US010217519B2

(12) United States Patent
Minagawa et al.

(10) Patent No.: US 10,217,519 B2
(45) Date of Patent: Feb. 26, 2019

(54) SEMICONDUCTOR MEMORY DEVICE HAVING A CONTROLLER CONFIGURED TO EXECUTE AN INTERVENING OPERATION AFTER A PROGRAM OPERATION AND BEFORE A VERIFY OPERATION FOR THAT PROGRAM OPERATION

(71) Applicant: Toshiba Memory Corporation, Tokyo (JP)

(72) Inventors: Hiroe Minagawa, Fujisawa Kanagawa (JP); Masanobu Shirakawa, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/448,607

(22) Filed: Mar. 3, 2017

(65) Prior Publication Data

US 2018/0090220 A1 Mar. 29, 2018

(30) Foreign Application Priority Data

Sep. 26, 2016 (JP) ................................ 2016-187472

(51) Int. Cl.
*G11C 16/06* (2006.01)
*G11C 16/34* (2006.01)
(Continued)

(52) U.S. Cl.
CPC ...... *G11C 16/3459* (2013.01); *G11C 11/5671* (2013.01); *G11C 16/08* (2013.01);
(Continued)

(58) Field of Classification Search
CPC ..... G11C 16/3459; G11C 16/08; G11C 16/16; G11C 16/10; G11C 16/26
(Continued)

(56) References Cited

U.S. PATENT DOCUMENTS 8,472,259 B2 6/2013 Futatsuyama et al.
8,547,744 B2 10/2013 Namiki et al.
(Continued)

FOREIGN PATENT DOCUMENTS

JP 2010-129104 A 6/2010

OTHER PUBLICATIONS

Taiwanese Office Action dated Nov. 17, 2017 in related Taiwanese Patent Application No. 106104393 with English Translation.
(Continued)

*Primary Examiner* — Tha-O H Bui
(74) *Attorney, Agent, or Firm* — Kim & Stewart LLP

(57) ABSTRACT

A semiconductor memory device includes memory cells, a word line connected to gates of the memory cells, and a control circuit configured to execute a write operation on the memory cells. The write operation includes a first program operation during which a first program voltage is applied to the word line, a first verify operation during which a first verification voltage is applied to the word line to determine whether or not the first program operation passed, a second program operation during which a second program voltage is applied to the word line, and a second verify operation during which a second verification voltage is applied to the word line to determine whether or not the second program operation passed. The control circuit is configured to execute at least one intervening program or verify operation between the first program operation and the first verify operation.

19 Claims, 195 Drawing Sheets

(51) Int. Cl.

| | |
|---|---|
| ***G11C 16/08*** | (2006.01) |
| ***G11C 16/10*** | (2006.01) |
| ***G11C 16/16*** | (2006.01) |
| ***G11C 16/26*** | (2006.01) |
| ***G11C 11/56*** | (2006.01) |
| *G11C 16/04* | (2006.01) |
| *H01L 27/11582* | (2017.01) |

(52) U.S. Cl.
CPC .............. *G11C 16/10* (2013.01); *G11C 16/16* (2013.01); *G11C 16/26* (2013.01); *G11C 16/0483* (2013.01); *G11C 2211/562* (2013.01); *G11C 2211/563* (2013.01); *G11C 2211/5621* (2013.01); *H01L 27/11582* (2013.01)

(58) Field of Classification Search
USPC ..................................................... 365/185.22
See application file for complete search history.

(56) References Cited

U.S. PATENT DOCUMENTS

| | | | | |
|---|---|---|---|---|
| 2008/0253181 A1* | 10/2008 | Edahiro | G11C 16/3418 | 365/185.03 |
| 2012/0020154 A1* | 1/2012 | Namiki | G11C 16/0483 | 365/185.03 |
| 2015/0078093 A1 | 3/2015 | Hahn et al. | | |

OTHER PUBLICATIONS

Office Action dated Apr. 16, 2018 in corresponding Taiwanese Patent Application No. 106104393 with English Translation, 7 pages.

* cited by examiner

| Page | Data | | | |
|---|---|---|---|---|
| Upper | 1 | 0 | 0 | 1 |
| Lower | 1 | 1 | 0 | 0 |

FIG. 21

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|
| P_A-B | | 1 | | | | 2 | | | | 3 | | | | | 4 | | | | 5 | | | 6 | | 7 | | 8 | |
| P_C | 1 | | | 2 | | | | 3 | | | | 4 | | | | | | | | | | | | | | | |
| V_A-B | | | | | A | | | | A | | | | A | B | | | A | B | | A | B | | B | | B | | B |
| V_C | | | C | | | | C | | | | C | | | | | C | | | | | | | | | | | |

FIG. 30

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|
| P_A-B | 1 | | | 2 | | | | 3 | | | | | 4 | | | | | 5 | | | | 6 | | 7 | | 8 | |
| P_C | | 1 | | | | 2 | | | | 3 | | | | | 4 | | | | | | | | | | | | |
| V_A-B | | | A | | | | A | | | | A | B | | | | A | B | | | A | B | | B | | B | | B |
| V_C | | | | | C | | | | C | | | | | C | | | | | C | | | | | | | | |

FIG. 32

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|
| P_A-B | | | | 1 | | | | 2 | | | | | 3 | | | | | 4 | | | | 5 | | 6 | | 7 | |
| P_B | 1 | | | | | | | | | | | | | | | | | | | | | | | | | | |
| P_C | | 1 | | | | 2 | | | | 3 | | | | | 4 | | | | | | | | | | | | |
| V_A-B | | | B | | | | A | | | | A | B | | | | A | B | | | A | B | | B | | B | | B |
| V_C | | | | | C | | | | C | | | | | C | | | | | C | | | | | | | | |

FIG. 51

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|
| P_A | | | | | | | | | | | | | | | | | | 1 | | | | 2 | | | 3 | | 4 | | 5 | |
| P_B | | 1 | | | | 2 | | | | 3 | | | | 4 | | | 5 | | | 6 | | | | | | | | | | |
| P_C | 1 | | | 2 | | | | 3 | | | | 4 | | | | | | | | | | | | | | | | | | |
| V_A | | | | | | | | | | | | | | | | | | | | | A | | | A | | A | | A | | A |
| V_B | | | | | B | | | | B | | | | B | | | B | | | B | | | | B | | | | | | | |
| V_C | | | C | | | | C | | | | C | | | | C | | | | | | | | | | | | | | | |

FIG. 56

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|
| P_A | | | | | | | | | | | | | | | | | | 1 | | | | 2 | | | 3 | | 4 | | 5 | |
| P_B | 1 | | | 2 | | | | 3 | | | | 4 | | | | 5 | | | | 6 | | | | | | | | | | |
| P_C | | 1 | | | | 2 | | | | 3 | | | | 4 | | | | | | | | | | | | | | | | |
| V_A | | | | | | | | | | | | | | | | | | | | | A | | | A | | A | | A | | A |
| V_B | | | B | | | | B | | | | B | | | | B | | | | B | | | | B | | | | | | | |
| V_C | | | | | C | | | | C | | | | C | | | | C | | | | | | | | | | | | | |

FIG. 64

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|---|---|---|---|---|---|---|---|---|---|---|---|---|---|---|
| P_A-B | | | | | 1 | | | | 2 | | | | 3 | | | | | 4 | | | | 5 | | | 6 | | 7 | | 8 | |
| P_C | 1 | 2 | 3 | 4 | | | 5 | | | | 6 | | | | 7 | | | | | | | | | | | | | | | |
| V_A-B | | | | | | | | A | | | | A | | | | A | B | | | A | B | | A | B | | B | | B | | B |
| V_C | | | | | | C | | | | C | | | | C | | | | | C | | | | | | | | | | | |

FIG. 70

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|
| P_A-B | | 1 | | | | 2 | | | | 3 | | | | | 4 | | | | 5 | | | 6 | | 7 | | 8 | |
| P_C | 1 | | | 2 | | | | 3 | | | | 4 | | | | | | | | | | | | | | | |
| V_A-B | | | | | A | | | | A | | | | A | B | | | A | B | | A | B | | B | | B | | B |
| V_C | | | C | | | | C | | | | C | | | | | C | | | | | | | | | | | |

| Page | Data | | | | | | | |
|---|---|---|---|---|---|---|---|---|
| Higher | 1 | 0 | 0 | 0 | 0 | 1 | 1 | 1 |
| Upper | 1 | 1 | 0 | 0 | 1 | 1 | 0 | 0 |
| Lower | 1 | 1 | 1 | 0 | 0 | 0 | 0 | 1 |

FIG. 78

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| P_A-D | | 1 | | | | 2 | | | | | | 3 | | | | | | | | 4 | | | | | | | 5 | | | | 6 | |
| P_E-G | 1 | | | 2 | | | | | 3 | | | | | | | 4 | | | | | | | 5 | | | | | | | | | |
| V_A-D | | | | | A | | | | | A | B | | | | | | A | B | C | | | | | B | C | D | | | C | D | | D |
| V_E-G | | | E | | | | E | F | | | | | E | F | G | | | | | | F | G | | | | | | G | | | | |

FIG. 82

| Pulse no | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| P_A-D | 1 | | | 2 | | | | | 3 | | | | | | | 4 |
| P_E-G | | 1 | | | | 2 | | | | | | 3 | | | | |
| V_A-D | | | A | | | | A | B | | | | | A | B | C | |
| V_E-G | | | | | E | | | | | E | F | | | | | |

| Pulse no | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|
| P_A-D | | | | | | | | 5 | | | | | | 6 | | |
| P_E-G | | | | 4 | | | | | | | 5 | | | | | |
| V_A-D | | | | | B | C | D | | | | | C | D | | | D |
| V_E-G | E | F | G | | | | | | F | G | | | | | G | |

FIG. 85

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |
|---|---|---|---|---|---|---|---|---|---|---|---|---|---|---|---|---|---|---|---|---|---|---|---|---|---|---|---|---|---|---|---|---|---|---|
| P_A | | | | | | | | | | | | | | | | | | | | | | | | | | | | | 1 | | 2 | | 3 | |
| P_B-D | | 1 | | | | 2 | | | | | | 3 | | | | | | | | 4 | | | | | | 5 | | | | | | | | |
| P_E-G | 1 | | | 2 | | | | | 3 | | | | | | | 4 | | | | | | | 5 | | | | | | | | | | | |
| V_A | | | | | | | | | | | | | | | | | | | | | | | | | | | | | | A | | A | | A |
| V_B-D | | | | | B | | | | | B | C | | | | | | B | C | D | | | | | C | D | | | D | | | | | | |
| V_E-G | | | E | | | | E | F | | | | | E | F | G | | | | | | F | G | | | | | G | | | | | | | |

FIG. 88

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |
|---|---|---|---|---|---|---|---|---|---|---|---|---|---|---|---|---|---|---|---|---|---|---|---|---|---|---|---|---|---|---|---|---|---|---|
| P_A | | | | | | | | | | | | | | | | | | | | 1 | | | | | | | | 2 | | | | | 3 | |
| P_B-D | | 1 | | | | 2 | | | | | | 3 | | | | | | | | | 4 | | | | | | | | 5 | | | | | |
| P_E-G | 1 | | | 2 | | | | | 3 | | | | | | | 4 | | | | | | | | 5 | | | | | | | | | | |
| V_A | | | | | | | | | | | | | | | | | | | | | | | | | A | | | | | | A | | | A |
| V_B-D | | | | | B | | | | | B | C | | | | | | B | C | D | | | | | | | C | D | | | | | D | | |
| V_E-G | | | E | | | | E | F | | | | | E | F | G | | | | | | | F | G | | | | | | | G | | | | |

FIG. 94

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 |
|---|---|---|---|---|---|---|---|---|---|---|---|---|---|---|---|---|---|---|---|---|---|---|---|---|---|---|---|---|---|---|---|---|---|---|---|
| P_A-D | | | | | 1 | | | | 2 | | | | | | 3 | | | | | | | | 4 | | | | | | | 5 | | | | 6 | |
| P_E-G | | | | 1 | | | 2 | | | | | 3 | | | | | | | 4 | | | | | | | 5 | | | | | | | | | |
| P_G | 1 | 2 | 3 | | | | | | | | | | | | | | | | | | | | | | | | | | | | | | | | |
| V_A-D | | | | | | | | A | | | | | A | B | | | | | | A | B | C | | | | | B | C | D | | | C | D | | D |
| V_E-G | | | | | | E | | | | E | F | | | | | E | F | G | | | | | | F | G | | | | | | G | | | | |

FIG. 98

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
|---|---|---|---|---|---|---|---|---|---|---|---|---|---|---|---|---|---|---|---|---|---|---|---|---|---|---|---|---|---|---|---|---|---|---|---|---|
| P_A-B | 1 | | | | | | | | | | | | | | | | | | | | | | | | | | | | | | | | | | | |
| P_C-D | | 1 | | | | | | | | | | | | | | | | | | | | | | | | | | | | | | | | | | |
| P_E-F | | | 1 | | | | | | | | | | | | | | | | | | | | | | | | | | | | | | | | | |
| P_G | | | | 1 | | | | | | | | | | | | | | | | | | | | | | | | | | | | | | | | |
| P_A-D | | | | | | 1 | | | | 2 | | | | | | 3 | | | | | | | | 4 | | | | | | | 5 | | | | 6 | |
| P_E-G | | | | | 1 | | | 2 | | | | | 3 | | | | | | | 4 | | | | | | | 5 | | | | | | | | | |
| V_A-D | | | | | | | | | A | | | | | A | B | | | | | | A | B | C | | | | | B | C | D | | | C | D | | D |
| V_E-G | | | | | | | E | | | | E | F | | | | | E | F | G | | | | | | F | G | | | | | | G | | | | |

FIG. 102

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 |
|---|---|---|---|---|---|---|---|---|---|---|---|---|---|---|---|---|---|---|---|---|---|---|---|---|---|---|---|---|---|---|---|---|---|---|---|
| P_A-D | | | | 1 | | | 2 | | | | | 3 | | | | | | | 4 | | | | | | | | 5 | | | | | | 6 | | |
| P_E-G | | | | | 1 | | | | 2 | | | | | | 3 | | | | | | | | 4 | | | | | | | 5 | | | | | |
| P_G | 1 | 2 | 3 | | | | | | | | | | | | | | | | | | | | | | | | | | | | | | | | |
| V_A-D | | | | | | A | | | | A | B | | | | | A | B | C | | | | | | B | C | D | | | | | C | D | | | D |
| V_E-G | | | | | | | | E | | | | | E | F | | | | | | E | F | G | | | | | | F | G | | | | | G | |

FIG. 106

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
|---|---|---|---|---|---|---|---|---|---|---|---|---|---|---|---|---|---|---|---|---|---|---|---|---|---|---|---|---|---|---|---|---|---|---|---|---|
| P_A-B | 1 | | | | | | | | | | | | | | | | | | | | | | | | | | | | | | | | | | | |
| P_C-D | | 1 | | | | | | | | | | | | | | | | | | | | | | | | | | | | | | | | | | |
| P_E-F | | | 1 | | | | | | | | | | | | | | | | | | | | | | | | | | | | | | | | | |
| P_G | | | | 1 | | | | | | | | | | | | | | | | | | | | | | | | | | | | | | | | |
| P_A-D | | | | | 1 | | | 2 | | | | | 3 | | | | | | | 4 | | | | | | | | 5 | | | | | | 6 | | |
| P_E-G | | | | | | 1 | | | | 2 | | | | | | 3 | | | | | | | | 4 | | | | | | | 5 | | | | | |
| V_A-D | | | | | | | A | | | | A | B | | | | | A | B | C | | | | | | B | C | D | | | | | C | D | | | D |
| V_E-G | | | | | | | | | E | | | | | E | F | | | | | | E | F | G | | | | | | F | G | | | | | G | |

FIG. 109

| Pulse no | P_A-D | P_E-G | P_G | V_A-D | V_E-G |
|---|---|---|---|---|---|
| 1 | | | 1 | | |
| 2 | | 1 | | | |
| 3 | 1 | | | | |
| 4 | | | | | E |
| 5 | | 2 | | | |
| 6 | | | | A | |
| 7 | 2 | | | | |
| 8 | | | | | E |
| 9 | | | | | F |
| 10 | | 3 | | | |
| 11 | | | | A | |
| 12 | | | | B | |
| 13 | 3 | | | | |
| 14 | | | | | E |
| 15 | | | | | F |
| 16 | | | | | G |
| 17 | | 4 | | | |
| 18 | | | | A | |
| 19 | | | | B | |
| 20 | | | | C | |
| 21 | 4 | | | | |
| 22 | | | | | F |
| 23 | | | | | G |
| 24 | | 5 | | | |
| 25 | | | | B | |
| 26 | | | | C | |
| 27 | | | | D | |
| 28 | 5 | | | | |
| 29 | | | | | G |
| 30 | | | | C | |
| 31 | | | | D | |
| 32 | 6 | | | | |
| 33 | | | | D | |

*FIG. 112*

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
|---|---|---|---|---|---|---|---|---|---|---|---|---|---|---|---|---|---|---|---|---|---|---|---|---|---|---|---|---|---|---|---|---|---|
| P_A-D | | 1 | | | 2 | | | | | 3 | | | | | | | 4 | | | | | | | | 5 | | | | | | 6 | | |
| P_E-G | | | 1 | | | | 2 | | | | | | 3 | | | | | | | | 4 | | | | | | | 5 | | | | | |
| P_G | 1 | | | | | | | | | | | | | | | | | | | | | | | | | | | | | | | | |
| V_A-D | | | | A | | | | A | B | | | | | A | B | C | | | | | | B | C | D | | | | | C | D | | | D |
| V_E-G | | | | | | E | | | | | E | F | | | | | | E | F | G | | | | | | F | G | | | | | G | |

| Page | Data | | | | | | | | | | | | | | | |
|---|---|---|---|---|---|---|---|---|---|---|---|---|---|---|---|---|
| TOP | 1 | 1 | 0 | 1 | 1 | 0 | 0 | 0 | 0 | 1 | 1 | 0 | 0 | 0 | 0 | 1 |
| Higher | 1 | 0 | 1 | 0 | 0 | 0 | 0 | 1 | 1 | 1 | 1 | 1 | 0 | 0 | 1 | 1 |
| Upper | 1 | 1 | 0 | 0 | 0 | 0 | 1 | 1 | 0 | 0 | 0 | 0 | 0 | 1 | 1 | 1 |
| Lower | 1 | 1 | 1 | 0 | 1 | 1 | 1 | 1 | 1 | 1 | 0 | 0 | 0 | 0 | 0 | 0 |

FIG. 121

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|
| P_1-4 | | | 1 | | | | | | | | 2 | | | | | | | | | | | | 3 |
| P_5-8 | | | | 1 | | | | | | | | 2 | | | | | | | | | | | |
| P_9-C | 1 | | | | | | 2 | | | | | | | | | | 3 | | | | | | |
| P_D-F | | 1 | | | | | | 2 | | | | | | | | | | 3 | | | | | |
| V_1-4 | | | | | | | | | 1 | | | | | | | | | | 1 | 2 | | | |
| V_5-8 | | | | | | | | | | 5 | | | | | | | | | | | 5 | 6 | |
| V_9-C | | | | | 9 | | | | | | | | 9 | A | | | | | | | | | |
| V_D-F | | | | | | D | | | | | | | | | D | E | | | | | | | |

| Pulse no | 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 |
|---|---|---|---|---|---|---|---|---|---|---|---|---|---|---|---|---|---|---|---|---|---|---|---|
| P_1-4 | | | | | | | | | | | | | | | | 4 | | | | | | | |
| P_5-8 | 3 | | | | | | | | | | | | | | | | 4 | | | | | | |
| P_9-C | | | | | | | | 4 | | | | | | | | | | | | | | | 5 |
| P_D-F | | | | | | | | | 4 | | | | | | | | | | | | | | |
| V_1-4 | | | | | | | | | | 1 | 2 | 3 | | | | | | | | | | | |
| V_5-8 | | | | | | | | | | | | | 5 | 6 | 7 | | | | | | | | |
| V_9-C | | 9 | A | B | | | | | | | | | | | | | | A | B | C | | | |
| V_D-F | | | | | D | E | F | | | | | | | | | | | | | | E | F | |

FIG. 122

| Pulse no | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
|---|---|---|---|---|---|---|---|---|---|---|---|---|---|---|---|---|---|---|---|---|---|---|
| P_1-4 | | | | | | | | 5 | | | | | | | | | | 6 | | | | |
| P_5-8 | | | | | | | | | 5 | | | | | | | | | | 6 | | | |
| P_9-C | | | | | | | | | | | | | 6 | | | | | | | | | |
| P_D-F | 5 | | | | | | | | | | | | | | | | | | | | | |
| V_1-4 | | 2 | 3 | 4 | | | | | | | | | | 3 | 4 | | | | | | 4 | |
| V_5-8 | | | | | 6 | 7 | 8 | | | | | | | | | 7 | 8 | | | | | 8 |
| V_9-C | | | | | | | | | | B | C | | | | | | | | | C | | |
| V_D-F | | | | | | | | | | | | F | | | | | | | | | | |

FIG. 127

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|
| P_1-4 | 1 | | | | | | 2 | | | | | | | | | | 3 | | | | | | |
| P_5-8 | | 1 | | | | | | 2 | | | | | | | | | | 3 | | | | | |
| P_9-C | | | 1 | | | | | | | | 2 | | | | | | | | | | | | 3 |
| P_D-F | | | | 1 | | | | | | | | 2 | | | | | | | | | | | |
| V_1-4 | | | | | 1 | | | | | | | | 1 | 2 | | | | | | | | | |
| V_5-8 | | | | | | 5 | | | | | | | | | 5 | 6 | | | | | | | |
| V_9-C | | | | | | | | | 9 | | | | | | | | | | 9 | A | | | |
| V_D-F | | | | | | | | | | D | | | | | | | | | | | D | E | |

| 24 | 25 | 26 | 27 | 28 | 29 | 30 | 31 | 32 | 33 | 34 | 35 | 36 | 37 | 38 | 39 | 40 | 41 | 42 | 43 | 44 | 45 | 46 |
|---|---|---|---|---|---|---|---|---|---|---|---|---|---|---|---|---|---|---|---|---|---|---|
| | | | | | | | 4 | | | | | | | | | | | | | | | |
| | | | | | | | | 4 | | | | | | | | | | | | | | |
| | | | | | | | | | | | | | | | 4 | | | | | | | |
| 3 | | | | | | | | | | | | | | | | 4 | | | | | | |
| | 1 | 2 | 3 | | | | | | | | | | | | | | 2 | 3 | 4 | | | |
| | | | | 5 | 6 | 7 | | | | | | | | | | | | | | 6 | 7 | 8 |
| | | | | | | | | | 9 | A | B | | | | | | | | | | | |
| | | | | | | | | | | | | D | E | F | | | | | | | | |

FIG. 128

| Pulse no | 47 | 48 | 49 | 50 | 51 | 52 | 53 | 54 | 55 | 56 | 57 | 58 | 59 | 60 | 61 | 62 | 63 | 64 | 65 | 66 | 67 | 68 |
|---|---|---|---|---|---|---|---|---|---|---|---|---|---|---|---|---|---|---|---|---|---|---|
| P_1-4 | 5 | | | | | | | | | | | | | 6 | | | | | | | | |
| P_5-8 | | 5 | | | | | | | | | | | | | 6 | | | | | | | |
| P_9-C | | | | | | | | 5 | | | | | | | | | | | | | 6 | |
| P_D-F | | | | | | | | | 5 | | | | | | | | | | | | | |
| V_1-4 | | | | | | | | | | 3 | 4 | | | | | 4 | | | | | | |
| V_5-8 | | | | | | | | | | | | 7 | 8 | | | | 8 | | | | | |
| V_9-C | | | A | B | C | | | | | | | | | | | | | B | C | | | C |
| V_D-F | | | | | | E | F | | | | | | | | | | | | | F | | |

FIG. 145

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| P_1 | | | | | | | | | | | | | | | | | | | | | | | | | |
| P_2-4 | | | 1 | | | | | | | | 2 | | | | | | | | | | | | 3 | | |
| P_5-8 | | | | 1 | | | | | | | | 2 | | | | | | | | | | | | 3 | |
| P_9-C | 1 | | | | | | 2 | | | | | | | | | | 3 | | | | | | | | |
| P_D-F | | 1 | | | | | | 2 | | | | | | | | | | 3 | | | | | | | |
| V_1 | | | | | | | | | | | | | | | | | | | | | | | | | |
| V_2-4 | | | | | | | | | 2 | | | | | | | | | | 2 | 3 | | | | | |
| V_5-8 | | | | | | | | | | 5 | | | | | | | | | | | 5 | 6 | | | |
| V_9-C | | | | | 9 | | | | | | | | 9 | A | | | | | | | | | | | 9 |
| V_D-F | | | | | | D | | | | | | | | | D | E | | | | | | | | | |

FIG. 146

| Pulse no | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 |
|---|---|---|---|---|---|---|---|---|---|---|---|---|---|---|---|---|---|---|---|---|---|---|---|---|---|
| P_1 | | | | | | | | | | | | | | | | | | | | | | | | | |
| P_2-4 | | | | | | | | | | | | | | 4 | | | | | | | | | | | |
| P_5-8 | | | | | | | | | | | | | | | 4 | | | | | | | | | | |
| P_9-C | | | | | | 4 | | | | | | | | | | | | | | | 5 | | | | |
| P_D-F | | | | | | | 4 | | | | | | | | | | | | | | | 5 | | | |
| V_1 | | | | | | | | | | | | | | | | | | | | | | | | | |
| V_2-4 | | | | | | | | 2 | 3 | 4 | | | | | | | | | | | | | 3 | 4 | |
| V_5-8 | | | | | | | | | | | 5 | 6 | 7 | | | | | | | | | | | | 6 |
| V_9-C | A | B | | | | | | | | | | | | | | A | B | C | | | | | | | |
| V_D-F | | | D | E | F | | | | | | | | | | | | | | E | F | | | | | |

FIG. 147

| Pulse no | 51 | 52 | 53 | 54 | 55 | 56 | 57 | 58 | 59 | 60 | 61 | 62 | 63 | 64 | 65 | 66 | 67 | 68 | 69 | 70 |
|---|---|---|---|---|---|---|---|---|---|---|---|---|---|---|---|---|---|---|---|---|
| P_1 | | | | | | | | | | 1 | | | | | 2 | | | | 3 | |
| P_2-4 | | | 5 | | | | | | | | | | | | | | | | | |
| P_5-8 | | | | 5 | | | | | | | | | 6 | | | | | | | |
| P_9-C | | | | | | | | 6 | | | | | | | | | | | | |
| P_D-F | | | | | | | | | | | | | | | | | | | | |
| V_1 | | | | | | | | | | | | | | 1 | | | | 1 | | 1 |
| V_2-4 | | | | | | | | | 4 | | | | | | | | | | | |
| V_5-8 | 7 | 8 | | | | | | | | | 7 | 8 | | | | | 8 | | | |
| V_9-C | | | | | B | C | | | | | | | | | | C | | | | |
| V_D-F | | | | | | | F | | | | | | | | | | | | | |

FIG. 154

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| P_1 | | | | | | | | | | | | | | | | | | | | | | | | | |
| P_2-4 | 1 | | | | | | 2 | | | | | | | | | | 3 | | | | | | | | |
| P_5-8 | | 1 | | | | | | 2 | | | | | | | | | | 3 | | | | | | | |
| P_9-C | | | 1 | | | | | | | | 2 | | | | | | | | | | | | 3 | | |
| P_D-F | | | | 1 | | | | | | | | 2 | | | | | | | | | | | | 3 | |
| V_1 | | | | | | | | | | | | | | | | | | | | | | | | | |
| V_2-4 | | | | | 2 | | | | | | | | 2 | 3 | | | | | | | | | | | 2 |
| V_5-8 | | | | | | 5 | | | | | | | | | 5 | 6 | | | | | | | | | |
| V_9-C | | | | | | | | | 9 | | | | | | | | | | 9 | A | | | | | |
| V_D-F | | | | | | | | | | D | | | | | | | | | | | D | E | | | |

FIG. 155

| Pulse no | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 |
|---|---|---|---|---|---|---|---|---|---|---|---|---|---|---|---|---|---|---|---|---|---|---|---|---|---|
| P_1 | | | | | | | | | | | | | | | | | | | | | | | | | |
| P_2-4 | | | | | | 4 | | | | | | | | | | | | | | | 5 | | | | |
| P_5-8 | | | | | | | 4 | | | | | | | | | | | | | | | 5 | | | |
| P_9-C | | | | | | | | | | | | | | 4 | | | | | | | | | | | |
| P_D-F | | | | | | | | | | | | | | | 4 | | | | | | | | | | |
| V_1 | | | | | | | | | | | | | | | | | | | | | | | | | |
| V_2-4 | 3 | 4 | | | | | | | | | | | | | | 3 | 4 | | | | | | | | |
| V_5-8 | | | 5 | 6 | 7 | | | | | | | | | | | | | 6 | 7 | 8 | | | | | |
| V_9-C | | | | | | | | 9 | A | B | | | | | | | | | | | | | A | B | C |
| V_D-F | | | | | | | | | | | D | E | F | | | | | | | | | | | | |

FIG. 156

| Pulse no | 51 | 52 | 53 | 54 | 55 | 56 | 57 | 58 | 59 | 60 | 61 | 62 | 63 | 64 | 65 | 66 | 67 | 68 | 69 | 70 |
|---|---|---|---|---|---|---|---|---|---|---|---|---|---|---|---|---|---|---|---|---|
| P_1 | | | | | | | | 1 | | | | | | | | 2 | | | 3 | |
| P_2-4 | | | | | | | | | | | | | | | | | | | | |
| P_5-8 | | | | | | | | | 6 | | | | | | | | | | | |
| P_9-C | | | 5 | | | | | | | | | | 6 | | | | | | | |
| P_D-F | | | | 5 | | | | | | | | | | | | | | | | |
| V_1 | | | | | | | | | | | | | | 1 | | | | 1 | | 1 |
| V_2-4 | | | | | 4 | | | | | | | | | | | | | | | |
| V_5-8 | | | | | | 7 | 8 | | | | | | | | 8 | | | | | |
| V_9-C | | | | | | | | | | B | C | | | | | | C | | | |
| V_D-F | E | F | | | | | | | | | | F | | | | | | | | |

FIG. 164

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| P_1-4 | | | | | | 1 | | | | | | | | 2 | | | | | | | | | | | |
| P_5-8 | | | | | | | 1 | | | | | | | | 2 | | | | | | | | | | |
| P_9-C | | | | 1 | | | | | | 2 | | | | | | | | | | 3 | | | | | |
| P_D-F | | | | | 1 | | | | | | 2 | | | | | | | | | | 3 | | | | |
| P_F | 1 | 2 | 3 | | | | | | | | | | | | | | | | | | | | | | |
| V_1-4 | | | | | | | | | | | | 1 | | | | | | | | | | 1 | 2 | | |
| V_5-8 | | | | | | | | | | | | | 5 | | | | | | | | | | | 5 | 6 |
| V_9-C | | | | | | | | 9 | | | | | | | | 9 | A | | | | | | | | |
| V_D-F | | | | | | | | | D | | | | | | | | | D | E | | | | | | |

FIG. 165

| Pulse no | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 |
|---|---|---|---|---|---|---|---|---|---|---|---|---|---|---|---|---|---|---|---|---|---|---|---|---|---|
| P_1-4 | 3 | | | | | | | | | | | | | | | | 4 | | | | | | | | |
| P_5-8 | | 3 | | | | | | | | | | | | | | | | 4 | | | | | | | |
| P_9-C | | | | | | | | | 4 | | | | | | | | | | | | | | | 5 | |
| P_D-F | | | | | | | | | | 4 | | | | | | | | | | | | | | | 5 |
| P_F | | | | | | | | | | | | | | | | | | | | | | | | | |
| V_1-4 | | | | | | | | | | | 1 | 2 | 3 | | | | | | | | | | | | |
| V_5-8 | | | | | | | | | | | | | | 5 | 6 | 7 | | | | | | | | | |
| V_9-C | | | 9 | A | B | | | | | | | | | | | | | | A | B | C | | | | |
| V_D-F | | | | | | D | E | F | | | | | | | | | | | | | | E | F | | |

FIG. 166

| Pulse no | 51 | 52 | 53 | 54 | 55 | 56 | 57 | 58 | 59 | 60 | 61 | 62 | 63 | 64 | 65 | 66 | 67 | 68 | 69 | 70 | 71 |
|---|---|---|---|---|---|---|---|---|---|---|---|---|---|---|---|---|---|---|---|---|---|
| P_1-4 | | | | | | | 5 | | | | | | | | | | 6 | | | | |
| P_5-8 | | | | | | | | 5 | | | | | | | | | | 6 | | | |
| P_9-C | | | | | | | | | | | | 6 | | | | | | | | | |
| P_D-F | | | | | | | | | | | | | | | | | | | | | |
| P_F | | | | | | | | | | | | | | | | | | | | | |
| V_1-4 | 2 | 3 | 4 | | | | | | | | | | 3 | 4 | | | | | | 4 | |
| V_5-8 | | | | 6 | 7 | 8 | | | | | | | | | 7 | 8 | | | | | 8 |
| V_9-C | | | | | | | | | B | C | | | | | | | | | C | | |
| V_D-F | | | | | | | | | | | F | | | | | | | | | | |

FIG. 170

| Pulse no | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| P_1-2 | 1 | | | | | | | | | | | | | | | | | | |
| P_3-4 | | 1 | | | | | | | | | | | | | | | | | |
| P_5-6 | | | 1 | | | | | | | | | | | | | | | | |
| P_7-8 | | | | 1 | | | | | | | | | | | | | | | |
| P_9-A | | | | | 1 | | | | | | | | | | | | | | |
| P_B-C | | | | | | 1 | | | | | | | | | | | | | |
| P_D-E | | | | | | | 1 | | | | | | | | | | | | |
| P_F | | | | | | | | 1 | | | | | | | | | | | |
| P_1-4 | | | | | | | | | | | 1 | | | | | | | | 2 |
| P_5-8 | | | | | | | | | | | | 1 | | | | | | | |
| P_9-C | | | | | | | | | 1 | | | | | | 2 | | | | |
| P_D-F | | | | | | | | | | 1 | | | | | | 2 | | | |
| V_1-4 | | | | | | | | | | | | | | | | | 1 | | |
| V_5-8 | | | | | | | | | | | | | | | | | | 5 | |
| V_9-C | | | | | | | | | | | | | 9 | | | | | | |
| V_D-F | | | | | | | | | | | | | | D | | | | | |

FIG. 171

| Pulse no | 20 | 21 | 22 | 23 | 24 | 25 | 26 | 27 | 28 | 29 | 30 | 31 | 32 | 33 | 34 | 35 | 36 | 37 | 38 |
|---|---|---|---|---|---|---|---|---|---|---|---|---|---|---|---|---|---|---|---|
| P_1-2 | | | | | | | | | | | | | | | | | | | |
| P_3-4 | | | | | | | | | | | | | | | | | | | |
| P_5-6 | | | | | | | | | | | | | | | | | | | |
| P_7-8 | | | | | | | | | | | | | | | | | | | |
| P_9-A | | | | | | | | | | | | | | | | | | | |
| P_B-C | | | | | | | | | | | | | | | | | | | |
| P_D-E | | | | | | | | | | | | | | | | | | | |
| P_F | | | | | | | | | | | | | | | | | | | |
| P_1-4 | | | | | | | | | | | | 3 | | | | | | | |
| P_5-8 | 2 | | | | | | | | | | | | 3 | | | | | | |
| P_9-C | | | | | | 3 | | | | | | | | | | | | | |
| P_D-F | | | | | | | 3 | | | | | | | | | | | | |
| V_1-4 | | | | | | | | 1 | 2 | | | | | | | | | | |
| V_5-8 | | | | | | | | | | 5 | 6 | | | | | | | | |
| V_9-C | | 9 | A | | | | | | | | | | | 9 | A | B | | | |
| V_D-F | | | | D | E | | | | | | | | | | | | D | E | F |

FIG. 172

| Pulse no | 39 | 40 | 41 | 42 | 43 | 44 | 45 | 46 | 47 | 48 | 49 | 50 | 51 | 52 | 53 | 54 | 55 | 56 | 57 |
|---|---|---|---|---|---|---|---|---|---|---|---|---|---|---|---|---|---|---|---|
| P_1-2 | | | | | | | | | | | | | | | | | | | |
| P_3-4 | | | | | | | | | | | | | | | | | | | |
| P_5-6 | | | | | | | | | | | | | | | | | | | |
| P_7-8 | | | | | | | | | | | | | | | | | | | |
| P_9-A | | | | | | | | | | | | | | | | | | | |
| P_B-C | | | | | | | | | | | | | | | | | | | |
| P_D-E | | | | | | | | | | | | | | | | | | | |
| P_F | | | | | | | | | | | | | | | | | | | |
| P_1-4 | | | | | | | | | 4 | | | | | | | | | | |
| P_5-8 | | | | | | | | | | 4 | | | | | | | | | |
| P_9-C | 4 | | | | | | | | | | | | | | | 5 | | | |
| P_D-F | | 4 | | | | | | | | | | | | | | | 5 | | |
| V_1-4 | | | 1 | 2 | 3 | | | | | | | | | | | | | 2 | 3 |
| V_5-8 | | | | | | 5 | 6 | 7 | | | | | | | | | | | |
| V_9-C | | | | | | | | | | | A | B | C | | | | | | |
| V_D-F | | | | | | | | | | | | | | E | F | | | | |

FIG. 173

| Pulse no | 58 | 59 | 60 | 61 | 62 | 63 | 64 | 65 | 66 | 67 | 68 | 69 | 70 | 71 | 72 | 73 | 74 | 75 | 76 |
|---|---|---|---|---|---|---|---|---|---|---|---|---|---|---|---|---|---|---|---|
| P_1-2 | | | | | | | | | | | | | | | | | | | |
| P_3-4 | | | | | | | | | | | | | | | | | | | |
| P_5-6 | | | | | | | | | | | | | | | | | | | |
| P_7-8 | | | | | | | | | | | | | | | | | | | |
| P_9-A | | | | | | | | | | | | | | | | | | | |
| P_B-C | | | | | | | | | | | | | | | | | | | |
| P_D-E | | | | | | | | | | | | | | | | | | | |
| P_F | | | | | | | | | | | | | | | | | | | |
| P_1-4 | | | | | 5 | | | | | | | | | | 6 | | | | |
| P_5-8 | | | | | | 5 | | | | | | | | | | 6 | | | |
| P_9-C | | | | | | | | | | 6 | | | | | | | | | |
| P_D-F | | | | | | | | | | | | | | | | | | | |
| V_1-4 | 4 | | | | | | | | | | 3 | 4 | | | | | | 4 | |
| V_5-8 | | 6 | 7 | 8 | | | | | | | | | 7 | 8 | | | | | 8 |
| V_9-C | | | | | | | B | C | | | | | | | | | C | | |
| V _D-F | | | | | | | | | F | | | | | | | | | | |

FIG. 179

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| P_1-4 | | | | 1 | | | | | | 2 | | | | | | | | | | 3 | | | | | |
| P_5-8 | | | | | 1 | | | | | | 2 | | | | | | | | | | 3 | | | | |
| P_9-C | | | | | | 1 | | | | | | | | 2 | | | | | | | | | | | |
| P_D-F | | | | | | | 1 | | | | | | | | 2 | | | | | | | | | | |
| P_F | 1 | 2 | 3 | | | | | | | | | | | | | | | | | | | | | | |
| V_1-4 | | | | | | | | 1 | | | | | | | | 1 | 2 | | | | | | | | |
| V_5-8 | | | | | | | | | 5 | | | | | | | | | 5 | 6 | | | | | | |
| V_9-C | | | | | | | | | | | | 9 | | | | | | | | | | 9 | A | | |
| V_D-F | | | | | | | | | | | | | D | | | | | | | | | | | D | E |

FIG. 180

| Pulse no | 26 | 27 | 28 | 29 | 30 | 31 | 32 | 33 | 34 | 35 | 36 | 37 | 38 | 39 | 40 | 41 | 42 | 43 | 44 | 45 | 46 | 47 | 48 | 49 | 50 |
|---|---|---|---|---|---|---|---|---|---|---|---|---|---|---|---|---|---|---|---|---|---|---|---|---|---|
| P_1-4 | | | | | | | | | 4 | | | | | | | | | | | | | | | | 5 |
| P_5-8 | | | | | | | | | | 4 | | | | | | | | | | | | | | | |
| P_9-C | 3 | | | | | | | | | | | | | | | | 4 | | | | | | | | |
| P_D-F | | 3 | | | | | | | | | | | | | | | | 4 | | | | | | | |
| P_F | | | | | | | | | | | | | | | | | | | | | | | | | |
| V_1-4 | | | 1 | 2 | 3 | | | | | | | | | | | | | | 2 | 3 | 4 | | | | |
| V_5-8 | | | | | | 5 | 6 | 7 | | | | | | | | | | | | | | 6 | 7 | 8 | |
| V_9-C | | | | | | | | | | | 9 | A | B | | | | | | | | | | | | |
| V_D-F | | | | | | | | | | | | | | D | E | F | | | | | | | | | |

FIG. 181

| Pulse no | 51 | 52 | 53 | 54 | 55 | 56 | 57 | 58 | 59 | 60 | 61 | 62 | 63 | 64 | 65 | 66 | 67 | 68 | 69 | 70 | 71 |
|---|---|---|---|---|---|---|---|---|---|---|---|---|---|---|---|---|---|---|---|---|---|
| P_1-4 | | | | | | | | | | | | | 6 | | | | | | | | |
| P_5-8 | 5 | | | | | | | | | | | | | 6 | | | | | | | |
| P_9-C | | | | | | | 5 | | | | | | | | | | | | | 6 | |
| P_D-F | | | | | | | | 5 | | | | | | | | | | | | | |
| P_F | | | | | | | | | | | | | | | | | | | | | |
| V_1-4 | | | | | | | | | 3 | 4 | | | | | 4 | | | | | | |
| V_5-8 | | | | | | | | | | | 7 | 8 | | | | 8 | | | | | |
| V_9-C | | A | B | C | | | | | | | | | | | | | B | C | | | C |
| V_D-F | | | | | E | F | | | | | | | | | | | | | F | | |

FIG. 185

| Pulse no | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| P_1-2 | 1 | | | | | | | | | | | | | | | | | | |
| P_3-4 | | 1 | | | | | | | | | | | | | | | | | |
| P_5-6 | | | 1 | | | | | | | | | | | | | | | | |
| P_7-8 | | | | 1 | | | | | | | | | | | | | | | |
| P_9-A | | | | | 1 | | | | | | | | | | | | | | |
| P_B-C | | | | | | 1 | | | | | | | | | | | | | |
| P_D-E | | | | | | | 1 | | | | | | | | | | | | |
| P_F | | | | | | | | 1 | | | | | | | | | | | |
| P_1-4 | | | | | | | | | 1 | | | | | | 2 | | | | |
| P_5-8 | | | | | | | | | | 1 | | | | | | 2 | | | |
| P_9-C | | | | | | | | | | | 1 | | | | | | | | 2 |
| P_D-F | | | | | | | | | | | | 1 | | | | | | | |
| V_1-4 | | | | | | | | | | | | | 1 | | | | | | |
| V_5-8 | | | | | | | | | | | | | | 5 | | | | | |
| V_9-C | | | | | | | | | | | | | | | | | 9 | | |
| V_D-F | | | | | | | | | | | | | | | | | | D | |

FIG. 186

| Pulse no | 20 | 21 | 22 | 23 | 24 | 25 | 26 | 27 | 28 | 29 | 30 | 31 | 32 | 33 | 34 | 35 | 36 | 37 | 38 |
|---|---|---|---|---|---|---|---|---|---|---|---|---|---|---|---|---|---|---|---|
| P_1-2 | | | | | | | | | | | | | | | | | | | |
| P_3-4 | | | | | | | | | | | | | | | | | | | |
| P_5-6 | | | | | | | | | | | | | | | | | | | |
| P_7-8 | | | | | | | | | | | | | | | | | | | |
| P_9-A | | | | | | | | | | | | | | | | | | | |
| P_B-C | | | | | | | | | | | | | | | | | | | |
| P_D-E | | | | | | | | | | | | | | | | | | | |
| P_F | | | | | | | | | | | | | | | | | | | |
| P_1-4 | | | | | | 3 | | | | | | | | | | | | | |
| P_5-8 | | | | | | | 3 | | | | | | | | | | | | |
| P_9-C | | | | | | | | | | | | 3 | | | | | | | |
| P_D-F | 2 | | | | | | | | | | | | 3 | | | | | | |
| V_1-4 | | 1 | 2 | | | | | | | | | | | 1 | 2 | 3 | | | |
| V_5-8 | | | | 5 | 6 | | | | | | | | | | | | 5 | 6 | 7 |
| V_9-C | | | | | | | | 9 | A | | | | | | | | | | |
| V_D-F | | | | | | | | | | D | E | | | | | | | | |

FIG. 187

| Pulse no | 39 | 40 | 41 | 42 | 43 | 44 | 45 | 46 | 47 | 48 | 49 | 50 | 51 | 52 | 53 | 54 | 55 | 56 | 57 |
|---|---|---|---|---|---|---|---|---|---|---|---|---|---|---|---|---|---|---|---|
| P_1-2 | | | | | | | | | | | | | | | | | | | |
| P_3-4 | | | | | | | | | | | | | | | | | | | |
| P_5-6 | | | | | | | | | | | | | | | | | | | |
| P_7-8 | | | | | | | | | | | | | | | | | | | |
| P_9-A | | | | | | | | | | | | | | | | | | | |
| P_B-C | | | | | | | | | | | | | | | | | | | |
| P_D-E | | | | | | | | | | | | | | | | | | | |
| P_F | | | | | | | | | | | | | | | | | | | |
| P_1-4 | 4 | | | | | | | | | | | | | | | | 5 | | |
| P_5-8 | | 4 | | | | | | | | | | | | | | | | 5 | |
| P_9-C | | | | | | | | | 4 | | | | | | | | | | |
| P_D-F | | | | | | | | | | 4 | | | | | | | | | |
| V_1-4 | | | | | | | | | | | 2 | 3 | 4 | | | | | | |
| V_5-8 | | | | | | | | | | | | | | 6 | 7 | 8 | | | |
| V_9-C | | | 9 | A | B | | | | | | | | | | | | | | A |
| V_D-F | | | | | | D | E | F | | | | | | | | | | | |

FIG. 188

| Pulse no | 58 | 59 | 60 | 61 | 62 | 63 | 64 | 65 | 66 | 67 | 68 | 69 | 70 | 71 | 72 | 73 | 74 | 75 | 76 |
|---|---|---|---|---|---|---|---|---|---|---|---|---|---|---|---|---|---|---|---|
| P_1-2 | | | | | | | | | | | | | | | | | | | |
| P_3-4 | | | | | | | | | | | | | | | | | | | |
| P_5-6 | | | | | | | | | | | | | | | | | | | |
| P_7-8 | | | | | | | | | | | | | | | | | | | |
| P_9-A | | | | | | | | | | | | | | | | | | | |
| P_B-C | | | | | | | | | | | | | | | | | | | |
| P_D-E | | | | | | | | | | | | | | | | | | | |
| P_F | | | | | | | | | | | | | | | | | | | |
| P_1-4 | | | | | | | | | | | 6 | | | | | | | | |
| P_5-8 | | | | | | | | | | | | 6 | | | | | | | |
| P_9-C | | | | | 5 | | | | | | | | | | | | | 6 | |
| P_D-F | | | | | | 5 | | | | | | | | | | | | | |
| V_1-4 | | | | | | | 3 | 4 | | | | | 4 | | | | | | |
| V_5-8 | | | | | | | | | 7 | 8 | | | | 8 | | | | | |
| V_9-C | B | C | | | | | | | | | | | | | B | C | | | C |
| V_D-F | | | E | F | | | | | | | | | | | | | F | | |

*FIG. 192*

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| P_1-4 | | | | 1 | | | | | | | | 2 | | | | | | | | | | | | 3 |
| P_5-8 | | | | | 1 | | | | | | | | 2 | | | | | | | | | | | |
| P_9-C | | 1 | | | | | | 2 | | | | | | | | | | 3 | | | | | | |
| P_D-F | | | 1 | | | | | | 2 | | | | | | | | | | 3 | | | | | |
| P_F | 1 | | | | | | | | | | | | | | | | | | | | | | | |
| V_1-4 | | | | | | | | | | 1 | | | | | | | | | | 1 | 2 | | | |
| V_5-8 | | | | | | | | | | | 5 | | | | | | | | | | | 5 | 6 | |
| V_9-C | | | | | | 9 | | | | | | | | 9 | A | | | | | | | | | |
| V_D-F | | | | | | | D | | | | | | | | | D | E | | | | | | | |

FIG. 193

| Pulse no | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|---|---|---|---|---|---|---|---|
| P_1-4 | | | | | | | | | | | | | | | | 4 | | | | | | | |
| P_5-8 | 3 | | | | | | | | | | | | | | | | 4 | | | | | | |
| P_9-C | | | | | | | | 4 | | | | | | | | | | | | | | | 5 |
| P_D-F | | | | | | | | | 4 | | | | | | | | | | | | | | |
| P_F | | | | | | | | | | | | | | | | | | | | | | | |
| V_1-4 | | | | | | | | | | 1 | 2 | 3 | | | | | | | | | | | |
| V_5-8 | | | | | | | | | | | | | 5 | 6 | 7 | | | | | | | | |
| V_9-C | | 9 | A | B | | | | | | | | | | | | | | A | B | C | | | |
| V_D-F | | | | | D | E | F | | | | | | | | | | | | | | E | F | |

FIG. 194

| Pulse no | 48 | 49 | 50 | 51 | 52 | 53 | 54 | 55 | 56 | 57 | 58 | 59 | 60 | 61 | 62 | 63 | 64 | 65 | 66 | 67 | 68 | 69 |
|---|---|---|---|---|---|---|---|---|---|---|---|---|---|---|---|---|---|---|---|---|---|---|
| P_1–4 | | | | | | | | 5 | | | | | | | | | | 6 | | | | |
| P_5–8 | | | | | | | | | 5 | | | | | | | | | | 6 | | | |
| P_9–C | | | | | | | | | | | | | 6 | | | | | | | | | |
| P_D–F | 5 | | | | | | | | | | | | | | | | | | | | | |
| P_F | | | | | | | | | | | | | | | | | | | | | | |
| V_1–4 | | 2 | 3 | 4 | | | | | | | | | | 3 | 4 | | | | | | 4 | |
| V_5–8 | | | | | 6 | 7 | 8 | | | | | | | | | 7 | 8 | | | | | 8 |
| V_9–C | | | | | | | | | | B | C | | | | | | | | | C | | |
| V_D–F | | | | | | | | | | | | F | | | | | | | | | | |

FIG. 198

| Pulse no | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| P_1-4 | | 1 | | | | | | 2 | | | | | | | | | | 3 | | | | | | |
| P_5-8 | | | 1 | | | | | | 2 | | | | | | | | | | 3 | | | | | |
| P_9-C | | | | 1 | | | | | | | | 2 | | | | | | | | | | | | 3 |
| P_D-F | | | | | 1 | | | | | | | | 2 | | | | | | | | | | | |
| P_F | 1 | | | | | | | | | | | | | | | | | | | | | | | |
| V_1-4 | | | | | | 1 | | | | | | | | 1 | 2 | | | | | | | | | |
| V_5-8 | | | | | | | 5 | | | | | | | | | 5 | 6 | | | | | | | |
| V_9-C | | | | | | | | | | 9 | | | | | | | | | | 9 | A | | | |
| V_D-F | | | | | | | | | | | D | | | | | | | | | | | D | E | |

FIG. 199

| Pulse no | 25 | 26 | 27 | 28 | 29 | 30 | 31 | 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|---|---|---|---|---|---|---|---|
| P_1-4 | | | | | | | | 4 | | | | | | | | | | | | | | | |
| P_5-8 | | | | | | | | | 4 | | | | | | | | | | | | | | |
| P_9-C | | | | | | | | | | | | | | | | 4 | | | | | | | |
| Pm_D-F | 3 | | | | | | | | | | | | | | | | 4 | | | | | | |
| V_1-4 | | 1 | 2 | 3 | | | | | | | | | | | | | | 2 | 3 | 4 | | | |
| V_5-8 | | | | | 5 | 6 | 7 | | | | | | | | | | | | | | 6 | 7 | 8 |
| V_9-C | | | | | | | | | | 9 | A | B | | | | | | | | | | | |
| V_D-F | | | | | | | | | | | | | D | E | F | | | | | | | | |

FIG. 200

| Pulse no | 48 | 49 | 50 | 51 | 52 | 53 | 54 | 55 | 56 | 57 | 58 | 59 | 60 | 61 | 62 | 63 | 64 | 65 | 66 | 67 | 68 | 69 |
|---|---|---|---|---|---|---|---|---|---|---|---|---|---|---|---|---|---|---|---|---|---|---|
| P_1-4 | 5 | | | | | | | | | | | | | 6 | | | | | | | | |
| P_5-8 | | 5 | | | | | | | | | | | | | 6 | | | | | | | |
| P_9-C | | | | | | | | 5 | | | | | | | | | | | | | 6 | |
| P_D-F | | | | | | | | | 5 | | | | | | | | | | | | | |
| V_1-4 | | | | | | | | | | 3 | 4 | | | | | 4 | | | | | | |
| V_5-8 | | | | | | | | | | | | 7 | 8 | | | | 8 | | | | | |
| V_9-C | | | A | B | C | | | | | | | | | | | | | B | C | | | C |
| V_D-F | | | | | | E | F | | | | | | | | | | | | | F | | |

SEMICONDUCTOR MEMORY DEVICE HAVING A CONTROLLER CONFIGURED TO EXECUTE AN INTERVENING OPERATION AFTER A PROGRAM OPERATION AND BEFORE A VERIFY OPERATION FOR THAT PROGRAM OPERATION

CROSS-REFERENCE TO RELATED APPLICATION

This application is based upon and claims the benefit of priority from Japanese Patent Application No. 2016-187472, filed Sep. 26, 2016, the entire contents of which are incorporated herein by reference.

FIELD

Embodiments described herein relate generally to a semiconductor memory device.

BACKGROUND

A NAND flash memory having memory cells arranged three-dimensionally is known.

DESCRIPTION OF THE DRAWINGS

FIG. 21 is a table showing the number of loops of a program pulse applied to the word line during the program operation, and verification levels during program verification.

FIG. 30 is a table showing the number of loops of the program pulse applied to the word line during the program operation, and verification levels during the program verification.

FIG. 32 is a table showing the number of loops of the program pulse applied to the word line during the program operation, and verification levels during the program verification.

FIG. 51 is a table showing the number of loops of the program pulse applied to the word line during the program operation, and verification levels during the program verification.

FIG. 56 is a table showing the number of loops of the program pulse applied to the word line during the program operation, and verification levels during the program verification.

FIG. 64 is a table showing the number of loops of the program pulse applied to the word line during the program operation, and a verification level during the program verification.

FIG. 70 is a table showing the number of loops of the program pulse applied to the word line during the program operation, and verification levels during the program verification.

FIG. 78 is a table showing the number of loops of the program pulse applied to the word line during the program operation, and verification levels during the program verification.

FIG. 82 is a table showing the number of loops of the program pulse applied to the word line during the program operation, and verification levels during the program verification.

FIG. 85 is a table showing the number of loops of the program pulse applied to the word line during the program operation, and verification levels during the program verification.

FIG. 88 is a table showing the number of loops of the program pulse applied to the word line during the program operation, and verification levels during the program verification.

FIG. 94 is a table showing the number of loops of the program pulse applied to the word line during the program operation, and verification levels during the program verification.

FIG. 98 is a table showing the number of loops of the program pulse applied to the word line during the program operation, and verification levels during the program verification.

FIG. 102 is a table showing the number of loops of the program pulse applied to the word line during the program operation, and verification levels during the program verification.

FIG. 106 is a table showing the number of loops of the program pulse applied to the word line during the program operation, and verification levels during the program verification.

FIG. 109 is a table showing the number of loops of the program pulse applied to the word line during the program operation, and verification levels during the program verification.

FIG. 112 is a table showing the number of loops of the program pulse applied to the word line during the program operation, and verification levels during the program verification.

FIG. 121 is a table showing the number of loops of the program pulse applied to the word line during the program operation, and verification levels during the program verification.

FIG. 122 is a table showing the number of loops of the program pulse applied to the word line during the program operation, and verification levels during the program verification.

FIG. 127 is a table showing the number of loops of the program pulse applied to the word line during the program operation, and verification levels during the program verification.

FIG. 128 is a table showing the number of loops of the program pulse applied to the word line during the program operation, and verification levels during the program verification.

FIG. 145 is a table showing the number of loops of the program pulse applied to the word line during the program operation, and verification levels during the program verification.

FIG. 146 is a table showing the number of loops of the program pulse applied to the word line during the program operation, and verification levels during the program verification.

FIG. 147 is a table showing the number of loops of the program pulse applied to the word line during the program operation, and verification levels during the program verification.

FIG. 153 is a waveform chart showing an example of voltages to be applied to the word lines and the bit lines during the write operation.

FIG. 154 is a table showing the number of loops of the program pulse applied to the word line during the program operation, and verification levels during the program verification.

FIG. 155 is a table showing the number of loops of the program pulse applied to the word line during the program operation, and verification levels during the program verification.

FIG. 156 is a table showing the number of loops of the program pulse applied to the word line during the program operation, and verification levels during the program verification.

FIG. 157 is a waveform chart schematically showing a waveform of the word line during the write operation.

FIG. 158 is a flowchart showing the method of generating the performance order (pulse order) of the program operation and the program verification operation.

FIG. 159 is a waveform chart schematically showing a waveform of the word line during the write operation.

FIG. 160 is a flowchart showing the method of generating the performance order (pulse order) of the program operation and the program verification operation.

FIG. 161 is a waveform chart schematically showing a waveform of the word line during the write operation.

FIG. 162 is a flowchart showing the method of generating the performance order (pulse order) of the program operation and the program verification operation.

FIG. 163 is a waveform chart showing an example of voltages to be applied to the word lines and the bit lines during the write operation.

FIG. 164 is a table showing the number of loops of the program pulse applied to the word line during the program operation, and verification levels during the program verification.

FIG. 165 is a table showing the number of loops of the program pulse applied to the word line during the program operation, and verification levels during the program verification.

FIG. 166 is a table showing the number of loops of the program pulse applied to the word line during the program operation, and verification levels during the program verification.

Figure 167:
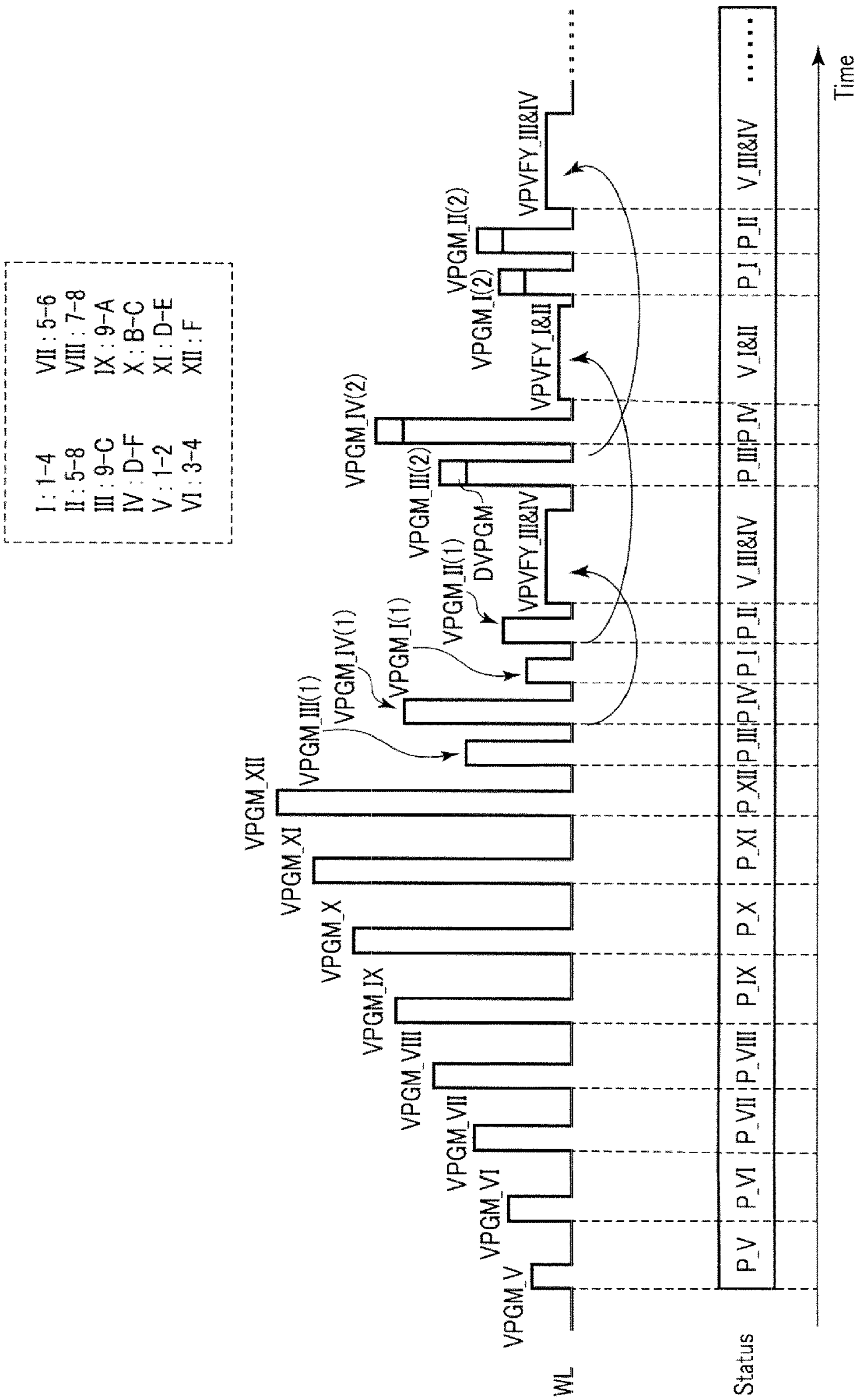

FIG. 167 is a waveform chart schematically showing a waveform of the word line during the write operation.

Figure 168:
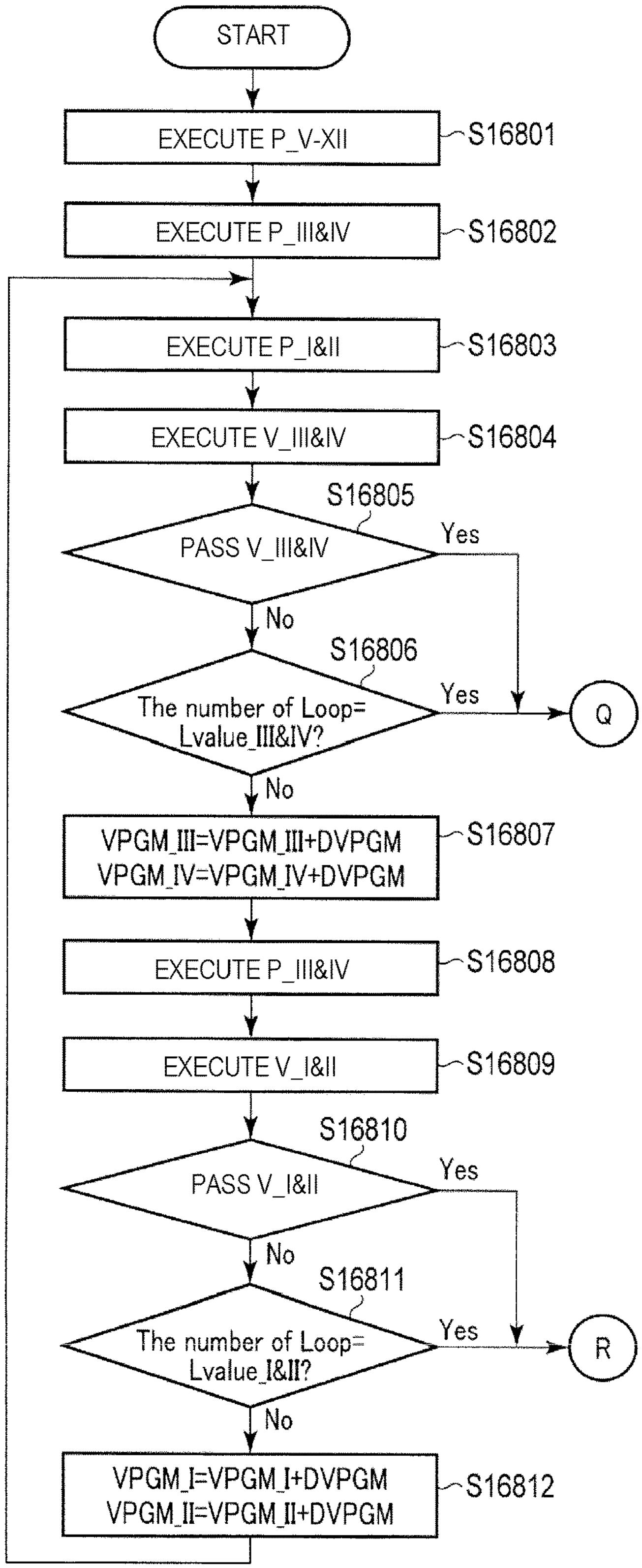

FIG. 168 is a flowchart showing the method of generating the performance order (pulse order) of the program operation and the program verification operation.

Figure 169:
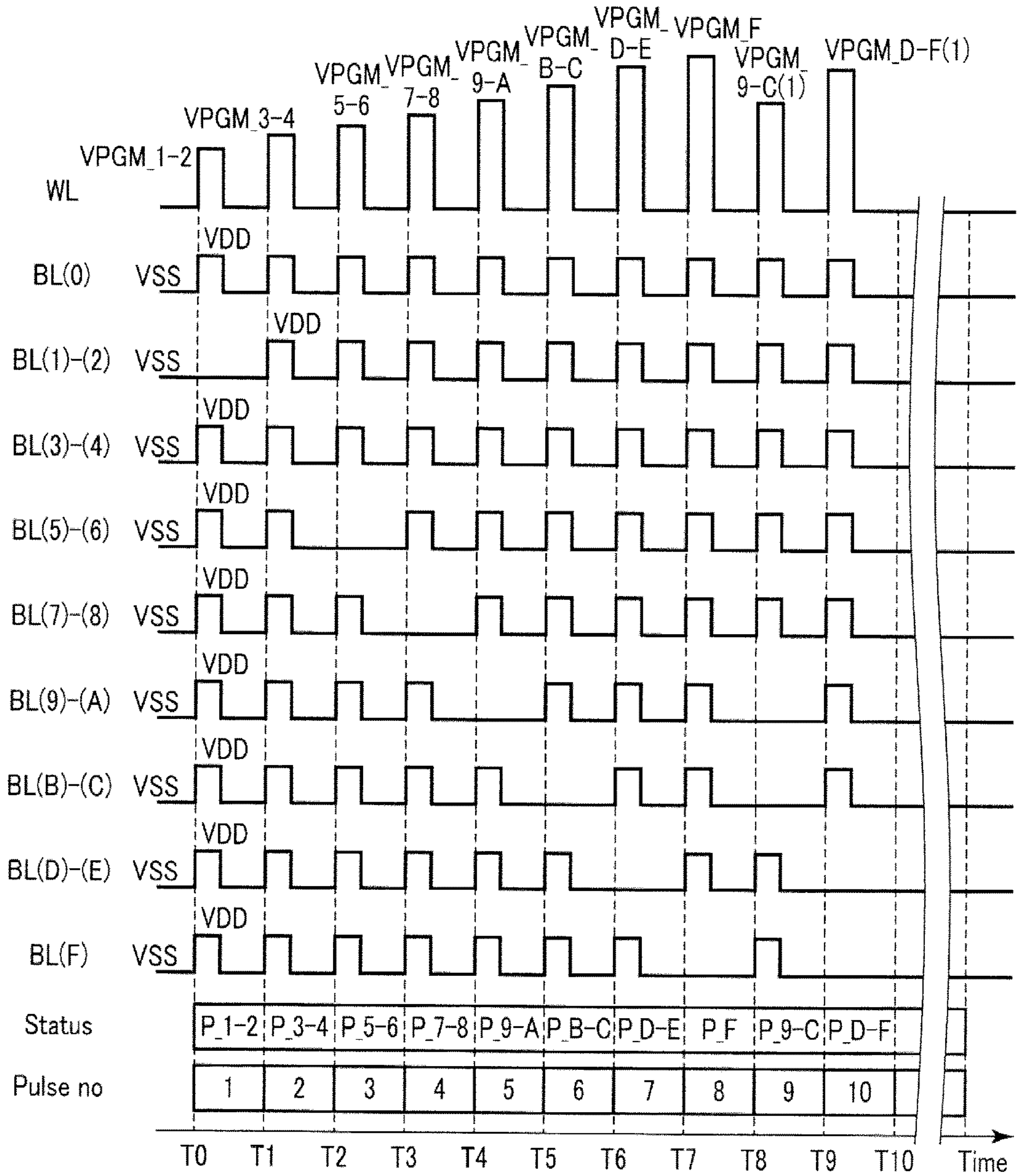

FIG. 169 is a waveform chart showing an example of voltages to be applied to the word lines and the bit lines during the write operation.

FIG. 170 is a table showing the number of loops of the program pulse applied to the word line during the program operation, and verification levels during the program verification.

FIG. 171 is a table showing the number of loops of the program pulse applied to the word line during the program operation, and verification levels during the program verification.

FIG. 172 is a table showing the number of loops of the program pulse applied to the word line during the program operation, and verification levels during the program verification.

FIG. 173 is a table showing the number of loops of the program pulse applied to the word line during the program operation, and verification levels during the program verification.

Figure 174:
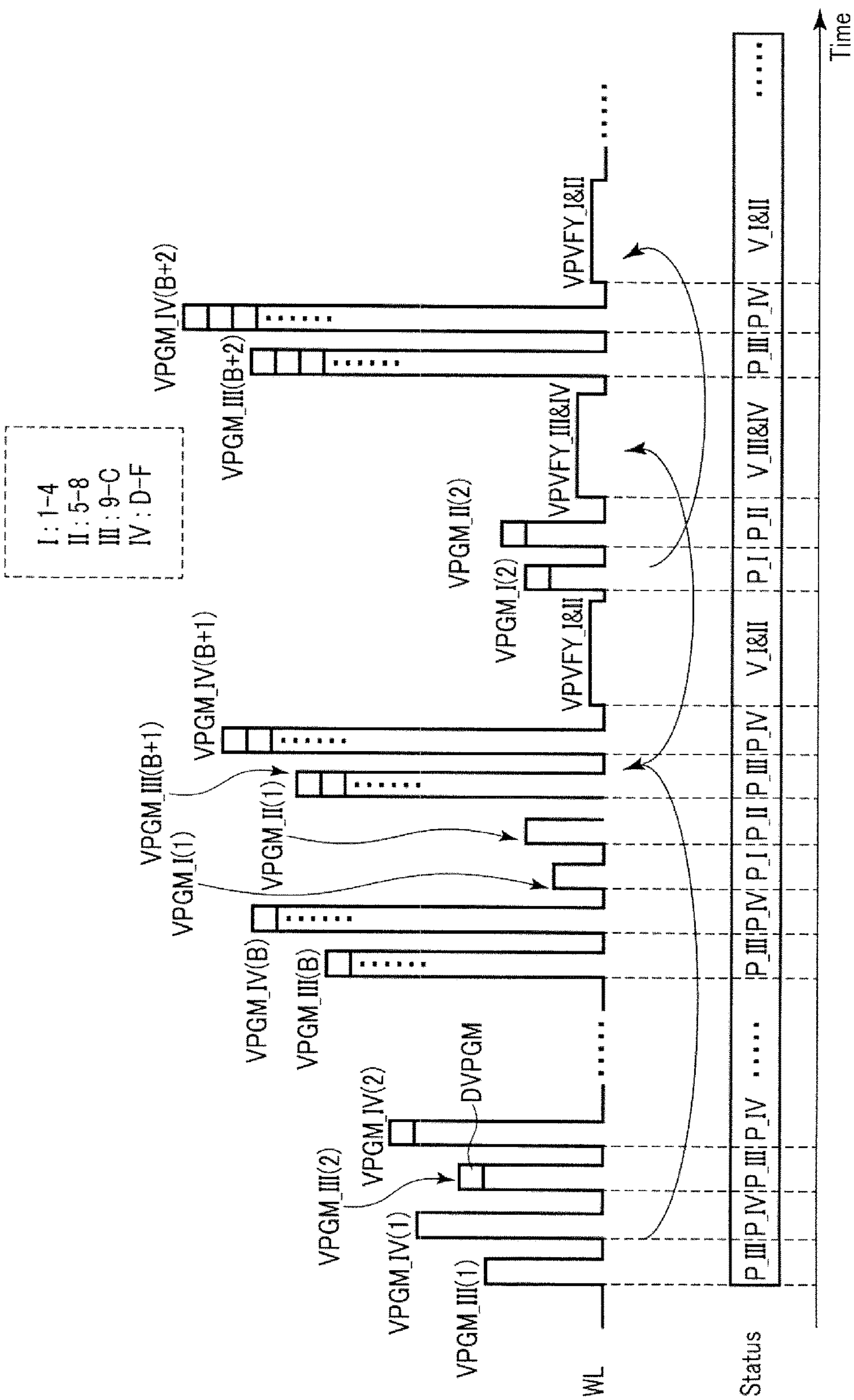

FIG. 174 is a waveform chart schematically showing a waveform of the word line during the write operation.

Figure 175:
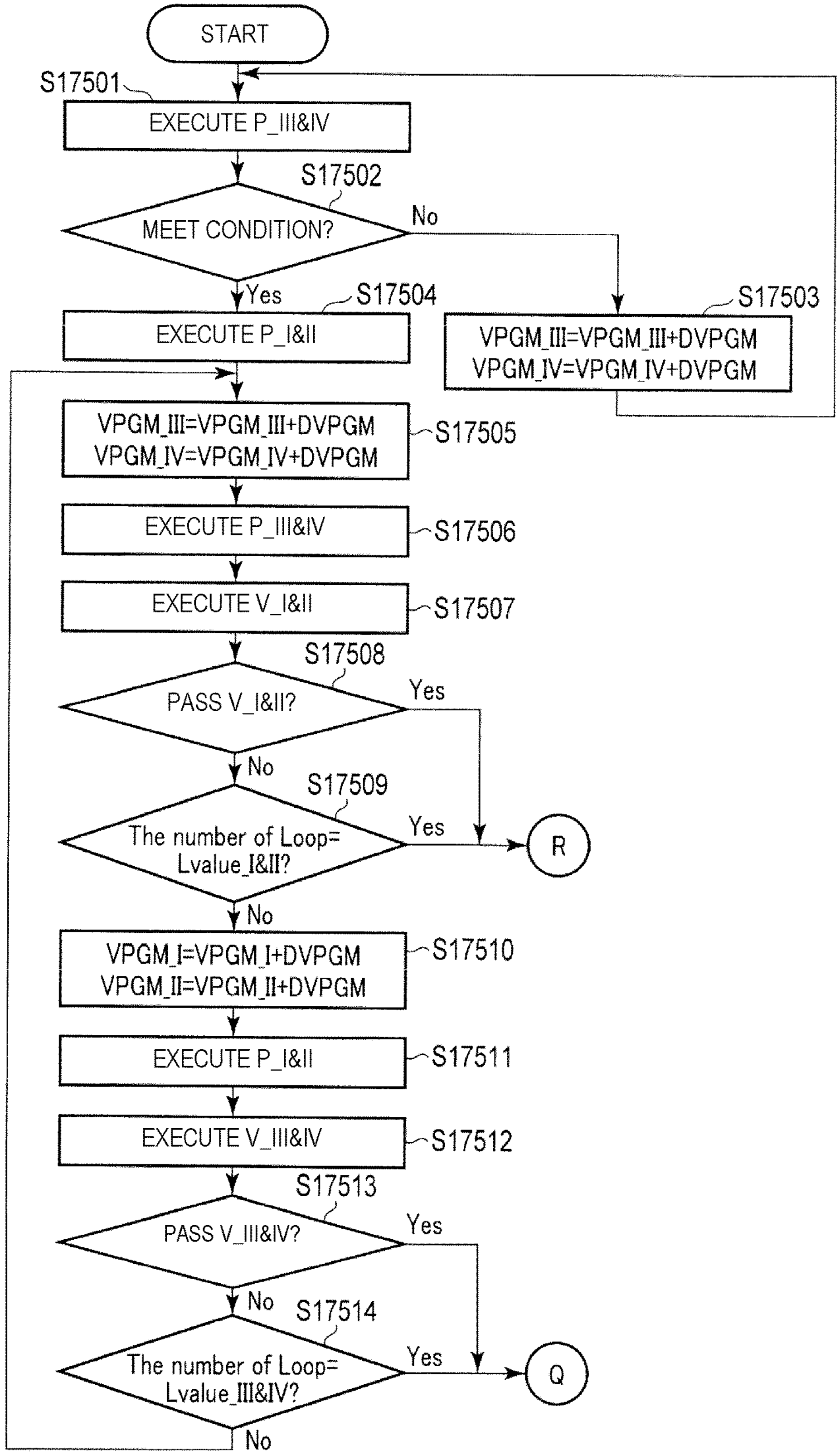

FIG. 175 is a flowchart showing the method of generating the performance order (pulse order) of the program operation and the program verification operation.

Figure 176:
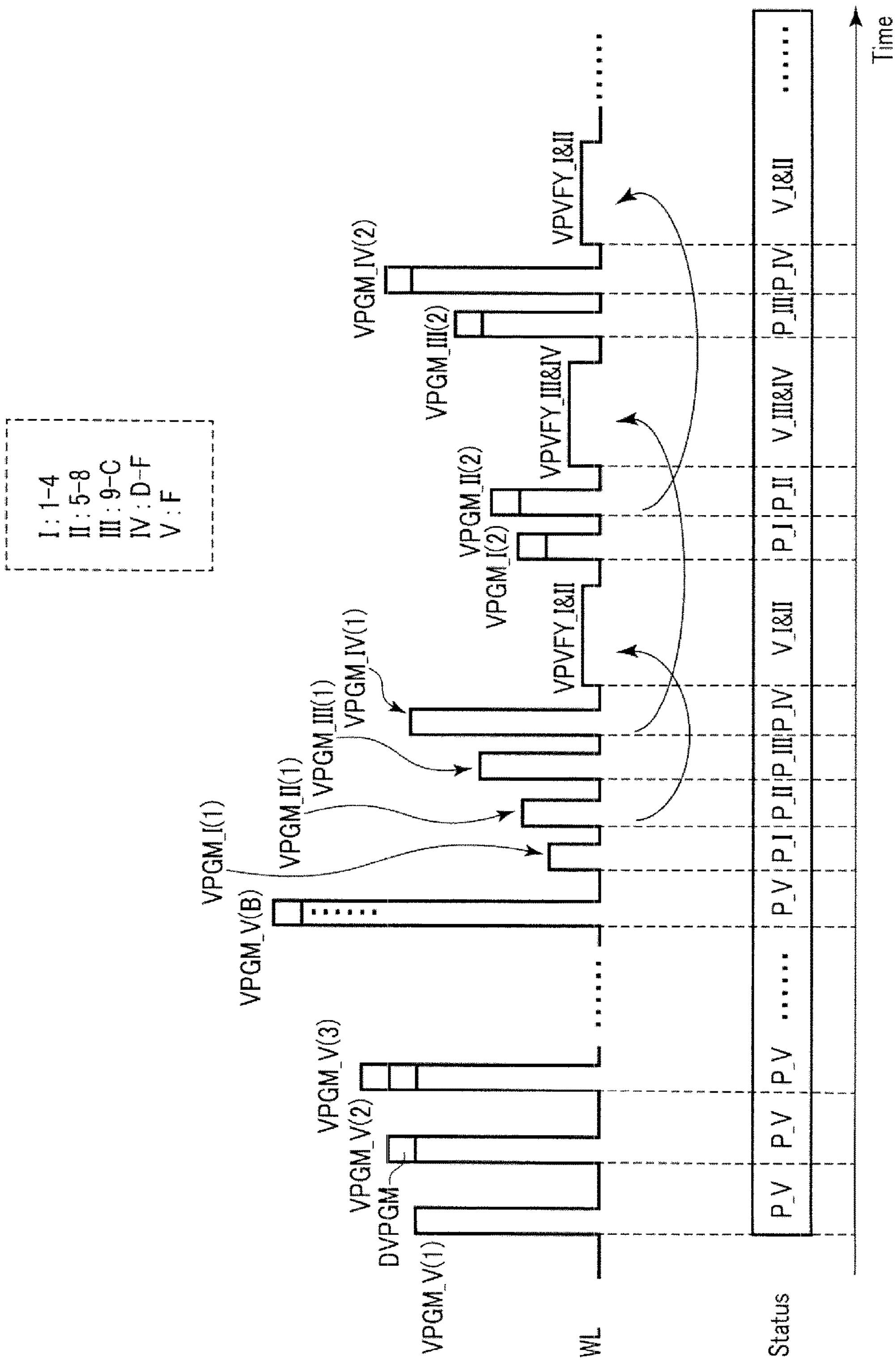

FIG. 176 is a waveform chart schematically showing a waveform of the word line during the write operation.

Figure 177:
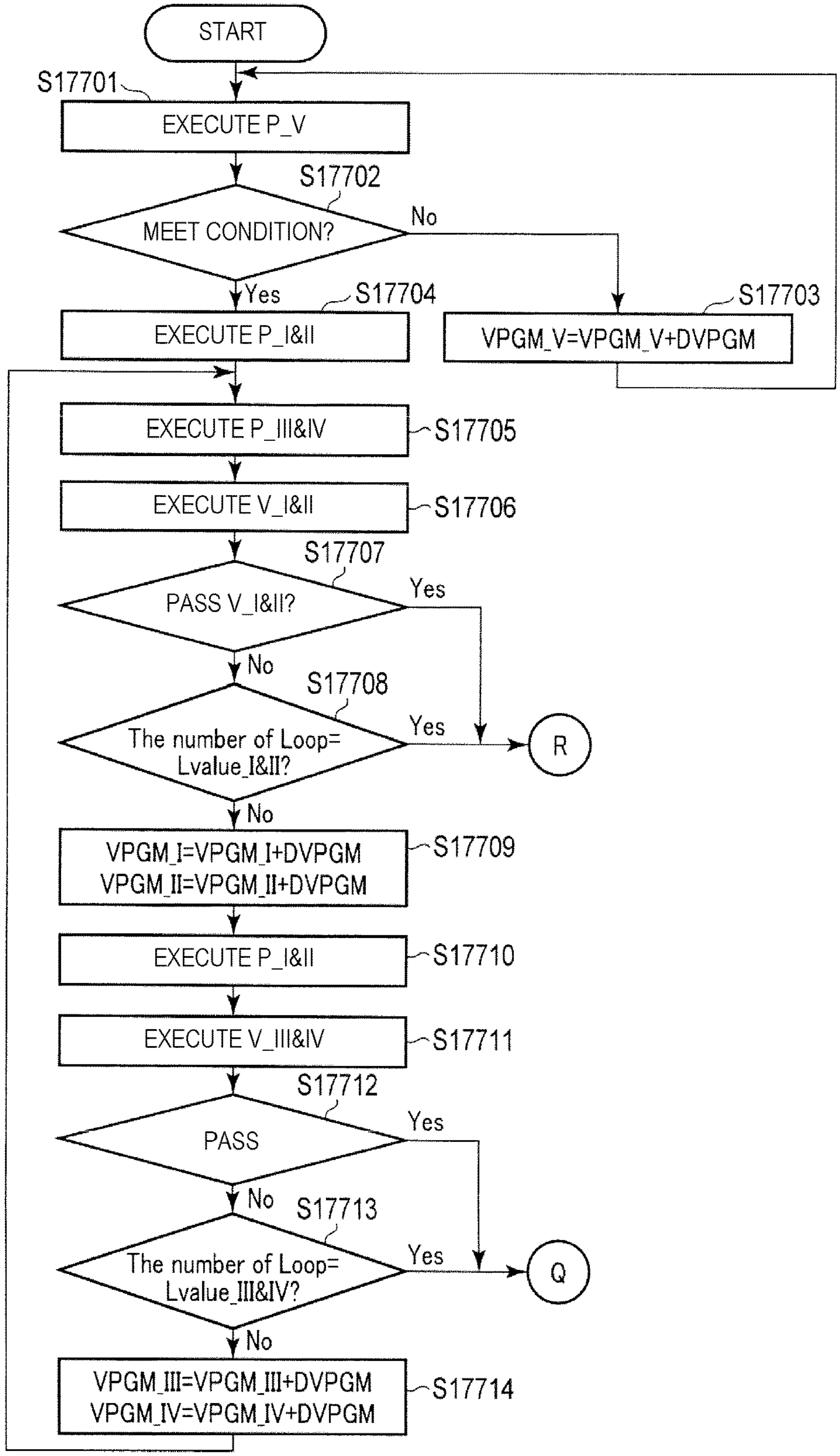

FIG. 177 is a flowchart showing the method of generating the performance order (pulse order) of the program operation and the program verification operation.

Figure 178:
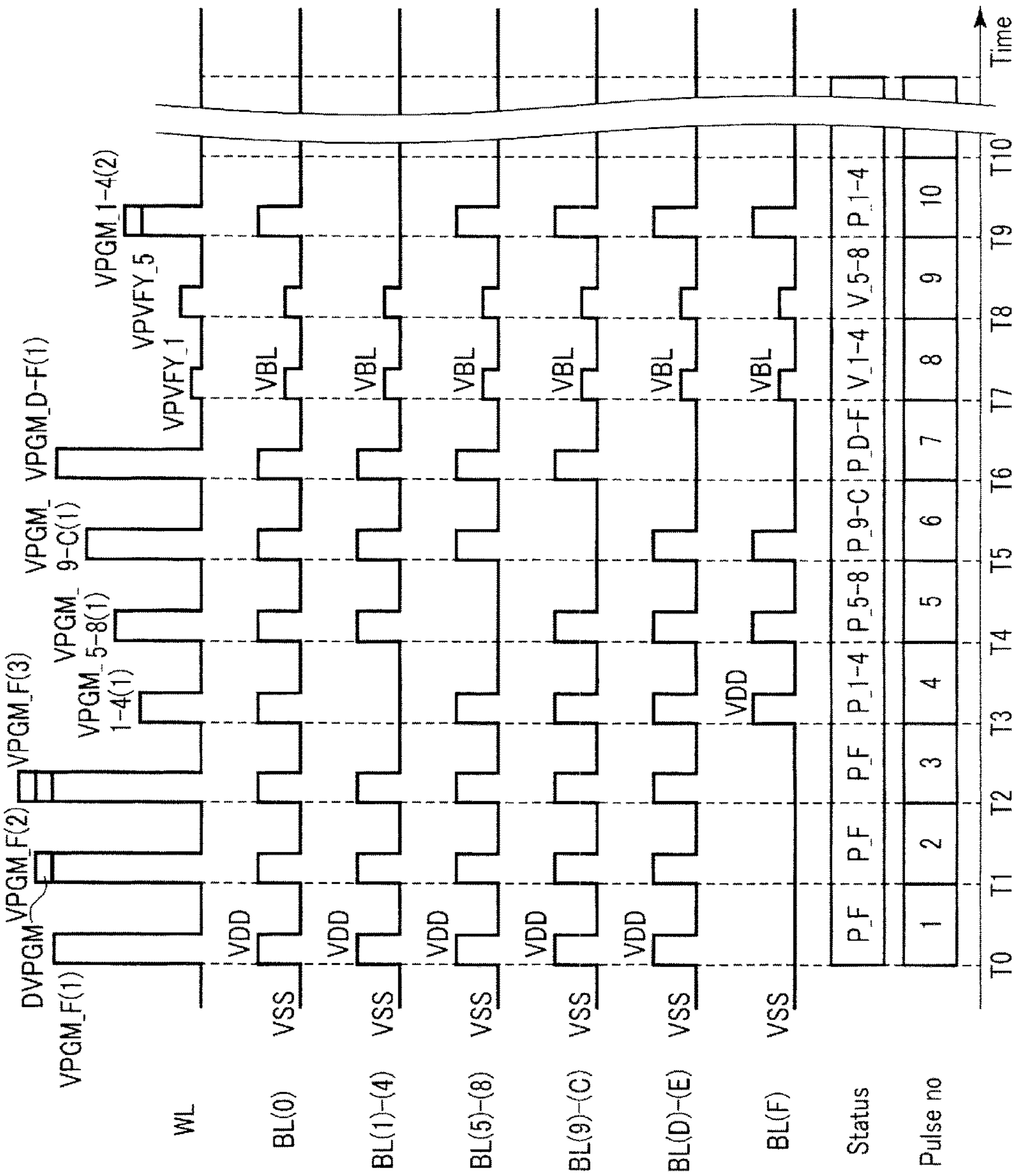

FIG. 178 is a waveform chart showing an example of voltages to be applied to the word lines and the bit lines during the write operation.

FIG. 179 is a table showing the number of loops of the program pulse applied to the word line during the program operation, and verification levels during the program verification.

FIG. 180 is a table showing the number of loops of the program pulse applied to the word line during the program operation, and verification levels during the program verification.

FIG. 181 is a table showing the number of loops of the program pulse applied to the word line during the program operation, and verification levels during the program verification.

Figure 182:
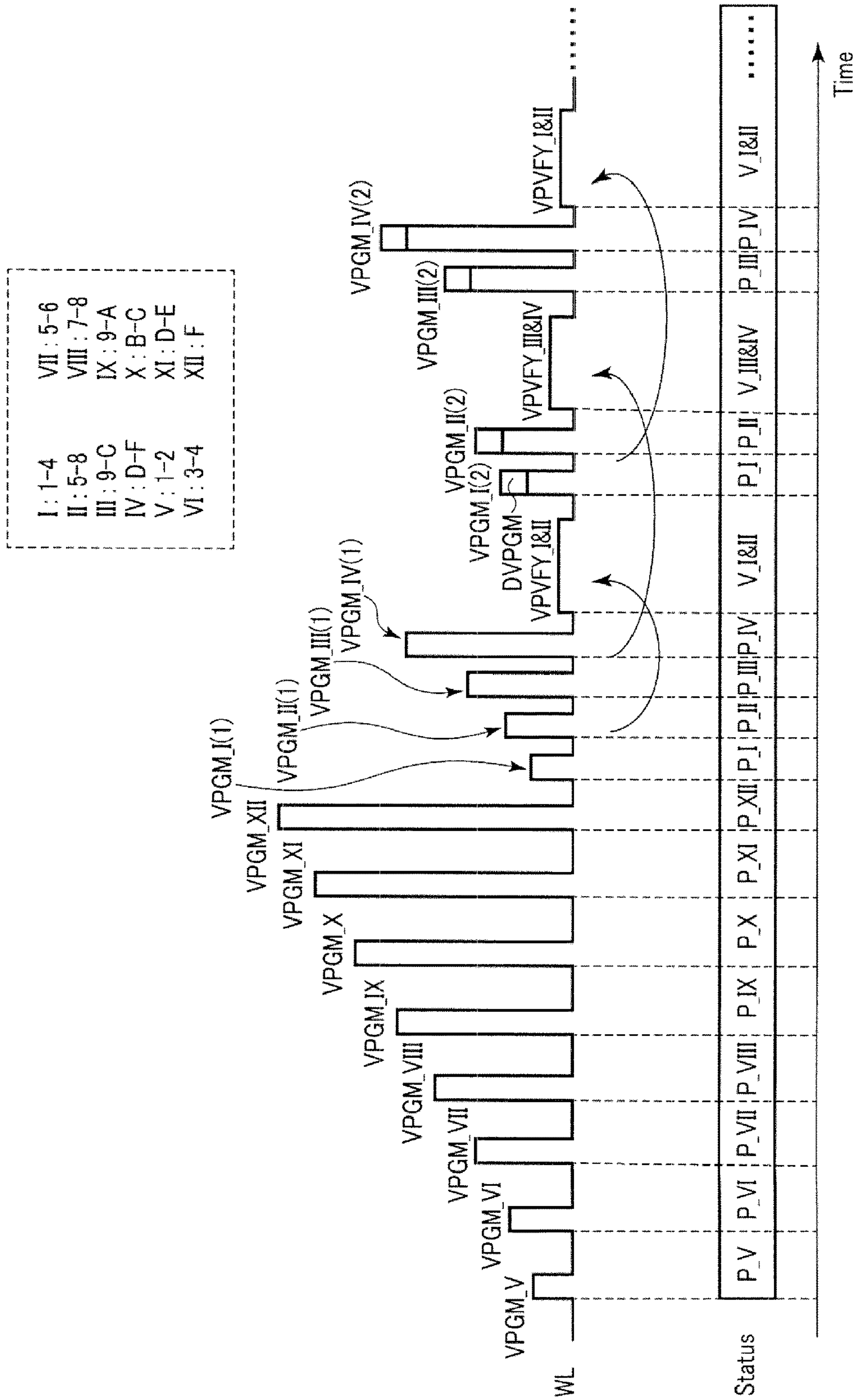

FIG. 182 is a waveform chart schematically showing a waveform of the word line during the write operation.

Figure 183:
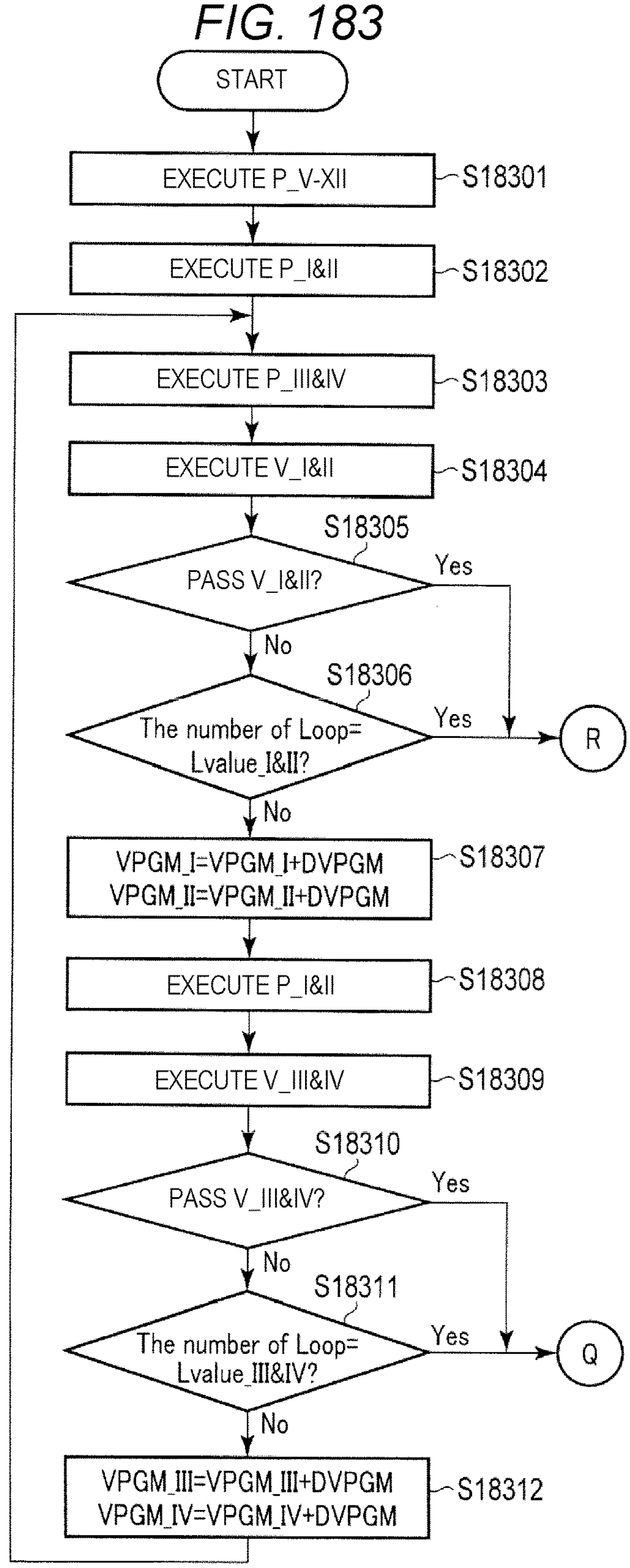

FIG. 183 is a flowchart showing the method of generating the performance order (pulse order) of the program operation and the program verification operation.

Figure 184:
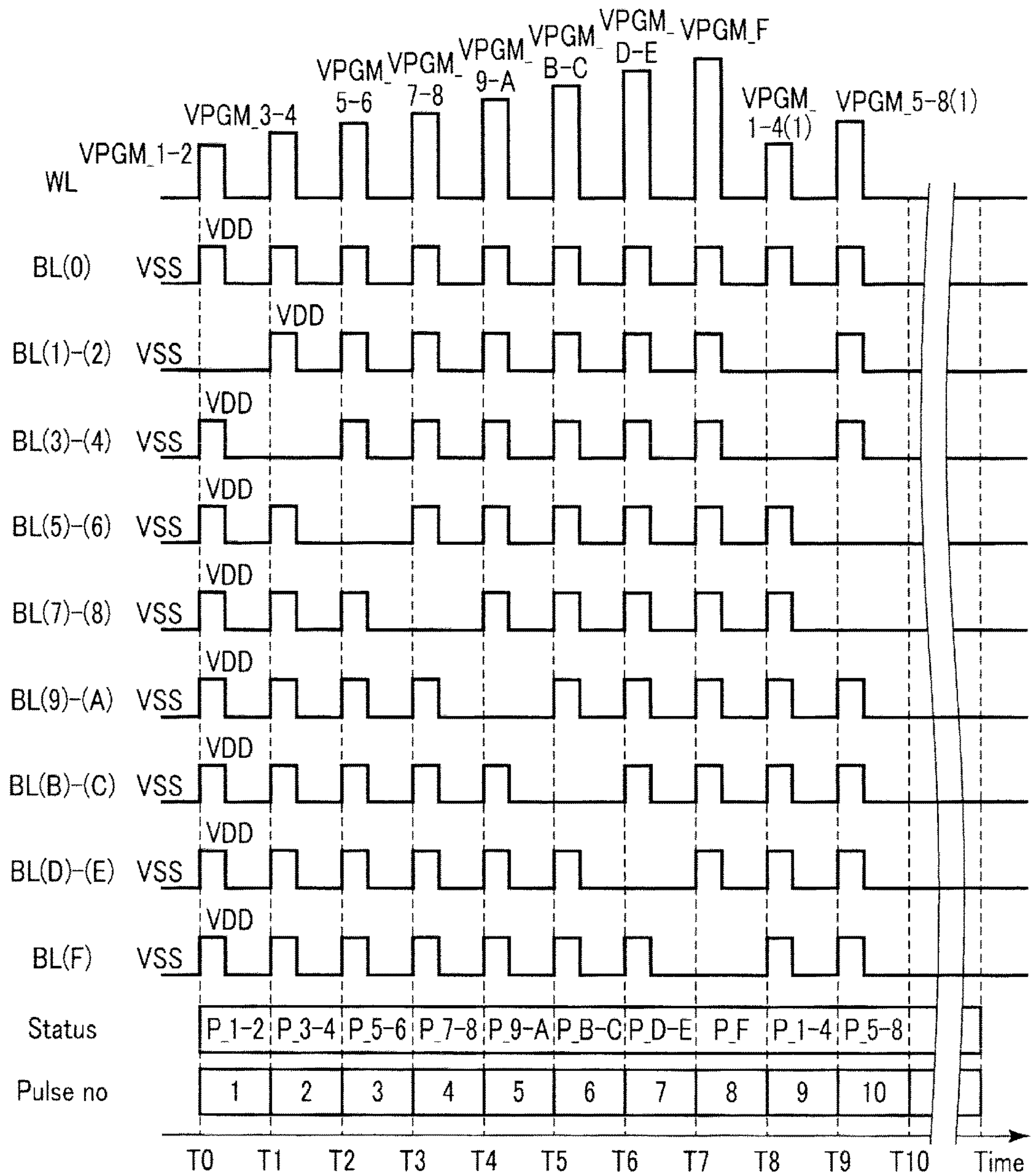

FIG. 184 is a waveform chart showing an example of voltages to be applied to the word lines and the bit lines during the write operation.

FIG. 185 is a table showing the number of loops of the program pulse applied to the word line during the program operation, and verification levels during the program verification.

FIG. 186 is a table showing the number of loops of the program pulse applied to the word line during the program operation, and verification levels during the program verification.

FIG. 187 is a table showing the number of loops of the program pulse applied to the word line during the program operation, and verification levels during the program verification.

FIG. 188 is a table showing the number of loops of the program pulse applied to the word line during the program operation, and verification levels during the program verification.

Figure 189:
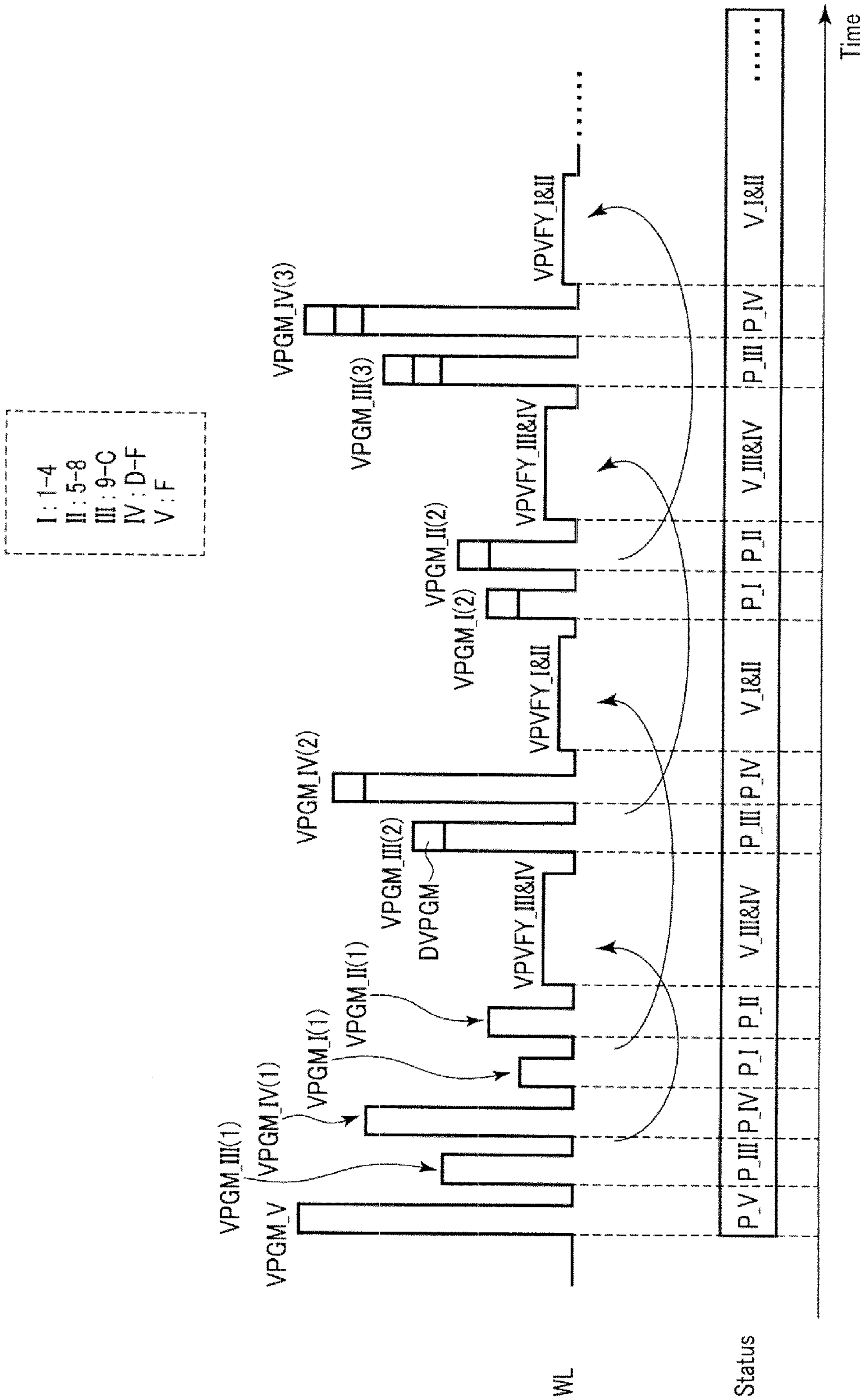

FIG. 189 is a waveform chart schematically showing a waveform of the word line during the write operation.

Figure 190:
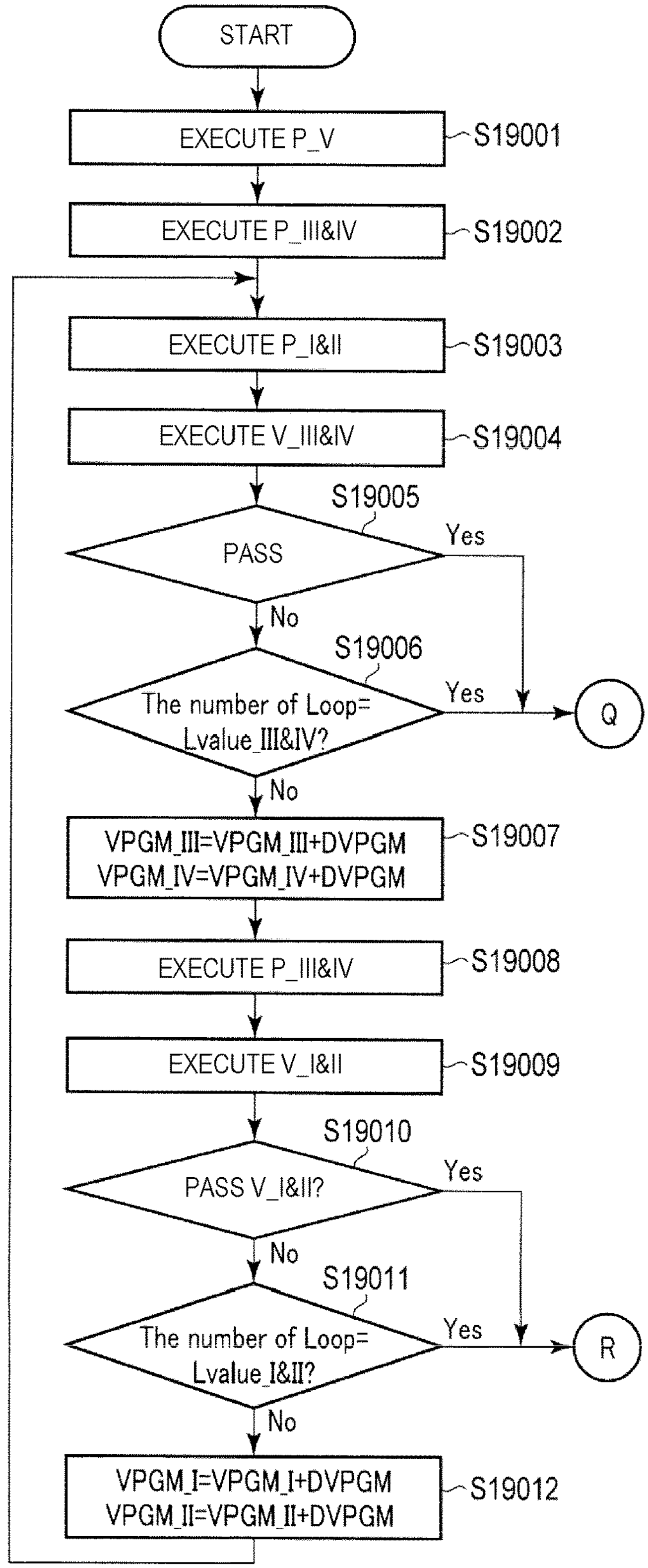

FIG. 190 is a flowchart showing the method of generating the performance order (pulse order) of the program operation and the program verification operation.

Figure 191:
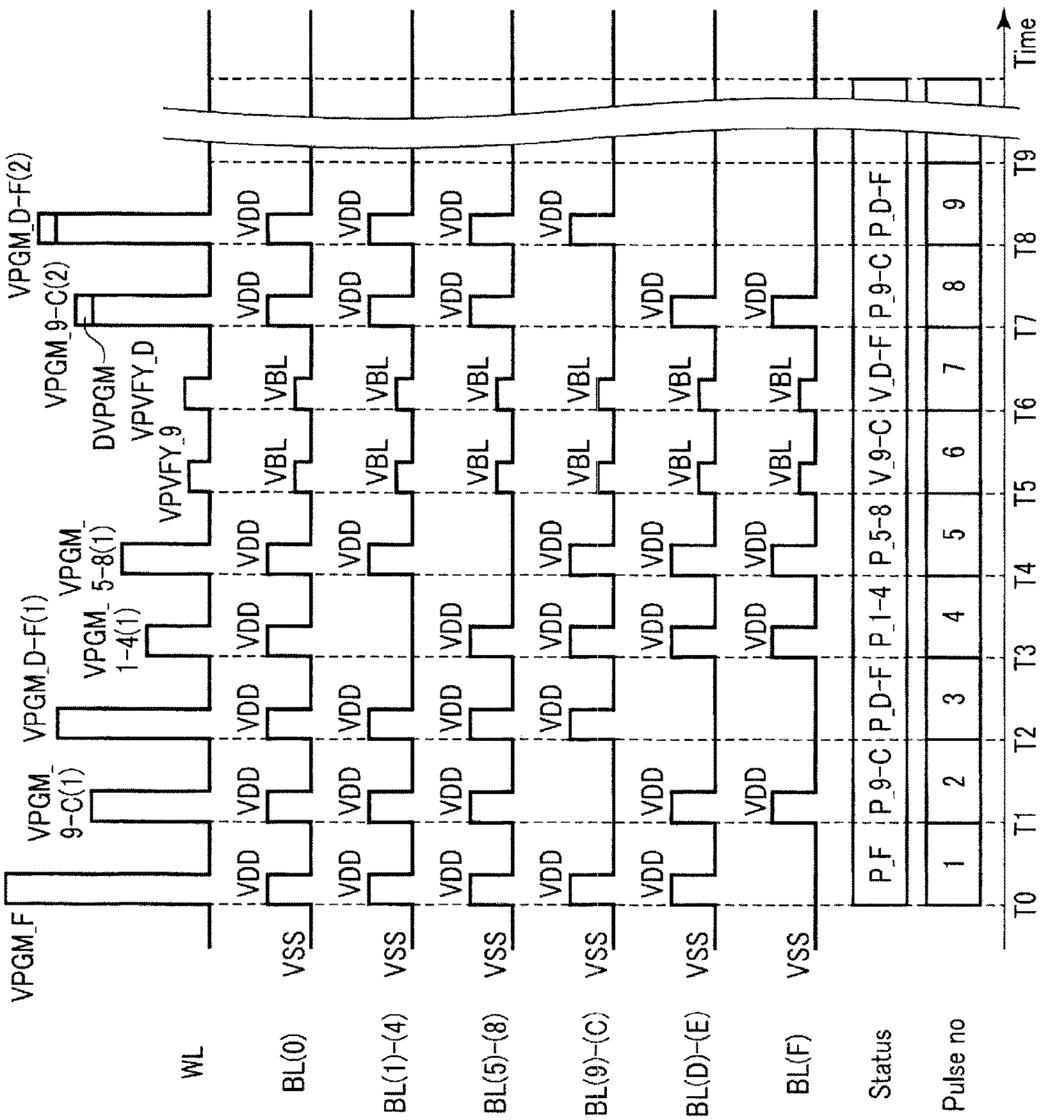

FIG. 191 is a waveform chart showing an example of voltages to be applied to the word lines and the bit lines during the write operation.

FIG. 192 is a table showing the number of loops of the program pulse applied to the word line during the program operation, and verification levels during the program verification.

FIG. 193 is a table showing the number of loops of the program pulse applied to the word line during the program operation, and verification levels during the program verification.

FIG. 194 is a table showing the number of loops of the program pulse applied to the word line during the program operation, and verification levels during the program verification.

Figure 195:
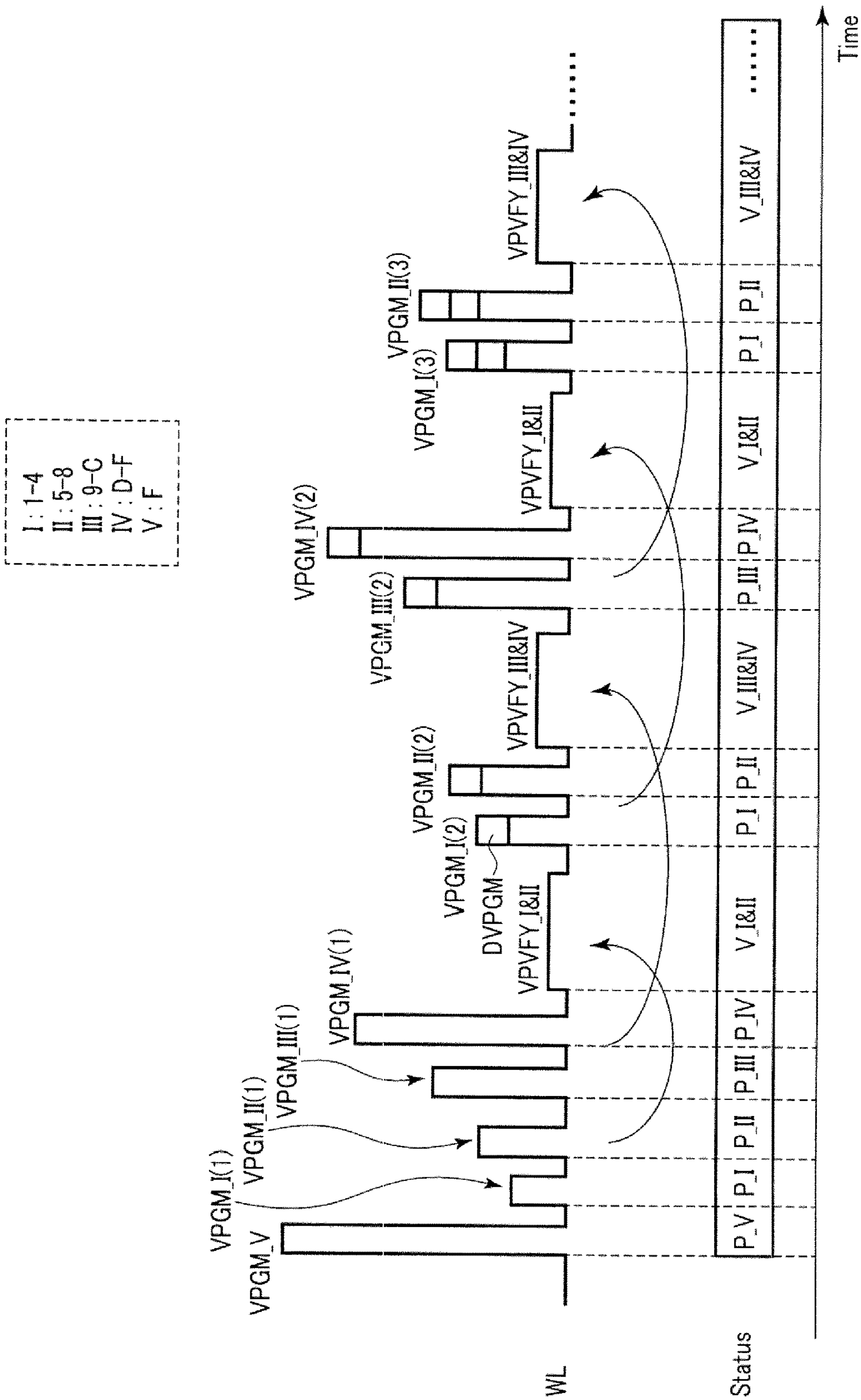

FIG. 195 is a waveform chart schematically showing a waveform of the word line during the write operation.

Figure 196:
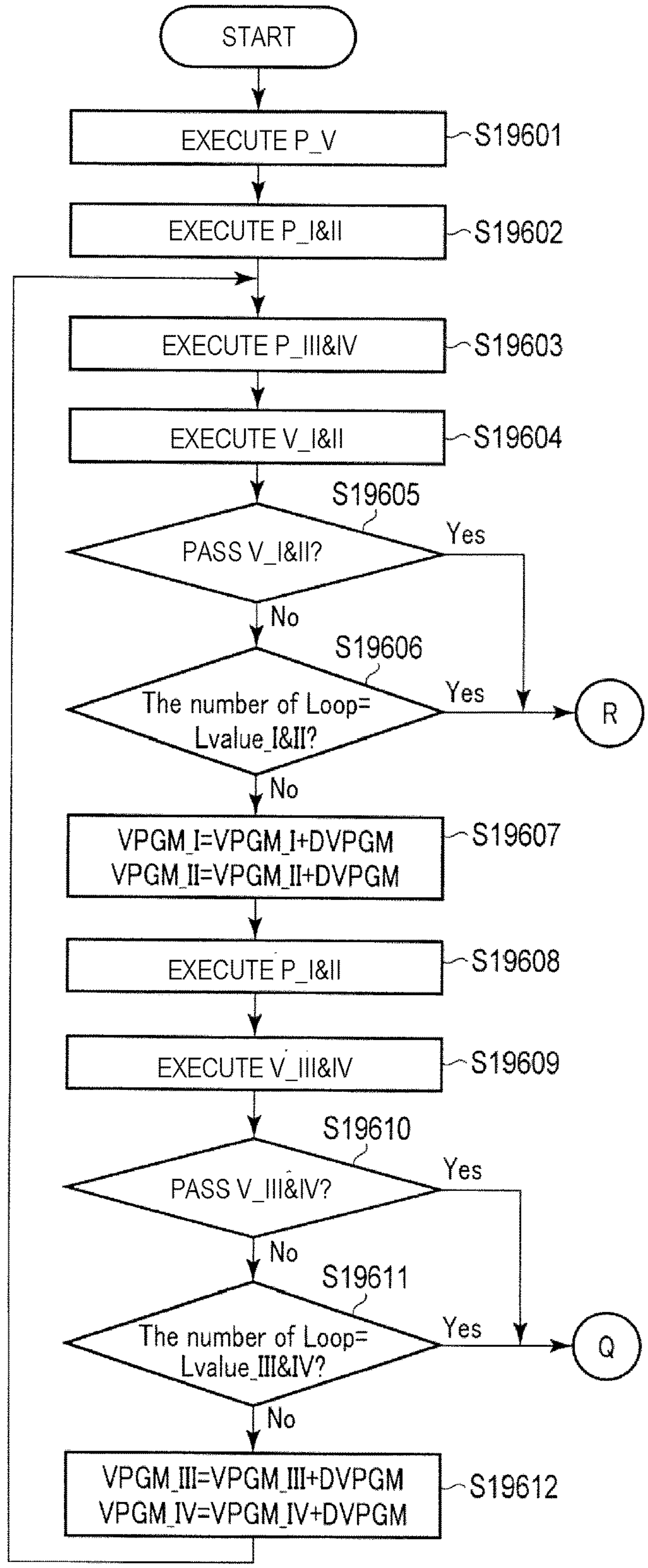

FIG. 196 is a flowchart showing the method of generating the performance order (pulse order) of the program operation and the program verification operation.

Figure 197:
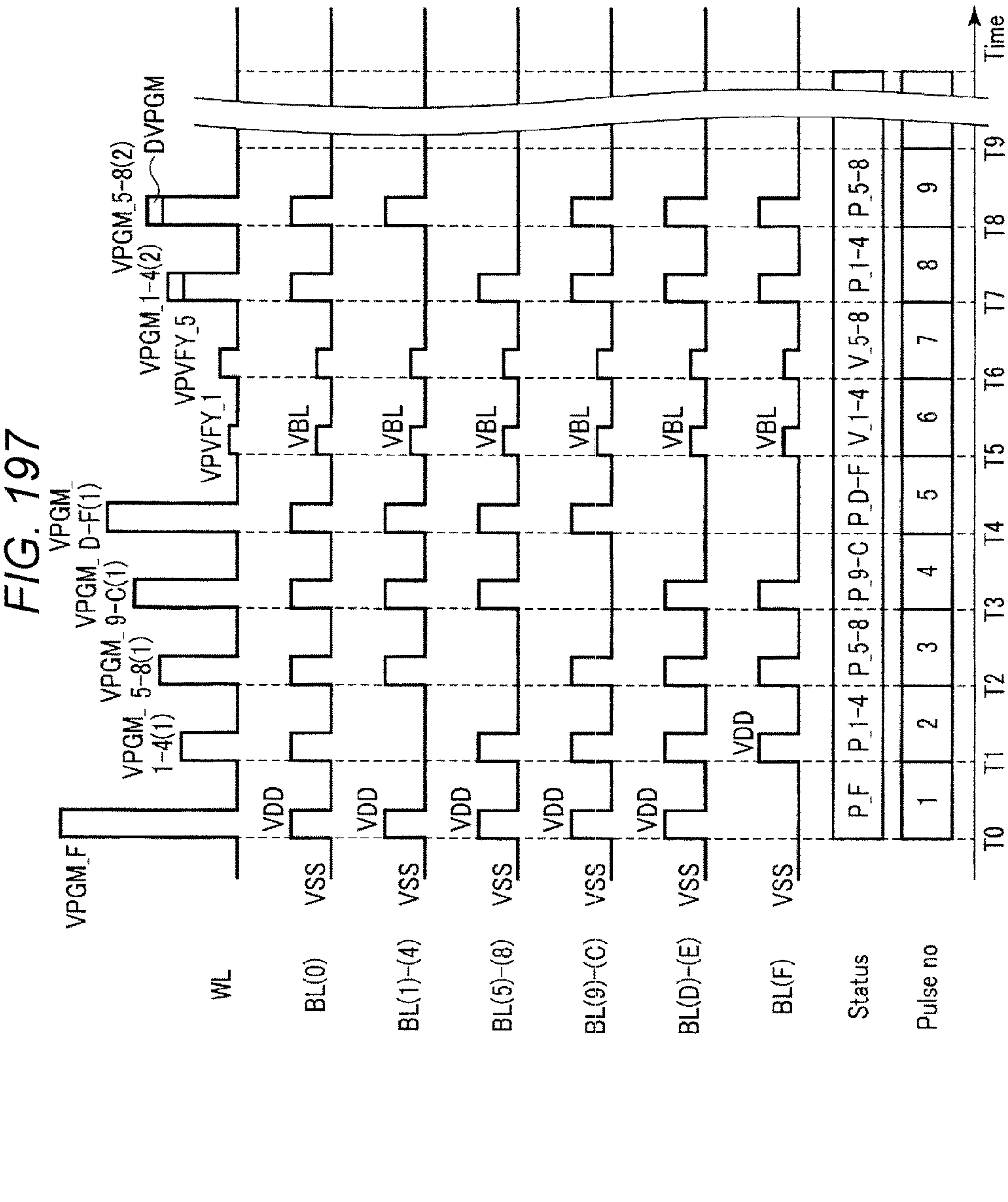

FIG. 197 is a waveform chart showing an example of voltages to be applied to the word lines and the bit lines during the write operation.

FIG. 198 is a table showing the number of loops of the program pulse applied to the word line during the program operation, and verification levels during the program verification.

FIG. 199 is a table showing the number of loops of the program pulse applied to the word line during the program operation, and verification levels during the program verification.

FIG. 200 is a table showing the number of loops of the program pulse applied to the word line during the program operation, and verification levels during the program verification.

DETAILED DESCRIPTION

Embodiments provide a semiconductor memory device which achieves an improvement of operation reliability.

In general, according to one embodiment, a semiconductor memory device includes a plurality of memory cells, a word line electrically connected to gates of the memory cells, and a control circuit configured to execute a write operation on the memory cells. The write operation includes a first program operation during which the control circuit applies a first program voltage to the word line, a first verify operation during which the control circuit applies a first verification voltage to the word line to determine whether or not the first program operation passed, a second program operation during which the control circuit applies a second program voltage, which is different from the first program voltage, to the word line, and a second verify operation during which the control circuit applies a second verification voltage, which is different from the first verification voltage, to the word line to determine whether or not the second program operation passed. The control circuit is configured to execute at least one intervening program or verify operation between the first program operation and the first verify operation.

With reference to the drawings, embodiments will be described below. In the description, common reference numerals denote common components throughout the drawings. In the following description, a three-dimensionally stacked NAND flash memory, having memory cell transistors stacked on a semiconductor substrate one on top of another, is exemplified as a semiconductor memory device.

<1> First Embodiment

A semiconductor memory device according to a first embodiment will be described.

<1-1> Configuration

<1-1-1> Configuration of Memory System

First of all, a configuration of a memory system including the semiconductor memory device according to the first embodiment will be described with reference to FIG. 1.

Figure 1:
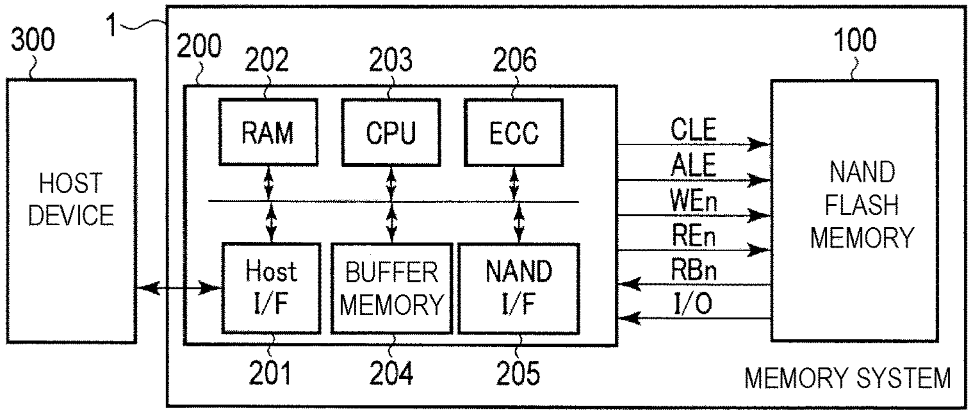
FIG. 1 is a block diagram of a memory system.

A memory system 1 as illustrated in FIG. 1 includes a NAND flash memory 100, and a memory controller 200. The memory controller 200 and the NAND flash memory 100 may constitute a single semiconductor device, for example, by integrating them on a single chip. Examples of the configuration include a memory card such as an SD™ card and an SSD (solid state drive). It is noted that the memory system 1 may have a configuration further including a host device 300.

The NAND flash memory 100 includes a plurality of memory cell transistors, and stores data in a non-volatile manner. Detailed configuration of the NAND flash memory 100 will be described later.

The memory controller 200 issues commands such as a read command, a write command, and an erase command to the NAND flash memory 100 in response to commands from the host device 300.

The memory controller 200 includes a host interface circuit (Host I/F) 201, a built-in memory (e.g., RAM: Random access memory) 202, a processor (e.g., CPU: Central processing unit) 203, a buffer memory 204, a NAND interface circuit (NAND I/F) 205, and an ECC circuit (error correction circuit or ECC) 206.

The host interface circuit 201, which is connected to the host device 300 via a controller bus, controls communication between the memory controller 200 and the host device 300. The host interface circuit 201 transfers a command, being received from the host device 300, to the CPU 203, and transfers data to the buffer memory 204. The host interface circuit 201 transfers the data in the buffer memory 204 to the host device 300 in response to a command from the CPU 203.

The NAND interface circuit 205 is connected to the NAND flash memory 100 via a NAND bus. The NAND interface circuit 205 controls communication between the NAND flash memory 100 and the memory controller 200. The NAND interface circuit 205 transfers a command received from the CPU 203 to the NAND flash memory 100. Furthermore, the NAND interface circuit 205 transfers write data in the buffer memory 204 to the NAND flash memory 100 when writing data. When reading data, the NAND interface circuit 205 transfers data read from the NAND flash memory 100 to the buffer memory 204.

The NAND bus transmits signals in accordance with the NAND interface. Specific examples of these signals include a command latch enable signal CLE, an address latch enable signal ALE, a write enable signal WEn, a read enable signal REn, a ready/busy signal RBn, and an input/output signal I/O.

The signals CLE and ALE are signals that notify that the input signals I/O to the NAND flash memory 100 are a command and an address, respectively, to the NAND flash memory 100. The signal WEn is a signal that is asserted at a low level, and causes the NAND flash memory 100 to capture the input signal I/O. As used herein, the term "assert" means that the signal (or logic) is true (in an active state), and as an opposite term, the term "negate" means that the signal (or logic) is false (in an inactive state). The signal REn is also a signal that is asserted by a low level and is emitted to cause data to be output through the output signal I/O from the NAND flash memory 100. The ready/busy signal RBn is a signal that indicates whether the NAND flash memory 100 is in the ready state (in a state of being ready for receiving a command from the memory controller 200) or in a busy state (in a state of being not ready to receive the command from the memory controller 200), and a low level corresponds to the busy state. The input/output signal I/O is, for example, an 8-bit signal. The input/output signal I/O contains data transmitted between the NAND flash memory 100 and the memory controller 200, and includes a command, an address, write data, and read data.

The CPU 203 controls an operation of the memory controller 200. For example, the CPU 203 issues a write command based on the NAND interface circuit 205 upon reception of the write command from the host device 300. The same applies to the read command and the erase command. The CPU 203 performs various processes for controlling the NAND flash memory 100 such as wear leveling. Furthermore, the CPU 203 performs various types of operations. For example, the CPU 203 performs a data coding process, a randomizing process, and the like. It is noted that the CPU 203 controls an operation of the memory system 1 also in a case where the host device 300 is included in the memory system 1.

The ECC circuit 206 performs an ECC (Error Checking and Correcting) process on data. In other words, when data is written, the ECC circuit 206 generate a parity based on the written data. In contrast, when data is read out, the ECC circuit 206 generates a syndrome from the parity, detects an error, and corrects the error. Alternatively, the CPU 203 may perform the function of the ECC circuit 206.

The built-in memory 202 is a semiconductor memory such as DRAM, and is used as a workspace for the CPU 203. The built-in memory 202 stores firmware for controlling the NAND flash memory 100, various types of control tables, and the like.

<1-1-2> Configuration of NAND Flash Memory

Subsequently, a configuration of the NAND flash memory 100 will be described with reference to FIG. 2.

Figure 2:
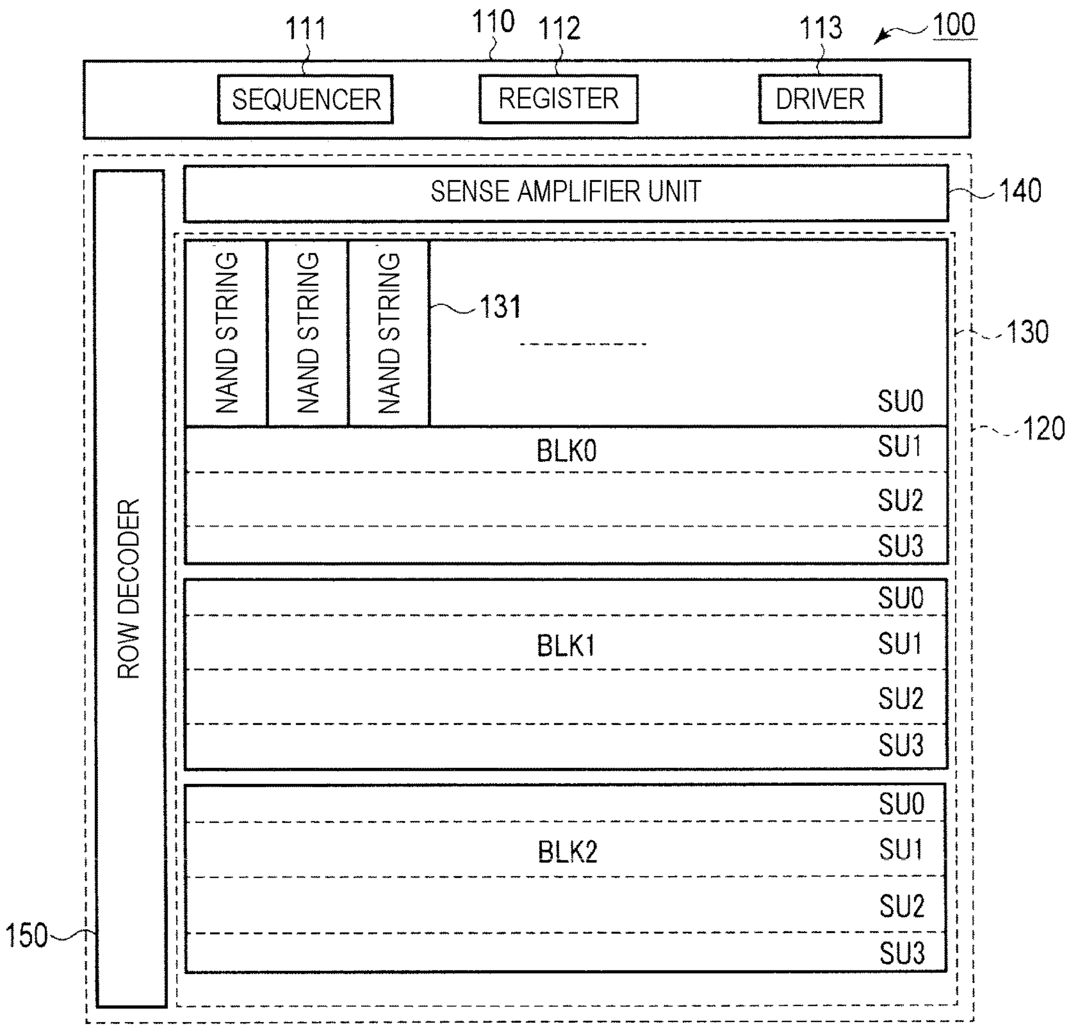
FIG. 2 is a block diagram of a NAND flash memory.

In the example illustrated in FIG. 2, the NAND flash memory 100 includes a peripheral circuit 110 and a core section 120 as illustrated in FIG. 2.

The core section 120 includes a memory cell array 130, a sense amplifier unit 140, and a row decoder (R/D) 150.

The memory cell array 130 includes a plurality of non-volatile memory cell transistors, each being associated with the word line and the bit line. The memory cell array 130 includes a plurality of (three in the example illustrated in FIG. 2) blocks BLK (BLK0, BLK1, BLK2, . . . ), each of which is a set of the plurality of non-volatile memory cell transistors.

Erasing data may be performed unit by unit such as block BLK, or by a unit smaller than the block BLK. An erasing method is described in U.S. Ser. No. 13/235,389 entitled "NONVOLATILE SEMICONDUCTOR MEMORY DEVICE," filed on Sep. 18, 2011. It is also described in U.S. Ser. No. 12/694,690 entitled "NONVOLATILE SEMICONDUCTOR STORAGE DEVICE," filed on Jan. 27, 2010. Furthermore, it is described in U.S. Ser. No. 13/483,610 entitled "NONVOLATILE SEMICONDUCTOR MEMORY DEVICE AND DATA ERASE METHOD THEREOF," filed on May 30, 2012. These patent applications are incorporated herein by reference in their entirety.

Each of the block BLK includes a plurality of (four in the example illustrated in FIG. 2) string units SU (SU0, SU1, SU2, and SU3), each being a set of NAND strings 131 each including the memory cell transistors connected in series). The number of blocks in the memory cell array 130 and the number of string units in one block BLK are arbitrary as a matter of course. An address which indicates a physical location of the block in the memory cell array 130 is referred to as "block address".

The row decoder 150 selects a block corresponding to the block address and enables a word line of the selected block to be a desired voltage.

When reading out data, the sense amplifier unit 140 senses data on a bit line that is read from the memory cell transistor.

The peripheral circuit 110 includes a sequencer 111, a register 112, and a driver 113.

The sequencer 111 controls the operation of the NAND flash memory 100.

The register 112 stores various types of signals. For example, the register 112 stores status information of writing or erasing operations, which notifies the controller whether or not the operations have been successfully completed. It is noted that the register 112 is capable of storing information for various tables.

The driver 113 supplies voltages required for writing, reading and erasing data to the row decoder 150, the sense amplifier unit 140, and a source line driver, which is not illustrated.

<1-1-3> Memory Cell Array

Figure 3:
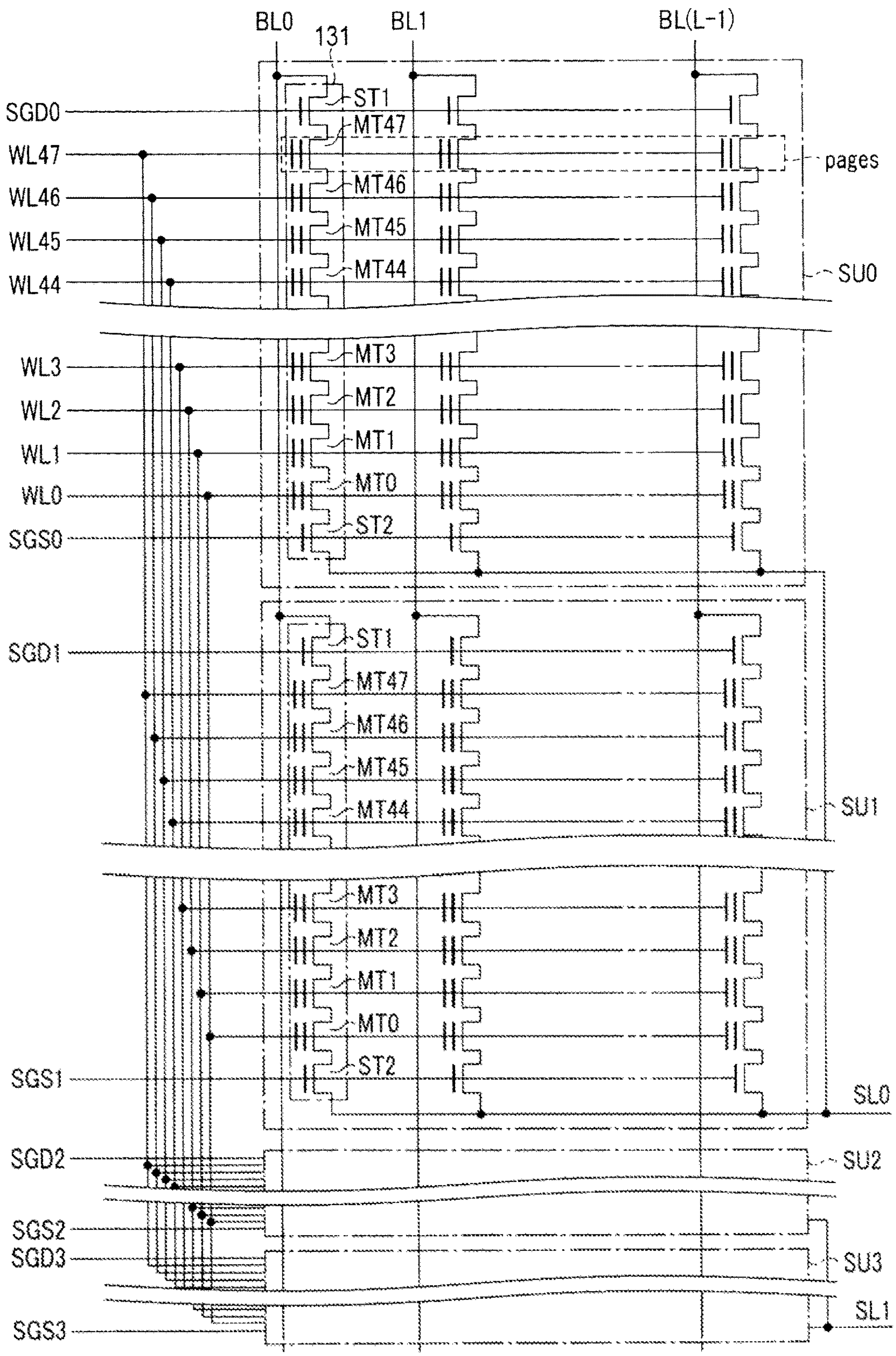
FIG. 3 is a circuit diagram of a memory cell array.

Referring now to FIG. 3, a configuration of the memory cell array will be described. FIG. 3 illustrates a certain block BLK. As illustrated in FIG. 3, the block BLK of the first embodiment includes, for example, four string units SU (SU0 to SU3). Each string unit SU includes a plurality of the NAND strings 131.

Each NAND string 131 includes select transistors ST1, ST2, and a plurality of (forty-eight in FIG. 3, for example) memory cell transistors MT (MT0 to MT47). The memory cell transistors MT includes a control gate and a charge storage layer, and retains data in a non-volatile manner. The plurality of memory cell transistors MT (memory cell transistor group) is connected between a source of the selected transistor ST1 and a drain of the select transistor ST2 in series. The number of the memory cell transistors is not limited to any particular number.

The gates of the selected transistors ST1 of each of the string units SU0 to SU3 are each connected to one of select gate lines SGD0 to SGD3. In contrast, the gates of the select transistors ST2 of each of the string units SU0 to SU3 are each connected to, for example, one of select gate lines SGS0 to SGD3, which are commonly connected. Alternatively, the gates of the select transistors ST2 may be connected to one of select gate lines SGS0 to SGS3, which are not commonly connected. The control gates of the memory cell transistors MT (MT0 to MT47) in the same block BLK are connected to the word lines WL (WL0 to WL47), respectively.

In the memory cell array 130, drains of the select transistors ST1 of the NAND strings 131 in the same column are connected to one of bit lines BL (BL0 to BL(L−1); L is a natural number not smaller than 2). In other words, the bit lines BL are connected to the NAND strings 131 in the plurality of blocks BLK. In addition, the sources of a plurality of the select transistors ST2 are connected to source lines SL.

Figure 4:
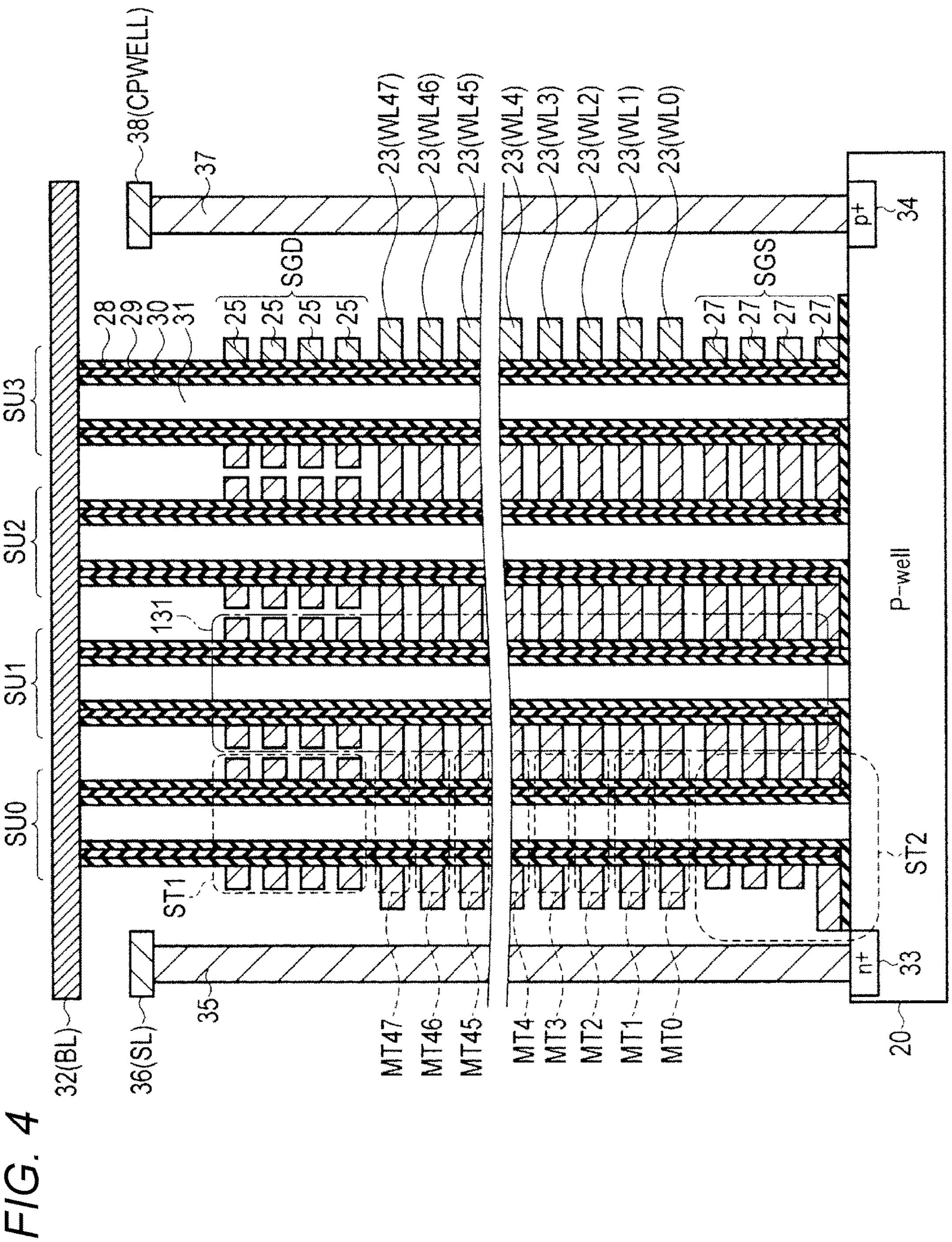
FIG. 4 is a cross-sectional view of the memory cell array.

Referring now to FIG. 4, a cross section of part of the block BLK will be described. FIG. 4 is a cross-sectional view of part of the block BLK. In the example illustrated in FIG. 4, the plurality of NAND strings 131 are formed on a P-well region 20. In other words, for example, four wiring layers 27 functioning as the select gate lines SGS, forty-eight layers of wiring layers 23 functioning as the word lines WL0 to WL47, and, for example, four wiring layers 25 functioning as the select gate lines SGD are stacked on the well region 20 in sequence. Insulating films, which are not illustrated, are formed between the stacked wiring layers.

Pillar shaped semiconductors 31 which penetrate through these wiring layers 25, 23, and 27, and reach the well region 20, are formed. A gate insulating film 30, a charge storage layer (insulating film) 29, and a block insulating film 28 are formed in sequence on each side surface of the semiconductors 31, to form the memory cell transistors MT, and the select transistors ST1 and ST2. The semiconductors 31 function as current channels of the NAND strings 131, and current channels of the respective transistors. Upper ends of the semiconductors 31 are connected to a metal wiring layer 32 which functions as the bit line BL.

An $n^+$ type impurity diffusion layer 33 is formed in a top surface area of the well region 20. A contact plug 35 is formed on the diffusion layer 33, and the contact plug 35 is connected to a metal wiring layer 36 which functions as the source line SL. In addition, a $p^+$ type impurity diffusion layer 34 is formed in a top surface area of the well region 20. A contact plug 37 is formed on the diffusion layer 34, and the contact plug 37 is connected to a metal wiring layer 38 which functions as well wiring CPWELL. The well wiring CPWELL is wiring for applying a voltage to the semiconductors 31 via the well region 20.

A plurality of the configurations described thus far are arranged in a depth direction of FIG. 4, and a set of the plurality of NAND strings 131 arranged in the depth direction constitutes one string unit SU.

In addition, the configuration of the memory cell array 130 may have other configurations, such as the configurations described in U.S. Ser. No. 12/407,403 entitled "THREE DIMENSIONAL LAYERED NON-VOLATILE SEMICONDUCTOR MEMORY," filed on Mar. 19, 2009, U.S. Ser. No. 12/406,524 entitled "THREE DIMENSIONAL LAYERED NON-VOLATILE SEMICONDUCTOR MEMORY," filed on Mar. 18, 2009, U.S. Ser. No. 12/679,991 entitled "NONVOLATILE SEMICONDUCTOR MEMORY DEVICE AND METHOD OF MANUFACTURING THE SAME," filed on Mar. 25, 2010, and U.S. Ser. No. 12/532,030 entitled "SEMICONDUCTOR MEMORY AND METHOD OF MANUFACTURING THE SAME," filed on Mar. 23, 2009. These patent applications are incorporated herein by reference in their entirety.

<1-1-4> Sense Amplifier Unit

<1-1-4-1> Outline of Sense Amplifier Unit

Subsequently, a configuration of the sense amplifier unit 140 will be described. Although a case where data is identified by sensing a current flowing in the bit lines is exemplified as the sense amplifier unit 140 described in this example below, a configuration that senses a voltage is also applicable.

Figure 5:
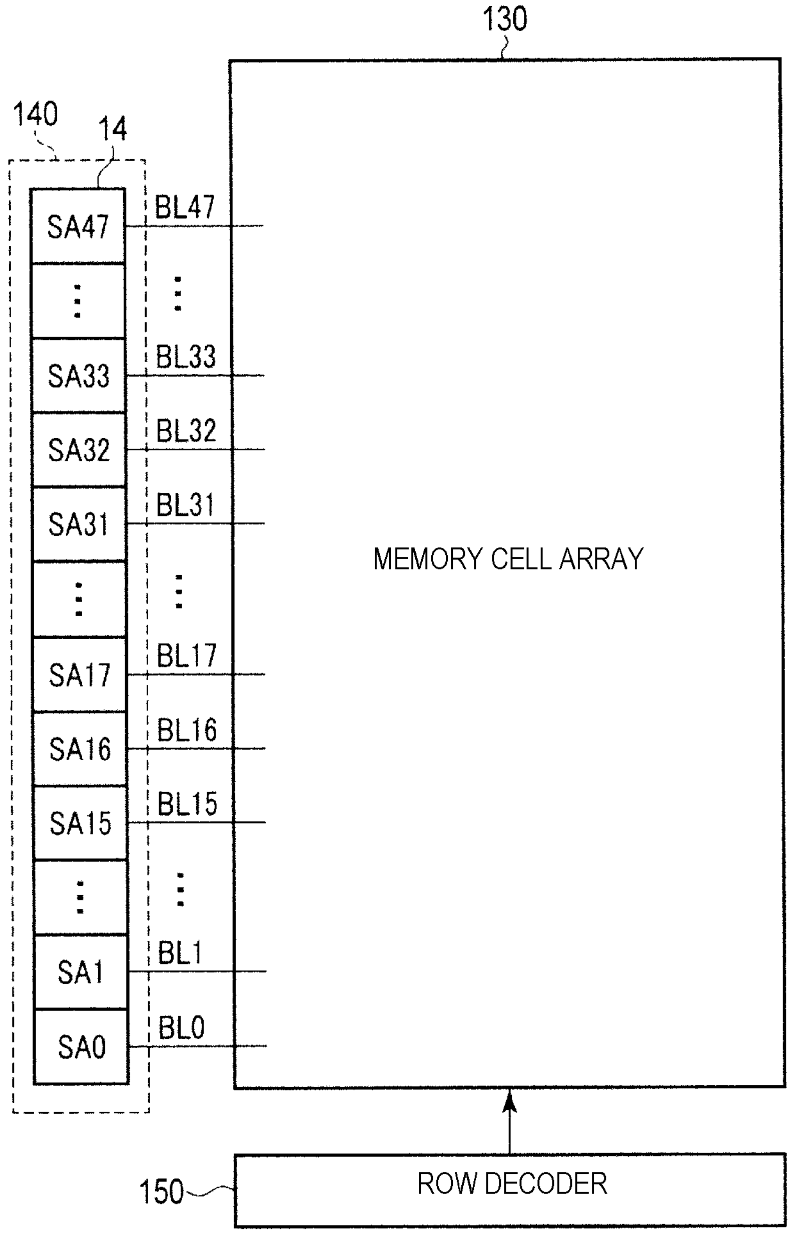
FIG. 5 is a block diagram illustrating an outline of a sense amplifier unit.

As illustrated in FIG. 5, the memory cell array 130 of this example includes forty-eight bit lines BL0 to BL47. The sense amplifier unit 140 includes sense amplifiers 14 provided for the respective bit lines BL. In FIG. 5, the sense amplifiers 14 corresponding to the bit lines BL0 to BL47 are denoted by SA0 to SA47, respectively.

<1-1-4-2> Sense Amplifier

Figure 6:
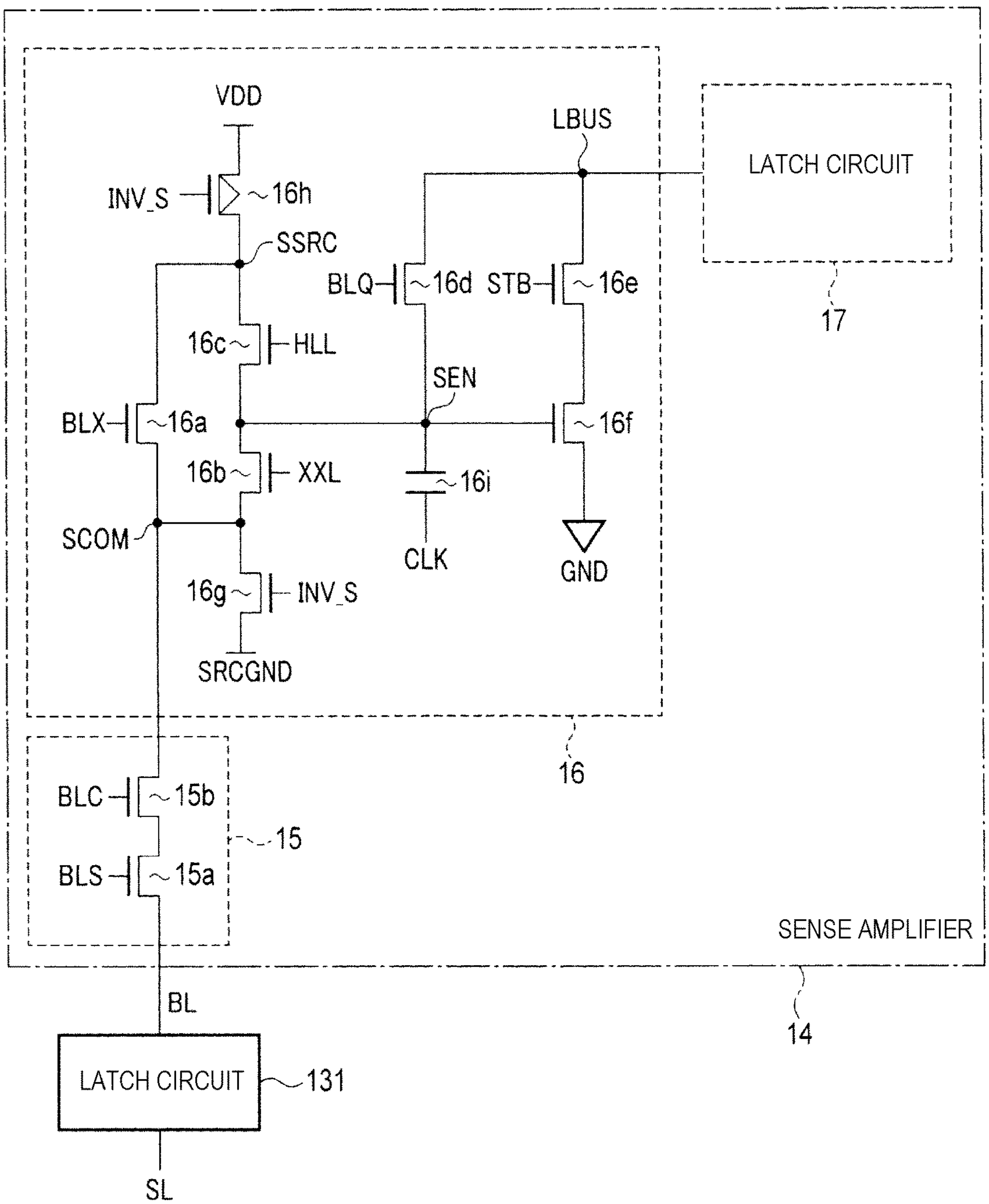
FIG. 6 is a circuit diagram of a sense amplifier.

The sense amplifier 14 will be described with reference to FIG. 6. In the example illustrated in FIG. 6, the sense amplifier 14 includes a connecting section 15, a sensing section 16, and a latch circuit 17. It is noted that when a memory cell transistor retains data of two or more bits, for example, two or more latch circuits are provided.

The connecting section 15 connects a bit line BL and a corresponding sensing section 16 to control the voltage of the bit line BL. Specifically, the connecting section 15 includes n channel MOS transistors 15*a* and 15*b*. The transistor 15*a* has a gate to which a signal BLS is applied, and a source connected to the bit line BL corresponding thereto. The transistor 15*b* has a source connected to a drain of the transistor 15*a* and a gate to which a signal BLC is applied, and a drain is connected to a node SCOM. The transistor 15*b* clamps the bit line BL corresponding thereto to a voltage in accordance with the signal BLC.

The sensing section 16 senses the bit line BL. The sensing section 16 includes n channel MOS transistors 16*a* to 16*g*, a p channel MOS transistor 16*h*, and a capacitive element 16*i*.

A transistor 16*h* includes a gate to which a node INV_S is connected and a drain connected to a node SSRC, and a power-supply voltage VDD is supplied to a source. The transistor 16*h* is controlled to charge the bit line BL and the capacitive element 16*i*. The transistor 16*a* includes a gate to which a signal BLX is supplied, a drain connected to the node SSRC, and a source connected to the node SCOM. The transistor 16*a* is controlled to pre-charge the bit line BL. The transistor 16*c* includes a gate to which a signal HLL is supplied, a drain connected to the node SSRC, and a source connected to a node SEN. The transistor 16*c* is controlled to charge the capacitive element 16*i*. The transistor 16*b* includes a gate to which a signal XXL is supplied, a drain connected to the node SEN, and a source connected to the node SCOM. The transistor 16*b* is controlled to discharge the node SEN when sensing data. The transistor 16*g* includes a gate connected to the node INV_S, a drain connected to the node SCOM, and a source connected to a node SRCGND. The transistor 16*g* is controlled to fix the bit line BL to a constant voltage.

The capacitive element 16*i* is charged when the bit line BL is pre-charged, and includes one electrode connected to the node SEN and another electrode to which a signal CLK is supplied.

The transistor 16*d* includes a gate to which a signal BLQ is supplied, a source connected to the node SEN, and a drain connected to a node LBUS. The node LBUS is a signal line for connecting the sensing section 16 and the latch circuit 17. The transistor 16*e* includes a gate to which a strobe signal STB is supplied, and a drain connected to the node LBUS. The transistor 16*e* is controlled according to data sensing timing, and to store sensed data in the latch circuit 17.

The transistor 16*f* includes a gate connected to the node SEN, a drain connected to a source of the transistor 16*e*, and a source which is grounded. The transistor 16*f* is controlled to sense whether the read data is "0" or "1".

The node INV_S is a node in the latch circuit 17, and may take a level in accordance with stored data in the latch circuit 17. For example, when reading data, if the selected memory cell is turned ON and the node SEN is sufficiently lowered, the node INV_S assumes an "H" level. In contrast, if the selected memory cell is in an off state and the node SEN retains a constant voltage, the node INV_S assumes an "L" level.

In the configuration described above, the transistor 16*f* is controlled to sense the read data based on the voltage of the node SEN at a timing when the signal STB is asserted, and the transistor 16*e* is turned on to transfer the sensed data to the latch circuit 17. Various control signals including the signal STB are supplied, for example, by the sequencer 111.

It is noted that the sense amplifier 14 may have various configurations including the configurations described in U.S. Ser. No. 13/052,148 entitled "THRESHOLD DETECTING METHOD AND VERIFY METHOD OF MEMORY CELL," filed on Mar. 21, 2011. The contents of this patent application are incorporated herein by reference in its entirety.

<1-1-5> Threshold Voltage Distribution of Memory Cell Transistor

<1-1-5-1> Relationship Between Threshold Voltage Distribution of Memory Cell Transistor and Data Referring now to FIG. 7, a relationship between a threshold voltage distribution of the memory cell transistor and data will be described.

Figure 7:
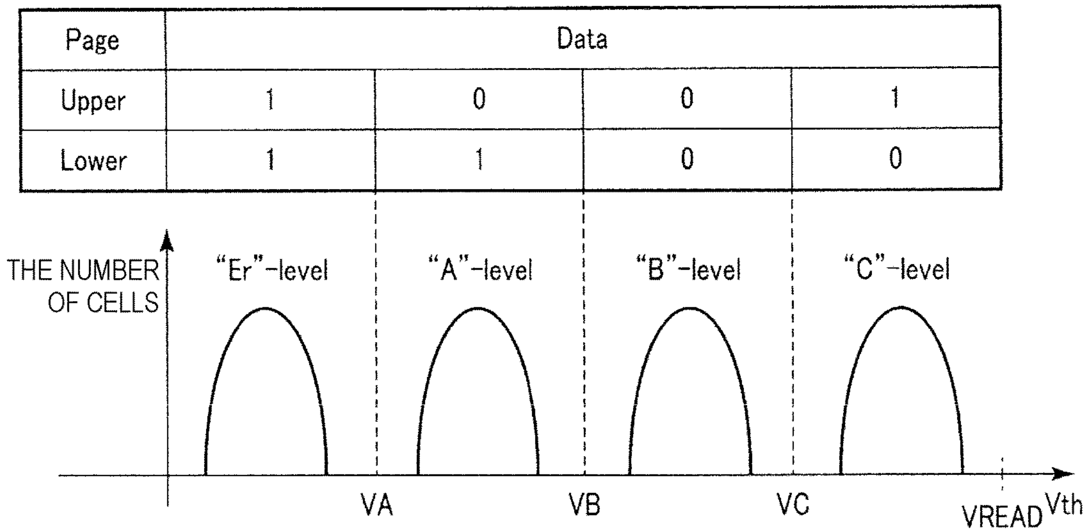
FIG. 7 is a drawing showing a distribution of threshold voltages that a memory cell transistor of a semiconductor memory device according to a first embodiment may have.

In the example illustrated in FIG. 7, each memory cell transistor MT is capable of retaining data of, for example, 2 bits in accordance with the threshold voltage thereof. The 2-bit data includes, for example, "11" "01", "00", "10" in an ascending order of the threshold voltage.

The threshold voltage of the memory cell transistor MT retaining "11" data is in a certain distribution, and the threshold voltage distribution corresponding to the "11" data is referred to as "Er"-level. The "Er"-level is a threshold voltage distribution in a state in which charge stored in a charge storage layer has been removed and thus data is considered to be erased, and includes positive or negative voltages (for example, lower than voltage VA).

01", "00", and "10" are each a threshold voltage distribution in a state in which the charge has been injected into the charge storage layer and thus data is considered to be written therein.

The threshold voltage of the memory cell transistor MT that retains "01" data is within a distribution of an "A"-level, and is higher than the threshold voltage in the "Er"-level (for example, higher than voltage VA and lower than voltage VB, where VA<VB).

The threshold voltage of the memory cell transistor MT that retains "00" data is within a distribution of a "B"-level, and is higher than the threshold voltage in the "A"-level (for example, higher than voltage VB and lower than voltage VC, where VB<VC).

The threshold voltage of the memory cell transistor MT that retains "10" data is within a distribution of a "C"-level, and is higher than the threshold voltage in the "B"-level (for example, higher than the voltage VC).

The relationship between the 2-bit data and the threshold voltage is not limited thereto, and, for example, a case where "11" data corresponds to the "C"-level is also applicable. The relationship therebetween may be selected as needed as a matter of design choice.

<1-1-5-2> Change in Threshold Voltage Distribution of Memory Cell Transistor During Write Operation Referring now to FIG. 8, changes of the threshold voltage distribution of the memory cell transistor during the write operation will be described.

Figure 8:
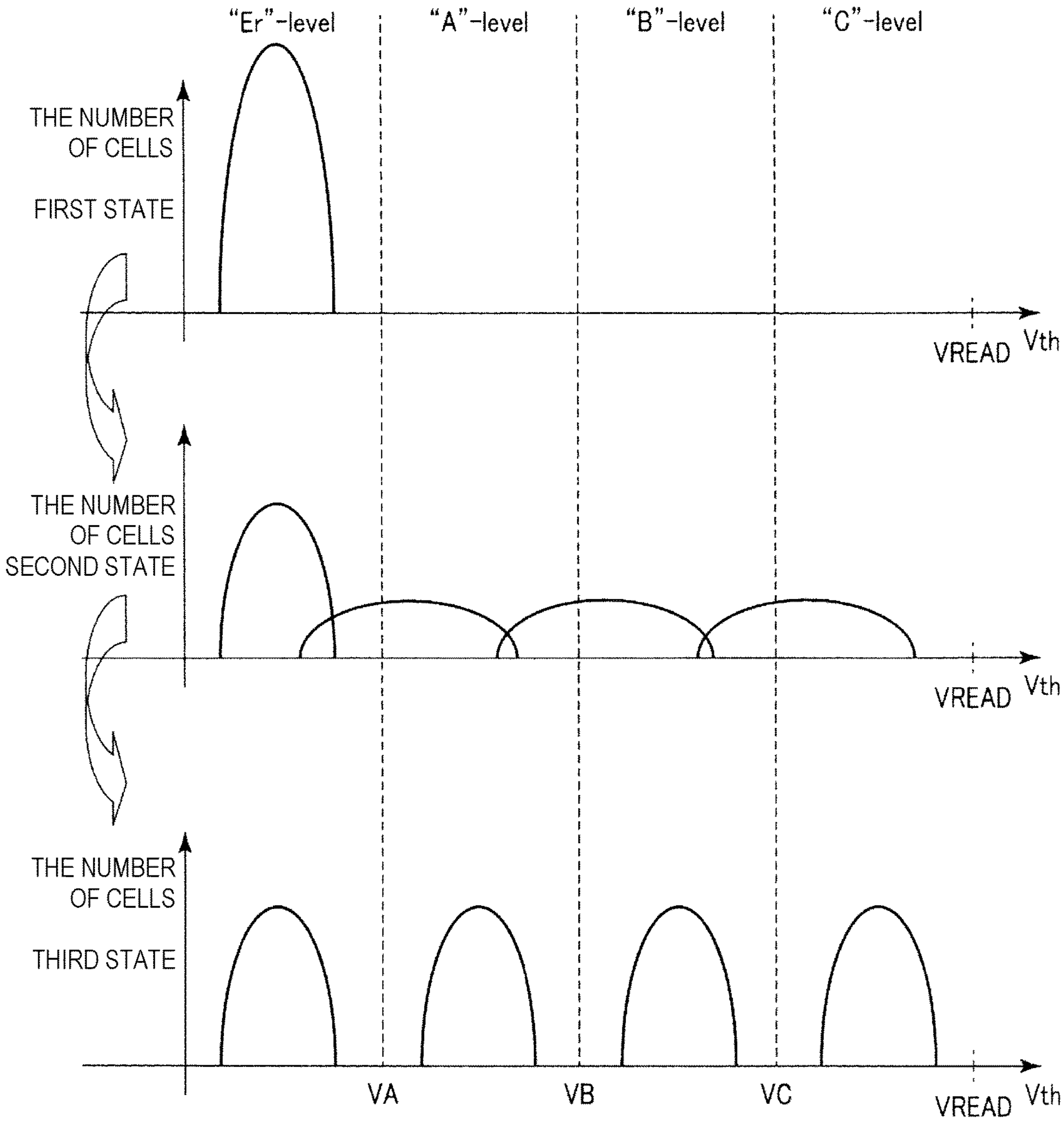
FIG. 8 is a drawing showing changes in the threshold voltage distribution that the memory cell transistor may undergo.

Before the write operation is performed, the threshold voltage distribution of all the memory cells MC in the block assumes an erased state ("Er"-level) illustrated in FIG. 8 by erasing the block in advance (first state).

When the write operation is performed, the threshold voltage distribution of the erased state ("Er"-level) is changed to the threshold distribution as in a second state. In the second state, the threshold distributions of the "Er"-level, the "A"-level, the "B"-level, and the "C"-level are distributed in such a manner that the adjacent threshold voltage distributions overlap with each other, and at this point, the write operation is not completed. When the write operation further proceeds, the threshold voltage distribution in the second state is changed to a four-value threshold distribution as in a third state. As described thus far, the write operation needs to be repeated until the four-value threshold voltage distribution as in the third state is achieved.

It is noted that although the threshold voltage distribution has been described as being transitioned from the first state to the second state in FIG. 8, and further transitioned from the second state to the third state during the write operation, a writing method is not limited thereto. Specifically, a writing method which causes transition from the first state to the third state is also applicable.

<1-2> Operation

<1-2-1> Write Operation in Comparative Example

Figure 9:
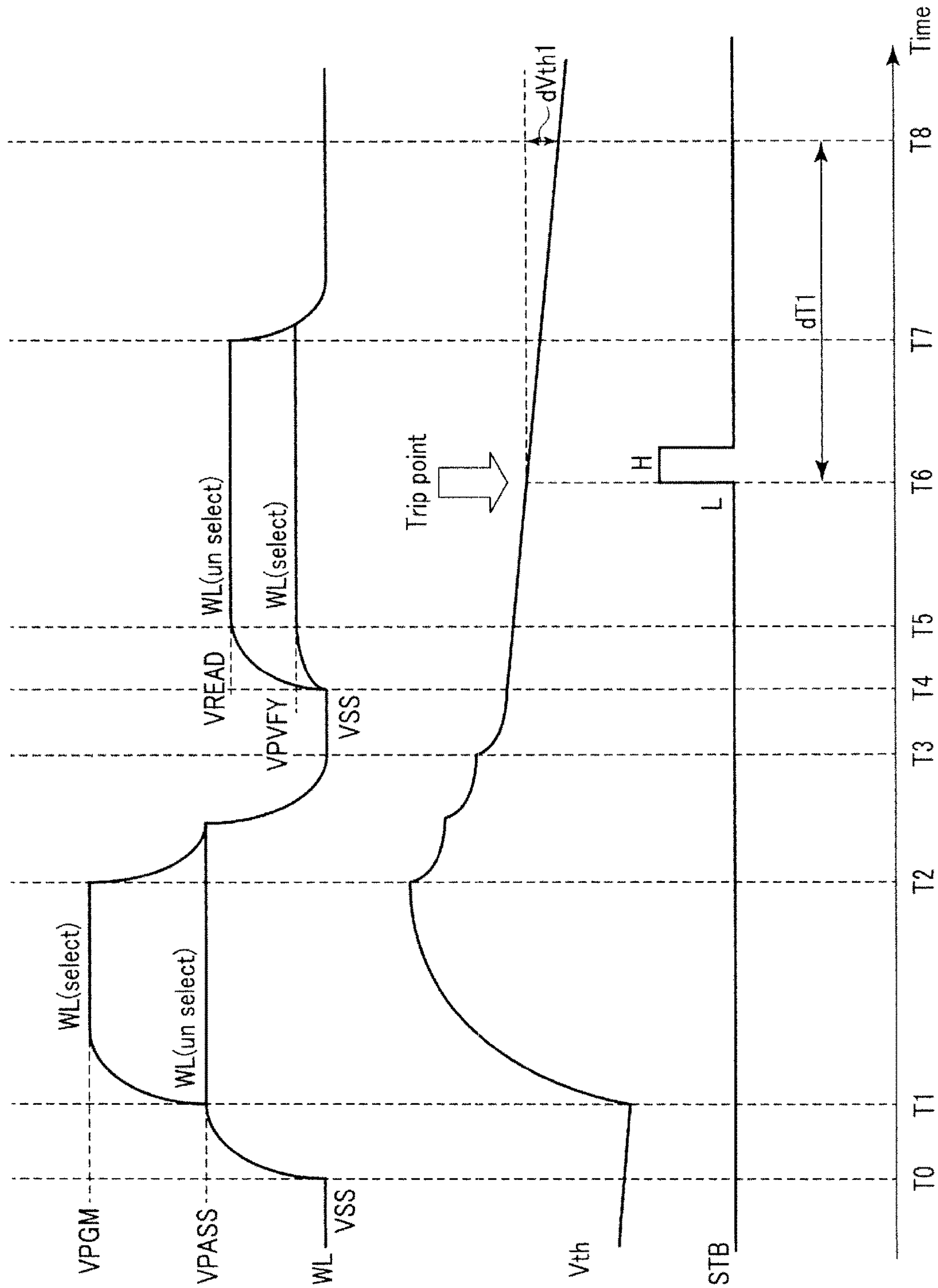
FIG. 9 is a drawing showing a relationship between a voltage to be applied to a word line during a write operation according to a comparative example and a threshold voltage of a memory cell transistor.

In order to facilitate understanding of the write operation of the first embodiment, an outline of a write operation of a comparative example will be described with reference to FIG. 9. Referring now to FIG. 9, a relationship between a voltage to be applied to a word line WL and a threshold voltage (Vth in FIG. 9) of a memory cell transistor (selected memory cell transistor) as a destination of writing will be described.

The write operation includes a program operation and a program verification operation. The program operation is an operation to inject electrons into the charge storage layer of the selected memory cell transistor. The program verification operation is an operation of confirming whether or not the program operation has been completed.

In the following, the program operation and the program verification operation of the comparative example will be described.

Time T0 to Time T1

The program operation is performed first. The sequencer 111 boosts the voltage of the word line WL (Select and Un Select) to achieve a voltage VPASS from time T0 to time T1. The voltage VPASS is a voltage to turn the memory cell transistor to an on state irrespective of the data retained therein.

Time T1 to Time T2

From the time T1 to the time T2, the sequencer 111 boosts a voltage of the selected word line WL (Select) to achieve the voltage VPGM (VPGM> VPASS). The selected word line WL is connected to the gate of the selected memory cell transistor. The voltage VPGM is a high voltage which can inject electrons into the charge storage layer 29 by FN tunneling.

Figure 10:
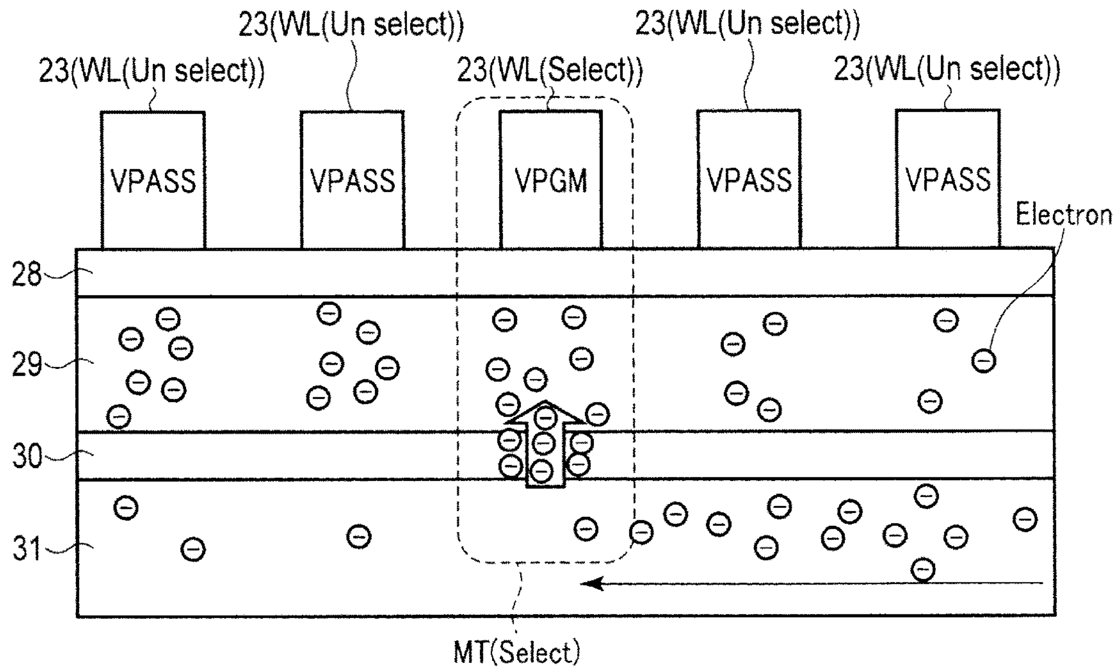
FIGS. 10-13 are schematic diagrams illustrating a state of the memory cell transistor during various phases of the write operation in the comparative example.

In the example illustrated in FIG. 10, when the voltage VPGM is applied to the selected word line WL, electrons are injected into the charge storage layer 29 through the gate insulating film 30 of the selected memory cell transistor MT (Select) via the semiconductors 31. The threshold voltage of the selected memory cell transistor varies depending on the number of electrons stored in the charge storage layer 29 the gate insulating film 30. In other words, in association with the injection of the electrons, the threshold voltage of the selected memory cell transistor rises (see "Vth" in FIG. 9).

Time T2 to Time T3

Returning back to FIG. 9, description of the program operation will be continued. The sequencer 111 lowers the voltage of the word line WL (Select and Un Select) to achieve a voltage VSS from the time T2 to the time T3. This represents the end of the program operation.

Electrons stored in the charge storage layer 29 in the vicinity of the gate insulating film 30 and in the gate insulating film 30 may be stored in an unstable state. Therefore, the electrons stored in the charge storage layer 29 and the gate insulating film 30 of the selected memory cell transistor MT (Select) may move to the semiconductor 31 from the moment when the application of the voltage VPGM to the selected word line WL is terminated. In such a case, the threshold voltage of the selected memory cell transistor is lowered.

Time T4 to Time T5

Subsequent to the program operation, the program verification operation is performed. Specifically, in the period from time T4 to time T5, the sequencer 111 boosts the voltage of the selected word line WL to a voltage VPVFY for the program verification operation, and the voltage of the non-selected word lines WL (Un Select) to a voltage VREAD (VREAD> VPVFY). The voltage VREAD is a voltage to turn the memory cell transistor MT to the on state irrespective of the data retained therein.

Time T5 to Time T6

From the time T5 to the time T6, the sequencer 111 maintains the selected word line WL at the voltage VPVFY and maintains the non-selected word lines WL to the voltage VREAD.

Time T6

At the time T6, the sequencer 111 supplies the signal STB to the sense amplifier 14. Accordingly, the sense amplifier 14 reads out data in the selected memory cell transistor. When the selected memory cell transistor MT connected to the selected word line WL is in an off state, a cell current does not flow to the bit line BL, and the corresponding bit line BL passes program verification. In contrast, when the selected memory cell transistor MT is in an on state, the cell current does not flow to the bit line BL and the corresponding bit line BL fails the program verification operation. When reading out the data at the time T6, the threshold voltage is determined based on the number of electrons stored in the charge storage layer 29 and the gate insulating film 30 of the selected memory cell transistor MT.

Figure 11:
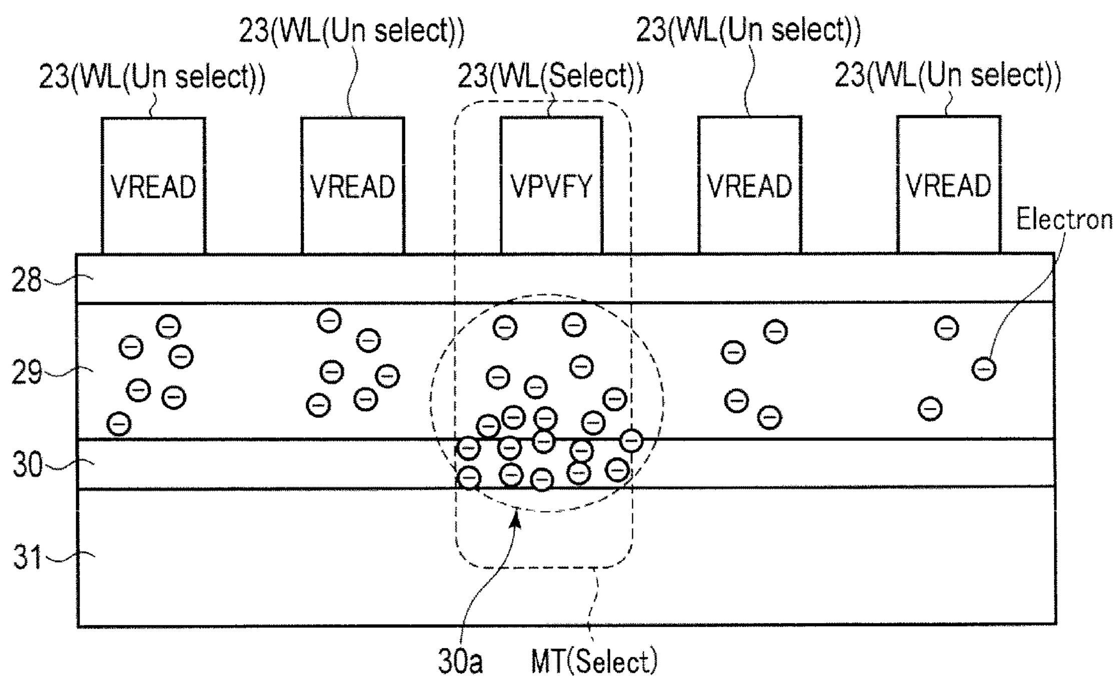

At the time point of the time T6 when the data is read out, for example, twenty electrons are stored in the charge storage layer 29 and the gate insulating film 30 of the selected memory cell transistor MT as illustrated in FIG. 11 (see 30*a* in FIG. 11).

Figure 12:
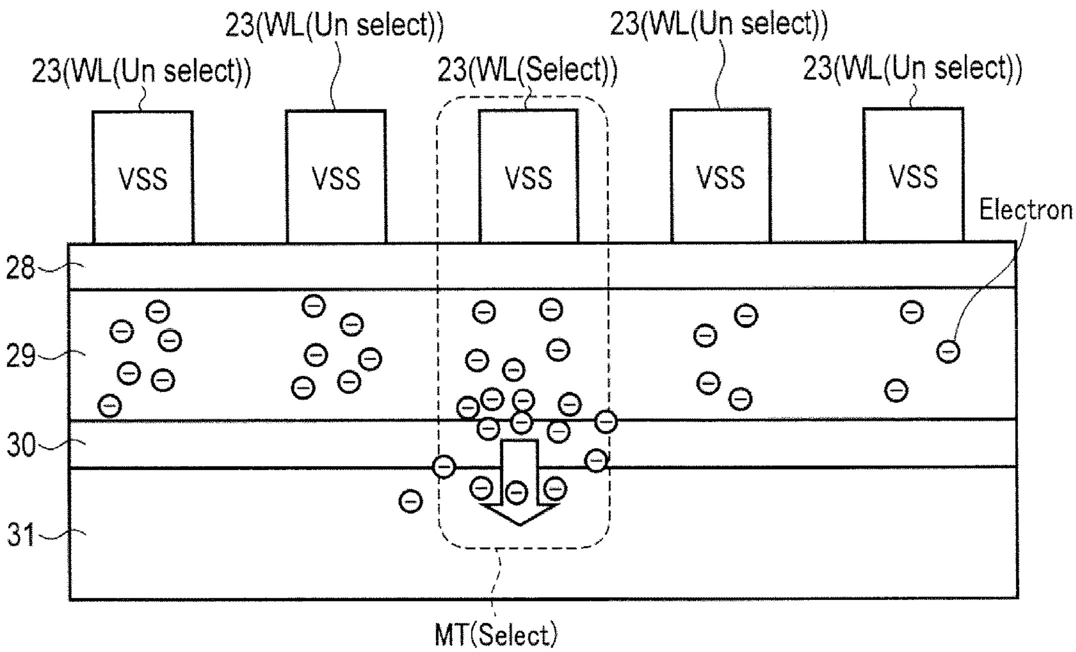

In the example illustrated in FIG. 12, the electrons stored in the charge storage layer 29 and the gate insulating film 30 of the selected memory cell transistor MT may move to the semiconductors 31 from the time T6 onward.

Time T7

Turning back to FIG. 9, description of the program verification operation will be continued. The sequencer 111 lowers the voltage of the word line WL (Select and Un Select) to achieve the voltage VSS at time T7. This represents the end of the program verification operation.

Time T8

Figure 13:
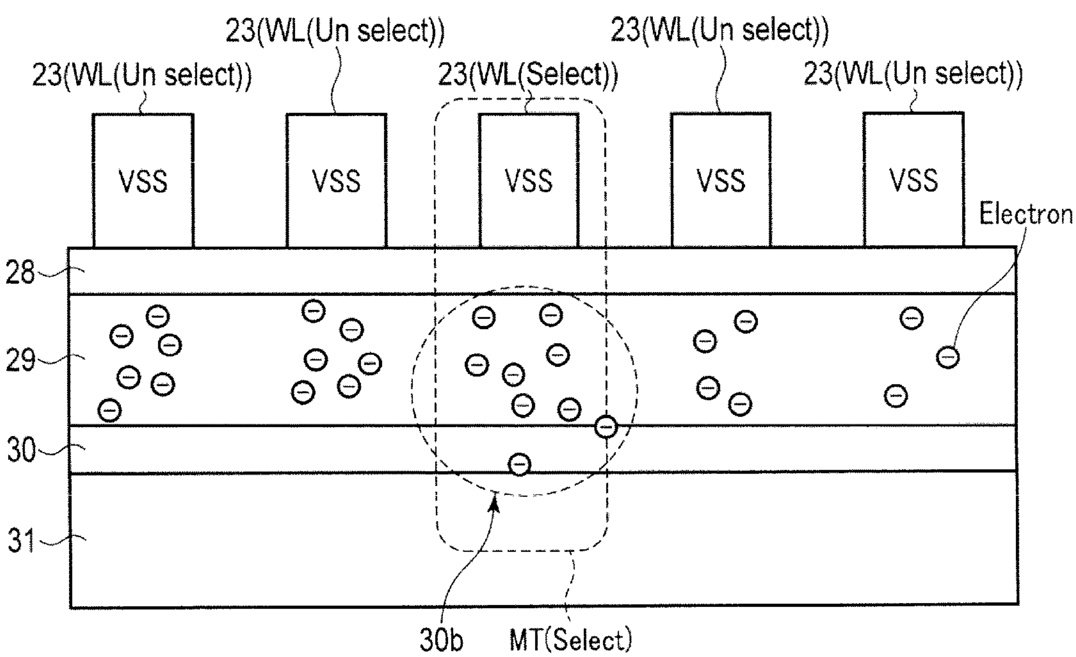

At time T8, which is after a period dT1 has elapsed from the time T6, twenty electrons stored in the charge storage layer 29 and the gate insulating film 30 may be reduced to nine electrons (see 30*b* in FIG. 13). Consequently, the threshold voltage of the selected memory cell transistor may be lowered on the order of a voltage dVth1.

As a result, in the comparative example, voltage difference of approximately around dVth1 may occur depending on the threshold voltages, between the one measured during data read and the other measured after the period dT1 has elapsed from the time of data read. Therefore, even though the program verification passed, for example, the state of data may change by the end of program verification operation.

<1-2-2> Write Operation of First Embodiment

Figure 14:
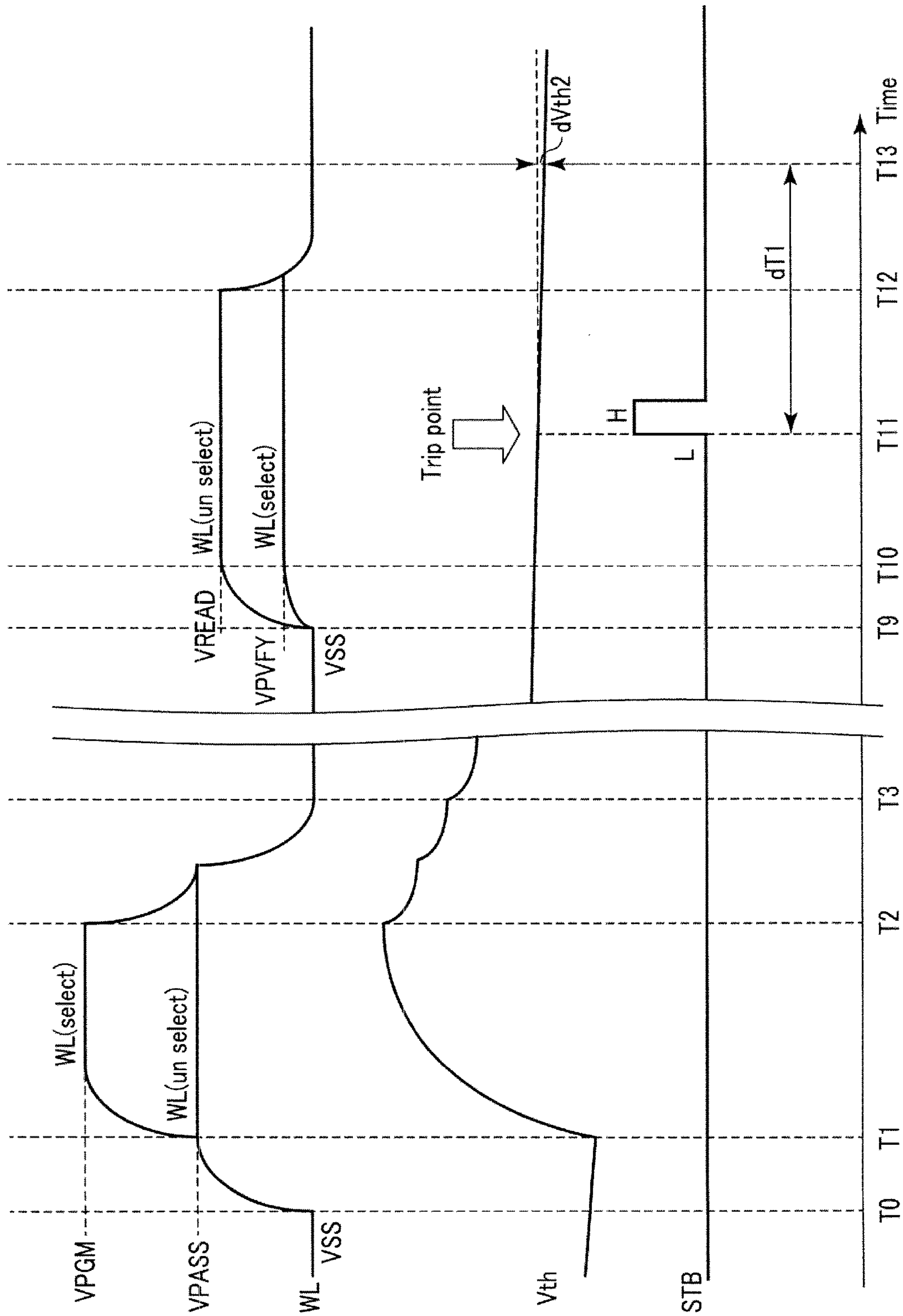
FIG. 14 is a drawing showing a relationship between the voltage to be applied to the word line during a write operation in the first embodiment and the threshold voltage of the memory cell transistor.

In the first embodiment, a write operation considering variations in threshold voltage described above is proposed. Referring now to FIG. 14, an outline of the write operation of the first embodiment will be described.

Electron leakage out of the selected memory cell transistor MT diminishes gradually if sufficient time has elapsed. Therefore, in the first embodiment, the program verification operation is performed after a sufficient time has elapsed after the program operation.

Time T0 to Time T3

The same operation as that in the time T0 to the time T3 described above is performed.

Time T9 to Time T10

In this example, the program verification operation is not performed immediately after the program operation like the comparative example. Instead, the program verification operation is performed after no operation is performed on the selected memory cell transistor MT for a certain period. Specific method of not performing any operation on the selected memory cell transistor MT will be described later.

From time T9 (time T4<time T9) to time T10, the sequencer 111 performs the same operation as the operation in a period from the time T4 to the time T5 described above.

Time T10 to Time T11

From the time T10 to time T11, the sequencer 111 performs the same operation as the operation in a period from the time T5 to the time T6 described above.

Time T11

At the time T11, the sequencer 111 supplies the signal STB to the sense amplifier 14. Accordingly, the sense amplifier 14 reads out data in the selected memory cell transistor.

Time T12

The sequencer 111 lowers the voltage of the word line WL to achieve the voltage VSS at a time T12. This represents the end of the program verification operation.

Time T13

At the time T13, which is after the period dT1 has elapsed from the time T11, the threshold voltage of the selected memory cell transistor is lowered on the order of dVth2 (dVth2<dVth1). In other words, lowering of the threshold voltage of the selected memory cell transistor after the elapse of the period dT1 since the data has read out in the first embodiment is less compared with the comparative example.

In the first embodiment, data is read out at the time T11 when the electron leakage out of the selected memory cell transistor becomes stable. Therefore, the drop of the threshold voltage after the data has read out is less.

Consequently, change of data during the program verification operation is reduced and accurate program verification is performed.

The write operation of the first embodiment will be described in detail below.

<1-3> Example of Write Operation in First Embodiment

An example of the write operation of the first embodiment will be described. In order to describe the example of the write operation in the first embodiment, basic operation waveforms of the program operation and the program verification operation will be described first.

<1-3-1> Program Operation

Figure 15:
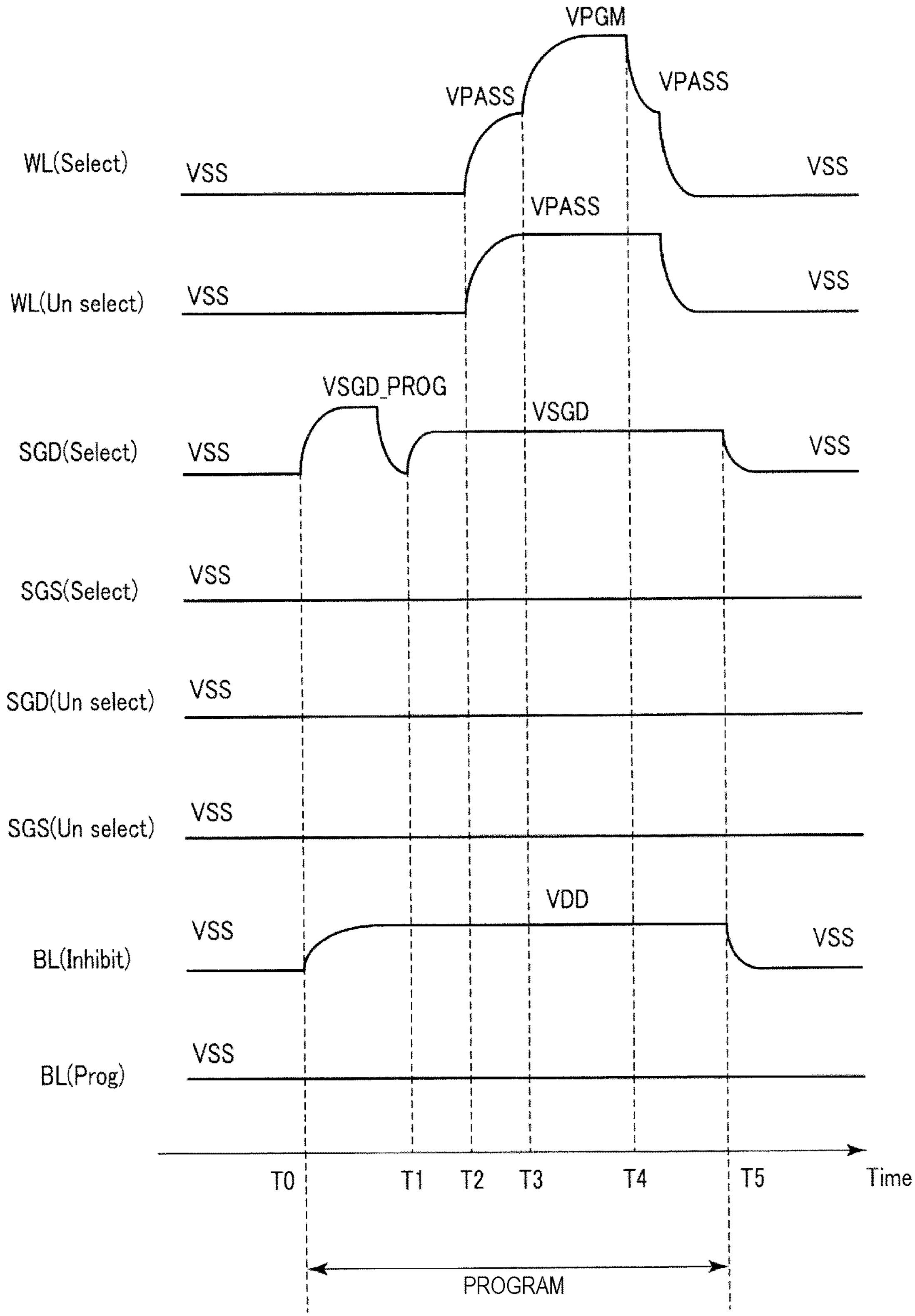
FIG. 15 is a waveform chart showing voltages to be applied to respective parts of wiring during a program operation.

Referring now to FIG. 15, the basic operation waveform of the program operation will be described.

Time T0 to Time T1

At the time T0, the row decoder 150 selects a block in accordance with a row address RA supplied from the register 112. The row decoder 150 applies a voltage VSGD_PROG to the selected select gate line SGD (Select) (for example, VSGD_PROG> VSS), and applies the voltage VSS to the selected select gate line SGS (Select), the non-selected select gate lines SGD (Un Select) and SGS (Un Select). The voltage VSGD_PROG is a voltage which turns on the selected transistor ST1.

At the time T0, the sense amplifier unit 140 applies, for example, the voltage VSS to a write bit line BL (Prog) so that electrons can be injected into the charge storage layer 29 of the memory cell transistor MT connected to the write bit line BL, or a positive voltage VDD (VDD> VSS) to a non-write bit line BL (Inhibit) so as to inhibit the injection of the electrons into the charge storage layer of the memory cell transistor MT connected to the non-write bit line BL.

Time T1 to Time T2

Subsequently, at the time T1, the row decoder 150 applies the voltage VSGD to the selected select gate line SGD (for example, VSGD_PROG> VSGD> VSS). The voltage VSGD is a voltage that enables the selected transistor ST1 to transfer the voltage VSS and disable the same to transfer the voltage VDD. Therefore, the selected transistor ST1 corresponding to the non-write bit line BL (Inhibit) goes into a cut-off state.

Time T2 to Time T3

Subsequently, at the time T2, the row decoder 150 applies the voltage VPASS to the word lines WL (Select and Un select).

Time T3 to Time T4

The row decoder 150 boosts the voltage to be applied to the plurality of selected word lines WL (Select) from the voltage VPASS to the voltage VPGM. Accordingly, electrons are injected to the selected memory cell transistor connected to the selected word lines WL and to the write bit line BL. The voltage VPGM is changed as needed according to a write level and the number of times of the programming. A specific method of changing the voltage VPGM will be described later.

Time T4 to Time T5

After having programmed in the period from the time T3 to the time T4, the row decoder 150 sets the voltage of the word line WL and the selected select gate line SGD to the voltage VSS, and the sense amplifier unit 140 sets the voltage of the non-write bit line BL to the voltage VSS. This represents the end of the program operation.

<1-3-2> Program Verification Operation

Figure 16:
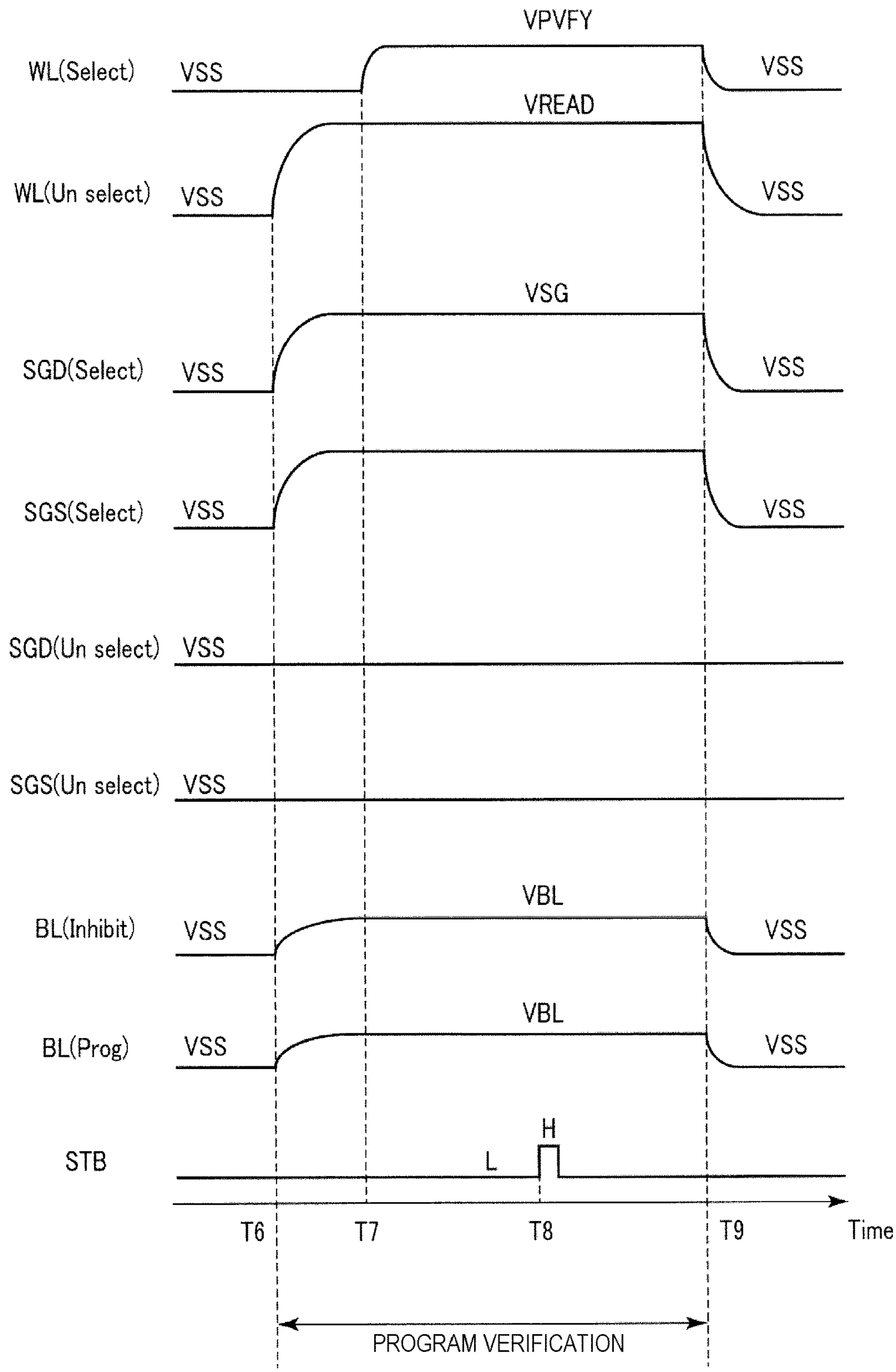
FIG. 16 is a waveform chart showing voltages to be applied to the respective parts of the wiring during a program verification operation.

Referring now to FIG. 16, the basic operation waveform of the program verification operation will be described.

Time T6 to Time T7

At the time T6, the row decoder 150 applies the voltage VSG (for example, VSG> VSS) to the selected select gate lines SGD and SGS, applies the voltage VSS to the non-selected select gate lines SGD and SGS, and applies a voltage "VREAD" to the non-selected word lines WL (Un Select). The voltage VSG is a voltage which turns on the selected transistor ST1.

At the time T6, the sense amplifier unit 140 applies, for example, a voltage "VBL" to the bit lines BL (Prog and Inhibit).

Time T7 to Time T8

At the time T7, the row decoder 150 applies the voltage VPVFY to the selected word line WL (Select).

Time T8

At the time T8, the sequencer 111 supplies the signal STB to the sense amplifier 14. The sense amplifier 14 reads out data in the selected memory cell transistor. Accordingly, whether the selected memory cell transistor has passed or failed the program verification is determined.

Time T9

Subsequently, the row decoder 150 sets the voltage of the word line WL and the selected select gate lines SGD and SGS to the voltage VSS and the sense amplifier unit 140 sets the voltage of the bit line BL to the voltage VSS. This represents the end of the program verification operation.

<1-3-3> Example of Order of Performance of Program Operation and Program Verification Operation In the description given above, the basic operations of the program operation and the program verification operation have been described. In the following, the order of performance of the program operation and the program verification operation (it may be referred to as "pulse order") will be described with reference to FIG. 17.

Figure 17:
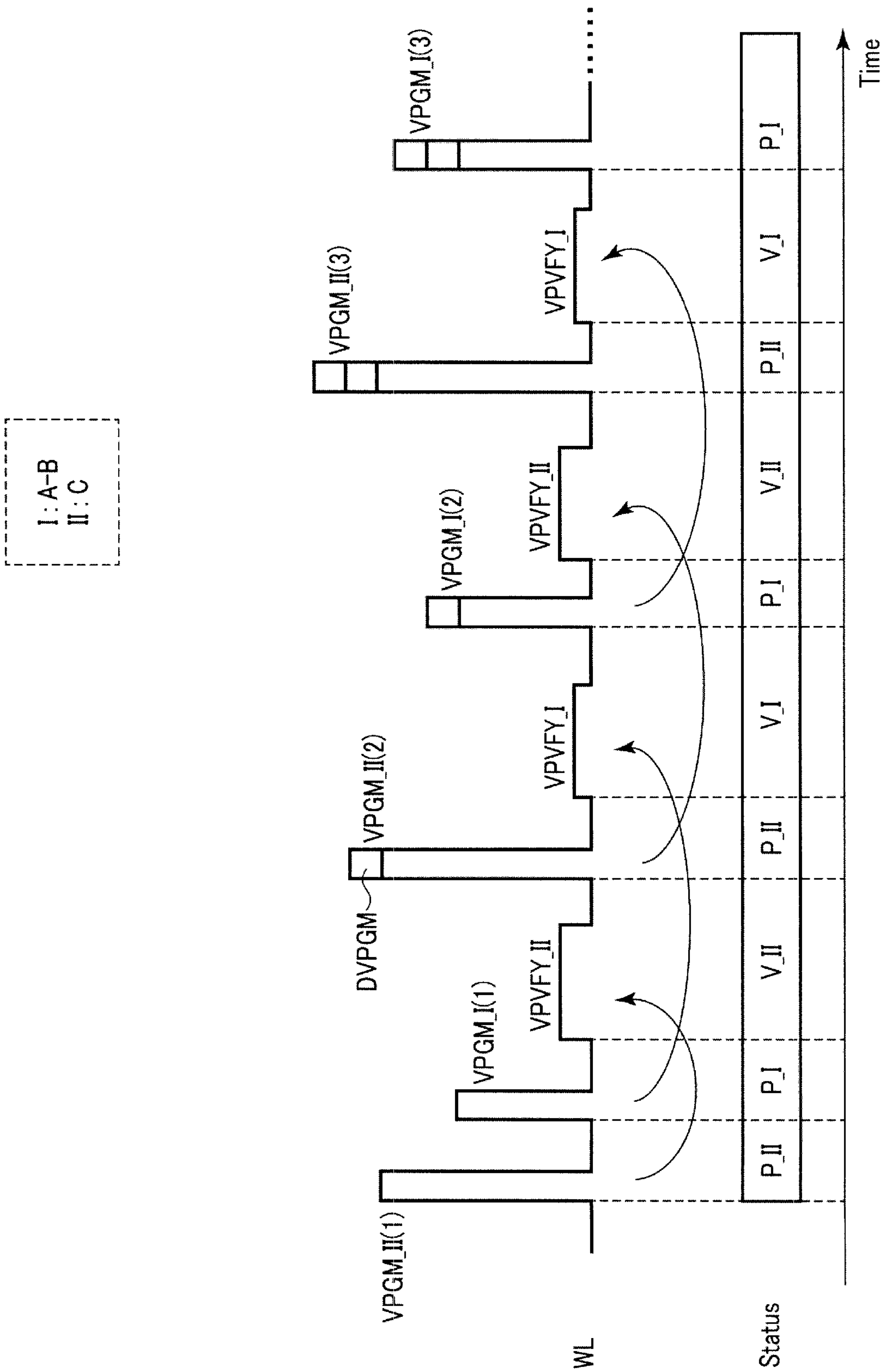
FIG. 17 is a waveform chart schematically showing a waveform of a word line during the write operation.

For easy understanding, FIG. 17 illustrates only the voltage VPGM to be applied to the selected word line WL during the period from the time T2 to the time T4 in FIG. 15 as a pulse for the program operation. For the program verification operation, only the voltage VPVFY to be applied to the selected word line WL during a period from the time T7 to the time T9 in FIG. 16 is illustrated as a pulse. In other words, the "pulse" during the program operation means the voltage VPGM to be applied to the selected word line WL during the period from the time T2 to the time T4 in FIG. 15. In the same manner, the "pulse" during program verification operation means the voltage VPVFY to be applied to the selected word line WL during the period from the time T7 to the time T9 in FIG. 16.

In the example illustrated in FIG. 17, the write operation of the first embodiment is divided into a first write operation and a second write operation.

The first write operation is a write operation for "A" and "B"-levels. The second write operation is a write operation for a "C"-level.

The first write operation includes a first program operation (P_I) relating to writing for the "A" and "B" levels, and a first program verification operation (V_I) that determines whether or not the first program operation has passed.

The second write operation includes a second program operation (P_II) relating to writing for the "C"-level, and a second program verification operation (V_II) that determines whether or not the second program operation has passed.

"P_X (X: arbitrary level) means a pulse relating to a program for an "X"-level. "V_X" means a pulse relating to the program verification operation for the "X"-level.

In the first program operation, the voltage VPGM to be applied to the selected word line WL is expressed as voltage VPGM_I (n). In the same manner, in the second program operation, the voltage VPGM to be applied to the selected word line WL is expressed as voltage VPGM_II (n). The variable "n" corresponds to the number of times (e.g., program loop number) of the first program operation or the second program operation.

The voltage VPGM relating to the program of the "X"-level is expressed as "VPGM_X".

The sequencer 111 increments the voltage VPGM_I (n) by a voltage DVPGM every time the first program operation is performed. In the same manner, the sequencer 111 increments the voltage VPGM_II (n) by the voltage DVPGM every time the second program operation is performed. Every time when the voltage VPGM_I (n) or the voltage VPGM_II (n) is incremented by the voltage DVPGM, the value n is also incremented.

In the first program verification operation, the voltage VPVFY to be applied to the selected word line WL is expressed as voltage VPVFY_I. In the second program verification operation, the voltage VPVFY to be applied to the selected word line WL is expressed as voltage VPVFY_II.

The voltage VPVFY relating to the program verification operation of the "X"-level is expressed as "VPVFY_X". This notation system is applied to other examples.

Basically, in this example, control is performed so that the first program verification operation is not performed immediately after the first program operation, and the second program verification operation is not performed immediately after the second program operation as illustrated in FIG. 17. However, this control is not performed in the case where the first program operation is terminated and then the second program operation is performed continuously. In the same manner, this control is not performed in the case where the second program operation is terminated and then the first program operation is performed continuously.

Figure 18:
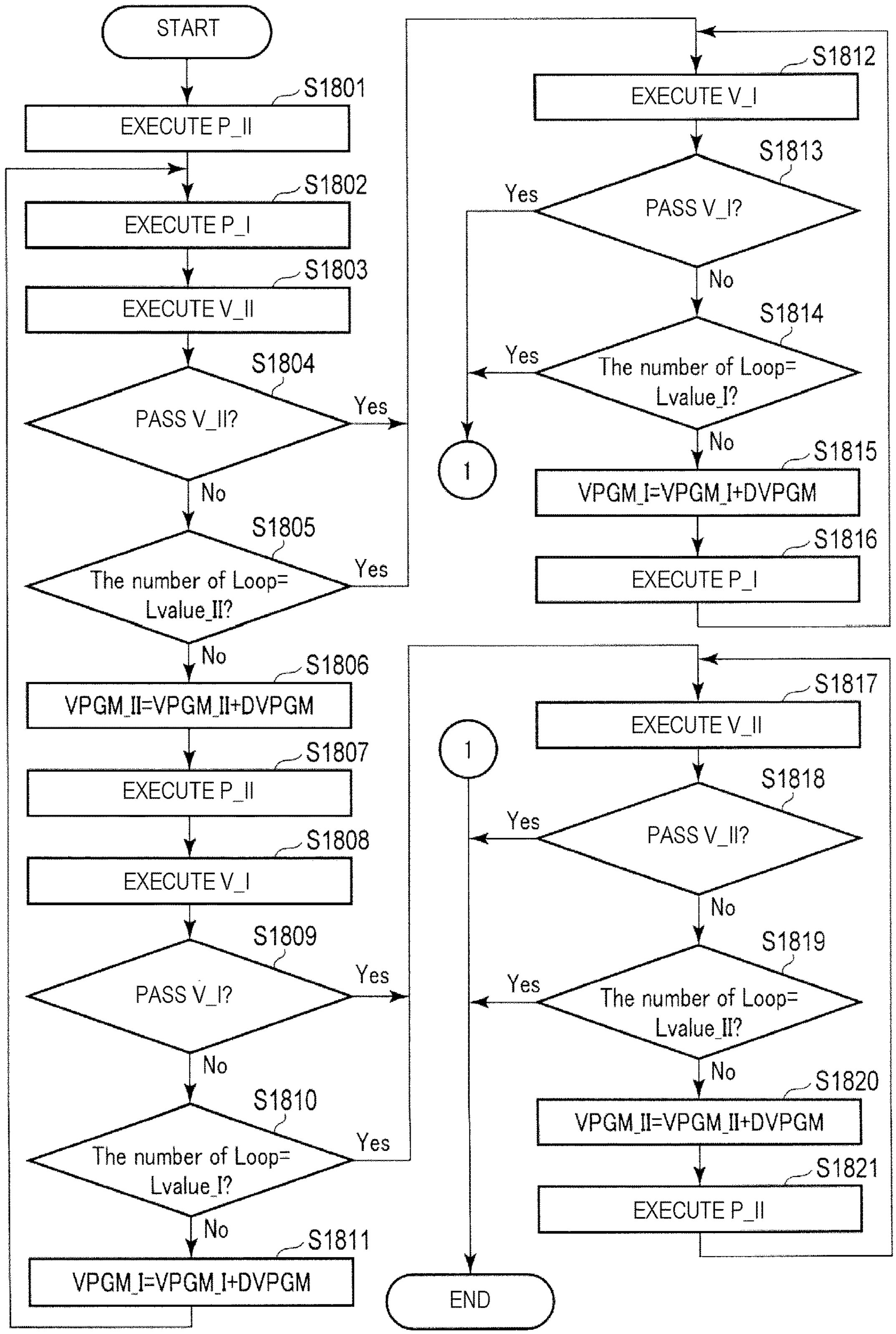
FIG. 18 is a flowchart showing the method of generating the performance order (pulse order) of the program operation and the program verification operation.
Figure 19:
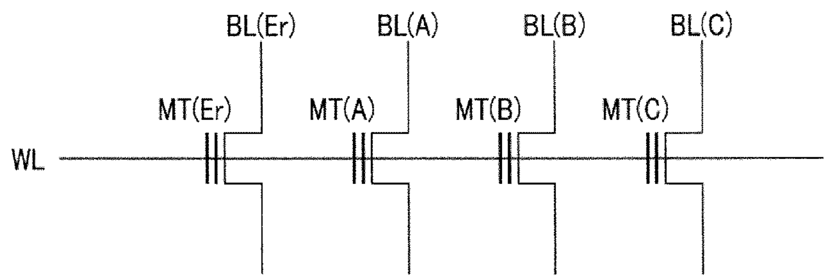
FIG. 19 is a drawing schematically illustrating the memory cell transistor which executes the write operation.

<1-3-4> Method of Generating Order of Performance of Program Operation and Program Verification Operation A method of generating the order of performance of the program operation and the program verification operation (pulse order) will be described with reference to FIG. 18. The pulse order may be generated in real time by the memory system 1 during the write operation. The pulse order may be generated by an external device such as a host device 300 during a test operation. In the case where the pulse order is generated during the test operation, for example, the pulse order is stored in the memory cell array 130, and is read out to the register 112 during the operation of the NAND flash memory 100. In the respective examples given below, a case of generating the pulse order in real time will be described as an example.

Step S1801

The sequencer 111 performs the second program operation (P_II) using the voltage VPGM_II.

Step S1802

The sequencer 111 performs the first program operation (P_I) using the voltage VPGM_I.

Step S1803

The sequencer 111 performs the second program verification operation relating to the second program operation after performing the first program operation. Specifically, the sequencer 111 performs the second program verification operation (V_II) using the voltage VPVFY_II.

In this manner, the sequencer 111 performs other operations between the second program operation and the second program verification operation. Accordingly, the memory cell transistor subjected to the second program operation by the sequencer 111 is left unoperated for a period longer than that in the case where the second program verification operation is performed immediately after the second program operation by a period corresponding to the first program operation. Consequently, in this example, the program verification can be performed in a state in which electron leakage becomes stable more than the case where the second program verification operation is performed immediately after the second program operation as described with reference to FIG. 14.

Step S1804

The sequencer 111 determines whether or not the result of the second program verification operation is a pass. More specifically, the sequencer 111 determines whether or not the number of fail bits is a fail bit by the second program verification operation is not smaller than a set value (FValue_II). In the case where the number of the fail bits is smaller than the set value (FValue_II), the sequencer 111 determines that the result of the second program verification operation is a pass. The set value (FValue_II) is, for example, the number of the fail bits which cannot be rescued by an ECC circuit 206. The set value (FValue_II) is stored, for example, in the register 112. More specifically, a configuration in which the set value (FValue_II) is stored, for example, in the memory cell array 130, and is read out to the register 112 when the NAND flash memory 100 is activated is also applicable. In other words, the sequencer 111 compares the set value (FValue_II) stored in the register 112 with the number of the fail bits.

Step S1805

In the case where the sequencer 111 determines that the result of the second program verification operation is not a pass (NO in Step S1804), the number of times of repetition (the number of loops) of the second program operation is determined. For example the number of loops of the second program operation is stored in the register 112. The counting of the number of loops of the second program operation may be performed by the sequencer 111, or may be performed by other units.

Subsequently, the sequencer 111 counts up the number of loops and then determines whether or not the number of loops of the second program operation is a set value (LValue_II). The set value (LValue_II) is stored, for example, in the register 112. More specifically, a configuration in which the set value (LValue_II) is stored, for example, in the memory cell array 130, and is read out to the register 112 when the NAND flash memory 100 is activated is also applicable. In other words, the sequencer 111 compares the set value (LValue_II) stored in the register 112 with the number of loops of the second program operation.

For example, there may be a memory cell transistor which keep causing errors in writing data irrespective of the number of times of trial of the program. It is not desirable to repeat the program operation until such a memory cell transistor passes verification. Therefore, by setting the number of loops of the program operation in this step, the loop of the useless program operation can be reduced.

Step S1806

If the sequencer 111 determines that the number of loops is not the set value (LValue_II) (NO in Step S1805), the sequencer 111 increments the voltage VPGM_II to be used in the second program operation by the voltage DVPGM.

Step S1807

The sequencer 111 performs the second program operation using the voltage VPGM_II.

Step S1808

The sequencer 111 performs the first program verification operation relating to the first program operation after performing the second program operation. Specifically, the sequencer 111 performs the first program verification operation using the voltage VPVFY_I.

In this manner, the sequencer 111 performs other operations between the first program operation and the first program verification operation. Accordingly, the program verification can be performed in a state in which electron leakage becomes stable more than the case where the first program verification operation is performed immediately after the first program operation as described with reference to FIG. 14.

Step S1809

The sequencer 111 determines whether or not the result of the first program verification operation is a pass. More specifically, the sequencer 111 determines whether or not the number of the fail bits determined by the first program verification operation to be a fail bit is not smaller than a set value (FValue_I). In the case where the number of the fail bits is smaller than the set value (FValue_I), the sequencer 111 determines that the result of the first program verification operation is a pass. The set value (FValue_I) is, for example, the number of the fail bits which cannot be rescued by the ECC circuit 206. The set value (FValue_I) is stored, for example, in the register 112. In other words, the sequencer 111 compares the set value (FValue_I) stored in the register 112 and the number of the fail bits determined to be the fail bit by the first program verification operation.

Step S1810

If the sequencer 111 determines that the result of the first program verification operation is not a pass (NO in Step S1809), the sequencer 111 counts up the number of times of repetition (the number of loops) of the first program operation. For example, the number of loops of the first program operation is stored in the register 112 or the like. The counting of the number of loops of the first program operation may be performed by the sequencer 111, or may be performed by other units.

Subsequently, the sequencer 111 counts up the number of loops and then determines whether or not the number of loops of the first program operation is a set value (LValue_I). The set value (LValue_I) is stored, for example, in the register 112. More specifically, a configuration in which the set value (LValue_I) is stored, for example, in the memory cell array 130, and is read out to the register 112 when the NAND flash memory 100 is activated is also applicable. In other words, the sequencer 111 compares the set value (LValue_I) stored in the register 112 with the number of loops of the first program operation.

Step S1811

If the sequencer 111 determines that the number of loops is not the set value (LValue_I) (NO in Step S1810), the sequencer 111 increments the voltage VPGM_I to be used in the first program operation by the voltage DVPGM. Subsequently, Step S1802 is performed.

Step S1812

If the sequencer 111 determines that the result of the second program verification operation is a pass (YES in Step S1804), or determines that the number of loops is the set value (LValue_II) (YES in Step S1805), the sequencer 111 performs the same operation as Step S1808.

Step S1813

The sequencer 111 determines whether or not the result of the first program verification operation is a pass. When the sequencer determines that the result of the first program verification operation is a pass (YES in Step S1813), the sequencer 111 terminates the write operation.

Step S1814

If the sequencer 111 determines that the result of the first program verification operation is not a pass (NO in Step S1813), the sequencer 111 counts up the number of loops relating to the first program operation. Subsequently, the sequencer 111 determines whether or not the number of loops relating to the first program operation is the set value (LValue_I). If the sequencer 111 determines that the number of loops relating to the first program operation is the set value (LValue_I), (YES in Step S1814), the sequencer 111 terminates the write operation.

Step S1815

If the sequencer 111 determines that the number of loops relating to the first program operation is not the set value (LValue_I) (NO in Step S1814), the sequencer 111 increments the voltage VPGM_I to be used in the first program operation by the voltage DVPGM.

Step S1816

The sequencer 111 performs the same operation as that in Step S1802.

Step S1817

If the sequencer 111 determines that the result of the first program verification operation is a pass (YES in S1809), or determines that the number of loops is the set value (LValue_I) (YES in Step S1810), the sequencer 111 performs the same operation as Step S1803.

Step S1818

The sequencer 111 determines whether or not the result of the second program verification operation is a pass. When the sequencer determines that the result of the second program verification operation is a pass (YES in Step S1818), the sequencer 111 terminates the write operation.

Step S1819

If the sequencer 111 determines that the result of the second program verification operation is not a pass (NO in Step S1818), the sequencer 111 counts up the number of loops relating to the second program operation. Subsequently, the sequencer 111 determines whether or not the number of loops relating to the second program operation is the set value (LValue_II). If the sequencer 111 determines that the number of loops relating to the second program operation is the set value (LValue_II), (YES in Step S1819), the sequencer 111 terminates the write operation.

Step S1820

The sequencer 111 performs the same operation as that in Step S1806.

Step S1821

The sequencer 111 performs the same operation as that in Step S1807.

The memory system 1 generates the pulse order in the manner described above.

<1-4> Specific Example

Subsequently, the specific example of the write operation relating to the memory system of the first embodiment will be described.

<1-4-1> Example of Memory Cell Transistor as Writing Destination

In this specific example, a case where any one of the "Er"-level, the "A"-level, the "B"-level, and the "C"-level is written in the plurality of memory cell transistors MT connected commonly to one word line WL will be described for easy understanding. Here, the bit line (Er) is connected to the memory cell transistor MT (Er) in which data of the "Er"-level is written, the bit line BL (A) is connected to the memory cell transistor MT (A) to which data of the "A"-level is written, the bit line BL (B) is connected to the memory cell transistor MT (B) in which data of the "B"-level is written, and the bit line BL (C) is connected to the memory cell transistor MT (C) in which data of the "C"-level is written.

It is noted that the plurality of memory cell transistors do not necessarily have to be commonly connected to one word line WL in this example. In other words, the same operation may be applied also to a case where the plurality of memory cell transistors are connected to different word lines WL.

<1-4-2> Specific Example of Pulse

Figure 20:
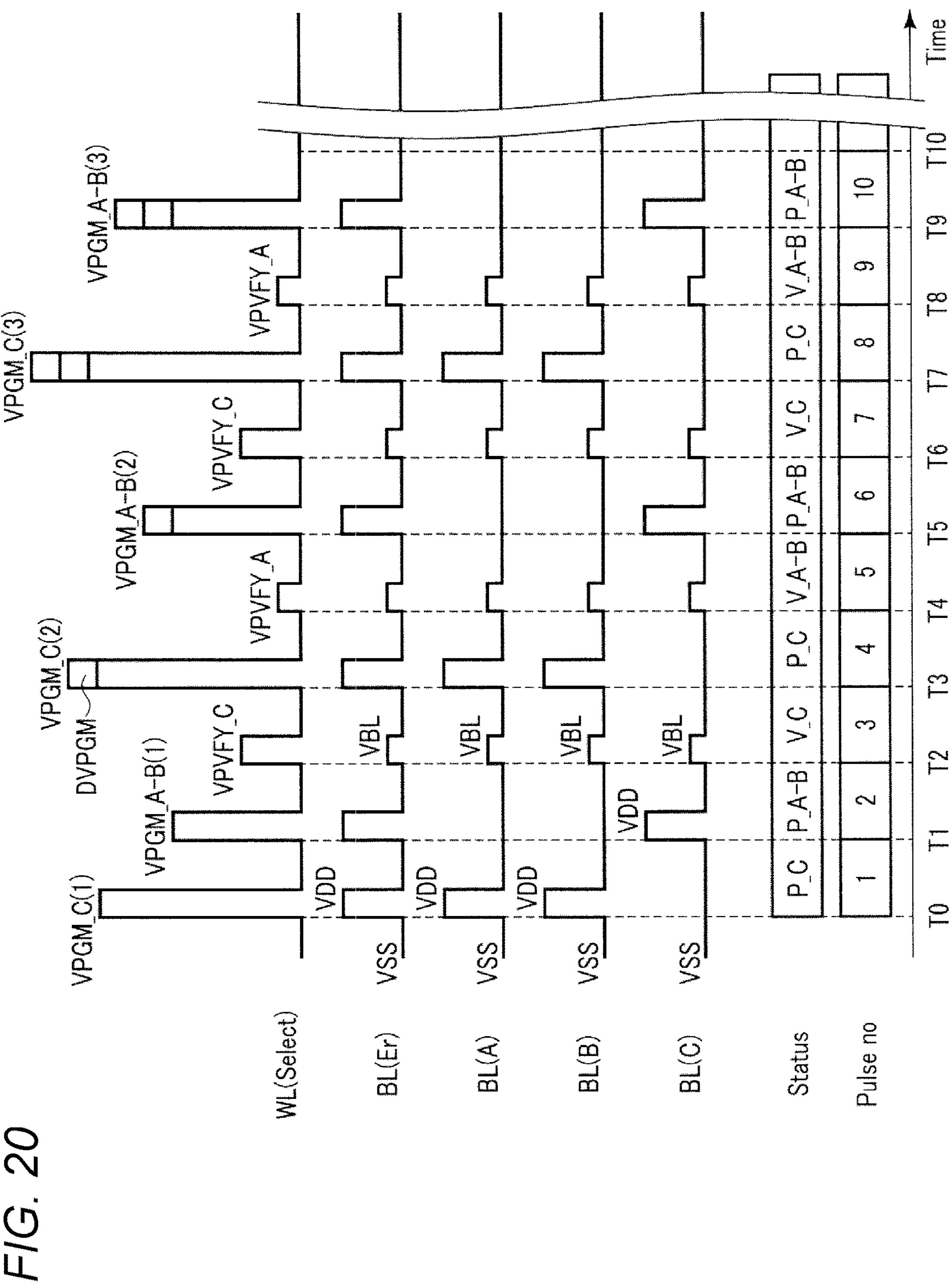
FIG. 20 is a waveform chart showing an example of voltages to be applied to the word lines and the bit lines during the write operation.

Subsequently, referring now to FIG. 20 and FIG. 21, a specific example of the pulse for a case where the write operation of the first embodiment is applied to the memory cell transistors MT described above will be described. In FIG. 20, only waveforms of the selected word line WL and the bit lines BL are illustrated for easy understanding. In FIG. 20 and FIG. 21, numbers are allocated for each pulse relating to the program and the program verification operation.

FIG. 21 illustrates a specific example of pulse application timing. The numbers of loops of the program operation are illustrated in a row (P_X) relating to the program operation. In a case where "X" is a plurality of levels, and if only the numbers of loops of the program verification operation are illustrated, the level being verified is not clear. Therefore, in FIG. 21, verification levels to be verified are illustrated in the row (V_X) relating to the program verification operation. It is noted that this notation system is applied to other tables.

FIG. 20 and FIG. 21 illustrate (i) pulses determined by setting and (ii) pulses determined by circumstances during the write operation, which are roughly classified pulse categories.

Examples of the pulse in (i) in this example include the program operation and the program verification operation starting pulses. For example, when the program operations of the levels A and B are performed three times or so, the threshold voltage of the memory cell transistor may reach the "B"-level. Therefore, it is necessary to perform the program operations of the levels A and B three times or so, and then to start the program verification operation for the "B"-level. Therefore, in this example, it is set to start the program verification operation relating to the "B"-level at the fourteenth pulse (Pulse No.=14) after a first program operation (P_A-B) has been performed three times. In other words, how many times of the first program operation (P_A-B) needs to be performed before starting the program verification operation for the "B"-level is determined by setting. In this manner, at which timing the program operation and the program verification operation are to be started is determined in advance. In the example illustrated in FIG.

20 and FIG. 21, pulses corresponding to the pulse Nos. 1, 2, 3, 5, 14 correspond to the pulses of (i).

Examples of the pulse of (ii) include pulses other than those in (i). For example, if the result of the program verification operation of the "A"-level (Pulse No.=20) is a pass (or the number of loops matches the set value) after the first program operation (Pulse No.=19) for the fifth time has performed, the write operation for the "A"-level is terminated. Therefore, from the program verification operation for the "A"-level (Pulse No.=20) onward, the program verification operation for the "A"-level is not performed.

Furthermore, for example, if the program verification operation of the "C"-level (Pulse No.=16) shows a pass (or the number of loops matches the set value) after the second program operation (Pulse No.=12) for the fourth time has performed, the write operation for the "C"-level is terminated. Therefore, from the program verification operation for the "C"-level (Pulse No.=16) onward, the program operation and the program verification operation for the "C"-level are not performed.

In this manner, if the determination of the verification operation is a pass (or in the case where the number of loops is determined to be the set value), the write operation does not have to be performed. Therefore, timing of termination of the pulse is not determined in advance, but needs to be determined during operation.

In the example of FIG. 20 and FIG. 21, the pulses corresponding to those other than the pulse No. 1, 2, 3, 5, 14 correspond to the pulses of (ii).

Pulse No. 1 (Pulse No=1)

In the example illustrated in FIG. 20 and FIG. 21, the sequencer 111 performs the second program operation (P_C) for the memory cell transistor MT (C) for the first time.

The sequencer 111 applies a program voltage VPGM_C (1) for the "C"-level to the word line WL. In this case, the sequencer 111 makes the bit line BL (C) have the voltage VSS, and applies the voltage VDD to the bit lines BL (Er), (A), and (B).

Accordingly, the channel of the memory cell transistor MT (C) has the voltage VSS, and the program voltage VPGM_C (1) is applied to the word line WL, so that the program is performed on the memory cell transistor MT (C). On the other hand, the voltage VDD is applied to the bit lines BL (Er), (A), and (B), so that the selected transistor ST1 to be connected to the memory cell transistor MT (Er), (A), and (B) is cut off. Accordingly, the channels of the memory cell transistor MT (Er), (A), and (B) are in a floating state and are boosted. Therefore, even though the program voltage VPGM_C (1) is applied to the word line WL, the program is not performed on the memory cell transistor MT (Er), (A), and (B).

Pulse No. 2 (Pulse No=2)

The sequencer 111 continues to perform the first program operation (P_A-B) for the first time on the memory cell transistors MT (A) and (B).

The sequencer 111 applies a program voltage VPGM_AB (1) (VPGM_A-B (1)<VPGM_C (1) for the levels A and B to the word line WL. In this case, the sequencer 111 makes the bit lines BL (A) and (B) have the voltage VSS and applies the voltage VDD to the bit lines BL (Er) and (C). Accordingly, from the same principle as that described above, the program is performed on the memory cell transistors MT (A) and (B), and the program is not performed on the memory cell transistors MT (Er) and (C).

Pulse No. 3 (Pulse No=3)

Subsequently, the sequencer 111 performs the second program verification operation. More specifically, the sequencer 111 applies a verification voltage for the "C"-level to the word line WL to perform the program verification on the memory cell transistor MT (C).

In this manner, the sequencer 111 performs the first program operation between the second program operation and the second program verification operation, and thus is capable of performing the second program verification operation in the state in which the electron leakage becomes stable.

Pulse No. 4 (Pulse No=4)

Subsequently, the sequencer 111 performs the second program operation for the memory cell transistor MT (C) which does not reach a desired voltage level found by the second program verification operation.

Specifically, the sequencer 111 applies the program voltage VPGM_C (2) (VPGM_C (2)=VPGM_C (1)+DVPGM) to the word line WL. In this manner, in this example, every time the second program operation is repeated, the voltage is incremented by the voltage DVPGM. In this case, the bit line BL(C) has the voltage VSS. In contrast, the voltage VDD is applied to the bit lines BL (Er), (A), and (B). Accordingly, the program is performed on the memory cell transistor MT (C), and the program is not performed on the memory cell transistor MT (Er), (A), and (B).

Pulse No. 5 (Pulse No=5)

Subsequently, the sequencer 111 performs the first program verification operation for the "A"-level. More specifically, the sequencer 111 applies a verification voltage for the "A"-level to the word line WL to perform the program verification on the memory cell transistor MT (A).

In this manner, the sequencer 111 performs other program operations between the first program operation and the first program verification operation, and thus is capable of performing the first program verification operation in the state in which the electron leakage becomes stable.

At the time point of the first program operation for the first time, it seems that the memory cell transistor that reaches the "B"-levels does not exist. Therefore, in the first program verification operation after the first program operation for the first time, the first program verification operation is not performed for the "B"-level. Accordingly, the process time in the first program verification operation is reduced compared with a case where the first program verification operation is performed for the "B"-level.

Pulse No. 6 (Pulse No=6)

Subsequently, the sequencer 111 performs the first program operation for the second time for the memory cell transistor MT (B) and the memory cell transistor MT (A) which does not reach a desired voltage level found by the first program verification operation.

Specifically, the sequencer 111 applies the program voltage VPGM_A-B (2) (VPGM_A-B (2)=VPGM_A-B (1)+DVPGM) to the word line WL. In this case, the bit lines BL(A) and (B) have the voltage VSS. In contrast, the voltage VDD is applied to the bit lines BL (Er) and (C). Accordingly, the program is performed on the memory cell transistors MT (A) and (B), and the program is not performed on the memory cell transistors MT (Er) and (C).

Pulse No. 7 (Pulse No=7)

The sequencer 111 performs the second program verification operation.

Pulse No. 8 (Pulse No=8)

The sequencer 111 performs the second program operation for the second time for the memory cell transistor MT (C) which does not reach a desired voltage level found by the second program verification operation.

Pulse No. 9 (Pulse No=9)

The sequencer 111 performs the first program verification operation for the "A"-level.

Pulse No. 10 (Pulse No=10)

The sequencer 111 performs the first program operation for the third time for the memory cell transistor MT (B) and the memory cell transistor MT (A) which does not reach a desired voltage level found by the first program verification operation.

Pulse No. 11 (Pulse No=11)

The sequencer 111 performs the second program verification operation.

Pulse No. 12 (Pulse No=12)

The sequencer 111 performs the second program operation for the third time for the memory cell transistor MT (C) which does not reach a desired voltage level found by the second program verification operation.

Pulse No. 13 (Pulse No=13)

The sequencer 111 performs the first program verification operation for the "A"-level.

Pulse No. 14 (Pulse No=14)

At the time point of the first program operation for the third time, it seems that the memory cell transistor that reaches the "B"-level appears.

Therefore, the sequencer 111 performs the first program verification operation for the "B"-level. More specifically, the sequencer 111 applies a verification voltage for the "B"-level to the word line WL to perform the program verification on the memory cell transistor MT (B).

Pulse No. 15 (Pulse No=15)

The sequencer 111 performs the first program operation for the fourth time for the memory cell transistors MT (A) and (B), which do not reach a desired voltage level found by the first program verification operation.

Pulse No. 16 (Pulse No=16)

The sequencer 111 performs the second program verification operation.

In this example, the sequencer 111 determines that the memory cell transistor MT (C) to be verified has passed. Therefore, the sequencer 111 does not perform the second program operation from the fourth time onward.

Pulse No. 17 (Pulse No=17)

The sequencer 111 performs the first program verification operation for the "A"-level.

Pulse No. 18 (Pulse No=18)

The sequencer 111 performs the first program verification operation for the "B"-level.

Pulse No. 19 (Pulse No=19)

The sequencer 111 performs the first program operation for the fifth time for the memory cell transistors MT (A) and (B), which do not reach a desired voltage level found by the first program verification operation.

Pulse No. 20 (Pulse No=20)

The sequencer 111 performs the first program verification operation for the "A"-level.

In this example, the sequencer 111 determines that the memory cell transistor MT (A) to be verified has passed. Therefore, the sequencer 111 does not perform the first program operation for the "A"-level from the sixth time onward.

Pulse No. 21 (Pulse No=21)

The sequencer 111 performs the first program verification operation for the "B"-level.

Pulse No. 22 (Pulse No=22) As described above, the memory cell transistor MT (A) has passed the program verification. Therefore, the sequencer 111 continues to perform the first program operation only on the memory cell transistor MT (B).

Specifically, the sequencer 111 applies the program voltage VPGM_A-B (6) (VPGM_A-B (6)=VPGM_A-B (1)+5*DVPGM) to the word line WL. In this case, the bit line BL(B) have the voltage VSS. In contrast, the voltage VDD is applied to the bit lines BL (Er), (A) and (C). Accordingly, the program is performed on the memory cell transistor MT (B), and the program is not performed on the memory cell transistors MT (Er), (A), and (C).

Pulse No. 23 (Pulse No=23)

The sequencer 111 performs the first program verification operation for the "B"-level.

Pulse No. 24 (Pulse No=24)

The sequencer 111 continues to perform the first program operation only on the memory cell transistor MT (B).

Pulse No. 25 (Pulse No=25)

The sequencer 111 performs the first program verification operation for the "B"-level.

Pulse No. 26 (Pulse No=26)

The sequencer 111 continues to perform the first program operation only on the memory cell transistor MT (B).

Pulse No. 27 (Pulse No=27)

The sequencer 111 performs the first program verification operation for the "B"-level.

In this example, the sequencer 111 determines that the memory cell transistor MT (B) to be verified has passed. Therefore, the sequencer 111 completes the first program operation for the "B"-level.

<1-5> Advantageous Effects

According to the first embodiment described above, the memory system 1 does not perform the first program verification operation immediately after the first program operation, and the second program verification operation is not performed immediately after the second program operation except for exceptions (for example, a case where the program verification operations such as those from the pulse no. 19 onward in FIG. 21 continues). In other words, according to the first embodiment, the memory system 1 reads out data after the electron leakage out of the selected memory cell transistor becomes stable. Therefore, the drop of the threshold voltage after the data has read out is restrained. Consequently, change of data during the data read operation is reduced and accurate program verification is performed.

<1-6> Modified Example 1 of First Embodiment

A modified Example 1 of the first embodiment will be described. In the modified example 1 of the first embodiment, a case where a data reading method different from the reading method described above is employed in the first embodiment will be described.

<1-6-1> Configuration

<1-6-1-1> Outline of Sense Amplifier Unit

Subsequently, a configuration of the sense amplifier unit 140 of the modified example 1 of the first embodiment will be described.

The distances of current channels between the memory cell transistors MT connected to the bit lines BL and the row decoder 150 are increased in the order of the bit lines BL. In other words, the voltage applied to the word line WL by the row decoder 150 first reaches a gate of the memory cell transistor MT corresponding to a bit line BL0, then reaches a gate of a memory cell transistor MT corresponding to a bit line BL1, and finally reaches the gate of the memory cell transistors MT corresponding to a bit line BLc (c: arbitrary integer).

Hereinafter, word lines WL and memory cell transistors MT corresponding to the bit lines BL0 to BLa (a: arbitrary integer) may be referred to as a group GP1, the word lines WL and memory cell transistors MT corresponding to bit lines BLa+1 to BLb (b: arbitrary integer) may be referred to as a group GP2, and the word lines WL and the memory cell transistors MT corresponding to bit lines BLb+1 to BLc (c: arbitrary integer) may be referred to as a group GP3.

Figure 22:
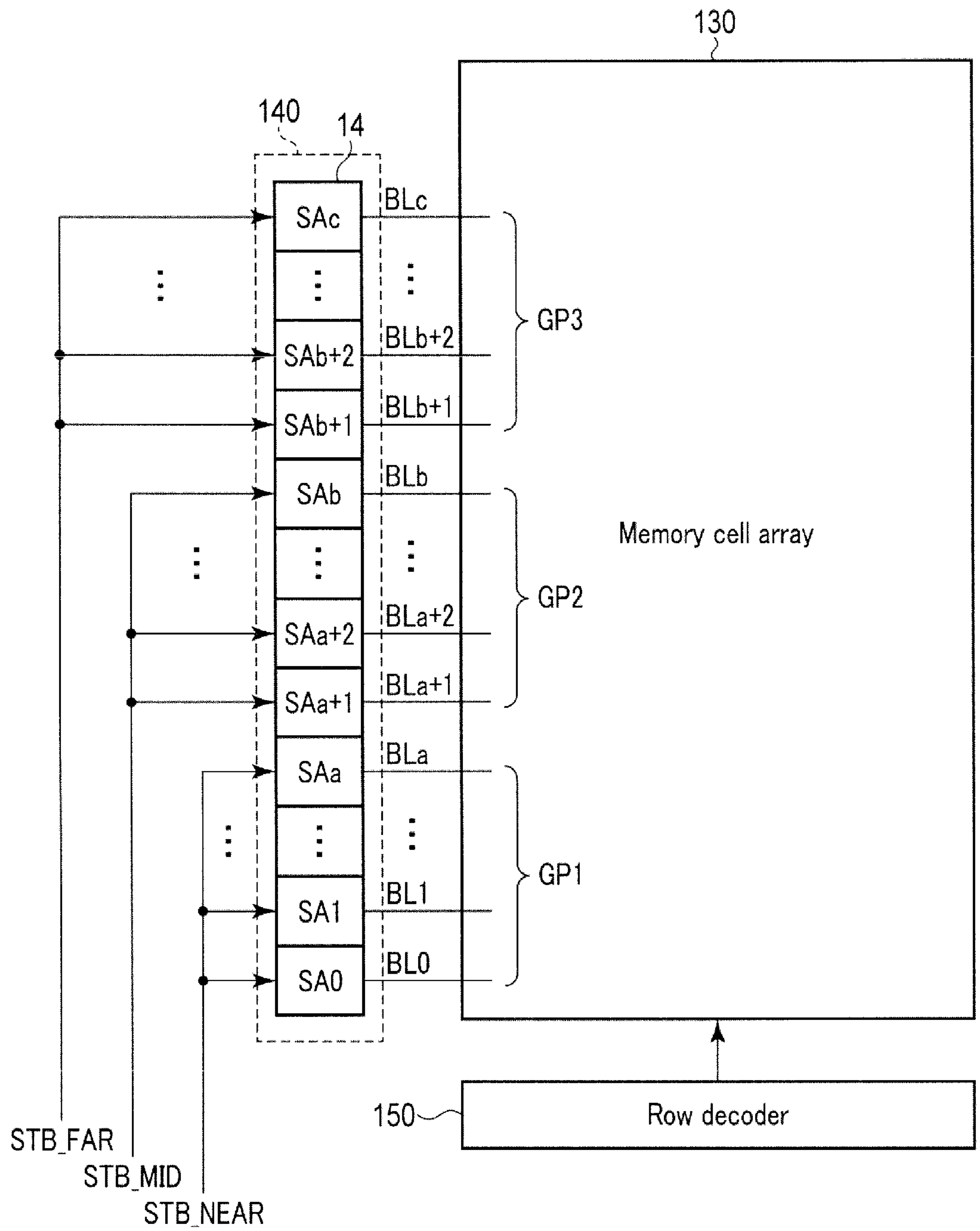
FIG. 22 is a block diagram illustrating an outline of the sense amplifier unit and groupings of bit lines.

In the example illustrated in FIG. 22, a signal STB NEAR is supplied to the sense amplifiers 14 (SA0 to SAa), a signal STB_MID is supplied to the sense amplifiers 14 (SAa+1 to SAb), and a signal STB_FAR is supplied to the sense amplifiers 14 (SAb+1 to SAc).

The signals STB NEAR, STB_MID, and STB_FAR are signals different from each other. During data strobe, the signal STB NEAR is asserted, then, the signal STB_MID is asserted, and finally the signal STB_FAR is asserted.

<1-6-1-2> Outline of Sense Amplifier

Figure 23:
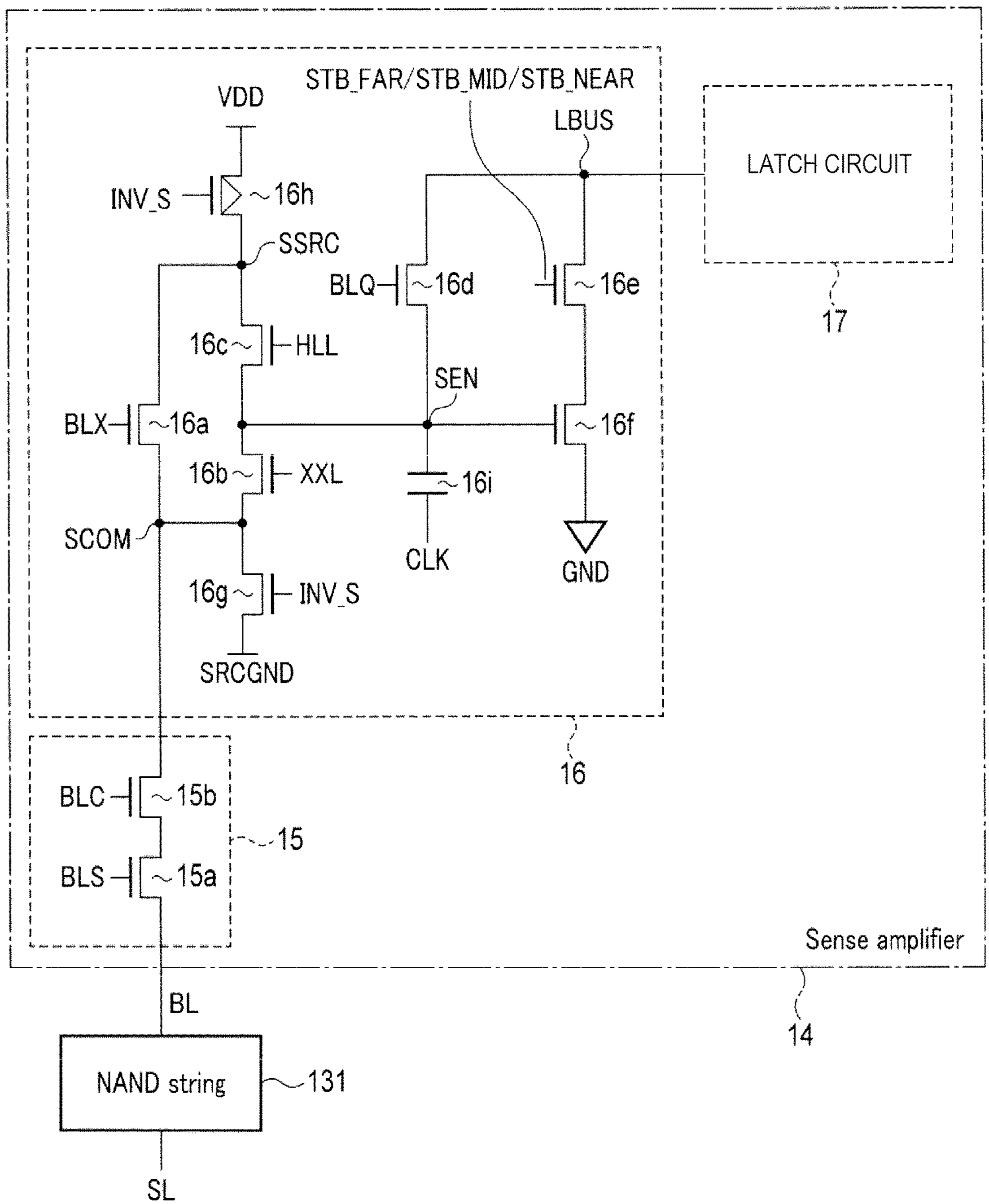
FIG. 23 is a circuit diagram of a sense amplifier, that illustrates application of different strobe signals.

An outline of the sense amplifiers 14 will be described with reference to FIG. 23.

The signal STB NEAR is supplied to a gate of the transistor 16*e* of the sense amplifier 14, which belongs to the sense amplifiers 14 (SA0 to SAa). The signal STB_MID is supplied to a gate of the transistor 16*e* of the sense amplifier 14 which belongs to the sense amplifiers 14 (SAa+1 to SAb). The signal STB_FAR is supplied to a gate of the transistor 16*e* of the sense amplifiers 14, which belongs to the sense amplifiers 14 (SAb+1 to SAc).

The transistor 16*f* is controlled to sense the read data based on a voltage of the node SEN at timings when the signals STB NEAR, STB_MID, or STB_FAR are asserted, and the transistor 16*e* is turned on to transfer the sensed data to the latch circuit 17.

<1-6-1-3> Configuration Relating to Signal Generation

Figure 24:
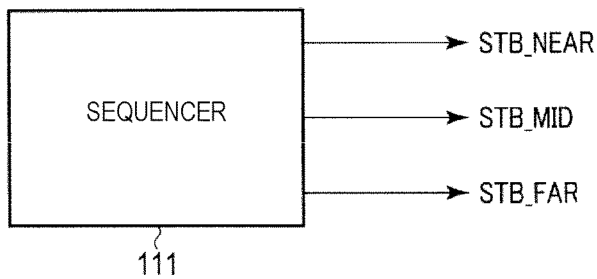
FIG. 24 is a conceptual diagram of different strobe signals being generated.
Figure 25:
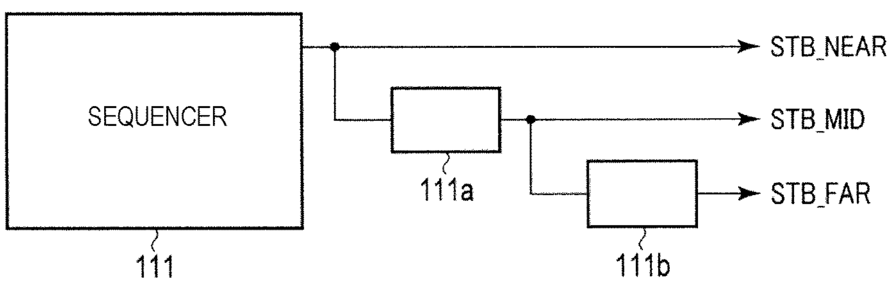
FIG. 25 is a block diagram of a strobe signal generation circuit.

FIG. 24 and FIG. 25 are conceptual drawings illustrating a method of generating the signals STB NEAR, STB_MID, and STB_FAR. As illustrated in FIG. 24, the sequencer 111 may generate all of three signals STB NEAR, STB_MID, and STB_FAR. Alternatively, as illustrated in FIG. 25, the sequencer 111 may generate only the signal STB NEAR. In this case, the signal STB_MID is generated by delaying the signal STB NEAR by a delay circuit 111*a*. In the same manner, the signal STB_FAR is generated by delaying the signal STB_MID by a delay circuit 111*b*.

<1-6-2> Read Operation

Subsequently, the data read operation according to the modified example 1 of the first embodiment will be described with reference to FIG. 26.

During read operation, the sequencer 111 applies a voltage VREAD, which turns the memory cell transistor MT ON, to the non-selected word lines WL irrespective of data retained therein. In addition, the voltage VSG, which turns the selected transistors ST1 and ST2 ON, is applied to the select gate lines SGD and SGS. The voltage of the selected word line rises continuously as illustrated in FIG. 26.

Data is read at a timing when the voltage of the selected word line WL reaches the VA. In other words, as illustrated in FIG. 26, determination is performed whether the threshold voltage of the memory cell transistor MT is included in the "Er"-level, or is included in distribution at the "A"-level or higher (This operation is referred to as "read operation AR"). In this manner, at a timing when the voltage of the selected word line WL reaches a certain voltage, retained data is determined depending on the voltage of the node SEN, and the result is transferred to the latch circuit 17. In the following, this operation relating to the read operation AR is referred to as "AR strobe".

Subsequently, at the timing when the voltage of the selected word line WL reaches VB, determination is performed whether the threshold voltage of the memory cell transistor MT is within a distribution of the "A"-level or lower, or within a distribution of the "B"-level or higher (this operation is referred to as "read operation BR"). Then, the result of determination is transferred to the latch circuit 17 (BR strobe).

Furthermore, at the timing when the voltage of the selected word line WL reaches VC, determination is performed whether the threshold voltage of the memory cell transistor MT is within the "C"-level, or within a distribution of the "B"-level or lower (this operation is referred to as "read operation CR"). Then, the result of determination is transferred to the latch circuit 17 (CR strobe).

As described above, when driving the selected word line WL via the row decoder 150, variations of voltage differ depending on a location of the memory cell transistor MT.

Figure 26:
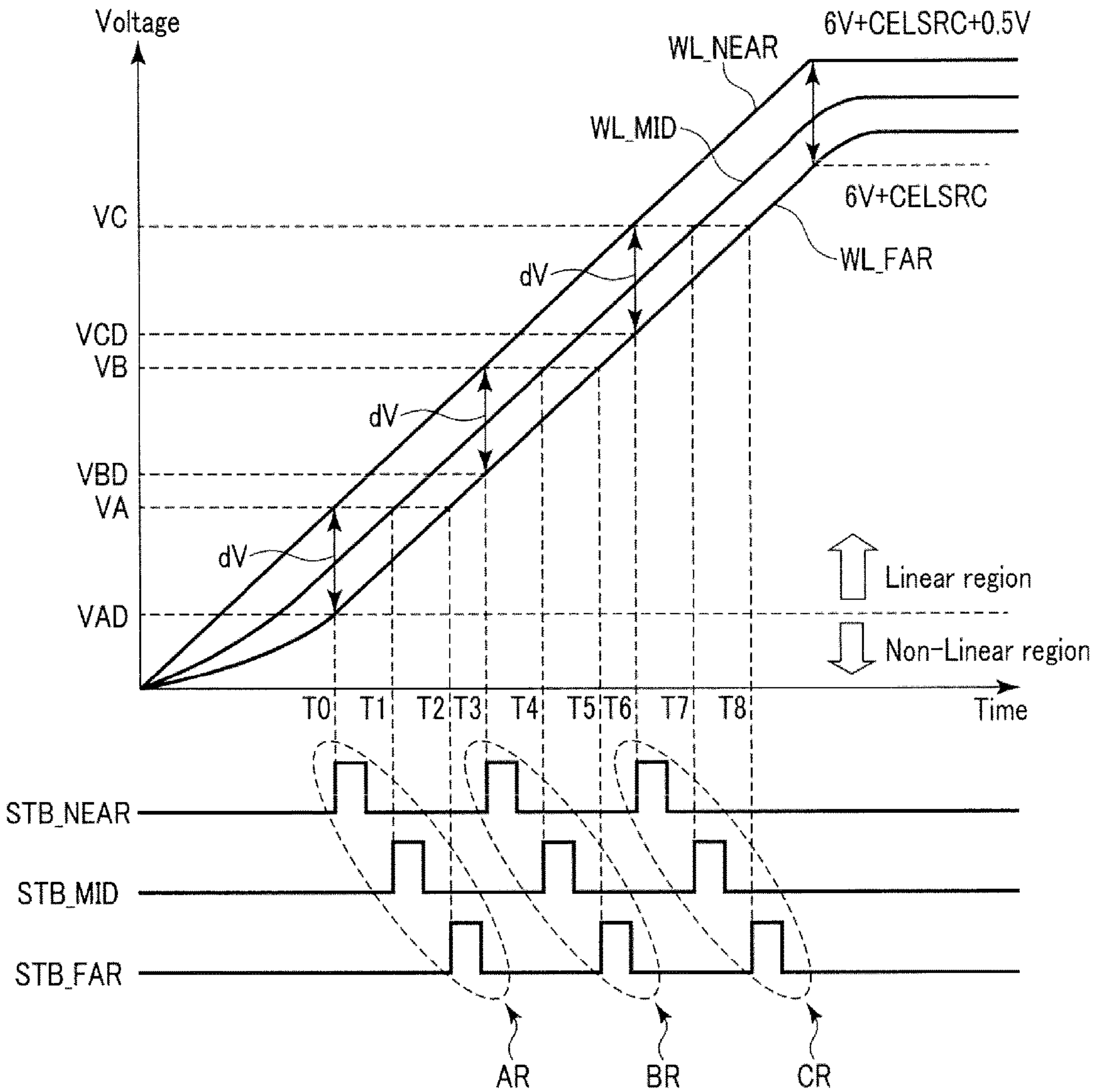
FIG. 26 is a timing chart showing the change in a word line voltage during a read operation and the strobe signal.

In other words, as illustrated in FIG. 26, the voltage of a region WL_NEAR corresponding to a region nearest to the row decoder 150 (group GP1) of the selected word line WL rises without substantial delay. In other words, during the read operation, (dV/dT) is substantially constant (where V represents a word line voltage, and T represents time). In contrast, the voltage of a region WL_MID corresponding to the group GP2 delays when the voltage rises compared with the voltage of the region WL_NEAR, and the voltage of a region WL_FAR which is the farthest from the row decoder 150 further delays.

In other words, in the read operation AR, the gate voltage of the memory cell transistor MT corresponding to the group GP1 reaches the voltage VA at approximately time T0. However, the gate voltage of the memory cell transistor MT corresponding to the group GP2 reaches the voltage VA at approximately time T1, which is later than the time T0, and the gate voltage of the memory cell transistor MT corresponding to the group GP3 reaches the voltage VA at approximately time T2, which is even later.

Therefore, as illustrated in FIG. 26, the signal STB NEAR is asserted ("H" level) at the time T0. Therefore, data read from the memory cell transistor MT corresponding to the group GP1 is strobed at the time T0. The signal STB_MID is asserted at the time T1. Therefore, data read from the memory cell transistor MT corresponding to the group GP2 is strobed at the time T1. Subsequently, the signal STB_FAR is asserted at the time T2. Therefore, data read from the memory cell transistor MT corresponding to the group GP3 is strobed at the time T2.

As described above, the AR strobe is performed at the timings of time T0, T1, and T2 depending on the location of the memory cell transistor MT. The same applies to the read operations BR and CR.

This example may be applied to the example according to the first embodiment.

<1-7> Modified Example 2 of First Embodiment

A modified example 2 of the first embodiment will be described. In the modified example 2 of the first embodiment, a case where a writing method different from the data writing method described above is employed in the first embodiment will be described.

<1-7-1> Operation

<1-7-1-1> Example of Order of Performance of Program Operation and Program Verification Operation In the following, the order of performance of the program operation and the program verification operation will be described with reference to FIG. 27.

Figure 27:
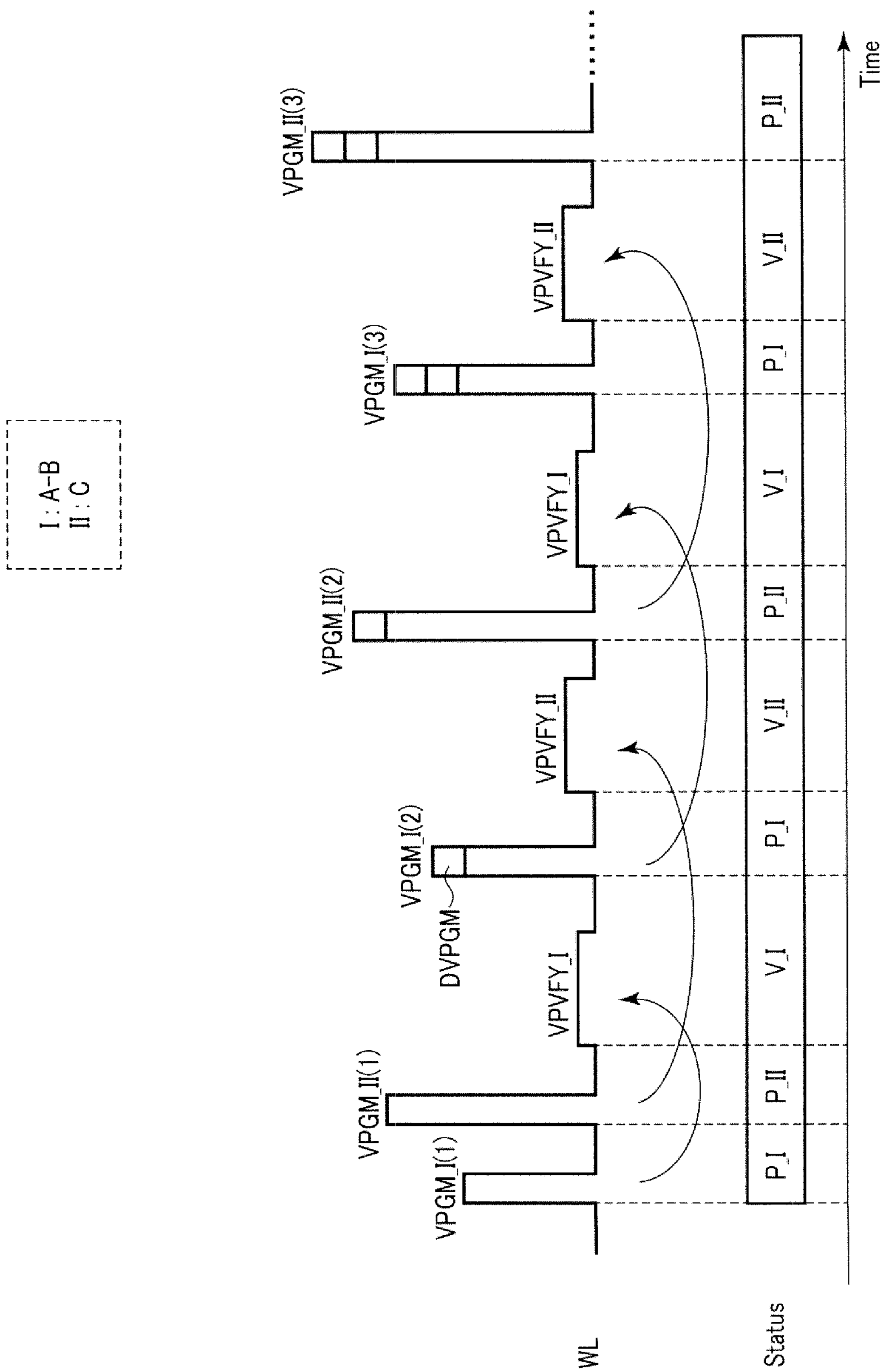
FIG. 27 is a waveform chart schematically showing a waveform of the word line during the write operation.

For easy understanding, FIG. 27 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

In the same manner as the write operation described in conjunction with FIG. 17, the write operation of the modified example 2 of the first embodiment is divided into a first write operation and a second write operation. The first write operation and the second write operation according to the modified example 2 of the first embodiment are the same as the first write operation and the second write operation described in conjunction with FIG. 17.

In the first embodiment, the second program operation is performed, and then the first program operation is performed. However, as illustrated in FIG. 27, in the modified example 2 of the first embodiment, the first program operation is performed first, and then the second program operation is performed. In this manner, in the modified example 2 of the first embodiment, an operation in which the order of performance of the first write operation and the second write operation are inverted is performed.

In this example, in the same manner as the first embodiment, control is performed basically so that the first program verification operation is not performed immediately after the first program operation, and the second program verification operation is not performed immediately after the second program operation.

Figure 28:
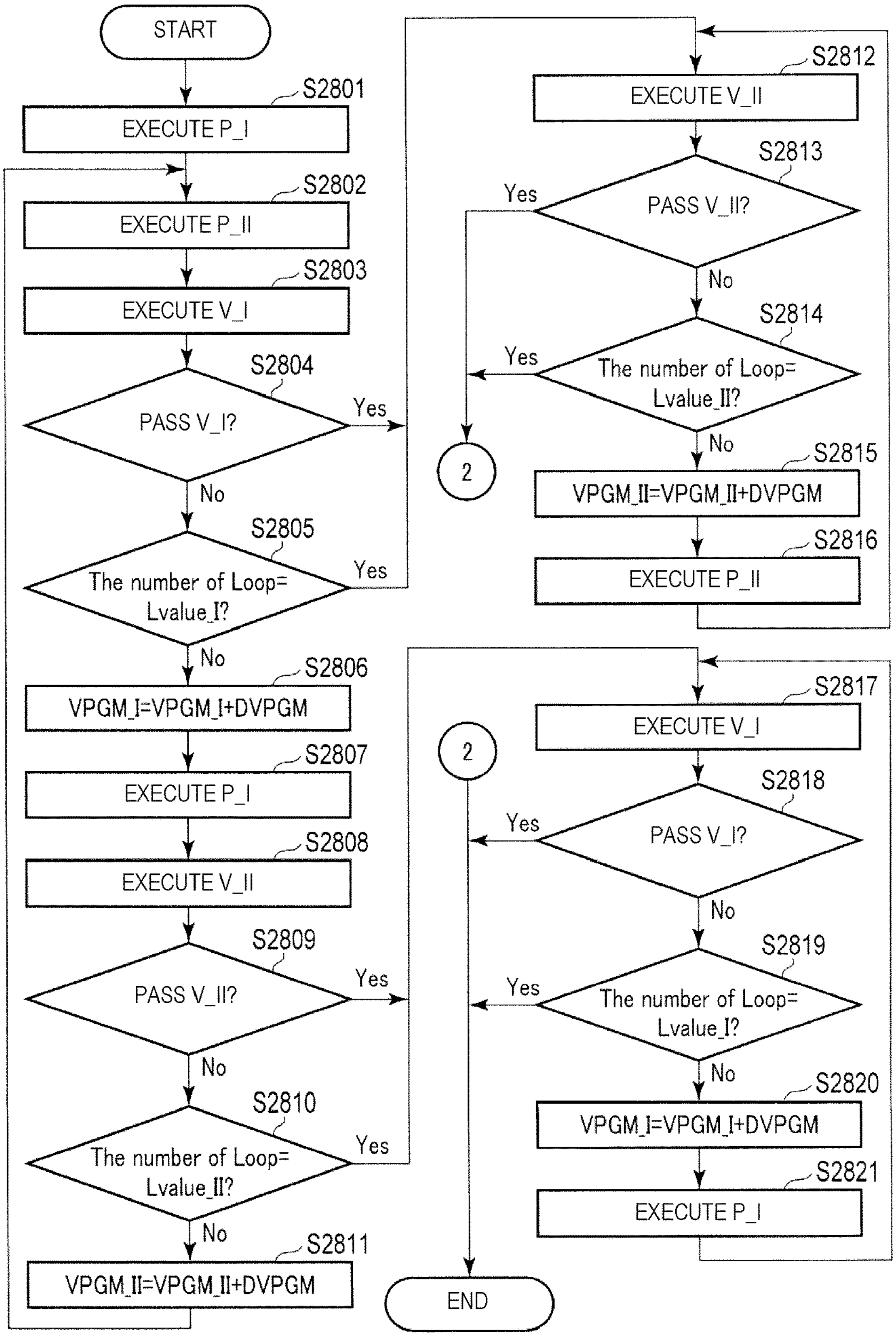
FIG. 28 is a flowchart showing the method of generating the performance order (pulse order) of the program operation and the program verification operation.

<1-7-1-2> Method of Generating Order of Performance of Program Operation and Program Verification Operation A method of generating the order of performance of the program operation and the program verification operation (pulse order) according to the first embodiment will be described with reference to FIG. 28.

Step S2801

The sequencer 111 performs a first program operation (P_I) first.

Step S2802

The sequencer 111 performs a second program operation (P_II).

Step S2803

The sequencer 111 performs the first program verification operation (V_I) after performing the second program operation.

In this manner, the sequencer 111 performs other operations between the first program operation and the first program verification operation. Accordingly, the sequencer 111 is capable of performing the program verification in a state in which the electron leakage becomes stable.

Step S2804

The sequencer 111 determines whether or not the result of the first program verification operation is a pass.

Step S2805 If the sequencer 111 determines that the result of the first program verification operation is not a pass (NO in Step S2804), the sequencer 111 counts up the number of loops relating to the first program operation. Subsequently, the sequencer 111 counts up the number of loops and then determines whether or not the number of loops of the first program operation is the set value (LValue_I).

Step S2806

If the sequencer 111 determines that the number of loops is not the set value (LValue_I) (NO in Step S2805), the sequencer 111 increments the voltage VPGM_I to be used in the first program operation by the voltage DVPGM.

Step S2807

The sequencer 111 performs the first program operation (P_I).

Step S2808

The sequencer 111 performs the second program verification operation (V_II) after performing the first program operation.

In this manner, the sequencer 111 performs other operations between the second program operation and the second program verification operation. Accordingly, the sequencer 111 is capable of performing the program verification in a state in which the electron leakage becomes stable.

Step S2809

The sequencer 111 determines whether or not the result of the second program verification operation is a pass.

Step S2810

If the sequencer 111 determines that the result of the second program verification operation is not a pass (NO in Step S2809), the sequencer 111 counts up the number of loops relating to the second program operation. Subsequently, the sequencer 111 counts up the number of loops and then determines whether or not the number of loops of the second program operation is the set value (LValue_II).

Step S2811

If the sequencer 111 determines that the number of loops is not the set value (LValue_II) (NO in Step S2810), the sequencer 111 increments the voltage VPGM_II to be used in the second program operation by the voltage DVPGM.

Step S2812

If the sequencer 111 determines that the result of the first program verification operation is a pass (YES in S2804), or determines that the number of loops is the set value (LValue_II) (YES in Step S2805), the sequencer 111 performs the second program verification operation (V_II).

Step S2813

The sequencer 111 determines whether or not the result of the second program verification operation is a pass.

If the sequencer 111 determines that the result of the second program verification operation is a pass (YES in Step S2813), the sequencer 111 terminates the write operation.

Step S2814

If the sequencer 111 determines that the result of the second program verification operation is not a pass (NO in Step S2813), the sequencer 111 counts up the number of loops relating to the second program operation. Subsequently, the sequencer 111 counts up the number of loops and then determines whether or not the number of loops of the second program operation is the set value (LValue_II).

If the sequencer 111 determines that the number of loops relating to the second program operation is the set value (LValue_II), (YES in Step S2814), the sequencer 111 terminates the write operation.

Step S2815

If the sequencer 111 determines that the number of loops relating to the second program operation is not the set value (LValue_II) (NO in Step S2814), the sequencer 111 increments the voltage VPGM_II to be used in the second program operation by the voltage DVPGM.

Step S2816

The sequencer 111 performs a second program operation (P_II).

Step S2817

If sequencer 111 determines that the result of the second program verification operation is a pass (YES in S2809), or determines that the number of loops is the set value (LValue_II) (YES in Step S2810), the sequencer 111 performs the first program verification operation V_I.

Step S2818

The sequencer 111 determines whether or not the result of the first program verification operation is a pass.

If the sequencer 111 determines that the result of the first program verification operation is a pass (YES in Step S2818), the sequencer 111 terminates the write operation.

Step S2819

If the sequencer 111 determines that the result of the first program verification operation is not a pass (NO in Step S2818), the sequencer 111 counts up the number of loops relating to the first program operation. Subsequently, the sequencer 111 counts up the number of loops and then determines whether or not the number of loops of the first program operation is the set value (LValue_I).

If the sequencer 111 determines that the number of loops relating to the first program operation is the set value (LValue_I), (YES in Step S2819), the sequencer 111 terminates the write operation.

Step S2820

If the sequencer 111 determines that the number of loops relating to the first program operation is not the set value (LValue_I) (NO in Step S2819), the sequencer 111 increments the voltage VPGM_I to be used in the first program operation by the voltage DVPGM.

Step S2821

The sequencer 111 performs the first program operation (P_I).

<1-7-2> Specific Example of Pulse

Subsequently, the specific example of the write operation relating to the memory system of the modified example 2 of the first embodiment will be described.

Subsequently, referring now to FIG. 29 and FIG. 30, a specific example of the pulses for a case where the write operation of the modified example 2 is applied to the memory cell transistors MT described above will be described. The basic operations are the same as those described with reference to FIG. 20 and FIG. 21.

Figure 29:
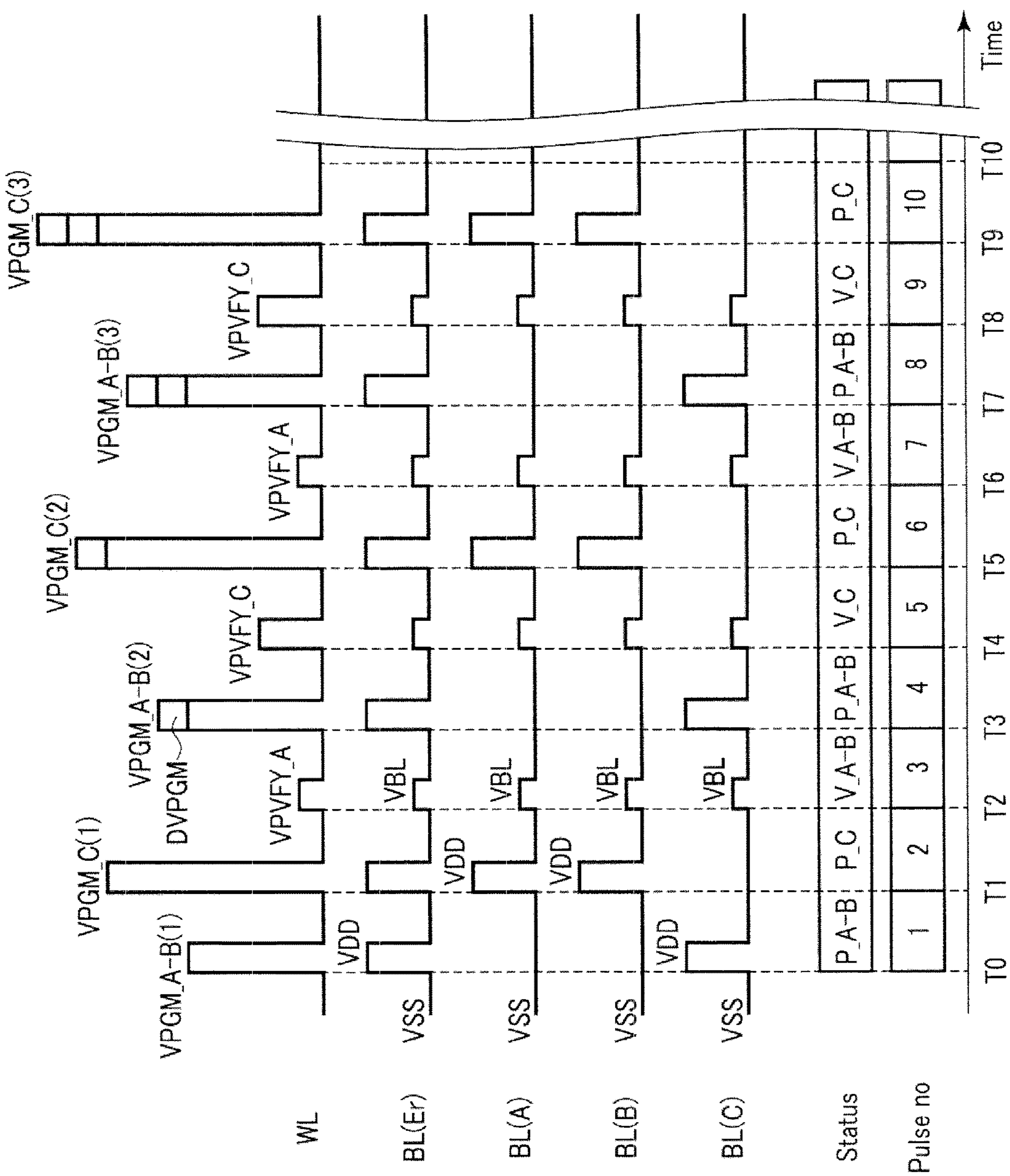
FIG. 29 is a waveform chart showing an example of voltages to be applied to the word lines and the bit lines during the write operation.

FIG. 29 and FIG. 30 illustrate pulses (i) and pulses (ii), which are roughly classified pulse categories, as described in conjunction with FIG. 20 and FIG. 21.

In the example illustrated in FIG. 29 and FIG. 30, the pulses corresponding to the pulse Nos. 1, 2, 3, 5, 12 correspond to the pulses of (i). The pulse No. 12 corresponds to the pulse No. 14 described in conjunction with FIG. 20 and FIG. 21.

In the example of FIG. 29 and FIG. 30, the pulses corresponding to those other than the pulse No. 1, 2, 3, 5, 12 correspond to the pulses of (ii).

<1-8> Modified Example 3 of First Embodiment

Subsequently, a specific example of the write operation relating to the memory system of a modified example 3 of the first embodiment will be described.

Subsequently, referring now to FIG. 31 and FIG. 32, a specific example of the pulse for a case where the write operation of the modified example 3 is applied to the memory cell transistors MT described above will be described. The basic operations are the same as those described with reference to FIG. 20 and FIG. 21.

Figure 31:
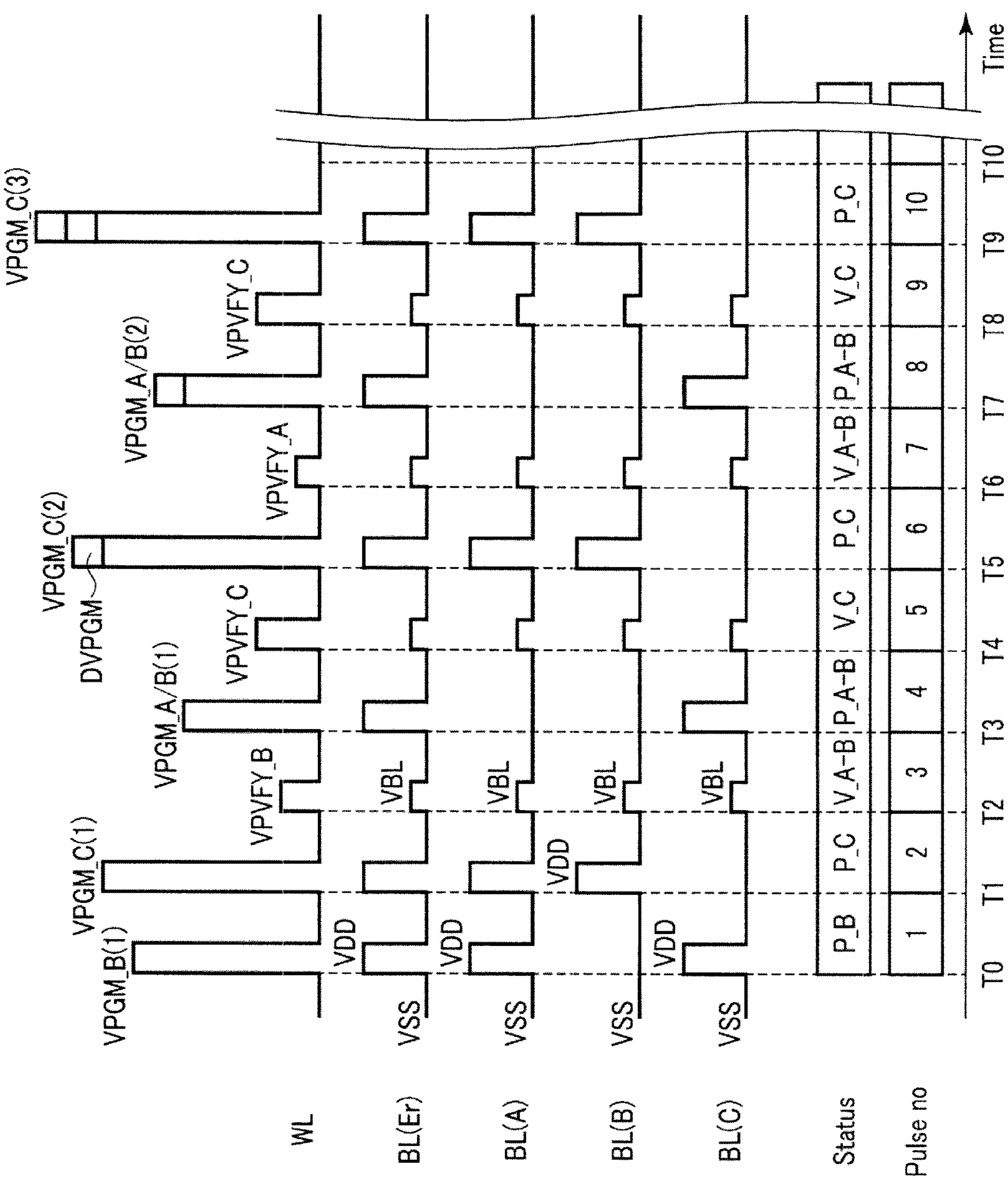
FIG. 31 is a waveform chart showing an example of voltages to be applied to the word lines and the bit lines during the write operation.

FIG. 31 and FIG. 32 illustrate a pulse of (i) and a pulse of (ii), which are roughly classified pulse categories, as described in conjunction with FIG. 20 and FIG. 21.

In the example illustrated in FIG. 31 and FIG. 32, pulses corresponding to the pulse Nos. 1 to 5, 7, and 12 correspond to the pulses of (i). In the example illustrated in FIG. 31 and FIG. 32, the sequencer 111 applies a pulse corresponding to the pulse No. 1 (Pulse No=1) to the memory cell transistor MT (B). The pulse corresponding to the pulse No. 1 is, for example, larger than the pulse applied during the first program operation for the first time. In this manner, the modified example 3 is an example in which a voltage larger than the pulse applied during the first program operation for the first time is applied firstly to the memory cell transistor MT (B).

In the example of FIG. 31 and FIG. 32, the pulses corresponding to those other than the pulse No. 1 to 5, 7, and 12 correspond to the pulses of (ii).

<1-9> Modified Example 4 of First Embodiment

A modified example 4 of the first embodiment will be described. In the modified example 4 of the first embodiment, a case where a data writing method different from the writing method described above is employed in the first embodiment will be described.

<1-9-1> Operation

<1-9-1-1> Example of Order of Performance of Program Operation and Program Verification Operation In the following, the order of performance of the program operation and the program verification operation will be described with reference to FIG. 33.

Figure 33:
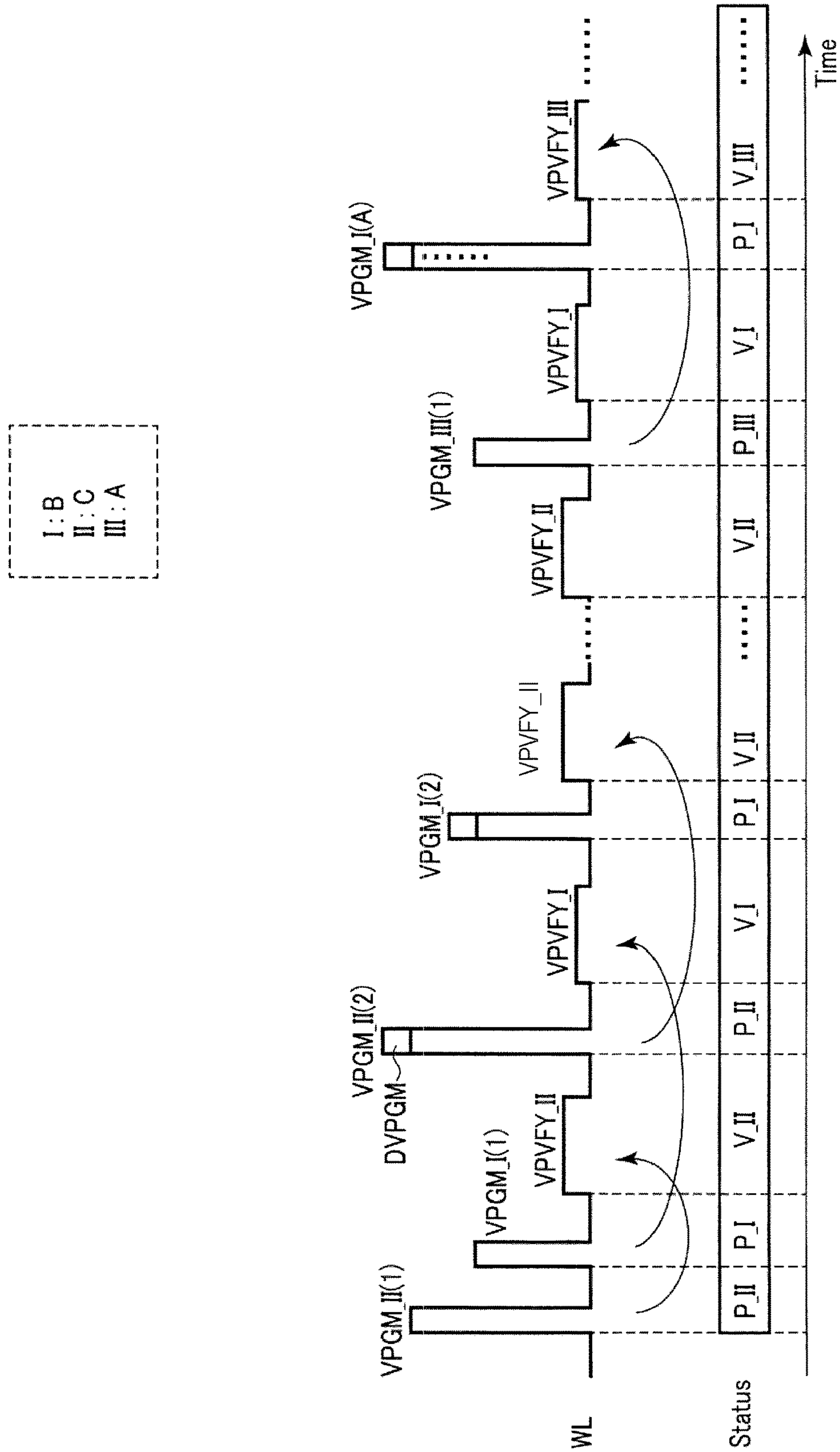
FIG. 33 is a waveform chart schematically showing a waveform of the word line during the write operation.

For easy understanding, FIG. 33 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 4 of the first embodiment is divided into first to third write operations.

The first write operation is the write operation for the "B"-level. The second write operation is a write operation for a "C"-level. The third write operation is a write operation for the "A"-level.

The first write operation includes a first program operation (P_I) relating to writing for the "B"-level, and a first program verification operation (V_I) that determines whether or not the first program operation has passed.

The second write operation includes a second program operation (P_II) relating to writing for a "C"-level, and a second program verification operation (V_II) that determines whether or not the second program operation has passed.

The third write operation includes a third program operation (P_III) relating to writing for the "A"-level, and a third program verification operation (V_III) that determines whether or not the third program operation has passed.

In the first program operation, the voltage VPGM to be applied to the selected word line WL is expressed as voltage VPGM_I (n). In the same manner, in the second program operation, the voltage VPGM to be applied to the selected word line WL is expressed as voltage VPGM_II (n). In the same manner, in the third program operation, the voltage VPGM to be applied to the selected word line WL is expressed as voltage VPGM_III (n).

The sequencer 111 increments the voltage VPGM_I (n) by the voltage DVPGM every time the first program operation is performed. In the same manner, the sequencer 111 increments the voltage VPGM_II (n) by the voltage DVPGM every time the second program operation is performed. In the same manner, the sequencer 111 increments the voltage VPGM_III (n) by the voltage DVPGM every time the third program operation is performed. Every time the voltage VPGM_I (n), the voltage VPGM_II (n), or the voltage VPGM_III (n) is incremented by the voltage DVPGM, the value n is also incremented.

In the first program verification operation, the voltage VPVFY to be applied to the selected word line WL is expressed as voltage VPVFY_I. In the second program verification operation, the voltage VPVFY to be applied to the selected word line WL is expressed as voltage VPVFY_II. In the same manner, in the third program verification operation, the voltage VPVFY to be applied to the selected word line WL is expressed as voltage VPVFY_III.

In the example illustrated in FIG. 33, control is performed so that the first program verification operation is not performed immediately after the first program operation, the second program verification operation is not performed immediately after the second program operation, and the third program verification operation is not performed immediately after the third program operation. The third program operation is performed after conditions have been satisfied.

<1-9-1-2> Method of Generating Order of Performance of Program Operation and Program Verification Operation Referring now to FIG. 34 to FIG. 49, a method of generating the order of performance of the program operation and the program verification operation according to the modified example 4 of the first embodiment will be described.

Step S3401

Figure 34:
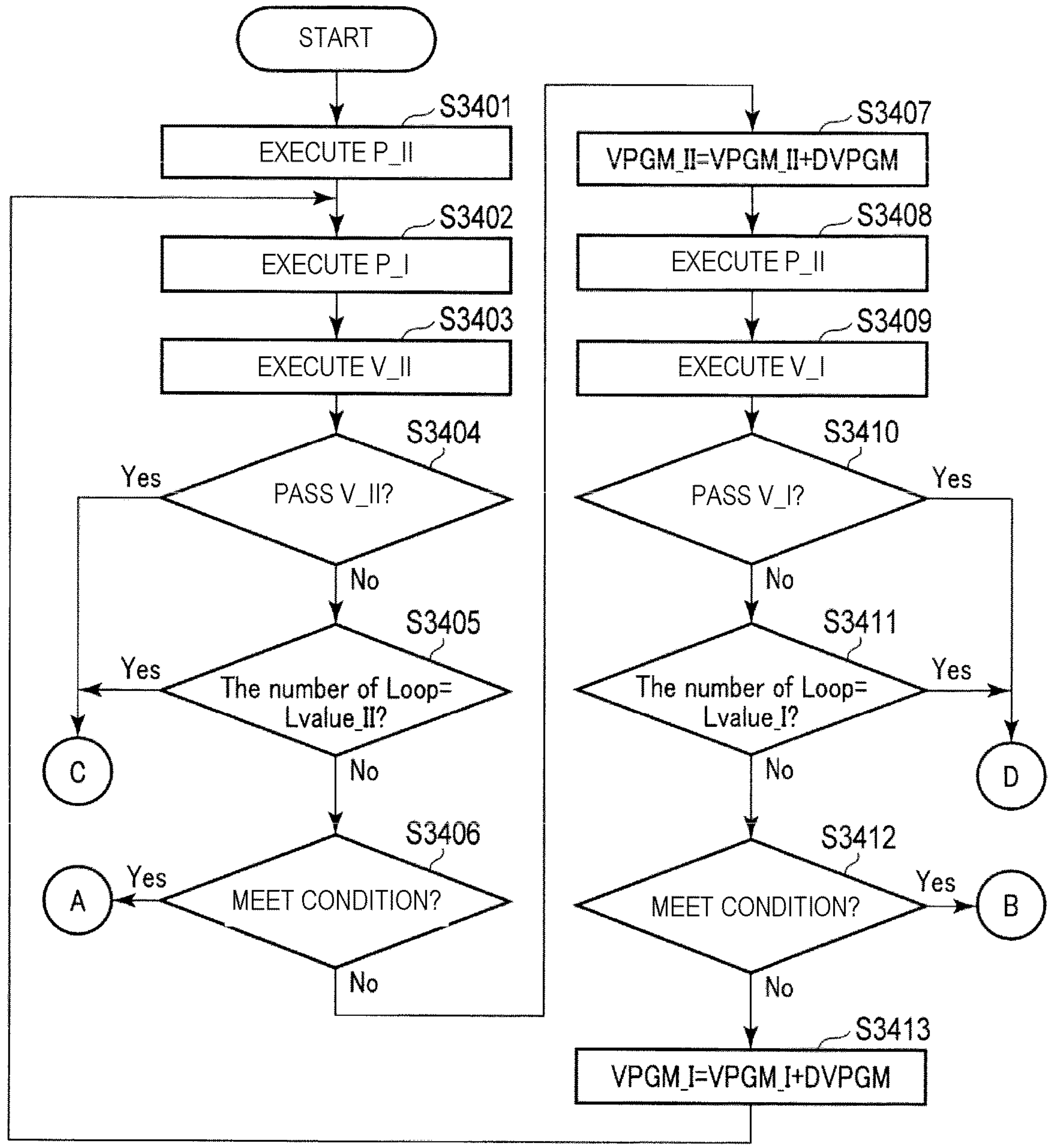
FIGS. 34-49 depict a flowchart showing the method of generating the performance order (pulse order) of the program operation and the program verification operation in the first embodiment.

First of all, the sequencer 111 performs the second program operation (see FIG. 34).

Step S3402

The sequencer 111 performs the first program operation.

Step S3403

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S3404

The sequencer 111 determines whether or not the result of the second program verification operation is a pass.

Step S3405

If the sequencer 111 determines that the result of the second program verification operation is not a pass (NO in Step S3404), the sequencer 111 counts up the number of loops relating to the second program operation.

Subsequently, the sequencer 111 counts up the number of loops and then determines whether or not the number of loops of the second program operation is the set value (LValue_II).

Step S3406

If the sequencer 111 determines that the number of loops is not the set value (LValue_II) (NO in Step S3405), the sequencer 111 determines whether or not the condition is satisfied.

The above-described conditions will be described. The above-described conditions include, for example, any one of "the number of loops of the first program operation", "the number of loops of the second program operation", "the number of loops of the first program verification operation", and "the number of loops of the second program verification operation" or "the total number of loops of various numbers of loops (any combination)" reaches the "set value". The above-described conditions may be "the write operation for the predetermined level is completed". The above-described conditions are examples only, and other conditions are also applicable.

For example, if the condition is "the number of loops of the first program operation reaches the set value", the sequencer 111 determines whether or not the number of loops of the first program operation is a set value (JValue_I).

In addition, for example, if the condition is "the write operation for the "A"-level is completed", the sequencer 111 determines whether or not the write operation of the "A"-level is completed.

Information relating to the above-described conditions is stored, for example, in the register 112. More specifically, a configuration in which the information relating to the conditions is stored, for example, in the memory cell array 130, and is read out to the register 112 when the NAND flash memory 100 is activated is also applicable.

It is noted that the respective "conditions" described below may be conditions different from each other. The same applies to other embodiments.

Step S3407

If the sequencer 111 determines that the condition is not satisfied (NO in Step S3406), the sequencer 111 increments the voltage VPGM_II to be used in the second program operation by the voltage DVPGM.

Step S3408

The sequencer 111 performs the second program operation.

Step S3409

The sequencer 111 performs the first program verification operation after performing the second program operation.

In this manner, the sequencer 111 performs other operations between the first program operation and the first program verification operation. Accordingly, the sequencer 111 is capable of performing the program verification in a state in which the electron leakage becomes stable.

Step S3410

The sequencer 111 determines whether or not the result of the first program verification operation is a pass.

Step S3411

If the sequencer 111 determines that the result of the first program verification operation is not a pass (NO in Step S3410), the sequencer 111 counts up the number of loops relating to the first program operation. Subsequently, the sequencer 111 counts up the number of loops and then determines whether or not the number of loops of the first program operation is the set value (LValue_I).

Step S3412

If the sequencer 111 determines that the number of loops is not the set value (LValue_I) (NO in Step S3411), the sequencer 111 determines whether or not the condition is satisfied. The "condition" in Step S3412 may be different from the "condition" in Step S3406.

Step S3413

If the sequencer 111 determines that the condition is not satisfied (NO in Step S3412), the sequencer 111 increments the voltage VPGM_I to be used in the first program operation by the voltage DVPGM. Subsequently, the sequencer 111 performs Step S3402.

Step S3501

Figure 35:
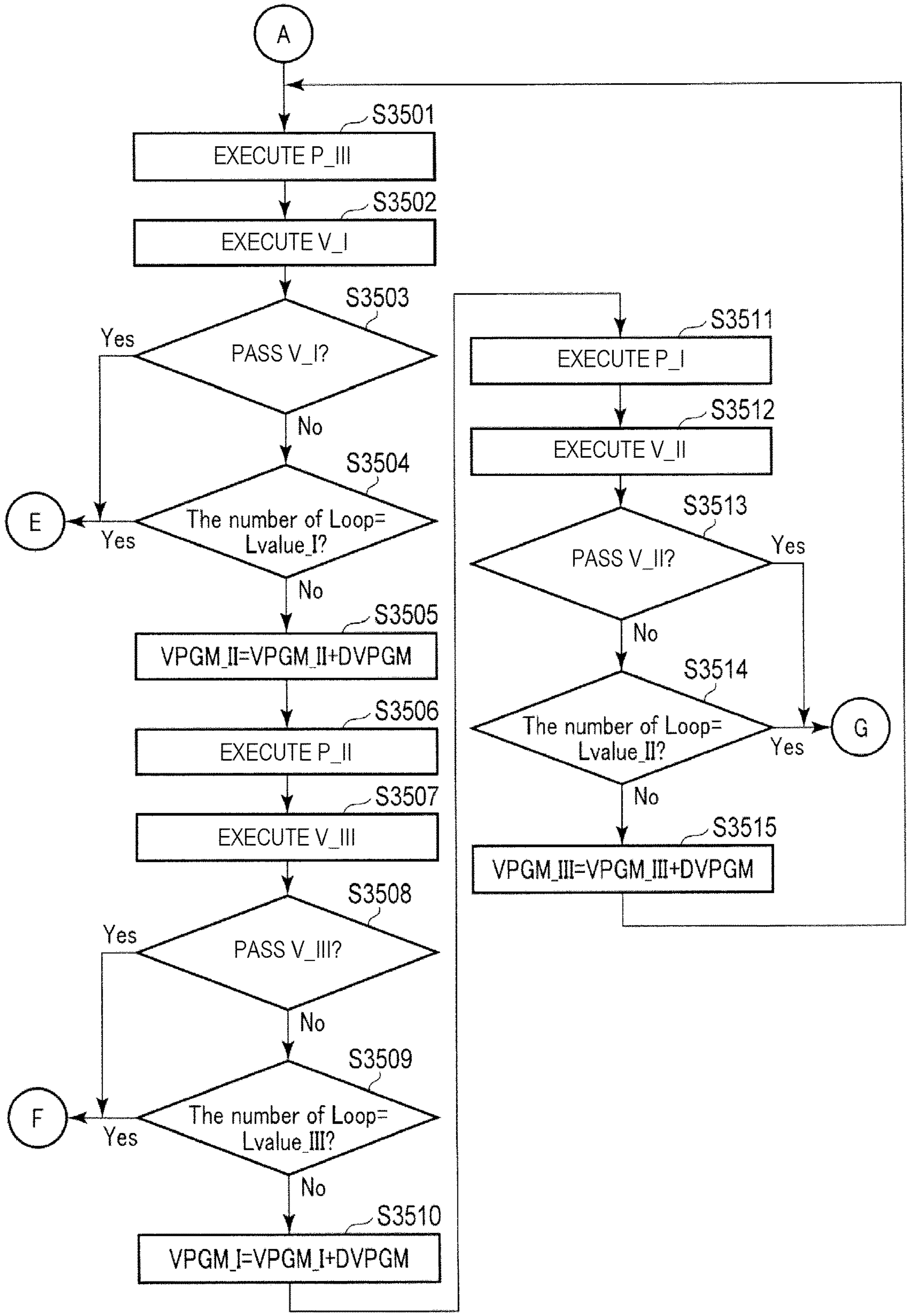

If the sequencer 111 determines that "the condition is satisfied" in Step S3406 (YES in Step S3406), a sequencer 111 performs the third program operation (see FIG. 35).

Step S3502

The sequencer 111 performs the first program verification operation after performing the third program operation.

In this manner, the sequencer 111 performs other operations between the first program operation and the first program verification operation. Accordingly, the sequencer 111 is capable of performing the program verification in a state in which the electron leakage becomes stable.

Step S3503

The sequencer 111 determines whether or not the result of the first program verification operation is a pass.

Step S3504

If the sequencer 111 determines that the result of the first program verification operation is not a pass (NO in Step S3503), the sequencer 111 counts up the number of loops relating to the first program operation. Subsequently, the sequencer 111 counts up the number of loops and then determines whether or not the number of loops of the first program operation is the set value (LValue_I).

Step S3505

If the sequencer 111 determines that the number of loops is not the set value (LValue_I) (NO in Step S3504), the sequencer 111 increments the voltage VPGM_II to be used in the second program operation by the voltage DVPGM.

Step S3506

The sequencer 111 performs the second program operation.

Step S3507

The sequencer 111 performs the third program verification operation after performing the second program operation.

In this manner, the sequencer 111 performs other operations between the third program operation and the third program verification operation. Accordingly, the sequencer 111 is capable of performing the program verification in a state in which the electron leakage becomes stable.

Step S3508

The sequencer 111 determines whether or not the result of the third program verification operation is a pass. More specifically, the sequencer 111 determines whether or not the number of the fail bits determined by the third program verification operation is not smaller than a set value (FValue_III). In the case where the number of the fail bits is smaller than the set value (FValue_III), the sequencer 111 determines that the result of the third program verification operation is a pass. The set value (FValue_III) is, for example, the number of the fail bits which cannot be rescued by the ECC circuit 206. The set value (FValue_III) is stored, for example, in the register 112. More specifically, a configuration in which the set value (FValue_III) is stored, for example, in the memory cell array 130, and is read out to the register 112 when the NAND flash memory 100 is activated is also applicable. In other words, the sequencer 111 compares the set value (FValue_III) stored in the register 112 with the number of the fail bits.

Step S3509

If the sequencer 111 determines that the result of the third program verification operation is not a pass (No in Step S3508), the sequencer 111 counts up the number of loops relating to the third program operation. Subsequently, the sequencer 111 counts up the number of loops and then determines whether or not the number of loops of the third program operation is a set value (LValue_III). For example the number of loops of the third program operation is stored in the register 112. The counting of the number of loops of the third program operation may be performed by the sequencer 111, or may be performed by other units.

Subsequently, the sequencer 111 counts up the number of loops and then determines whether or not the number of loops of the third program operation is a set value (LValue_III). The set value (LValue_III) is stored, for example, in the register 112. More specifically, a configuration in which the set value (LValue_III) is stored, for example, in the memory cell array 130, and is read out to the register 112 when the NAND flash memory 100 is activated is also applicable. In other words, the sequencer 111 compares the set value (LValue_III) stored in the register 112 with the number of loops of the third program operation.

Step S3510

If the sequencer 111 determines that the number of loops is not the set value (LValue_III) (NO in Step S3509), the sequencer 111 increments the voltage VPGM_I to be used in the first program operation by the voltage DVPGM.

Step S3511

The sequencer 111 performs the first program operation.

Step S3512

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S3513

The sequencer 111 determines whether or not the result of the second program verification operation is a pass.

Step S3514

If the sequencer 111 determines that the result of the second program verification operation is not a pass (NO in Step S3513), the sequencer 111 counts up the number of loops relating to the second program operation. Subsequently, the sequencer 111 counts up the number of loops and then determines whether or not the number of loops of the second program operation is the set value (LValue_II).

Step S3515

If the sequencer 111 determines that the number of loops is not the set value (LValue_II) (NO in Step S3514), the sequencer 111 increments that the voltage VPGM_III to be used in the third program operation by the voltage DVPGM.

Subsequently, the sequencer 111 performs Step S3501.

Step S3601

Figure 36:
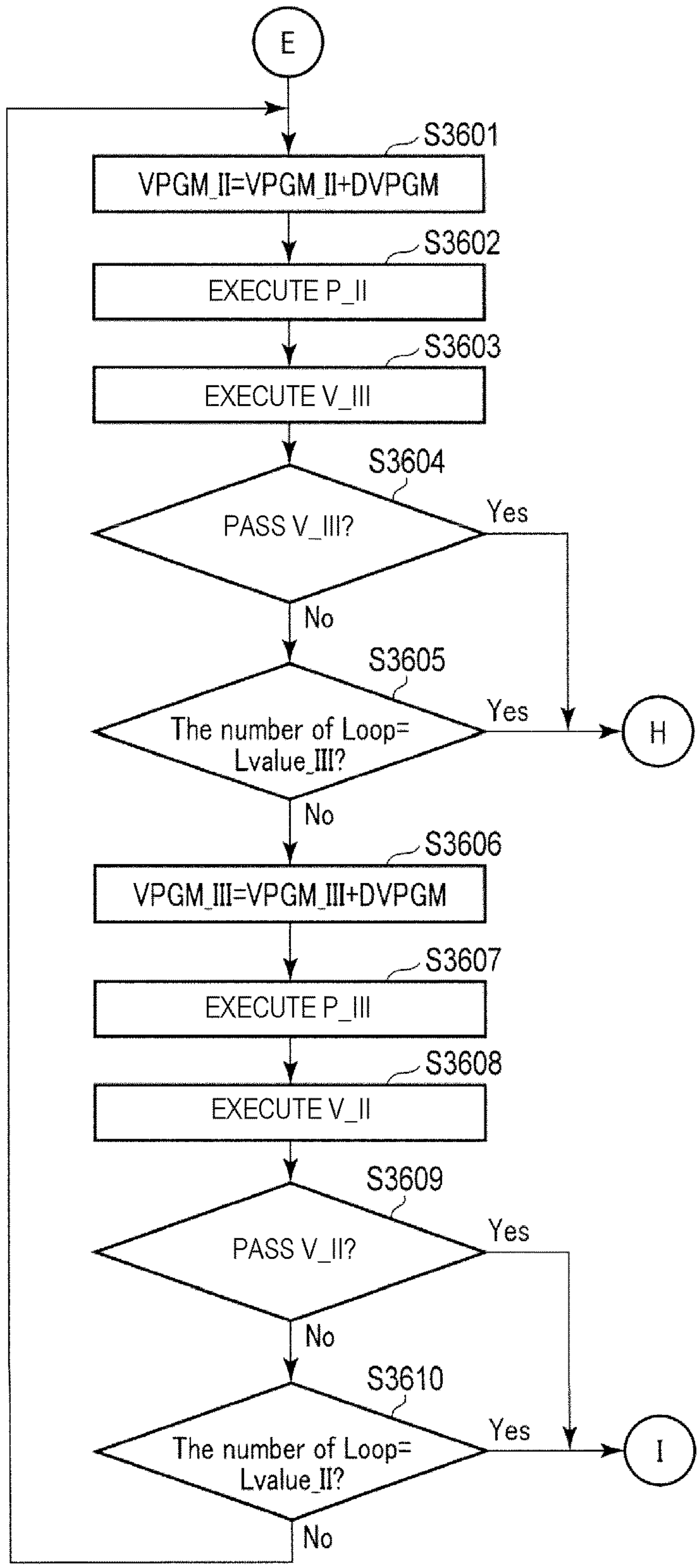

If the sequencer 111 determines that "the result of the first program verification operation is a pass" in Step S3503 (YES in Step S3503), or determines that "the number of loops is the set value (LValue_I)" in Step S3504 (YES in Step S3504), the sequencer 111 increments the voltage VPGM_II to be used in the second program operation by the voltage DVPGM (see FIG. 36).

Step S3602

The sequencer 111 performs the second program operation.

Step S3603

The sequencer 111 performs the third program verification operation after performing the second program operation.

In this manner, the sequencer 111 performs other operations between the third program operation and the # program verification operation. Accordingly, the sequencer 111 is capable of performing the program verification in a state in which the electron leakage becomes stable.

Step S3604

The sequencer 111 determines whether or not the result of the third program verification operation is a pass.

Step S3605

If the sequencer 111 determines that the result of the third program verification operation is not a pass (NO in Step S3604), the sequencer 111 counts up the number of loops relating to the third program operation. Subsequently, the sequencer 111 counts up the number of loops and then determines whether or not the number of loops of the third program operation is a set value (LValue_III).

Step S3606

If the sequencer 111 determines that the number of loops is not the set value (LValue_III) (NO in Step S3605), the sequencer 111 increments the voltage VPGM_III to be used in the third program operation by the voltage DVPGM.

Step S3607

The sequencer 111 performs the third program operation.

Step S3608

The sequencer 111 performs the second program verification operation after performing the third program operation.

In this manner, the sequencer 111 performs other operations between the second program operation and the second program verification operation. Accordingly, the sequencer 111 is capable of performing the program verification in a state in which the electron leakage becomes stable.

Step S3609

The sequencer 111 determines whether or not the result of the second program verification operation is a pass.

Step S3610

If the sequencer 111 determines that the result of the second program verification operation is not a pass (NO in Step S3609), the sequencer 111 counts up the number of loops relating to the second program operation. Subsequently, the sequencer 111 counts up the number of loops and then determines whether or not the number of loops of the second program operation is the set value (LValue_II).

If the sequencer 111 determines that the number of loops is not the set value (LValue_II) (NO in Step S3610), the sequencer 111 repeats Step S3601.

Step S3701

Figure 37:
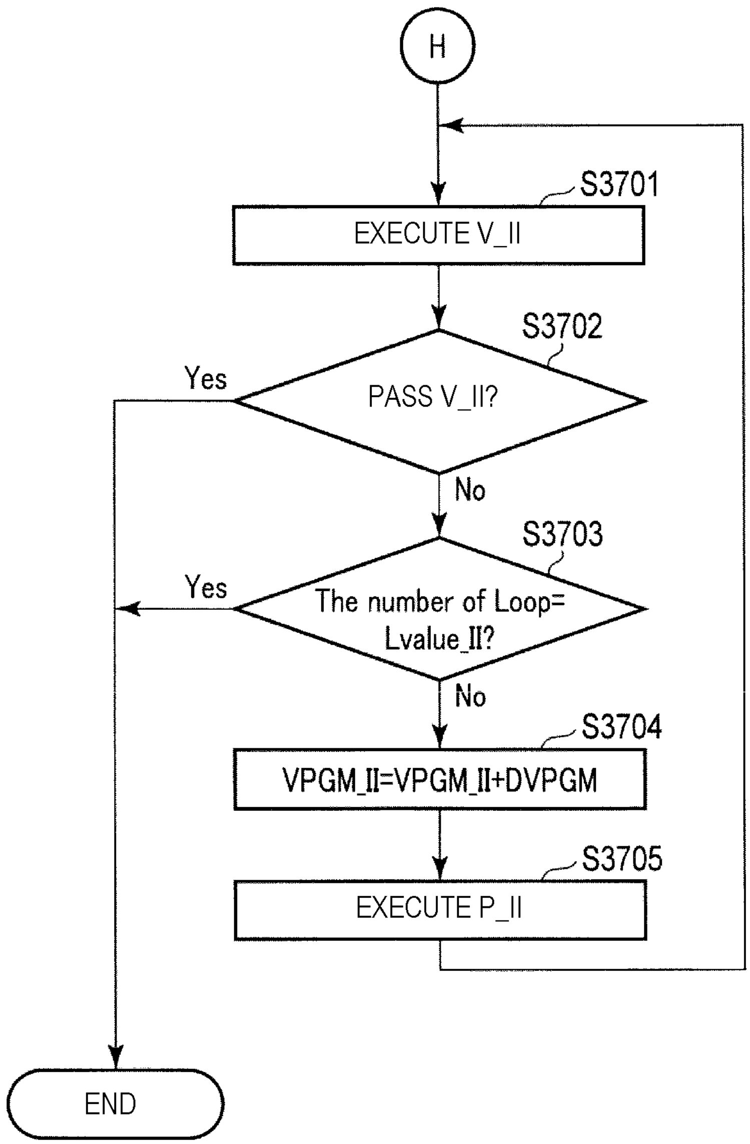

If the sequencer 111 determines that "the result of the third program verification operation is a pass" in Step S3604 (YES in Step S3604), or determines that "the number of loops is the set value (LValue_III)" in Step S3605 (YES in Step S3605), the second program verification operation is performed (see FIG. 37).

Step S3702

The sequencer 111 determines whether or not the result of the second program verification operation is a pass.

The sequencer 111 terminates the write operation in a case where the result of the second program verification operation is a pass (YES in Step S3702).

Step S3703

If the sequencer 111 determines that the result of the second program verification operation is not a pass (NO in Step S3702), the number of loops relating to the second program operation is determined. Subsequently, the sequencer 111 counts up the number of loops and then determines whether or not the number of loops of the second program operation is the set value (LValue_II).

The sequencer 111 terminates the write operation in a case where the number of loops is the set value (LValue_II) (YES in Step S3703).

Step S3704

If the sequencer 111 determines that the number of loops is not the set value (LValue_II) (NO in Step S3703), the voltage VPGM_II to be used in the second program operation is incremented by the voltage DVPGM.

Step S3705

The sequencer 111 performs the second program operation.

Step S3801

Figure 38:
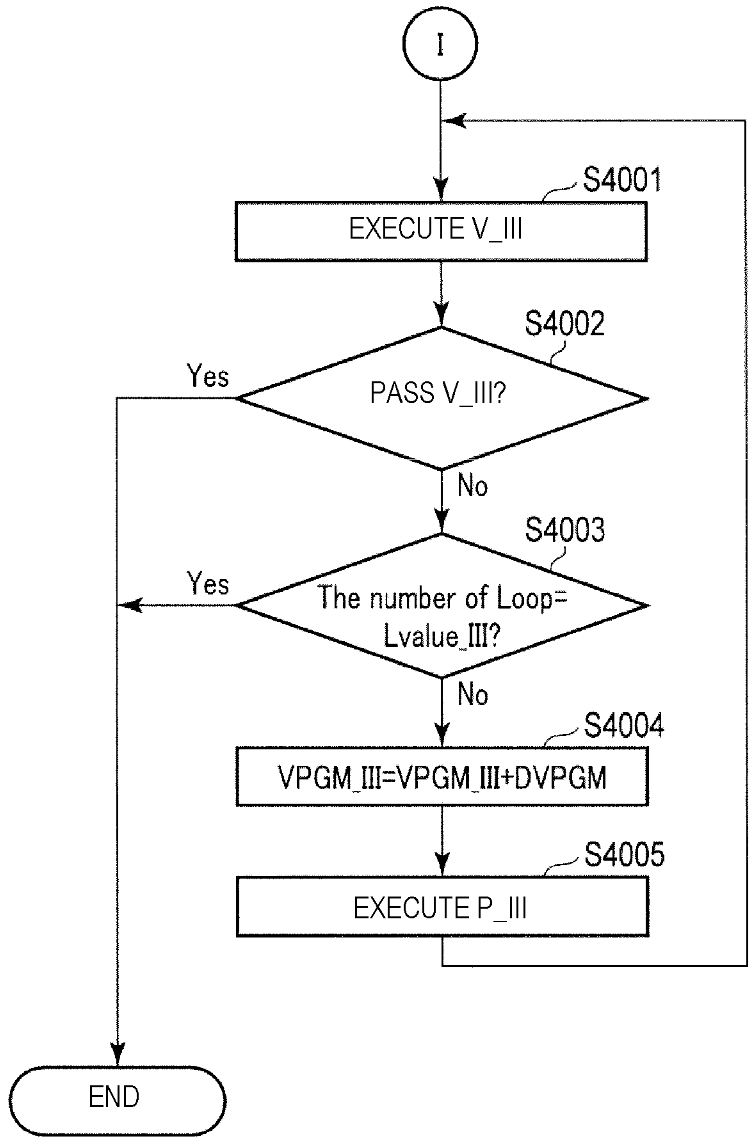

If the sequencer 111 determines that "the result of the second program verification operation is a pass" in Step S3609 (YES in Step S3609), or determines that "the number of loops is the set value (LValue_II)" in Step S3610 (YES in Step S3610), the third program verification operation is performed (see FIG. 38).

Step S3802

The sequencer 111 determines whether or not the result of the third program verification operation is a pass.

The sequencer 111 terminates the write operation in a case where the result of the third program verification operation is a pass (YES in Step S3802).

Step S3803

If the sequencer 111 determines that the result of the third program verification operation is not a pass (NO in Step S3802), the number of loops relating to the third program operation is counted. Subsequently, the sequencer 111 counts up the number of loops and then determines whether or not the number of loops of the third program operation is a set value (LValue_III).

The sequencer 111 terminates the write operation in a case where the number of loops is the set value (LValue_III) (YES in Step S3803).

Step S3804

If the sequencer 111 determines that the number of loops is not the set value (LValue_III) (NO in Step S3803), the sequencer 111 increments the voltage VPGM_III to be used in the third program operation by the voltage DVPGM.

Step S3805

The sequencer 111 performs the third program operation.

Step S3901

Figure 39:
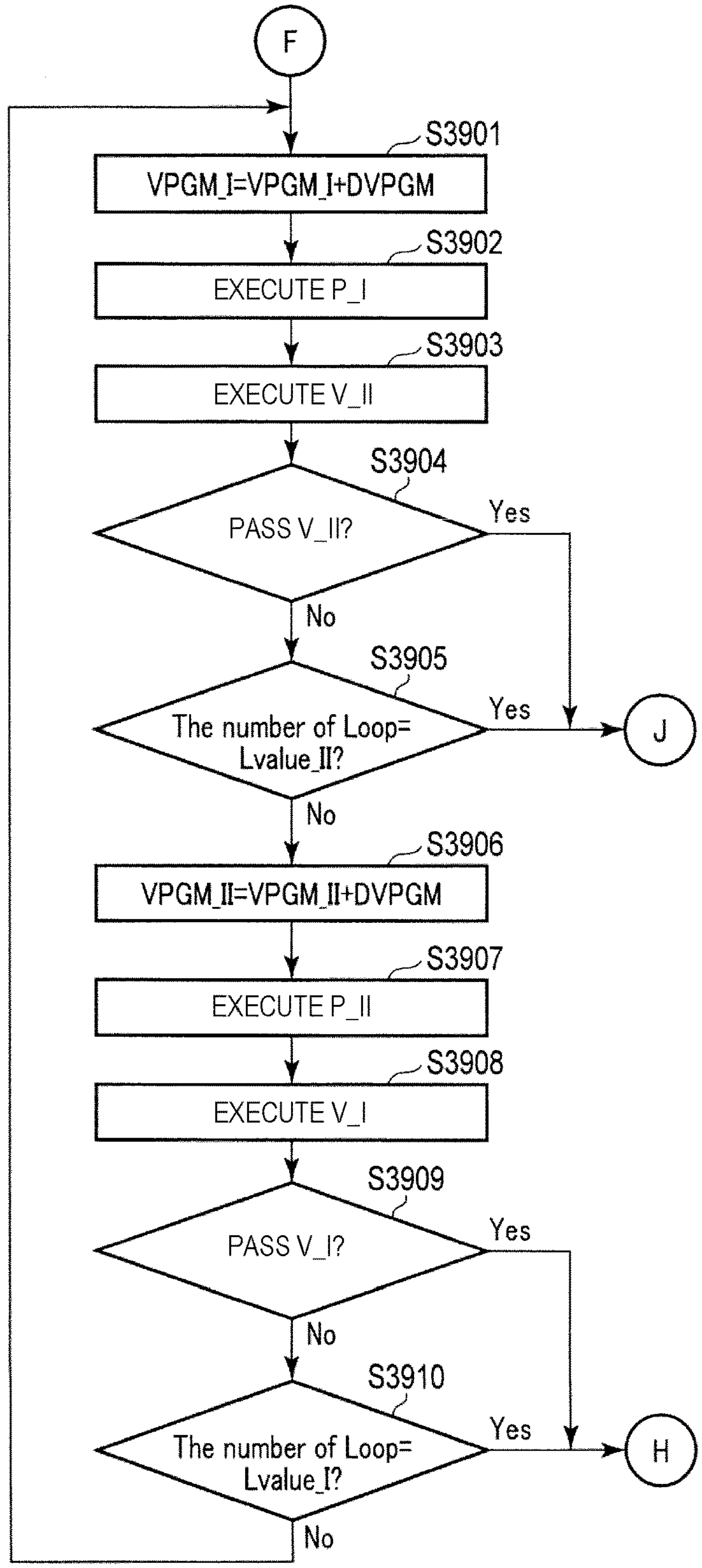

If the sequencer 111 determines that "the result of the third program verification operation is a pass" in Step S3508 (YES in Step S3508), or determines that "the number of loops is the set value (LValue_III)" in Step S3509 (YES in Step S3509), the voltage VPGM_I to be used in the first program operation is incremented by the voltage DVPGM (see FIG. 39).

Step S3902

The sequencer 111 performs the first program operation.

Step S3903

The sequencer 111 performs the second program verification operation.

In this manner, the sequencer 111 performs other operations between the second program operation and the second program verification operation. Accordingly, the sequencer 111 is capable of performing the program verification in a state in which the electron leakage becomes stable.

Step S3904

The sequencer 111 determines whether or not the result of the second program verification operation is a pass.

Step S3905

If the sequencer 111 determines that the result of the second program verification operation is not a pass (NO in Step S3904), the number of loops relating to the second program operation is counted. Subsequently, the sequencer 111 counts up the number of loops and then determines whether or not the number of loops of the second program operation is the set value (LValue_II).

Step S3906

If the sequencer 111 determines that the number of loops is not the set value (LValue_II) (NO in Step S3905), the sequencer 111 increments the voltage VPGM_II to be used in the second program operation by the voltage DVPGM.

Step S3907

The sequencer 111 performs the second program operation.

Step S3908

The sequencer 111 performs the first program verification operation.

In this manner, the sequencer 111 performs other operations between the first program operation and the first program verification operation. Accordingly, the sequencer 111 is capable of performing the program verification in a state in which the electron leakage becomes stable.

Step S3909

The sequencer 111 determines whether or not the result of the first program verification operation is a pass.

The sequencer 111 performs Step S3701 in a case where the result of the first program verification operation is a pass (YES in Step S3909).

Step S3910

If the sequencer 111 determines that the result of the first program verification operation is not a pass (NO in Step S3909), the number of loops relating to the first program operation is counted. Subsequently, the sequencer 111 counts up the number of loops and then determines whether or not the number of loops of the first program operation is the set value (LValue_I).

The sequencer 111 repeats Step S3901 in the case where it is determined that the number of loops is not the set value (LValue_I) (NO in Step S3910).

The sequencer 111 performs Step S3701 in the case where it is determined that the number of loops is the set value (LValue_I) (YES in Step S3910).

Step S4001

Figure 40:
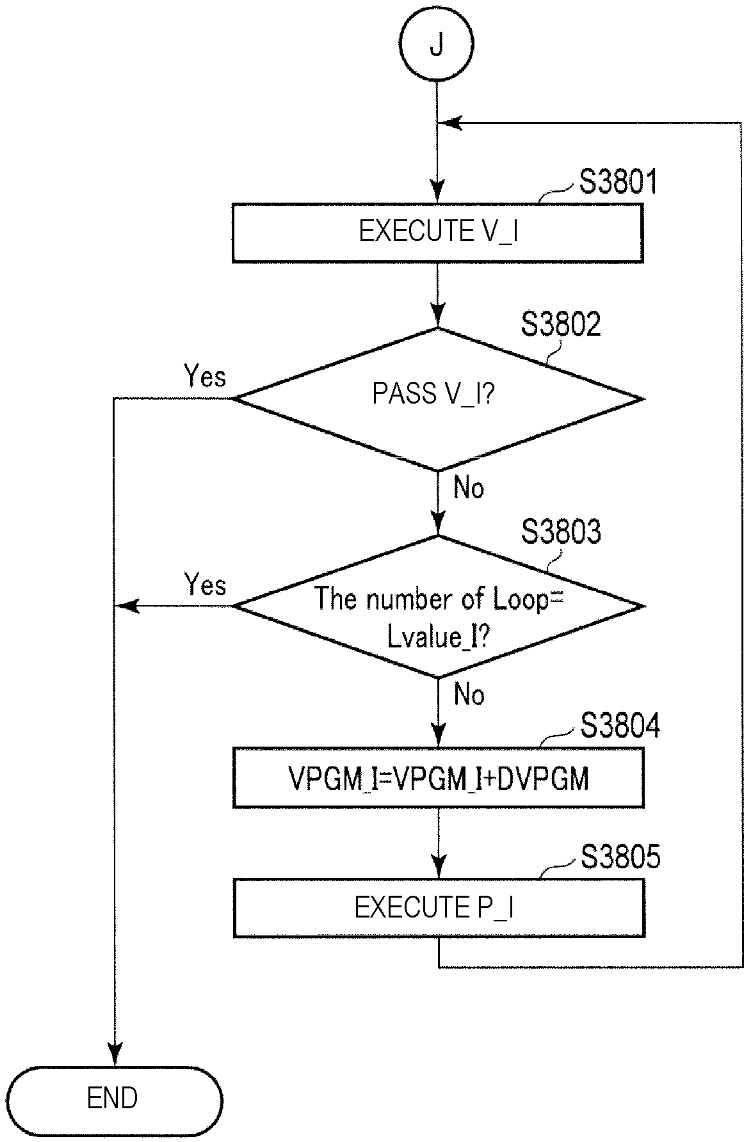

If the sequencer 111 determines that "the result of the second program verification operation is a pass" in Step S3904 (YES in Step S3904), or determines that "the number of loops is the set value (LValue_II)" in Step S3905 (YES in Step S3905), the first program verification operation is performed (see FIG. 40).

Step S4002

The sequencer 111 determines whether or not the result of the first program verification operation is a pass.

The sequencer 111 terminates the write operation in a case where the result of the first program verification operation is a pass (YES in Step S4002).

Step S4003

If the sequencer 111 determines that the result of the first program verification operation is not a pass (NO in Step S4002), the number of loops relating to the first program operation is counted. Subsequently, the sequencer 111 counts up the number of loops and then determines whether or not the number of loops of the first program operation is the set value (LValue_I).

The sequencer 111 terminates the write operation in a case where the number of loops is the set value (LValue_I), (YES in Step S4003).

Step S4004

If the sequencer 111 determines that the number of loops is not the set value (LValue_I) (NO in Step S4003), the sequencer 111 increments the voltage VPGM_I to be used in the first program operation by the voltage DVPGM.

Step S4005

The sequencer 111 performs the first program operation.

Step S4101

Figure 41:
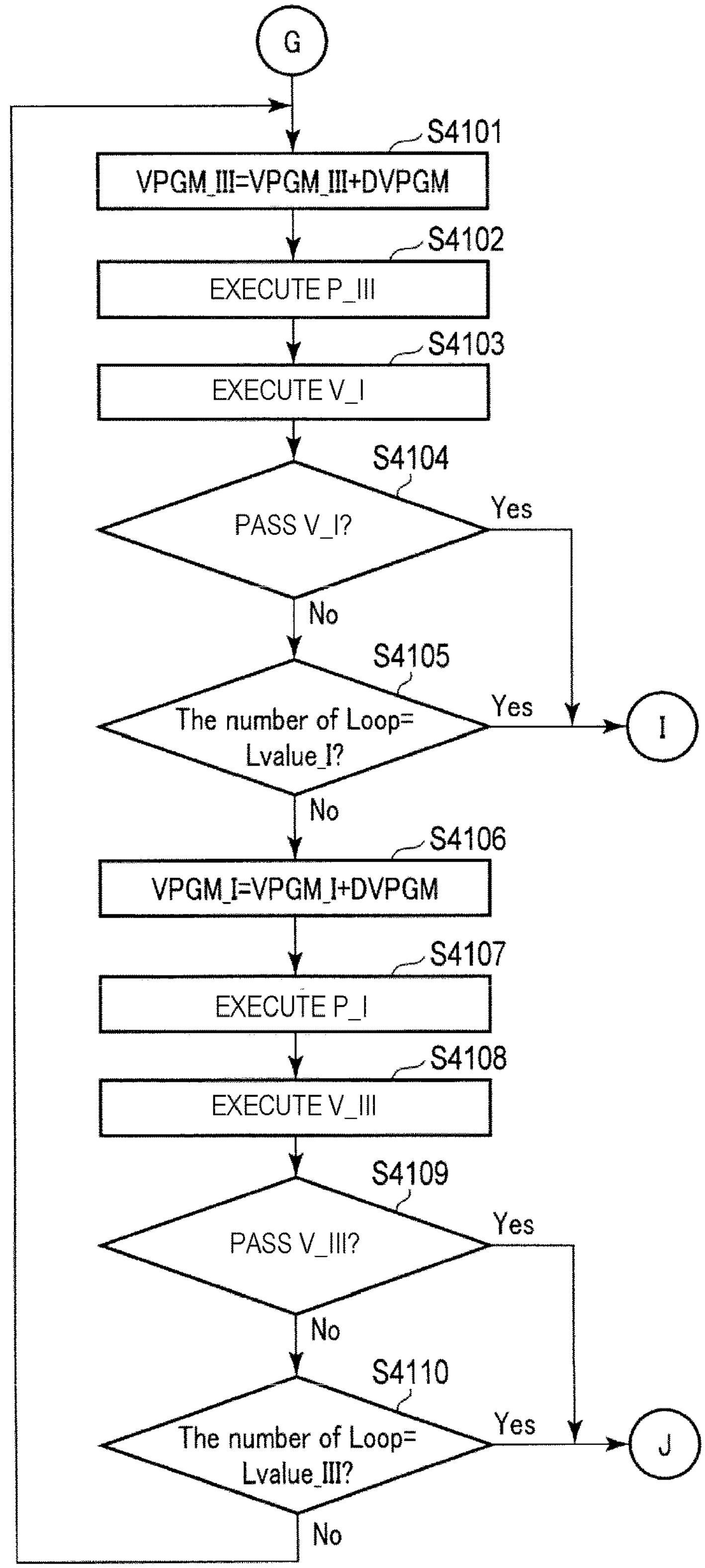

If the sequencer 111 determines that "the result of the second program verification operation is a pass" in Step S3513 (YES in Step S3513), or determines that "the number of loops is the set value (LValue_II)" in Step S3514 (YES in Step S3514), the voltage VPGM_III to be used in the third program operation is incremented by the voltage DVPGM (see FIG. 41).

Step S4102

The sequencer 111 performs the third program operation.

Step S4103

The sequencer 111 performs the first program verification operation.

In this manner, the sequencer 111 performs other operations between the first program operation and the first program verification operation. Accordingly, the sequencer 111 is capable of performing the program verification in a state in which the electron leakage becomes stable.

Step S4104

The sequencer 111 determines whether or not the result of the first program verification operation is a pass.

If the sequencer 111 determines that the result of the first program verification operation is a pass (YES in Step S4104), Step S3801 is performed.

Step S4105

If the sequencer 111 determines that the result of the first program verification operation is not a pass (NO in Step S4104), the number of loops relating to the first program operation is counted. Subsequently, the sequencer 111 counts up the number of loops and then determines whether or not the number of loops of the first program operation is the set value (LValue_I).

The sequencer 111 performs Step S3801 in the case where it is determined that the number of loops is the set value (LValue_I) (YES in Step S4105).

Step S4106

If the sequencer 111 determines that the number of loops is not the set value (LValue_I) (NO in Step S4105), the sequencer 111 increments the voltage VPGM_I to be used in the first program operation by the voltage DVPGM.

Step S4107

The sequencer 111 performs the first program operation.

Step S4108

The sequencer 111 performs the third program verification operation.

In this manner, the sequencer 111 performs other operations between the third program operation and the third program verification operation. Accordingly, the sequencer 111 is capable of performing the program verification in a state in which the electron leakage becomes stable.

Step S4109

The sequencer 111 determines whether or not the result of the third program verification operation is a pass.

The sequencer 111 performs Step S4001 in a case where the result of the third program verification operation is a pass (YES in Step S4109).

Step S4110

If the sequencer 111 determines that the result of the third program verification operation is not a pass (NO in Step S4109), the number of loops relating to the third program operation is counted. Subsequently, the sequencer 111 counts up the number of loops and then determines whether or not the number of loops of the third program operation is a set value (LValue_III).

The sequencer 111 repeats Step S4101 in the case where it is determined that the number of loops is not the set value (LValue_III) (NO in Step S4110).

The sequencer 111 performs Step S4001 in the case where it is determined that the number of loops is the set value (LValue_III) (YES in Step S4110).

Step S4201

Figure 42:
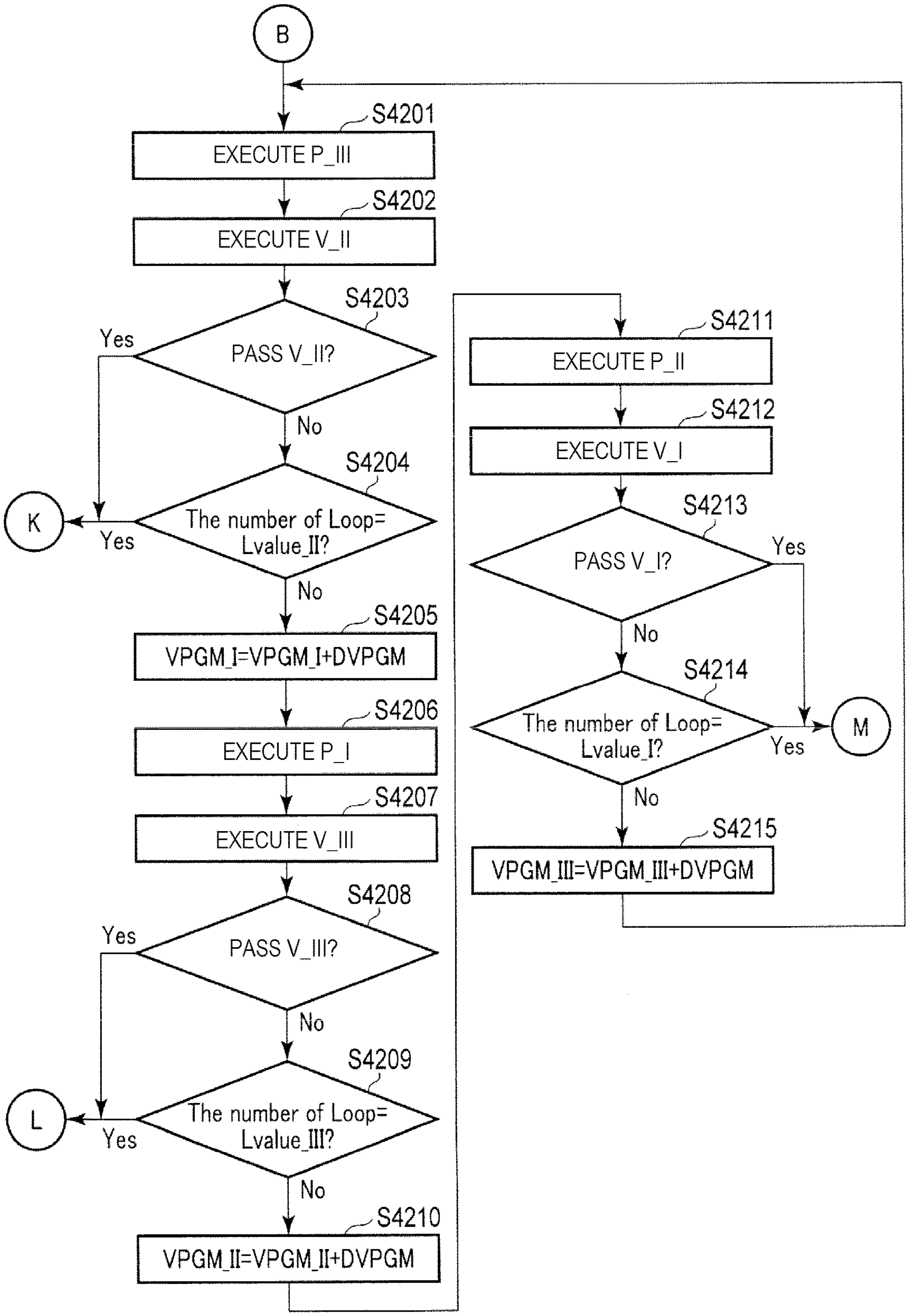

If the sequencer 111 determines that "the condition is satisfied" in Step S3412 (YES in Step S3412), the third program operation is performed (see FIG. 42).

Step S4202

The sequencer 111 performs the second program verification operation after performing the third program operation.

In this manner, the sequencer 111 performs other operations between the second program operation and the second program verification operation. Accordingly, the sequencer 111 is capable of performing the program verification in a state in which the electron leakage becomes stable.

Step S4203

The sequencer 111 determines whether or not the result of the second program verification operation is a pass.

Step S4204

If the sequencer 111 determines that the result of the second program verification operation is not a pass (NO in Step S4203), the number of loops relating to the second program operation is counted. Subsequently, the sequencer 111 counts up the number of loops and then determines whether or not the number of loops of the second program operation is the set value (LValue_II).

Step S4205

If the sequencer 111 determines that the number of loops is not the set value (LValue_II) (NO in Step S4204), the voltage VPGM_I to be used in the first program operation is incremented by the voltage DVPGM.

Step S4206

The sequencer 111 performs the first program operation.

Step S4207

The sequencer 111 performs the third program verification operation after performing the first program operation.

In this manner, the sequencer 111 performs other operations between the third program operation and the third program verification operation. Accordingly, the sequencer 111 is capable of performing the program verification in a state in which the electron leakage becomes stable.

Step S4208

The sequencer 111 determines whether or not the result of the third program verification operation is a pass.

Step S4209

If the sequencer 111 determines that the result of the third program verification operation is not a pass (NO in Step S4208), the sequencer 111 counts up the number of loops relating to the third program operation. Subsequently, the sequencer 111 counts up the number of loops and then determines whether or not the number of loops of the third program operation is a set value (LValue_III).

Step S4210

If the sequencer 111 determines that the number of loops is not the set value (LValue_III) (NO in Step S4209), the sequencer 111 increments the voltage VPGM_II to be used in the second program operation by the voltage DVPGM.

Step S4211

The sequencer 111 performs the second program operation.

Step S4212

The sequencer 111 performs the first program verification operation after performing the second program operation.

In this manner, the sequencer 111 performs other operations between the first program operation and the first program verification operation. Accordingly, the sequencer 111 is capable of performing the program verification in a state in which the electron leakage becomes stable.

Step S4213

The sequencer 111 determines whether or not the result of the first program verification operation is a pass.

Step S4214

If the sequencer 111 determines that the result of the first program verification operation is not a pass (NO in Step S4213), the sequencer 111 counts up the number of loops relating to the first program operation. Subsequently, the sequencer 111 counts up the number of loops and then determines whether or not the number of loops of the first program operation is the set value (LValue_I).

Step S4215

If the sequencer 111 determines that the number of loops is not the set value (LValue_I) (NO in Step S4214), the sequencer 111 increments the voltage VPGM_III to be used in the third program operation by the voltage DVPGM.

Step S4301

Figure 43:
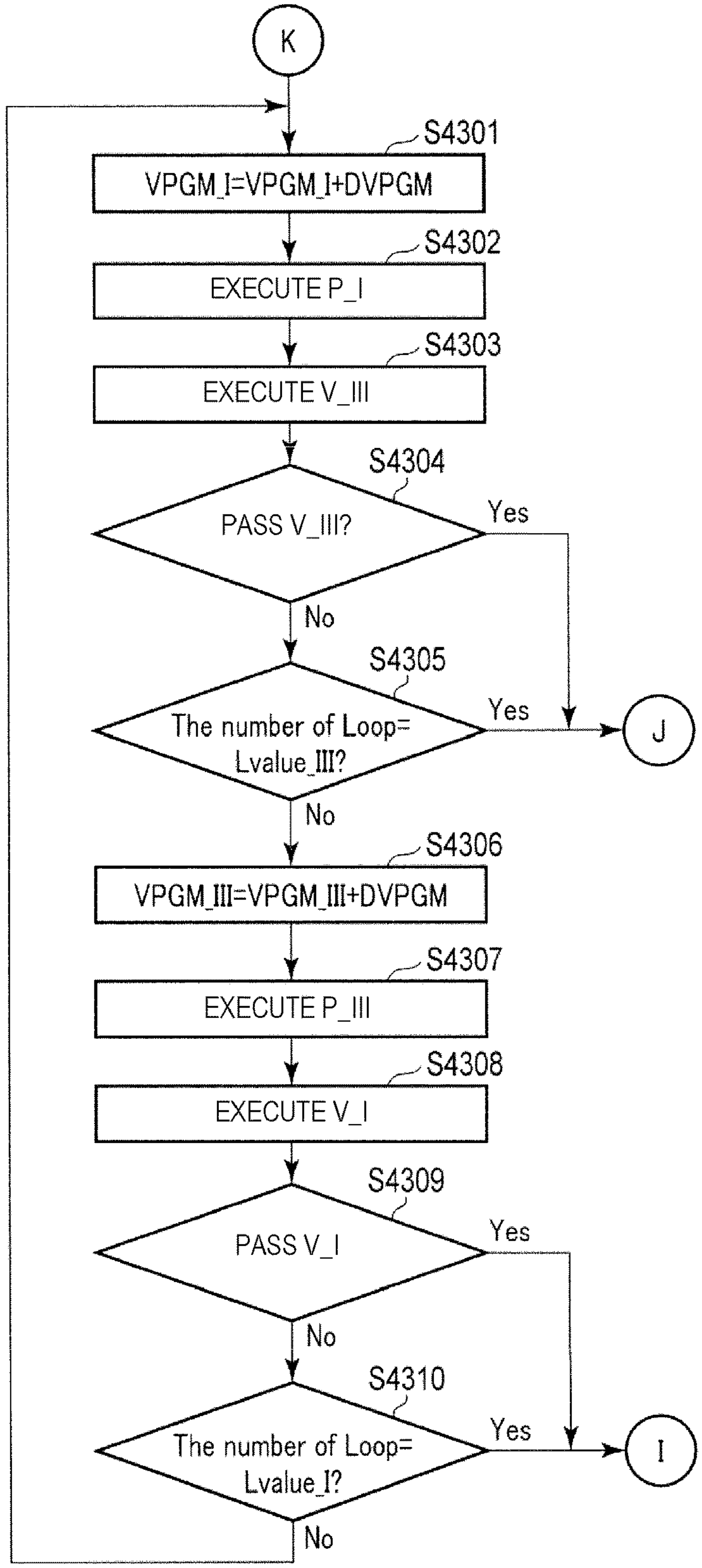

If the sequencer 111 determines that "the result of the second program verification operation is a pass" in Step S4203 (YES in Step S4203), or determines that "the number of loops is the set value (LValue_II)" in Step S4204 (YES in Step S4204), the sequencer 111 increments the voltage VPGM_II to be used in the second program operation by the voltage DVPGM (see FIG. 43).

Step S4302

The sequencer 111 performs the first program operation.

Step S4303

The sequencer 111 performs the third program verification operation after performing the first program operation.

In this manner, the sequencer 111 performs other operations between the third program operation and the third program verification operation. Accordingly, the sequencer 111 is capable of performing the program verification in a state in which the electron leakage becomes stable.

Step S4304

The sequencer 111 determines whether or not the result of the third program verification operation is a pass.

If the sequencer 111 determines that the result of the third program verification operation is a pass (YES in Step S4304), the sequencer 111 performs Step S4001.

Step S4305

If the sequencer 111 determines that the result of the third program verification operation is not a pass (NO in Step S4304), the sequencer 111 counts up the number of loops relating to the third program operation. Subsequently, the sequencer 111 counts up the number of loops and then determines whether or not the number of loops of the third program operation is a set value (LValue_III).

If the sequencer 111 determines that the number of loops is the set value (LValue_III) (YES in Step S4305), the sequencer 111 performs Step S4001.

Step S4306

If the sequencer 111 determines that the number of loops is not the set value (LValue_III) (NO in Step S4305), the sequencer 111 increments the voltage VPGM_III to be used in the third program operation by the voltage DVPGM.

Step S4307

The sequencer 111 performs the third program operation.

Step S4308

The sequencer 111 performs the first program verification operation after performing the third program operation.

In this manner, the sequencer 111 performs other operations between the first program operation and the first program verification operation. Accordingly, the sequencer 111 is capable of performing the program verification in a state in which the electron leakage becomes stable.

Step S4309

The sequencer 111 determines whether or not the result of the first program verification operation is a pass.

If the sequencer 111 determines that the result of the first program verification operation is a pass (YES in Step S4309), the sequencer 111 performs Step S3801.

Step S4310

If the sequencer 111 determines that the result of the first program verification operation is not a pass (NO in Step S4309), the sequencer 111 counts up the number of loops relating to the second program operation. Subsequently, the sequencer 111 counts up the number of loops and then determines whether or not the number of loops of the first program operation is the set value (LValue_I).

If the sequencer 111 determines that the number of loops is not the set value (LValue_I) (NO in Step S4310), the sequencer 111 repeats Step S4301.

If the sequencer 111 determines that the number of loops is the set value (LValue_I) (YES in Step S4310), the sequencer 111 performs Step S3801.

Step S4401

Figure 44:
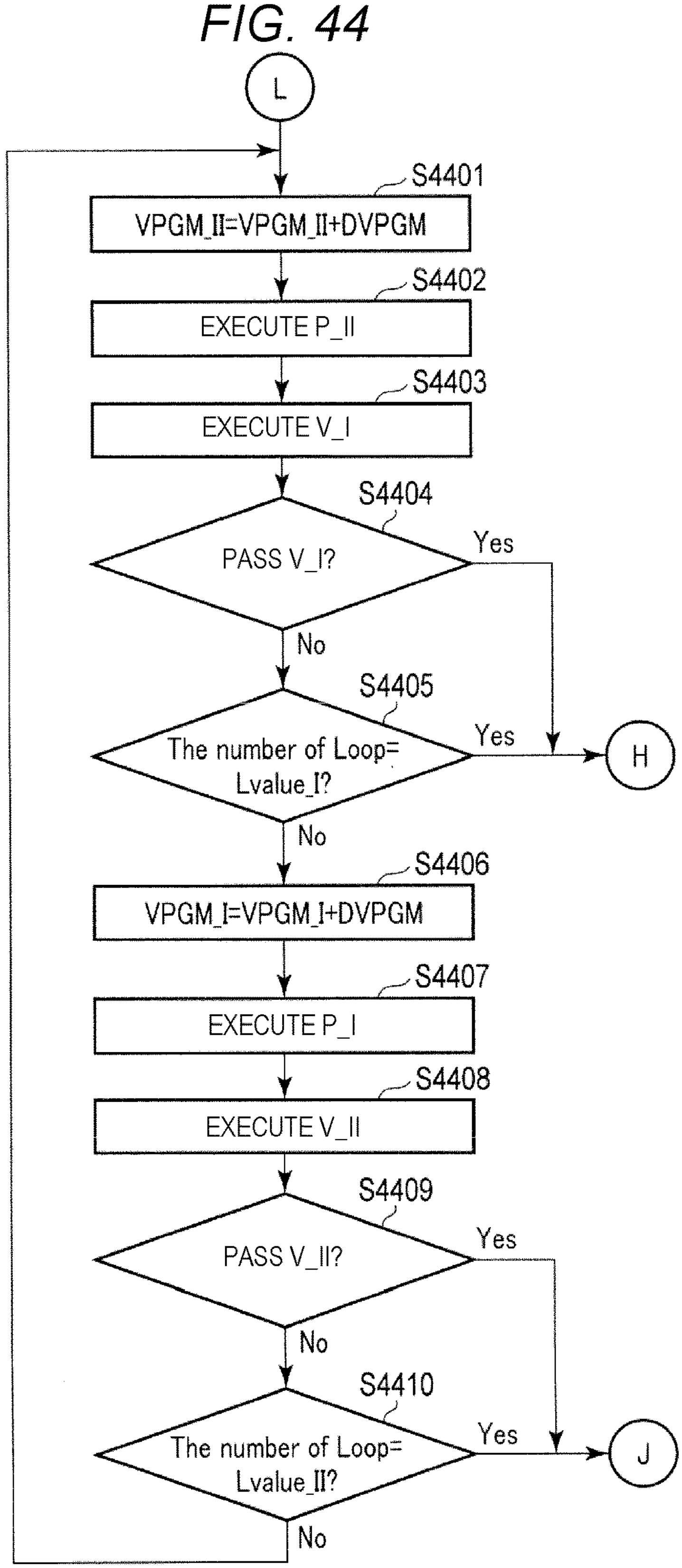

If the sequencer 111 determines that "the result of the third program verification operation is a pass" in Step S4208 (YES in Step S4208), or determines that "the number of loops is the set value (LValue_III)" in Step S4209 (YES in Step S4209), the sequencer 111 increments the voltage VPGM_II to be used in the second program operation by the voltage DVPGM (see FIG. 44).

Step S4402

The sequencer 111 performs the second program operation.

Step S4403

The sequencer 111 performs the first program verification operation.

In this manner, the sequencer 111 performs other operations between the first program operation and the first program verification operation. Accordingly, the sequencer 111 is capable of performing the program verification in a state in which the electron leakage becomes stable.

Step S4404

The sequencer 111 determines whether or not the result of the first program verification operation is a pass.

If the sequencer 111 determines that the result of the first program verification operation is a pass (YES in Step S4404), the sequencer 111 performs Step S3701.

Step S4405

If the sequencer 111 determines that the result of the first program verification operation is not a pass (NO in Step S4404), the sequencer 111 counts up the number of loops relating to the first program operation. Subsequently, the sequencer 111 counts up the number of loops and then determines whether or not the number of loops of the first program operation is the set value (LValue_I).

If the sequencer 111 determines that the number of loops is the set value (LValue_I) (YES in Step S4405), the sequencer 111 performs Step S3701.

Step S4406

If the sequencer 111 determines that the number of loops is not the set value (LValue_I) (NO in Step S4405), the sequencer 111 increments the voltage VPGM_I to be used in the first program operation by the voltage DVPGM.

Step S4407

The sequencer 111 performs the first program operation.

Step S4408

The sequencer 111 performs the second program verification operation.

In this manner, the sequencer 111 performs other operations between the second program operation and the second program verification operation. Accordingly, the sequencer 111 is capable of performing the program verification in a state in which the electron leakage becomes stable.

Step S4409

The sequencer 111 determines whether or not the result of the second program verification operation is a pass.

If the sequencer 111 determines that the result of the second program verification operation is a pass (YES in Step S4409), the sequencer 111 performs Step S4001.

Step S4410

If the sequencer 111 determines that the result of the second program verification operation is not a pass (NO in Step S4409), the number of loops relating to the second program operation is counted. Subsequently, the sequencer 111 counts up the number of loops and then determines whether or not the number of loops of the second program operation is the set value (LValue_II).

If the sequencer 111 determines that the number of loops is not the set value (LValue_II) (NO in Step S4410), the sequencer 111 repeats Step S4401.

If the sequencer 111 determines that the number of loops is the set value (LValue_II) (YES in Step S4410), the sequencer 111 performs Step S4001.

Step S4501

Figure 45:
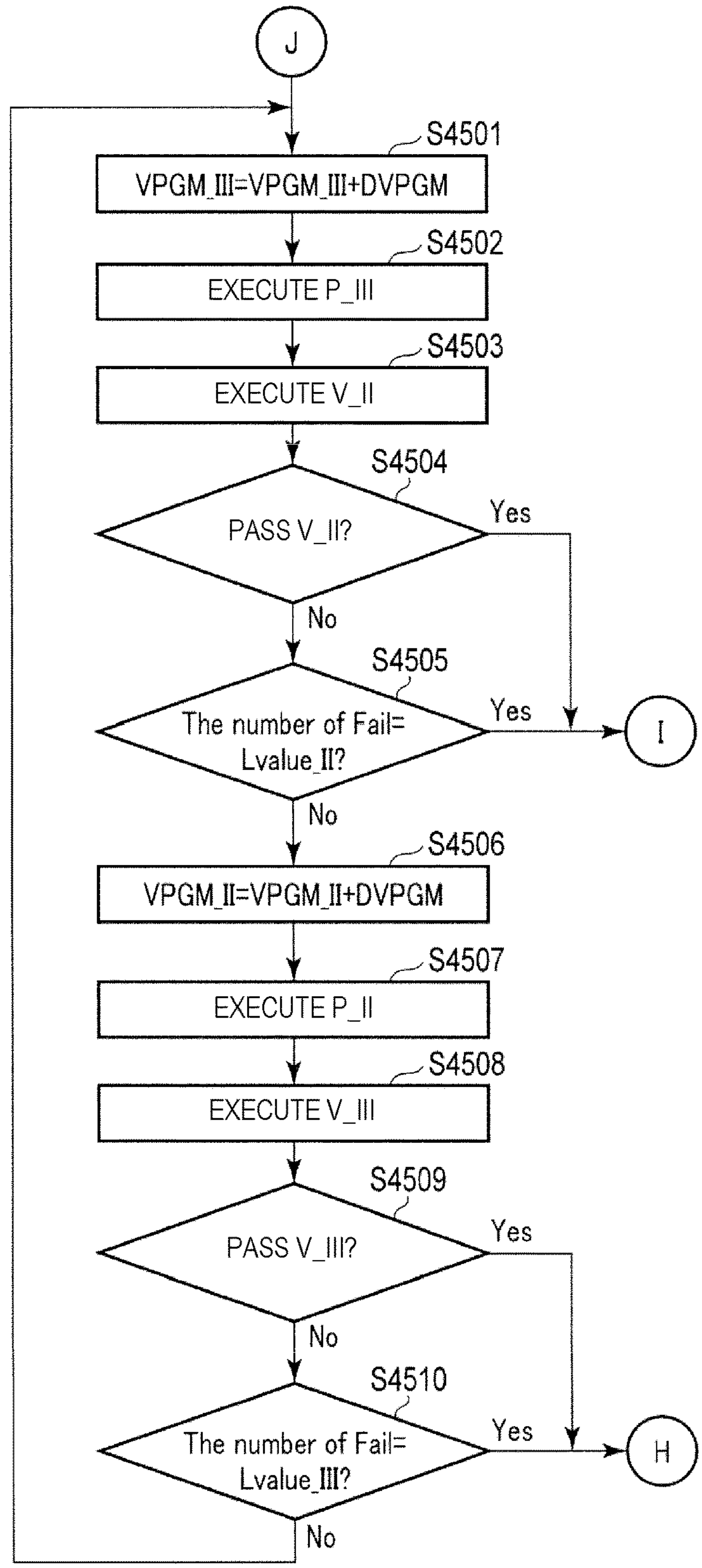

If the sequencer 111 determines that "the result of the first program verification operation is a pass" in Step S4213 (YES in Step S4213), or determines that "the number of loops is the set value (LValue_I)" in Step S4214 (YES in Step S4214), the sequencer 111 increments the voltage VPGM_III to be used in the third program operation by the voltage DVPGM (see FIG. 45).

Step S4502

The sequencer 111 performs the third program operation.

Step S4503

The sequencer 111 performs the second program verification operation.

In this manner, the sequencer 111 performs other operations between the second program operation and the second program verification operation. Accordingly, the sequencer 111 is capable of performing the program verification in a state in which the electron leakage becomes stable.

Step S4504

The sequencer 111 determines whether or not the result of the second program verification operation is a pass.

If the sequencer 111 determines that the result of the second program verification operation is a pass (YES in Step S4504), the sequencer 111 performs Step S3801.

Step S4505

If the sequencer 111 determines that the result of the second program verification operation is not a pass (NO in Step S4504), the sequencer 111 counts up the number of loops relating to the second program operation. Subsequently, the sequencer 111 counts up the number of loops and then determines whether or not the number of loops of the second program operation is the set value (LValue_II).

If the sequencer 111 determines that the number of loops is the set value (LValue_II) (YES in Step S4505), the sequencer 111 performs Step S3801.

Step S4506

If the sequencer 111 determines that the number of loops is not the set value (LValue_II) (NO in Step S4505), the sequencer 111 increments the voltage VPGM_II to be used in the second program operation by the voltage DVPGM.

Step S4507

The sequencer 111 performs the second program operation.

Step S4508

The sequencer 111 performs the third program verification operation.

In this manner, the sequencer 111 performs other operations between the third program operation and the third program verification operation. Accordingly, the sequencer 111 is capable of performing the program verification in a state in which the electron leakage becomes stable.

Step S4509

The sequencer 111 determines whether or not the result of the third program verification operation is a pass.

If the sequencer 111 determines that the result of the third program verification operation is a pass (YES in Step S4509), the sequencer 111 performs Step S3701.

Step S4510

If the sequencer 111 determines that the result of the third program verification operation is not a pass (NO in Step S4509), the sequencer 111 counts up the number of loops relating to the third program operation. Subsequently, the sequencer 111 counts up the number of loops and then determines whether or not the number of loops of the third program operation is a set value (LValue_III).

If the sequencer 111 determines that the number of loops is not the set value (LValue_III) (NO in Step S4510), the sequencer 111 repeats Step S4501.

If the sequencer 111 determines that the number of loops is the set value (LValue_III) (YES in Step S4510), the sequencer 111 performs Step S3701.

Step S4601

Figure 46:
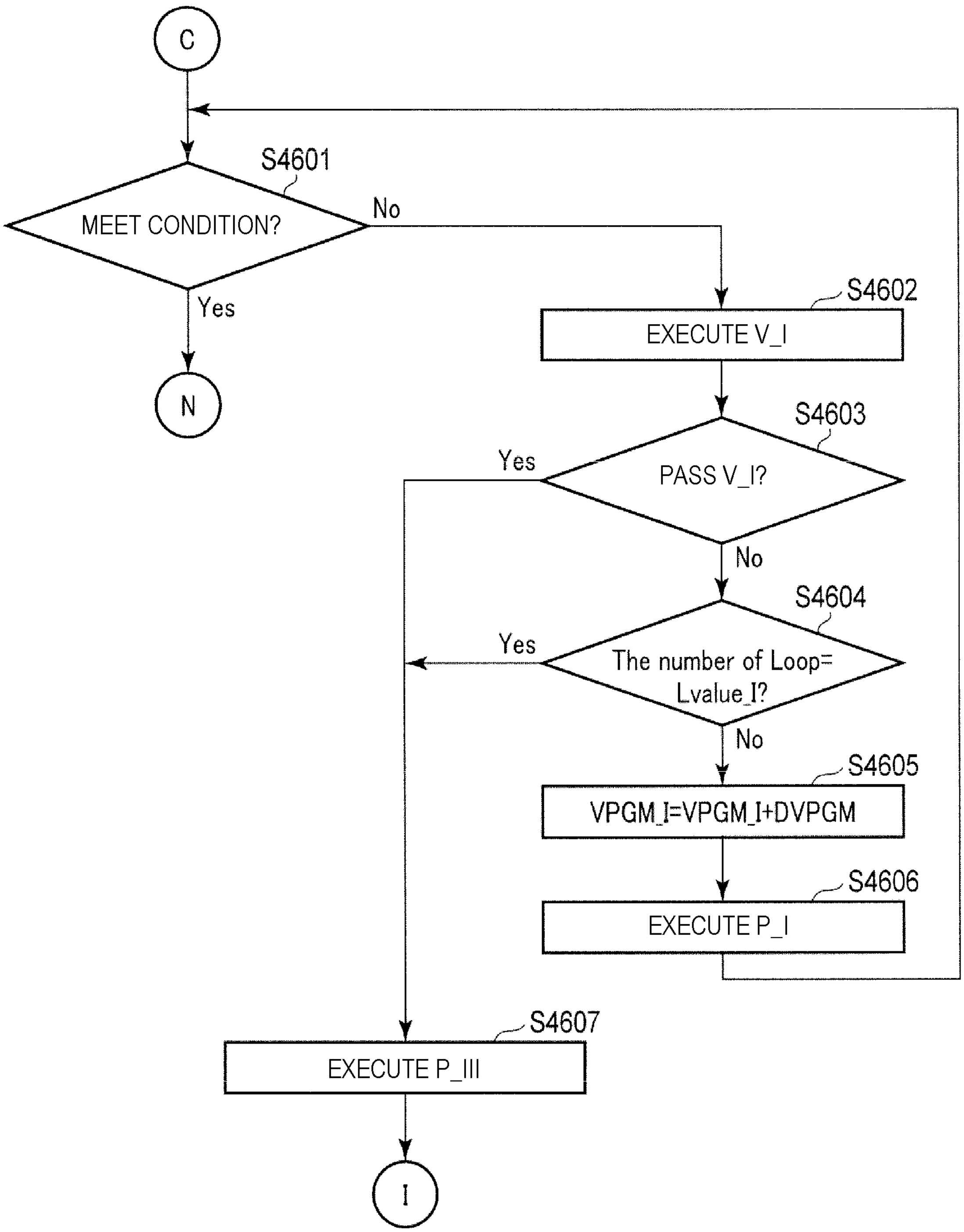

If the sequencer 111 determines that "the result of the second program verification operation is a pass" in Step S3404 (YES in Step S3404), or determines that "the number of loops is the set value (LValue_II)" in Step S3405 (YES in Step S3405), the sequencer 111 determines whether or not the condition is satisfied (see FIG. 46). The "condition" in Step S4601 may be different from the "conditions" in Step S3406, S3412.

Step S4602

If the sequencer 111 determines that the condition is not satisfied (NO in Step S4601), the sequencer 111 performs the first program verification operation.

Step S4603

The sequencer 111 determines whether or not the result of the first program verification operation is a pass.

Step S4604

If the sequencer 111 determines that the result of the first program verification operation is not a pass (NO in Step S4603), the sequencer 111 counts up the number of loops relating to the first program operation. Subsequently, the sequencer 111 counts up the number of loops and then determines whether or not the number of loops of the first program operation is the set value (LValue_I).

Step S4605

If the sequencer 111 determines that the number of loops is not the set value (LValue_I) (NO in Step S4604), the sequencer 111 increments the voltage VPGM_I to be used in the first program operation by the voltage DVPGM.

Step S4606

The sequencer 111 performs the first program operation. Subsequently, the sequencer 111 performs Step S4601.

Step S4607

If the sequencer 111 determines that "the result of the first program verification operation is a pass" in Step S4603 (YES in Step S4603), or the sequencer 111 determines that "the number of loops is the set value (LValue_I)" in Step S4604 (YES in Step S4604), the sequencer 111 performs the third program operation. Subsequently, the sequencer 111 performs Step S3801.

Step S4701

Figure 47:
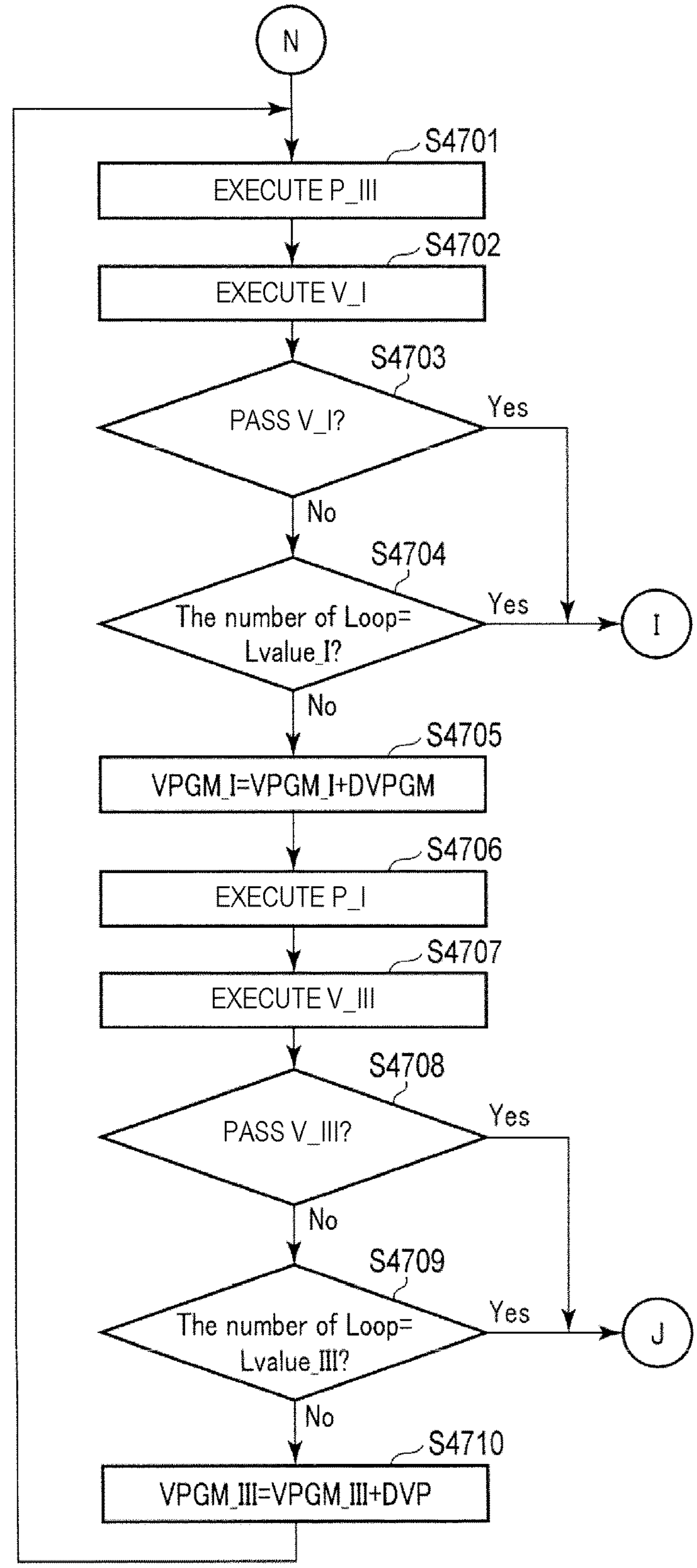

If the sequencer 111 determines that "the condition is satisfied" in Step S4601 (YES in Step S4601), the sequencer performs the third program operation (see FIG. 47).

Step S4702

The sequencer 111 performs the first program verification operation.

In this manner, the sequencer 111 performs other operations between the first program operation and the first program verification operation. Accordingly, the sequencer 111 is capable of performing the program verification in a state in which the electron leakage becomes stable.

Step S4703

The sequencer 111 determines whether or not the result of the first program verification operation is a pass.

If the sequencer 111 determines that the result of the first program verification operation is a pass (YES in Step S4704), the sequencer performs Step S3801.

Step S4704

If the sequencer 111 determines that the result of the first program verification operation is not a pass (NO in Step S4704), the sequencer 111 counts up the number of loops relating to the first program operation. Subsequently, the sequencer 111 counts up the number of loops and then determines whether or not the number of loops of the first program operation is the set value (LValue_I).

If the sequencer 111 determines that the number of loops is the set value (LValue_I) (YES in Step S4705), the sequencer 111 performs Step S3801.

Step S4705

If the sequencer 111 determines that the number of loops is not the set value (LValue_I) (NO in Step S4705), the sequencer increments the voltage VPGM_I to be used in the first program operation by the voltage DVPGM.

Step S4706

The sequencer 111 performs the first program operation.

Step S4707

The sequencer 111 performs the third program verification operation.

In this manner, the sequencer 111 performs other operations between the third program operation and the third program verification operation. Accordingly, the sequencer 111 is capable of performing the program verification in a state in which the electron leakage becomes stable.

Step S4708

The sequencer 111 determines whether or not the result of the third program verification operation is a pass.

If the sequencer 111 determines that the result of the third program verification operation is a pass (YES in Step S4708), the sequencer 111 performs Step S4001.

Step S4709

If the sequencer 111 determines that the result of the third program verification operation is not a pass (NO in Step S4708), the sequencer 111 counts up the number of loops relating to the third program operation. Subsequently, the sequencer 111 counts up the number of loops and then determines whether or not the number of loops of the third program operation is a set value (LValue_III).

If the sequencer 111 determines that the number of loops is the set value (LValue_III) (YES in Step S4709), the sequencer 111 performs Step S4001.

Step S4710

If the sequencer 111 determines that the number of loops is not the set value (LValue_III) (NO in Step S4709), the sequencer 111 increments the voltage VPGM_III to be used in the third program operation by the voltage DVPGM. Subsequently, the sequencer 111 repeats Step S4701.

Step S4801

Figure 48:
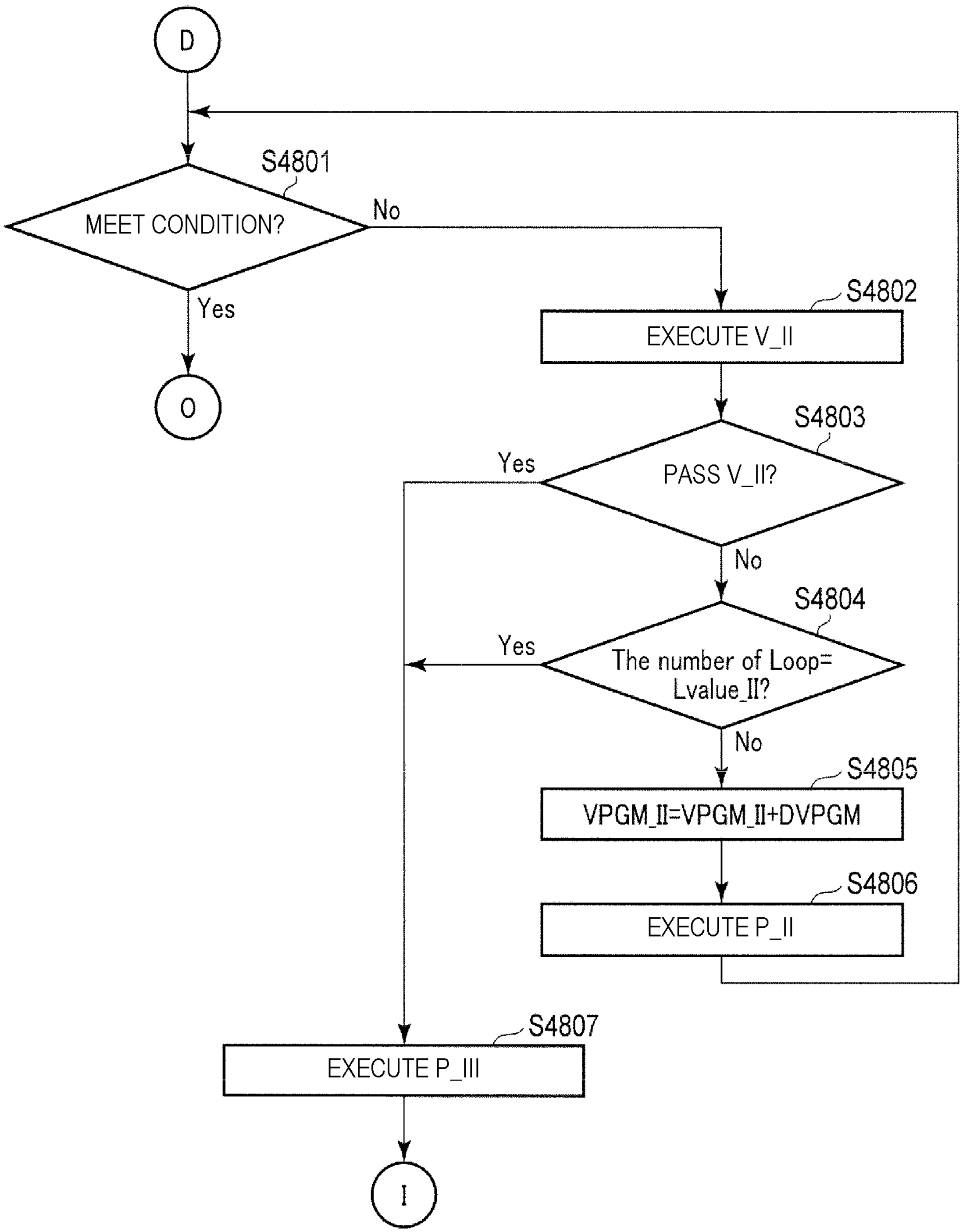

If the sequencer 111 determines that "the result of the first program verification operation is a pass" in Step S3410 (YES in Step S3410), or determines that "the number of loops is the set value (LValue_I)" in Step S3411 (YES in Step S3411), the sequencer 111 determines whether or not the condition is satisfied (see FIG. 48). The "condition" in Step S4801 may be different from the "conditions" in Step S3406, S3412 and S4601.

Step S4802

If the sequencer 111 determines that the condition is not satisfied (NO in Step S4801), the sequencer 111 performs the second program verification operation.

Step S4803

The sequencer 111 determines whether or not the result of the second program verification operation is a pass.

Step S4804

If the sequencer 111 determines that the result of the second program verification operation is not a pass (NO in Step S4803), the sequencer 111 counts up the number of loops relating to the second program operation. Subsequently, the sequencer 111 counts up the number of loops and then determines whether or not the number of loops of the second program operation is the set value (LValue_II).

Step S4805

If the sequencer 111 determines that the number of loops is not the set value (LValue_II) (NO in Step S4804), the sequencer 111 increments the voltage VPGM_II to be used in the second program operation by the voltage DVPGM.

Step S4806

The sequencer 111 performs the second program operation. Subsequently, the sequencer 111 performs Step S4801.

Step S4807

If the sequencer 111 determines that the result of the second program verification operation is a pass in Step S4803 (YES in Step S4803), or If the sequencer 111 determines that the number of loops is the set value (LValue_II) in Step S4804 (YES in Step S4804), the sequencer 111 performs the third program operation. Subsequently, the sequencer 111 performs Step S3801.

Step S4901

Figure 49:
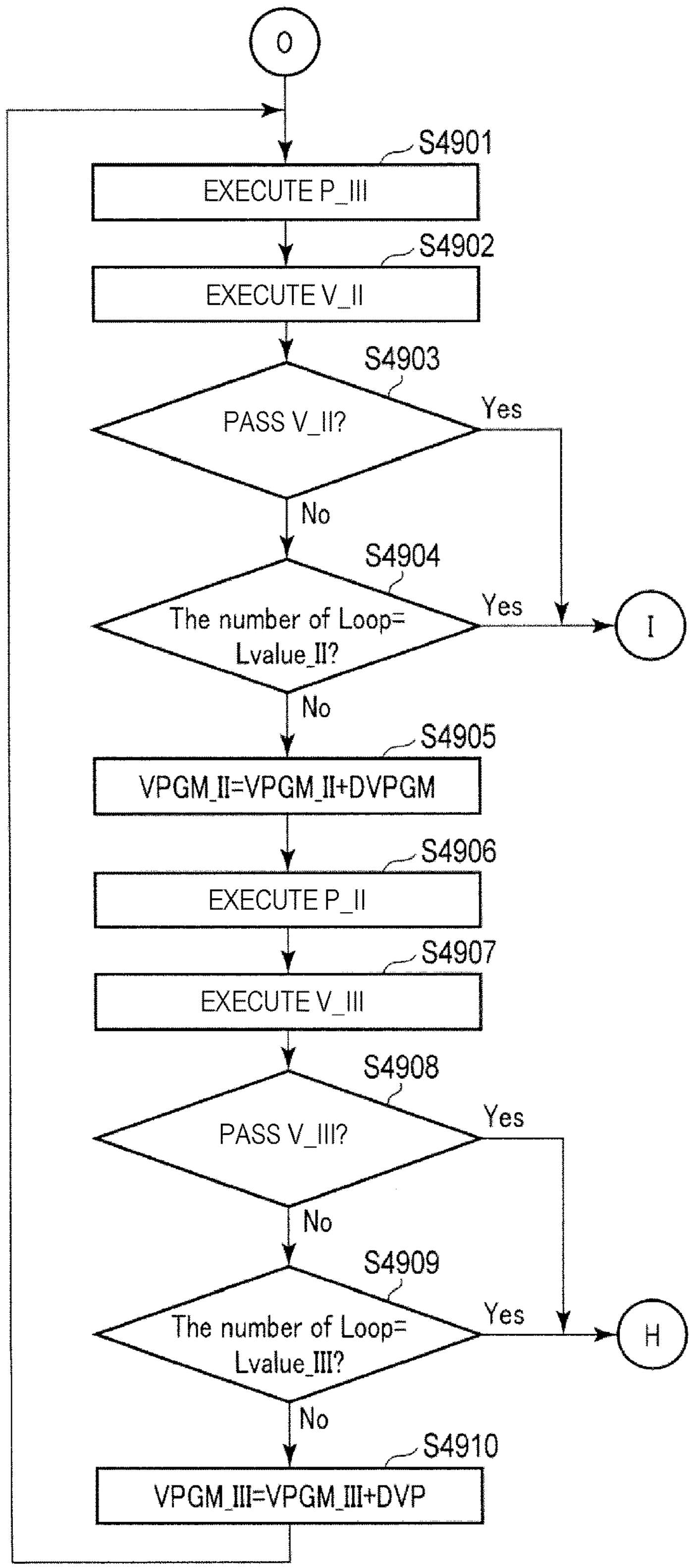

If the sequencer 111 determines that "the condition is satisfied" in Step S4801 (YES in Step S4801), the sequencer 111 performs the third program operation (see FIG. 49).

Step S4902

The sequencer 111 performs the second program verification operation.

In this manner, the sequencer 111 performs other operations between the second program operation and the second program verification operation. Accordingly, the sequencer 111 is capable of performing the program verification in a state in which the electron leakage becomes stable.

Step S4903

The sequencer 111 determines whether or not the result of the second program verification operation is a pass.

If the sequencer 111 determines that the result of the second program verification operation is a pass (YES in Step S4903), the sequencer 111 performs Step S3801.

Step S4904

If the sequencer 111 determines that the result of the second program verification operation is not a pass (NO in Step S4903), the sequencer 111 counts up the number of loops relating to the second program operation. Subsequently, the sequencer 111 counts up the number of loops and then determines whether or not the number of loops of the second program operation is the set value (LValue_II).

If the sequencer 111 determines that the number of loops is the set value (LValue_II) (YES in Step S4904), the sequencer 111 performs Step S3801.

Step S4905

If the sequencer 111 determines that the number of loops is not the set value (LValue_II) (NO in Step S4904), the sequencer 111 increments the voltage VPGM_II to be used in the second program operation by the voltage DVPGM.

Step S4906

The sequencer 111 performs the second program operation.

Step S4907

The sequencer 111 performs the third program verification operation.

In this manner, the sequencer 111 performs other operations between the third program operation and the third program verification operation. Accordingly, the sequencer 111 is capable of performing the program verification in a state in which the electron leakage becomes stable.

Step S4908

The sequencer 111 determines whether or not the result of the third program verification operation is a pass.

If the sequencer 111 determines that the result of the third program verification operation is a pass (YES in Step S4908), the sequencer 111 performs Step S3701.

Step S4909

If the sequencer 111 determines that the result of the third program verification operation is not a pass (NO in Step S4908), the sequencer 111 counts up the number of loops relating to the third program operation. Subsequently, the sequencer 111 counts up the number of loops and then determines whether or not the number of loops of the third program operation is a set value (LValue_III).

If the sequencer 111 determines that the number of loops is the set value (LValue_III) (YES in Step S4909), the sequencer 111 performs Step S3701.

Step S4910

If the sequencer 111 determines that the number of loops is not the set value (LValue_III) (NO in Step S4909), the sequencer 111 increments the voltage VPGM_III to be used in the third program operation by the voltage DVPGM. Subsequently, the sequencer 111 repeats Step S4901.

<1-9-2> Specific Example of Pulse

Subsequently, a specific example of the write operation relating to the memory system of a modified example 4 of the first embodiment will be described.

Subsequently, referring now to FIG. 50 and FIG. 51, a specific example of the pulse for the case where the write operation of the first embodiment is applied to the memory cell transistors MT described above will be described. The basic operations are the same as those described with reference to FIG. 20 and FIG. 21.

Figure 50:
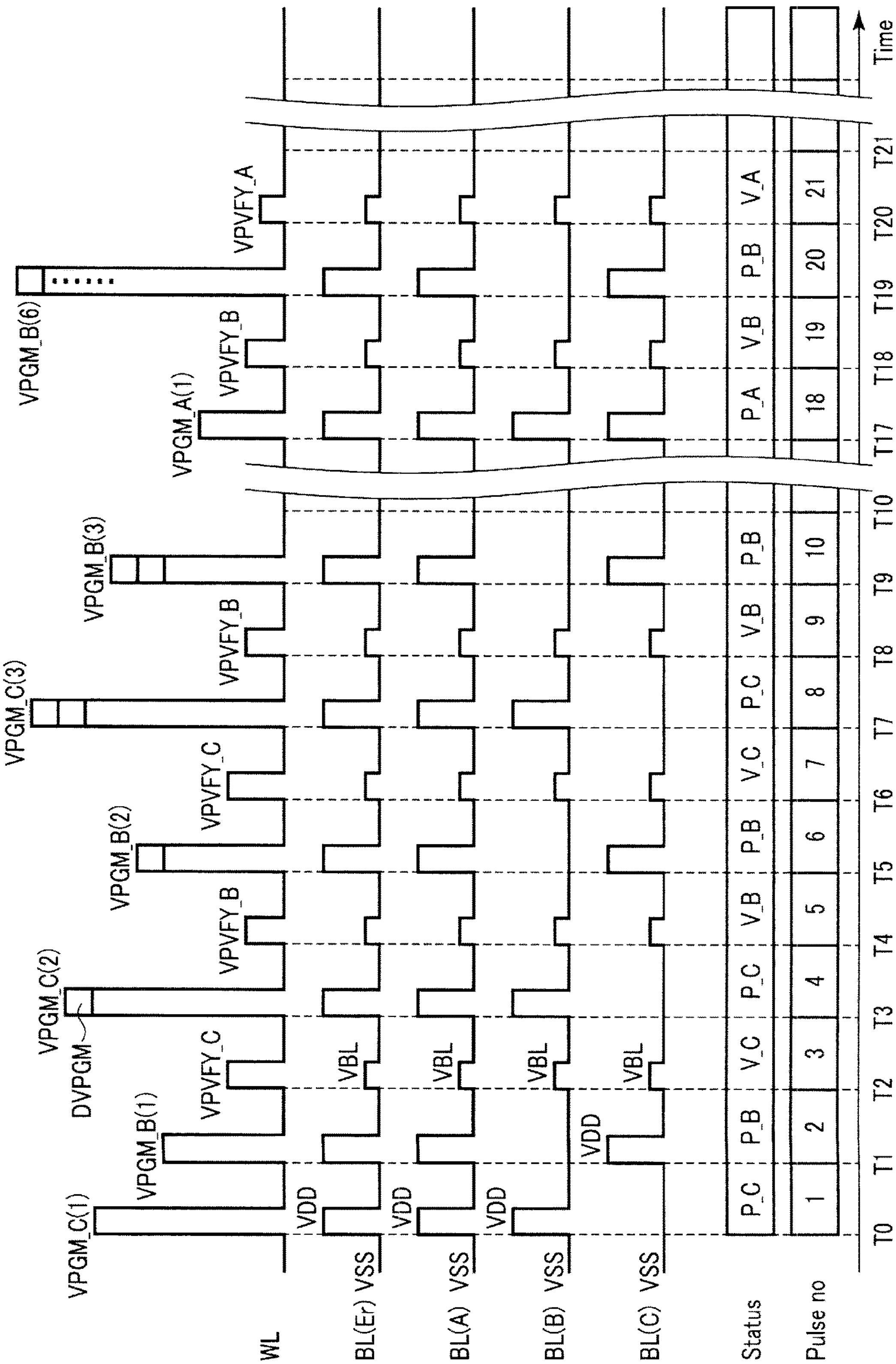
FIG. 50 is a waveform chart showing an example of the voltages to be applied to the word lines and the bit lines during the write operation.

FIG. 50 and FIG. 51 illustrate a pulse of (i) and a pulse of (ii), which are roughly classified pulse categories, as described in conjunction with FIG. 20 and FIG. 21.

In the example illustrated in FIG. 50 and FIG. 51, pulses corresponding to the pulse Nos. 1 to 3, and 5 correspond to the pulses of (i).

In the example of FIG. 50 and FIG. 51, the pulses corresponding to those other than the pulse No. 1 to 3, and 5 correspond to the pulses of (ii).

As described above, the sequencer 111 determines whether or not the condition is satisfied during the write operation. If the sequencer 111 determines that the condition is satisfied, the sequencer 111 performs the third program operation. Specifically, for example, the sequencer 111 determines that the condition is satisfied after a pulse having a pulse no. 17 (Pulse No=17) has been applied, and thus the sequencer 111 starts the third program operation at a pulse no. 18 (Pulse No=18).

<1-10> Modified Example 5 of First Embodiment

A modified example 5 of the first embodiment will be described. In the modified example 5 of the first embodiment, a case where a data writing method different from the writing method described above is employed in the first embodiment will be described.

<1-10-1> Operation

<1-10-1-1> Example of Order of Performance of Program Operation and Program Verification Operation In the following, the order of performance of the program operation and the program verification operation will be described with reference to FIG. 52.

Figure 52:
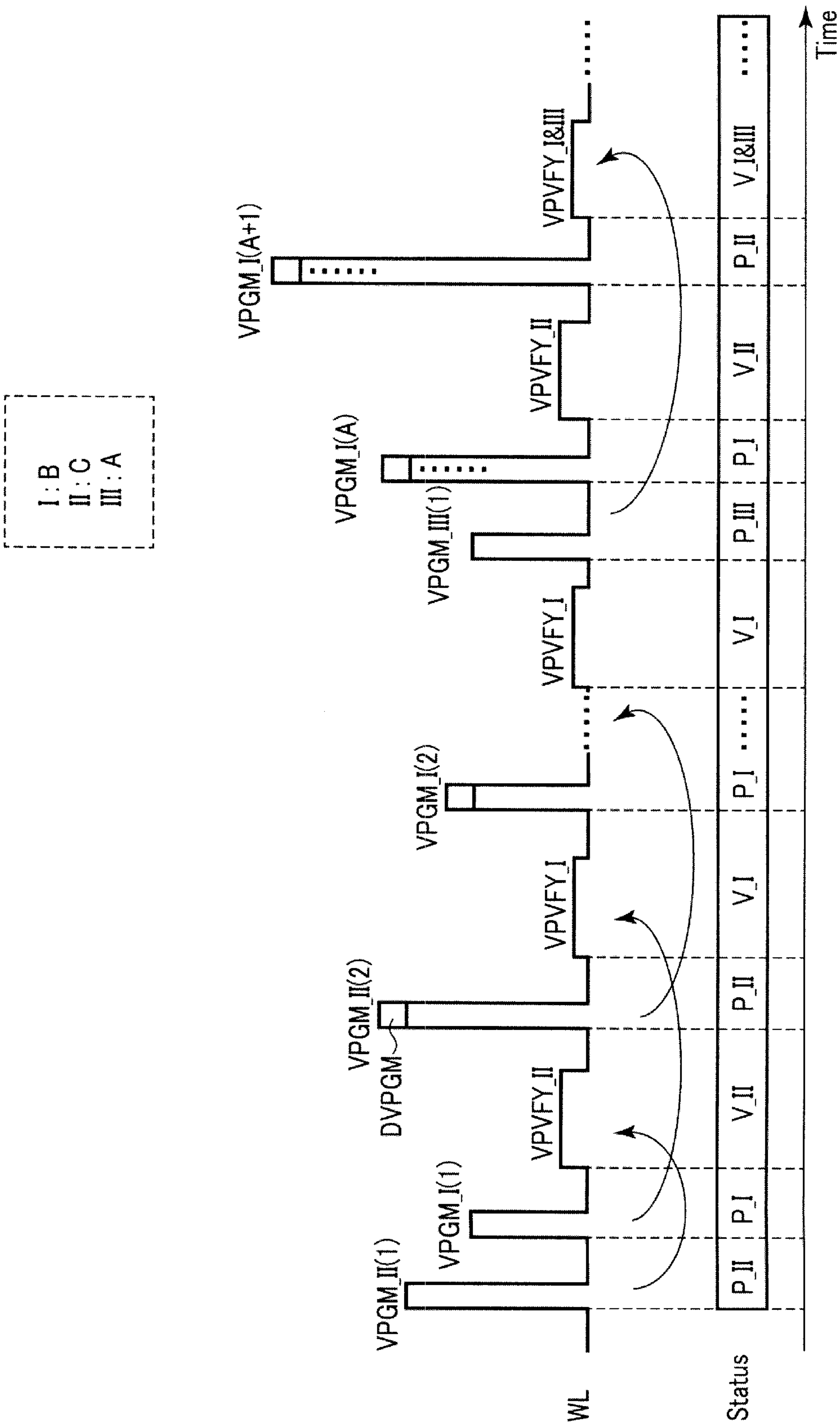
FIG. 52 is a waveform chart schematically showing a waveform of the word line during the write operation.

For easy understanding, FIG. 52 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 5 of the first embodiment is divided into first to third write operations in the same manner as the modified example 4 of the first embodiment.

The modified example 5 of the first embodiment is different from the modified example 4 of the first embodiment in that the first program operation is performed immediately after the third program operation.

Figure 53:
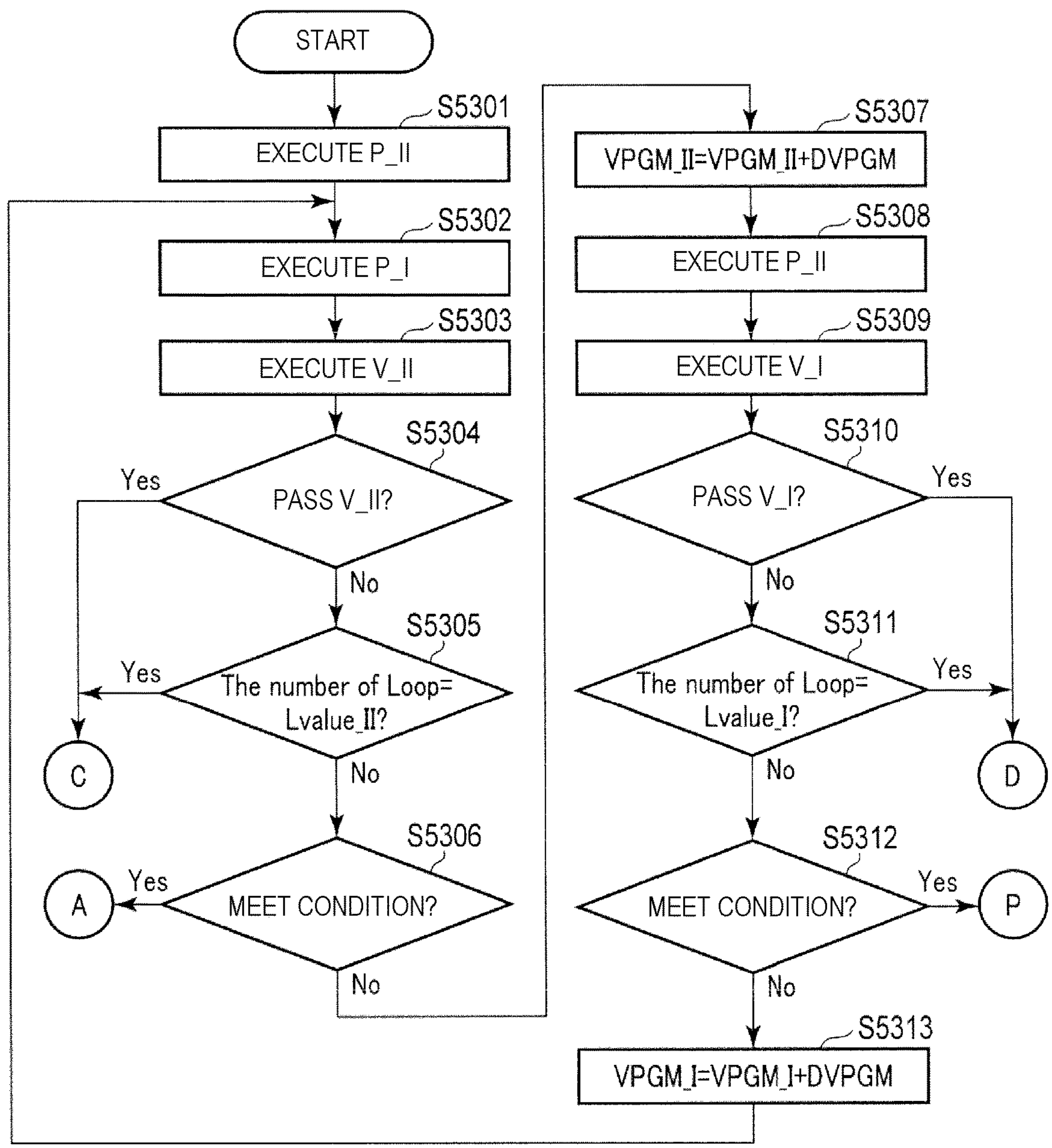
FIG. 53 is a flowchart showing the method of generating the performance order (pulse order) of the program operation and the program verification operation.

<1-10-1-2> Method of Generating Order of Performance of Program Operation and Program Verification Operation Referring now to FIG. 53 and FIG. 54, a method of generating the order of performance of the program operation and the program verification operation according to the modified example 5 of the first embodiment will be described.

Step S5301 to Step S5311 (see FIG. 53) correspond to Step S3401 to Step S3411 in FIG. 34.

Step S5312

If the sequencer 111 determines that the number of loops is not the set value (LValue_I) (NO in Step S5311), the sequencer 111 determines whether or not the condition is satisfied. The "condition" in Step S5312 may be different from the "conditions" in Step S5306.

Figure 54:
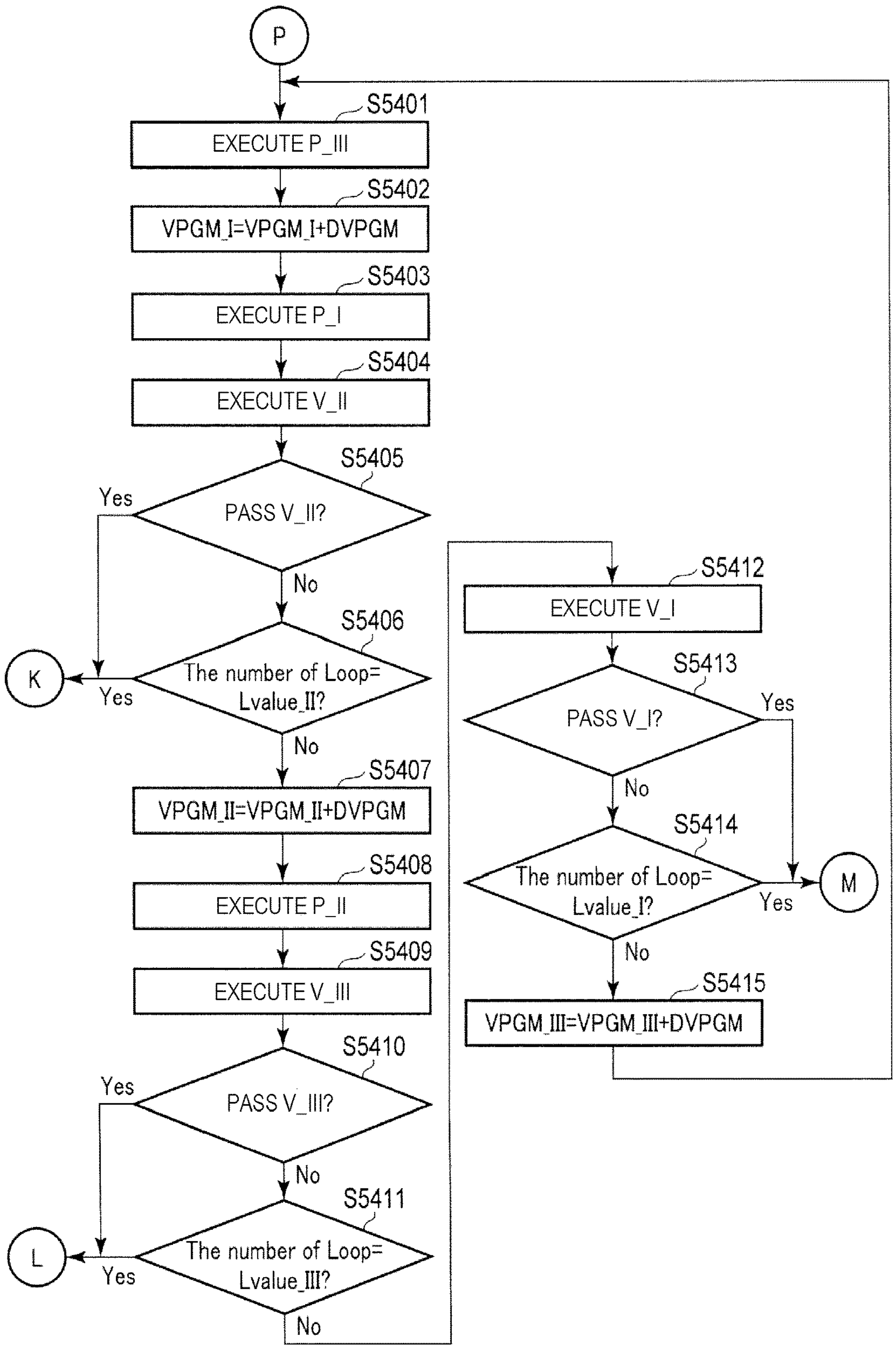
FIG. 54 is a flowchart showing the method of generating the performance order (pulse order) of the program operation and the program verification operation.

If the sequencer 111 determines that the condition is satisfied (YES in Step S5312), the sequencer 111 performs an operation illustrated in FIG. 54.

Step S5313

The sequencer 111 performs the same operation as that in Step S3413.

Step S5401

If the sequencer 111 determines that "the condition is satisfied" in Step S5312, the sequencer 111 performs the third program operation (see FIG. 54).

Step S5402

The sequencer 111 increments the voltage VPGM_I to be used in the first program operation by the voltage DVPGM.

Step S5403

The sequencer 111 performs the first program operation.

Step S5404

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S5405

The sequencer 111 determines whether or not the result of the second program verification operation is a pass. If the sequencer 111 determines that the result of the second program verification operation is a pass (YES in Step S5405), the sequencer 111 performs Step S4301.

Step S5406

If the sequencer 111 determines that the result of the second program verification operation is not a pass (NO in Step S5405), the sequencer 111 counts up the number of loops relating to the second program operation. Subsequently, the sequencer 111 counts up the number of loops and then determines whether or not the number of loops of the second program operation is the set value (LValue_II). If the sequencer 111 determines that the number of loops is the set value (LValue_II) (YES in Step S5406), the sequencer 111 performs Step S4301.

Step S5407

If the sequencer 111 determines that the number of loops is not the set value (LValue_II) (NO in Step S5406), the sequencer 111 increments the voltage VPGM_II to be used in the second program operation by the voltage DVPGM.

Step S5408

The sequencer 111 performs the second program operation.

Step S5409

The sequencer 111 performs the third program verification operation after performing the second program operation.

In this manner, the sequencer 111 performs other operations between the third program operation and the third program verification operation. Accordingly, the sequencer 111 is capable of performing the program verification in a state in which the electron leakage becomes stable.

Step S5410

The sequencer 111 determines whether or not the result of the third program verification operation is a pass. If the sequencer 111 determines that the result of the third program verification operation is a pass (YES in Step S5410), the sequencer 111 performs Step S4401.

Step S5411

If the sequencer 111 determines that the result of the third program verification operation is not a pass (NO in Step S5410), the sequencer 111 counts up the number of loops relating to the third program operation. Subsequently, the sequencer 111 counts up the number of loops and then determines whether or not the number of loops of the third program operation is a set value (LValue_III). If the sequencer 111 determines that the number of loops is the set value (LValue_III) (YES in Step S5411), the sequencer 111 performs Step S4401.

Step S5412

If the sequencer 111 determines that the number of loops is not the set value (LValue_III) (NO in Step S5411), the sequencer 111 performs the first program verification operation (V_I).

In this manner, the sequencer 111 performs other operations between the first program operation and the first program verification operation. Accordingly, the sequencer 111 is capable of performing the program verification in a state in which the electron leakage becomes stable.

Step S5413

The sequencer 111 determines whether or not the result of the first program verification operation is a pass. If the sequencer 111 determines that the result of the first program verification operation is a pass (YES in Step S5413), the sequencer 111 performs Step S4501.

Step S5414

If the sequencer 111 determines that the result of the first program verification operation is not a pass (NO in Step S5413), the sequencer 111 counts up the number of loops relating to the first program operation. Subsequently, the sequencer 111 counts up the number of loops and then determines whether or not the number of loops of the first program operation is the set value (LValue_I). If the sequencer 111 determines that the number of loops is the set value (LValue_I) (YES in Step S5414), the sequencer 111 performs Step S4501.

Step S5415

If the sequencer 111 determines that the number of loops is not the set value (LValue_I) (NO in Step S5414), the sequencer 111 increments the voltage VPGM_III to be used in the third program operation by the voltage DVPGM.

<1-10-2> Specific Example of Pulse

Subsequently, the specific example of the write operation relating to the memory system of the modified example 5 of the first embodiment will be described.

Subsequently, referring now to FIG. 55 and FIG. 56, a specific example of the pulse for a case where the write operation of the first embodiment is applied to the memory cell transistors MT described above will be described. The basic operations are the same as those described with reference to FIG. 50 and FIG. 51.

Figure 55:
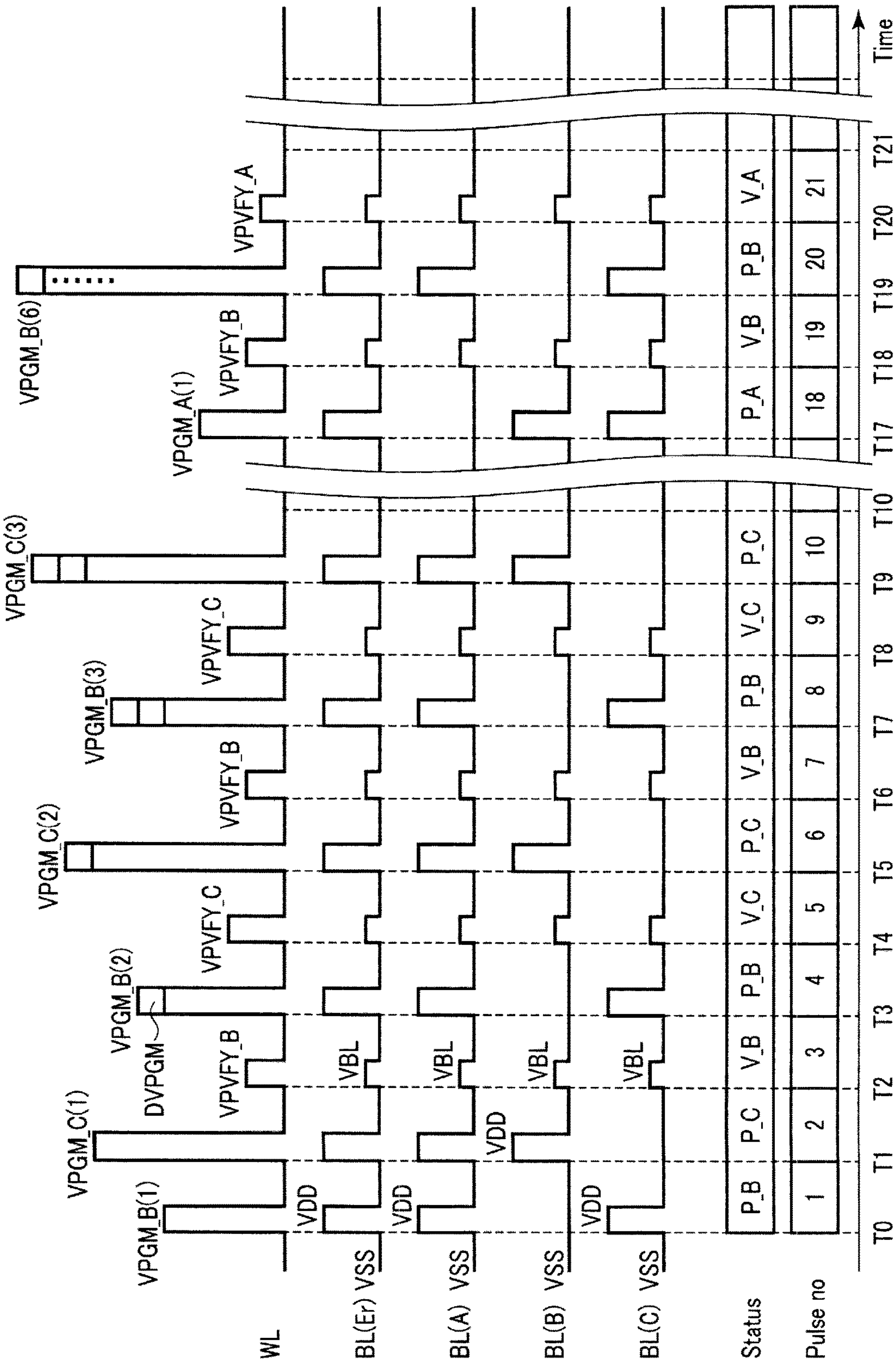
FIG. 55 is a waveform chart showing an example of the voltages to be applied to the word lines and the bit lines during the write operation.

FIG. 55 and FIG. 56 illustrate a pulse of (i) and a pulse of (ii), which are roughly classified pulse categories, as described in conjunction with FIG. 20 and FIG. 21.

In the example illustrated in FIG. 55 and FIG. 56, pulses corresponding to the pulse Nos. 1 to 3, and 5 correspond to the pulses of (i).

In the example of FIG. 55 and FIG. 56, the pulses corresponding to those other than the pulse No. 1 to 3, and 5 correspond to the pulses of (ii).

As described above, the sequencer 111 determines whether or not the condition is satisfied during the write operation. Specifically, for example, the sequencer 111 determines that the condition is satisfied after a pulse having a pulse no. 17 (Pulse no=17) has been applied, and thus the sequencer 111 starts the third program operation at a pulse no. 18 (Pulse No=18).

<1-11> Modified Example 6 of First Embodiment

A modified example 6 of the first embodiment will be described. In the modified example 6 of the first embodiment, a case where a writing method different from the data writing method described above is employed in the first embodiment will be described.

<1-11-1> Operation

<1-11-1-1> Example of Order of Performance of Program Operation and Program Verification Operation In the following, the order of performance of the program operation and the program verification operation will be described with reference to FIG. 57.

Figure 57:
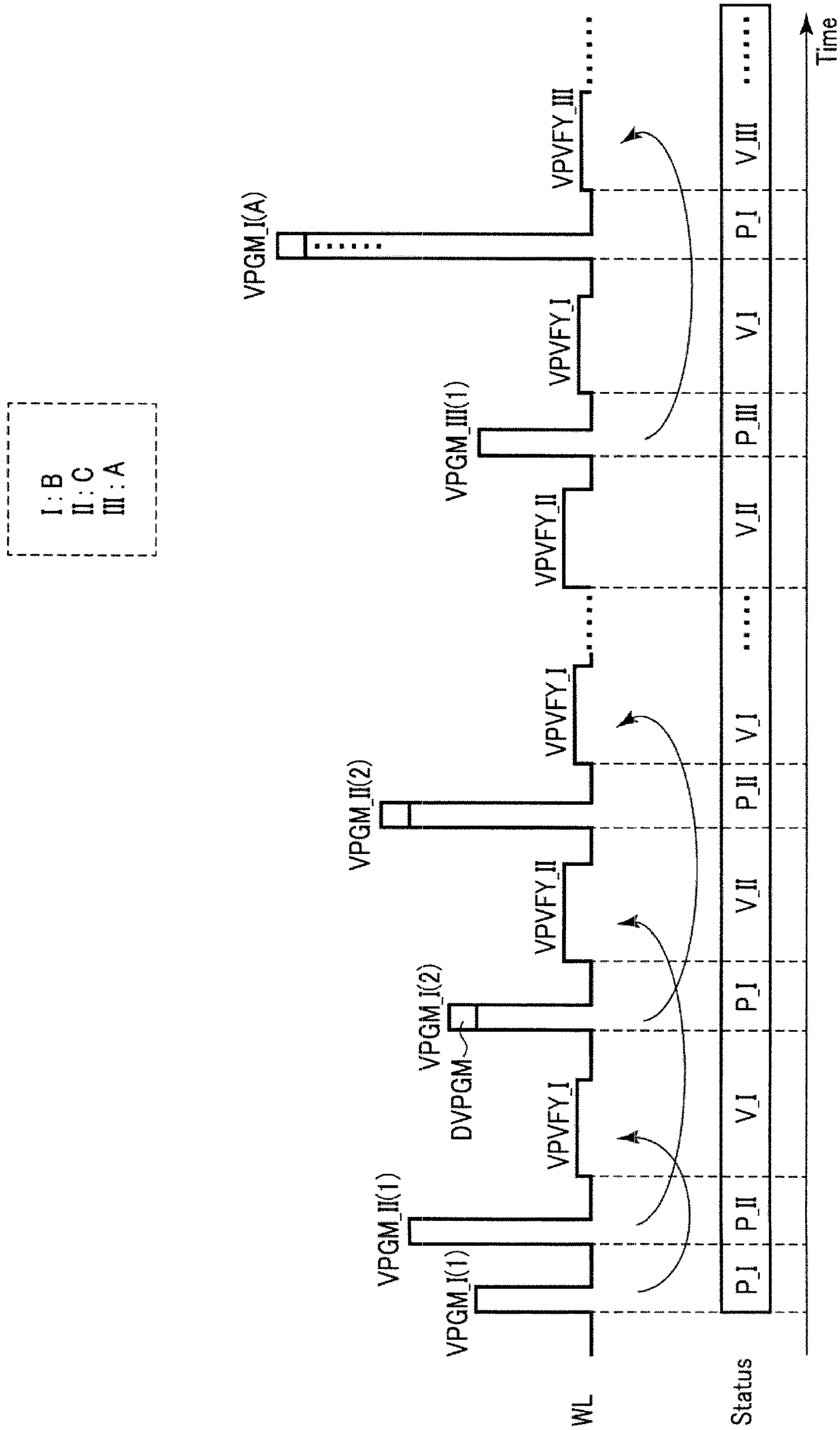
FIG. 57 is a waveform chart schematically showing a waveform of the word line during the write operation.

For easy understanding, FIG. 57 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 6 of the first embodiment is divided into first to third write operations in the same manner as the modified example 6 of the first embodiment.

The modified example 6 of the first embodiment is different from the modified example 4 of the first embodiment in that the order of the first write operation and the second write operation are inverted.

<1-11-1-2> Method of Generating Order of Performance of Program Operation and Program Verification Operation Referring now to FIG. 58, a method of generating the order of performance of the program operation and the program verification operation according to the modified example 6 of the first embodiment will be described.

Step S5801

The sequencer 111 performs the first program operation.

Step S5802

The sequencer 111 performs the second program operation.

Step S5803

The sequencer 111 performs the first program verification operation (V_I) after performing the second program operation.

In this manner, the sequencer 111 performs other operations between the first program operation and the first program verification operation. Accordingly, the sequencer 111 is capable of performing the program verification in a state in which the electron leakage becomes stable.

Step S5804

The sequencer 111 determines whether or not the result of the first program verification operation is a pass.

If the sequencer 111 determines that the result of the first program verification operation is a pass (YES in Step S5804), the sequencer 111 performs Step S4801.

Step S5805

If the sequencer 111 determines that the result of the first program verification operation is not a pass (NO in Step S5804), the sequencer 111 counts up the number of loops relating to the first program operation.

Subsequently, the sequencer 111 counts up the number of loops and then determines whether or not the number of loops of the first program operation is the set value (LValue_I).

If the sequencer 111 determines that the number of loops is the set value (LValue_I) (YES in Step S5805), the sequencer 111 performs Step S4801.

Step S5806

If the sequencer 111 determines that the number of loops is not the set value (LValue_I) (NO in Step S5805), the sequencer 111 determines whether or not the condition is satisfied.

If the sequencer 111 determines that the condition is satisfied (YES in Step S5806), the sequencer 111 performs Step S4201.

Step S5807

If the sequencer 111 determines that the condition is not satisfied (NO in Step S5806), the sequencer 111 increments the voltage VPGM_I to be used in the first program operation by the voltage DVPGM.

Step S5808

The sequencer 111 performs the first program operation.

Step S5809

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S5810

The sequencer 111 determines whether or not the result of the second program verification operation is a pass.

If the sequencer 111 determines that the result of the second program verification operation is a pass (YES in Step S5810), the sequencer 111 performs Step S4601.

Step S5811

If the sequencer 111 determines that the result of the second program verification operation is not a pass (NO in Step S5810), the sequencer 111 counts up the number of loops relating to the second program operation. Subsequently, the sequencer 111 counts up the number of loops and then determines whether or not the number of loops of the second program operation is the set value (LValue_II).

If the sequencer 111 determines that the number of loops is the set value (LValue_II) (YES in Step S5811), the sequencer 111 performs Step S4601.

Step S5812

If the sequencer 111 determines that the number of loops is not the set value (LValue_II) (NO in Step S5811), the sequencer 111 determines whether or not the condition is satisfied. The "condition" in Step S5812 may be different from the "conditions" in Step S5806.

If the sequencer 111 determines that the condition is satisfied (YES in Step S5812), the sequencer 111 performs Step S3501.

Step S5813

If the sequencer 111 determines that the condition is not satisfied (NO in Step S5812), the sequencer 111 increments the voltage VPGM_II to be used in the second program operation by the voltage DVPGM. Subsequently, Step S5802 is performed.

<1-12> Modified Example 7 of First Embodiment

A modified example 7 of the first embodiment will be described. In the modified example 7 of the first embodiment, a case where a writing method different from the data writing method described above is employed in the first embodiment will be described.

<1-12-1> Operation

<1-12-1-1> Example of Order of Performance of Program Operation and Program Verification Operation In the following, the order of performance of the program operation and the program verification operation will be described with reference to FIG. 59.

Figure 59:
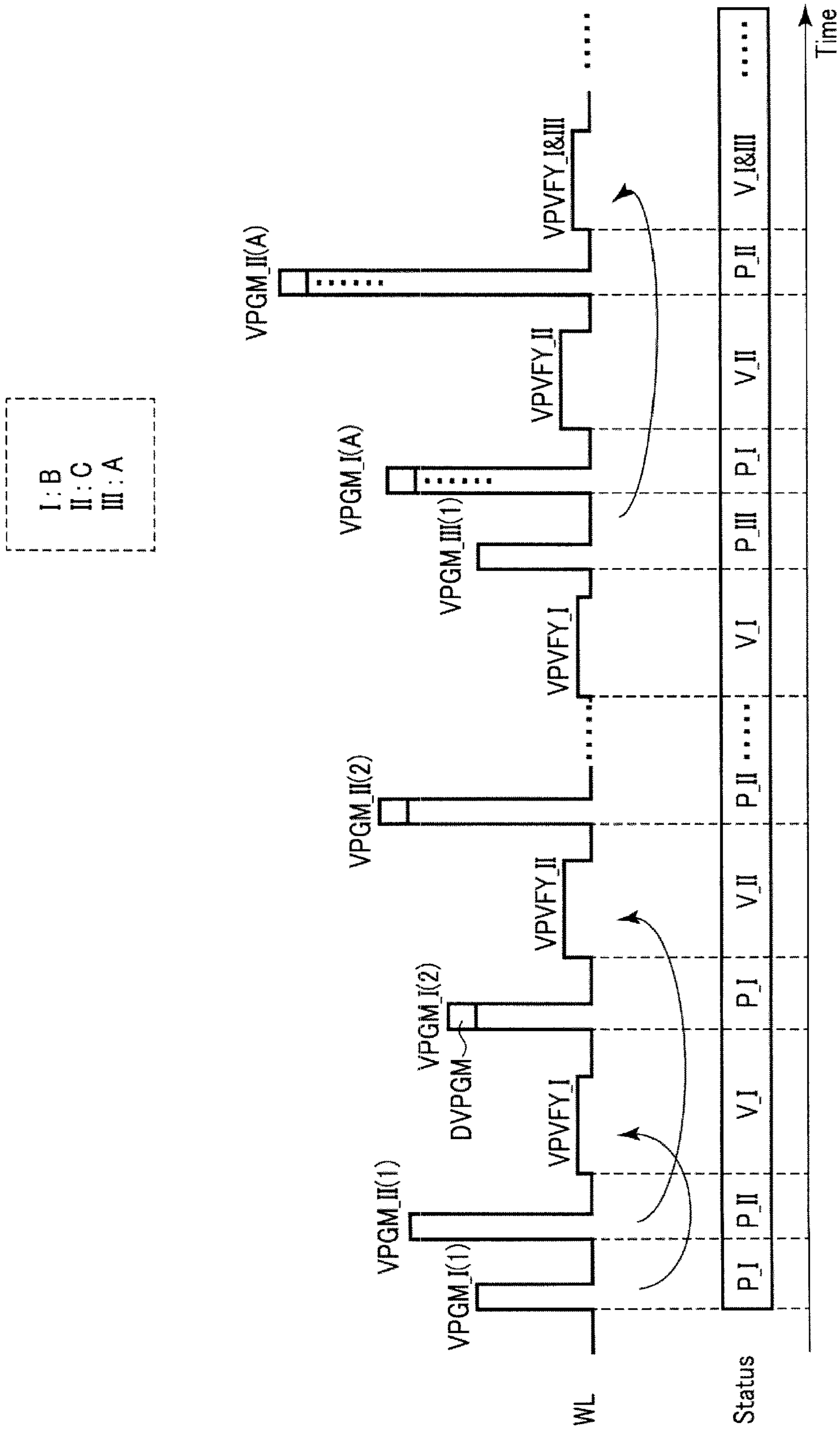
FIG. 59 is a waveform chart schematically showing a waveform of the word line during the write operation.

For easy understanding, FIG. 59 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 7 of the first embodiment is divided into first to third write operations in the same manner as the modified example 4 of the first embodiment.

The modified example 7 of the first embodiment is different from the modified example 6 of the first embodiment in that the first program operation is performed immediately after the third program operation.

Figure 60:
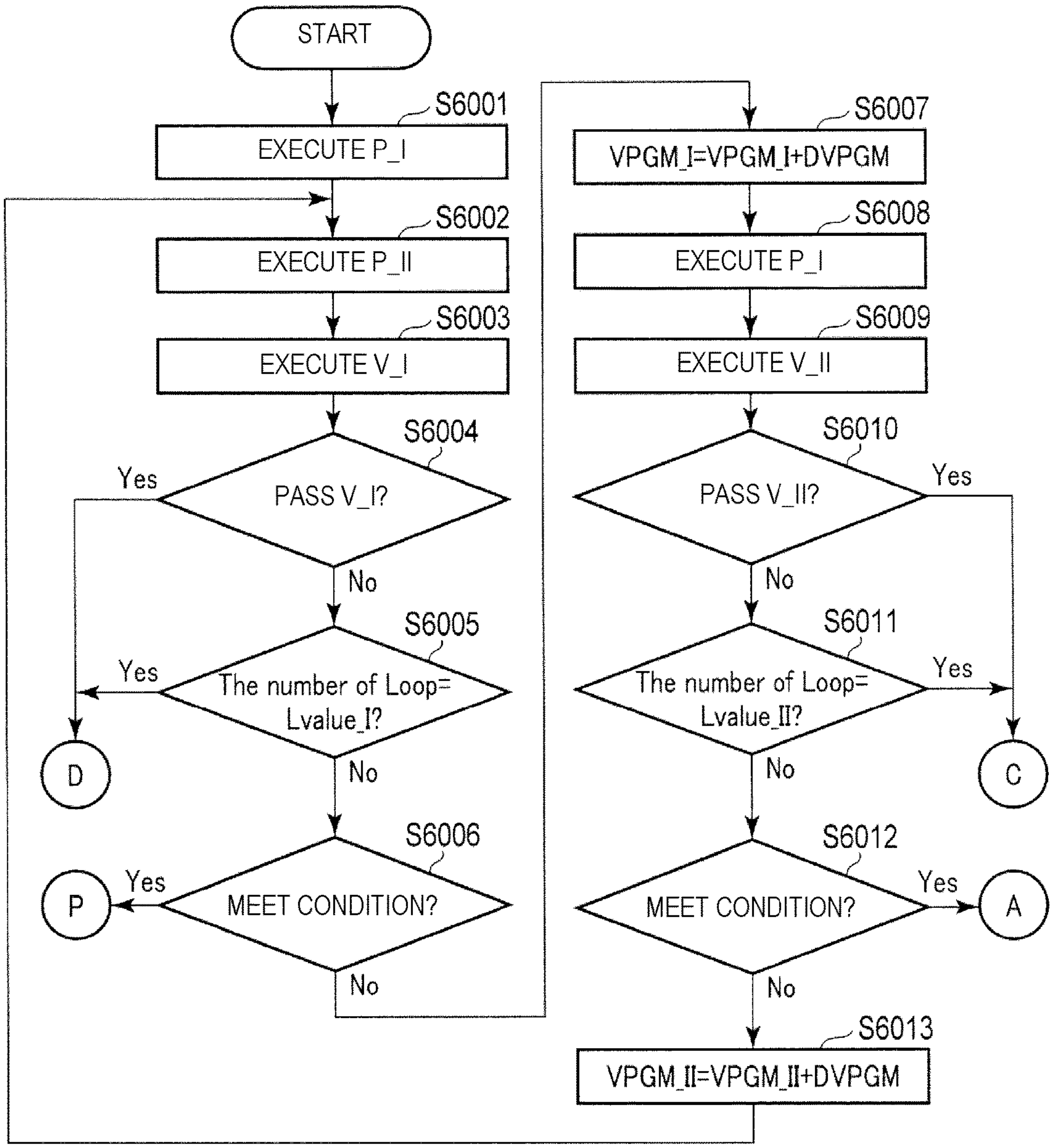
FIG. 60 is a flowchart showing the method of generating a performance order (pulse order) of the program operation and the program verification operation.

<1-12-1-2> Method of Generating Order of Performance of Program Operation and Program Verification Operation Referring now to FIG. 60, a method of generating the order of performance of the program operation and the program verification operation according to the modified example 7 of the first embodiment will be described.

Figure 58:
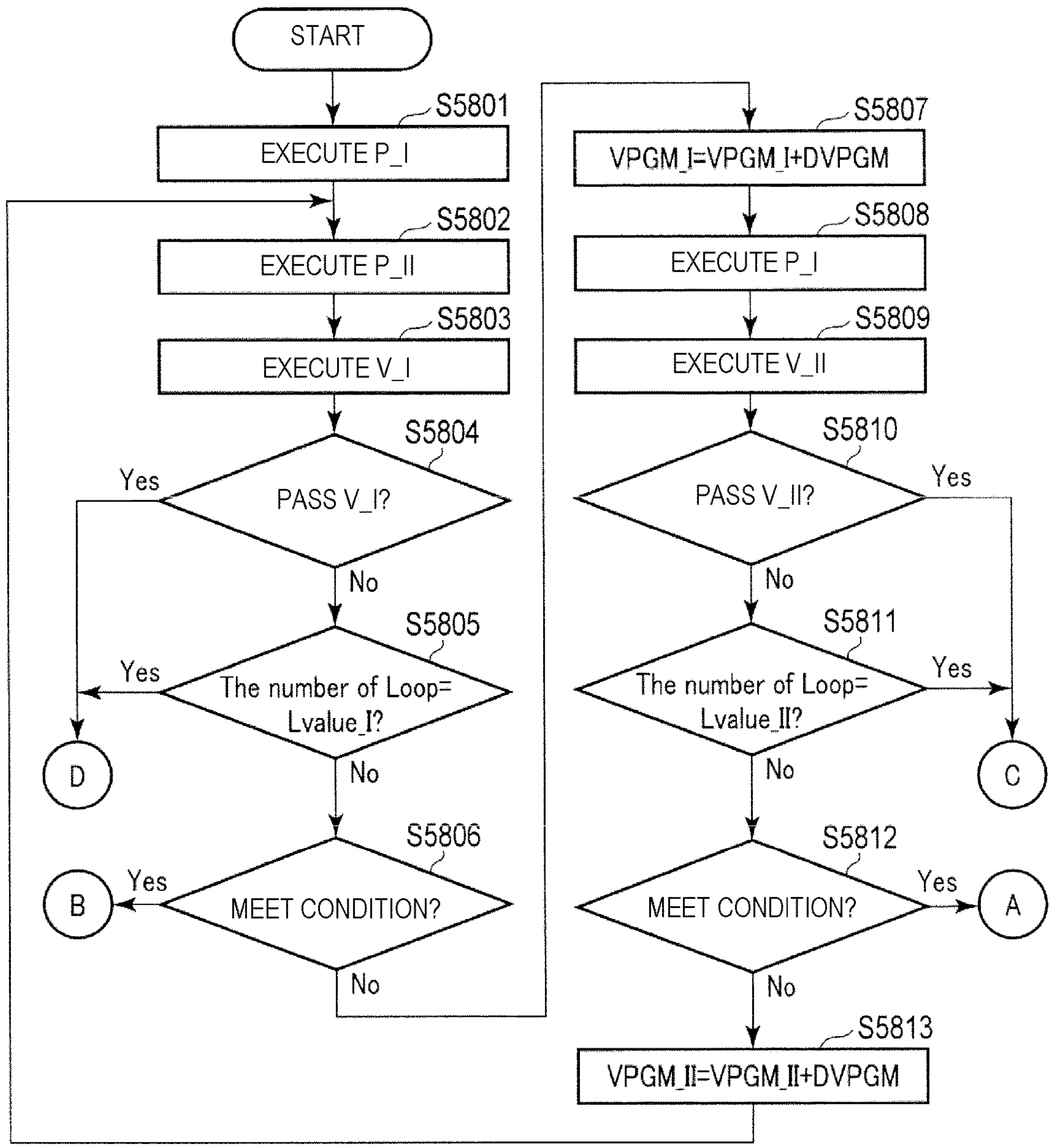
FIG. 58 is a flowchart showing the method of generating a performance order (pulse order) of the program operation and the program verification operation.

Step S6001 to Step S6005 correspond to Step S5801 to Step S5805 in FIG. 58.

Step S6006

If the sequencer 111 determines that the number of loops is not the set value (LValue_I) (NO in Step S6005), the sequencer 111 determines whether or not the condition is satisfied. The "condition" in Step S6006 may be different from the "conditions" in Step S6012.

If the sequencer 111 determines that the condition is satisfied (YES in Step S6006), the sequencer 111 performs Step S5401.

Step S6007 to Step S6013 correspond to Step S5807 to Step S5813 in FIG. 58.

<1-13> Modified Example 8 of First Embodiment

A modified example 8 of the first embodiment will be described. In the modified example 8 of the first embodiment, a case where a writing method different from the data writing method described above is employed in the first embodiment will be described.

<1-13-1> Operation

<1-13-1-1> Example of Order of Performance of Program Operation and Program Verification Operation In the following, the order of performance of the program operation and the program verification operation will be described with reference to FIG. 61.

Figure 61:
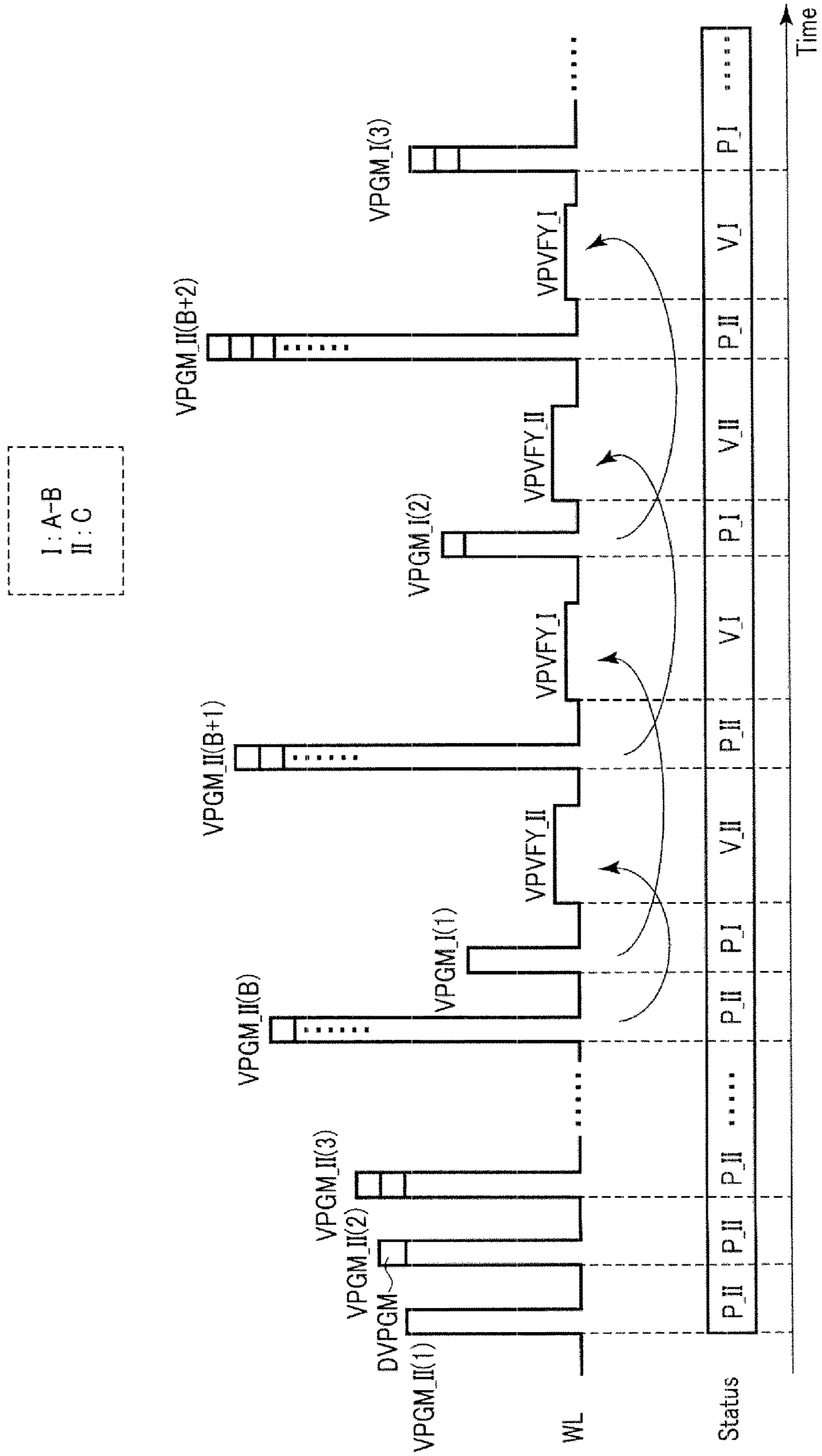
FIG. 61 is a waveform chart schematically showing a waveform of the word line during the write operation.

For easy understanding, FIG. 61 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 8 of the first embodiment is divided into first and second write operations in the same manner as the first embodiment.

The modified example 8 of the first embodiment is different from the first embodiment in that the second program operation is repeated by a predetermined number of times at the start of the write operation.

For example, in the example illustrated in FIG. 61, the sequencer 111 repeats the second program operation by B times (B may be set to any integer), and then performs the first program operation.

<1-13-1-2> Method of Generating Order of Performance of Program Operation and Program Verification Operation Referring now to FIG. 62, a method of generating the order of performance of the program operation and the program verification operation according to the modified example 8 of the first embodiment will be described.

Step S6201

The sequencer 111 performs the second program operation.

Step S6202

The sequencer 111 determines whether or not the condition is satisfied. For example, the "condition" in Step S6202 is the number of loops of the second program operation. In other words, the sequencer 111 determines whether or not the number of loops of the second program operation reaches the set value.

Information relating to the above-described conditions is stored, for example, in the register 112 in the same manner as the "conditions" described in other examples.

Step S6203

If the sequencer 111 determines that the condition is not satisfied (NO in Step S6202), the sequencer 111 increments the voltage VPGM_II to be used in the second program operation by the voltage DVPGM. Subsequently, Step S6201 is performed.

Step S6204

If the sequencer 111 determines that the condition is satisfied (YES in Step S6202), the sequencer 111 performs the first program operation.

Step S6205

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S6206

The sequencer 111 determines whether or not the result of the second program verification operation is a pass.

If the sequencer 111 determines that the result of the second program verification operation is a pass (YES in Step S6206), the sequencer 111 performs Step S4001.

Step S6207

If the sequencer 111 determines that the result of the second program verification operation is not a pass (NO in Step S6206), the sequencer 111 counts up the number of loops relating to the second program operation.

Subsequently, the sequencer 111 counts up the number of loops and then determines whether or not the number of loops of the second program operation is the set value (LValue_II).

If the sequencer 111 determines that the number of loops is the set value (LValue_II) (YES in Step S6207), the sequencer 111 performs Step S4001.

Step S6208

If the sequencer 111 determines that the number of loops is not the set value (LValue_II) (NO in Step S6207), the sequencer 111 increments the voltage VPGM_II to be used in the second program operation by the voltage DVPGM.

Step S6209

The sequencer 111 performs the second program operation.

Step S6210

The sequencer 111 performs the first program verification operation after performing the second program operation.

In this manner, the sequencer 111 performs other operations between the first program operation and the first program verification operation. Accordingly, the sequencer 111 is capable of performing the program verification in a state in which the electron leakage becomes stable.

Step S6211

The sequencer 111 determines whether or not the result of the first program verification operation is a pass.

If the sequencer 111 determines that the result of the first program verification operation is a pass (YES in Step S6211), the sequencer 111 performs Step S3701.

Step S6212

If the sequencer 111 determines that the result of the first program verification operation is not a pass (NO in Step S6211), the sequencer 111 counts up the number of loops relating to the first program operation.

Subsequently, the sequencer 111 counts up the number of loops and then determines whether or not the number of loops of the first program operation is the set value (LValue_I).

If the sequencer 111 determines that the number of loops is the set value (LValue_I) (YES in Step S6212), the sequencer 111 performs Step S3701.

Step S6213

If the sequencer 111 determines that the number of loops is not the set value (LValue_I) (NO in Step S6212), the sequencer III increments the voltage VPGM_I to be used in the first program operation by the voltage DVPGM. Subsequently, Step S6204 is performed.

<1-13-2-1> Specific Example of Pulse

Subsequently, a specific example of the write operation relating to the memory system of the modified example 8 of the first embodiment will be described.

Subsequently, referring now to FIG. 63 and FIG. 64, a specific example of the pulse for a case where the write operation of the first embodiment is applied to the memory cell transistors MT described above will be described. The basic operations are the same as those described with reference to FIG. 20 and FIG. 21.

Figure 63:
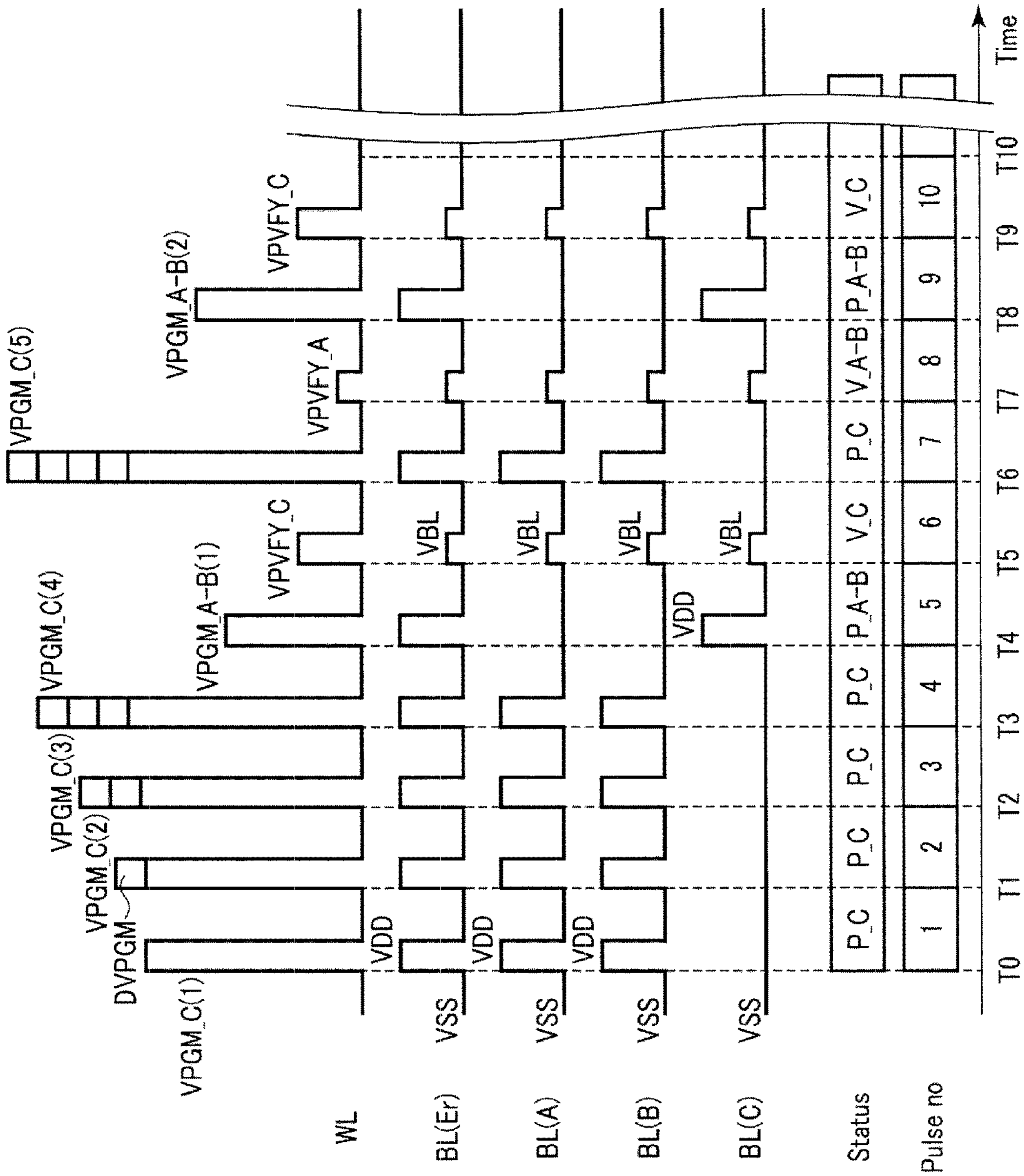
FIG. 63 is a waveform chart showing an example of voltages to be applied to the word lines and the bit lines during the write operation.

FIG. 63 and FIG. 64 illustrate a pulse of (i) and a pulse of (ii), which are roughly classified pulse categories, as described in conjunction with FIG. 20 and FIG. 21.

In the example illustrated in FIG. 63 and FIG. 64, pulses corresponding to the pulse Nos. 1, 5, 6, 8, and 17 correspond to the pulses of (i).

In the example of FIG. 63 and FIG. 64, the pulses corresponding to those other than the pulse No. 1, 5, 6, 8, and 17 correspond to the pulses of (ii).

<1-14> Modified Example 9 of First Embodiment

A modified example 9 of the first embodiment will be described. In the modified example 9 of the first embodiment, a case where a writing method different from the data writing method described above is employed in the first embodiment will be described.

<1-14-1> Operation

<1-14-1-1> Example of Order of Performance of Program Operation and Program Verification Operation In the following, the order of performance of the program operation and the program verification operation will be described with reference to FIG. 65.

Figure 65:
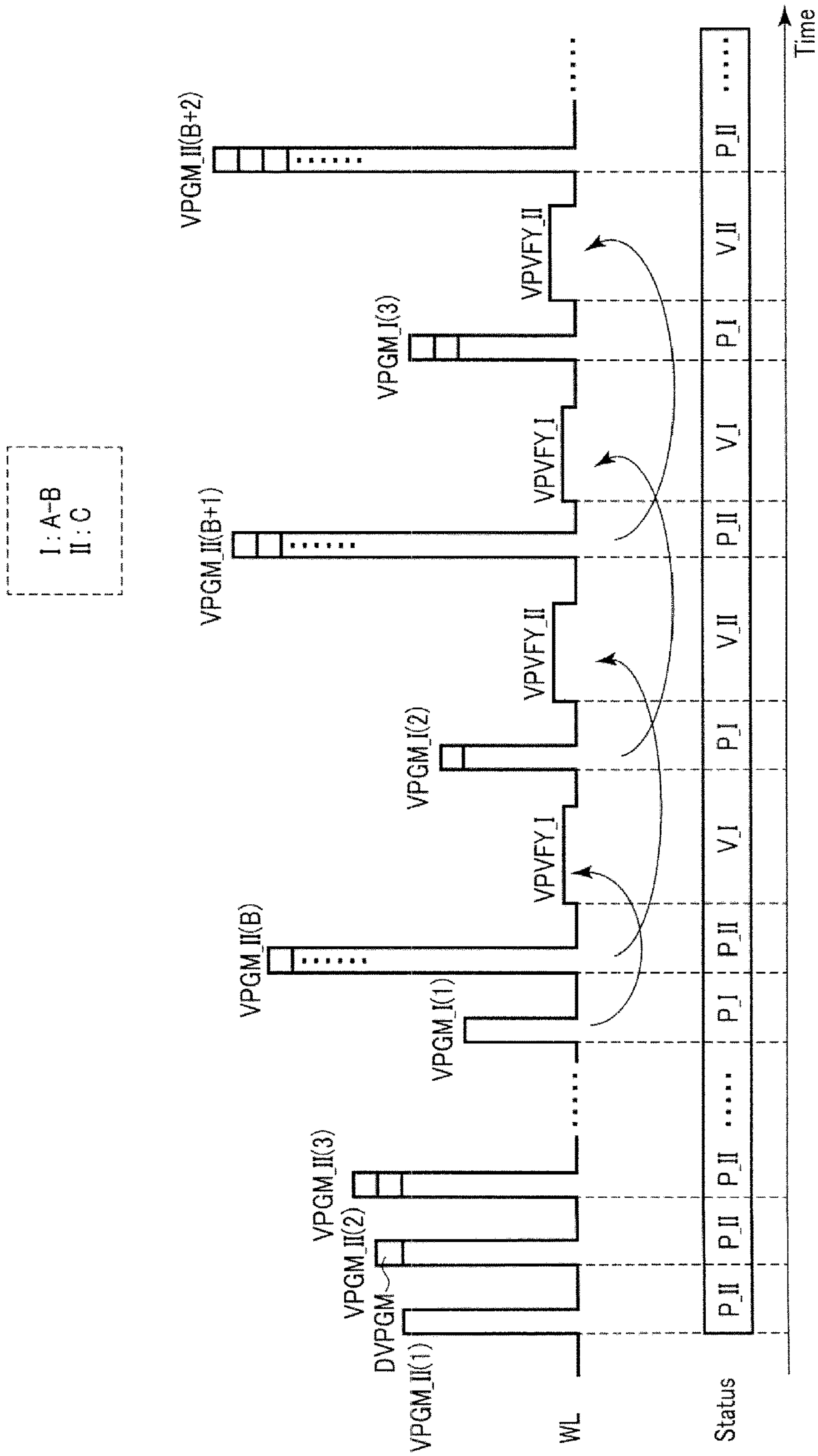
FIG. 65 is a waveform chart schematically showing a waveform of the word line during the write operation.

For easy understanding, FIG. 65 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 9 of the first embodiment is divided into first and second write operations in the same manner as the first embodiment.

The modified example 9 of the first embodiment is different from the modified example 8 of the first embodiment in that the second program operation is repeated by a plurality of times, then, the first program operation is performed, and then the second program operation is performed.

Figure 66:
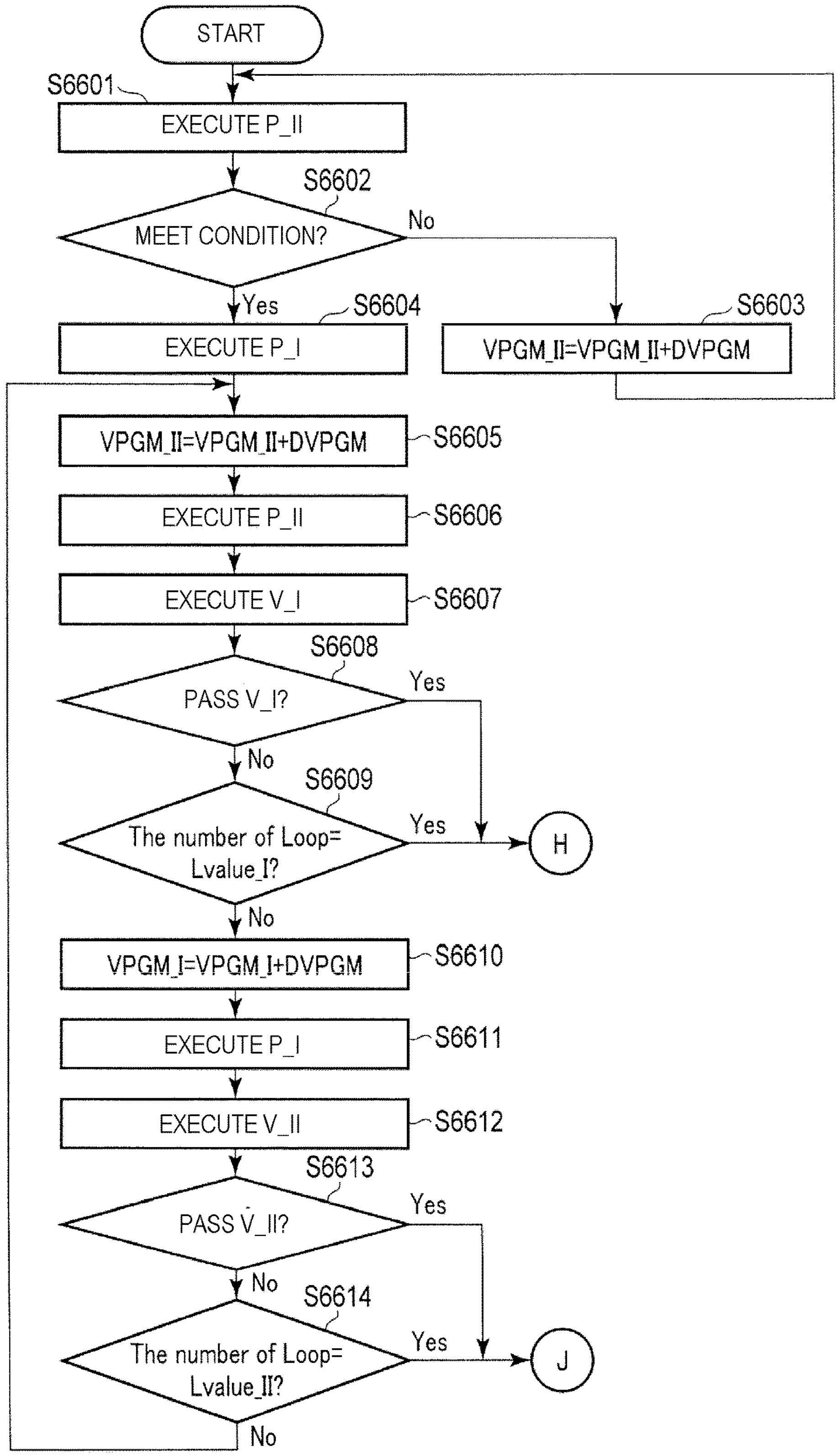
FIG. 66 is a flowchart showing the method of generating the performance order (pulse order) of the program operation and the program verification operation.

<1-14-1-2> Method of Generating Order of Performance of Program Operation and Program Verification Operation Referring now to FIG. 66, a method of generating the order of performance of the program operation and the program verification operation according to the modified example 9 of the first embodiment will be described.

Figure 62:
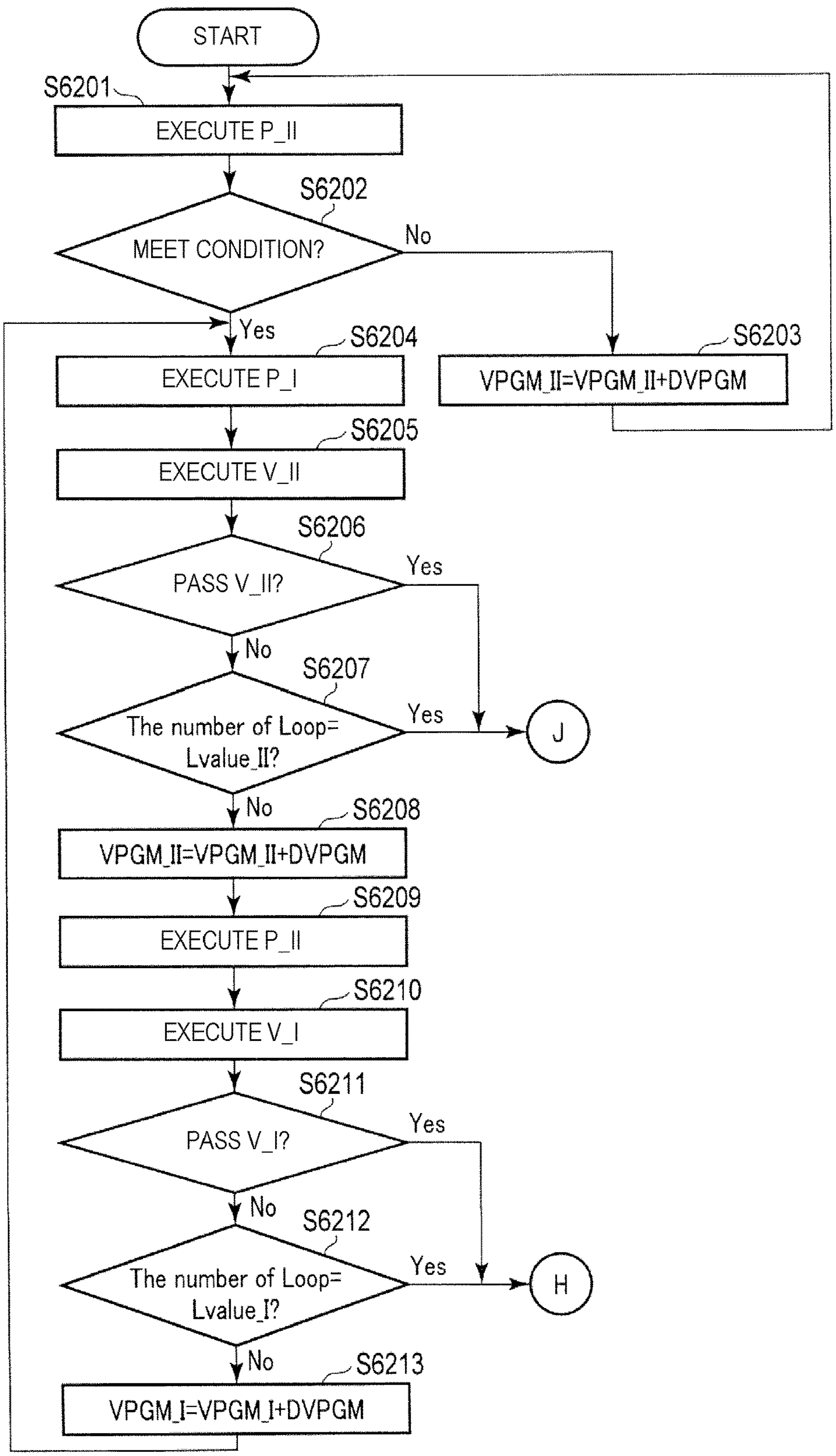
FIG. 62 is a flowchart showing the method of generating the performance order (pulse order) of the program operation and the program verification operation.

Step S6601 to Step S6604 correspond to Step S6201 to Step S6204 in FIG. 62.

Step S6605

The sequencer 111 increments the voltage VPGM_II to be used in the second program operation by the voltage DVPGM.

Step S6606

The sequencer 111 performs the second program operation.

Step S6607

The sequencer 111 performs the first program verification operation after performing the second program operation.

In this manner, the sequencer 111 performs other operations between the first program operation and the first program verification operation. Accordingly, the sequencer 111 is capable of performing the program verification in a state in which the electron leakage becomes stable.

Step S6608

The sequencer 111 determines whether or not the result of the first program verification operation is a pass.

If the sequencer 111 determines that the result of the first program verification operation is a pass (YES in Step S6608), the sequencer 111 performs Step S3701.

Step S6609

If the sequencer 111 determines that the result of the first program verification operation is not a pass (NO in Step S6608), the sequencer 111 counts up the number of loops relating to the first program operation.

Subsequently, the sequencer 111 counts up the number of loops and then determines whether or not the number of loops of the first program operation is the set value (LValue_I).

If the sequencer 111 determines that the number of loops is the set value (LValue_I) (YES in Step S6609), the sequencer 111 performs Step S3701.

Step S6610

If the sequencer 111 determines that the number of loops is not the set value (LValue_I) (NO in Step S6609), the sequencer 111 increments the voltage VPGM_I to be used in the first program operation by the voltage DVPGM.

Step S6611

The sequencer 111 performs the first program operation.

Step S6612

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S6613

The sequencer 111 determines whether or not the result of the second program verification operation is a pass.

If the sequencer 111 determines that the result of the second program verification operation is a pass (YES in Step S6613), the sequencer 111 performs Step S4001.

Step S6614

If the sequencer 111 determines that the result of the second program verification operation is not a pass (NO in Step S6613), the sequencer 111 counts up the number of loops relating to the second program operation.

Subsequently, the sequencer 111 counts up the number of loops and then determines whether or not the number of loops of the second program operation is the set value (LValue_II).

If the sequencer 111 determines that the number of loops is not the set value (LValue_II) (NO in Step S6614), the sequencer 111 performs Step S6605.

If the sequencer 111 determines that the number of loops is the set value (LValue_II) (YES in Step S6614), the sequencer 111 performs Step S4001.

<1-15> Modified Example 10 of First Embodiment

A modified example 10 of the first embodiment will be described. In the modified example 10 of the first embodiment, a case where a writing method different from the data writing method described above is employed in the first embodiment will be described.

<1-15-1> Operation

<1-15-1-1> Example of Order of Performance of Program Operation and Program Verification Operation In the following, the order of performance of the program operation and the program verification operation will be described with reference to FIG. 67.

Figure 67:
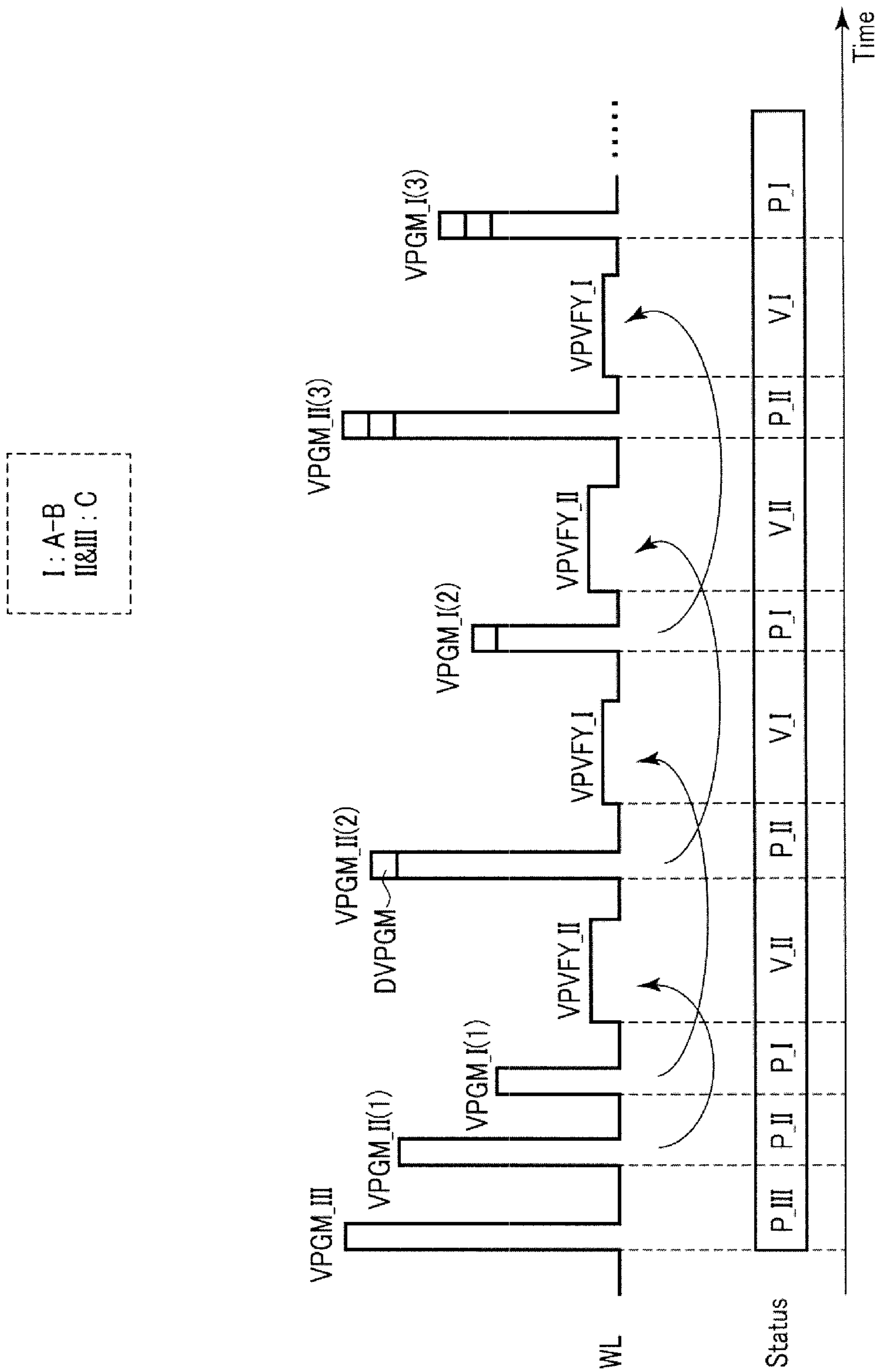
FIG. 67 is a waveform chart schematically showing a waveform of the word line during the write operation.

For easy understanding, FIG. 67 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 10 of the first embodiment is divided into first to third write operations. The first write operation and the second write operation are the same as those described in conjunction with FIG. 17.

The third write operation is a write operation for a “C”-level.

The third write operation includes the third program operation (P_III) for the “C”-level.

In the third program operation, the voltage VPGM to be applied to the selected word line WL is expressed as the voltage VPGM_III. The voltage VPGM_III is larger than, for example, the voltage VPGM_II (2).

The modified example 10 of the first embodiment is different from the first embodiment in that the third program operation is performed first.

Figure 68:
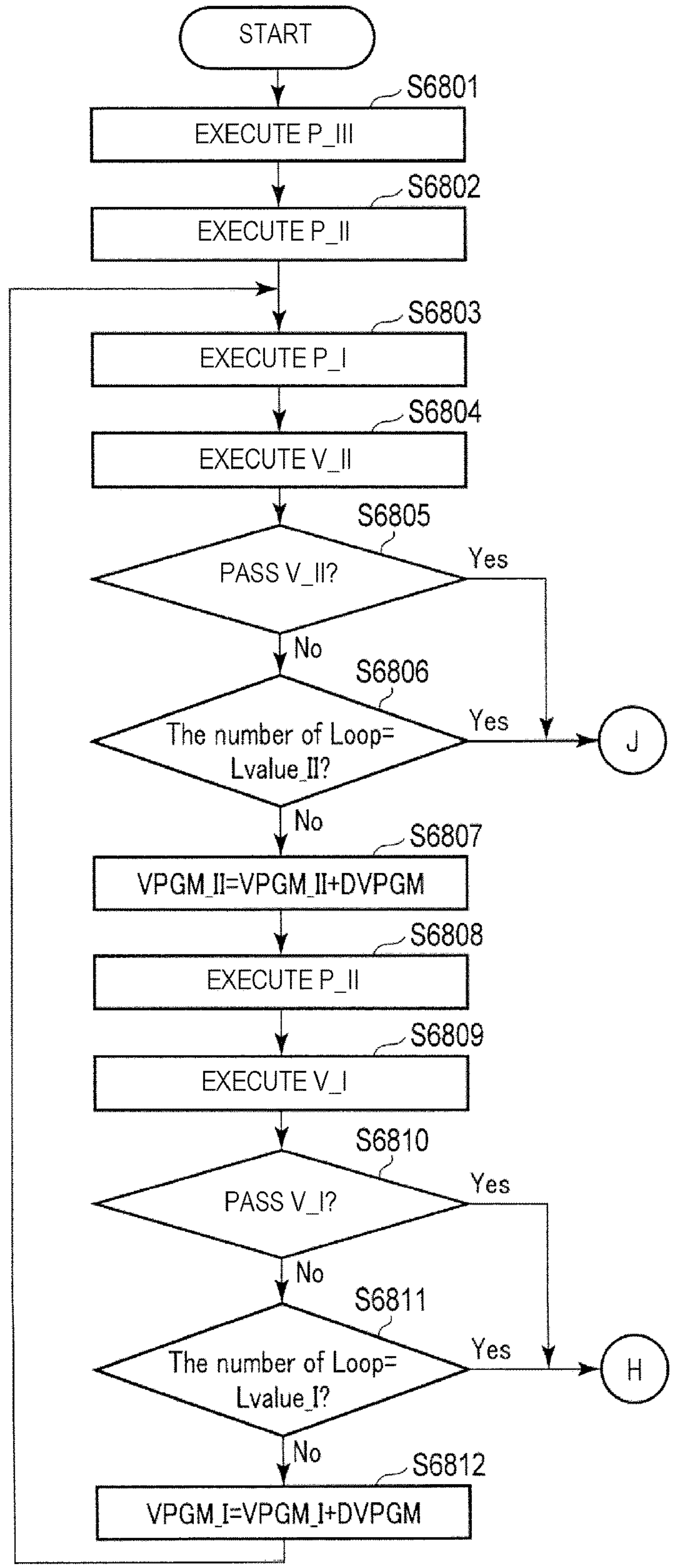
FIG. 68 is a flowchart showing the method of generating the performance order (pulse order) of the program operation and the program verification operation.

<1-15-1-2> Method of Generating Order of Performance of Program Operation and Program Verification Operation Referring now to FIG. 68, a method of generating the order of performance of the program operation and the program verification operation according to the modified example 10 of the first embodiment will be described.

Step S6801

The sequencer 111 performs the third program operation.

Step S6802

The sequencer 111 performs the second program operation.

Step S6803 to Step S6812 correspond to Step S6204 to Step S6213 in FIG. 62.

<1-15-2-1> Specific Example of Pulse

Subsequently, referring now to FIG. 69 and FIG. 70, a specific example of the pulse for a case where the write operation of the first embodiment is applied to the memory cell transistors MT described above will be described. The basic operations are the same as those described with reference to FIG. 20 and FIG. 21.

Figure 69:
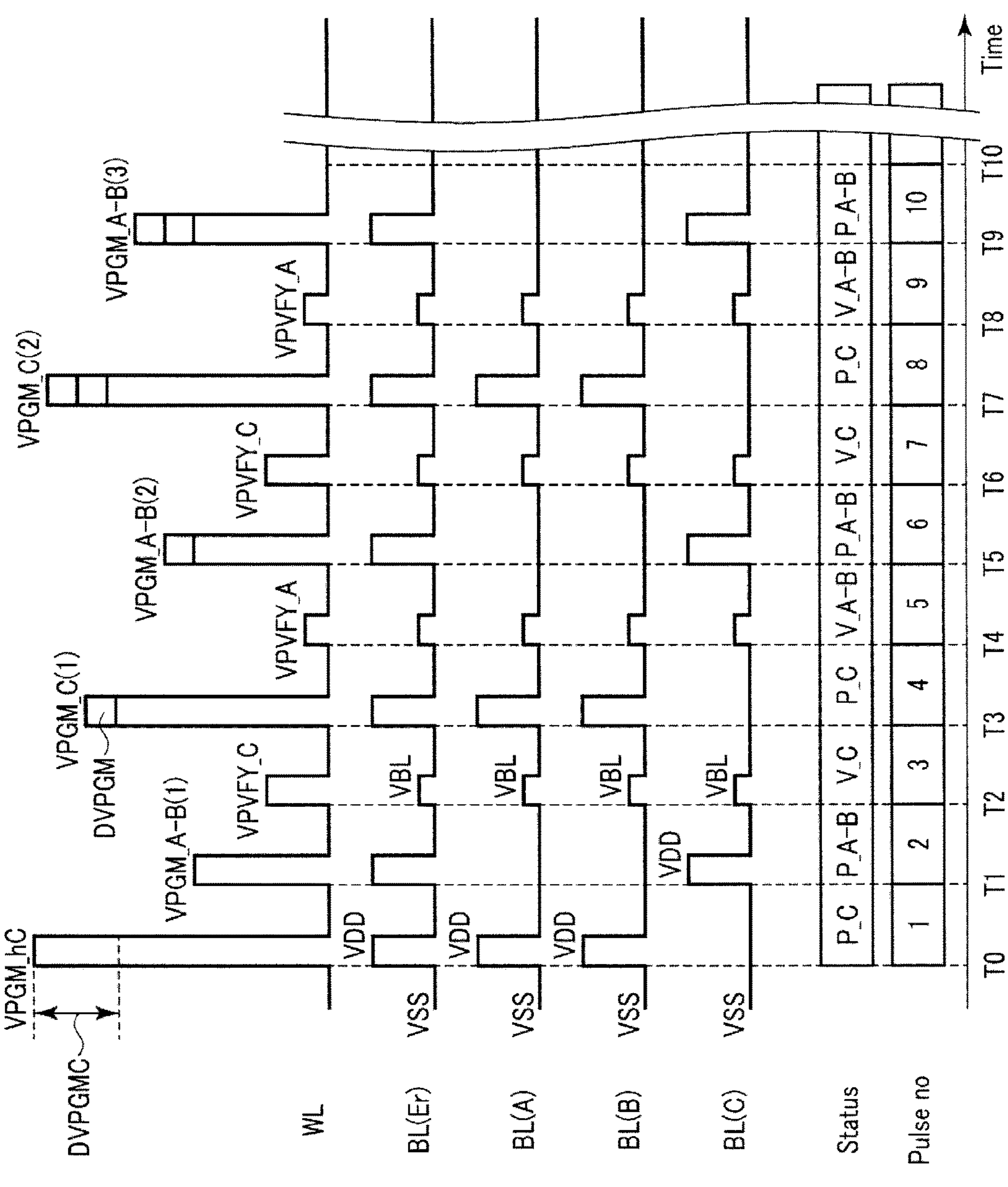
FIG. 69 is a waveform chart showing an example of voltages to be applied to the word lines and the bit lines during the write operation.

FIG. 69 and FIG. 70 illustrate a pulse of (i) and a pulse of (ii), which are roughly classified pulse categories, as described in conjunction with FIG. 20 and FIG. 21.

In the example illustrated in FIG. 69 and FIG. 70, pulses corresponding to the pulse Nos. 1 to 3, 5, and 18 correspond to the pulses of (i).

In the example of FIG. 69 and FIG. 70, the pulses corresponding to those other than the pulse No. 1 to 3, 5, and 14 correspond to the pulses of (ii).

<1-16> Modified Example 11 of First Embodiment

A modified example 11 of the first embodiment will be described. In the modified example 11 of the first embodiment, a case where a writing method different from the data writing method described above is employed in the first embodiment will be described.

<1-16-1> Operation

<1-16-1-1> Example of Order of Performance of Program Operation and Program Verification Operation In the following, the order of performance of the program operation and the program verification operation will be described with reference to FIG. 71.

Figure 71:
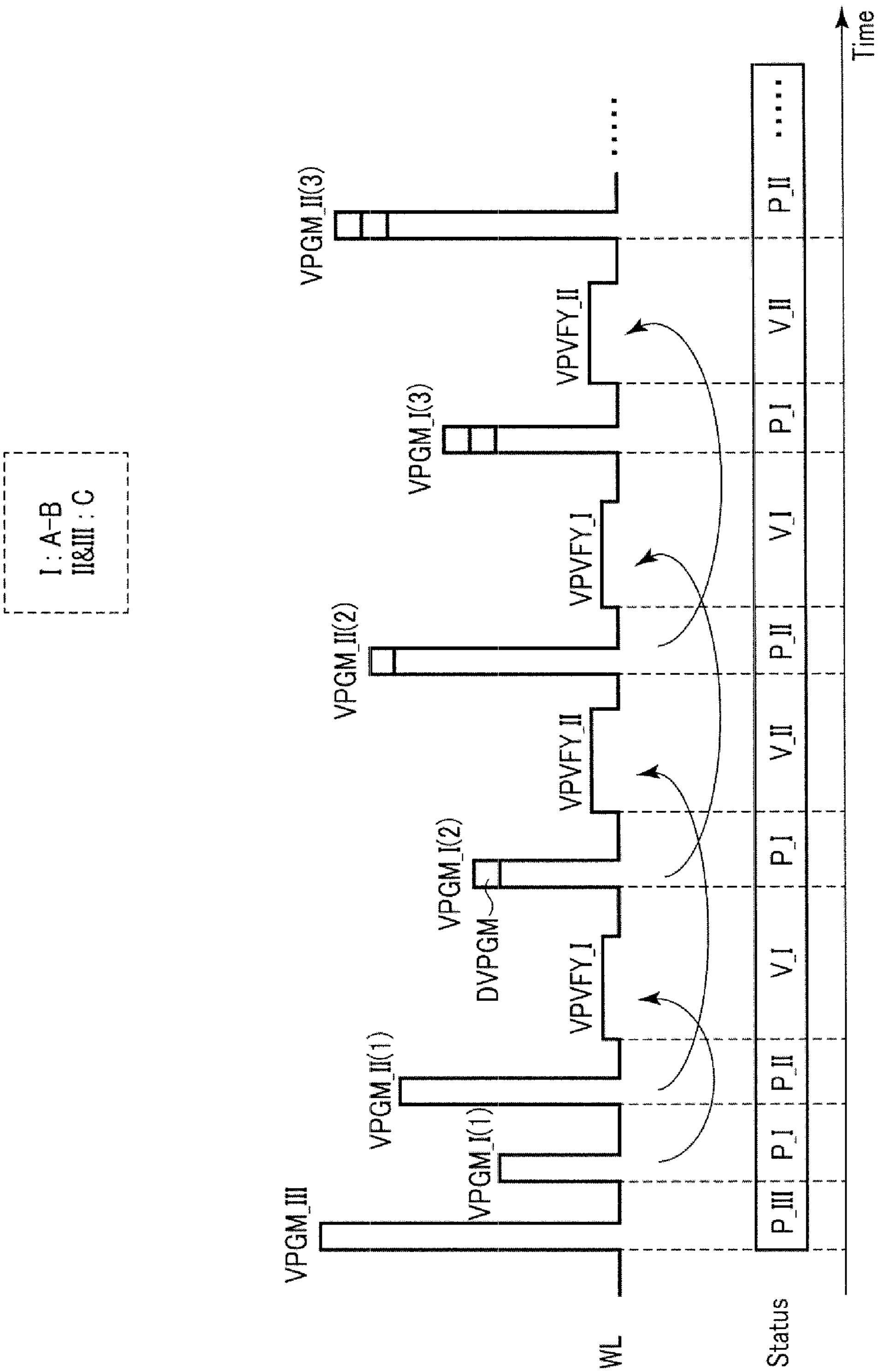
FIG. 71 is a waveform chart schematically showing a waveform of the word line during the write operation.

For easy understanding, FIG. 71 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 11 of the first embodiment is divided into first to third write operations in the same manner as the modified example 10 of the first embodiment.

The modified example 11 of the first embodiment is different from the modified example 10 of the first embodiment in that the first write operation and the second write operation are exchanged.

Figure 72:
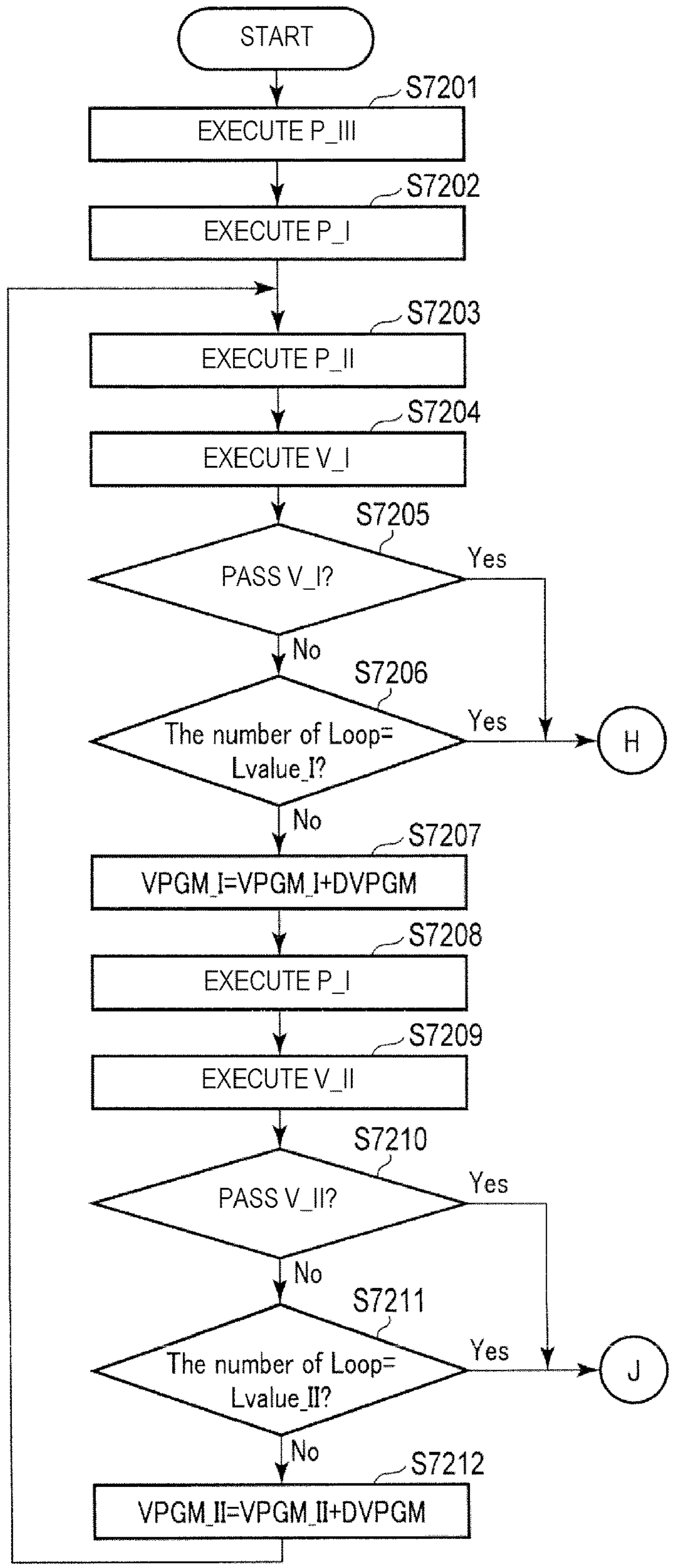
FIG. 72 is a flowchart showing the method of generating the performance order (pulse order) of the program operation and the program verification operation.

<1-16-1-2> Method of Generating Order of Performance of Program Operation and Program Verification Operation Referring now to FIG. 72, a method of generating the order of performance of the program operation and the program verification operation according to the modified example 11 of the first embodiment will be described.

Step S7201

The sequencer 111 performs the third program operation (P_III).

Step S7202

The sequencer 111 performs the first program operation (P_I).

Step S7203

The sequencer 111 performs the second program operation (P_II).

Step S7204

The sequencer 111 performs the first program verification operation after performing the second program operation.

In this manner, the sequencer 111 performs other operations between the first program operation and the first program verification operation. Accordingly, the sequencer 111 is capable of performing the program verification in a state in which the electron leakage becomes stable.

Step S7205

The sequencer 111 determines whether or not the result of the first program verification operation is a pass.

If the sequencer 111 determines that the result of the first program verification operation is a pass (YES in Step S7205), the sequencer 111 performs Step S3701.

Step S7206

If the sequencer 111 determines that the result of the first program verification operation is not a pass (NO in Step S7205), the sequencer 111 counts up the number of loops relating to the first program operation.

Subsequently, the sequencer 111 counts up the number of loops and then determines whether or not the number of loops of the first program operation is the set value (LValue_I).

If the sequencer 111 determines that the number of loops is the set value (LValue_I) (YES in Step S7206), the sequencer 111 performs Step S3701.

Step S7207

If the sequencer 111 determines that the number of loops is not the set value (LValue_I) (NO in Step S7206), the sequencer increments the voltage VPGM_I to be used in the first program operation by the voltage DVPGM.

Step S7208

The sequencer 111 performs the first program operation.

Step S7209

The sequencer 111 performs the second program verification operation (V_II) after performing the first program operation.

In this manner, the sequencer 111 performs other operations between the second program operation and the second program verification operation. Accordingly, the sequencer 111 is capable of performing the program verification in a state in which the electron leakage becomes stable.

Step S7210

The sequencer 111 determines whether or not the result of the second program verification operation is a pass.

If the sequencer 111 determines that the result of the second program verification operation is a pass (YES in Step S7210), the sequencer 111 performs Step S4001.

Step S7211

If the sequencer 111 determines that the result of the second program verification operation is not a pass (NO in Step S7210), the sequencer 111 counts up the number of loops relating to the second program operation.

Subsequently, the sequencer 111 counts up the number of loops and then determines whether or not the number of loops of the second program operation is the set value (LValue_II).

If the sequencer 111 determines that the number of loops is the set value (LValue_II) (YES in Step S7211), the sequencer 111 performs Step S4001.

Step S7212

If the sequencer 111 determines that the number of loops is not the set value (LValue_II) (NO in Step S7211), the sequencer 111 increments the voltage VPGM_II to be used in the second program operation by the voltage DVPGM.

<2> Second Embodiment

A second embodiment will be described. In the second embodiment, a case where a memory cell transistor stores 8-value data will be described. A basic configuration and a basic operation of the memory device of the second embodiment are the same as the memory device of the first embodiment described above. Therefore, description of properties described in the first embodiment above and properties which can be estimated easily from the first embodiment will be omitted.

<2-1> Threshold Voltage Distribution of Memory Cell Transistor

<2-1-1> Relationship Between Threshold Voltage Distribution of Memory Cell Transistor and Data Referring now to FIG. 73, a relationship between a threshold voltage distribution of the memory cell transistor and data will be described.

Figure 73:
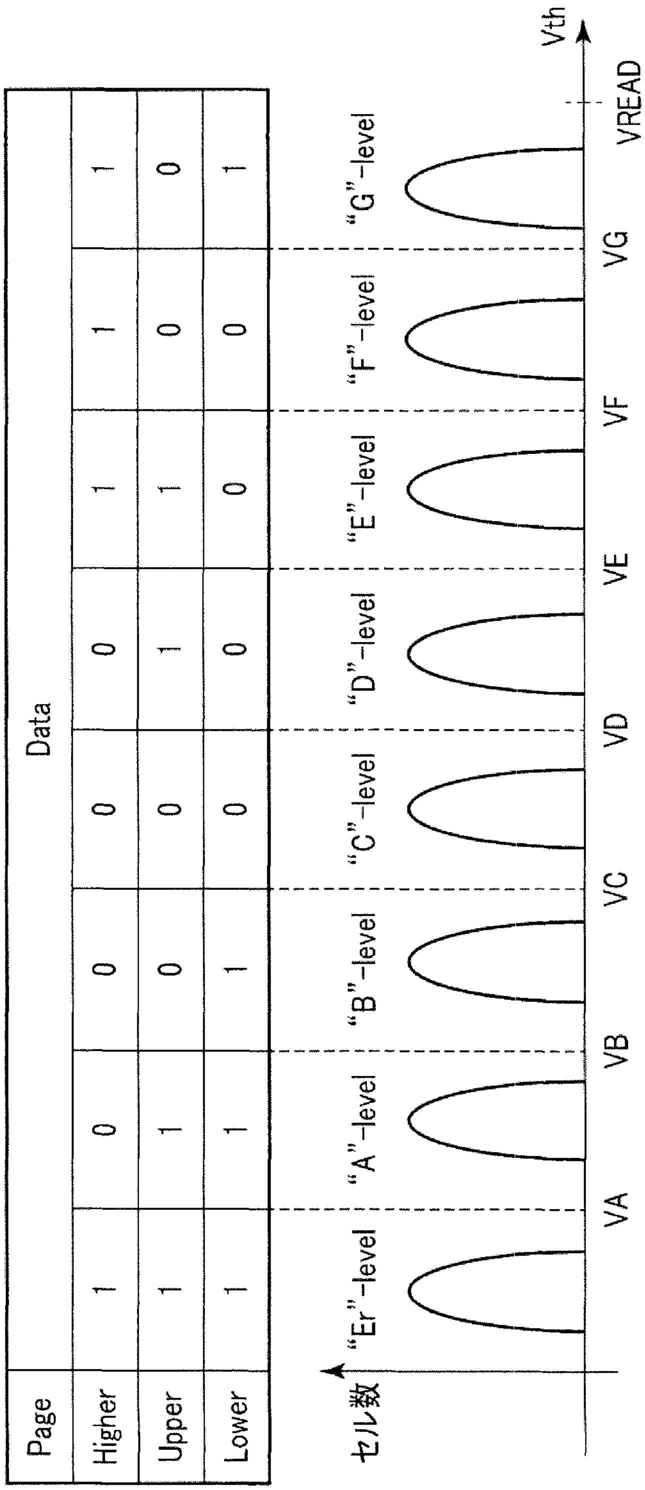
FIG. 73 is a drawing showing a distribution of threshold voltages that a memory cell transistor in a semiconductor memory device according to a second embodiment may have.

In the example illustrated in FIG. 73, each memory cell transistor MT is capable of retaining data of, for example, 3 bits in accordance with the threshold voltage thereof. The 3-bit data includes, for example, "111", "011", "001", "000", "010", "110", "100" and "101" from an ascending order in the threshold voltage.

The threshold voltage of the memory cell transistor MT retaining "111" data is in a certain distribution, and the threshold voltage distribution corresponding to the "111" data is referred to as "Er"-level. The "Er"-level is a threshold voltage distribution in a state in which charge stored in a charge storage layer has been removed and thus data is considered to be erased, and is a positive or negative voltages (for example, lower than voltage VA).

"011", "001", "000", "010", "110" "100", and "101" are each a threshold voltage distribution in a state in which the charge has been injected into the charge storage layer and thus data is considered to be written therein.

The threshold voltage of the memory cell transistor MT that retains "011" data is within a distribution of an "A"-level, and is higher than the threshold voltage in the "Er"-level (for example, higher than voltage VA and lower than voltage VB, where VA<VB).

The threshold voltage of the memory cell transistor MT that retains "001" data is within a distribution of a "B"-level, and is higher than the threshold voltage in the "A"-level (for example, higher than voltage VB and lower than voltage VC, where VB<VC).

The threshold voltage of the memory cell transistor MT that retains "000" data is within a distribution of a "C"-level, and is higher than the threshold voltage in the "B"-level (for example, higher than voltage VC and lower than voltage VD, where VC<VD).

The threshold voltage of the memory cell transistor MT that retains "010" data is within a distribution of a "D"-level, and is higher than the threshold voltage in the "C"-level (for example, higher than voltage VD and lower than voltage VE, where VD<VE).

The threshold voltage of the memory cell transistor MT that retains "110" data is within a distribution of an "E"-level, and is higher than the threshold voltage in the "D"-level (for example, higher than voltage VE and lower than voltage VF, where VE<VF).

The threshold voltage of the memory cell transistor MT that retains "100" data is within a distribution of an "F"-level, and is higher than the threshold voltage in the "E"-level (for example, higher than voltage VF and lower than voltage VG, where VF<VG).

The threshold voltage of the memory cell transistor MT that retains "101" data is within a distribution of a "G"-level, and is higher than the threshold voltage in the "F"-level (for example, higher than the voltage VG).

The relationship between the 3-bit data and the threshold voltage is not limited thereto, and, for example, a case where "111" data corresponds to the "G"-level is also applicable. The relationship therebetween may be selected as needed.

<2-1-2> Change in threshold voltage distribution of Memory Cell Transistor during Write Operation Referring now to FIG. 74, a change of the threshold voltage distribution of the memory cell transistor and data during the write operation will be described.

Figure 74:
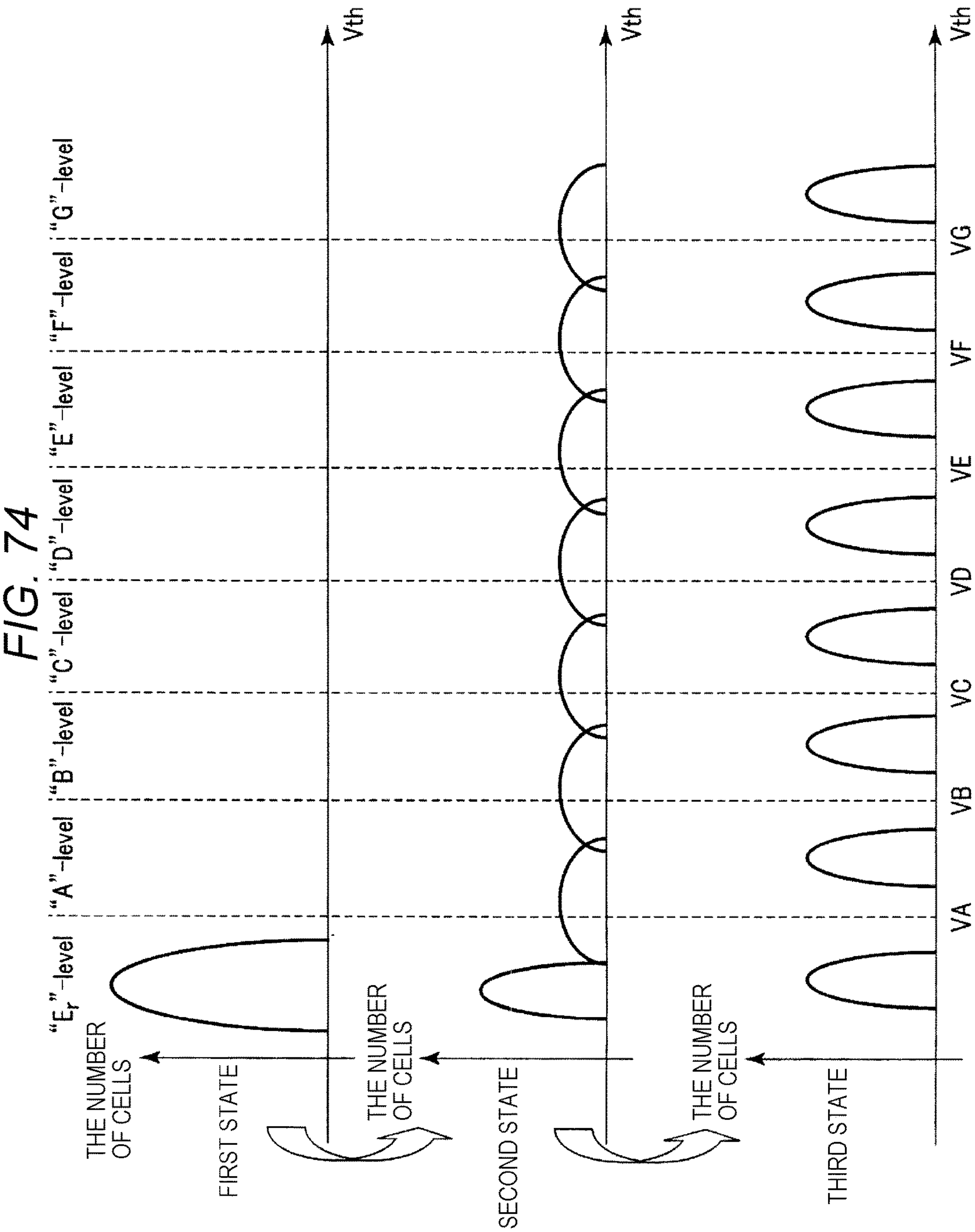
FIG. 74 is a drawing showing changes in the threshold voltage distribution that the memory cell transistor may undergo.

Before the write operation is performed, the threshold voltage distribution of all the memory cells MC in the block assumes an erased state ("Er"-level) illustrated in FIG. 74 by erase of the block in advance (first state).

When the write operation is performed, the threshold voltage distribution of the erased state ("Er"-level) is changed to the threshold distribution as in a second state. In the second state, the threshold distributions of the "Er"-level, the "A"-level, the "B"-level, the "C"-level, the "D"-level, the "E"-level, the "F"-level, and the "G"-level are distributed in such a manner that the adjacent threshold voltage distributions overlap with each other, and at this point, the write operation is not completed. When the write operation further proceeds, the threshold voltage distribution in the second state is changed to an eight-value threshold distribution as in a third state. As described thus far, the write operation needs to be repeated until the eight-value threshold voltage distribution as in the third state is achieved.

It is noted that although the threshold voltage distribution has been described as being transitioned from the first state to the second state in FIG. 74, and further transitioned from the second state to the third state during the write operation, a writing method is not limited thereto. Specifically, a writing method which causes transition from the first state to the third state is also applicable.

<2-2> Operation

<2-2-1> Example of Order of Performance of Program Operation and Program Verification Operation In the following, the order of performance of the program operation and the program verification operation will be described with reference to FIG. 75.

Figure 75:
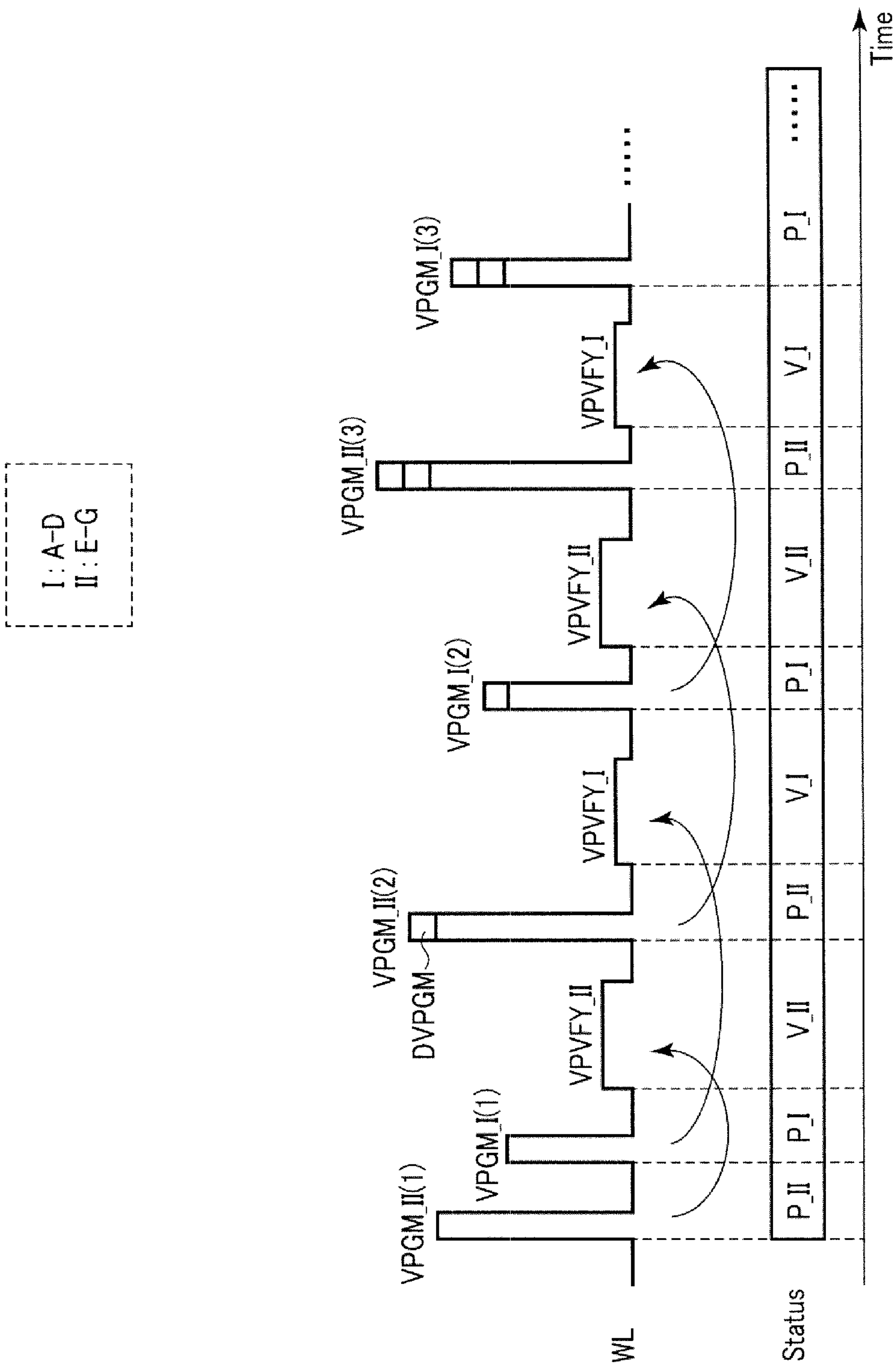
FIG. 75 is a waveform chart schematically showing a waveform of the word line during the write operation.

For easy understanding, FIG. 75 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the second embodiment is divided into first and second write operations. It is noted that there are many ways of grouping the first and the second write operations. An example is presented in this example.

The first write operation is the write operations for the "A", "B", "C", and "D" levels. The second write operation is the write operations for the levels "E", "F", "G", and "H".

The first write operation includes a first program operation (P_I) relating to writing for the levels "A", "B", "C", and "D", and a first program verification operation (V_I) that determines whether or not the first program operation has passed.

The second write operation includes the second program operation (P_II) relating to writing for the levels "E", "F", "G", and "H" and the second program verification operation (V_II) that determines whether or not the second program operation has passed.

The sequencer 111 increments the voltage VPGM_I (n) by a voltage DVPGM every time the first program operation is performed. In the same manner, the sequencer 111 increments the voltage VPGM_II (n) by the voltage DVPGM every time the second program operation is performed.

An order of performance of the program operation and the program verification operation illustrated in FIG. 75 is basically the same as the order of performance of the program operation and the program verification operation described in conjunction with FIG. 17.

A method of generating the order of performance of the program operation and the program verification operation illustrated in FIG. 75 is the same as the method described with reference to FIG. 18.

<2-3> Specific Example

Subsequently, the specific example of the write operation relating to the memory system of the second embodiment will be described.

<2-3-1> Example of Memory Cell Transistor as Writing Destination

Figure 76:
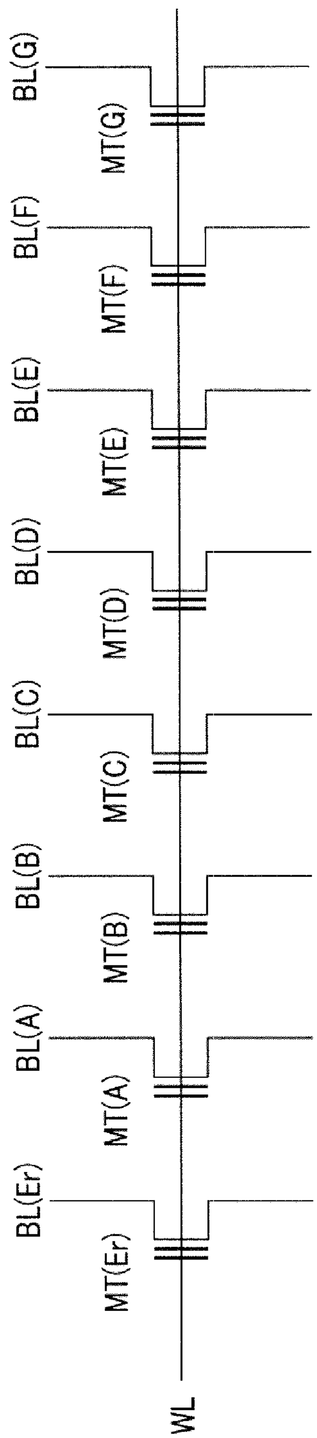
FIG. 76 is a drawing schematically illustrating a memory cell transistor which executes the write operation.

As illustrated in FIG. 76, in this specific example, a case where any one of the "Er"-level, the "A"-level, the "B"-level, the "C"-level, the "D"-level, the "E"-level, the "F"-level, and the "G"-level is written in the plurality of memory cell transistors MT connected commonly to one word line WL will be described for easy understanding. Here, the bit line (Er) is connected to the memory cell transistor MT (Er) in which data of the "Er"-level is written, the bit line BL (A) is connected to the memory cell transistor MT (A) to which data of the "A"-level is written, the bit line BL(B) is connected to the memory cell transistor MT (B) in which data of the "B"-level is written, and the bit line BL (C) is connected to the memory cell transistor MT (C) in which data of the "C"-level is written. In the same manner, the bit line BL (D) is connected to the memory cell transistor MT (D) in which data of the "D"-level is written, the bit line BL (E) is connected to the memory cell transistor MT (E) to which data of the "E"-level is written, the bit line BL(F) is connected to the memory cell transistor MT (F) in which data of the "F"-level is written, and the bit line BL (G) is connected to the memory cell transistor MT (G) in which data of the "G"-level is written.

It is noted that the plurality of memory cell transistors do not necessarily have to be commonly connected to one word line WL in this example. In other words, the same operation may be applied also to a case where the plurality of memory cell transistors are connected to different word lines WL.

<2-3-2> Specific Example of Pulse

Subsequently, referring now to FIG. 77 and FIG. 78, a specific example of the pulse for a case where the write operation of the second embodiment is applied to the memory cell transistors MT described above will be described. The basic operations are the same as those described with reference to FIG. 20 and FIG. 21.

Figure 77:
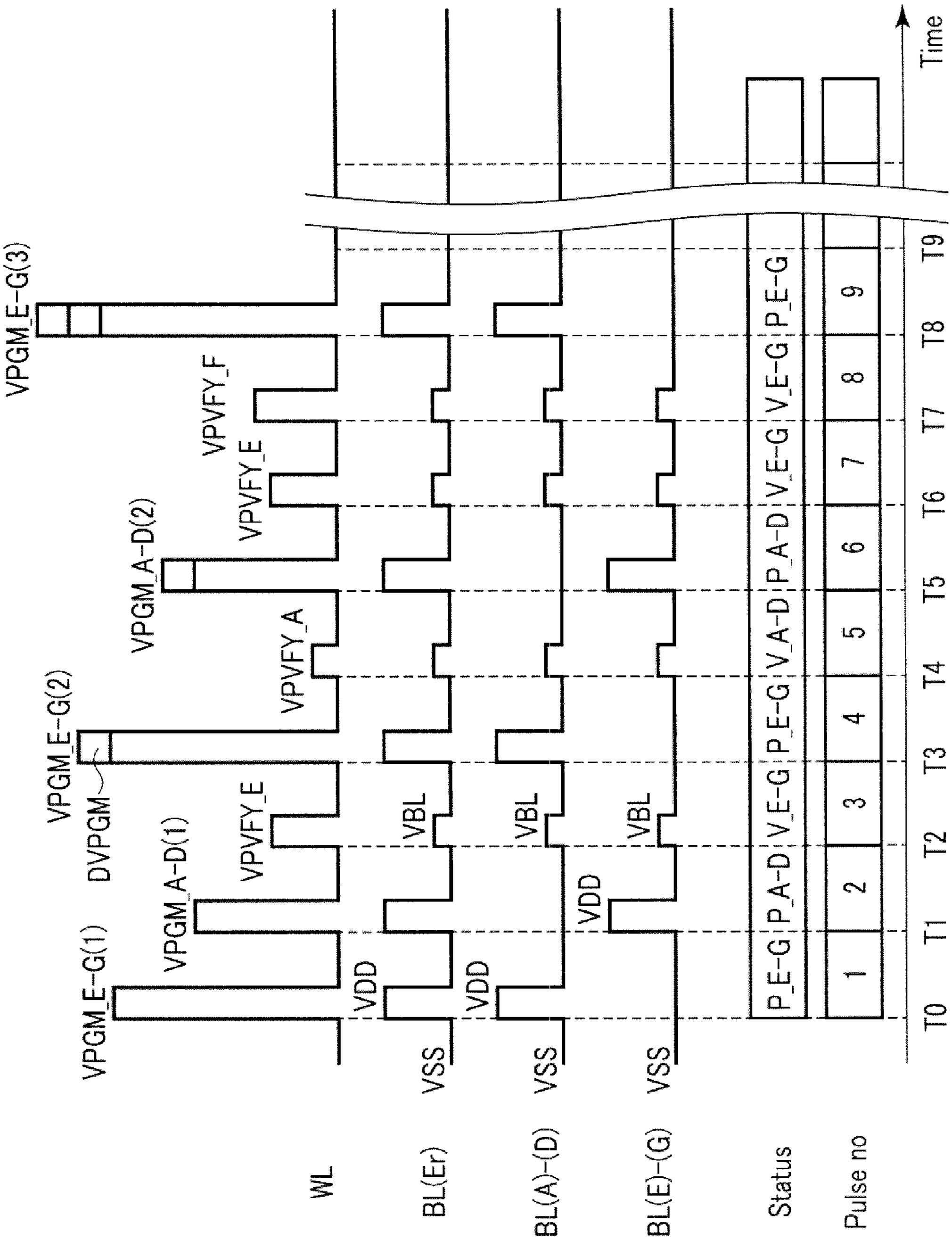
FIG. 77 is a waveform chart showing an example of voltages to be applied to the word lines and the bit lines during the write operation.

FIG. 77 and FIG. 78 illustrate a pulse of (i) and a pulse of (ii), which are roughly classified pulse categories, as described in conjunction with FIG. 20 and FIG. 21.

In the example illustrated in FIG. 77 and FIG. 78, pulses corresponding to the pulse Nos. 1 to 3, 5, 8, 11, 15, 19, and 26 correspond to the pulses of (i).

In the example illustrated in FIG. 77 and FIG. 78, pulses corresponding to the Pulse other than No. 1 to 3, 5, 8, 11, 15, 19, and 26 correspond to the pulses of (ii).

<2-4> Advantageous Effects

According to the first embodiment described above, the memory system 1 does not perform the first program verification operation immediately after the first program operation, and the second program verification operation is not performed immediately after the second program operation. Consequently, the same advantageous effects as those of the first embodiment are achieved.

<2-5> Modified Example 1 of Second Embodiment

A modified example 1 of the second embodiment will be described. In the modified example 1 of the second embodiment, a case where a data reading method different from the reading method described above is employed in the second embodiment will be described.

<2-5-1> Read Operation

Subsequently, the data read operation according to the modified example 1 of the second embodiment will be described with reference to FIG. 79.

During read operation, the sequencer 111 applies a voltage VREAD which turns the memory cell transistor MT ON to the non-selected word lines WL irrespective of retained data. In addition, the voltage VSG which turns the selected transistors ST1 and ST2 ON is applied to the select gate lines SGD and SGS. The voltage of the selected word line rises continuously as illustrated in FIG. 79.

Data is read at the timing when the voltage of the selected word line WL reaches the VA. In other words, as illustrated in FIG. 79, determination is performed whether the threshold voltage of the memory cell transistor MT is included in the "Er"-level, or is included in distribution at the "A"-level or higher (This operation is referred to as "read operation AR"). Then, the result of determination is transferred to the latch circuit 17 (AR strobe).

Subsequently, at the timing when the voltages of the selected word line WL reaches VB, determination is performed whether the threshold voltage of the memory cell transistor MT is within a distribution of the "A"-level or lower, or within a distribution of the "B"-level or higher (this operation is referred to as "read operation BR"). Then, the result of determination is transferred to the latch circuit 17 (BR strobe).

Furthermore, at the timing when the voltages of the selected word line WL reaches VC, determination is performed whether the threshold voltage of the memory cell transistor MT is within the "C"-level, or within a distribution of the "D"-level or higher (this operation is referred to as "read operation CR"). Then, the result of determination is transferred to the latch circuit 17 (CR strobe).

At the timing when the voltages of the selected word line WL reaches VD, determination is performed whether the threshold voltage of the memory cell transistor MT is within a distribution of the "D"-level or lower, or within a distribution of the "E"-level or higher (this operation is referred to as "read operation DR"). Then, the result of determination is transferred to the latch circuit 17 (DR strobe).

Furthermore, at the timing when the voltages of the selected word line WL reaches VE, determination is performed whether the threshold voltage of the memory cell transistor MT is within the "E"-level, or within a distribution of the "F"-level or higher (this operation is referred to as "read operation ER"). Then, the result of determination is transferred to the latch circuit 17 (ER strobe).

At the timing when the voltages of the selected word line WL reaches VF, determination is performed whether the threshold voltage of the memory cell transistor MT is within a distribution of the "F"-level or lower, or within a distribution of the "G"-level or higher (this operation is referred to as "read operation FR"). Then, the result of determination is transferred to the latch circuit 17 (FR strobe).

Furthermore, at the timing when the voltages of the selected word line WL reaches VG, determination is performed whether the threshold voltage of the memory cell transistor MT is within the "G"-level, or within a distribution of the "F"-level or lower (this operation is referred to as "read operation CG"). Then, the result of determination is transferred to the latch circuit 17 (GR strobe).

As described in the modified example 1 of the first embodiment, when driving the selected word line WL via the row decoder 150, variations of voltage differ depending on the location of the memory cell transistor MT.

Figure 79:
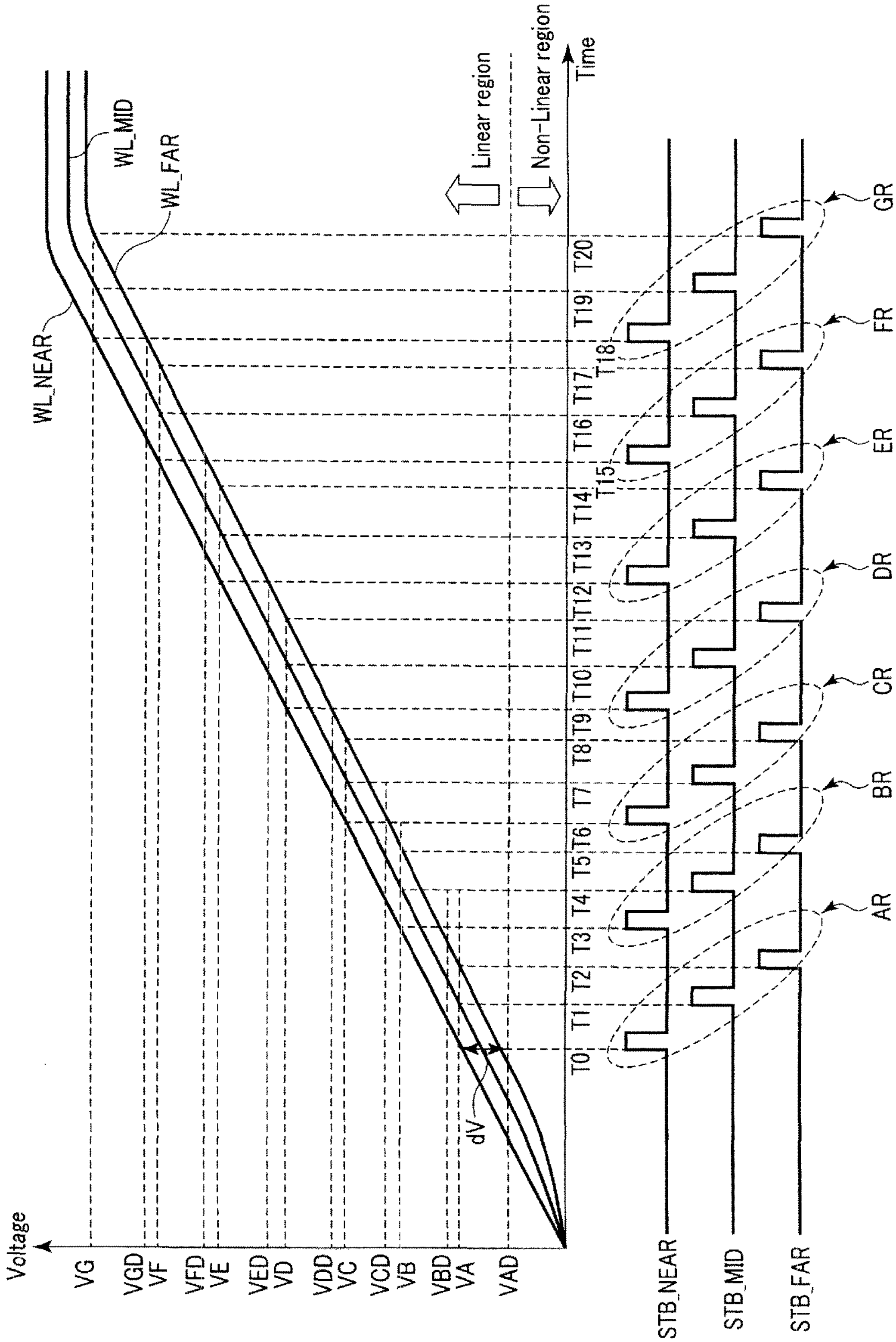
FIG. 79 is a timing chart showing the change in the word line voltage during a read operation and the strobe signal.

Therefore, as illustrated in FIG. 79, the signal STB NEAR is asserted ("H" level) at the time T0. Therefore, data read from the memory cell transistor MT corresponding to the group GP1 is strobed at the time T0. The signal STB_MID is asserted at the time T1. Therefore, data read from the memory cell transistor MT corresponding to the group GP2 is strobed at the time T1. Subsequently, the signal STB_FAR is asserted at the time T2. Therefore, data read from the memory cell transistor MT corresponding to the group GP3 is strobed at the time T2.

As described above, the AR strobe is performed at the timings of Time T0, T1, and T2 depending on the location of the memory cell transistor MT. The same applies to the read operations BR, CR, DR, ER, FR, and GR.

This example may be applied to the example according to the second embodiment.

<2-6> Modified Example 2 of Second Embodiment

A modified example 2 of the second embodiment will be described. In the modified example 2 of the second embodiment, a case where a writing method different from the data writing method described above is employed in the second embodiment will be described.

<2-6-1> Operation

<2-6-1-1> Example of Order of Performance of Program Operation and Program Verification Operation In the following, the order of performance of the program operation and the program verification operation will be described with reference to FIG. 80.

Figure 80:
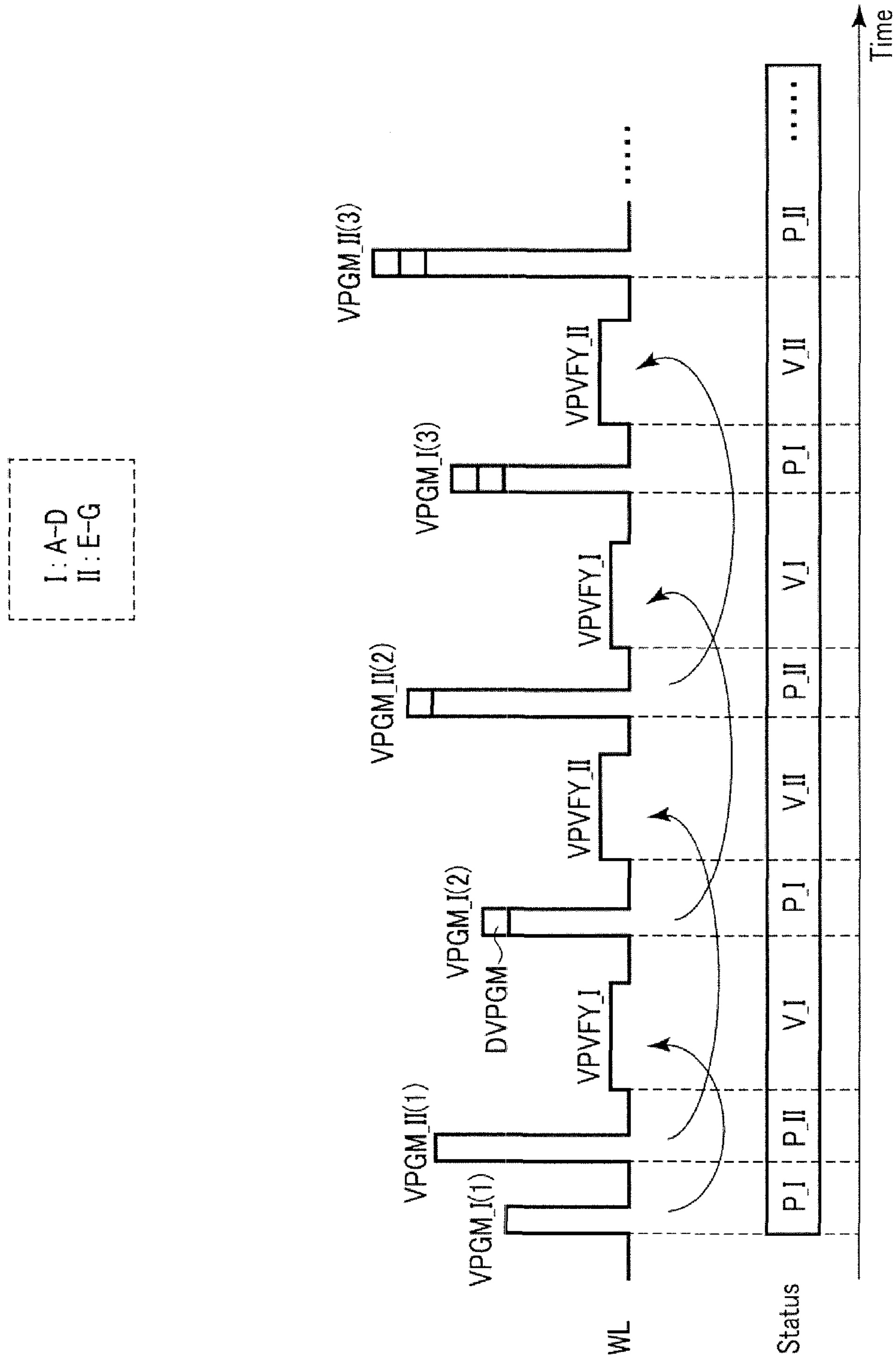
FIG. 80 is a waveform chart schematically showing a waveform of the word line during the write operation.

For easy understanding, FIG. 80 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 2 of the second embodiment is divided into first and second write operations in the same manner as the second embodiment.

In the second embodiment, the second program operation is performed, and then the first program operation is performed. However, as illustrated in FIG. 80, in the modified example 2 of the second embodiment, the first program operation is performed first, and then the second program operation is performed. In this manner, in the modified example 2 of the second embodiment, an operation in which the order of performance of the first write operation and the second write operation is inverted is performed.

A method of generating the order of performance of the program operation and the program verification operation is the same as the method described with reference to FIG. 28.

<2-6-2> Specific Example of Pulse

Subsequently, referring now to FIG. 81 and FIG. 82, a specific example of the pulse for a case where the write operation of the second embodiment is applied to the memory cell transistors MT described above will be described. The basic operations are the same as those described with reference to FIG. 20 and FIG. 21.

Figure 81:
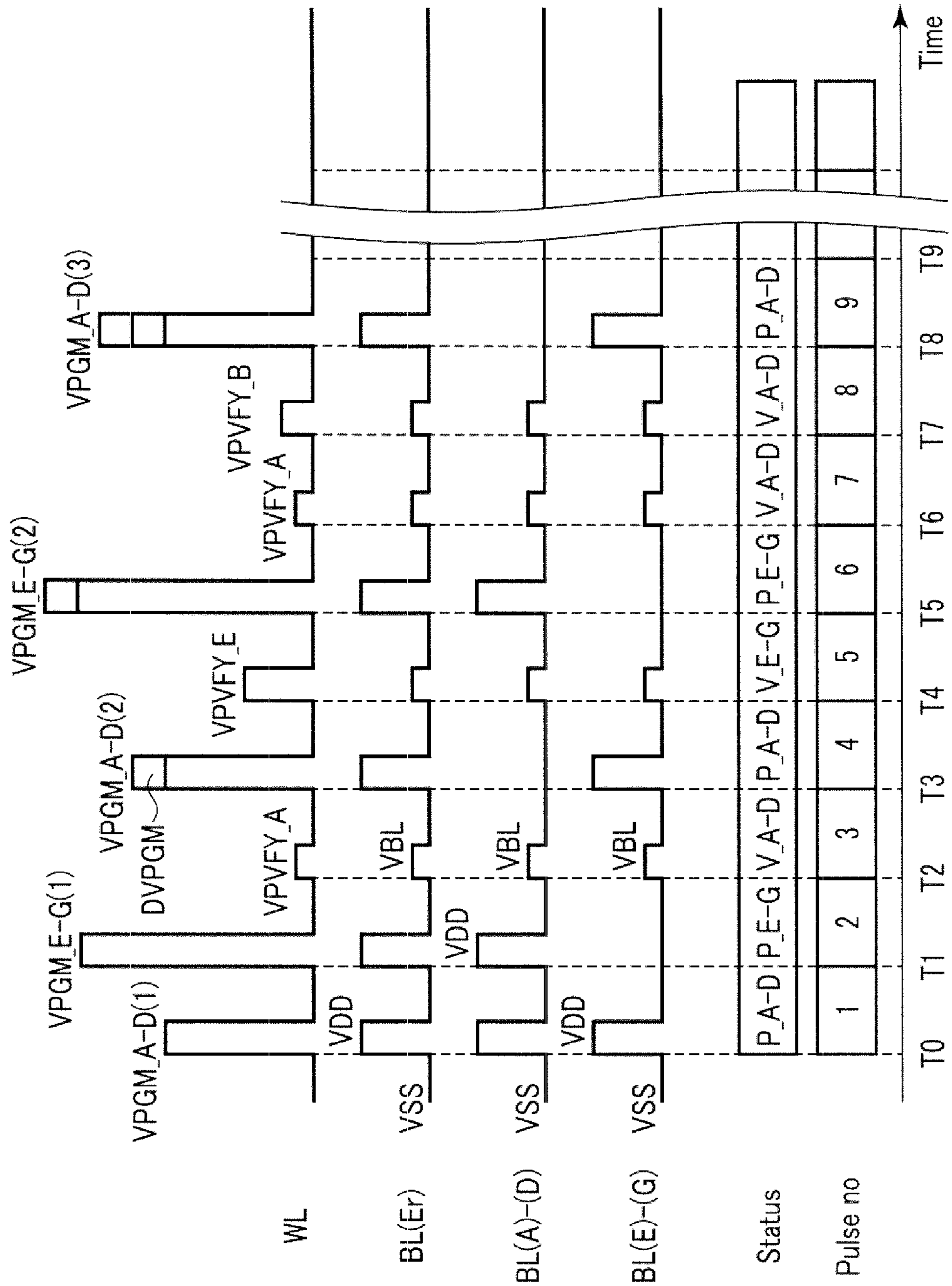
FIG. 81 is a waveform chart showing an example of voltages to be applied to the word lines and the bit lines during the write operation.

FIG. 81 and FIG. 82 illustrate a pulse of (i) and a pulse of (ii), which are roughly classified pulse categories, as described in conjunction with FIG. 20 and FIG. 21.

In the example illustrated in FIG. 81 and FIG. 82, pulses corresponding to the pulse Nos. 1 to 3, 5, 8, 11, 15, 19, and 23 correspond to the pulses of (i).

In the example illustrated in FIG. 81 and FIG. 82, pulses corresponding to the Pulse other than Nos. 1 to 3, 5, 8, 11, 15, 19, and 23 correspond to the pulses of (ii).

<2-7> Modified Example 3 of Second Embodiment

A modified example 3 of the second embodiment will be described. In the modified example 3 of the second embodiment, a case where a writing method different from the data writing method described above is employed in the second embodiment will be described.

<2-7-1> Operation

<2-7-1-1> Example of Order of Performance of Program Operation and Program Verification Operation In the following, the order of performance of the program operation and the program verification operation will be described with reference to FIG. 83.

Figure 83:
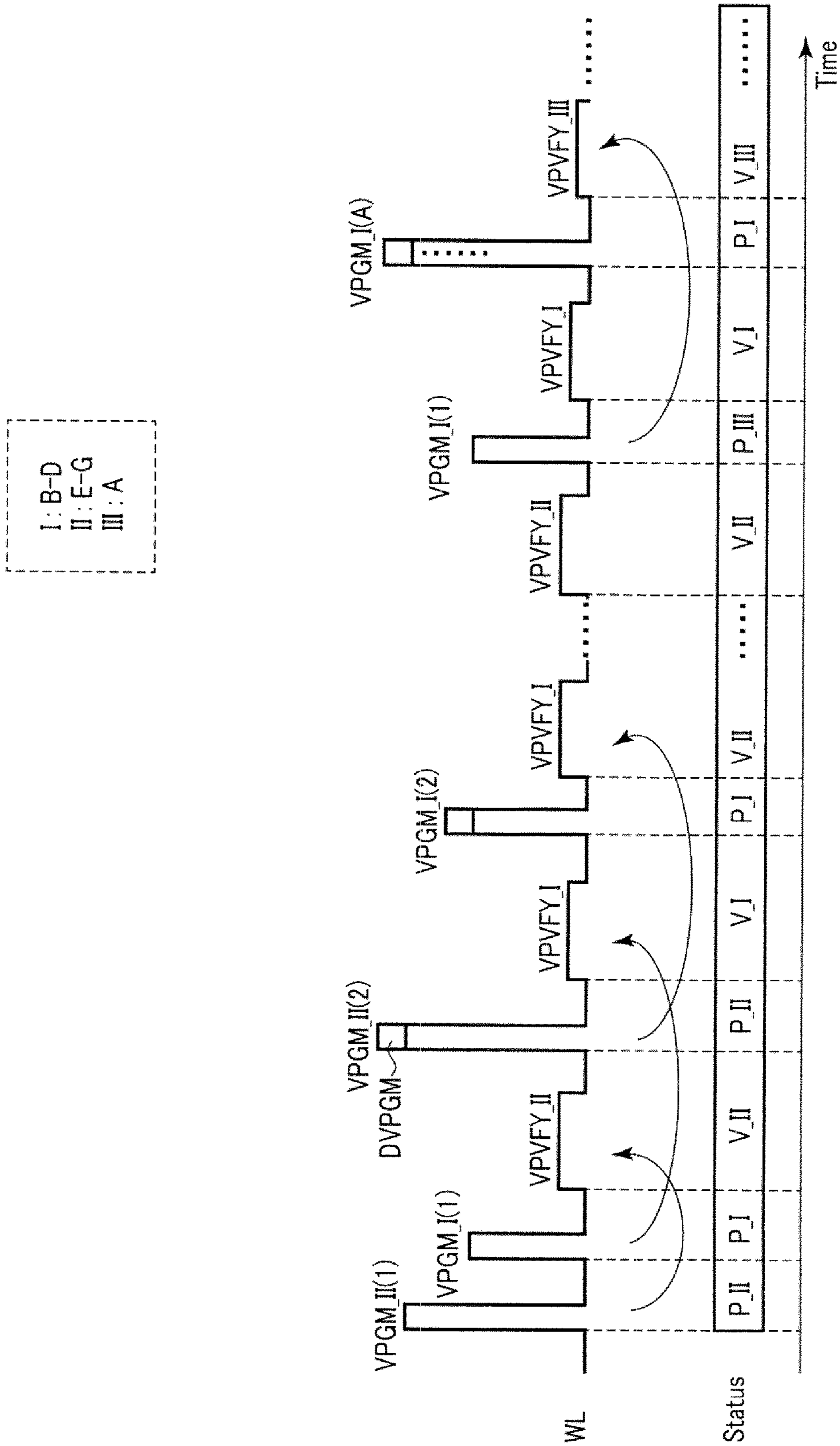
FIG. 83 is a waveform chart schematically showing a waveform of the word line during the write operation.

For easy understanding, FIG. 83 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 3 of the second embodiment is divided into first to third write operations.

The first write operation is the write operations for the "B", "C", and "D"-levels. The second write operation is the write operations for the "E", "F", and "G"-levels. The third write operation is a write operation for the "A"-level.

The first write operation includes a first program operation (P_I) relating to writing for the "B", "C", and "D"-levels, and a first program verification operation (V_I) that determines whether or not the first program operation has passed.

The second write operation includes the second program operation (P_II) relating to writing for the "E", "F", and "G"-levels and the second program verification operation (V_II) that determines whether or not the second program operation has passed.

The third write operation includes a third program operation (P_III) relating to writing for the "A"-level, and a third program verification operation (V_III) that determines whether or not the third program operation has passed.

The sequencer 111 increments the voltage VPGM_I (n) by a voltage DVPGM every time the first program operation is performed. In the same manner, the sequencer 111 increments the voltage VPGM_II (n) by the voltage DVPGM every time the second program operation is performed. In the same manner, the sequencer 111 increments the voltage VPGM_III (n) by the voltage DVPGM every time the third program operation is performed.

In the first program verification operation, the voltage VPVFY to be applied to the selected word line WL is expressed as voltage VPVFY_I. In the second program verification operation, the voltage VPVFY to be applied to the selected word line WL is expressed as voltage VPVFY_II. In the same manner, in the third program verification operation, the voltage VPVFY to be applied to the selected word line WL is expressed as voltage VPVFY_III.

In the example illustrated in FIG. 83, control is performed so that the first program verification operation is not performed immediately after the first program operation, the second program verification operation is not performed immediately after the second program operation, and the third program verification operation is not performed immediately after the third program operation. The third program operation is performed after conditions have been satisfied.

A method of generating the order of performance of the program operation and the program verification operation is the same as the method described with reference to FIG. 34 to FIG. 49.

<2-7-2> Specific Example of Pulse

Subsequently, referring now to FIG. 84 and FIG. 85, a specific example of the pulse for a case where the write operation of the second embodiment is applied to the memory cell transistors MT described above will be described. The basic operations are the same as those described with reference to FIG. 20 and FIG. 21.

Figure 84:
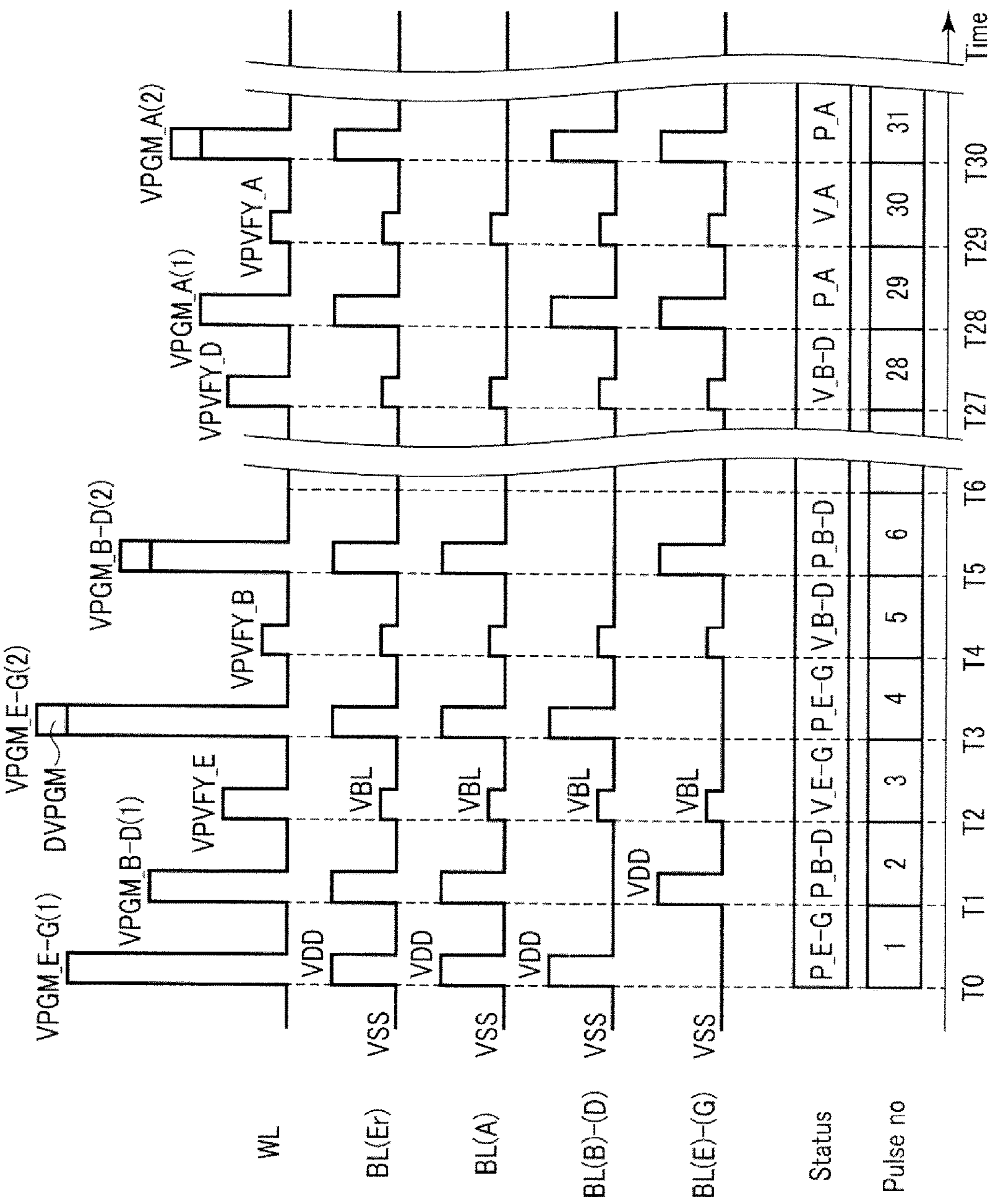
FIG. 84 is a waveform chart showing an example of voltages to be applied to the word lines and the bit lines during the write operation.

FIG. 84 and FIG. 85 illustrate a pulse of (i) and a pulse of (ii), which are roughly classified pulse categories, as described in conjunction with FIG. 20 and FIG. 21.

In the example illustrated in FIG. 84 and FIG. 85, pulses corresponding to the pulse Nos. 1 to 3, 5, 8, 11, 15, and 19 correspond to the pulses of (i).

In the example illustrated in FIG. 84 and FIG. 85, pulses corresponding to the Pulse other than No. 1 to 3, 5, 8, 11, 15, and 19 correspond to the pulses of (ii).

As described above, the sequencer 111 determines whether or not the condition is satisfied during the write operation. If the sequencer 111 determines that the condition is satisfied, the sequencer 111 performs the third program operation. Specifically, for example, the sequencer 111 determines that the condition is satisfied after a pulse having a pulse no. 28 (Pulse No=28) has been applied, and thus the sequencer 111 starts the third program operation at the pulse no. 29 (Pulse No=29).

<2-8> Modified Example 4 of Second Embodiment

A modified example 4 of the second embodiment will be described. In the modified example 4 of the second embodiment, a case where a writing method different from the data writing method described above is employed in the second embodiment will be described.

<2-8-1> Operation

<2-8-1-1> Example of Order of Performance of Program Operation and Program Verification Operation In the following, the order of performance of the program operation and the program verification operation will be described with reference to FIG. 86.

Figure 86:
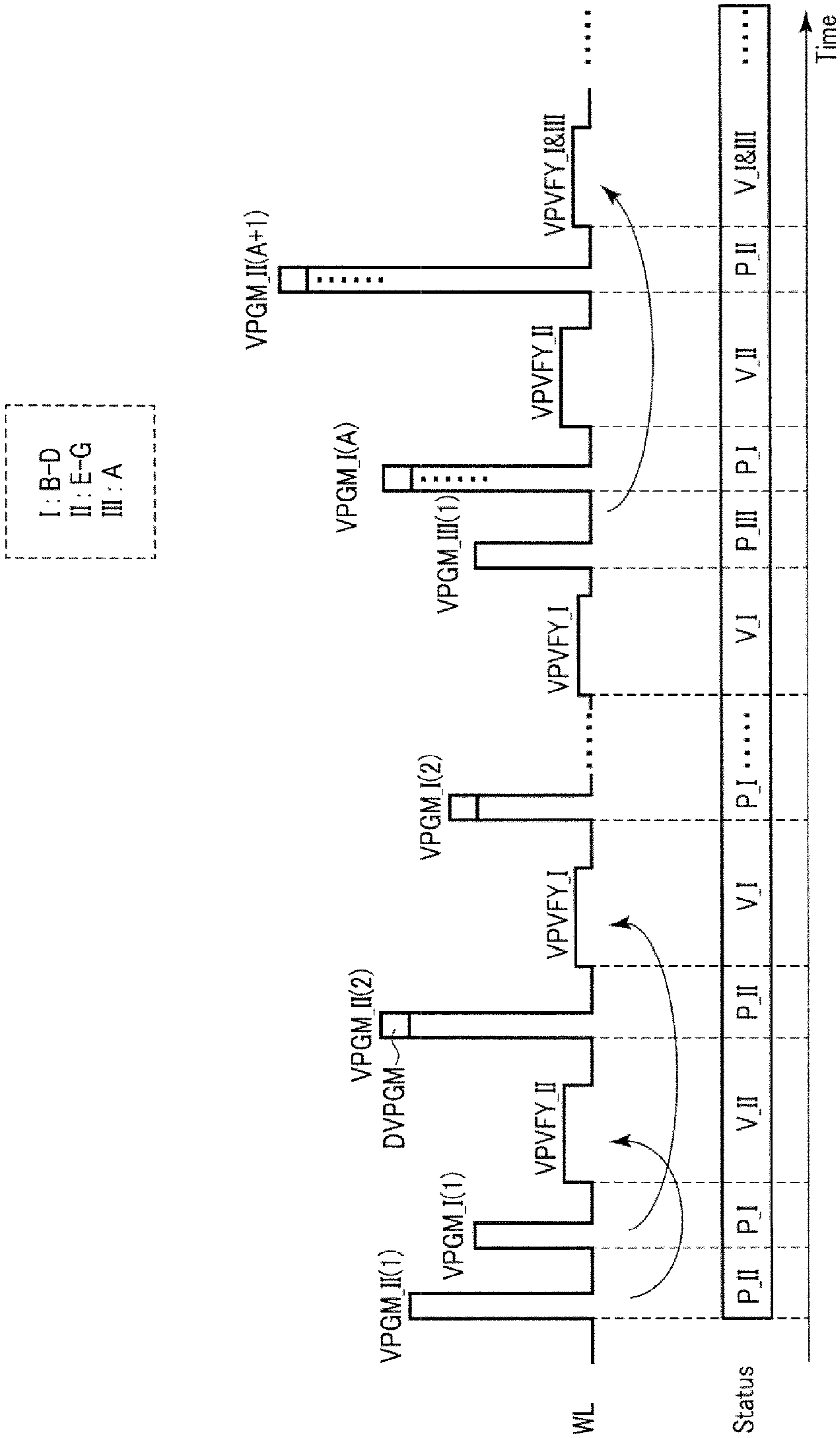
FIG. 86 is a waveform chart schematically showing a waveform of the word line during the write operation.

For easy understanding, FIG. 86 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 4 of the second embodiment is divided into first to third write operations in the same manner as the modified example 3 of the second embodiment.

The modified example 4 of the second embodiment is different from the modified example 3 of the second embodiment in that the first program operation is performed immediately after the third program operation.

A method of generating the order of performance of the program operation and the program verification operation is the same as the method described with reference to FIG. 53 to FIG. 54.

<2-8-2> Specific Example of Pulse

Subsequently, referring now to FIG. 87 and FIG. 88, a specific example of the pulse for a case where the write operation of the second embodiment is applied to the memory cell transistors MT described above will be described. The basic operations are the same as those described with reference to FIG. 20 and FIG. 21.

Figure 87:
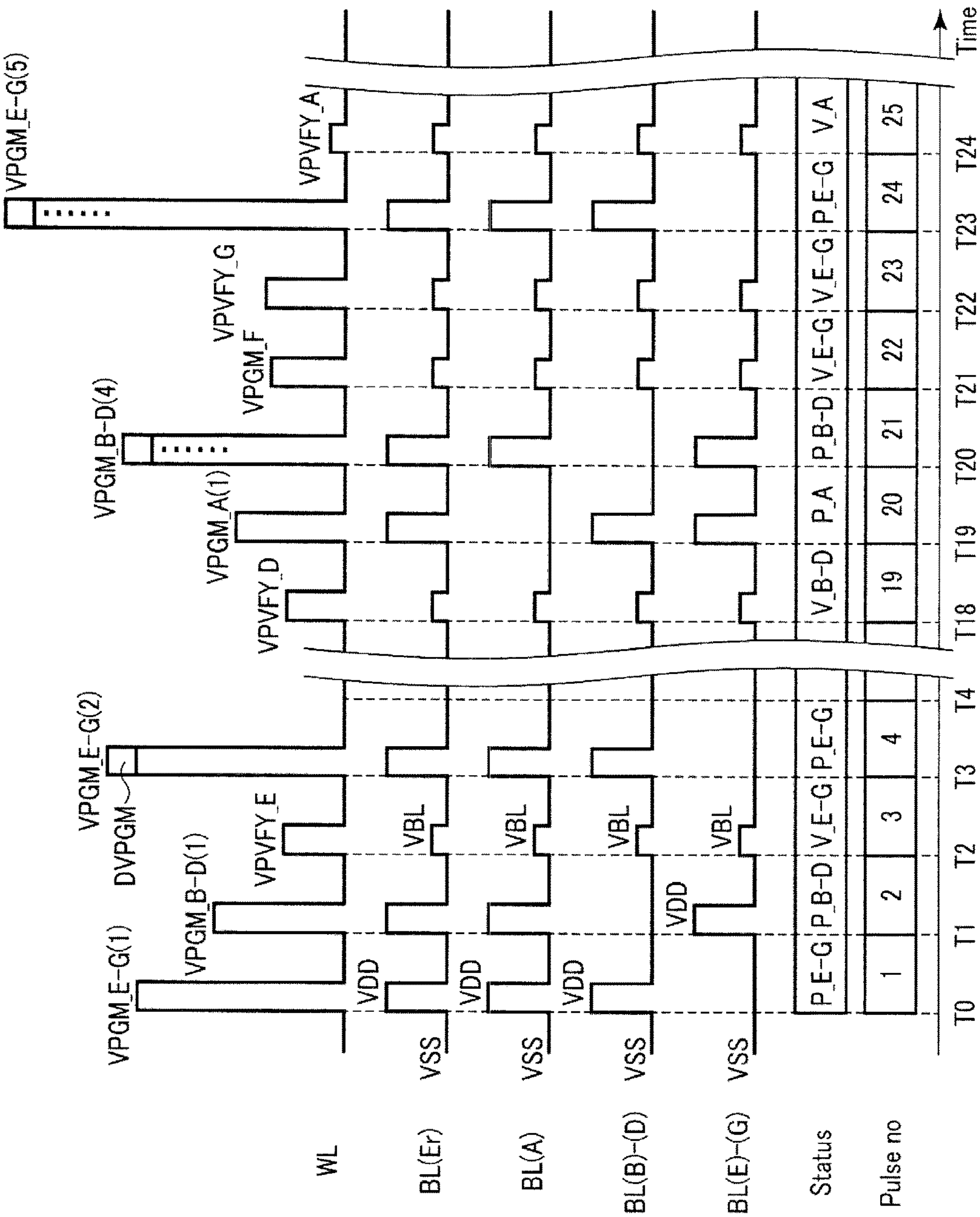
FIG. 87 is a waveform chart showing an example of voltages to be applied to the word lines and the bit lines during the write operation.

FIG. 87 and FIG. 88 illustrate a pulse of (i) and a pulse of (ii), which are roughly classified pulse categories, as described in conjunction with FIG. 20 and FIG. 21.

In the example illustrated in FIG. 87 and FIG. 88, pulses corresponding to the pulse Nos. 1 to 3, 5, 8, 11, 15, and 19 correspond to the pulses of (i).

In the example illustrated in FIG. 87 and FIG. 88, pulses corresponding to the Pulse other than No. 1 to 3, 5, 8, 11, 15, and 19 correspond to the pulses of (ii).

As described above, the sequencer 111 determines whether or not the condition is satisfied during the write operation. If the sequencer 111 determines that the condition is satisfied, the sequencer 111 performs the third program operation. Specifically, for example, the sequencer 111 determines that the condition is satisfied after a pulse having the pulse no. 19 (Pulse No=19) has been applied, and thus the sequencer 111 starts the third program operation at a pulse no. 20 (Pulse No=20).

<2-9> Modified Example 5 of Second Embodiment

A modified example 5 of the second embodiment will be described. In the modified example 5 of the second embodiment, a case where a writing method different from the data writing method described above is employed in the second embodiment will be described.

<2-9-1> Example of Order of Performance of Program Operation and Program Verification Operation In the following, the order of performance of the program operation and the program verification operation will be described with reference to FIG. 89.

Figure 89:
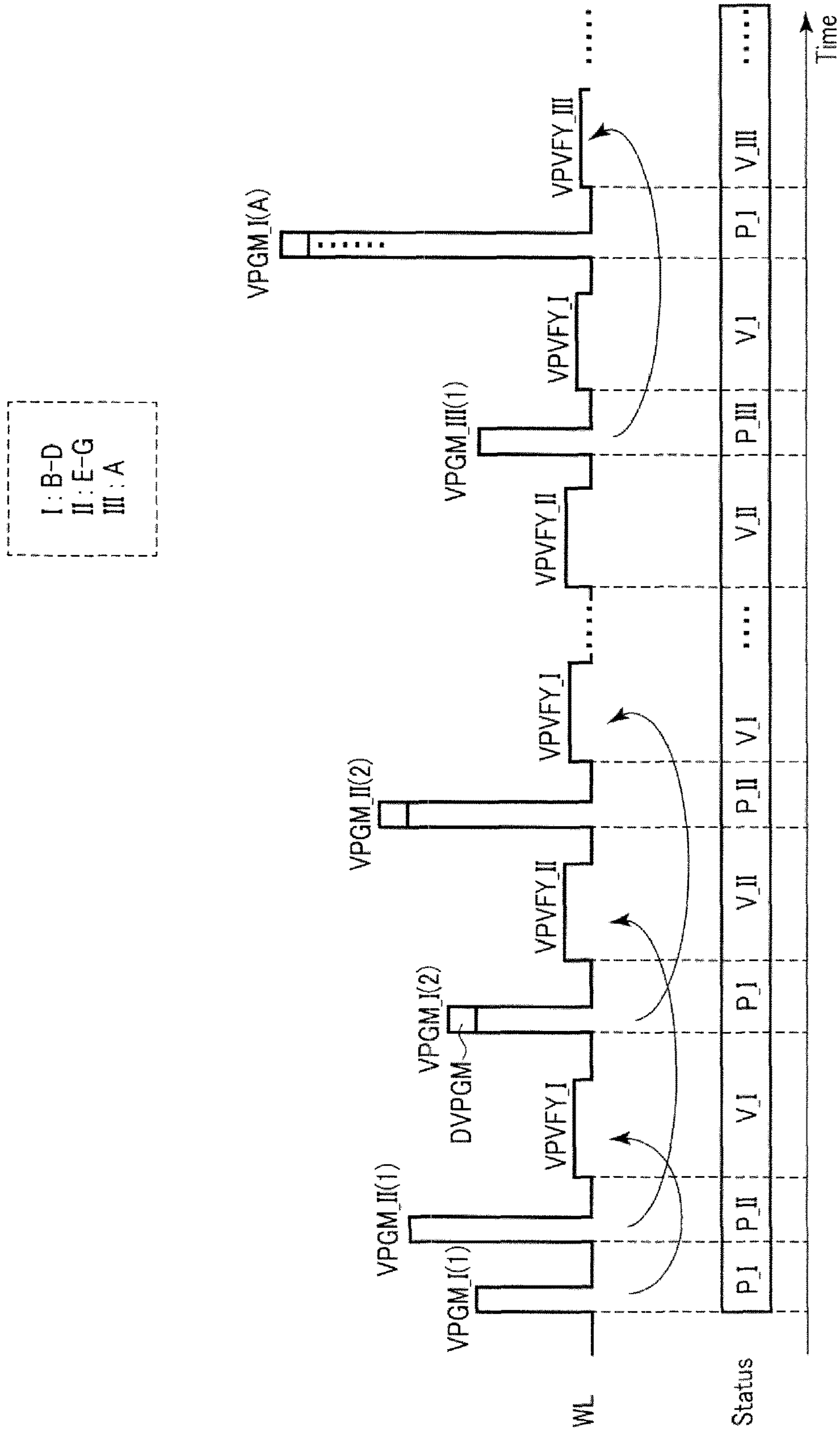
FIG. 89 is a waveform chart schematically showing a waveform of the word line during the write operation.

For easy understanding, FIG. 89 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 5 of the second embodiment is divided into first to third write operations in the same manner as the modified example 3 of the second embodiment.

The modified example 5 of the second embodiment is different from the modified example 3 of the second embodiment in that the order of the first write operation and the second write operation are inverted.

A method of generating the order of performance of the program operation and the program verification operation is the same as the method described with reference to FIG. 58.

<2-10> Modified Example 6 of Second Embodiment

A modified example 6 of the second embodiment will be described. In the modified example 6 of the second embodiment, a case where a data writing method different from the writing method described above is employed in the second embodiment will be described.

2-10-1> Operation

<2-10-1-1> Example of Order of Performance of Program Operation and Program Verification Operation In the following, the order of performance of the program operation and the program verification operation will be described with reference to FIG. 90.

Figure 90:
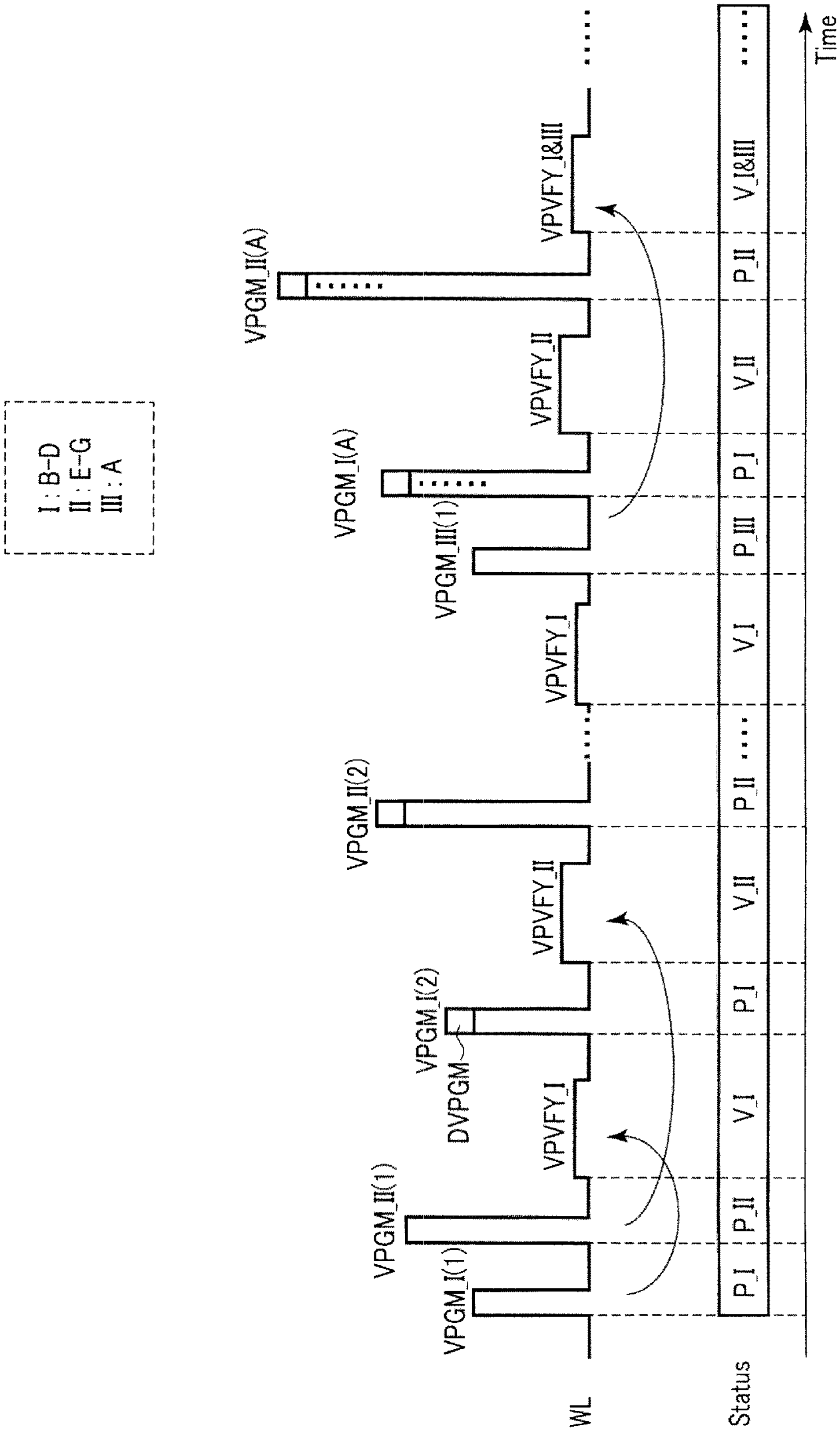
FIG. 90 is a waveform chart schematically showing a waveform of the word line during the write operation.

For easy understanding, FIG. 90 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 6 of the second embodiment is divided into first to third write operations in the same manner as the modified example 3 of the second embodiment.

The modified example 6 of the second embodiment is different from the modified example 5 of the second embodiment in that the first program operation is performed immediately after the third program operation.

A method of generating the order of performance of the program operation and the program verification operation is the same as the method described with reference to FIG. 60.

2-11> Modified Example 7 of Second Embodiment

A modified example 7 of the second embodiment will be described. In the modified example 7 of the second embodiment, a case where a writing method different from the data writing method described above is employed in the second embodiment will be described.

<2-11-1> Operation

<2-11-1-1> Example of Order of Performance of Program Operation and Program Verification Operation In the following, the order of performance of the program operation and the program verification operation will be described with reference to FIG. 91.

Figure 91:
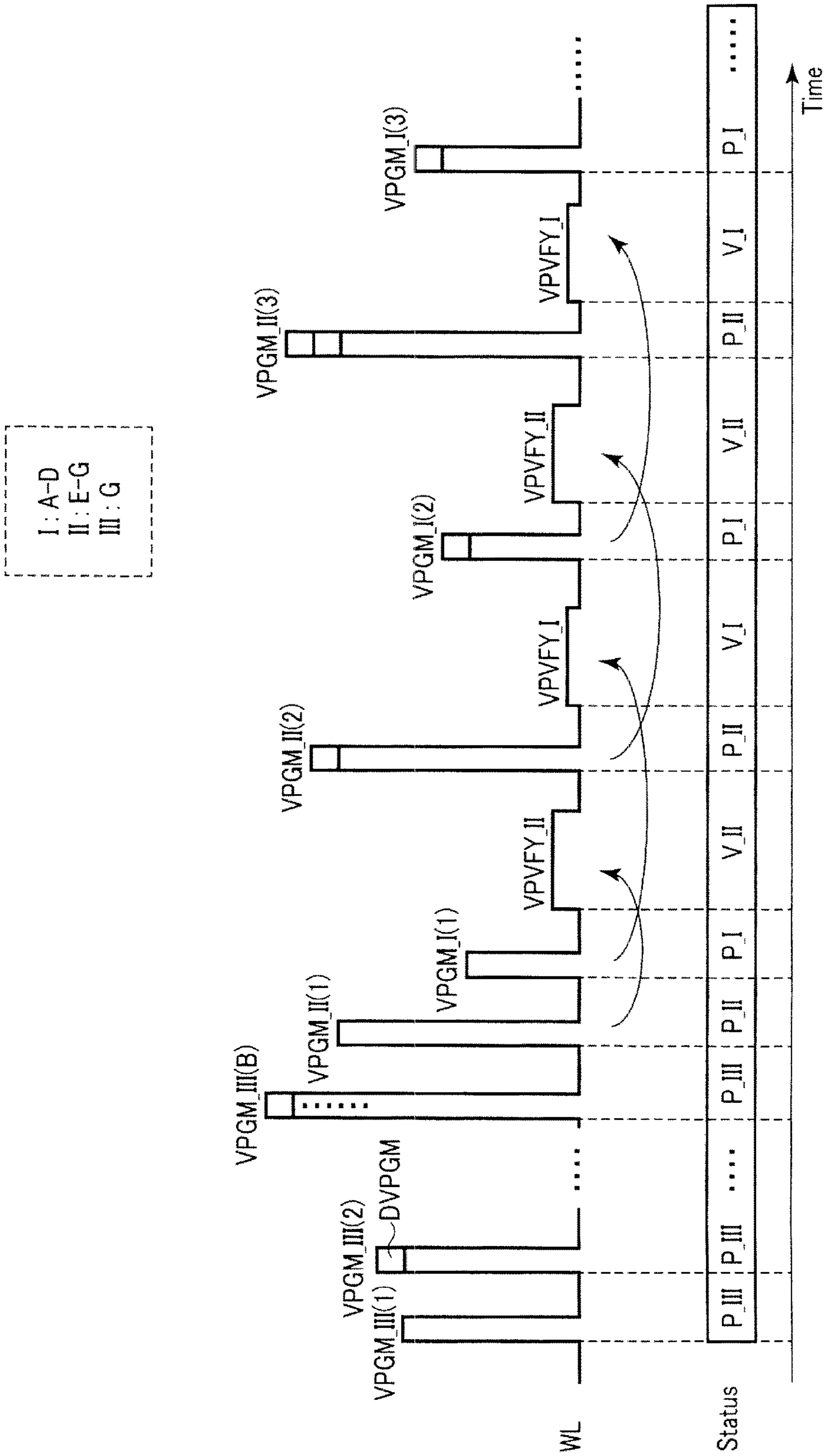
FIG. 91 is a waveform chart schematically showing a waveform of the word line during the write operation.

For easy understanding, FIG. 91 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 7 of the second embodiment is divided into first to third write operations.

The first write operation is the write operations for the "A", "B", "C", and "D"-levels. The second write operation is the write operations for the "E", "F", and "G"-levels. The third write operation is a write operation for the "G"-level.

The first write operation includes the first program operation (P_I) relating to writing for the "A", "B", "C", and "D"-levels, and the first program verification operation (V_I) that determines whether or not the first program operation has passed.

The second write operation includes the second program operation (P_II) relating to writing for the "E", "F", and "G"-levels and the second program verification operation (V_II) that determines whether or not the second program operation has passed.

The third write operation includes the third program operation (P_III) relating to writing for the "G"-level.

The sequencer 111 increments the voltage VPGM_I (n) by a voltage DVPGM every time the first program operation is performed. In the same manner, the sequencer 111 increments the voltage VPGM_II (n) by the voltage DVPGM every time the second program operation is performed.

The modified example 7 of the second embodiment is different from the second embodiment in that the third program operation is repeated by a predetermined number of times at the start of the write operation.

For example, in the example illustrated in FIG. 91, the sequencer 111 repeats the third program operation by B times (B is an arbitrary integer), and then performs the second program operation and the first program operation.

<2-11-1-2> Method of Generating Order of Performance of Program Operation and Program Verification Operation Referring now to FIG. 92, a method of generating the order of performance of the program operation and the program verification operation according to the modified example 7 of the second embodiment will be described.

Step S9201

The sequencer 111 performs the third program operation.

Step S9202

The sequencer 111 determines whether or not the condition is satisfied. For example, the "condition" in Step S9202 is the number of loops of the third program operation. In other words, the sequencer 111 determines whether or not the number of loops of the third program operation reaches the set value.

Step S9203

If the sequencer 111 determines that the condition is not satisfied (NO in Step S9202), the sequencer 111 increments the voltage VPGM_III to be used in the third program operation by the voltage DVPGM. Subsequently, Step S9201 is performed.

Step S9204

If the sequencer 111 determines that the condition is satisfied (YES in Step S9202), the sequencer 111 performs the second program operation.

Step S9205

The sequencer 111 performs the first program operation.

Step S9206

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S9207

The sequencer 111 determines whether or not the result of the second program verification operation is a pass.

If the sequencer 111 determines that the result of the second program verification operation is a pass (YES in Step S9207), the sequencer 111 performs Step S4001.

Step S9208

If the sequencer 111 determines that the result of the second program verification operation is not a pass (NO in Step S9207), the sequencer 111 counts up the number of loops relating to the second program operation.

Subsequently, the sequencer 111 counts up the number of loops and then determines whether or not the number of loops of the second program operation is the set value (LValue_II).

If the sequencer 111 determines that the number of loops is the set value (LValue_II) (YES in Step S9208), the sequencer 111 performs Step S4001.

Step S9209

If the sequencer 111 determines that the number of loops is not the set value (LValue_II) (NO in Step S9208), the sequencer 111 increments the voltage VPGM_II to be used in the second program operation by the voltage DVPGM.

Step S9210

The sequencer 111 performs the second program operation.

Step S9211

The sequencer 111 performs the first program verification operation after performing the second program operation.

In this manner, the sequencer 111 performs other operations between the first program operation and the first program verification operation. Accordingly, the sequencer 111 is capable of performing the program verification in a state in which the electron leakage becomes stable.

Step S9212

The sequencer 111 determines whether or not the result of the first program verification operation is a pass.

If the sequencer 111 determines that the result of the first program verification operation is a pass (YES in Step S9212), the sequencer 111 performs Step S3701.

Step S9213

If the sequencer 111 determines that the result of the first program verification operation is not a pass (NO in Step S9212), the sequencer 111 counts up the number of loops relating to the first program operation.

Subsequently, the sequencer 111 counts up the number of loops and then determines whether or not the number of loops of the first program operation is the set value (LValue_I).

If the sequencer 111 determines that the number of loops is the set value (LValue_I) (YES in Step S9213), the sequencer 111 performs Step S3701.

Step S9214

If the sequencer 111 determines that the number of loops is not the set value (LValue_I) (NO in Step S9213), the sequencer increments the voltage VPGM_I to be used in the first program operation by the voltage DVPGM. Subsequently, Step S9205 is performed.

<2-11-2> Specific Example of Pulse

Subsequently, referring now to FIG. 93 and FIG. 94, a specific example of a pulse for a case where the write operation of the second embodiment is applied to the memory cell transistors MT described above will be described. The basic operations are the same as those described with reference to FIG. 20 and FIG. 21.

Figure 93:
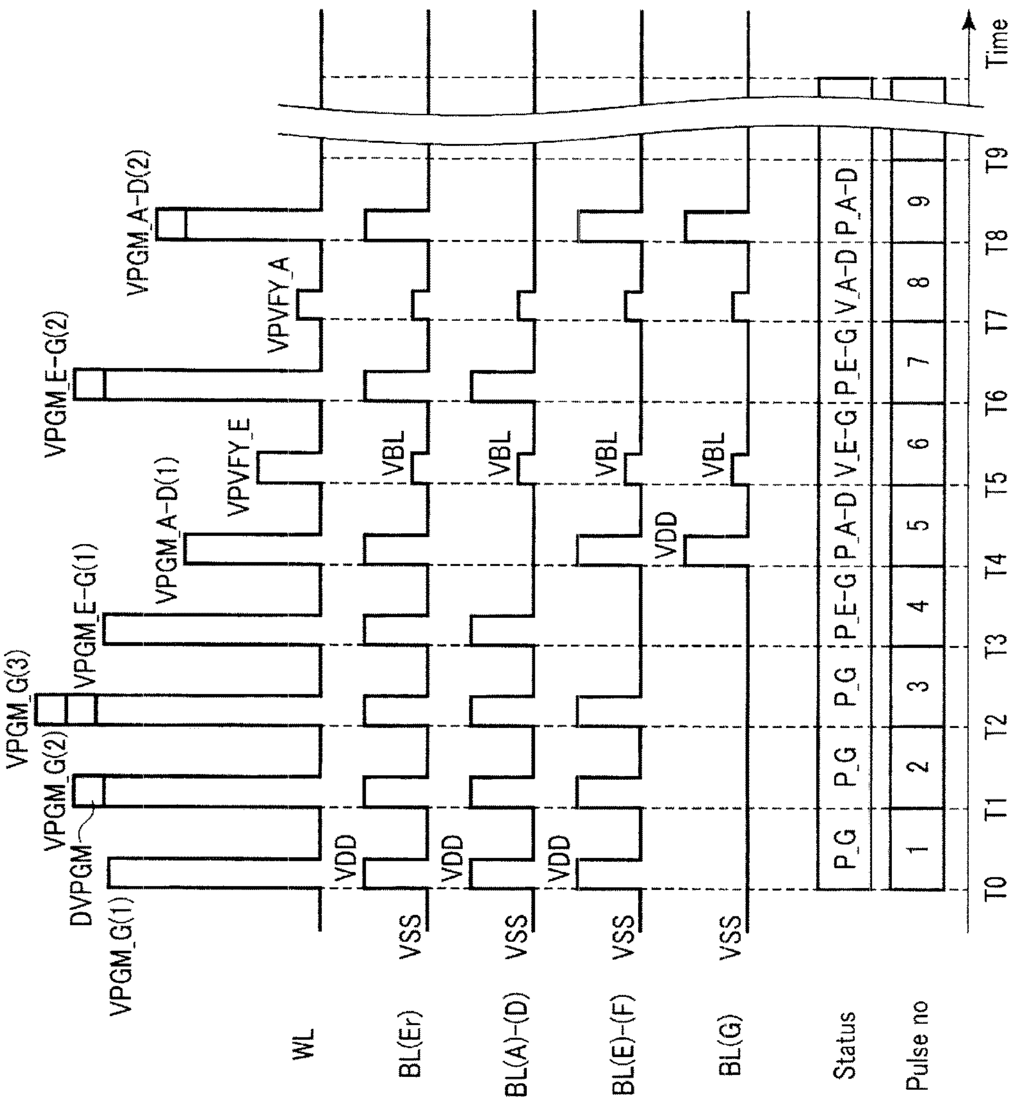
FIG. 93 is a waveform chart showing an example of voltages to be applied to the word lines and the bit lines during the write operation.

FIG. 93 and FIG. 94 illustrate a pulse of (i) and a pulse of (ii), which are roughly classified pulse categories, as described in conjunction with FIG. 20 and FIG. 21.

In the example illustrated in FIG. 93 and FIG. 94, pulses corresponding to the pulse Nos. 1, 4 to 6, 8, 11, 14, 18, 22, and 29 correspond to the pulses of (i).

In the example illustrated in FIG. 93 and FIG. 94, pulses corresponding to the Pulse other than No. 1, 4 to 6, 8, 11, 14, 18, 22, and 29 correspond to the pulses of (ii).

<2-12> Modified Example 8 of Second Embodiment

A modified example 8 of the second embodiment will be described. In the modified example 8 of the second embodiment, a case where a writing method different from the data writing method described above is employed in the second embodiment will be described.

<2-12-1> Operation

<2-12-1-1> Example of Order of Performance of Program Operation and Program Verification Operation In the following, the order of performance of the program operation and the program verification operation will be described with reference to FIG. 95.

Figure 95:
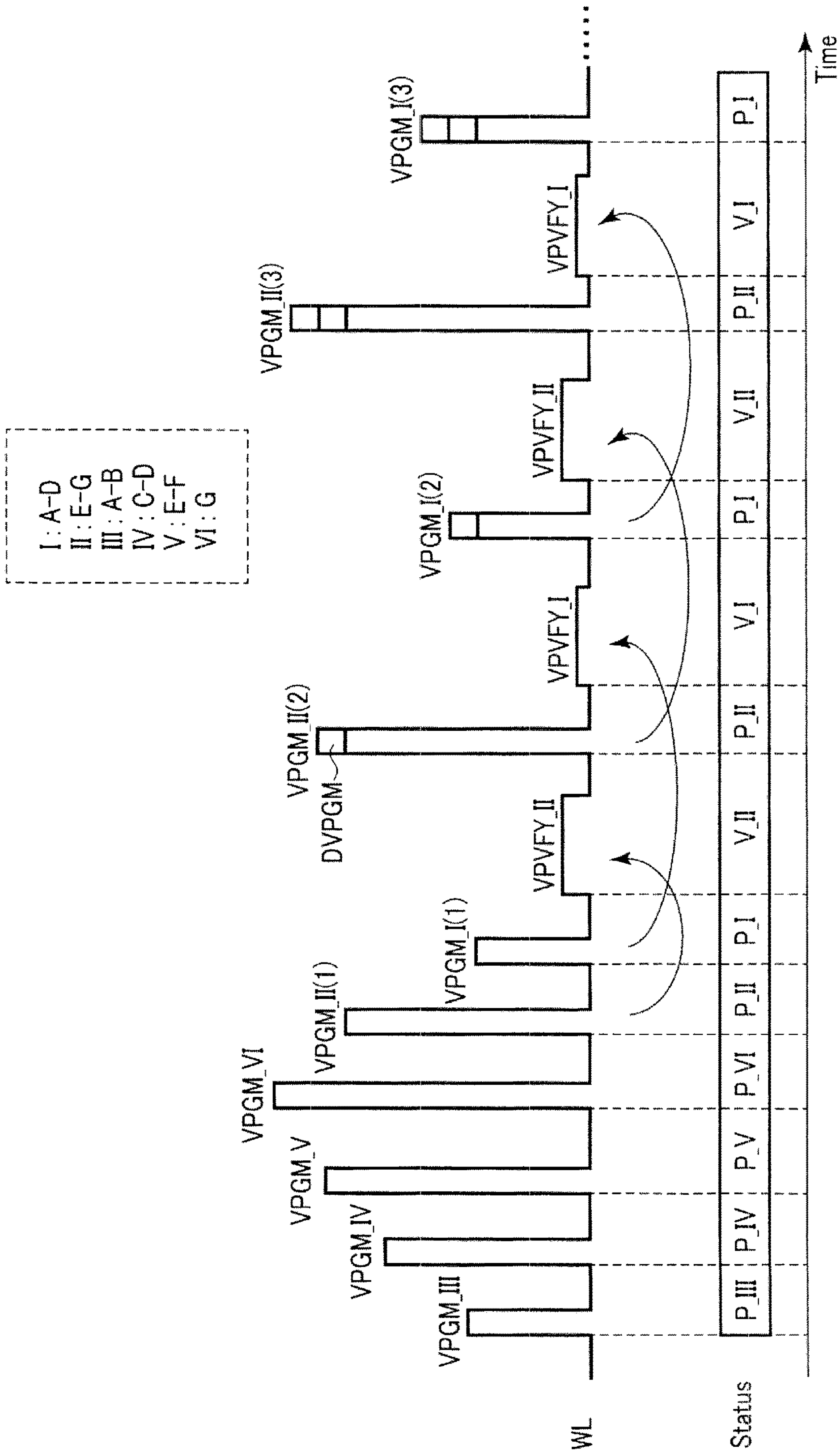
FIG. 95 is a waveform chart schematically showing a waveform of the word line during the write operation.

For easy understanding, FIG. 95 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 8 of the second embodiment is divided into a first write operation to a sixth write operation.

The first write operation is the write operations for the "A", "B", "C", and "D" levels. The second write operation is the write operations for the "E", "F", and "G"-levels. The third write operation is a write operation for the levels "A" and "B". The forth write operation is a write operation for the levels "C" and "D". The fifth write operation is a write operation for the levels "E" and "F". The sixth write operation is a write operation for the "G"-level.

The first write operation includes a first program operation (P_I) relating to writing for the levels "A", "B", "C", and "D", and a first program verification operation (V_I) that determines whether or not the first program operation has passed.

The second write operation includes the second program operation (P_II) relating to writing for the levels "E", "F", and "G" and a second program verification operation (V_II) relating to writing that determines whether or not the second program operation has passed.

The third write operation includes the third program operation (P_III) relating to writing for the "levels A" and "B".

The fourth write operation includes the fourth program operation (P_IV) relating to writing for the levels "C" and "D".

The fifth write operation includes the fifth program operation (P_V) relating to writing for the levels "E" and "F".

The sixth write operation includes the sixth program operation (P_VI) relating to writing for the "G"-level.

The sequencer 111 increments the voltage VPGM_I (n) by a voltage DVPGM every time the first program operation is performed. In the same manner, the sequencer 111 increments the voltage VPGM_II (n) by the voltage DVPGM every time the second program operation is performed.

The modified example 8 of the second embodiment is different from the second embodiment in that the third to the sixth program operations are performed at the start of the write operation.

Figure 96:
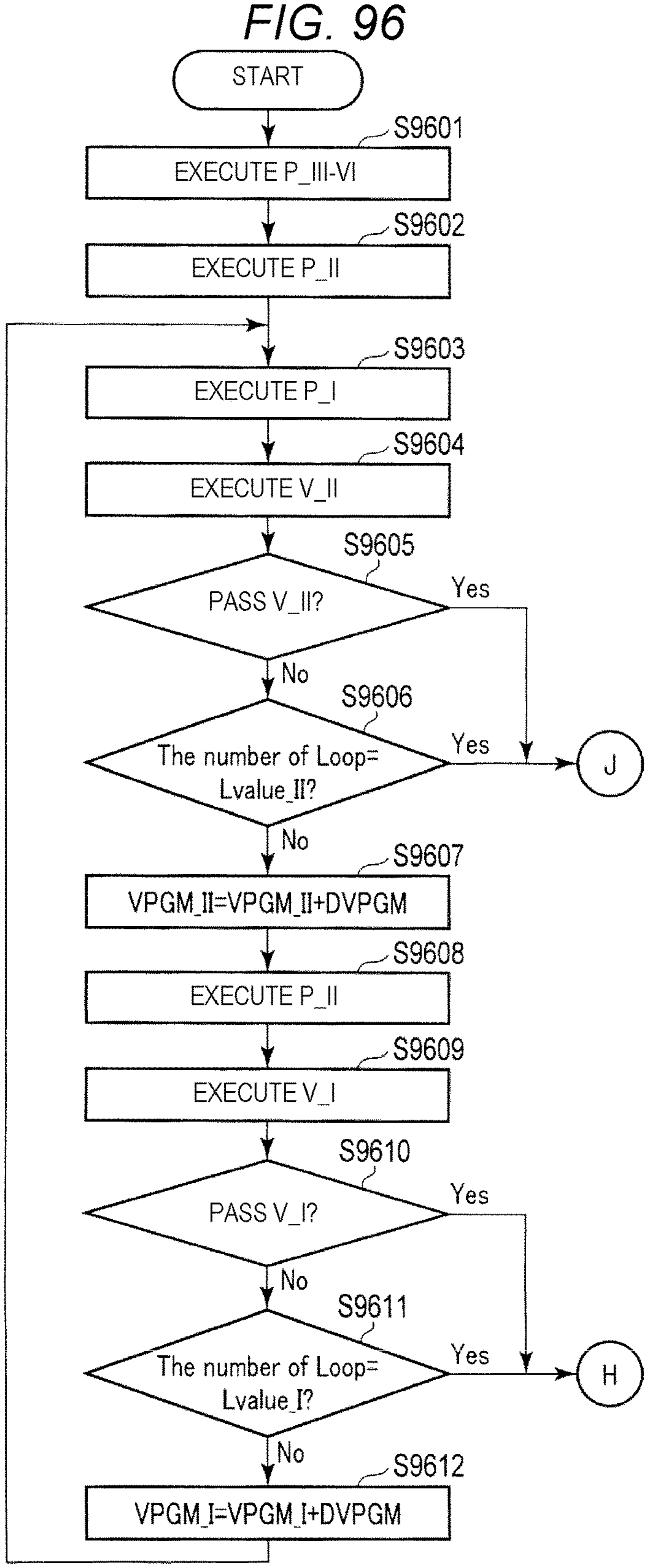
FIG. 96 is a flowchart showing the method of generating the performance order (pulse order) of the program operation and the program verification operation.

<2-12-1-2> Method of Generating Order of Performance of Program Operation and Program Verification Operation Referring now to FIG. 96, a method of generating the order of performance of the program operation and the program verification operation according to the modified example 8 of the second embodiment will be described.

Step S9601

The sequencer 111 performs the third program operation, the fourth program operation, the fifth program operation, and the sixth program operation in this order.

Figure 92:
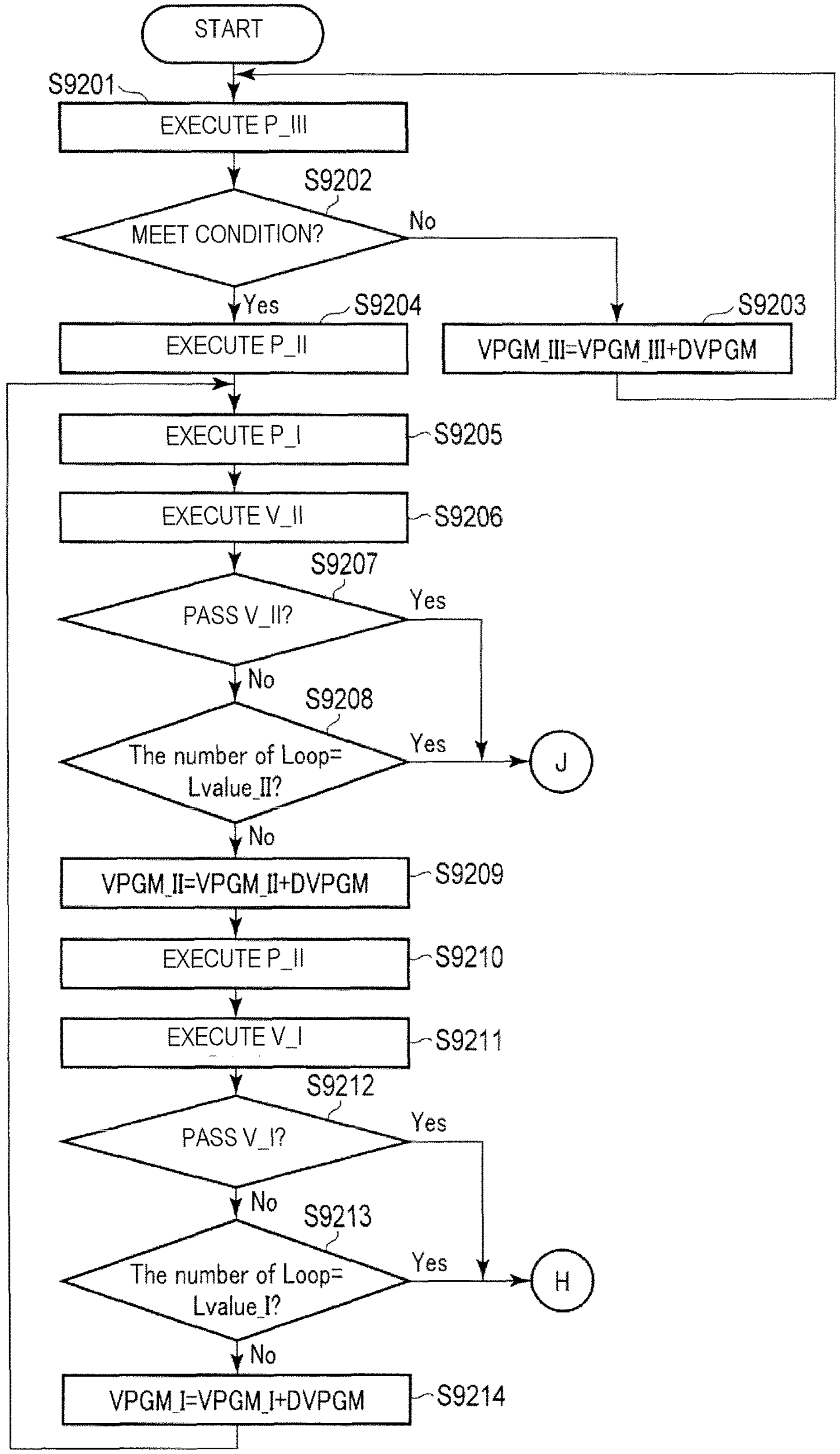
FIG. 92 is a flowchart showing the method of generating the performance order (pulse order) of the program operation and the program verification operation.

Step S9602 to Step S9612 correspond to Step S9204 to Step S9214 in FIG. 92.

<2-12-2> Specific Example of Pulse

Subsequently, referring now to FIG. 97 and FIG. 98, a specific example of the pulse for a case where the write operation of the second embodiment is applied to the memory cell transistors MT described above will be described. The basic operations are the same as those described with reference to FIG. 20 and FIG. 21.

Figure 97:
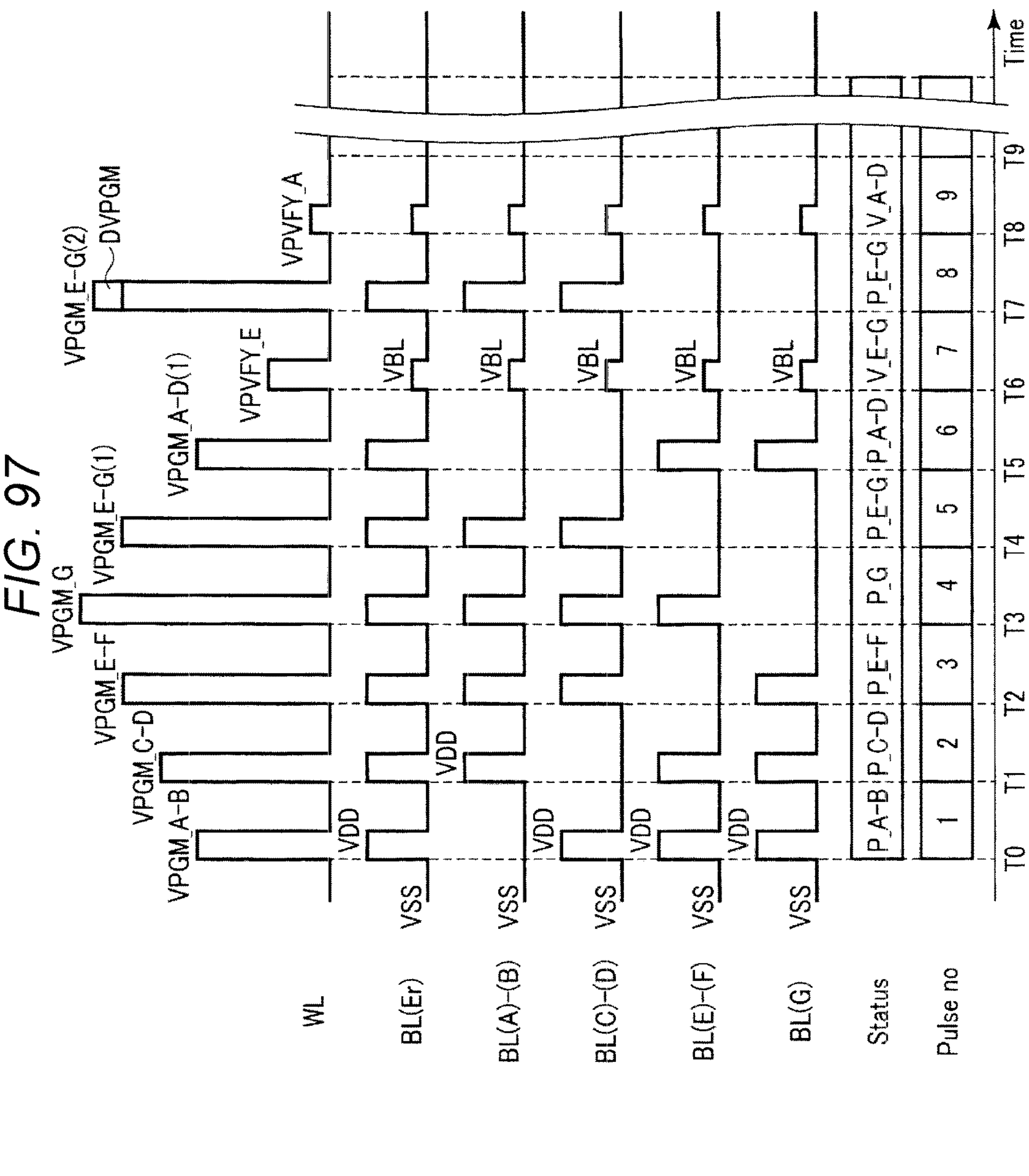
FIG. 97 is a waveform chart showing an example of voltages to be applied to the word lines and the bit lines during the write operation.

FIG. 97 and FIG. 98 illustrate a pulse of (i) and a pulse of (ii), which are roughly classified pulse categories, as described in conjunction with FIG. 20 and FIG. 21.

In the example illustrated in FIG. 97 and FIG. 98, pulses corresponding to the pulse Nos. 1 to 7, 9, 12, 15, 19, 23, and 30 correspond to the pulses of (i).

In the example illustrated in FIG. 97 and FIG. 98, pulses corresponding to the Pulse other than No. 1 to 7, 9, 12, 15, 19, 23, and 30 correspond to the pulses of (ii).

<2-13> Modified Example 9 of Second Embodiment

A modified example 9 of the second embodiment will be described. In the modified example 9 of the second embodiment, a case where a writing method different from the data writing method described above is employed in the second embodiment will be described.

<2-13-1> Operation

<2-13-1-1> Example of Order of Performance of Program Operation and Program Verification Operation In the following, the order of performance of the program operation and the program verification operation will be described with reference to FIG. 99.

Figure 99:
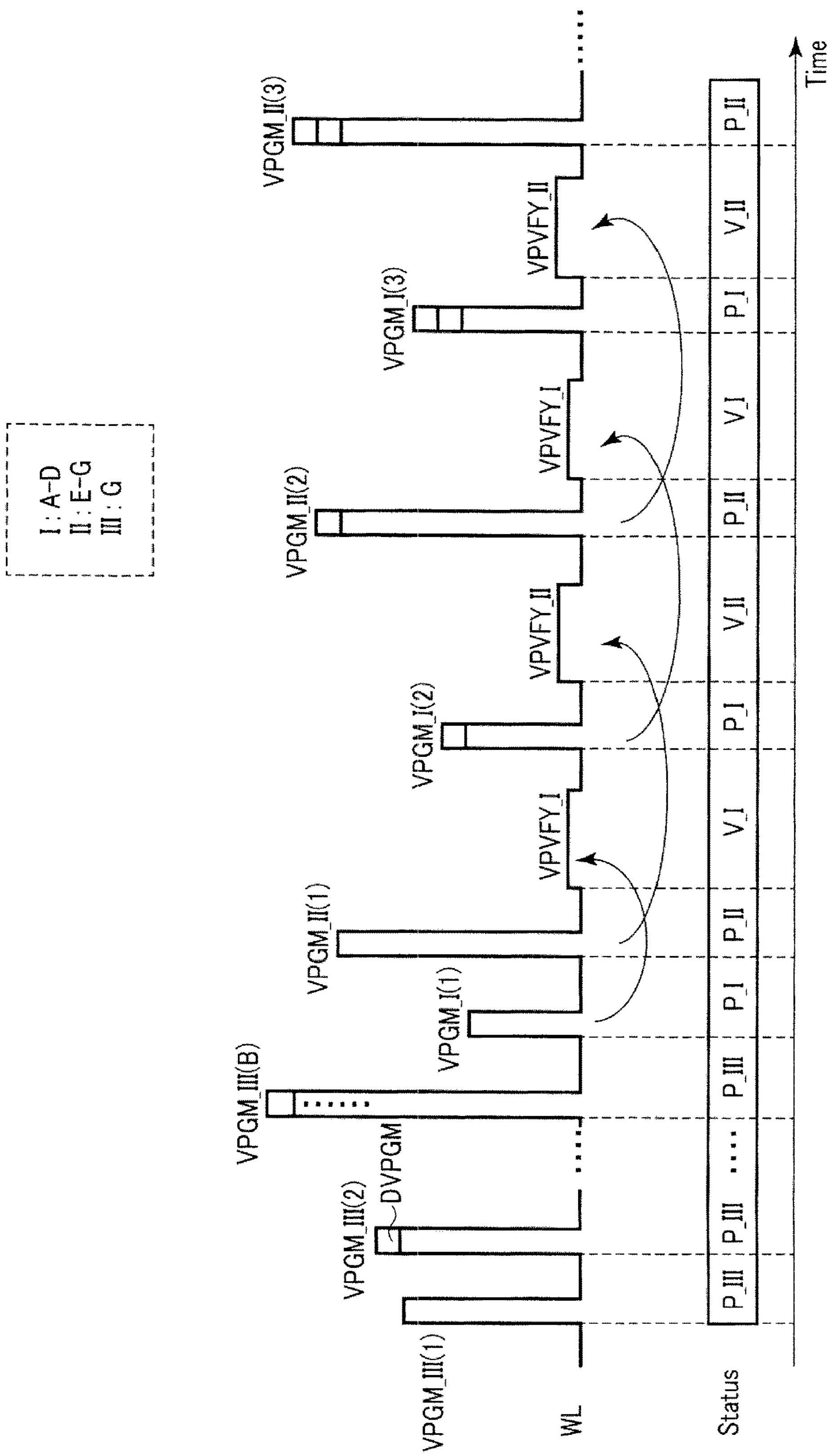
FIG. 99 is a waveform chart schematically showing a waveform of the word line during the write operation.

For easy understanding, FIG. 99 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 9 of the second embodiment is divided into first to third write operations in the same manner as the modified example 7 of the second embodiment.

The modified example 9 of the second embodiment is different from the modified example 7 of the second embodiment in that the order of performance of the first write operation and the second write operation are inverted.

<2-13-1-2> Method of Generating Order of Performance of Program Operation and Program Verification Operation Referring now to FIG. 100, a method of generating the order of performance of the program operation and the program verification operation according to the modified example 9 of the second embodiment will be described.

Step S10001 to Step S10003 correspond to Step S9201 to Step S9203 in FIG. 92.

Step S10004

If the sequencer 111 determines that the condition is satisfied (YES in Step S10002), the sequencer 111 performs the first program operation.

Step S10005

The sequencer 111 performs the second program operation.

Step S10006

The sequencer 111 performs the first program verification operation after performing the second program operation.

In this manner, the sequencer 111 performs other operations between the first program operation and the first program verification operation. Accordingly, the sequencer 111 is capable of performing the program verification in a state in which the electron leakage becomes stable.

Step S10007

The sequencer 111 determines whether or not the result of the first program verification operation is a pass.

If the sequencer 111 determines that the result of the first program verification operation is a pass (YES in Step S10007), the sequencer 111 performs Step S3701.

Step S10008

If the sequencer 111 determines that the result of the first program verification operation is not a pass (NO in Step S10007), the sequencer 111 counts up the number of loops relating to the first program operation.

Subsequently, the sequencer 111 counts up the number of loops and then determines whether or not the number of loops of the first program operation is the set value (LValue_I).

If the sequencer 111 determines that the number of loops is the set value (LValue_I) (YES in Step S10008), the sequencer 111 performs Step S3701.

Step S10009

If the sequencer 111 determines that the number of loops is not the set value (LValue_I) (NO in Step S10008), the sequencer 111 increments the voltage VPGM_I to be used in the first program operation by the voltage DVPGM.

Step S10010

The sequencer 111 performs the first program operation.

Step S10011

The sequencer 111 performs the second program verification operation after performing the first program operation.

In this manner, the sequencer 111 performs other operations between the second program operation and the second program verification operation. Accordingly, the sequencer 111 is capable of performing the program verification in a state in which the electron leakage becomes stable.

Step S10012

The sequencer 111 determines whether or not the result of the second program verification operation is a pass.

If the sequencer 111 determines that the result of the second program verification operation is a pass (YES in Step S10012), the sequencer 111 performs Step S4001.

Step S10013

If the sequencer 111 determines that the result of the second program verification operation is not a pass (NO in Step S10012), the sequencer 111 counts up the number of loops relating to the second program operation.

Subsequently, the sequencer 111 counts up the number of loops and then determines whether or not the number of loops of the second program operation is the set value (LValue_II).

If the sequencer 111 determines that the number of loops is the set value (LValue_II) (YES in Step S10013), the sequencer 111 performs Step S4001.

Step S10014

If the sequencer 111 determines that the number of loops is not the set value (LValue_II) (NO in Step S10013), the sequencer 111 increments the voltage VPGM_II to be used in the second program operation by the voltage DVPGM. Subsequently, Step S10005 is performed.

<2-13-2> Specific Example of Pulse

Subsequently, referring now to FIG. 101 and FIG. 102, a specific example of the pulse for a case where the write operation of the second embodiment is applied to the memory cell transistors MT described above will be described. The basic operations are the same as those described with reference to FIG. 20 and FIG. 21.

Figure 101:
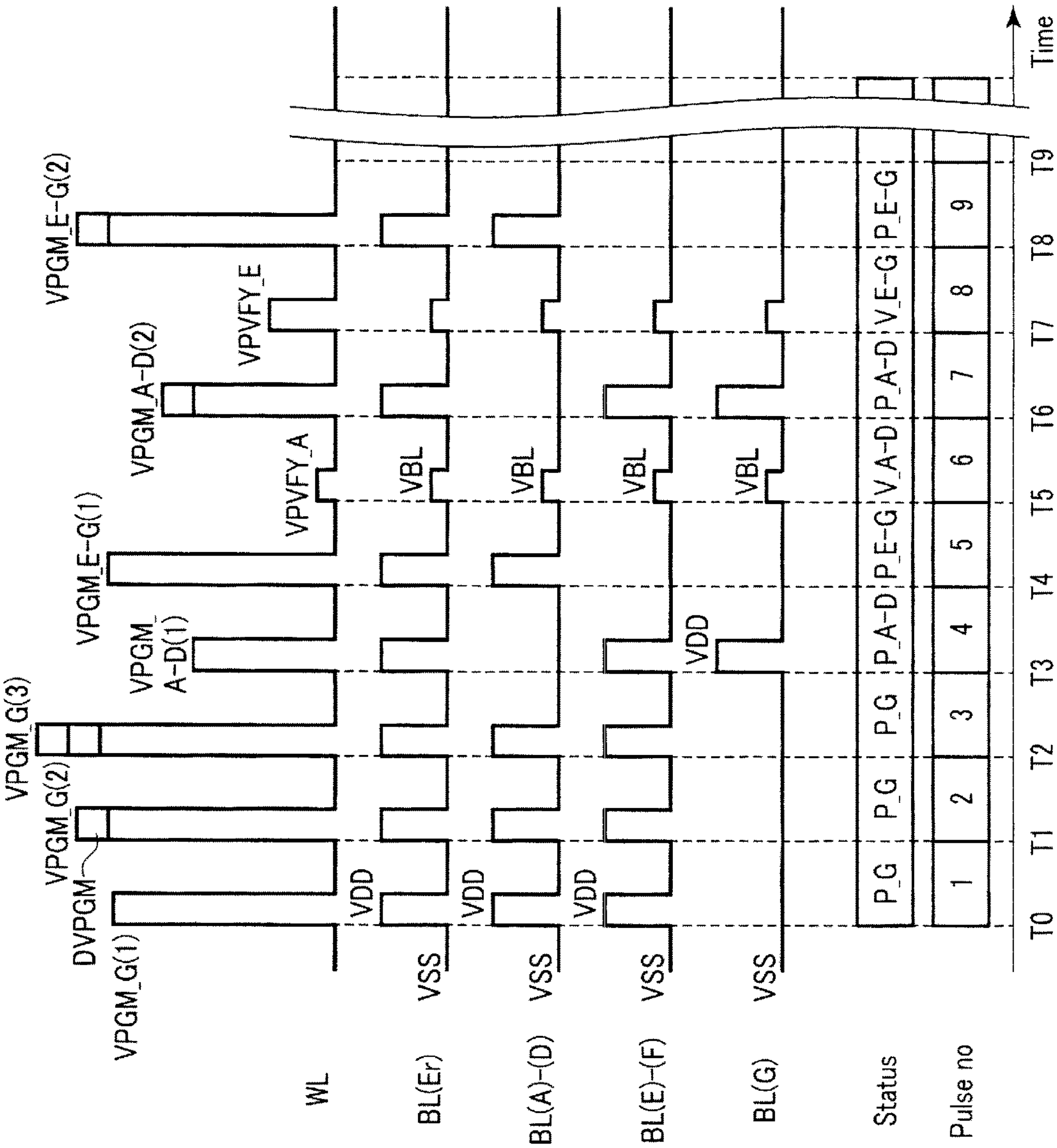
FIG. 101 is a waveform chart showing an example of voltages to be applied to the word lines and the bit lines during the write operation.

FIG. 101 and FIG. 102 illustrate a pulse of (i) and a pulse of (ii), which are roughly classified pulse categories, as described in conjunction with FIG. 20 and FIG. 21.

In the example illustrated in FIG. 101 and FIG. 102, pulses corresponding to the pulse Nos. 1 to 6, 8, 11, 14, 18, 22, and 26 correspond to the pulses of (i).

In the example illustrated in FIG. 101 and FIG. 102, pulses corresponding to the Pulse other than No. 1 to 6, 8, 11, 14, 18, 22, and 26 correspond to the pulses of (ii).

<2-14> Modified Example 10 of Second Embodiment

A modified example 10 of the second embodiment will be described. In the modified example 10 of the second embodiment, a case where a writing method different from the data writing method described above is employed in the second embodiment will be described.

<2-14-1> Operation

<2-14-1-1> Example of Order of Performance of Program Operation and Program Verification Operation In the following, the order of performance of the program operation and the program verification operation will be described with reference to FIG. 103.

Figure 103:
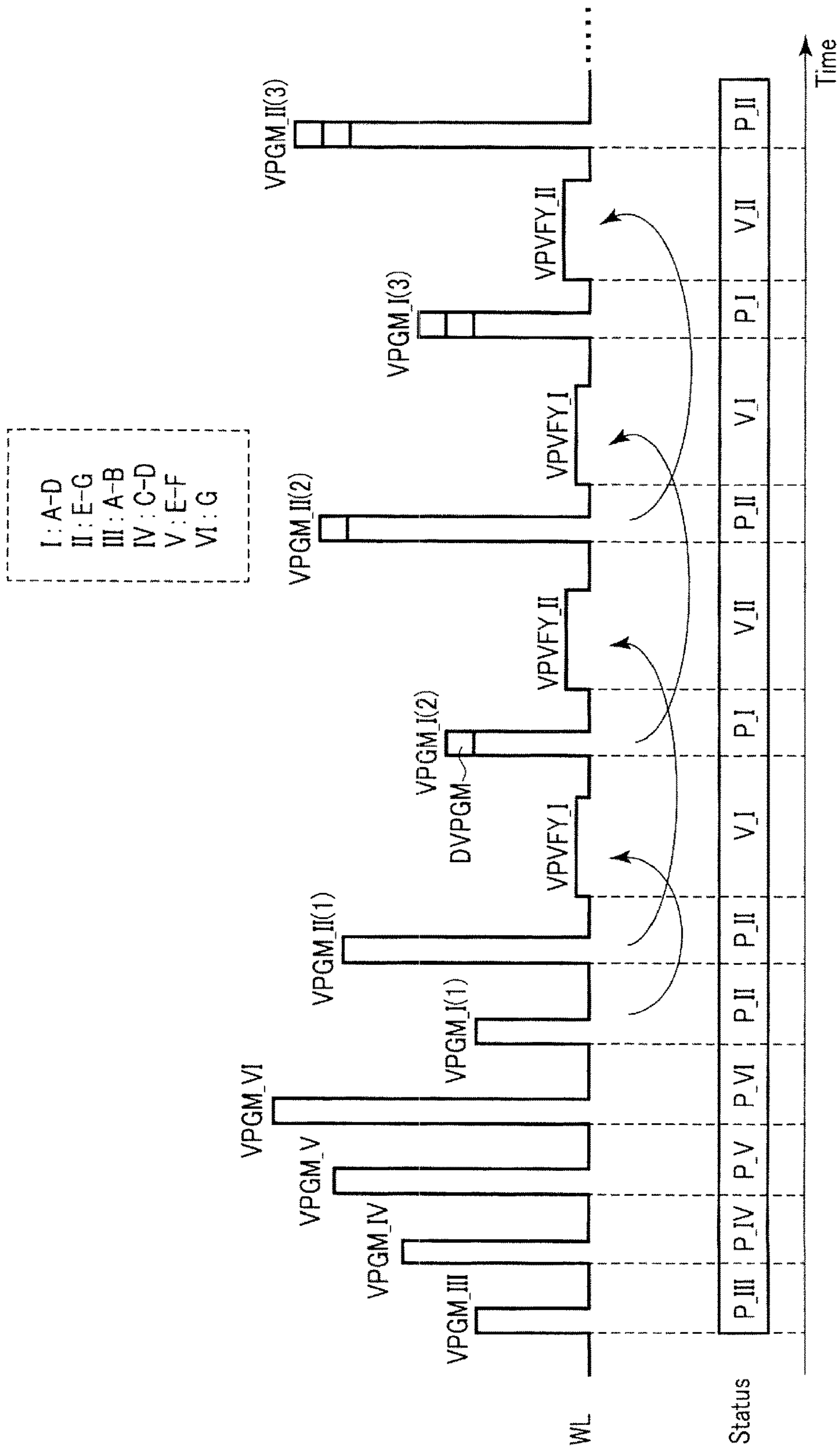
FIG. 103 is a waveform chart schematically showing a waveform of the word line during the write operation.

For easy understanding, FIG. 103 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 10 of the second embodiment is divided into first to sixth write operations in the same manner as the modified example 8 of the second embodiment.

The modified example 10 of the second embodiment is different from the modified example 8 of the second embodiment in that the order of performance of the first write operation and the second write operation are inverted.

Figure 104:
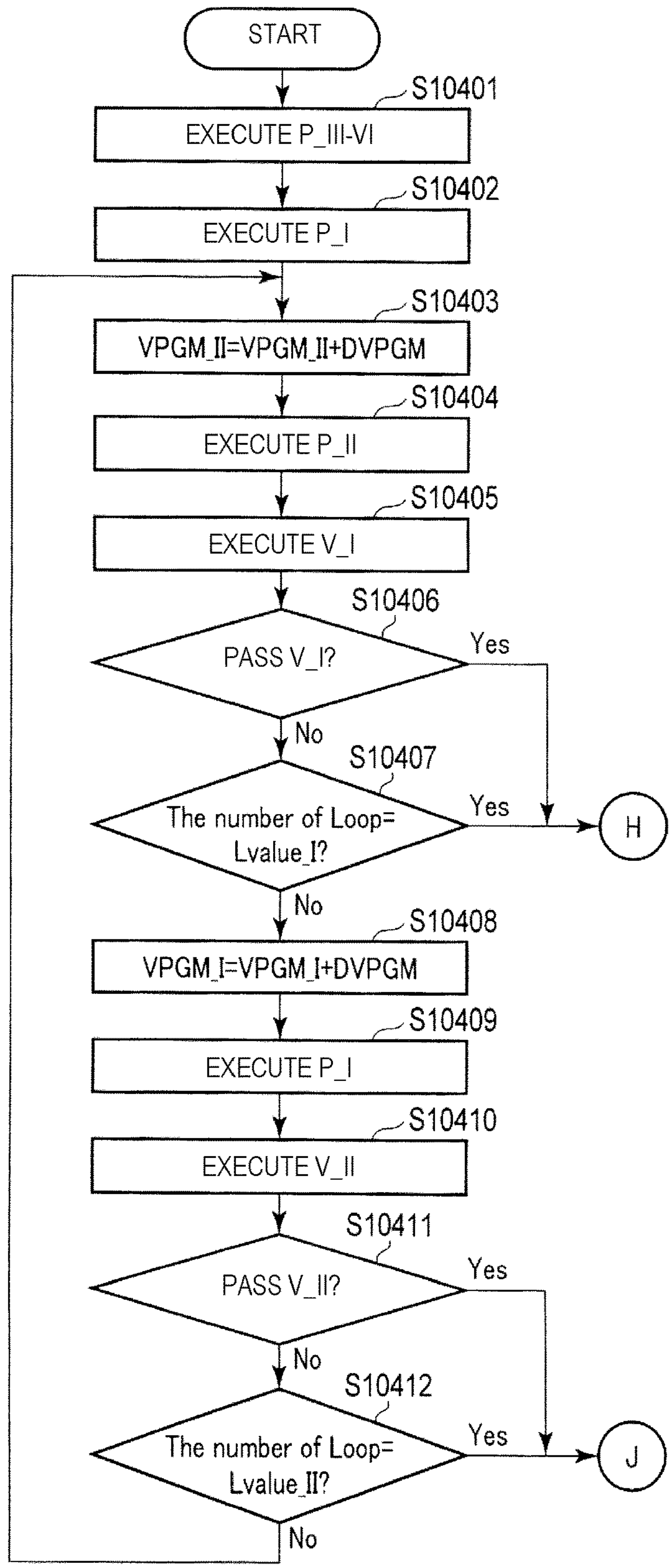
FIG. 104 is a flowchart showing the method of generating the performance order (pulse order) of the program operation and the program verification operation.

<2-14-1-2> Method of Generating Order of Performance of Program Operation and Program Verification Operation Referring now to FIG. 104, a method of generating the order of performance of the program operation and the program verification operation according to the modified example 10 of the second embodiment will be described.

Step S10401

The sequencer 111 performs the third program operation, the fourth program operation, the fifth program operation, and the sixth program operation in this order.

Figure 100:
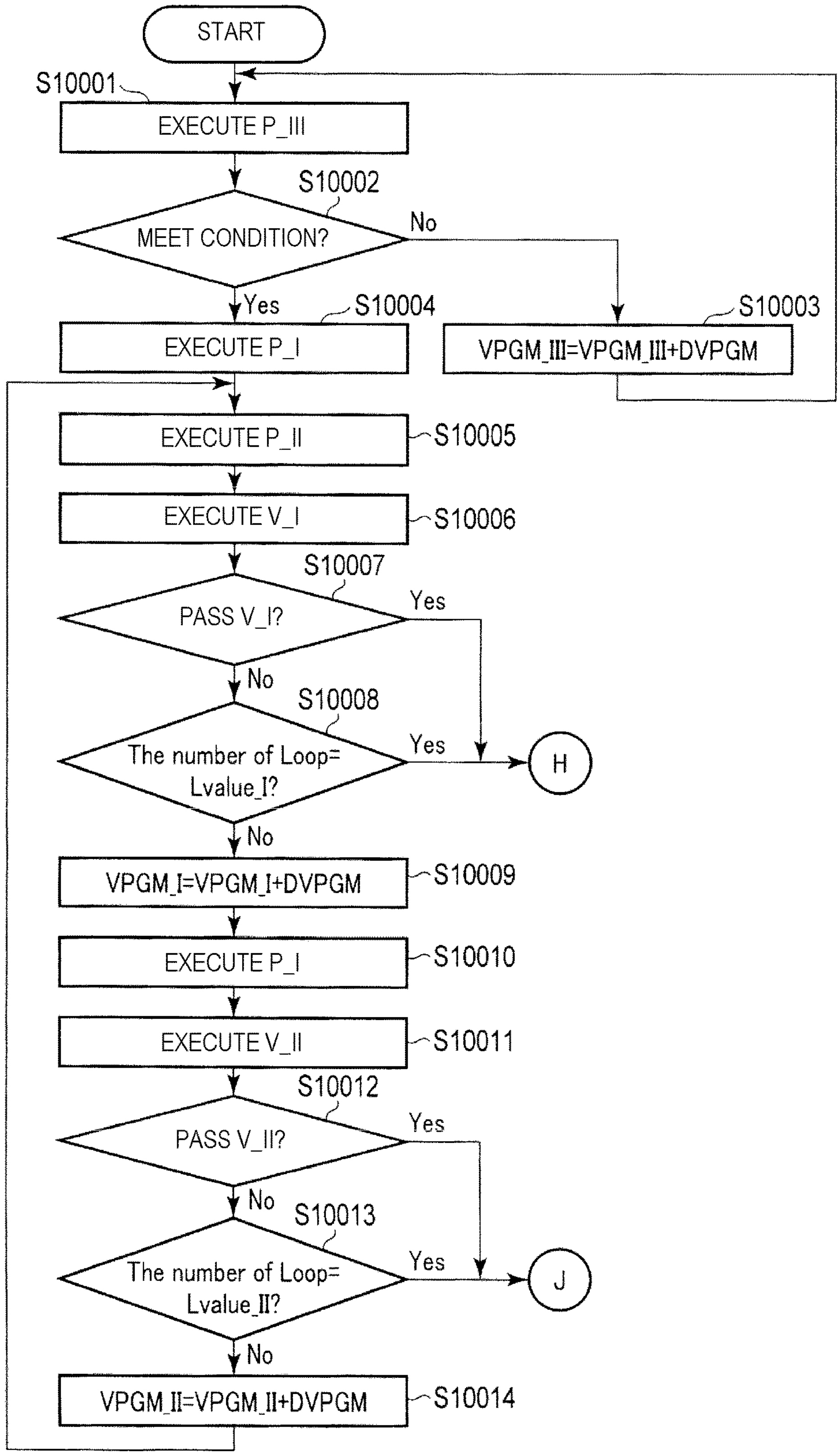
FIG. 100 is a flowchart showing the method of generating the performance order (pulse order) of the program operation and the program verification operation.

Step S10402 to Step S10412 correspond to Step S10004 to Step S10014 in FIG. 100.

<2-14-2> Specific Example of Pulse

Subsequently, referring now to FIG. 105 and FIG. 106, a specific example of the pulse for a case where the write operation of the second embodiment is applied to the memory cell transistors MT described above will be described. The basic operations are the same as those described with reference to FIG. 20 and FIG. 21.

Figure 105:
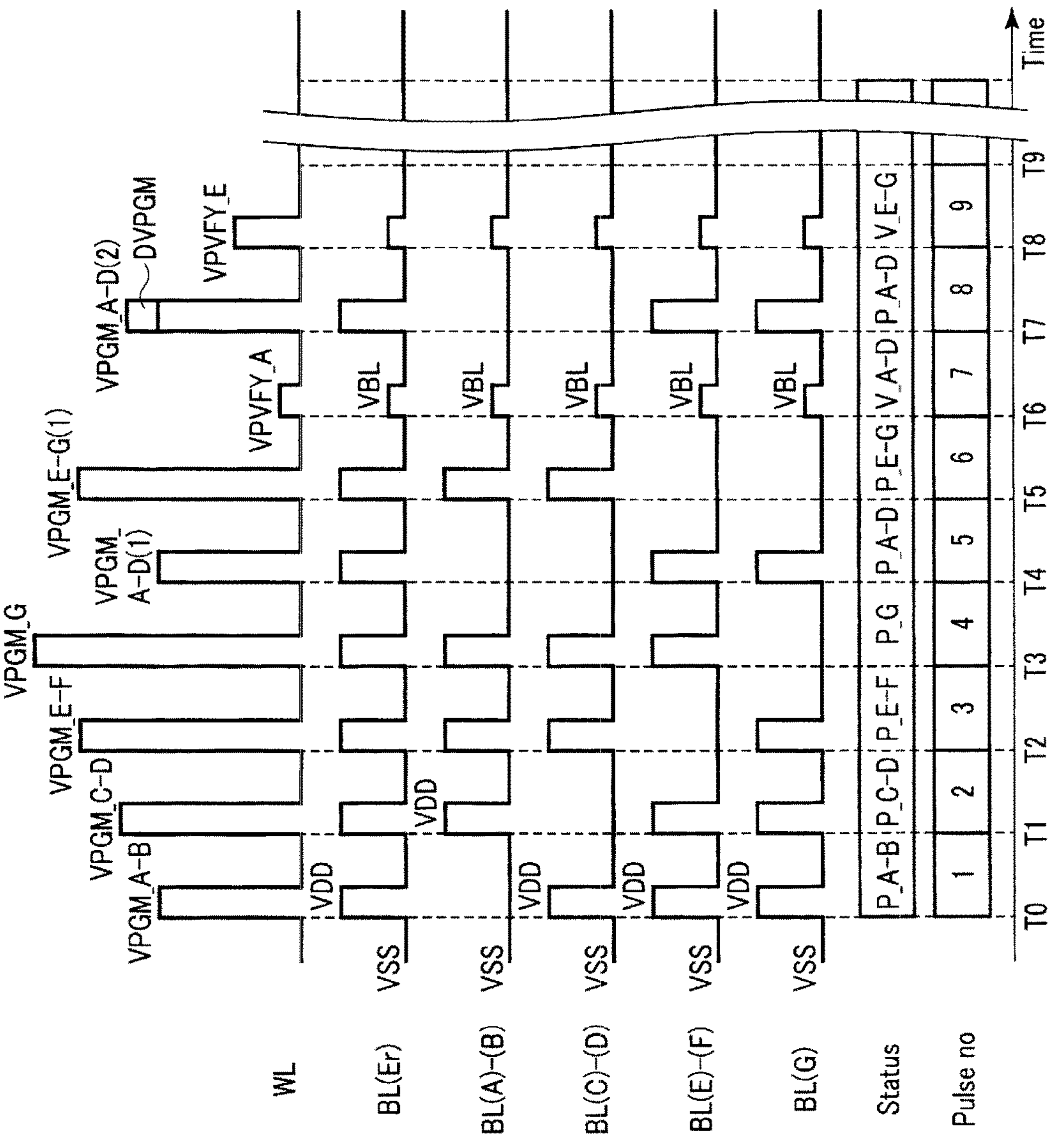
FIG. 105 is a waveform chart showing an example of voltages to be applied to the word lines and the bit lines during the write operation.

FIG. 105 and FIG. 106 illustrate a pulse of (i) and a pulse of (ii), which are roughly classified pulse categories, as described in conjunction with FIG. 20 and FIG. 21.

In the example illustrated in FIG. 105 and FIG. 106, pulses corresponding to the pulse Nos. 1 to 7, 9, 12, 15, 19, 23, and 27 correspond to the pulses of (i).

In the example illustrated in FIG. 105 and FIG. 106, pulses corresponding to the Pulse other than No. 1 to 7, 9, 12, 15, 19, 23, and 27 correspond to the pulses of (ii).

<2-15> Modified Example 11 of Second Embodiment

A modified example 11 of the second embodiment will be described. In the modified example 11 of the second embodiment, a case where a writing method different from the data writing method described above is employed in the second embodiment will be described.

<2-15-1> Operation

<2-15-1-1> Example of Order of Performance of Program Operation and Program Verification Operation In the following, the order of performance of the program operation and the program verification operation will be described with reference to FIG. 107.

Figure 107:
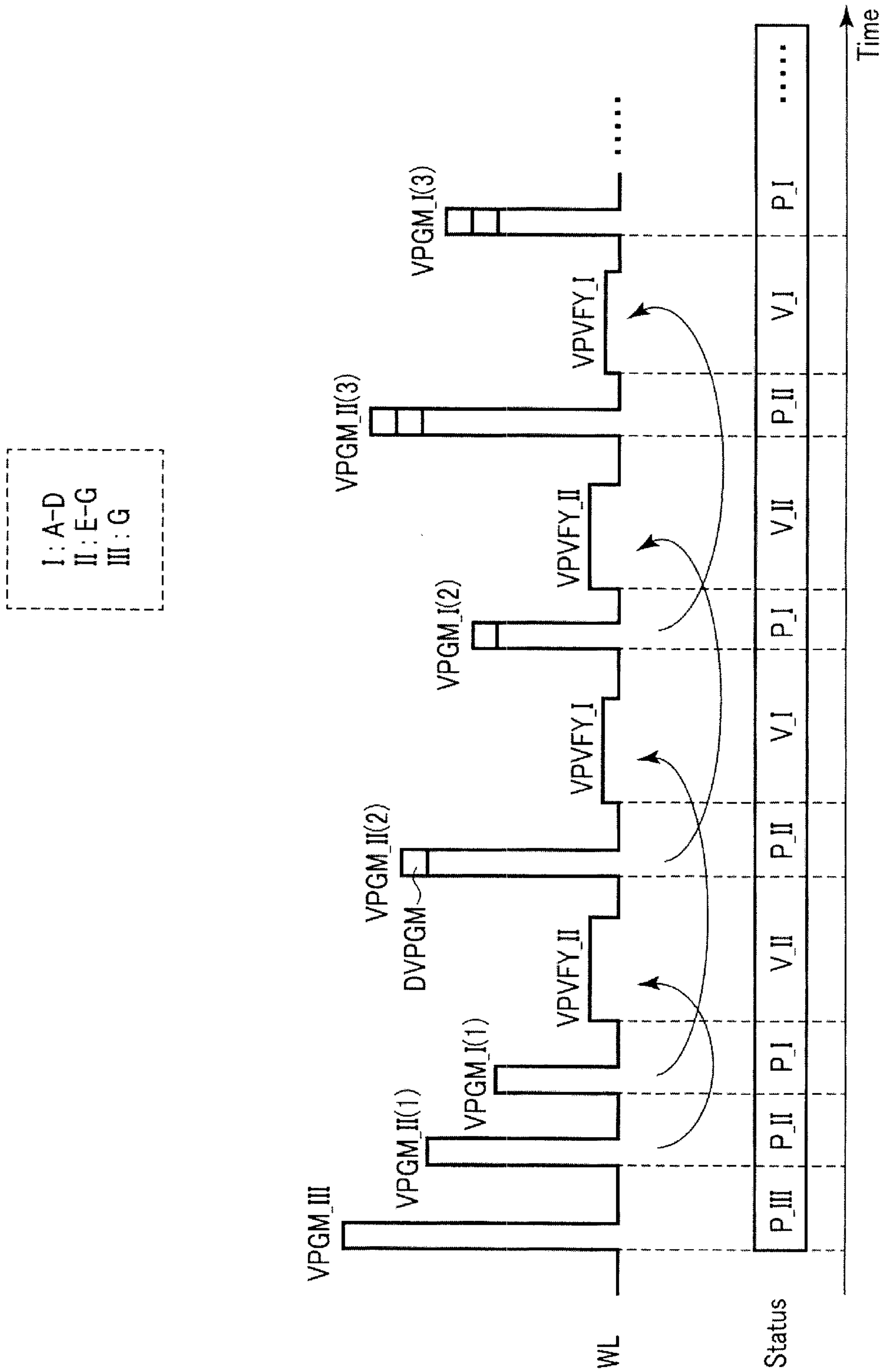
FIG. 107 is a waveform chart schematically showing a waveform of the word line during the write operation.

For easy understanding, FIG. 107 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 11 of the second embodiment is divided into first to third write operations in the same manner as the modified example 7 of the second embodiment.

The modified example 11 of the second embodiment is different from the modified example 7 of the second embodiment in that voltages during the third program operation are different, and in that the third program operation is performed only once.

More specifically, in the third program operation, the voltage VPGM_III to be applied to the selected word line WL is larger than, for example, a voltage VPGM_II (2).

A method of generating the order of performance of the program operation and the program verification operation is the same as the method described with reference to FIG. 92. Specifically, the "condition" in Step S9202 needs only to be set to "set value=1".

<2-15-2> Specific Example of Pulse

Subsequently, referring now to FIG. 108 and FIG. 109, a specific example of the pulse for a case where the write operation of the second embodiment is applied to the memory cell transistors MT described above will be described. The basic operations are the same as those described with reference to FIG. 20 and FIG. 21.

Figure 108:
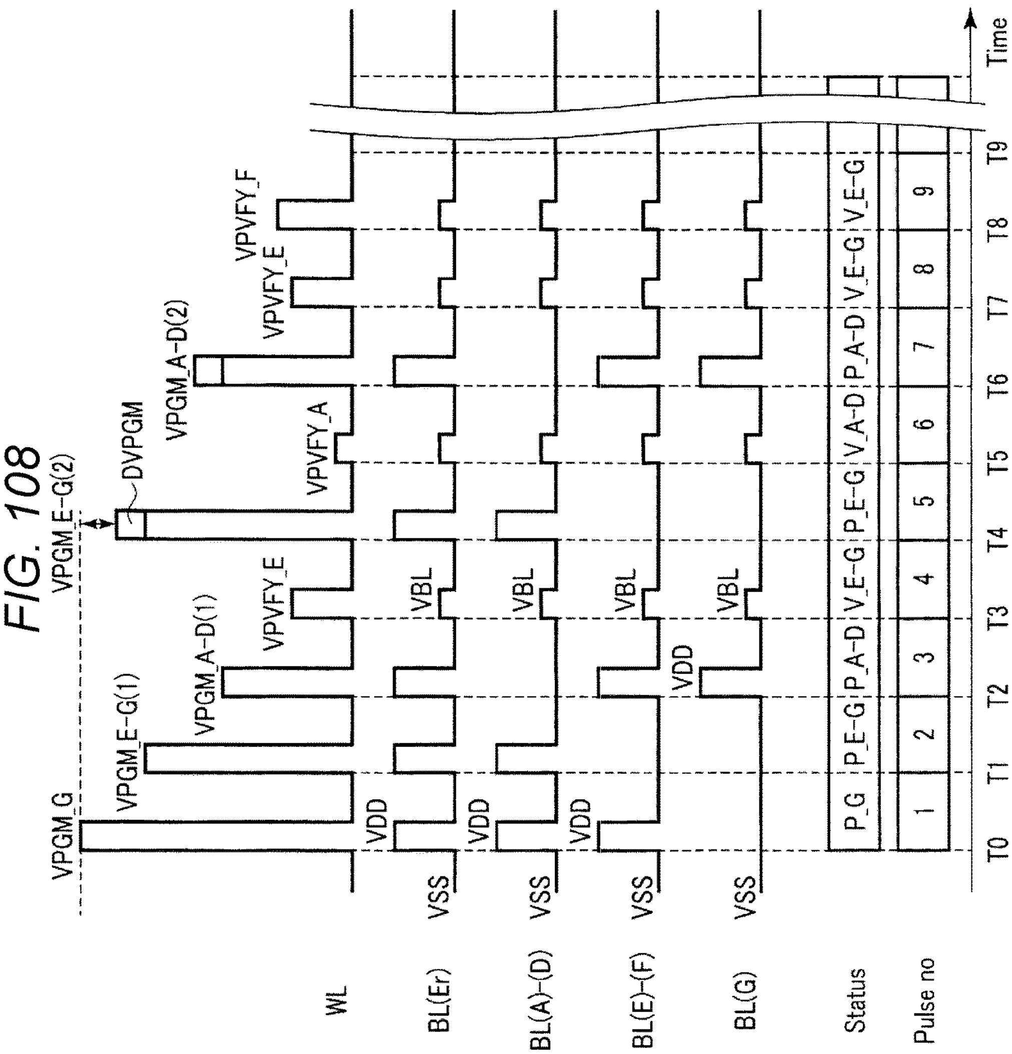
FIG. 108 is a waveform chart showing an example of voltages to be applied to the word lines and the bit lines during the write operation.

FIG. 108 and FIG. 109 illustrate a pulse of (i) and a pulse of (ii), which are roughly classified pulse categories, as described in conjunction with FIG. 20 and FIG. 21.

In the example illustrated in FIG. 108 and FIG. 109, pulses corresponding to the pulse Nos. 1 to 4, 6, 9, 12, 16, 20, and 27 correspond to the pulses of (i).

In the example illustrated in FIG. 108 and FIG. 109, pulses corresponding to the Pulse other than No. 1 to 4, 6, 9, 12, 16, 20, and 27 correspond to the pulses of (ii).

<2-16> Modified Example 12 of Second Embodiment

A modified example 12 of the second embodiment will be described. In the modified example 12 of the second embodiment, a case where a writing method different from the data writing method described above is employed in the second embodiment will be described.

<2-16-1> Operation

<2-16-1-1> Example of Order of Performance of Program Operation and Program Verification Operation In the following, the order of performance of the program operation and the program verification operation will be described with reference to FIG. 110.

Figure 110:
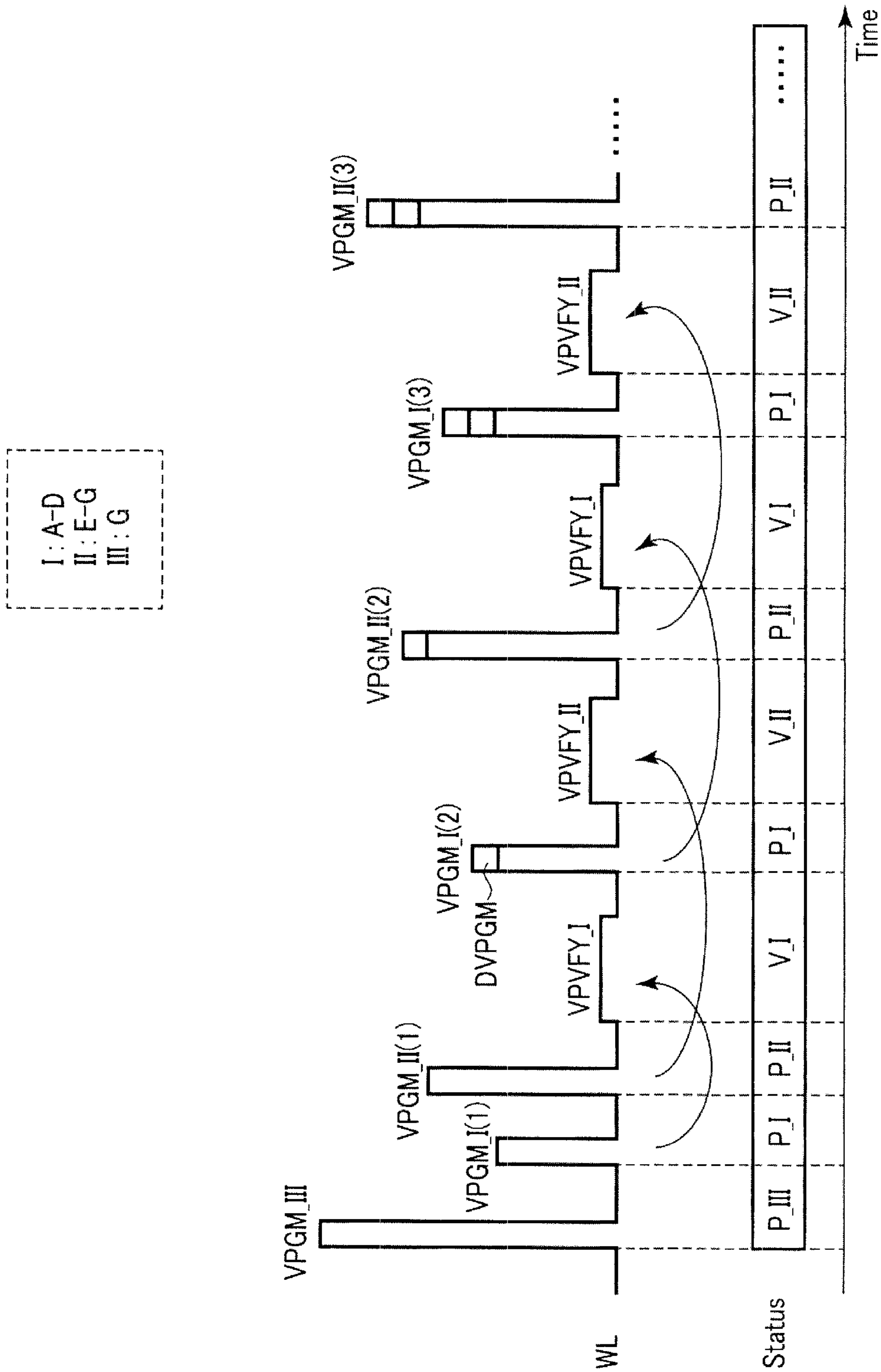
FIG. 110 is a waveform chart schematically showing a waveform of the word line during the write operation.

For easy understanding, FIG. 110 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 12 of the second embodiment is divided into first to third write operations in the same manner as the modified example 11 of the second embodiment.

The modified example 12 of the second embodiment is different from the modified example 11 of the second embodiment in that the order of performance of the first write operation and the second write operation are inverted.

A method of generating the order of performance of the program operation and the program verification operation is the same as the method described with reference to FIG. 100. Specifically, the "condition" in Step S10002 needs only to be set to "set value=1".

<2-16-2> Specific Example of Pulse

Subsequently, referring now to FIG. 111 and FIG. 112, a specific example of the pulse for a case where the write operation of the second embodiment is applied to the memory cell transistors MT described above will be described. The basic operations are the same as those described with reference to FIG. 20 and FIG. 21.

Figure 111:
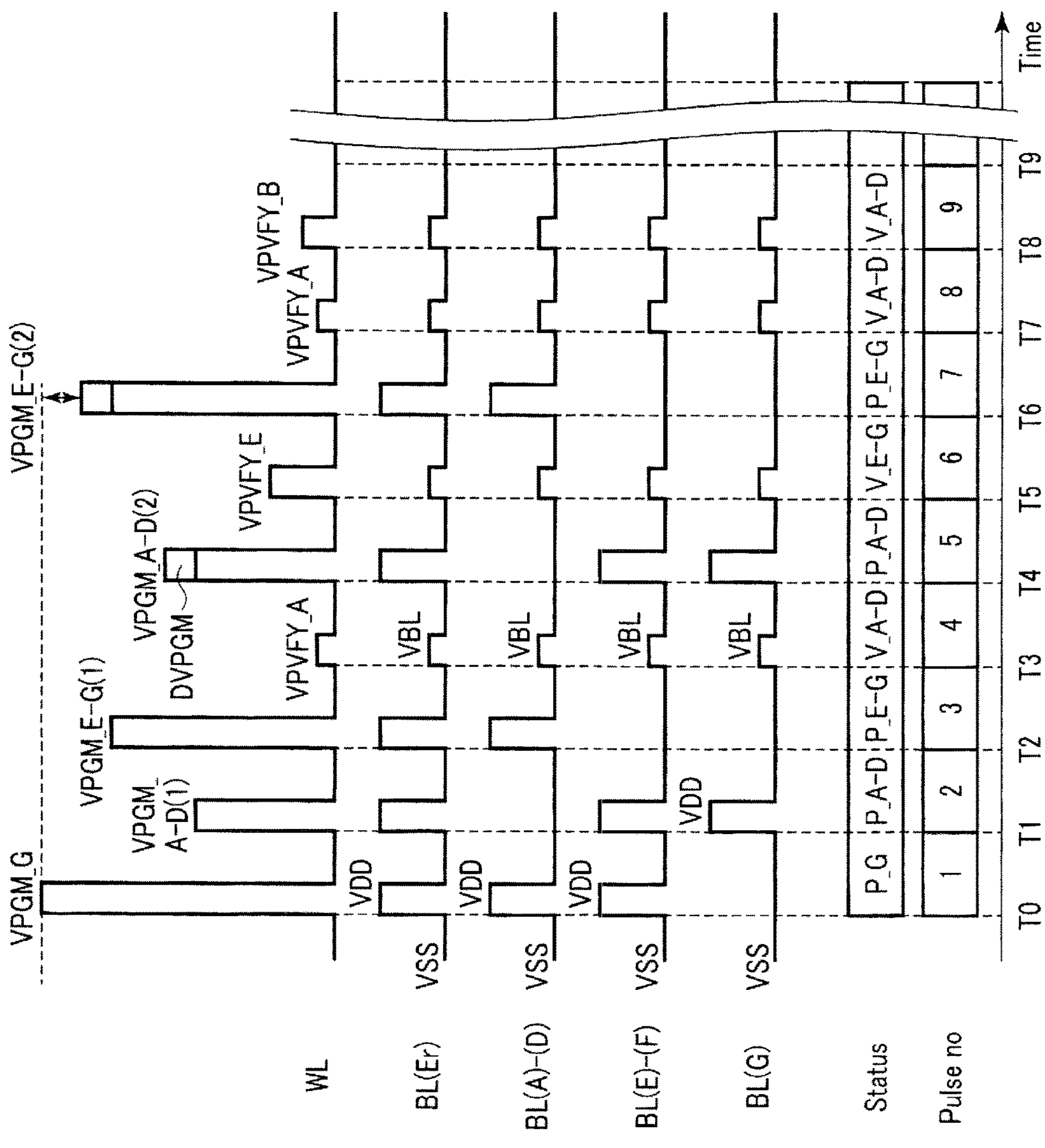
FIG. 111 is a waveform chart showing an example of voltages to be applied to the word lines and the bit lines during the write operation.

FIG. 111 and FIG. 112 illustrate a pulse of (i) and a pulse of (ii), which are roughly classified pulse categories, as described in conjunction with FIG. 20 and FIG. 21.

In the example illustrated in FIG. 111 and FIG. 112, pulses corresponding to the pulse Nos. 1 to 4, 6, 9, 12, 16, 20, and 24 correspond to the pulses of (i).

In the example illustrated in FIG. 111 and FIG. 112, pulses corresponding to the Pulse other than No. 1 to 4, 6, 9, 12, 16, 20 and 24 correspond to the pulses of (ii).

<3> Third Embodiment

A third embodiment will be described. In the third embodiment, a case where a memory cell transistor stores 16-value data will be described. A basic configuration and a basic operation of the memory device of the third embodiment are the same as the memory device of the first embodiment described above. Therefore, description of properties described in the first embodiment above and properties which can be estimated easily from the first embodiment will be omitted.

<3-1> Threshold Voltage Distribution of Memory Cell Transistor

<3-1-1> Relationship Between Threshold Voltage Distribution of Memory Cell Transistor and Data Referring now to FIG. 113, a relationship between a threshold voltage distribution of the memory cell transistor and data will be described.

Figure 113:
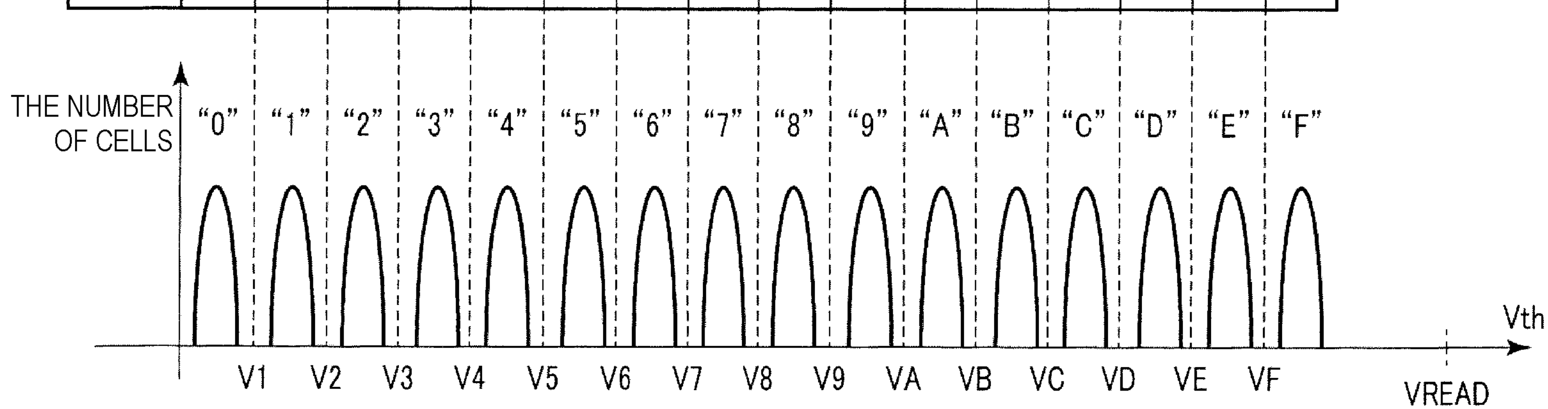
FIG. 113 is a drawing showing a distribution of threshold voltages that a memory cell transistor in a semiconductor memory device according to a third embodiment may have.

In the example illustrated in FIG. 113, each memory cell transistor MT is capable of retaining data of, for example, 4 bits in accordance with a threshold voltage thereof. The 4-bit data includes, for example, "1111", "101170101", "1000", "1001", "0001", "0011", "0111", "0101", "1101", "1100", "0100", "0000", "0010", "0110", and "1110" from an ascending order in the threshold voltage.

A threshold voltage of the memory cell transistor MT retaining "1111" data is in a certain distribution, and the threshold voltage distribution corresponding to the "1111" data is referred to as "Er"-level. The "Er"-level is a threshold voltage distribution in a state in which charge stored in a charge storage layer is removed and thus data is erased, and is a positive or negative value (for example, lower than voltage V1).

"1011", "0101", "1000", "1001", "0001", "0011", "0111", "0101", "1101", "1100", "0100", "0000", "0010",

"0110", and "1110" are each a threshold voltage distribution in a state in which the charge has been injected into the charge storage layer and thus data is considered to be written therein.

The threshold voltage of the memory cell transistor MT that retains "1011" data is within a distribution of a "1" level, and is higher than the threshold voltage in the 0 level (for example, higher than voltage V1 and lower than V2 V1<V2).

The threshold voltage of the memory cell transistor MT that retains "0101" data is within a distribution of a "2" level, and is higher than the threshold voltage in the 1 level (for example, higher than voltage V2 and lower than V3 V2<V3).

The threshold voltage of the memory cell transistor MT that retains "1000" data is within a distribution of a "3" level, and is higher than the threshold voltage in the 2 level (for example, higher than voltage V3 and lower than V4 V3<V4).

The threshold voltage of the memory cell transistor MT that retains "1001" data is within a distribution of a "4" level, and is higher than the threshold voltage in the 3 level (for example, higher than voltage V4 and lower than V5 V4<V5).

The threshold voltage of the memory cell transistor MT that retains "0001" data is within a distribution of a "5" level, and is higher than the threshold voltage in the 4 level (for example, higher than voltage V5 and lower than V6 V5<V6).

The threshold voltage of the memory cell transistor MT that retains "0011" data is within a distribution of a "6" level, and is higher than the threshold voltage in the 5 level (for example, higher than voltage V6 and lower than V7 V6<V7).

The threshold voltage of the memory cell transistor MT that retains "0111" data is within a distribution of a "7" level, and is higher than the threshold voltage in the 6 level (for example, higher than voltage V7 and lower than V8 V7<V8).

The threshold voltage of the memory cell transistor MT that retains "0101" data is within a distribution of an "8" level, and is higher than the threshold voltage in the 7 level (for example, higher than voltage V8 and lower than V9 V8<V9).

The threshold voltage of the memory cell transistor MT that retains "1101" data is within a distribution of a "9" level, and is higher than the threshold voltage in the 8 level (for example, higher than voltage V9 and lower than V10 V9<V10).

The threshold voltage of the memory cell transistor MT that retains "1100" data is within a distribution of an "A"-level, and is higher than the threshold voltage in the 9 level (for example, higher than voltage VA and lower than VB VA<VB).

The threshold voltage of the memory cell transistor MT that retains "0100" data is within a distribution of a "B"-level, and is higher than the threshold voltage in the "A"-level (for example, higher than voltage VB and lower than VC VB<VC).

The threshold voltage of the memory cell transistor MT that retains "0000" data is within a distribution of a "C"-level, and is higher than the threshold voltage in the "B"-level (for example, higher than voltage VC and lower than VD VC<VD).

The threshold voltage of the memory cell transistor MT that retains "0010" data is within a distribution of a "D"-level, and is higher than the threshold voltage in the "C"-level (for example, higher than voltage VD and lower than VE VD<VE).

The threshold voltage of the memory cell transistor MT that retains "0110" data is within a distribution of a "E"-level, and is higher than the threshold voltage in the "D"-level (for example, higher than voltage VE and lower than VF VE<VF).

The threshold voltage of the memory cell transistor MT that retains "1110" data is within a distribution of a "F"-level, and is higher than the threshold voltage in the "E"-level (for example, higher than the voltage VF).

The relationship between the 4-bit data and the threshold voltage is not limited thereto as a matter of design choice, and, for example, a case where "1111" data corresponds to a "G"-level is also applicable. The relationship therebetween may be selected as needed.

<3-1-2> Change in Threshold Voltage Distribution of Memory Cell Transistor During Write Operation Referring now to FIG. 114, a change in threshold voltage distribution of the memory cell transistor during the write operation will be described.

Before the write operation is performed, the threshold voltage distribution of all the memory cells MC in the block assumes an erased state ("0" level) by erase of the block in advance (first state).

When the write operation is performed, the threshold voltage distribution in the erased state ("0" level) is changed to the threshold distribution as in a second state. In the second state, the threshold distributions of the 0 level, the 1 level, the 2 level, the 3 level, the 4 level, the 5 level, the 6 level, the 7 level, the 8 level, the 9 level, the "A"-level, the "B"-level, the "C"-level, the "D"-level, the "E"-level, and the "F"-level are distributed in such a manner that the adjacent threshold voltage distributions overlap with each other, and at this point, the write operation is not completed. When the write operation further proceeds, the threshold voltage distribution in the second state is changed to a 16-value threshold distribution as in a third state. As described thus far, the write operation needs to be repeated until the 16-value threshold voltage distribution as in the third state is achieved.

Figure 114:
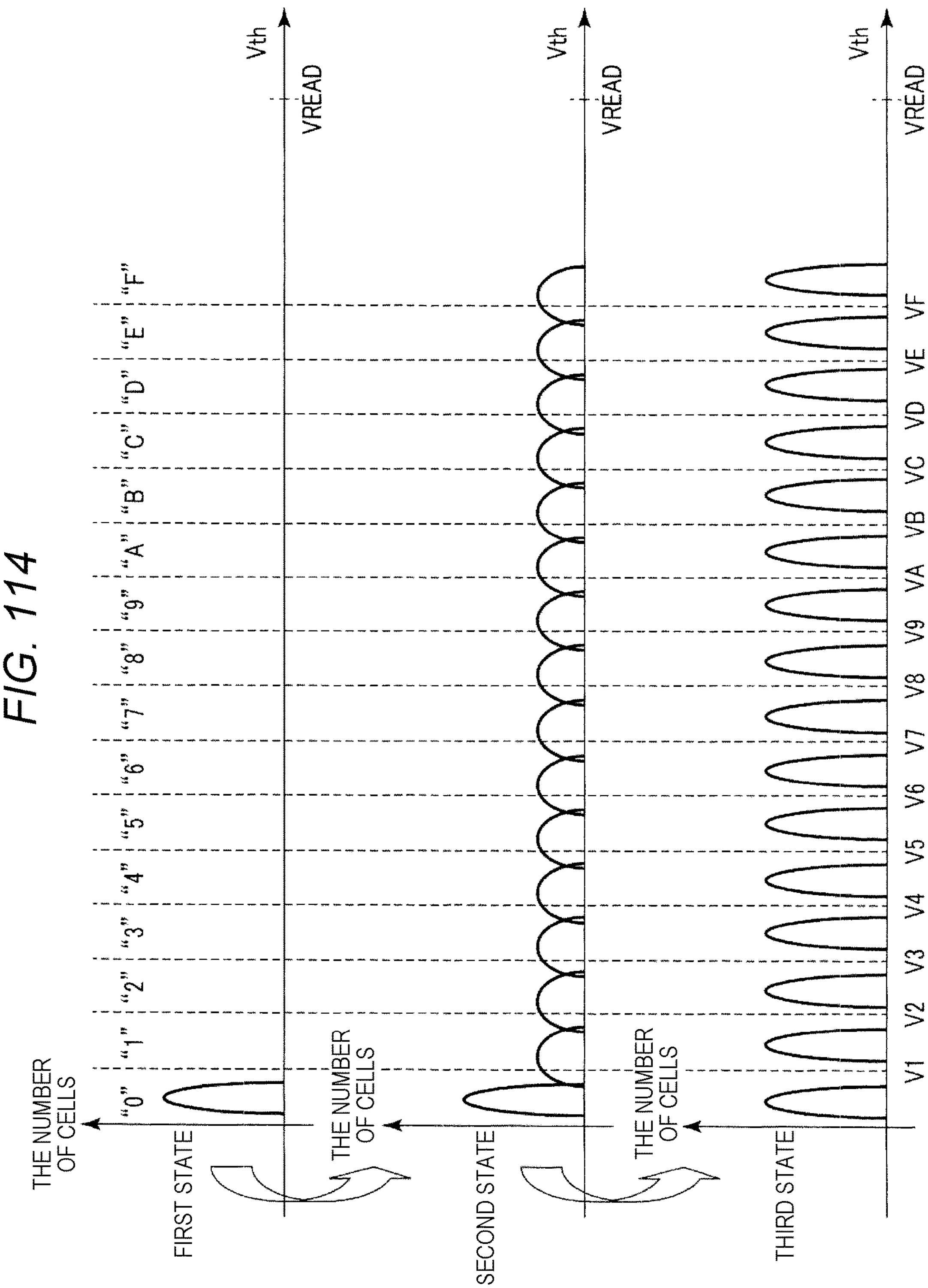
FIG. 114 is a drawing showing changes in the threshold voltage distribution that the memory cell transistor may undergo.

It is noted that although the threshold voltage distribution has been described as being transitioned from the first state to the second state in FIG. 114, and further transitioned from the second state to the third state during the write operation, a writing method is not limited thereto. Specifically, a writing method which causes transition from the first state to the third state is also applicable.

<3-2> Operation

<3-2-1> Example of Order of Performance of Program Operation and Program Verification Operation In the following, the order of performance of the program operation and the program verification operation will be described with reference to FIG. 115.

Figure 115:
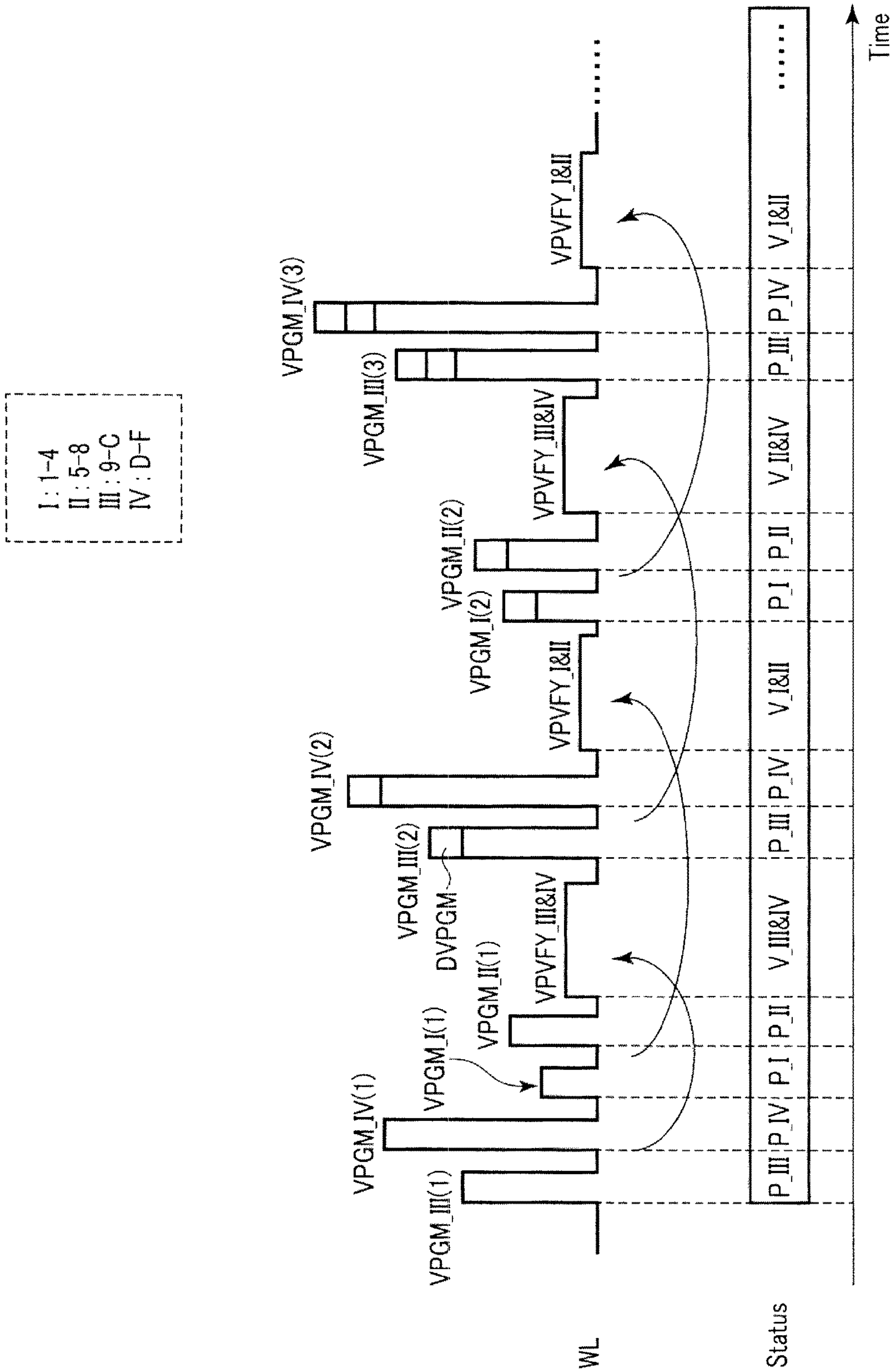
FIG. 115 is a waveform chart schematically showing a waveform of the word line during the write operation.

For easy understanding, FIG. 115 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the third embodiment is divided into first to fourth write operations. It is noted that there are many ways of grouping the first to the fourth write operations. An example is presented in this example.

The first write operation is a write operation for the "1", "2", "3", and "4" levels. The second write operation is a write operation for the "5", "6", "7", and "8" levels. The third write operation is a write operation for the "9", "A", "B", and "C"-levels. The fourth write operation is a write operation for the "D", "E", and "F"-levels.

The first write operation includes the first program operation (P_I) relating to writing for the "1", "2", "3", and "4" levels, and the first program verification operation (V_I) that determines whether or not the first program operation has passed.

The second write operation includes the second program operation (P_II) relating to writing for the "5", "6", "7", and "8" levels, and the second program verification operation (V_II) that determines whether or not the second program operation has passed.

The third write operation includes the third program operation (P_III) relating to writing for the "9", "A", "B" and "C"-levels, and the third program verification operation (V_III) that determines whether or not the third program operation has passed.

The fourth write operation includes the fourth program operation (P_IV) relating to writing for the "D", "E", and "F"-levels and the fourth program verification operation (V_IV) that determines whether or not the fourth program operation has passed.

In the first program operation, the voltage VPGM to be applied to the selected word line WL is expressed as voltage VPGM_I (n). In the same manner, in the second program operation, the voltage VPGM to be applied to the selected word line WL is expressed as voltage VPGM_II (n). In the same manner, in the third program operation, the voltage VPGM to be applied to the selected word line WL is expressed as voltage VPGM_III (n). In the same manner, in the fourth program operation, the voltage VPGM to be applied to the selected word line WL is expressed as voltage VPGM_IV (n). The sign "n" corresponds to the number of times of the first program operation or the second program operation.

The sequencer 111 increments the voltage VPGM_I (n) by the voltage DVPGM every time the first program operation is performed. In the same manner, the sequencer 111 increments the voltage VPGM_II (n) by the voltage DVPGM every time the second program operation is performed. In the same manner, the sequencer 111 increments the voltage VPGM_III (n) by the voltage DVPGM every time the third program operation is performed. In the same manner, the sequencer 111 increments the voltage VPGM_IV (n) by the voltage DVPGM every time the fourth program operation is performed. Every time when the voltage VPGM_I (n) to the voltage VPGM_IV(n) are incremented by the voltage DVPGM, the value n is also incremented.

In the first program verification operation, the voltage VPVFY to be applied to the selected word line WL is expressed as voltage VPVFY_I. In the second program verification operation, the voltage VPVFY to be applied to the selected word line WL is expressed as voltage VPVFY_II. In the third program verification operation, the voltage VPVFY to be applied to the selected word line WL is expressed as voltage VPVFY_III. In the fourth program verification operation, the voltage VPVFY to be applied to the selected word line WL is expressed as voltage VPVFY_IV.

In the example illustrated in FIG. 115, control is performed so that the first program verification operation is not performed immediately after the first program operation, the second program verification operation is not performed immediately after the second program operation, the third program verification operation is not performed immediately after the third program operation, and the fourth program verification operation is not performed immediately after the fourth program operation. However, for example, the case of continuing only one of the first program operation to the fourth program operation is excluded.

In the example illustrated in FIG. 115, the first write operation and the second write operation are performed as a set, and the third write operation and the fourth write operation are performed as a set, as an example.

<3-2-2> Method of Generating Order of Performance of Program Operation and Program Verification Operation A method of generating the order of performance of the program operation and the program verification operation (pulse order) according to the third embodiment will be described with reference to FIG. 116 to FIG. 118.

Step S11601

Figure 116:
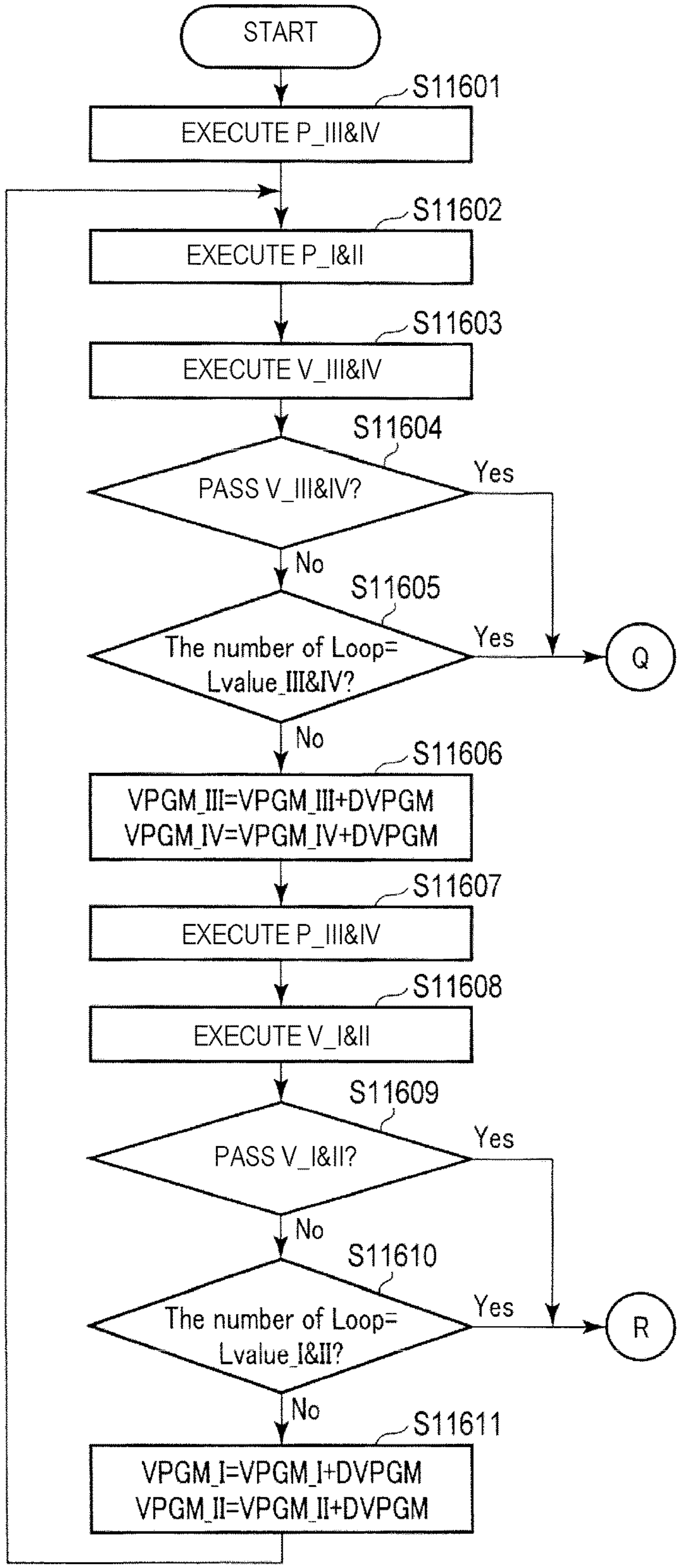
FIGS. 116-118 depict a flowchart showing the method of generating the performance order (pulse order) of the program operation and the program verification operation in the second embodiment.

The sequencer 111 performs the third and the fourth program operations using the voltages VPGM_III and VPGM_IV (see FIG. 116). It is noted that although it is written that "performs the third and the fourth program operations", the third program does not have to be performed if the third write operation is completed. In the same manner, the fourth program does not have to be performed if the fourth write operation is completed. This system is applied to other examples.

Step S11602

The sequencer 111 performs the first and the second program operations using the voltages VPGM_I and VPGM_II. It is noted that although it is written that "performs the first and the second program operations", the first program does not have to be performed if the first write operation is completed. In the same manner, the second program does not have to be performed if the second write operation is completed. This system is applied to other examples.

Step S11603

The sequencer 111 performs the third and the fourth program verification operations relating to the third and the fourth program operations after performing the first and the second program operations. Specifically, the sequencer 111 performs the third and the fourth program verification operations using the voltages VPVFY_III and VPVFY_IV.

In this manner, the sequencer 111 performs other operations between the third and the fourth program operations and the third and the fourth program verification operations. Accordingly, the memory cell transistor subjected to the third and the fourth program operations is left unoperated for a period longer than that in the case where the third and the fourth program verification operations are performed immediately after the third and the fourth program operations by a period corresponding to the first and the second program operations. Consequently, the sequencer 111 can perform the program verification in a state in which electron leakage becomes stable more than the case where the third and the fourth program verification operations are performed immediately after the third and the fourth program operations as described with reference to FIG. 14.

Step S11604

The sequencer 111 determines whether or not the results of the third and the fourth program verification operations are passes. More specifically, the sequencer 111 determines whether or not the numbers of the fail bits determined by the third and the fourth program verification operations are not smaller than the set values (FValue_III&IV). In the case where the numbers of the fail bits are smaller than the set values (FValue_III&IV), the sequencer 111 determines that the results of the third and the fourth program verification operations are passes. The set values (FValue_III&IV) are, for example, the numbers of the fail bits which cannot be rescued by the ECC circuit 206. The set values (FValue_III&IV) are stored, for example, in the register 112. The sequencer 111 compares the set values (FValue_III&IV) stored in the register 112 with the number of the fail bits.

Step S11605

If the sequencer 111 determines that the results of the third and the fourth program verification operations are not passes (NO in Step S11604), the sequencer 111 counts up the numbers of times of repetition of the third and the fourth program operations (the numbers of loops). For example, the numbers of loops of the third and the fourth program operations are stored in the register 112 or the like. The counting of the numbers of loops of the third and the fourth program operations may be performed by the sequencer 111, or may be performed by other units.

Subsequently, the sequencer 111 counts up the numbers of loops and then determines whether or not the numbers of loops of the third and the fourth program operations are the set values (LValue_III&IV). The set values (LValue_III&IV) are stored, for example, in the register 112. The sequencer 111 compares the set values (LValue_III&IV) stored in the register 112 with the numbers of loops of the third and the fourth program operations.

Step S11606

If the sequencer 111 determines that the numbers of loops are not the set values (LValue_III&IV) (NO in Step S11605), the sequencer 111 increments the voltages VPGM_III and VPGM_IV to be used in the third and the fourth program operations by the voltage DVPGM, respectively.

Step S11607

The sequencer 111 performs the third and the fourth program operations using the voltages VPGM_III and VPGM_IV.

Step S11608

The sequencer 111 performs the first and the second program verification operations relating to the first and the second program operations after performing the third and the fourth program operations. Specifically, the sequencer 111 performs the first and the second program verification operations using the voltages VPVFY_I and VPVFY_II.

In this manner, the sequencer 111 performs other operations between the first and the second program operations and the first and the second program verification operations. Accordingly, the sequencer 111, can perform the program verification in a state in which electron leakage becomes stable more than the case where the first and the second program verification operations are performed immediately after the first and the second program operations as described with reference to FIG. 14.

Step S11609

The sequencer 111 determines whether or not the results of the first and the second program verification operations are passes. More specifically, the sequencer 111 determines whether or not the numbers of the fail bits determined by the first and the second program verification operations are not smaller than the set values (FValue_I&II). In the case where the numbers of the fail bits are smaller than the set values (FValue_I&II), the sequencer 111 determines that the results of the first and the second program verification operations are passes. The set values (FValue_I&II) are, for example, the numbers of the fail bits which cannot be rescued by an ECC circuit 206. The set values (FValue_I&II) are stored, for example, in the register 112. In other words, the sequencer 111 compares the set values (FValue_I&II) stored in the register 112 and the numbers of the fail bits determined to be the fail bit by the first and the second program verification operations.

Step S11610

If the sequencer 111 determines that the results of the first and the second program verification operations are not passes (NO in Step S11609), the sequencer 111 counts up the numbers of times of repetition (the numbers of loops) of the first and the second program operations. For example, the numbers of loops of the first and the second program operations are stored in the register 112 or the like. The counting of the numbers of loops of the first and the second program operations may be performed by the sequencer 111, or may be performed by other units.

Subsequently, the sequencer 111 counts up the numbers of loops and then determines whether or not the numbers of loops of the first and the second program operations are the set values (LValue_I&II). The set values (LValue_I&II) are stored, for example, in the register 112. The sequencer 111 compares the set values (LValue_I&II) stored in the register 112 with the numbers of loops of the first and the second program operations.

Step S11611

If the sequencer 111 determines that the numbers of loops are not the set values (LValue_I&II) (NO in Step S11610), the sequencer 111 increments the voltages VPGM_I and VPGM_II to be used in the first and the second program operations by the voltage DVPGM, respectively. Subsequently, Step S11602 is performed.

Step S11701

Figure 117:
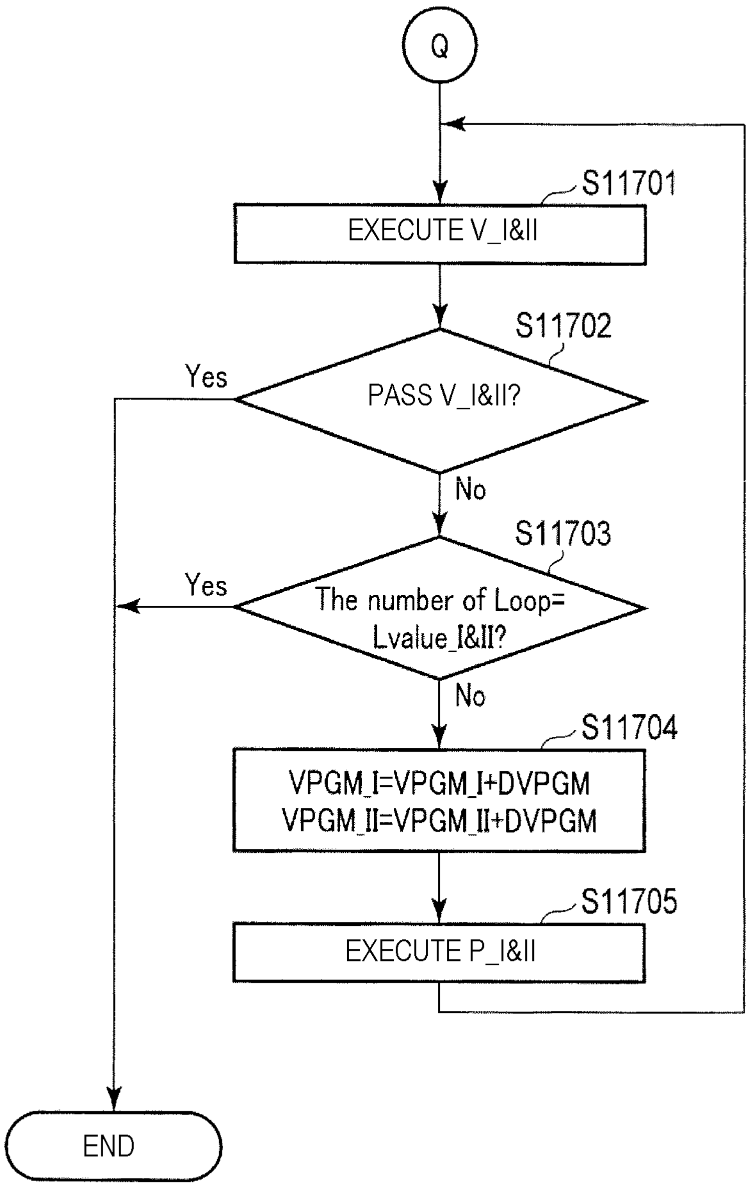

If the sequencer 111 determines that the results of the third and the fourth program verification operations are passes (YES in Step S11604), or determines that the numbers of loops are the set values (LValue_III&IV) (YES in Step S11605), the sequencer 111 performs the same operation as that in Step S11608 (see FIG. 117).

Step S11702

The sequencer 111 determines whether or not the results of the first and the second program verification operations are passes. The sequencer 111 terminates the write operation in a case where the results of the first and the second program verification operations are passes (YES in Step S11702).

Step S11703

If the sequencer 111 determines that the results of the first and the second program verification operations are not passes (NO in Step S11702), the sequencer 111 counts up the numbers of loops relating to the first and the second program operations.

Subsequently, the sequencer 111 determines whether or not the numbers of loops relating to the first and the second program operations are the set values (LValue_I&II). If the sequencer 111 determines that the numbers of loops relating to the first and the second program operations are the set values (LValue_I&II), (YES in Step S11703), the sequencer 111 terminates the write operation.

Step S11704

If the sequencer 111 determines that the numbers of loops relating to the first and the second program operations are not the set values (LValue_I&II) (NO in Step S11703), the sequencer 111 increments the voltages VPGM_I and VPGM_II to be used in the first and the second program operations by the voltage DVPGM, respectively.

Step S11705

The sequencer 111 performs the same operation as that in Step S11602.

Step S11801

Figure 118:
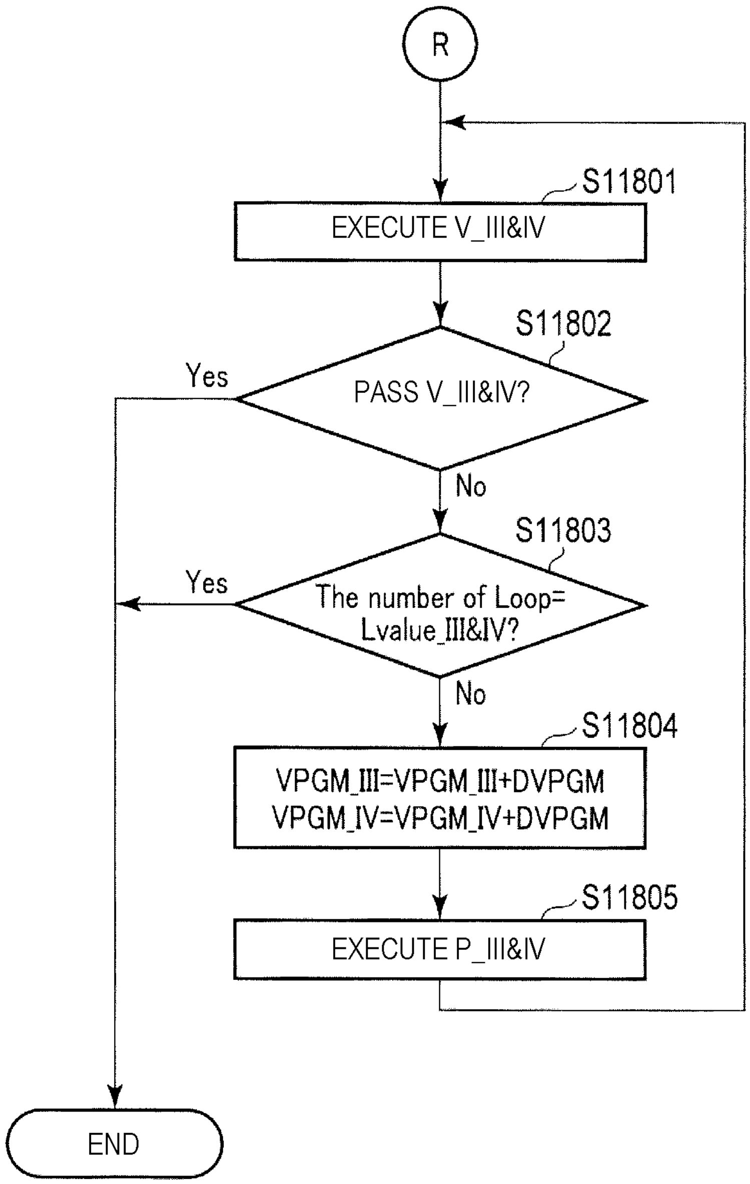

If the sequencer 111 determines that the results of the first and the second program verification operations are passes (YES in Step S11609), or determines that the numbers of loops are the set values (LValue_I&II) (YES in Step S11610), the sequencer 111 performs the same operation as that in Step S11603 (see FIG. 118).

Step S11802

The sequencer 111 determines whether or not the results of the third and the fourth program verification operations are passes. The sequencer 111 terminates the write operation in a case where the results of the third and the fourth program verification operations are passes (YES in Step S11802).

Step S11803

If the sequencer 111 determines that the results of the third and the fourth program verification operations are not passes (NO in Step S11802), the sequencer 111 counts up the numbers of loops relating to the third and the fourth program operations.

Subsequently, the sequencer 111 determines whether or not the numbers of loops relating to the third and the fourth program operations are the set values (LValue_III&IV). If the sequencer 111 determines that the numbers of loops relating to the third and the fourth program operations are the set values (LValue_III&IV), (YES in Step S11803), the sequencer 111 terminates the write operation.

Step S11804

The sequencer 111 performs the same operation as that in Step S11606.

Step S11805

The sequencer 111 performs the same operation as that in Step S11607.

The memory system 1 generates the pulse order in the manner described above.

<3-3> Specific Example

Subsequently, the specific example of the write operation relating to the memory system of the third embodiment will be described.

<3-3-1> Example of Memory Cell Transistor as Writing Destination

Figure 119:
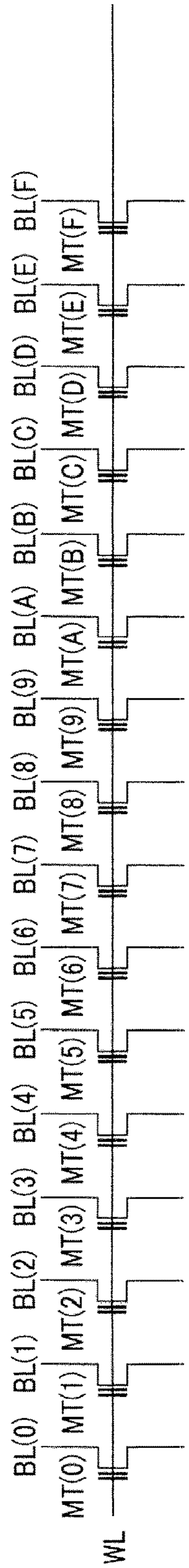
FIG. 119 is a drawing schematically illustrating a memory cell transistor which executes the write operation.

As illustrated in FIG. 119, in this specific example, a case where any one of the 0 level to the "F"-level is written in the plurality of memory cell transistors MT commonly connected to one word line WL will be described for easy understanding. A bit line BL (0) here is connected to a memory cell transistor MT (0) in which data of the 0 level is written. In the same manner, a bit line BL (Y (Y: arbitrary level)) here is connected to a memory cell transistor MT (Y) in which data of the Y level is written.

It is noted that the plurality of memory cell transistors do not necessarily have to be commonly connected to one word line WL in this example. In other words, the same operation may be applied also to a case where the plurality of memory cell transistors are connected to different word lines WL.

<3-3-2> Specific Example of Pulse

Subsequently, referring now to FIG. 120 to FIG. 122, a specific example of the pulse for a case where the write operation of the third embodiment is applied to the memory cell transistors MT described above will be described. The basic operations are the same as those described with reference to FIG. 20 and FIG. 21.

Figure 120:
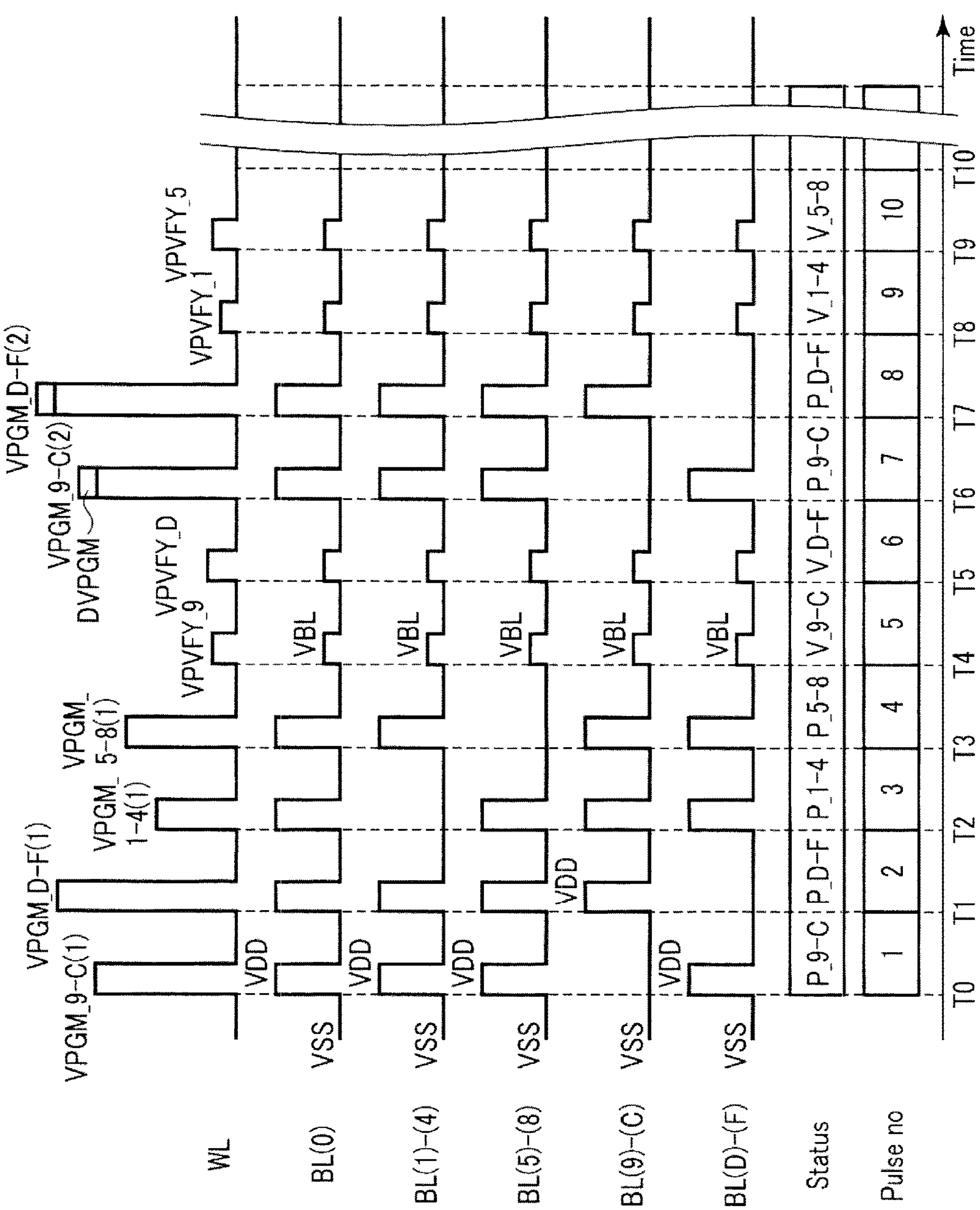
FIG. 120 is a waveform chart showing an example of voltages to be applied to the word lines and the bit lines during the write operation.

FIG. 120 to FIG. 122 illustrate a pulse of (i) and a pulse of (ii), which are roughly classified pulse categories, as described in conjunction with FIG. 20 and FIG. 21.

In the example illustrated in FIG. 120 and FIG. 122, pulses corresponding to the pulse Nos. 1 to 6, 9, 10, 14, 16, 20, 22, 27, 30, 35, 38, 43, 50, and 53 correspond to the pulses of (i).

In the example illustrated in FIG. 120 and FIG. 122, pulses corresponding to the pulses other than Nos. 1 to 6, 9, 10, 14, 16, 20, 22, 27, 30, 35, 38, 43, 50, and 53 correspond to the pulses of (ii).

<3-4> Advantageous Effects

According to the third embodiment described above, the memory system 1 does not perform the first and the second program verification operations immediately after the first and the second program operations, and the third and the fourth program verification operations are not performed immediately after the third and the fourth program operations. Consequently, the same advantageous effects as those of the first embodiment are achieved.

<3-5> Modified Example 1 of Third Embodiment

A modified example 1 of the third embodiment will be described. In the modified example 1 of the third embodiment, a case where a data reading method different from the reading method described above is employed in the third embodiment will be described.

<3-5-1> Read Operation

Subsequently, the data read operation according to the modified example 1 of the third embodiment will be described with reference to FIG. 123.

During the read operation, the sequencer 111 applies the voltage VREAD which turns the memory cell transistor MT ON to the non-selected word lines WL irrespective of retained data. In addition, the voltage VSG which turns the selected transistors ST1 and ST2 ON is applied to the select gate lines SGD and SGS. The voltage of the selected word line rises continuously as illustrated in FIG. 123.

At the timing when the voltages of the selected word line WL reach VZ (Z: arbitrary level), determination is performed whether the threshold voltage of the memory cell transistor MT is within the "Z" level, or within a distribution of the "Z+1" level or higher (this operation is referred to as "read operation ZR"). Then, the result of determination is transferred to the latch circuit 17 (ZR strobe).

Specifically, data is read at a timing when the voltage of the selected word line WL reaches the V1. In other words, as illustrated in FIG. 123, determination is performed whether the threshold voltage of the memory cell transistor MT is included in the "0" level, or is included in a distribution at the "1" level or higher (This operation is referred to as "read operation 1R"). Then, the result of determination is transferred to the latch circuit 17 (1R strobe).

Subsequently, at the timing when the voltages of the selected word line WL reach V2, determination is performed whether the threshold voltage of the memory cell transistor MT is within a distribution of the "1" level or lower, or within a distribution of the "2" level or higher (this operation is referred to as "read operation 2R"). Then, the result of determination is transferred to the latch circuit 17 (2R strobe).

Furthermore, at the timing when the voltages of the selected word line WL reach V3, determination is performed whether the threshold voltage of the memory cell transistor MT is included in the "2" level, or within a distribution of the "3" level or higher (this operation is referred to as "read operation 3R"). Then, the result of determination is transferred to the latch circuit 17 (3R strobe).

In the same manner, the procedure continues to FR strobe.

As described in the modified example 1 of the first embodiment, when driving the selected word line WL via the row decoder 150, variations of voltage differ depending on the location of the memory cell transistor MT.

Figure 123:
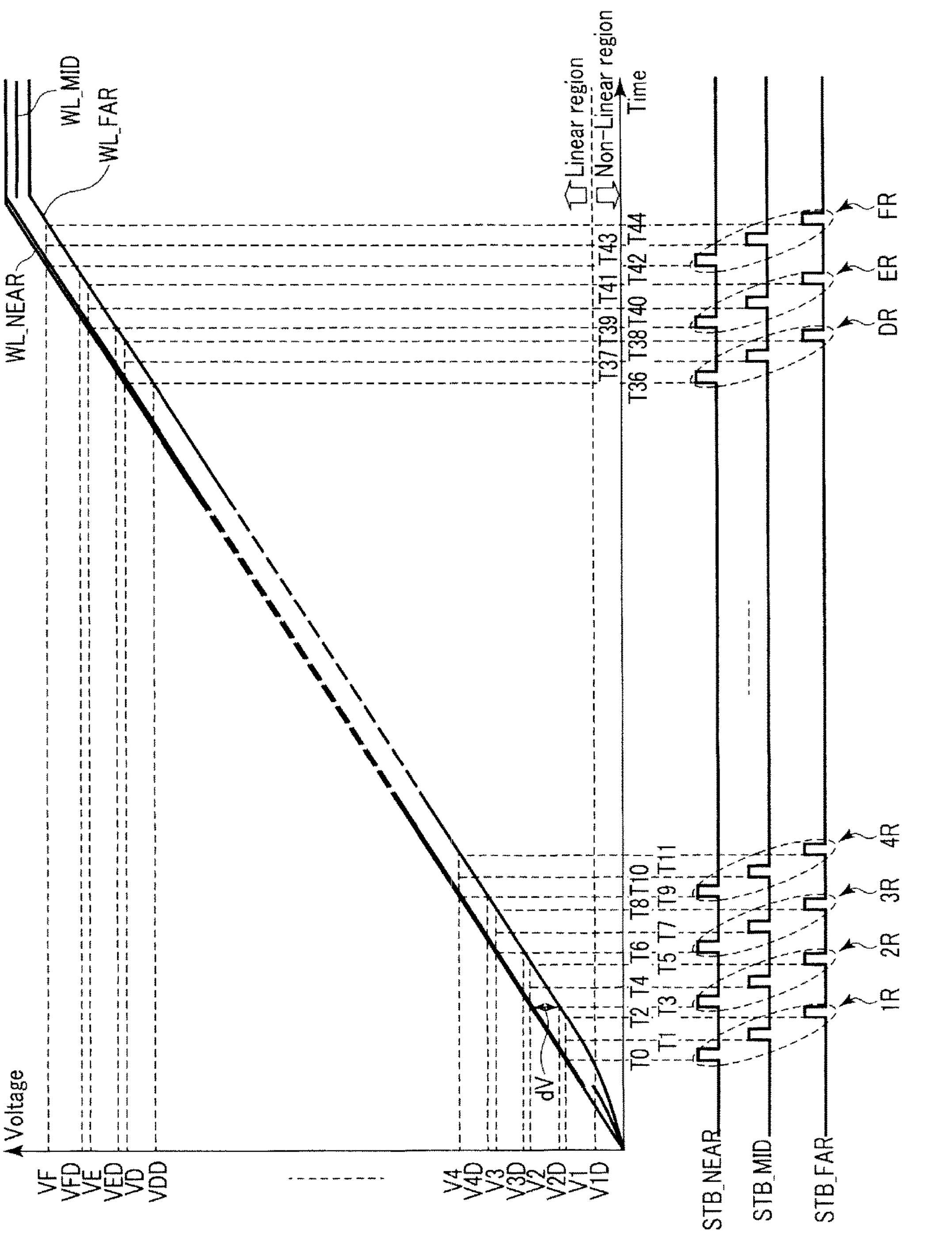
FIG. 123 is a timing chart showing the change in the word line voltage during a read operation and the strobe signal.

Therefore, as illustrated in FIG. 123, the signal STB NEAR is asserted ("H" level) at the time T0. Therefore, data read from the memory cell transistor MT corresponding to the group GP1 is strobed at the time T0. The signal STB_MID is asserted at the time T1. Therefore, data read from the memory cell transistor MT corresponding to the group GP2 is strobed at the time T1. Subsequently, the signal STB_FAR is asserted at the time T2. Therefore, data read from the memory cell transistor MT corresponding to the group GP3 is strobed at the time T2.

As described above, the AR strobe is performed at the timings of time T0, T1, and T2 depending on the location of the memory cell transistor MT. The same applies to the read operations 2R to FR.

This example may be applied to the examples according to the third embodiment.

<3-6> Modified Example 2 of Third Embodiment

A modified example 2 of the third embodiment will be described. In the modified example 2 of the third embodiment, a case where a data writing method different from the writing method described above is employed in the third embodiment will be described.

<3-6-1> Operation

<3-6-1-1> Example of Order of Performance of Program Operation and Program Verification Operation In the following, the order of performance of the program operation and the program verification operation will be described with reference to FIG. 124.

Figure 124:
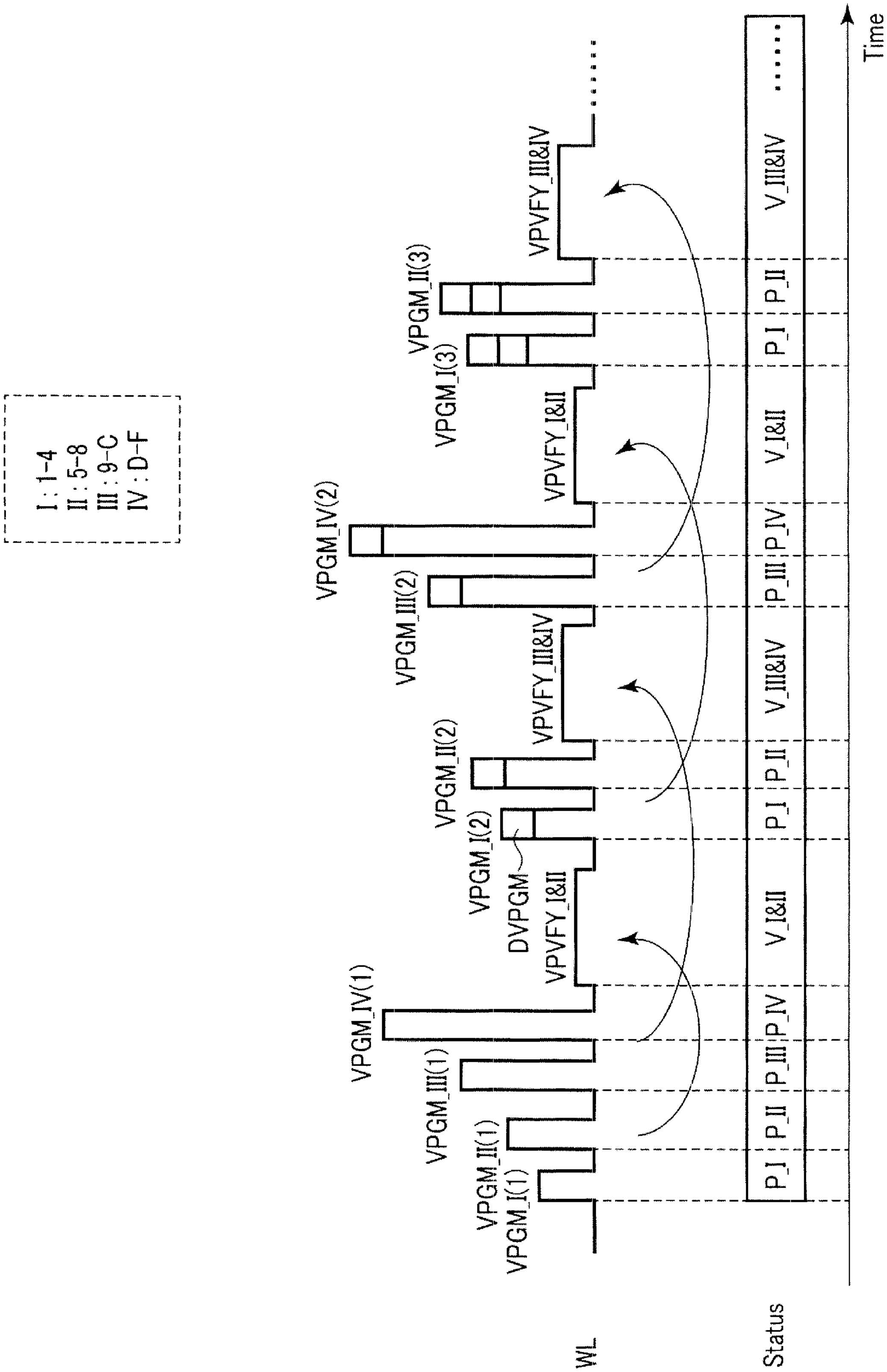
FIG. 124 is a waveform chart showing an example of voltages to be applied to the word lines and the bit lines during the write operation.

For easy understanding, FIG. 124 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation according to the modified example 2 of the third embodiment is divided into first to fourth write operations in the same manner as in the third embodiment.

In the third embodiment, the third and the fourth program operations are performed firstly, and then the first and the second program operations are performed. However, as illustrated in FIG. 124, in the modified example 2 of the third embodiment, the first and the second program operations are performed first, and then the third and the fourth program operations are performed. In this manner, in the modified example 2 of the third embodiment, operations in which the order of performance of the first and the second write operations and the third and the fourth write operations are inverted are performed.

<3-6-1-2> Method of Generating Order of Performance of Program Operation and Program Verification Operation A method of generating the order of performance of the program operation and the program verification operation (pulse order) according to the third embodiment will be described with reference to FIG. 125.

Step S12501

The sequencer 111 performs the same operation as that in Step S11602.

Step S12502

The sequencer 111 performs the same operation as that in Step S11601.

Step S12503

The sequencer 111 performs the same operation as that in Step S11608.

In this manner, the sequencer 111 performs other operations between the first and the second program operations and the first and the second program verification operations. Accordingly, the sequencer 111 is capable of performing the program verification in a state in which the electron leakage becomes stable.

Step S12504

The sequencer 111 performs the same operation as that in Step S11609.

If the sequencer 111 determines that the results of the first and the second program verification operations are passes (YES in Step S12504), the sequencer 111 performs Step S11801.

Step S12505

If the sequencer 111 determines that the results of the first and the second program verification operations are not "pass" (NO in Step S12504), the sequencer 111 counts up the numbers of times of repetition (the numbers of loops) of the first and the second program operations.

Subsequently, the sequencer 111 counts up the numbers of loops and then determines whether or not the number of loops of the first and the second program operations are the set values (LValue_I&II).

If the sequencer 111 determines that the numbers of loops relating to the first and the second program operations are the set values (LValue_I&II) (YES in Step S12505), the sequencer 111 performs Step S11801.

Step S12506

If the sequencer 111 determines that the numbers of loops are not the set values (LValue_I&II) (NO in Step S12505), the sequencer 111 increments the voltages VPGM_I and VPGM_II to be used in the first and the second program operations by the voltage DVPGM, respectively.

Step S12507

The sequencer 111 performs the same operation as that in Step S11602.

Step S12508

The sequencer 111 performs the same operation as that in Step S11603.

In this manner, the sequencer 111 performs other operations between the third and the fourth program operations and the third and the fourth program verification operations. Accordingly, the sequencer 111 is capable of performing the program verification in a state in which the electron leakage becomes stable.

Step S12509

The sequencer 111 performs the same operation as that in Step S11604.

If the sequencer 111 determines that the results of the third and the fourth program verification operations are passes (YES in Step S12509), the sequencer 111 performs Step S11701.

Step S12510

If the sequencer 111 determines that the results of the third and the fourth program verification operations are not passes (NO in Step S12509), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

If the sequencer 111 determines that the numbers of loops relating to the third and the fourth program operations are the set values (LValue_III&IV) (YES in Step S12510), the sequencer 111 performs Step S11701.

Step S12511

If the sequencer 111 determines that the numbers of loops is not the set values (LValue_III&IV) (NO in Step S12510), the sequencer 111 increments the voltages VPGM_III and VPGM_IV to be used in the third and the fourth program operations by the voltage DVPGM, respectively.

Subsequently, the sequencer 111 performs Step S12502.

<3-6-2> Specific Example of Pulse

Subsequently, referring now to FIG. 126 to FIG. 128, a specific example of the pulse for a case where the write operation of the third embodiment is applied to the memory cell transistors MT described above will be described. The basic operations are the same as those described with reference to FIG. 20 and FIG. 21.

Figure 126:
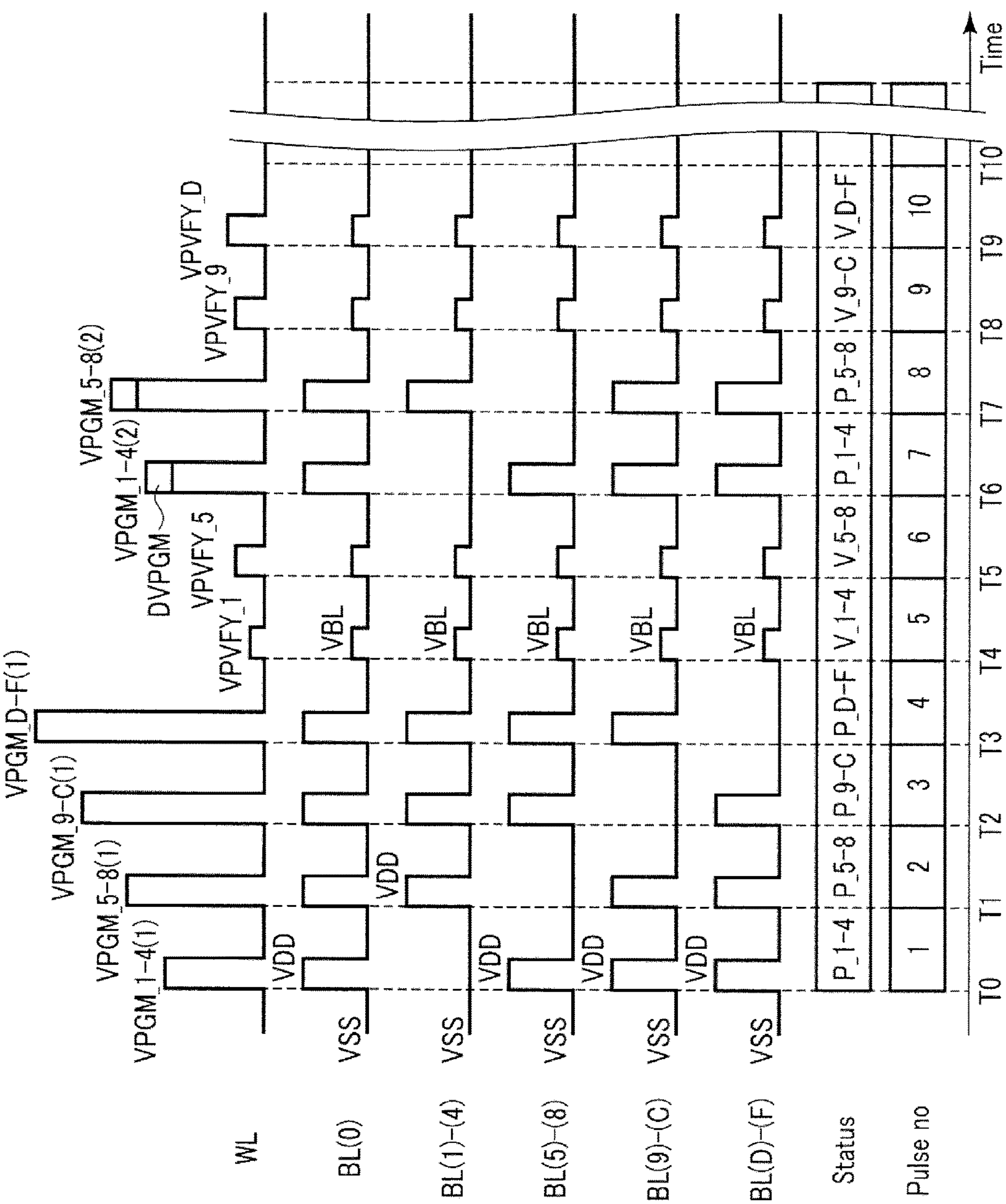
FIG. 126 is a waveform chart showing an example of voltages to be applied to the word lines and the bit lines during the write operation.

FIG. 126 to FIG. 128 illustrate the pulse of (i) and the pulse of (ii), which are roughly classified pulse categories, as described in conjunction with FIG. 20 and FIG. 21.

In the example illustrated in FIG. 126 to FIG. 128, pulses corresponding to the pulse Nos. 1 to 6, 9, 10, 14, 16, 20, 22, 27, 30, 35, 38, 43, 46, and 51 correspond to the pulses of (i).

In the example illustrated in FIG. 126 to FIG. 128, pulses corresponding to the pulses other than Nos. 1 to 6, 9, 10, 14, 16, 20, 22, 27, 30, 35, 38, 43, 46, and 51 correspond to the pulses of (ii).

<3-7> Modified Example 3 of Third Embodiment

A modified example 3 of the third embodiment will be described. In the modified example 3 of the third embodiment, a case where a data writing method different from the writing method described above is employed in the third embodiment will be described.

<3-7-1> Operation

<3-7-1-1> Example of Order of Performance of Program Operation and Program Verification Operation In the following, the order of performance of the program operation and the program verification operation will be described with reference to FIG. 129.

Figure 129:
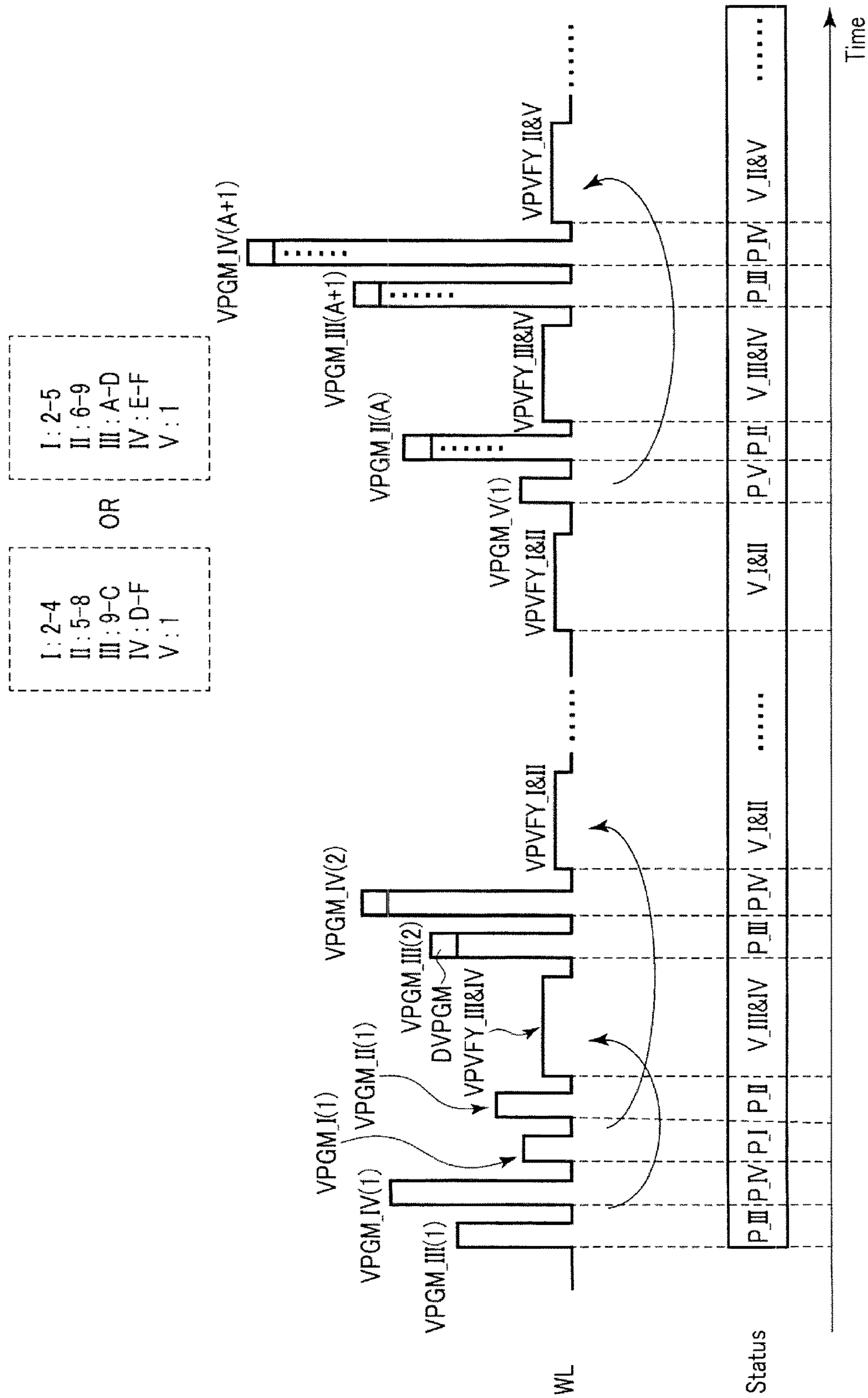
FIG. 129 is a waveform chart schematically showing a waveform of the word line during the write operation.

For easy understanding, FIG. 129 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 3 of the third embodiment is divided into first to fifth write operations. It is noted that there are many ways of grouping the first to the fifth write operations. Two examples are presented in this example 3.

The first write operation is a write operation for the "2 to "4" levels as an example. The second write operation is a write operation for the "5" to "8" levels. The third write operation is a write operation for the "9" to "C"-levels. The fourth write operation is a write operation for the "D" to "F"-levels. The fifth write operation is a write operation for the level "1".

As another example, the first write operation is a write operation for the "2" to "5" levels. The second write operation is a write operation for the "6" to "9" levels. The third write operation is a write operation for the "A" to "D"-levels. The fourth write operation is a write operation for the "E" and "F"-levels. The fifth write operation is a write operation for the level "1".

The first write operation includes a first program operation (P_I) relating to writing for the "2" to "4" (or "2" to "5") levels, and a first program verification operation (V_I) that determines whether or not the first program operation has passed.

The second write operation includes the second program operation (P_II) relating to writing for the "5" to "8" (or "6" to "9") levels, and the second program verification operation (V_II) that determines whether or not the second program operation has passed.

The second write operation includes the third program operation (P_III) relating to writing for the "9" to "C" (or "A" to "D") levels, and the third program verification operation (V_III) that determines whether or not the third program operation has passed.

The fourth write operation includes the fourth program operation (P_IV) relating to writing for the "D" to "F" (or "E" and "F") levels and the fourth program verification operation (V_IV) that determines whether or not the fourth program operation has passed.

The fifth write operation includes the fifth program operation (P_V) relating to writing for the "1" level, and the fifth program verification operation (V_V) that determines whether or not the fifth program operation has passed.

The sequencer 111 increments the voltages VPGM_I (n) to VPGM_V (n) by the voltage DVPGM every time the first to the fifth program operations are performed.

In the first to the fifth program verification operations, the voltage VPVFY to be applied to the selected word line WL is expressed as the voltages VPVFY_I to VPVFY_V, respectively.

In the example illustrated in FIG. 129, control is performed so that the first program verification operation is not performed immediately after the first program operation, the second program verification operation is not performed immediately after the second program operation, the third program verification operation is not performed immediately after the third program operation, the fourth program verification operation is not performed immediately after the fourth program operation, and the fifth program verification operation is not performed immediately after the fifth program operation. The fifth program operation is performed after conditions have been satisfied.

<3-7-1-2> Method of Generating Order of Performance of Program Operation and Program Verification Operation Referring now to FIG. 130 to FIG. 143, a method of generating the order of performance of the program operation and the program verification operation according to the modified example 3 of the third embodiment will be described.

Step S13001

Figure 130:
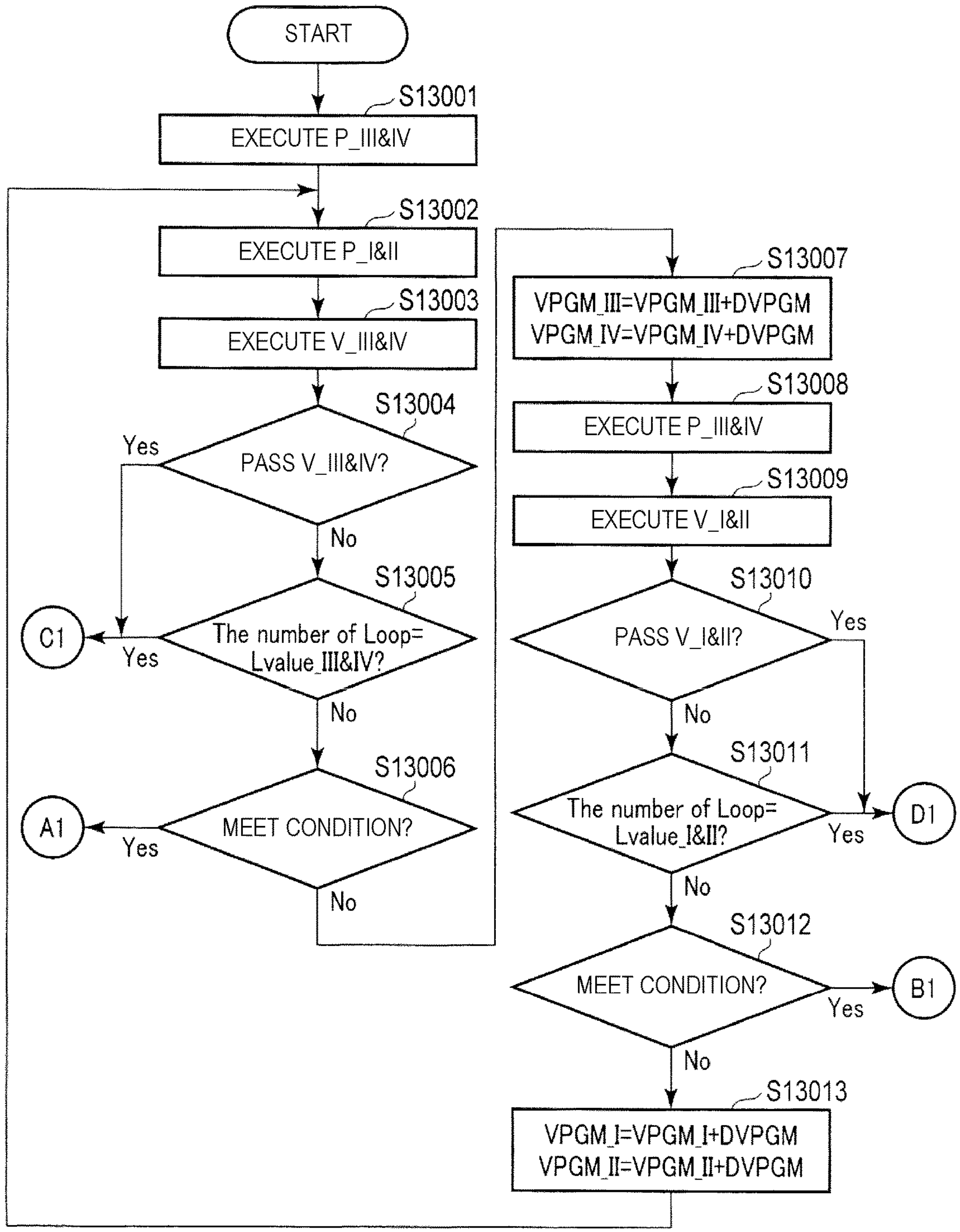
FIGS. 130-143 depict a flowchart showing the method of generating the performance order (pulse order) of the program operation and the program verification operation in the third embodiment.

The sequencer 111 performs the same operation as that in Step S11601 (see FIG. 130).

Step S13002

The sequencer 111 performs the same operation as that in Step S11602.

Step S13003

The sequencer 111 performs the same operation as that in Step S11603.

Step S13004

The sequencer 111 performs the same operation as that in Step S11604.

Step S13005

If the sequencer 111 determines that the results of the third and the fourth program verification operations are not passes (NO in Step S13004), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

Step S13006

If the sequencer 111 determines that the numbers of loops of the third and the fourth program operations are not the set values (LValue_III&IV) (NO in Step S13005), the sequencer 111 determines whether or not the condition is satisfied.

Step S13007

If the sequencer 111 determines that the condition is not satisfied (NO in Step S13006), the sequencer 111 increments the voltages VPGM_III and VPGM_IV to be used in the third and the fourth program operations by the voltage DVPGM, respectively.

Step S13008

The sequencer 111 performs the same operation as that in Step S11601.

Step S13009

The sequencer 111 performs the same operation as that in Step S11608.

Step S13010

The sequencer 111 performs the same operation as that in Step S11609.

Step S13011

If the sequencer 111 determines that the results of the first and the second program verification operations are not passes (NO in Step S13010), the sequencer 111 counts up the numbers of times of repetition (the numbers of loops) of the first and the second program operations.

Subsequently, the sequencer 111 counts up the number of loops and then determines whether or not the number of loops of the first and the second program operations are the set values (LValue_I&II).

Step S13012

If the sequencer 111 determines that the numbers of loops of the first and the second program operations are not the set values (LValue_I&II) (NO in Step S13011), the sequencer 111 determines whether or not the condition is satisfied.

Step S13013

If the sequencer 111 determines that the condition is not satisfied (NO in Step S13012), the sequencer 111 increments the voltages VPGM_I and VPGM_II to be used in the first and the second program operations by the voltage DVPGM, respectively.

Subsequently, the sequencer 111 performs Step S13002.

Step S13101

Figure 131:
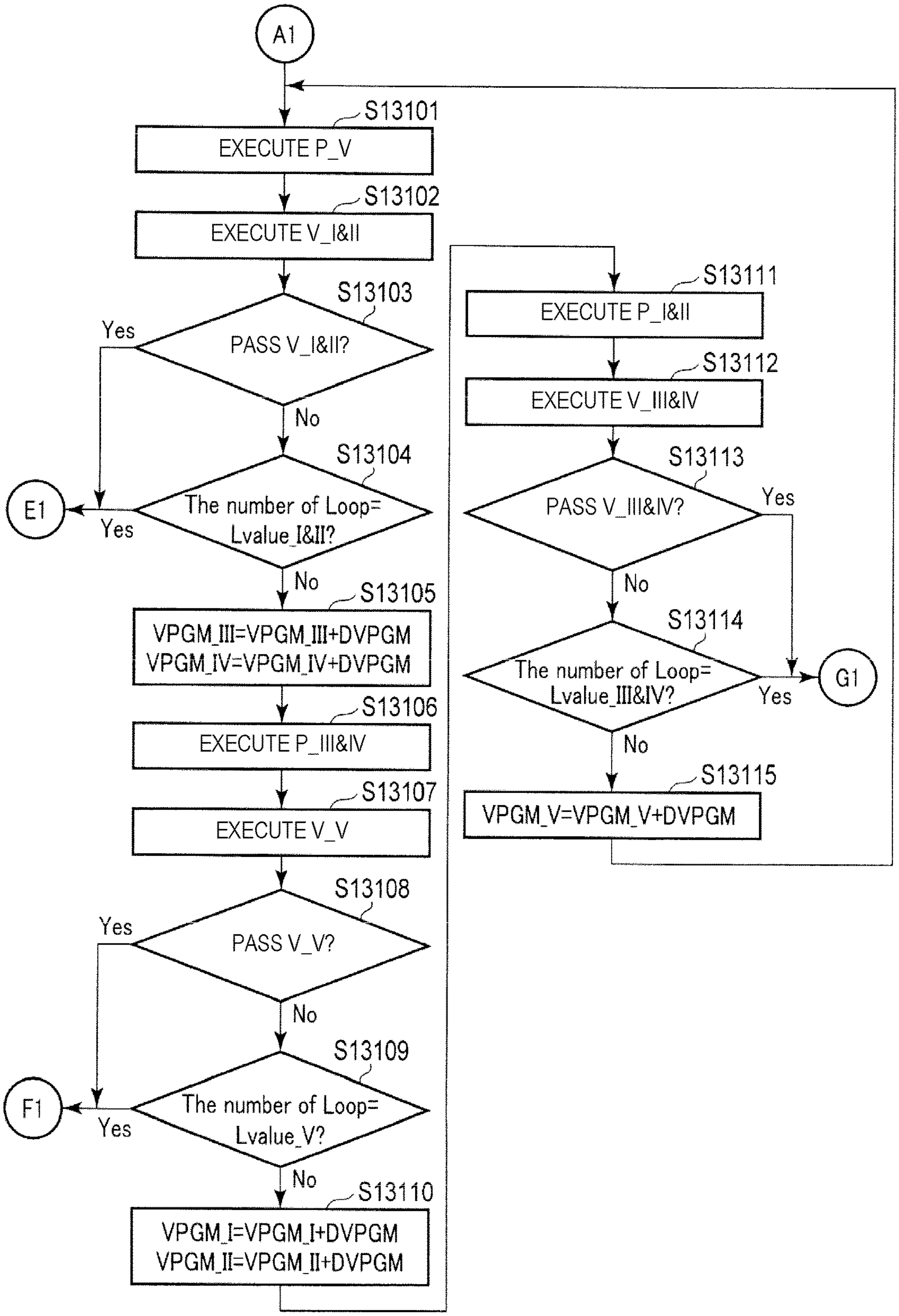

If the sequencer 111 determines that the condition is satisfied (YES in Step S13006), the sequencer 111 performs the fifth program operation by using the voltage VPGM_V (see FIG. 131).

Step S13102

The sequencer 111 performs the same operation as that in Step S11608.

Step S13103

The sequencer 111 performs the same operation as that in Step S11609.

Step S13104

If the sequencer 111 determines that the results of the first and the second program verification operations are not passes (NO in Step S13103), the sequencer 111 counts up the numbers of times of repetition (the numbers of loops) of the first and the second program operations.

Subsequently, the sequencer 111 counts up the numbers of loops and then determines whether or not the numbers of loops of the first and the second program operations are the set values (LValue_I&II).

Step S13105

If the sequencer 111 determines that the results of the first and the second program verification operations are not passes (NO in Step S13104), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

Step S13106

The sequencer 111 performs the same operation as that in Step S11601.

Step S13107

The sequencer 111 performs the third and the fourth program operations and then performs the fifth program verification operation relating to the fifth program operation. Specifically, the sequencer 111 performs the fifth program verification operation using the voltage VPVFY_V.

Step S13108

The sequencer 111 determines whether or not the result of the fifth program verification operation is a pass. More specifically, the sequencer 111 determines whether or not the number of the fail bits determined by the fifth program verification operation to be a fail bit is not smaller than a set value (FValue_V). In the case where the number of the fail bits is smaller than the set value (FValue_V), the sequencer 111 determines that the result of the fifth program verification operation is a pass. The set value (FValue_V) is, for example, the number of the fail bits which cannot be rescued by the ECC circuit 206. The set value (FValue_V) is stored, for example, in the register 112. The sequencer 111 compares the set values (FValue_V) stored in the register 112 with the number of the fail bits.

Step S13109

If the sequencer 111 determines that the result of the fifth program verification operation is not a pass (NO in Step S13108), the sequencer 111 counts up the number of times of repetition (the numbers of loops) of the fifth program operation. For example, the number of loops of the fifth program operation is stored in the register 112 or the like. The counting of the number of loops of the fifth program operation may be performed by the sequencer 111, or may be performed by other units.

Subsequently, the sequencer 111 counts up the number of loops and then determines whether or not the number of loops of the fifth program operation is a set value (LValue_V). The set value (LValue_V) is stored, for example, in the register 112. The sequencer 111 compares the set value (LValue_V) stored in the register 112 with the number of loops of the fifth program operation.

Step S13110

If the sequencer 111 determines that the number of loops is not the set value (LValue_V) (NO in Step S13109), the sequencer 111 increments the voltages VPGM_I and VPGM_II to be used in the first and the second program operations by the voltage DVPGM, respectively.

Step S13111

The sequencer 111 performs the same operation as that in Step S11602.

Step S13112

The sequencer 111 performs the same operation as that in Step S11603.

Step S13113

The sequencer 111 performs the same operation as that in Step S11604.

Step S13114

If the sequencer 111 determines that the results of the third and the fourth program verification operations are not passes (NO in Step S13113), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

Step S13115

If the sequencer 111 determines that the numbers of loops are not the set values (LValue_III&IV) (NO in Step S13114), the sequencer 111 increments the voltage VPGM_V to be used in the fifth program operation by the voltage DVPGM.

Subsequently, the sequencer 111 performs Step S13101.

Step S13201

Figure 132:
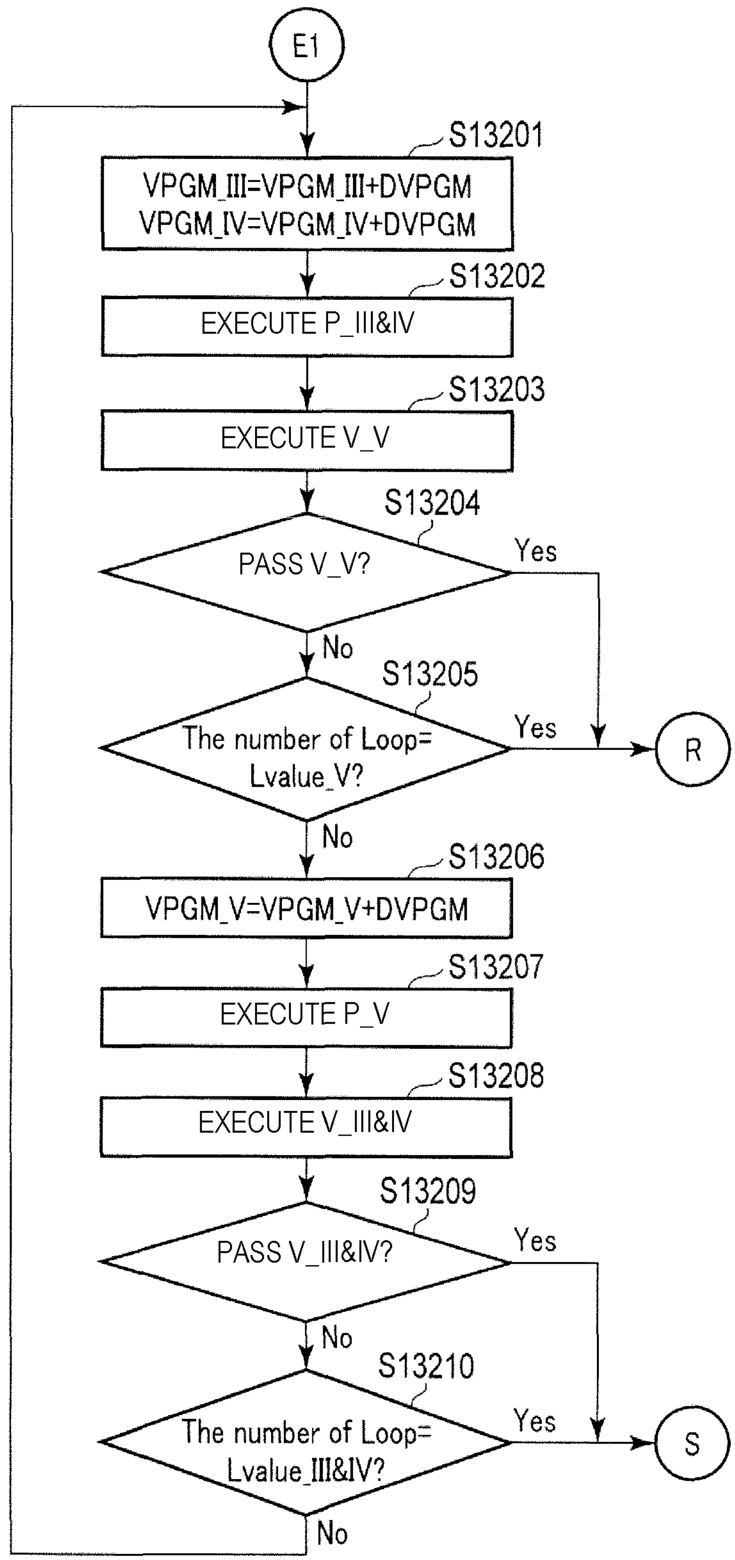

If the sequencer 111 determines that the results of the first and the second program verification operations pass (YES in Step S13103), or determines that the results of the first and the second program verification operations are passes (YES in Step S13104), the sequencer 111 increments the voltages VPGM_III and VPGM_IV to be used in the third and the fourth program operations by the voltage DVPGM, respectively (see FIG. 132).

Step S13202

The sequencer 111 performs the same operation as that in Step S11601.

Step S13203

The sequencer 111 performs the same operation as that in Step S13107.

Step S13204

The sequencer 111 performs the same operation as that in Step S13108.

If the sequencer 111 determines that the result of the fifth program verification operation is a pass (YES in Step S13204), the sequencer 111 performs Step S11801.

Step S13205

If the sequencer 111 determines that the result of the fifth program verification operation is not a pass (NO in Step S13204), the sequencer 111 counts up the numbers of times of repetition (the numbers of loops) of the fifth program operation.

Subsequently, the sequencer 111 counts up the number of loops and then determines whether or not the number of loops of the fifth program operation is the set value (LValue_V).

If the sequencer 111 determines that the number of loops of the fifth program operation is the set value (LValue_V) (YES in Step S13205), the sequencer 111 performs Step S11801.

Step S13206

If the sequencer 111 determines that the number of loops is not the set value (LValue_V) (NO in Step S13205), the sequencer 111 increments the voltage VPGM_V to be used in the fifth program operation by the voltage DVPGM.

Step S13207

The sequencer 111 performs the same operation as that in Step S13101.

Step S13208

The sequencer 111 performs the same operation as that in Step S11603.

Step S13209

The sequencer 111 performs the same operation as that in Step S11604.

Step S13210

If the sequencer 111 determines that the results of the third and the fourth program verification operations are not passes (NO in Step S13209), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

If the sequencer 111 determines that the numbers of loops of the third and the fourth program operations are not the set values (LValue_III&IV) (NO in Step S13210), the sequencer 111 performs Step S13201.

Step S13301

Figure 133:
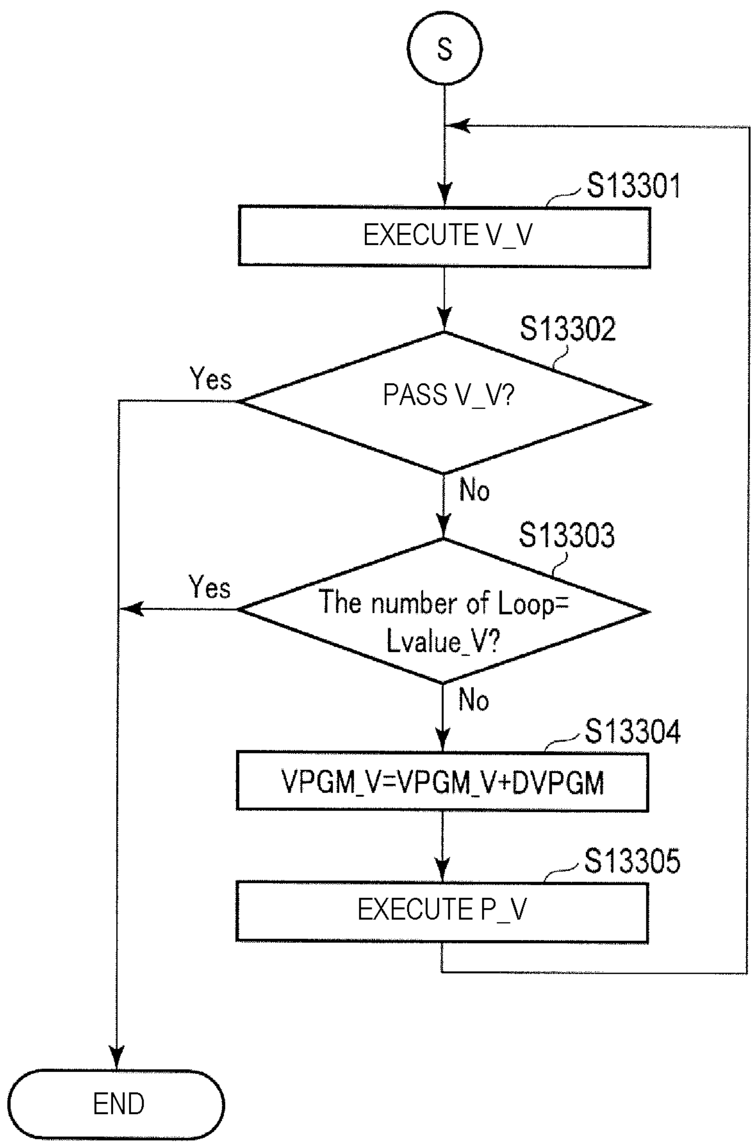

If the sequencer 111 determines that the results of the third and the fourth program verification operations are passes (YES in Step S13209), or determines that the numbers of loops of the third and the fourth program operations are the set values (LValue_III&IV) (YES in Step S13210), the sequencer 111 performs the same operation as that in Step S13107 (see FIG. 133).

Step S13302

The sequencer 111 performs the same operation as that in Step S13108.

The sequencer 111 terminates the write operation if the result of the fifth program verification operation is a pass (YES in Step S13302).

Step S13303

If the sequencer 111 determines that the result of the fifth program verification operation is not a pass (NO in Step S13302), the sequencer 111 counts up the numbers of times of repetition (the numbers of loops) of the fifth program operation.

Subsequently, the sequencer 111 counts up the number of loops and then determines whether or not the number of loops of the fifth program operation is the set value (LValue_V).

If the sequencer 111 determines that the number of loops of the fifth program operation is the set value (LValue_V) (YES in Step S13303), the sequencer 111 terminates the write operation.

Step S13304

If the sequencer 111 determines that the number of loops of the fifth program operation is not the set value (LValue_V) (NO in Step S13303), the sequencer 111 increments the voltage VPGM_V to be used in the fifth program operation by the voltage DVPGM.

Step S13305

The sequencer 111 performs the same operation as that in Step S13107.

Subsequently, the sequencer 111 performs Step S13301.

Step S13401

Figure 134:
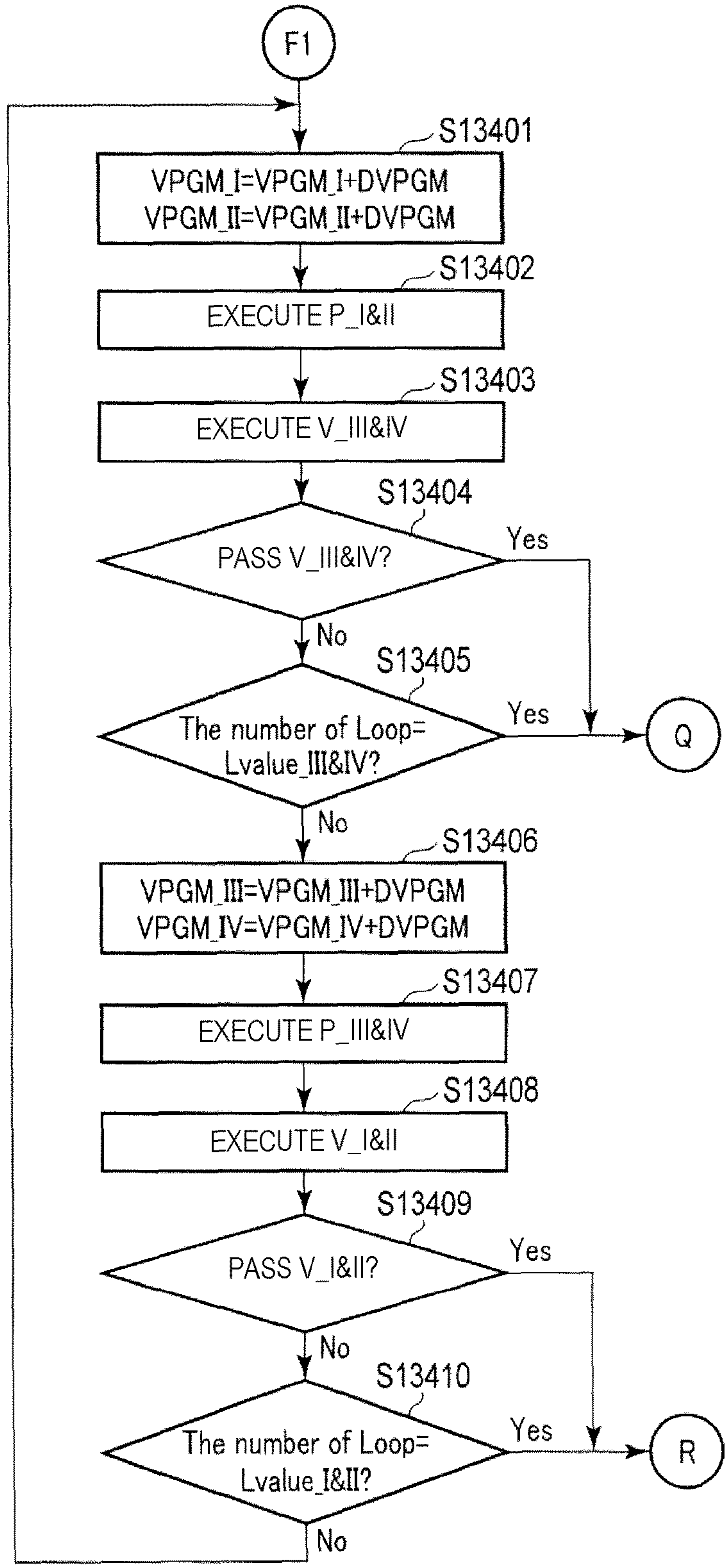

If the sequencer 111 determines that the result of the fifth program verification operation is a pass (YES in Step S13108), or determines that the number of loops is the set value (LValue_V) (YES in Step S13109), the sequencer 111 increments the voltages VPGM_I and VPGM_II to be used in the first and the second program operations by the voltage DVPGM, respectively (see FIG. 134).

Step S13402

The sequencer 111 performs the same operation as that in Step S11602.

Step S13403

The sequencer 111 performs the same operation as that in Step S11603.

Step S13404

The sequencer 111 performs the same operation as that in Step S11604.

If the sequencer 111 determines that the results of the third and the fourth program verification operations are passes (YES in Step S13404), the sequencer 111 performs Step S11701.

Step S13405

If the sequencer 111 determines that the results of the third and the fourth program verification operations are not passes (NO in Step S13404), the sequencer 111 counts up the numbers of times (the numbers of loops) of repetition of the third and the fourth program operations.

Subsequently, the sequencer 111 counts up the numbers of loops and then determines whether or not the numbers of loops of the third and the fourth program operations are the set values (LValue_III&IV).

If the sequencer 111 determines that the numbers of loops of the third and the fourth program operations are the set values (LValue_III&IV) (YES in Step S13405), the sequencer 111 performs Step S11701.

Step S13406

If the sequencer 111 determines that the numbers of loops are not the set values (LValue_III&IV) (NO in Step S13405), the sequencer 111 increments the voltages VPGM_III and VPGM_IV to be used in the third and the fourth program operations by the voltage DVPGM, respectively.

Step S13407

The sequencer 111 performs the same operation as that in Step S11601.

Step S13408

The sequencer 111 performs the same operation as that in Step S11608.

Step S13409

The sequencer 111 performs the same operation as that in Step S11609.

If the sequencer 111 determines that the results of the first and the second program verification operations are passes (YES in Step S13409), the sequencer 111 performs Step S11801.

Step S13410

If the sequencer 111 determines that the results of the first and the second program verification operations are not passes (NO in Step S13409), the sequencer 111 counts up the numbers of times (the numbers of loops) of repetition of the first and the second program operations.

Subsequently, the sequencer 111 counts up the numbers of loops and then determines whether or not the numbers of loops of the first and the second program operations are the set values (LValue_I&II).

If the sequencer 111 determines that the numbers of loops of the first and the second program operations are the set values (LValue_I&II), (YES in Step S13410), the sequencer 111 performs Step S11801.

If the sequencer 111 determines that the numbers of loops of the first and the second program operations are not the set values (LValue_I&II), (NO in Step S13410), the sequencer 111 performs Step S13401.

Step S13501

Figure 135:
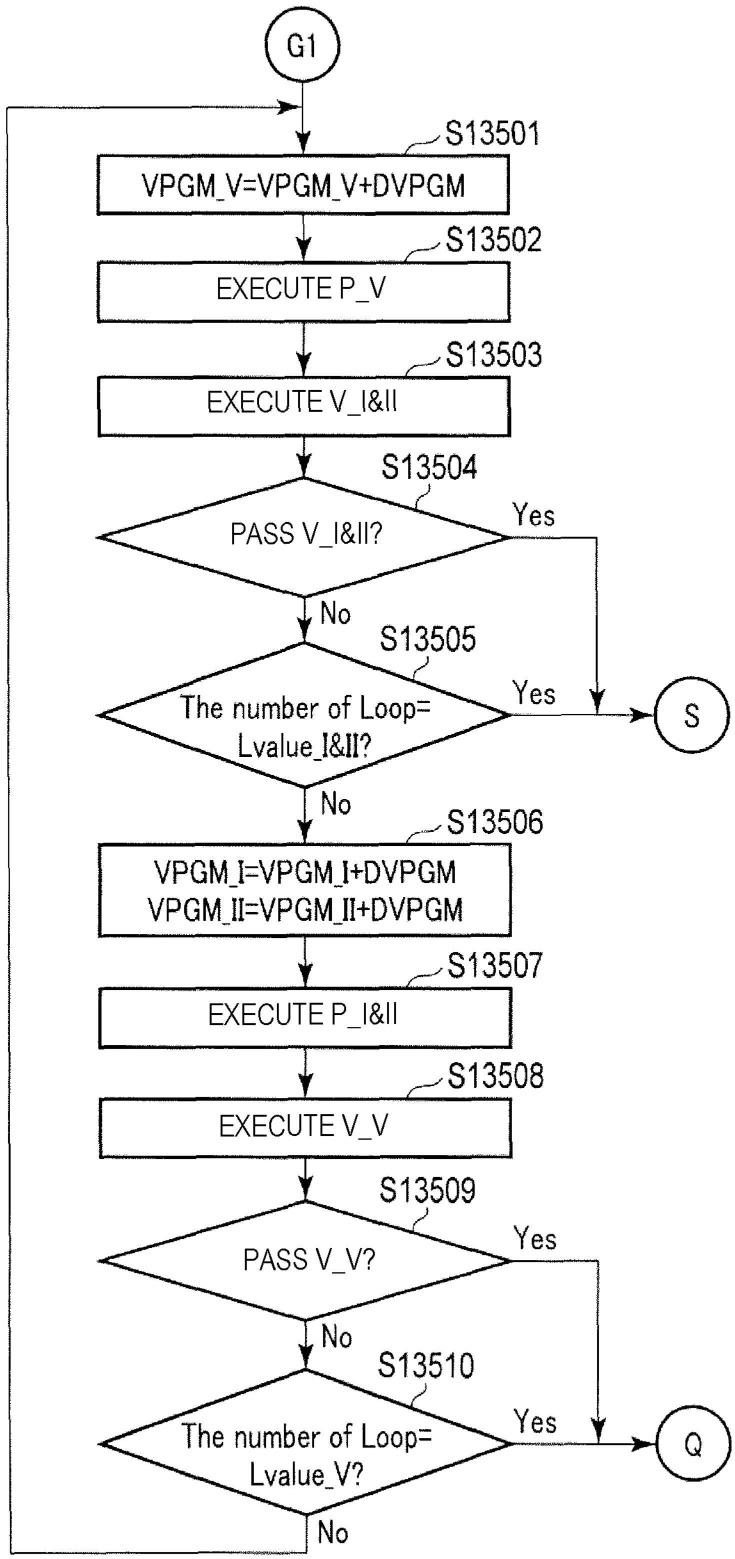

If the sequencer 111 determines that the results of the third and the fourth program verification operations are passes (YES in Step S13113), or determines that the numbers of loops are the set values (LValue_III&IV) (YES in Step S13114), the sequencer 111 increments the voltage VPGM_V to be used in the fifth program operation by the voltage DVPGM (see FIG. 135).

Step S13502

The sequencer 111 performs the same operation as that in Step S13101.

Step S13503

The sequencer 111 performs the same operation as that in Step S11608.

Step S13504

The sequencer 111 performs the same operation as that in Step S11609.

If the sequencer 111 determines that the results of the first and the second program verification operations are passes (YES in Step S13504), the sequencer 111 performs Step S13301.

Step S13505

If the sequencer 111 determines that the results of the first and the second program verification operations are not passes (NO in Step S13504), the sequencer 111 counts up the numbers of times of repetition (the numbers of loops) of the first and the second program operations.

Subsequently, the sequencer 111 counts up the numbers of loops and then determines whether or not the numbers of loops of the first and the second program operations are the set values (LValue_I&II).

If the sequencer 111 determines that the numbers of loops of the first and the second program operations are the set values (LValue_I&II), (YES in Step S13505), the sequencer 111 performs Step S13301.

Step S13506

If the sequencer 111 determines that the numbers of loops of the first and the second program operation are not the set values (LValue_I&II) (NO in Step S13505), the sequencer 111 increments the voltages VPGM_I and VPGM_II to be used in the first and the second program operations by the voltage DVPGM, respectively.

Step S13507

The sequencer 111 performs the same operation as that in Step S11602.

Step S13508

The sequencer 111 performs the same operation as that in Step S13107.

Step S13509

The sequencer 111 performs the same operation as that in Step S13108.

If the sequencer 111 determines that the result of the fifth program verification operation is a pass (YES in Step S13509), the sequencer 111 performs Step S11701.

Step S13510

If the sequencer 111 determines that the result of the fifth program verification operation is not a pass (NO in Step S13509), the sequencer 111 counts up the numbers of times of repetition (the numbers of loops) of the fifth program operation.

Subsequently, the sequencer 111 counts up the number of loops and then determines whether or not the number of loops of the fifth program operation is the set value (LValue_V).

If the sequencer 111 determines that the number of loops of the fifth program operation is the set value (LValue_V) (YES in Step S13510), the sequencer 111 performs Step S11701.

If the sequencer 111 determines that the number of loops of the fifth program operation is not the set value (LValue_V) (NO in Step S13510), the sequencer 111 performs Step S13501.

Step S13601

Figure 136:
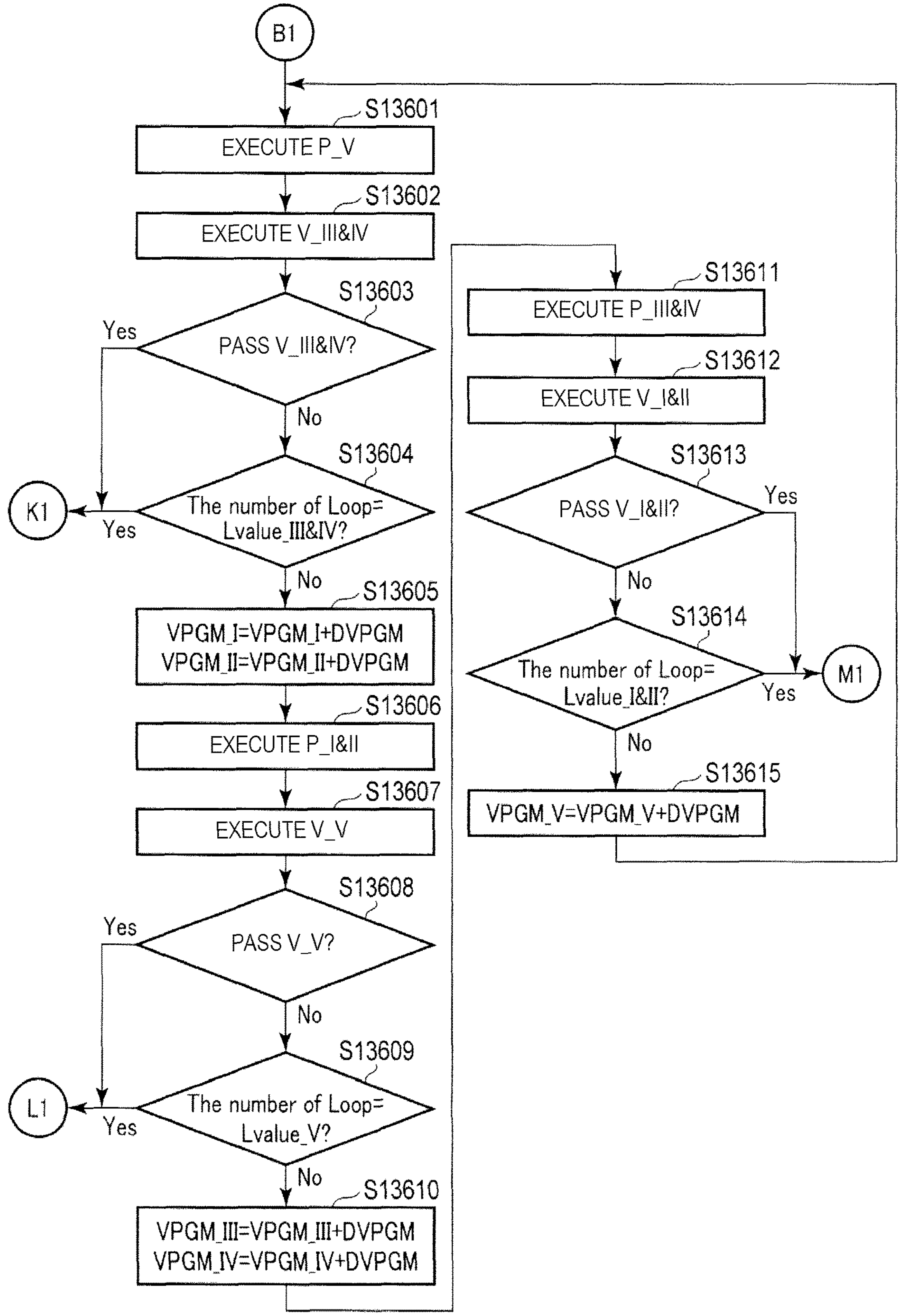

If the sequencer 111 determines that the condition is satisfied (YES in Step S13012), the sequencer 111 performs the same operation as that in Step S13101 (see FIG. 136).

Step S13602

The sequencer 111 performs the same operation as that in Step S11603.

Step S13603

The sequencer 111 performs the same operation as that in Step S11604.

Step S13604

If the sequencer 111 determines that the results of the third and the fourth program verification operations are not passes (NO in Step S13603), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

Step S13605

If the sequencer 111 determines that the numbers of loops are not the set values (LValue_III&IV) (NO in Step S13604), the sequencer 111 increments the voltages VPGM_I and VPGM_II to be used in the first and the second program operations by the voltage DVPGM, respectively.

Step S13606

The sequencer 111 performs the same operation as that in Step S11602.

Step S13607

The sequencer 111 performs the same operation as that in Step S13107.

Step S13608

The sequencer 111 performs the same operation as that in Step S13108.

Step S13609

If the sequencer 111 determines that the result of the fifth program verification operation is not a pass (NO in Step S13608), the sequencer 111 counts up the numbers of times of repetition (the numbers of loops) of the fifth program operation.

Subsequently, the sequencer 111 counts up the number of loops and then determines whether or not the number of loops of the fifth program operation is the set value (LValue_V).

Step S13610

If the sequencer 111 determines that the number of loops is not the set value (LValue_V) (NO in Step S13609), the sequencer 111 increments the voltages VPGM_III and VPGM_IV to be used in the third and the fourth program operations by the voltage DVPGM, respectively.

Step S13611

The sequencer 111 performs the same operation as that in Step S11601.

Step S13612

The sequencer 111 performs the same operation as that in Step S11608.

Step S13613

The sequencer 111 performs the same operation as that in Step S11609.

Step S13614

If the sequencer 111 determines that the results of the first and the second program verification operations are not passes (NO in Step S13613), the sequencer 111 counts up the numbers of times of repetition (the numbers of loops) of the first and the second program operations.

Subsequently, the sequencer 111 counts up the numbers of loops and then determines whether or not the numbers of loops of the first and the second program operations are the set values (LValue_I&II).

Step S13615

If the sequencer 111 determines that the numbers of loops are not the set values (LValue_I&II) (NO in Step S13614), the sequencer 111 increments the voltage VPGM_V to be used in the fifth program operation by the voltage DVPGM.

Subsequently, the sequencer 111 performs Step S13601.

Step S13701

Figure 137:
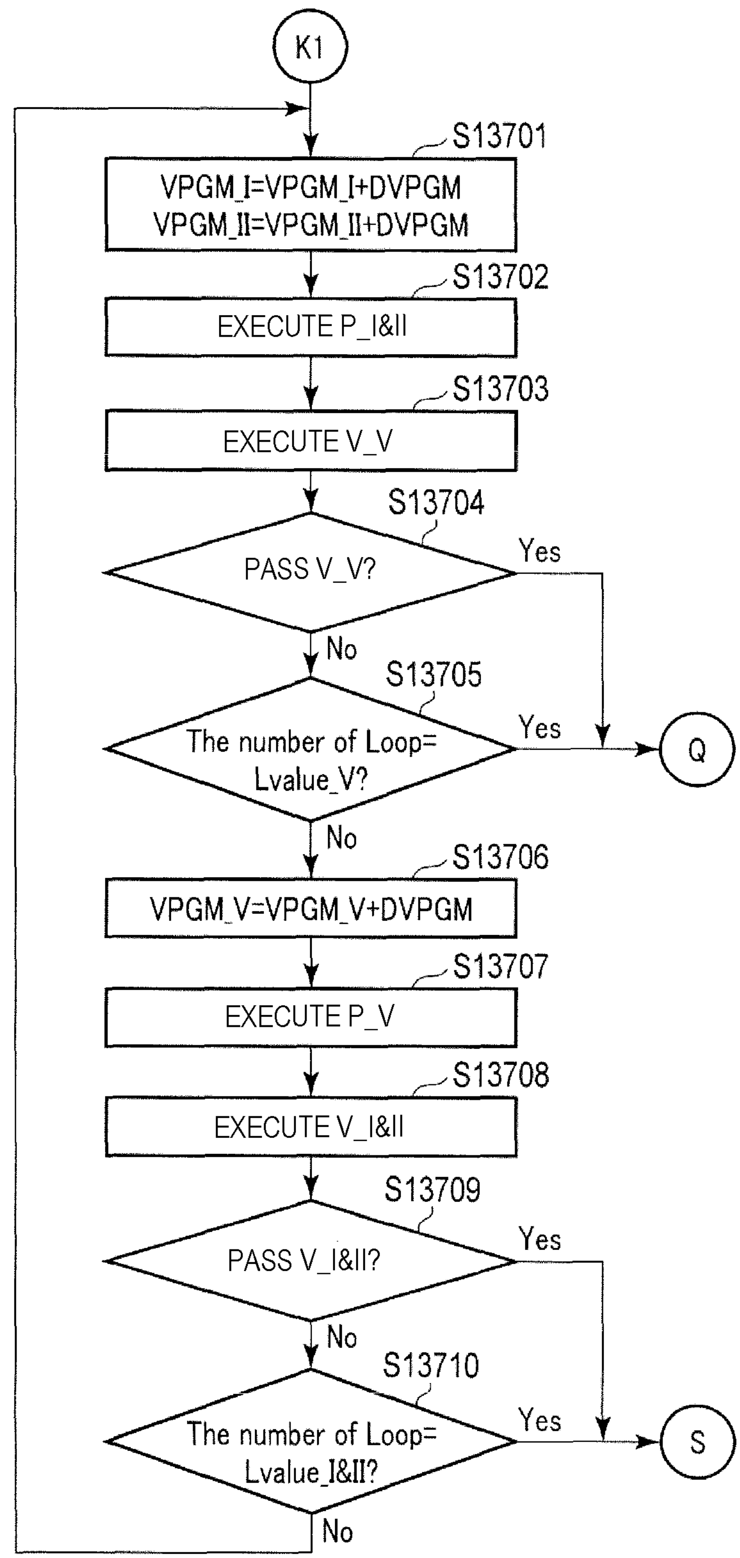

If the sequencer 111 determines that the results of the third and the fourth program verification operations are passes (YES in Step S13603), or the sequencer 111 determines that the numbers of loops are the set values (LValue_III&IV) (YES in Step S13604), the sequencer 111 increments the voltages VPGM_I and VPGM_II to be used in the first and the second program operations by the voltage DVPGM, respectively (see FIG. 137).

Step S13702

The sequencer 111 performs the same operation as that in Step S11602.

Step S13703

The sequencer 111 performs the same operation as that in Step S13107.

Step S13704

The sequencer 111 performs the same operation as that in Step S13108.

If the sequencer 111 determines that the result of the fifth program verification operation is a pass (YES in Step S13704), the sequencer 111 performs Step S11701.

Step S13705

If the sequencer 111 determines that the result of the fifth program verification operation is not a pass (NO in Step S13704), the sequencer 111 counts up the number of times of repetition (the numbers of loops) of the fifth program operation.

Subsequently, the sequencer 111 counts up the number of loops and then determines whether or not the number of loops of the fifth program operation is the set value (LValue_V).

If the sequencer 111 determines that the number of loops of the fifth program operation is the set value (LValue_V) (YES in Step S13705), the sequencer 111 performs Step S11701.

Step S13706

If the sequencer 111 determines that the number of loops of the fifth program operation is not the set value (LValue_V) (NO in Step S13705), the sequencer 111 increments the voltage VPGM_V to be used in the fifth program operation by the voltage DVPGM.

Step S13707

The sequencer 111 performs the same operation as that in Step S13101.

Step S13708

The sequencer 111 performs the same operation as that in Step S11608.

Step S13709

The sequencer 111 performs the same operation as that in Step S11609.

If the sequencer 111 determines that the results of the first and the second program verification operations are passes (YES in Step S13709), the sequencer 111 performs Step S13301.

Step S13710

If the sequencer 111 determines that the results of the first and the second program verification operations are not passes (NO in Step S13709), the sequencer 111 counts up the numbers of times of repetition (the numbers of loops) of the first and the second program operations.

Subsequently, the sequencer 111 counts up the numbers of loops and then determines whether or not the numbers of loops of the first and the second program operations are the set values (LValue_I&II).

If the sequencer 111 determines that the numbers of loops of the first and the second program operations are the set values (LValue_I&II), (YES in Step S13710), the sequencer 111 performs Step S13301.

If the sequencer 111 determines that the numbers of loops of the first and the second program operations are not the set values (LValue_I&II), (NO in Step S13710), the sequencer 111 performs Step S13701.

Step S13801

Figure 138:
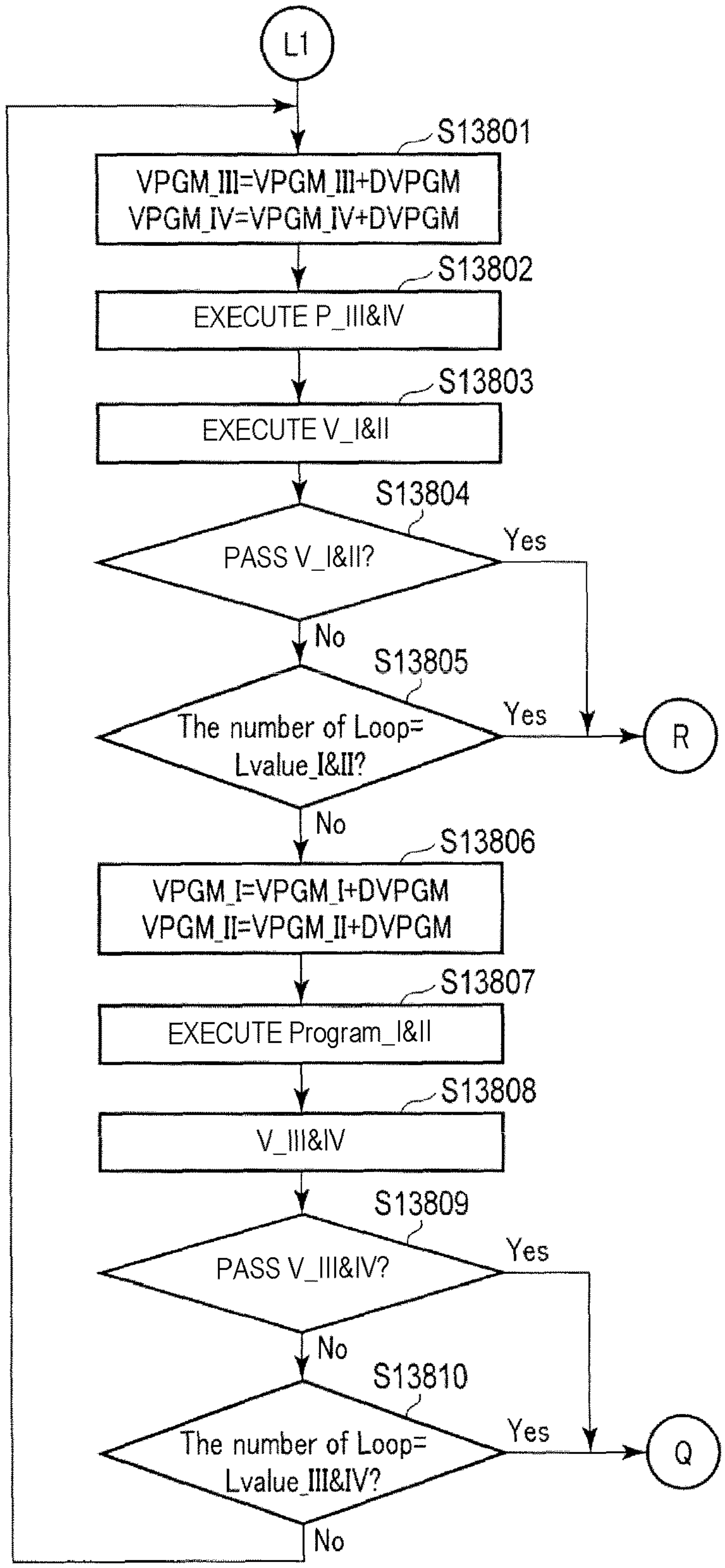

If the sequencer 111 determines that the result of the fifth program verification operation is a pass (YES in Step S13608), or determines that the number of loops is the set value (LValue_V) (YES in Step S13609), the sequencer 111 increments the voltages VPGM_III and VPGM_IV to be used in the third and the fourth program operations by the voltage DVPGM, respectively (see FIG. 138).

Step S13802

The sequencer 111 performs the same operation as that in Step S11601.

Step S13803

The sequencer 111 performs the same operation as that in Step S11608.

Step S13804

The sequencer 111 performs the same operation as that in Step S11609.

If the sequencer 111 determines that the results of the first and the second program verification operations are passes (YES in Step S13804), the sequencer 111 performs Step S11801.

Step S13805

If the sequencer 111 determines that the results of the first and the second program verification operations are not passes (NO in Step S13804), the sequencer 111 counts up the numbers of times of repetition (the numbers of loops) of the first and the second program operations.

Subsequently, the sequencer 111 counts up the number of loops and then determines whether or not the number of loops of the first and the second program operations are the set values (LValue_I&II).

If the sequencer 111 determines that the numbers of loops of the first and the second program operations are the set values (LValue_I&II), (YES in Step S13805), the sequencer 111 performs Step S11801.

Step S13806

If the sequencer 111 determines that the numbers of loops of the first and the second program operation are not the set values (LValue_I&II) (NO in Step S13805), the sequencer 111 increments the voltages VPGM_I and VPGM_II to be used in the first and the second program operations by the voltage DVPGM, respectively.

Step S13807

The sequencer 111 performs the same operation as that in Step S11602.

Step S13808

The sequencer 111 performs the same operation as that in Step S11603.

Step S13809

The sequencer 111 performs the same operation as that in Step S11604.

If the sequencer 111 determines that the results of the third and fourth program verification operations are passes (YES in Step S13809), the sequencer 111 performs Step S11701.

Step S13810

If the sequencer 111 determines that the results of the third and the fourth program verification operations are not passes (NO in Step S13809), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

If the sequencer 111 determines that the numbers of loops of the third and the fourth program operations are the set values (LValue_III&IV), (YES in Step S13810), the sequencer 111 performs Step S11701.

If the sequencer 111 determines that the numbers of loops of the third and the fourth program operations are not the set values (LValue_III&IV), (NO in Step S13810), the sequencer 111 performs Step S13801.

Step S13901

Figure 139:
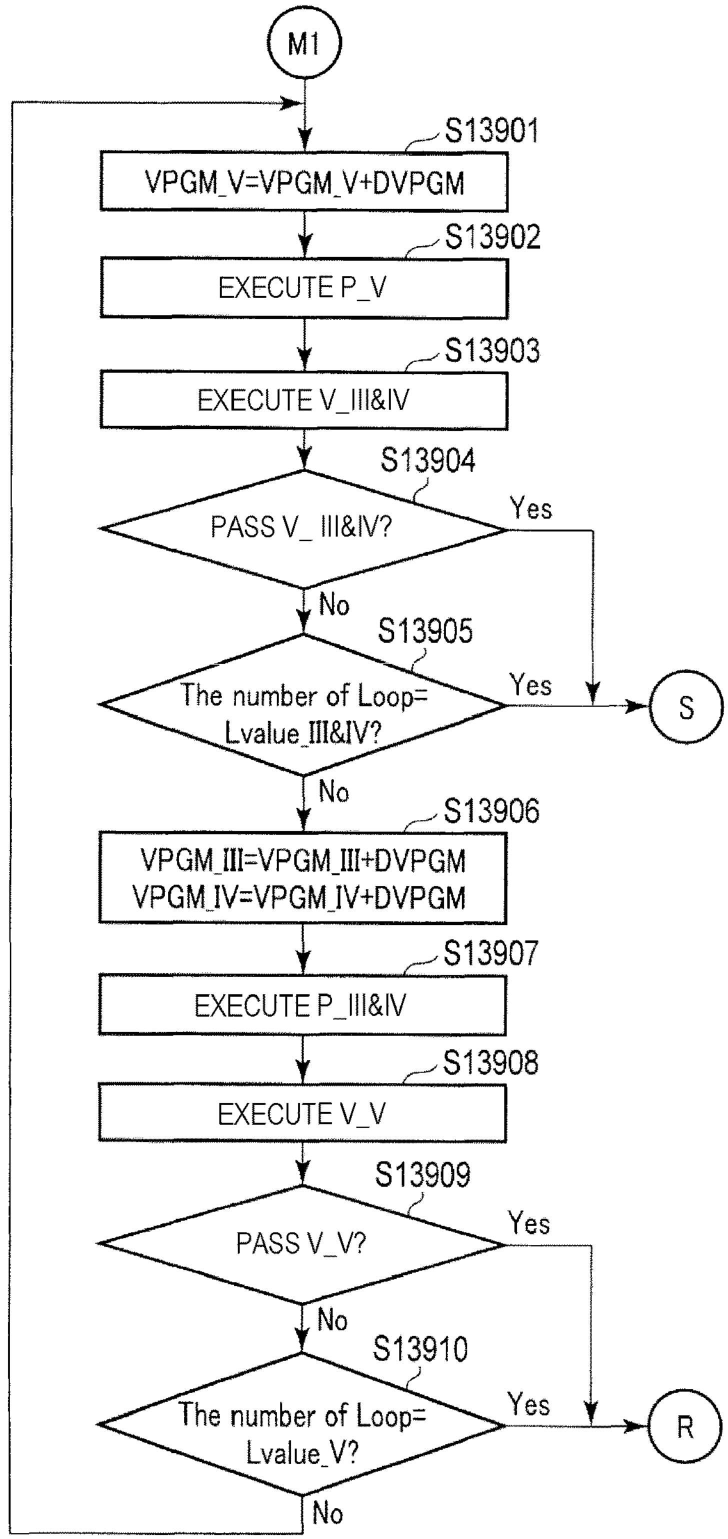

If the sequencer 111 determines that the results of the first and the second program verification operations are passes (YES in Step S13613), or determines that the numbers of the loops are the set values (LValue_I&II) (YES in Step S13614), the sequencer 111 increments the voltage VPGM_V to be used in the fifth program operation by the voltage DVPGM (see FIG. 139).

Step S13902

The sequencer 111 performs the same operation as that in Step S13101.

Step S13903

The sequencer 111 performs the same operation as that in Step S11603.

Step S13904

The sequencer 111 performs the same operation as that in Step S11604.

If the sequencer 111 determines that the results of the third and fourth program verification operations are passes (YES in Step S13904), the sequencer 111 performs Step S13301.

Step S13905

If the sequencer 111 determines that the results of the third and the fourth program verification operations are not passes (NO in Step S13904), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

If the sequencer 111 determines that the numbers of loops of the third and the fourth program operations are the set values (LValue_III&IV), (YES in Step S13905), the sequencer 111 performs Step S13301.

Step S13906

If the sequencer 111 determines that the numbers of loops of the third and the fourth program operation are not the set values (LValue_III&IV) (NO in Step S13905), the sequencer 111 increments the voltages VPGM_III and VPGM_IV to be used in the third and the fourth program operations by the voltage DVPGM, respectively.

Step S13907

The sequencer 111 performs the same operation as that in Step S11601.

Step S13908

The sequencer 111 performs the same operation as that in Step S13107.

Step S13909

The sequencer 111 performs the same operation as that in Step S13108.

If the sequencer 111 determines that the result of the fifth program verification operation is a pass (YES in Step S13909), the sequencer 111 performs Step S11801.

Step S13910

If the sequencer 111 determines that the result of the fifth program verification operation is not a pass (NO in Step S13909), the sequencer 111 counts up the number of times of repetition (the numbers of loops) of the fifth program operation.

Subsequently, the sequencer 111 counts up the number of loops and then determines whether or not the number of loops of the fifth program operation is the set value (LValue_V).

If the sequencer 111 determines that the number of loops of the fifth program operation is the set value (LValue_V) (YES in Step S13910), the sequencer 111 performs Step S11801.

If the sequencer 111 determines that the number of loops of the fifth program operation is not the set value (LValue_V) (NO in Step S13910), the sequencer 111 performs Step S13901.

Step S14001

Figure 140:
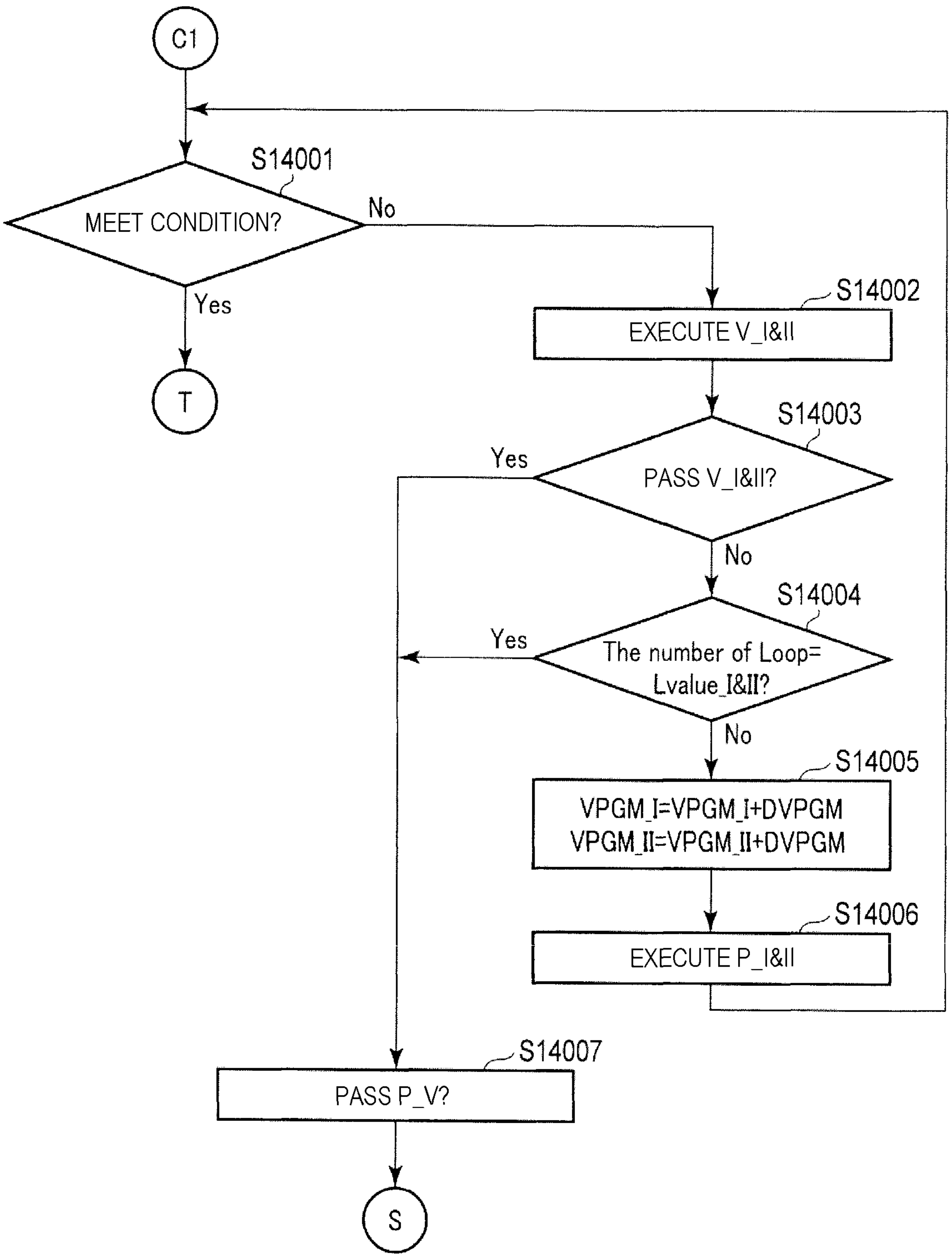

If the sequencer 111 determines that the results of the third and the fourth program verification operations are passes (YES in Step S13004), or determines that the numbers of loops of the third and the fourth program operations are the set values (LValue_III&IV) (YES in Step S13005), the sequencer 111 determines whether or not the conditions are satisfied (see FIG. 140).

Step S14002

If the sequencer 111 determines that "the condition is not satisfied" (NO in Step S14001), the sequencer 111 performs the same operation as that in Step S11608.

Step S14003

The sequencer 111 performs the same operation as that in Step S11609.

Step S14004

If the sequencer 111 determines that the results of the first and the second program verification operations are not passes (NO in Step S14003), the sequencer 111 counts up the numbers of times of repetition (the numbers of loops) of the first and the second program operations.

Subsequently, the sequencer 111 counts up the numbers of loops and then determines whether or not the numbers of loops of the first and the second program operations are the set values (LValue_I&II).

Step S14005

If the sequencer 111 determines that the numbers of loops are not the set values (LValue_I&II) (NO in Step S14004), the sequencer 111 increments the voltages VPGM_I and VPGM_II to be used in the first and the second program operations by the voltage DVPGM, respectively.

Step S14006

The sequencer 111 performs the same operation as that in Step S11602.

Step S14007

If the sequencer 111 determines that the result of the first and the second program verification operations are passes (YES in Step S14003), or determines that the numbers of loops are the set values (LValue_I&II) (YES in Step S14004), the sequencer 111 performs the same operation as Step S13101. Subsequently, the sequencer 111 performs Step S13301.

Step S14101

Figure 141:
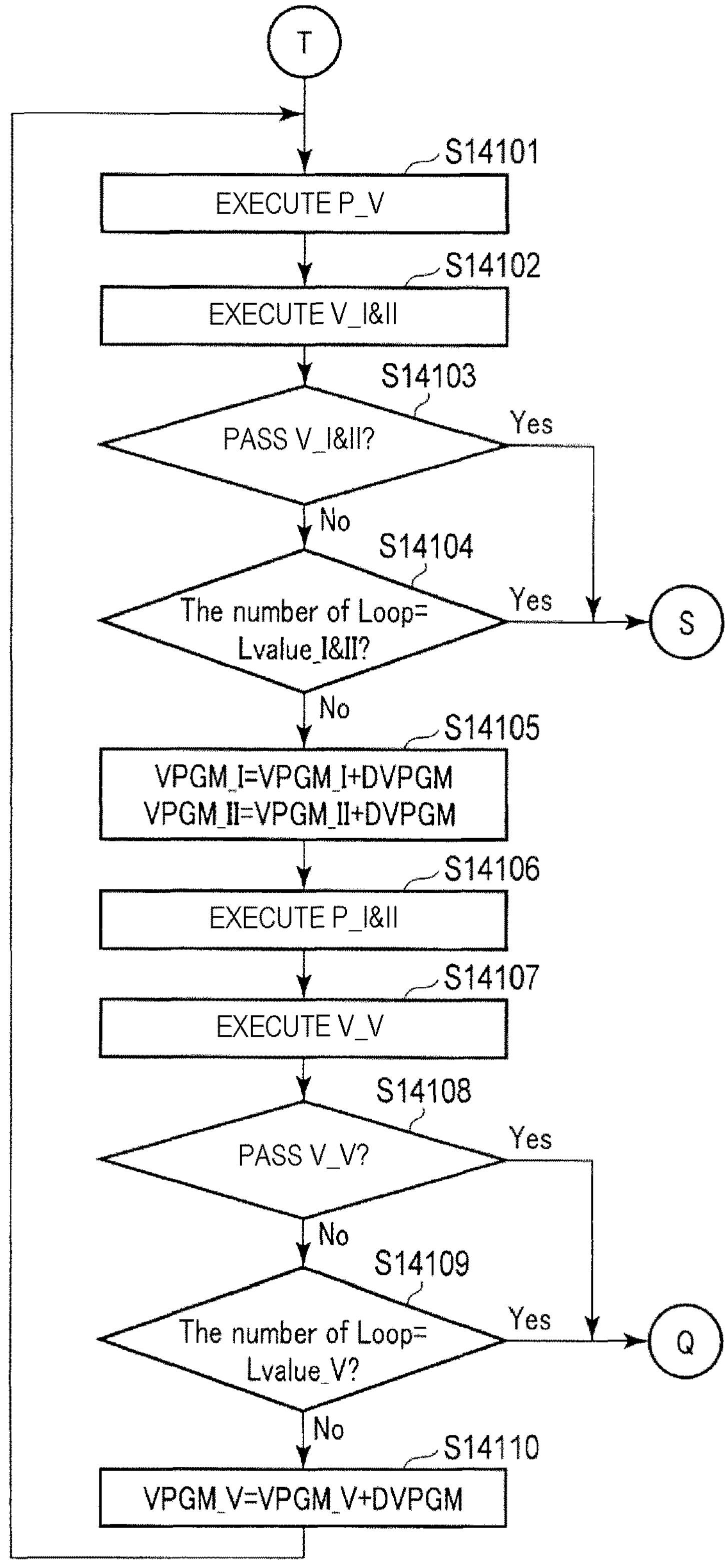

If the sequencer 111 determines that the condition is satisfied (YES in Step S14001), the sequencer 111 performs the same operation as that in Step S13101 (see FIG. 141).

Step S14102

The sequencer 111 performs the same operation as that in Step S11608.

Step S14103

The sequencer 111 performs the same operation as that in Step S11609.

If the sequencer 111 determines that the results of the first and the second program verification operations are passes (YES in Step S14103), the sequencer 111 performs Step S13301.

Step S14104

If the sequencer 111 determines that the results of the first and the second program verification operations are not passes (NO in Step S14103), the sequencer 111 counts up the numbers of times of repetition (the numbers of loops) of the first and the second program operations.

Subsequently, the sequencer 111 counts up the numbers of loops and then determines whether or not the numbers of loops of the first and the second program operations are the set values (LValue_I&II).

If the sequencer 111 determines that the numbers of loops of the first and the second program operations are the set values (LValue_I&II), (YES in Step S14104), the sequencer 111 performs Step S13301.

Step S14105

If the sequencer 111 determines that the numbers of loops are not the set values (LValue_I&II) (NO in Step S14104), the sequencer 111 increments the voltages VPGM_I and VPGM_II to be used in the first and the second program operations by the voltage DVPGM, respectively.

Step S14106

The sequencer 111 performs the same operation as that in Step S11602.

Step S14107

The sequencer 111 performs the same operation as that in Step S13107.

Step S14108

The sequencer 111 performs the same operation as that in Step S13108.

If the sequencer 111 determines that the result of the fifth program verification operation is a pass (YES in Step S14108), the sequencer 111 performs Step S11701.

Step S14109

If the sequencer 111 determines that the result of the fifth program verification operation is not a pass (NO in Step S14108), the sequencer 111 counts up the number of times of repetition (the numbers of loops) of the fifth program operation.

Subsequently, the sequencer 111 counts up the number of loops and then determines whether or not the number of loops of the fifth program operation is the set value (LValue_V).

If the sequencer 111 determines that the number of loops of the fifth program operation is the set value (LValue_V) (YES in Step S14109), the sequencer 111 performs Step S11701.

Step S14110

If the sequencer 111 determines that the number of loops is not the set value (LValue_V) (NO in Step S14109), the sequencer 111 increments the voltage VPGM_V to be used in the fifth program operation by the voltage DVPGM.

Subsequently, the sequencer 111 performs Step S14101.

Step S14201

Figure 142:
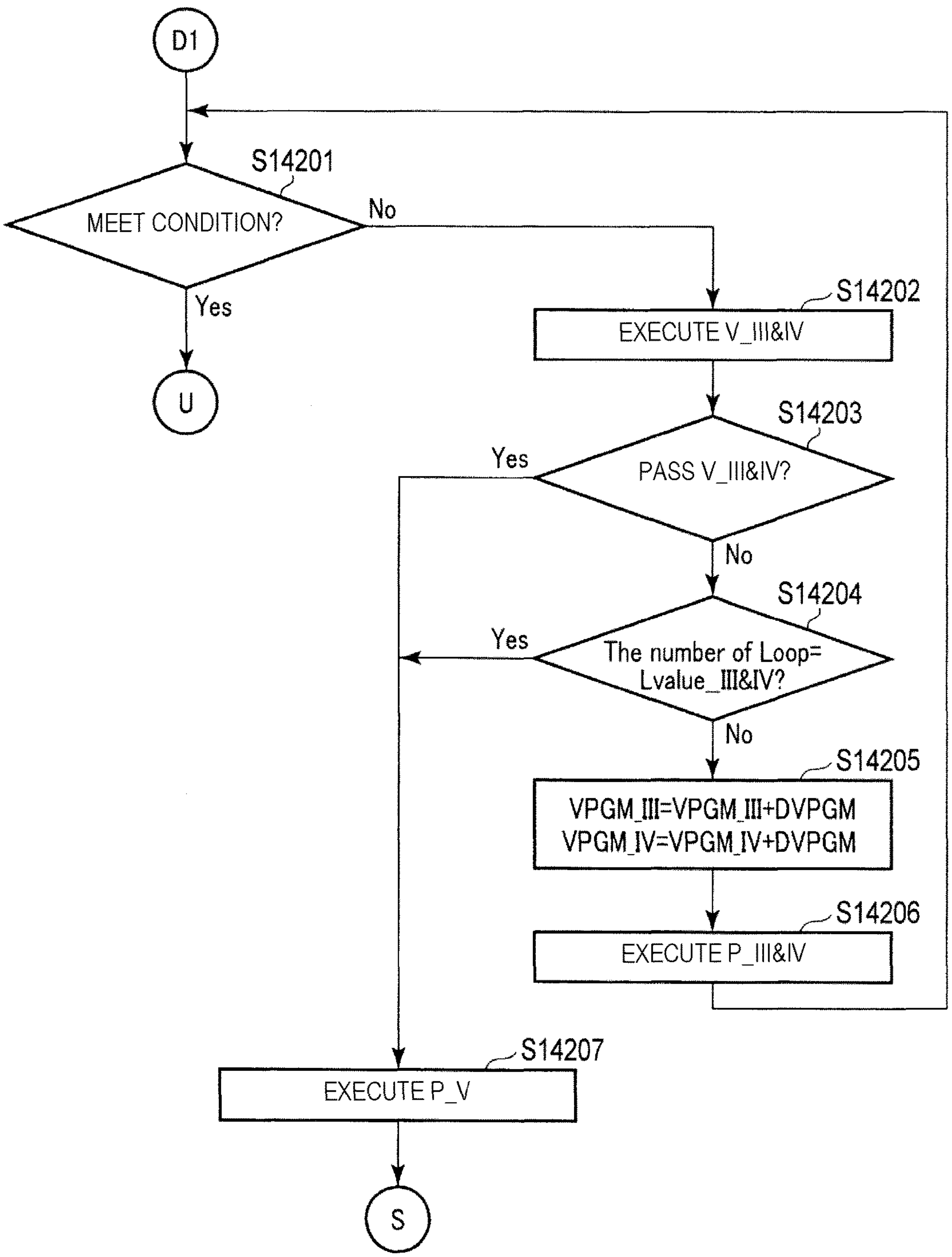

If the sequencer 111 determines that the results of the first and the second program verification operations are passes (YES in Step S13010), or determines that the numbers of loops of the first and the second program operations are the set values (LValue_I&II) (YES in Step S13011), the sequencer 111 determines whether or not the condition is satisfied (see FIG. 142).

Step S14202

If the sequencer 111 determines that the condition is not satisfied (NO in Step S14201), the sequencer 111 performs the same operation as that in Step S11603.

Step S14203

The sequencer 111 performs the same operation as that in Step S11604.

Step S14204

If the sequencer 111 determines that the results of the third and the fourth program verification operations are not passes (NO in Step S14203), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

Step S14205

If the sequencer 111 determines that the numbers of loops are not the set values (LValue_III&IV) (NO in Step S14204), the sequencer 111 increments the voltages VPGM_III and VPGM_IV to be used in the third and the fourth program operations by the voltage DVPGM, respectively.

Step S14206

The sequencer 111 performs the same operation as that in Step S11601.

Step S14207

If the sequencer 111 determines that the results of the third and the fourth program verification operations are passes (YES in Step S14203), or determines that the numbers of loops are the set values (LValue_III&IV) (YES in Step S14204), the sequencer 111 performs the same operation as Step S13101. Subsequently, the sequencer 111 performs Step S13301.

Step S14301

Figure 143:
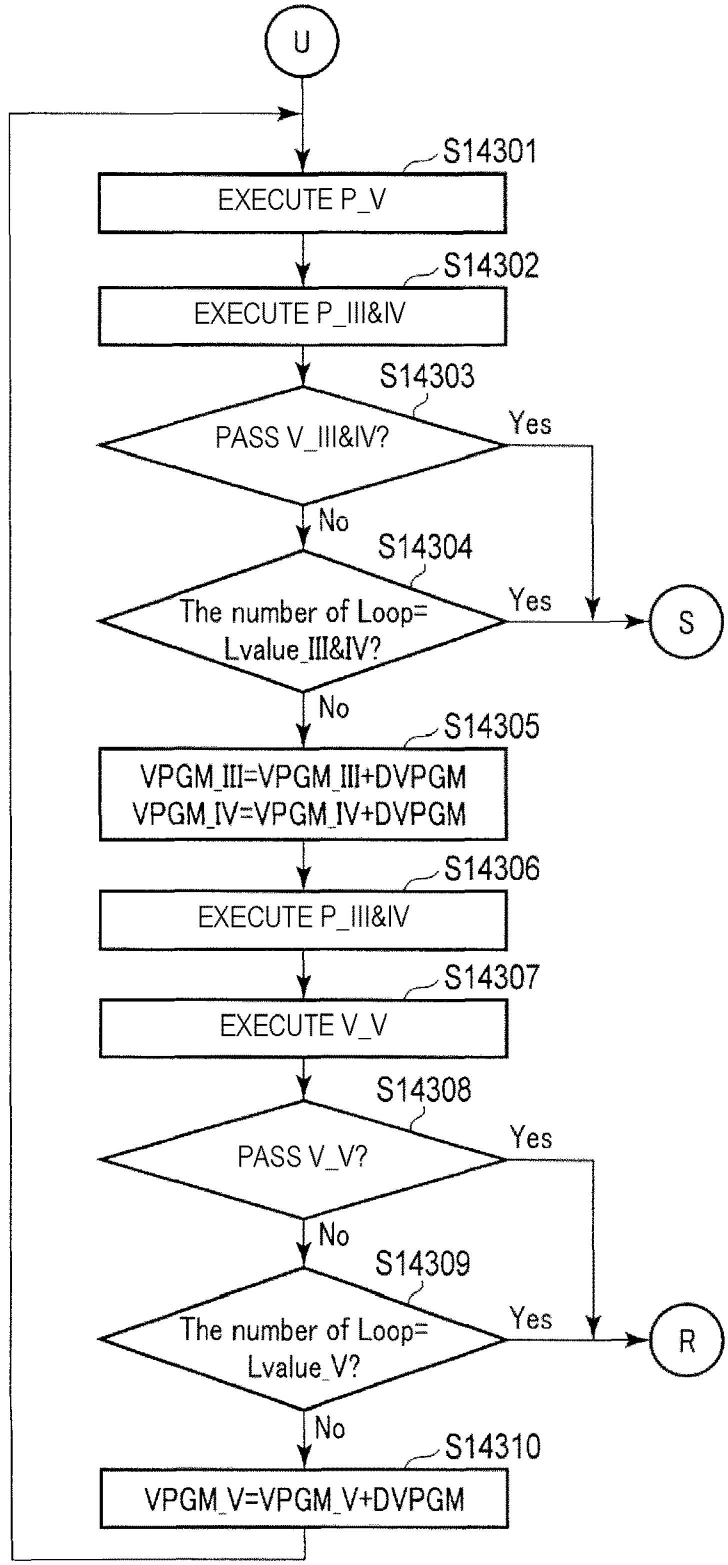

If the sequencer 111 determines that the condition is satisfied (YES in Step S14201), the sequencer 111 performs the same operation as that in Step S13101 (see FIG. 143).

Step S14302

The sequencer 111 performs the same operation as that in Step S11603.

Step S14303

The sequencer 111 performs the same operation as that in Step S11604.

If the sequencer 111 determines that the results of the third and the fourth program verification operations are passes (YES in Step S14303), the sequencer 111 performs Step S13301.

Step S14304

If the sequencer 111 determines that the results of the third and the fourth program verification operations are not passes (NO in Step S14303), the sequencer 111 counts up the numbers of times of repetition (the numbers of loops) of the third and the fourth program operations.

Subsequently, the sequencer 111 counts up the numbers of loops and then determines whether or not the numbers of loops of the third and the fourth program operations are the set values (LValue_III&IV).

If the sequencer 111 determines that the numbers of loops of the third and the fourth program operations are the set values (LValue_III&IV), (YES in Step S14304), the sequencer 111 performs Step S13301.

Step S14305

If the sequencer 111 determines that the numbers of loops are not the set values (LValue_III&IV) (NO in Step S14304), the sequencer 111 increments the voltages VPGM_III and VPGM_IV to be used in the third and the fourth program operations by the voltage DVPGM, respectively.

Step S14306

The sequencer 111 performs the same operation as that in Step S11601.

Step S14307

The sequencer 111 performs the same operation as that in Step S13107.

Step S14308

The sequencer 111 performs the same operation as that in Step S13108.

If the sequencer 111 determines that the result of the fifth program verification operation is a pass (YES in Step S14308), the sequencer 111 performs Step S11801.

Step S14309

If the sequencer 111 determines that the result of the fifth program verification operation is not a pass (NO in Step S14308), the sequencer 111 counts up the number of times of repetition (the numbers of loops) of the fifth program operation.

Subsequently, the sequencer 111 counts up the number of loops and then determines whether or not the number of loops of the fifth program operation is the set value (LValue_V).

If the sequencer 111 determines that the number of loops of the fifth program operation is the set value (LValue_V) (YES in Step S14309), the sequencer 111 performs Step S11801.

Step S14310

If the sequencer 111 determines that the number of loops is not the set value (LValue_V) (NO in Step S14309), the sequencer 111 increments the voltage VPGM_V to be used in the fifth program operation by the voltage DVPGM.

Subsequently, the sequencer 111 performs Step S14301.

<3-7-2> Specific Example of Pulse

Subsequently, referring now to FIG. 144 to FIG. 147, a specific example of the pulse for a case where the write operation of the third embodiment is applied to the memory cell transistors MT described above will be described. The basic operations are the same as those described with reference to FIG. 20 and FIG. 21.

FIG. 144 to FIG. 147 illustrate a pulse of (i) and a pulse of (ii), which are roughly classified pulse categories, as described in conjunction with FIG. 20 and FIG. 21.

In the examples illustrated in FIG. 144 to FIG. 147, pulses corresponding to the pulse Nos. 1 to 6, 9, 10, 14, 16, 20, 22, 27, 30, 35, 38, 43, and 52 correspond to the pulses of (i).

Figure 144:
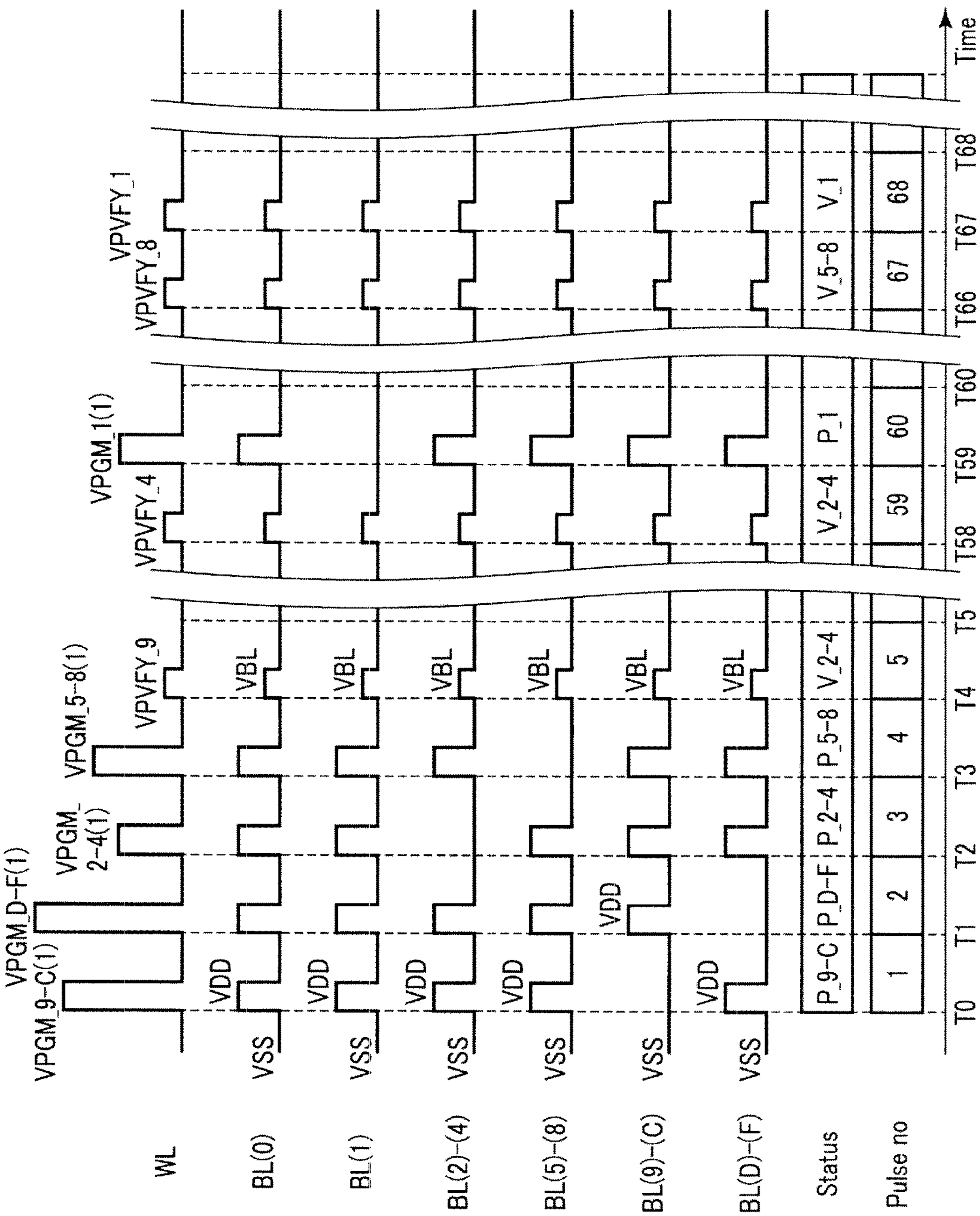
FIG. 144 is a waveform chart showing an example of voltages to be applied to the word lines and the bit lines during the write operation.

In the example illustrated in FIG. 144 and FIG. 147, pulses corresponding to the pulses other than Nos. 1 to 6, 9, 10, 14, 16, 20, 22, 27, 30, 35, 38, 43, and 52 correspond to the pulses of (ii).

<3-8> Modified Example 4 of Third Embodiment

A modified example 4 of the third embodiment will be described. In the modified example 4 of the third embodiment, a case where a writing method different from the data writing method described above is employed in the third embodiment will be described.

<3-8-1> Example of Order of Performance of Program Operation and Program Verification Operation In the following, the order of performance of the program operation and the program verification operation will be described with reference to FIG. 148.

Figure 148:
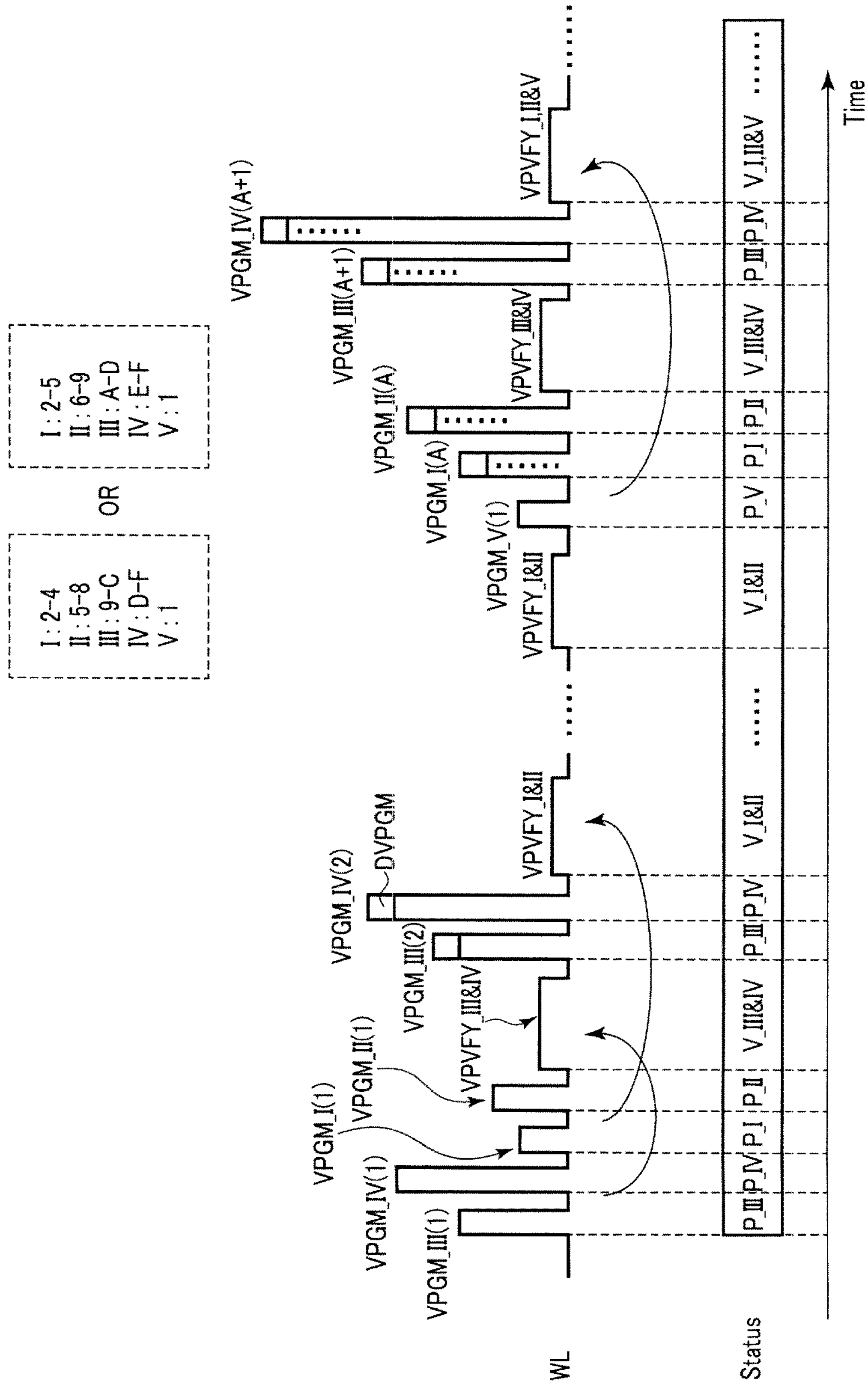
FIG. 148 is a waveform chart schematically showing a waveform of the word line during the write operation.

For easy understanding, FIG. 148 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 4 of the third embodiment is divided into first to fifth write operations in the same manner as the modified example 3 of the third embodiment.

The modified example 4 of the third embodiment is different from the modified example 3 of the third embodiment in that the first and the second program operations are performed immediately after the third and the fourth program operations.

<3-8-2> Example of Order of Performance of Program Operation and Program Verification Operation A method of generating the order of performance of the program operation and the program verification operation (pulse order) according to the third embodiment will be described with reference to FIG. 149 and FIG. 150.

Step S14901

Figure 149:
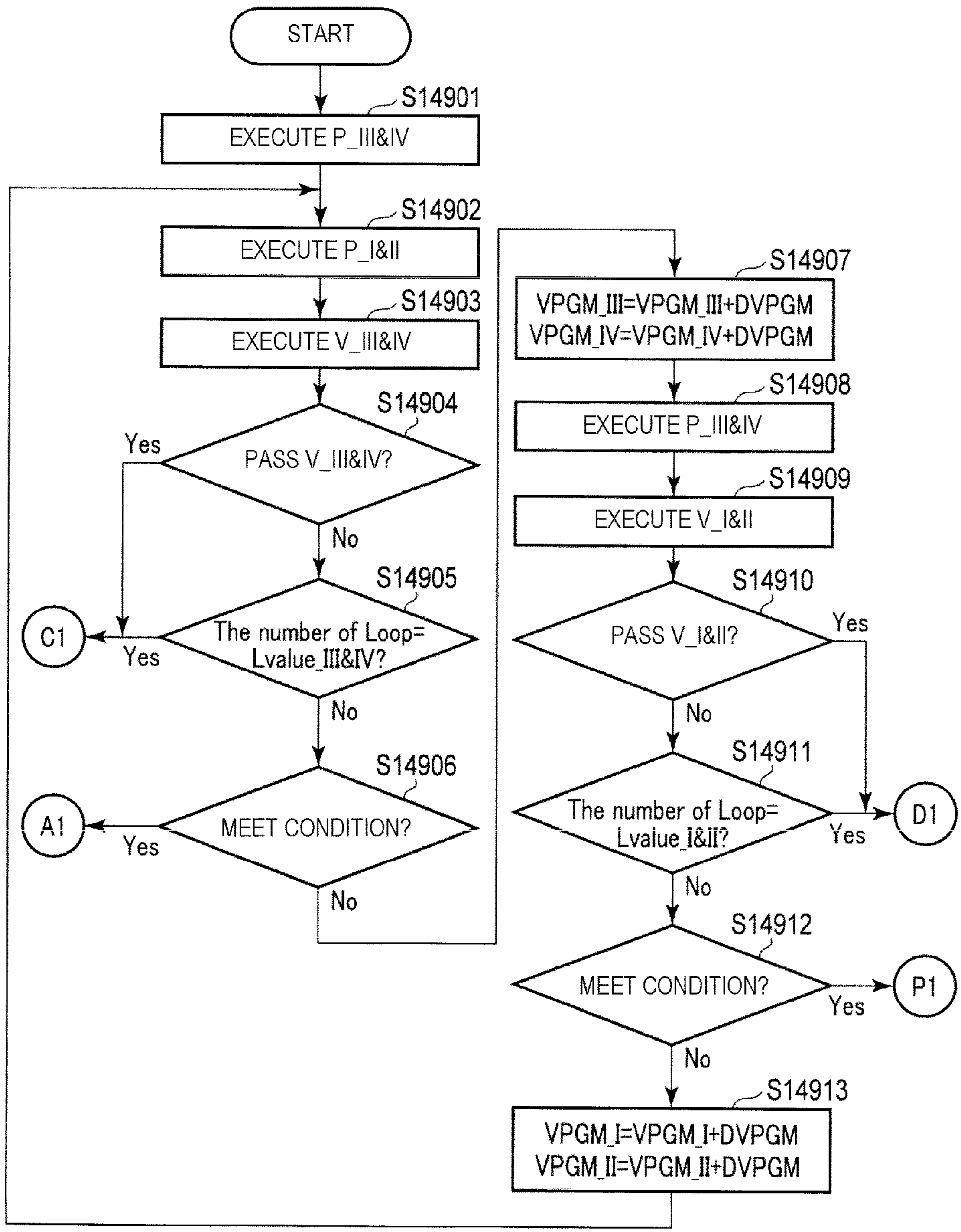
FIG. 149 is a flowchart showing the method of generating the performance order (pulse order) of the program operation and the program verification operation.

The sequencer 111 performs the same operation as that in Step S11601 (see FIG. 149).

Step S14902

The sequencer 111 performs the same operation as that in Step S11602.

Step S14903

The sequencer 111 performs the same operation as that in Step S11603.

Step S14904

The sequencer 111 performs the same operation as that in Step S11604. If the sequencer 111 determines that the results of the verification operations are passes (YES in Step S14904), the sequencer 111 performs Step S14001.

Step S14905

If the sequencer 111 determines that the results of the third and the fourth program verification operations are not passes (NO in Step S14904), the sequencer 111 counts up the numbers of times of repetition of the third and the fourth program operations (the numbers of loops).

Subsequently, the sequencer 111 counts up the numbers of loops and then determines whether or not the numbers of loops of the third and the fourth program operations are the set values (LValue_III&IV).

If the sequencer 111 determines that the numbers of loops of the third and the fourth program operations are the set values (LValue_III&IV) (YES in Step S14905), the sequencer 111 performs Step S14001.

Step S14906

If the sequencer 111 determines that the numbers of loops are not the set values (LValue_III&IV) (NO in Step S14905), the sequencer 111 determines whether or not the condition is satisfied.

If the sequencer 111 determines that the condition is satisfied (YES in Step S14906), the sequencer 111 performs Step S13101.

Step S14907

If the sequencer 111 determines that the condition is not satisfied (NO in Step S14906), the sequencer 111 increments the voltages VPGM_III and VPGM_IV to be used in the third and the fourth program operations by the voltage DVPGM, respectively.

Step S14908

The sequencer 111 performs the same operation as that in Step S11601.

Step S14909

The sequencer 111 performs the same operation as that in Step S11608.

Step S14910

The sequencer 111 performs the same operation as that in Step S11609. If the sequencer 111 determines that the results of the first and the second program verification operations are passes (YES in Step S14910), the sequencer 111 performs Step S14201.

Step S14911

If the sequencer 111 determines that the results of the first and the second program verification operations are not passes (NO in Step S14910), the sequencer 111 counts up the numbers of times of repetition of the first and the second program operations (the numbers of loops).

Subsequently, the sequencer 111 counts up the numbers of loops and then determines whether or not the numbers of loops of the first and the second program operations are the set values (LValue_I&II).

If the sequencer 111 determines that the numbers of loops of the first and the second program operations are the set values (LValue_I&II), the sequencer 111 performs Step S14201.

Step S14912

If the sequencer 111 determines that the numbers of loops of the first and the second program operations are not the set values (LValue_I&II), the sequencer 111 determines whether or not the condition is satisfied.

Step S14913

If the sequencer 111 determines that the numbers of loops are not the set values (LValue_I&II) (NO in Step S14912), the sequencer 111 increments the voltages VPGM_I and VPGM_II to be used in the first and the second program operations by the voltage DVPGM, respectively. The sequencer 111 performs Step S14902 after Step S14913.

Step S15001

Figure 150:
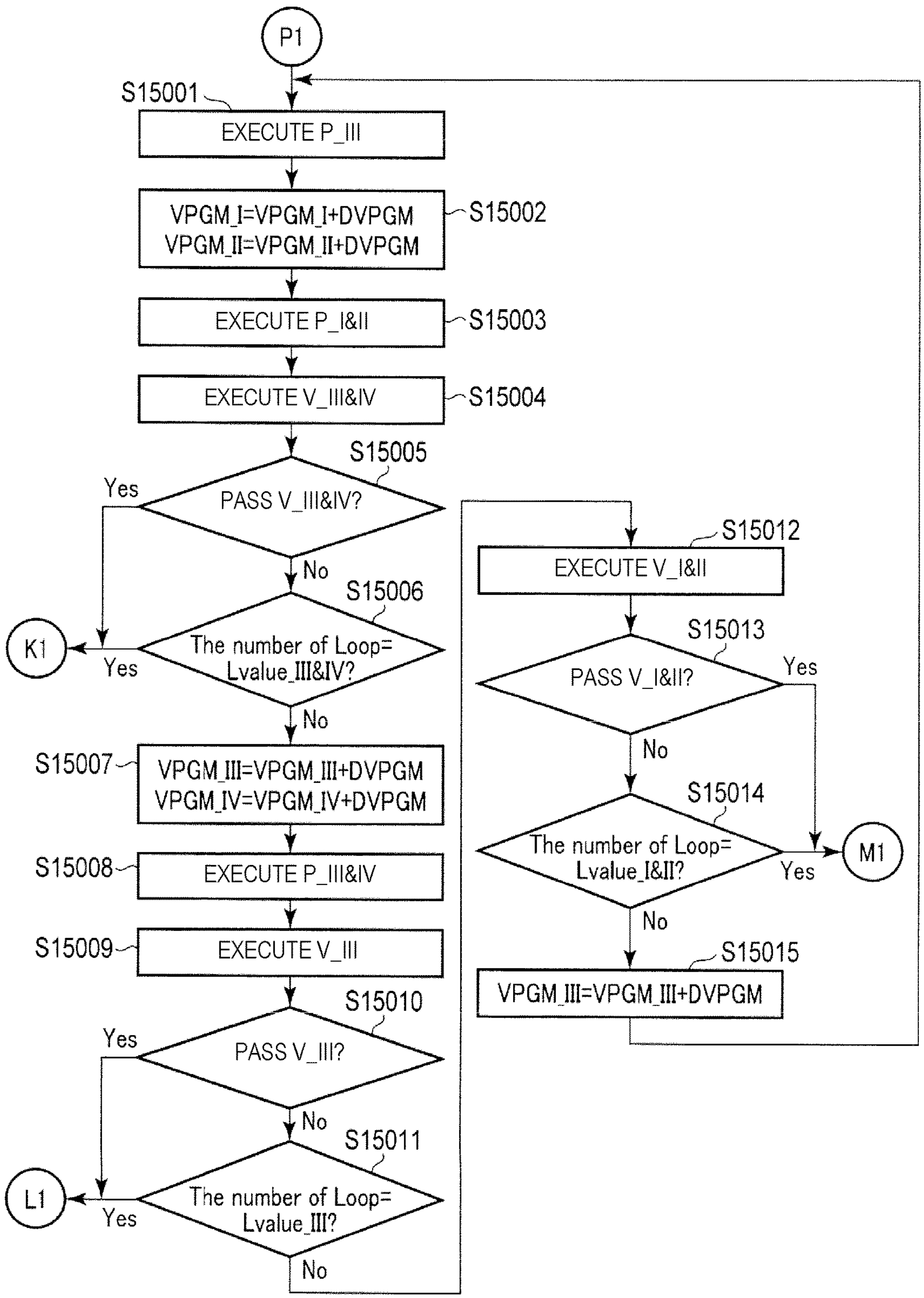
FIG. 150 is a flowchart showing the method of generating the performance order (pulse order) of the program operation and the program verification operation.

If the sequencer 111 determines that the numbers of loops are the set values (LValue_I&II) (YES in Step S14912), the sequencer 111 performs the third program operation by using Voltage VPGM_III (See FIG. 150).

Step S15002

The sequencer 111 increments the voltages VPGM_I and VPGM_II to be used in the first and the second program operations by the voltage DVPGM, respectively.

Step S15003

The sequencer 111 performs the same operation as that in Step S11602.

Step S15004

The sequencer 111 performs the same operation as that in Step S11603.

Step S15005

The sequencer 111 performs the same operation as that in Step S11604. If the sequencer 111 determines that the results of the third and the fourth program verification operations are passes (YES in Step S15005), the sequencer 111 performs Step S13701.

Step S15006

If the sequencer 111 determines that the results of the third and the fourth program verification operations are not passes (NO in Step S15005), the sequencer 111 counts up the numbers of times of repetition of the third and the fourth program operations (the numbers of loops).

Subsequently, the sequencer 111 counts up the number of loops and then determines whether or not the number of loops of the third and the fourth program operations are the set values (LValue_III&IV). If the sequencer 111 determines that the numbers of loops are the set values (LValue_III&IV), the sequencer 111 performs Step S13701.

Step S15007

If the sequencer 111 determines that the numbers of loops are not the set values (LValue_III&IV) (NO in Step S15006), the sequencer 111 increments the voltages VPGM_III and VPGM_IV to be used in the third and the fourth program operations by the voltage DVPGM, respectively.

Step S15008

The sequencer 111 performs the same operation as that in Step S11601.

Step S15009

The sequencer 111 performs the third program verification operation relating to the third program operation.

Step S15010

The sequencer 111 determines whether or not the result of the third program verification operation is a pass. If the sequencer 111 determines that the result of the third program verification operation is a pass (YES in Step S15010), the sequencer 111 performs Step S13801.

Step S15011

If the sequencer 111 determines that the result of the third program verification operation is not a pass (NO in Step S15010), the sequencer 111 counts up the number of times of repetition (the number of loops) of the third program operation.

Subsequently, the sequencer 111 counts up the number of loops and then determines whether or not the number of loops of the third program operation is a set value (LValue_III). If the sequencer 111 determines that the number of loops is the set value (LValue_III), the sequencer 111 performs Step S13801.

Step S15012

If the sequencer 111 determines that the number of loops is not the set values (LValue_III), the sequencer 111 performs the same operation as that in Step S11608.

Step S15013

The sequencer 111 performs the same operation as that in Step S11609. If the sequencer 111 determines that the results of the first and the second program verification operations are passes (YES in Step S15013), the sequencer 111 performs Step S13901.

Step S15014

If the sequencer 111 determines that the results of the first and the second program verification operations are not passes (NO in Step S15013), the sequencer 111 counts up the numbers of times of repetition of the first and the second program operations (the numbers of loops).

Subsequently, the sequencer 111 counts up the numbers of loops and then determines whether or not the numbers of loops of the first and the second program operations are the set values (LValue_I&II). If the sequencer 111 determines that the numbers of loops are the set values (LValue_I&II), the sequencer 111 performs Step S13901.

Step S15015

If the sequencer 111 determines that the numbers of loops are not the set values (LValue_I&II) (NO in Step S15014), the sequencer 111 increments the voltage VPGM_III to be used in the third program operation by the voltage DVPGM. The sequencer 111 performs Step S15001 after Step S15015.

<3-9> Modified Example 5 of Third Embodiment

A modified example 5 of the third embodiment will be described. In the modified example 5 of the third embodiment, a case where a writing method different from the data writing method described above is employed in the third embodiment will be described.

<3-9-1> Example of Order of Performance of Program Operation and Program Verification Operation In the following, the order of performance of the program operation and the program verification operation will be described with reference to FIG. 151.

Figure 151:
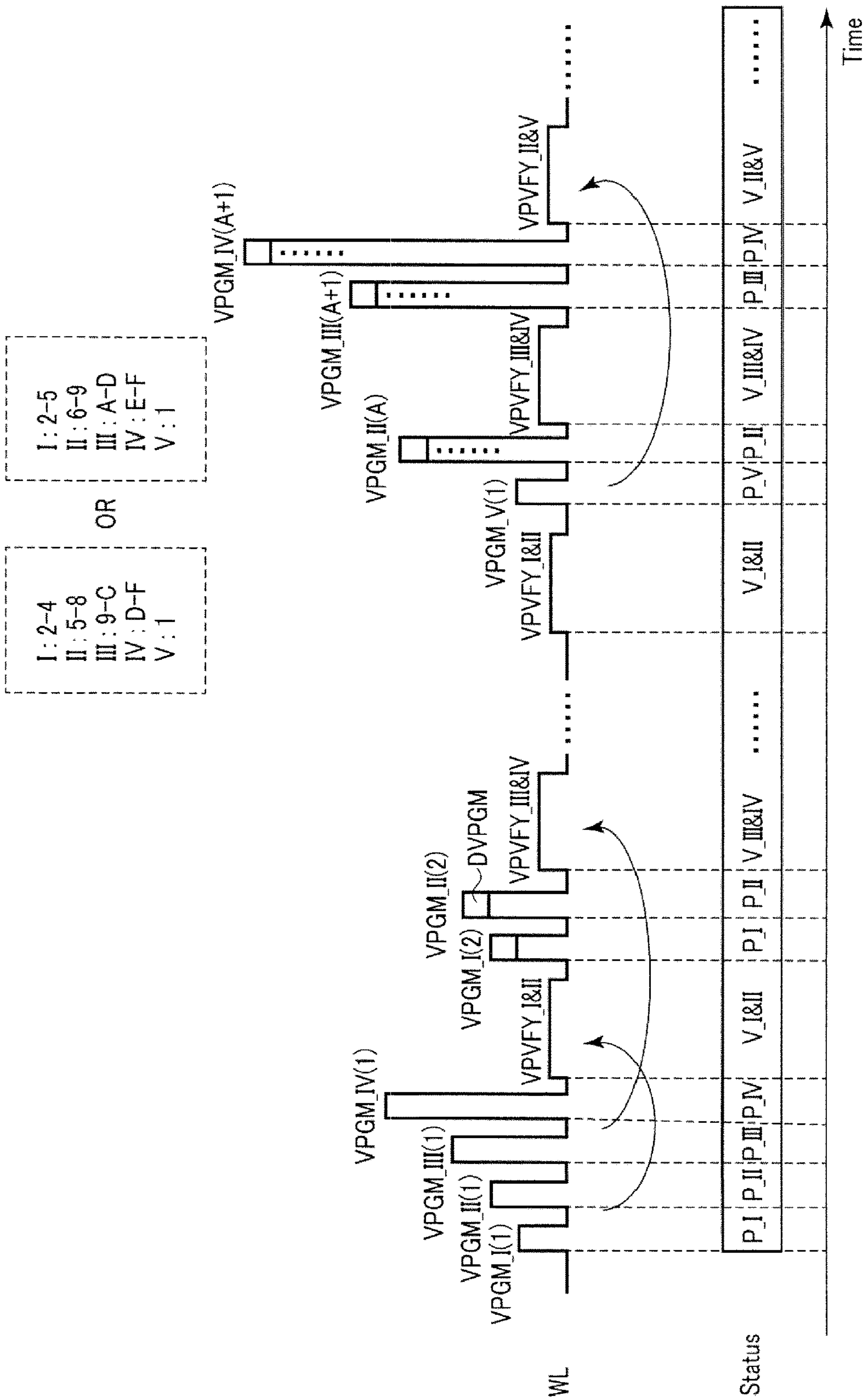
FIG. 151 is a waveform chart schematically showing a waveform of the word line during the write operation.

For easy understanding, FIG. 151 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 5 of the third embodiment is divided into first to fifth write operations in the same manner as the modified example 3 of the third embodiment.

The modified example 5 of the third embodiment is different from the modified example 3 of the third embodiment in timing of start of the fifth program operation.

<3-9-2> Example of Order of Performance of Program Operation and Program Verification Operation A method of generating the order of performance of the program operation and the program verification operation (pulse order) according to the third embodiment will be described with reference to FIG. 152.

Step S15201

The sequencer 111 performs the same operation as that in Step S11602.

Step S15202

The sequencer 111 performs the same operation as that in Step S11601.

Step S15203

The sequencer 111 performs the same operation as that in Step S11608.

Step S15204

The sequencer 111 performs the same operation as that in Step S11609. If the sequencer 111 determines that the results of the first and the second program verification operations are passes (YES in Step S15204), the sequencer 111 performs Step S14201.

Step S15205

If the sequencer 111 determines that the results of the first and the second program verification operations are not passes (NO in Step S15204), the sequencer 111 counts up the numbers of times of repetition of the first and the second program operations (the numbers of loops).

Subsequently, the sequencer 111 counts up the numbers of loops and then determines whether or not the numbers of loops of the first and the second program operations are the set values (LValue_I&II).

If the sequencer 111 determines that the numbers of loops are the set values (LValue_I&II) (YES in Step S15205), the sequencer 111 performs Step S14201.

Step S15206

If the sequencer 111 determines that the numbers of loops are not the set values (LValue_I&II) (NO in Step S15205), the sequencer 111 determines whether or not the condition is satisfied. If the sequencer 111 determines that the condition is satisfied (YES in Step S15206), the sequencer 111 performs Step S13601.

Step S15207

If the sequencer 111 determines that the condition is not satisfied (NO in Step S15207), the sequencer 111 increments the voltages VPGM_I and VPGM_II to be used in the first and the second program operations by the voltage DVPGM, respectively.

Step S15208

The sequencer 111 performs the same operation as that in Step S11602.

Step S15209

The sequencer 111 performs the same operation as that in Step S11603.

Step S15210

The sequencer 111 performs the same operation as that in Step S11604. If the sequencer 111 determines that the results of the third and the fourth program verification operations are passes (YES in Step S15210), the sequencer 111 performs Step S14001.

Step S15211

If the sequencer 111 determines that the results of the third and the fourth program verification operations are not passes (NO in Step S15210), the sequencer 111 counts up the numbers of times of repetition of the third and the fourth program operations (the numbers of loops).

Subsequently, the sequencer 111 counts up the numbers of loops and then determines whether or not the numbers of loops of the third and the fourth program operations are the set values (LValue_III&IV). If the sequencer 111 determines that the numbers of loops are the set values (LValue_III&IV) (YES in Step S15211), the sequencer 111 performs Step S14001.

Step S15212

If the sequencer 111 determines that the numbers of loops are not the set values (LValue_III&IV) (NO in Step S15211), the sequencer 111 determines whether or not the condition is satisfied. If the sequencer 111 determines that the condition is satisfied (YES in Step S15212), the sequencer 111 performs Step S13101.

Step S15213

If the sequencer 111 determines that the condition is not satisfied (NO in Step S15212), the sequencer 111 increments the voltages VPGM_III and VPGM_IV to be used in the third and the fourth program operations by the voltage DVPGM, respectively. The sequencer 111 performs Step S15201 after Step S15213.

<3-9-3> Specific Example of Pulse

Subsequently, referring now to FIG. 153 to FIG. 156, a specific example of the pulse for a case where the write operation of the third embodiment is applied to the memory cell transistors MT described above will be described. The basic operations are the same as those described with reference to FIG. 20 and FIG. 21.

FIG. 153 to FIG. 156 illustrate a pulse of (i) and a pulse of (ii), which are roughly classified pulse categories, as described in conjunction with FIG. 20 and FIG. 21.

In the example illustrated in FIG. 153 to FIG. 156, pulses corresponding to the pulse Nos. 1 to 6, 9, 10, 14, 16, 20, 22, 27, 30, 35, 38, 45, and 50 correspond to the pulses of (i).

In the example illustrated in FIG. 153 to FIG. 156, pulses corresponding to the pulses other than Nos. 1 to 6, 9, 10, 14, 16, 20, 22, 27, 30, 35, 38, 45, and 50 correspond to the pulses of (ii).

<3-10> Modified Example 6 of Third Embodiment

A modified example 6 of the third embodiment will be described. In the modified example 6 of the third embodiment, a case where a writing method different from the data writing method described above is employed in the third embodiment will be described.

<3-10-1> Example of Order of Performance of Program Operation and Program Verification Operation In the following, the order of performance of the program operation and the program verification operation will be described with reference to FIG. 157.

Figure 157:
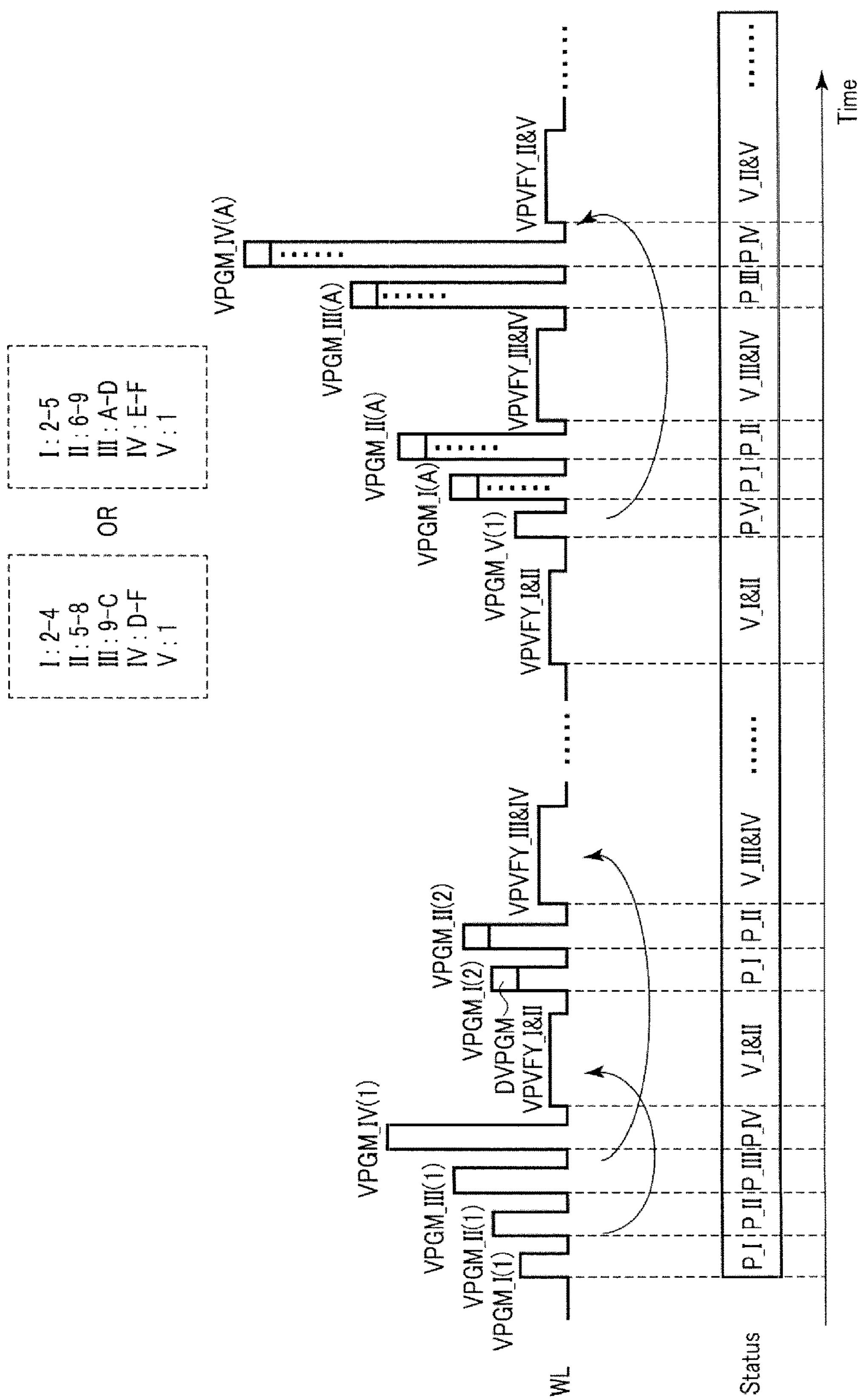

For easy understanding, FIG. 157 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 6 of the third embodiment is divided into first to fifth write operations in the same manner as the modified example 3 of the third embodiment.

The modified example 6 of the third embodiment is different from the modified example 3 of the third embodiment in timing of start of the fifth program operation.

Figure 158:
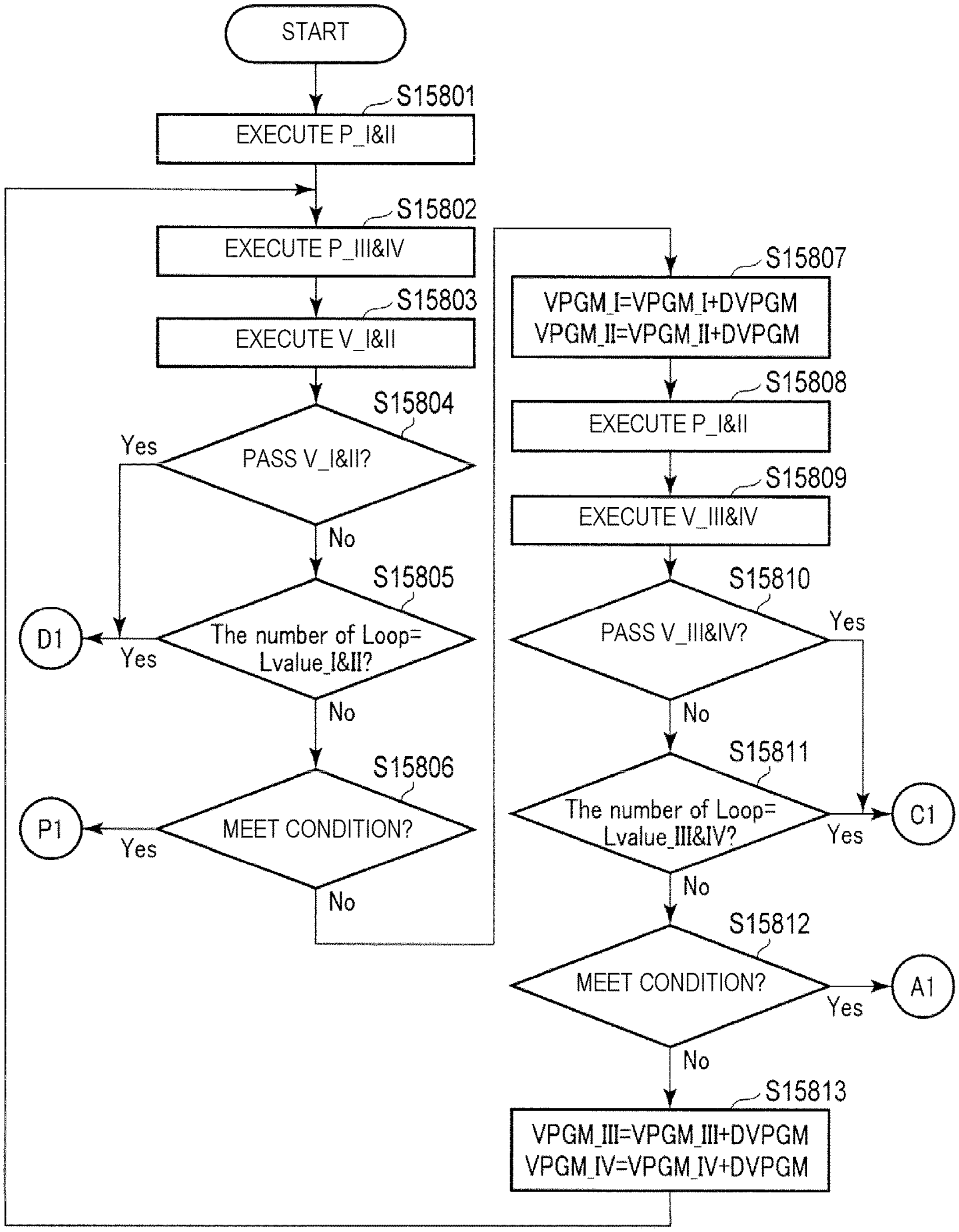

<3-10-2> Example of Order of Performance of Program Operation and Program Verification Operation A method of generating the order of performance of the program operation and the program verification operation (pulse order) according to the third embodiment will be described with reference to FIG. 158.

Figure 152:
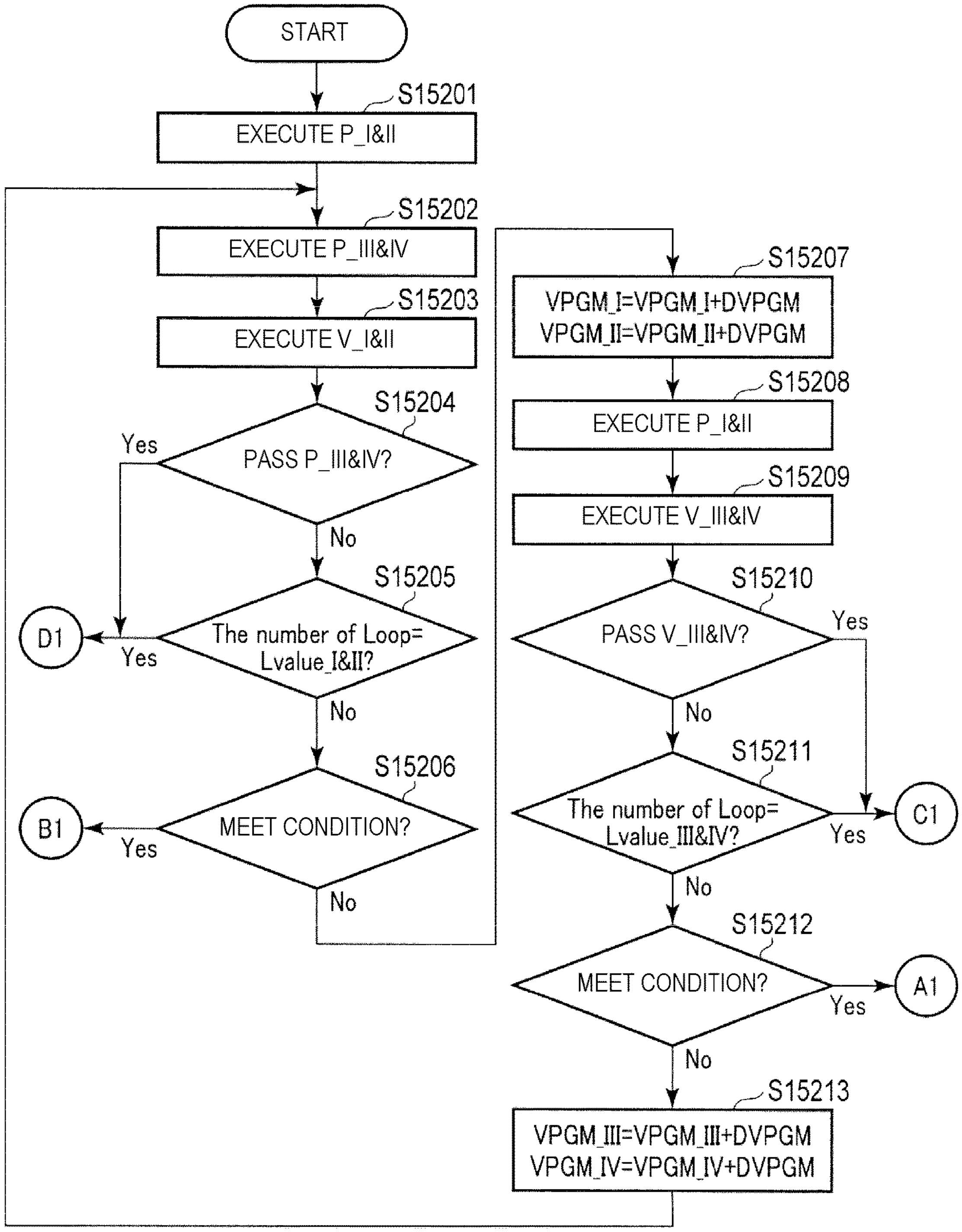
FIG. 152 is a flowchart showing the method of generating the performance order (pulse order) of the program operation and the program verification operation.
Figure 153:
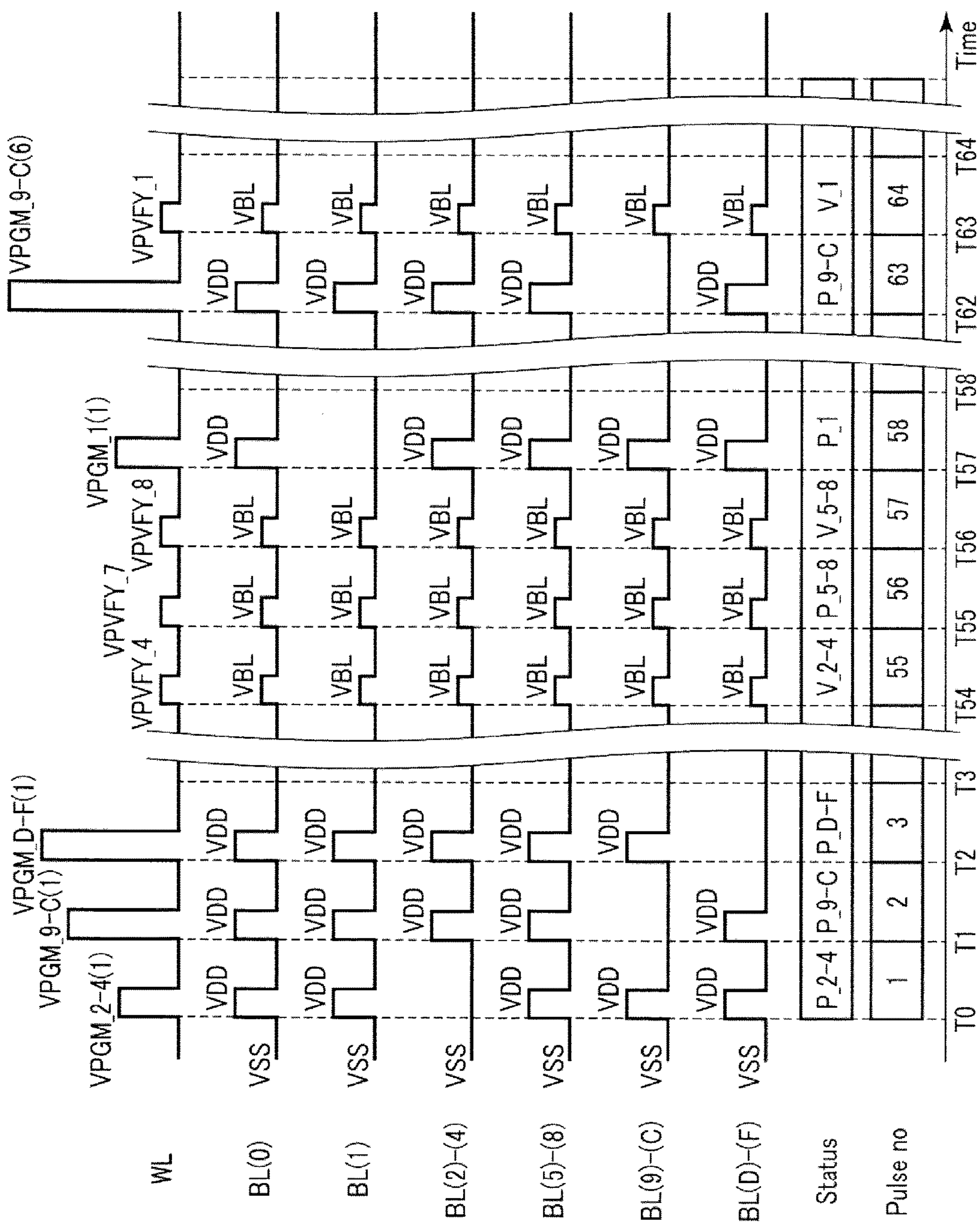

Step S15801 to Step S15813 correspond to Step S15201 to Step S15213 in FIG. 152. If the sequencer 111 determines that the condition is satisfied (YES in Step S15806), the sequencer 111 performs Step S15001.

<3-11> Modified Example 7 of Third Embodiment

A modified example 7 of the third embodiment will be described. In the modified example 7 of the third embodiment, a case where a writing method different from the data writing method described above is employed in the third embodiment will be described.

<3-11-1> Example of Order of Performance of Program Operation and Program Verification Operation In the following, the order of performance of the program operation and the program verification operation will be described with reference to FIG. 159.

Figure 159:
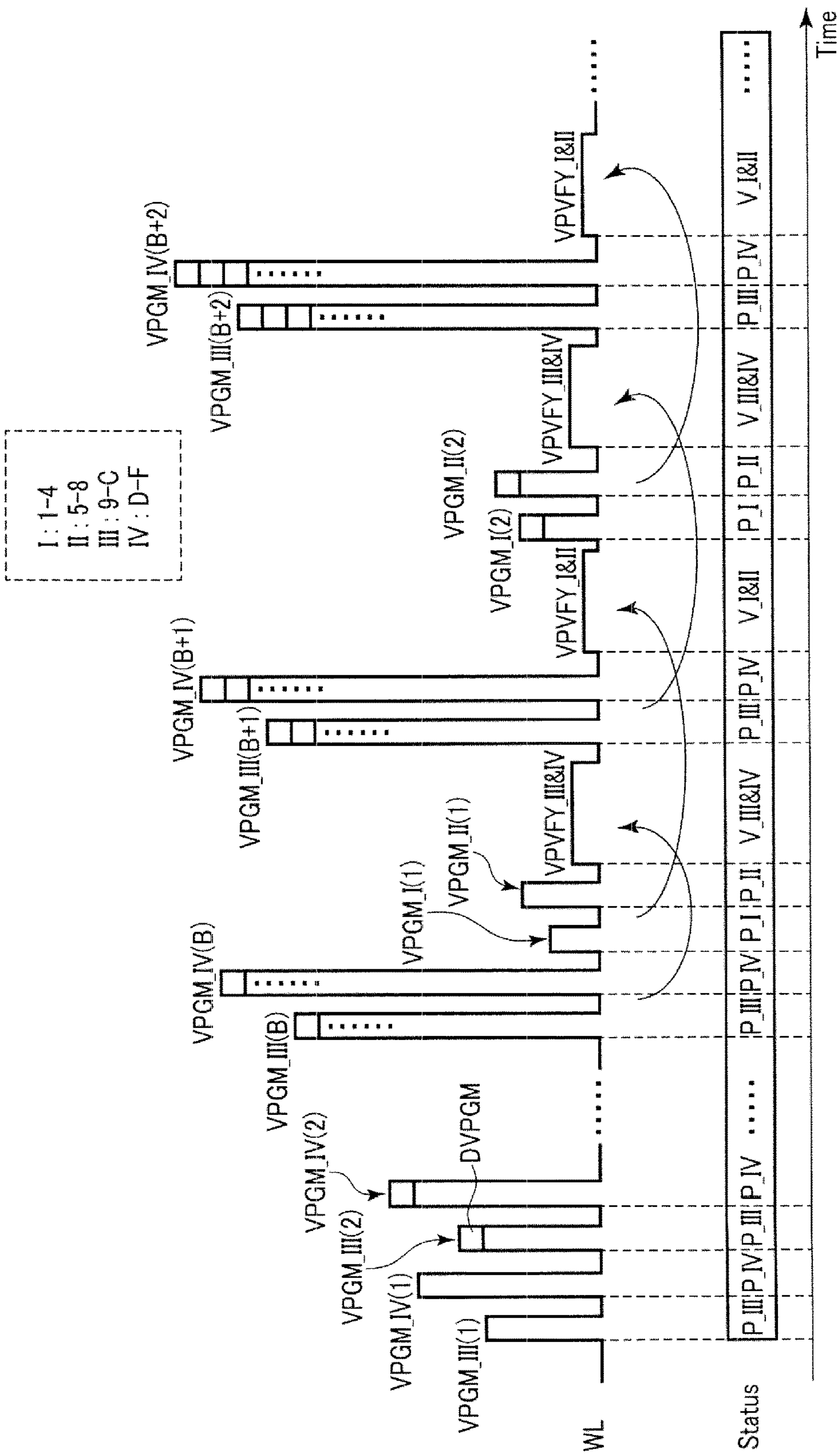

For easy understanding, FIG. 159 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 7 of the third embodiment is divided into first to fourth write operations in the same manner as the third embodiment.

The modified example 7 of the third embodiment is different from the third embodiment in that the third and the fourth program operations are performed firstly by a plurality of times.

Figure 160:
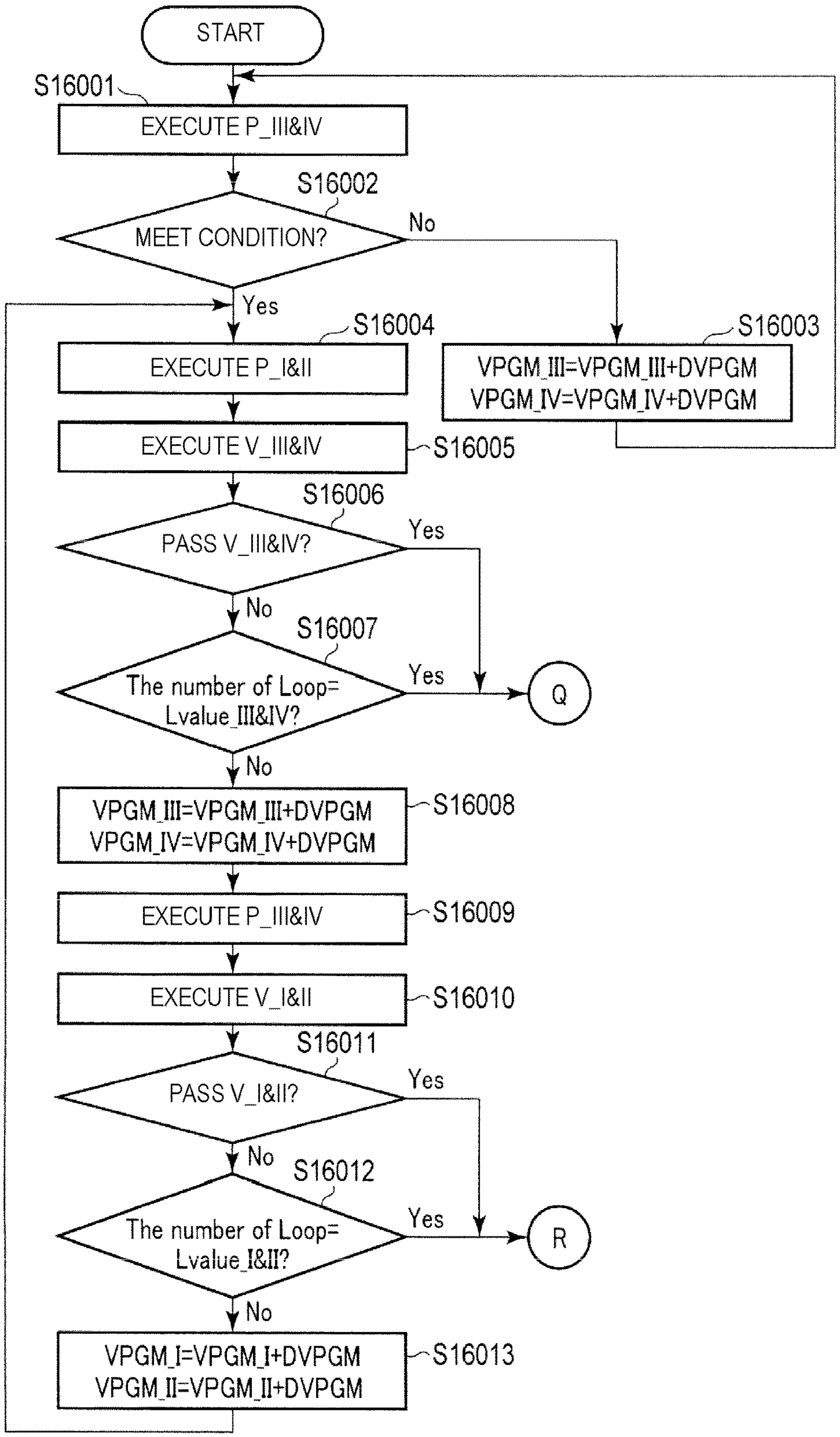

<3-11-2> Example of Order of Performance of Program Operation and Program Verification Operation A method of generating the order of performance of the program operation and the program verification operation (pulse order) according to the third embodiment will be described with reference to FIG. 160.

Step S16001

The sequencer 111 performs the same operation as that in Step S11601.

Step S16002

The sequencer 111 determines whether or not the condition is satisfied.

Step S16003

If the sequencer 111 determines that the numbers of loops are not the set values (LValue_III&IV) (NO in Step S16002), the sequencer 111 increments the voltages VPGM_III and VPGM_IV to be used in the third and the fourth program operations by the voltage DVPGM, respectively.

Step S16004 to Step S16013 correspond to Step S11602 to Step S11611 in FIG. 116.

<3-12> Modified Example 8 of Third Embodiment

A modified example 8 of the third embodiment will be described. In the modified example 8 of the third embodiment, a case where a writing method different from the data writing method described above is employed in the third embodiment will be described.

<3-12-1> Example of Order of Performance of Program Operation and Program Verification Operation In the following, the order of performance of the program operation and the program verification operation will be described with reference to FIG. 161.

Figure 161:
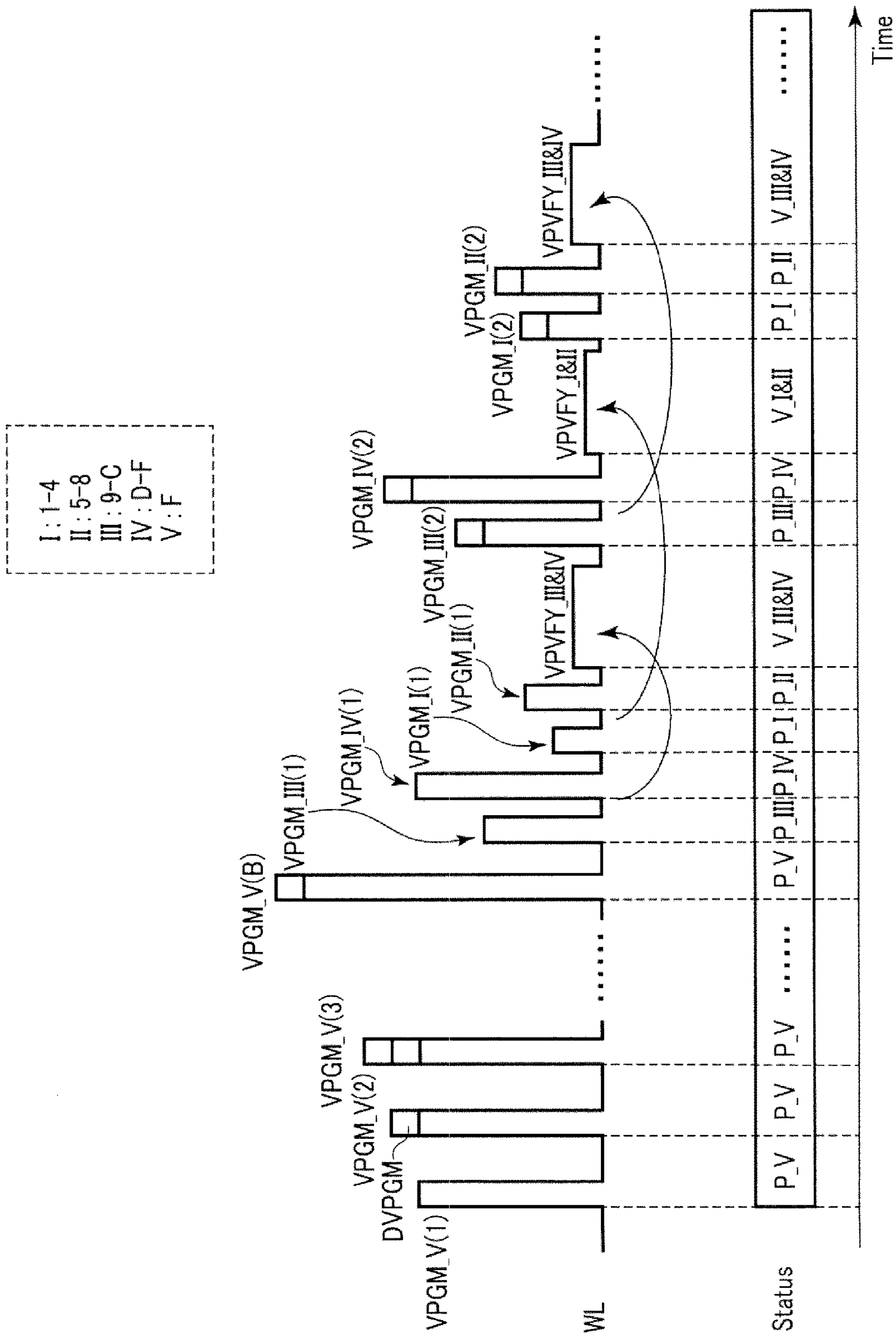

For easy understanding, FIG. 161 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 8 of the third embodiment is divided into first to fifth write operations in the same manner as the modified example 3 of the third embodiment.

The modified example 8 of the third embodiment is different from the third embodiment in that the fifth program operation is performed firstly by a plurality of times.

Figure 162:
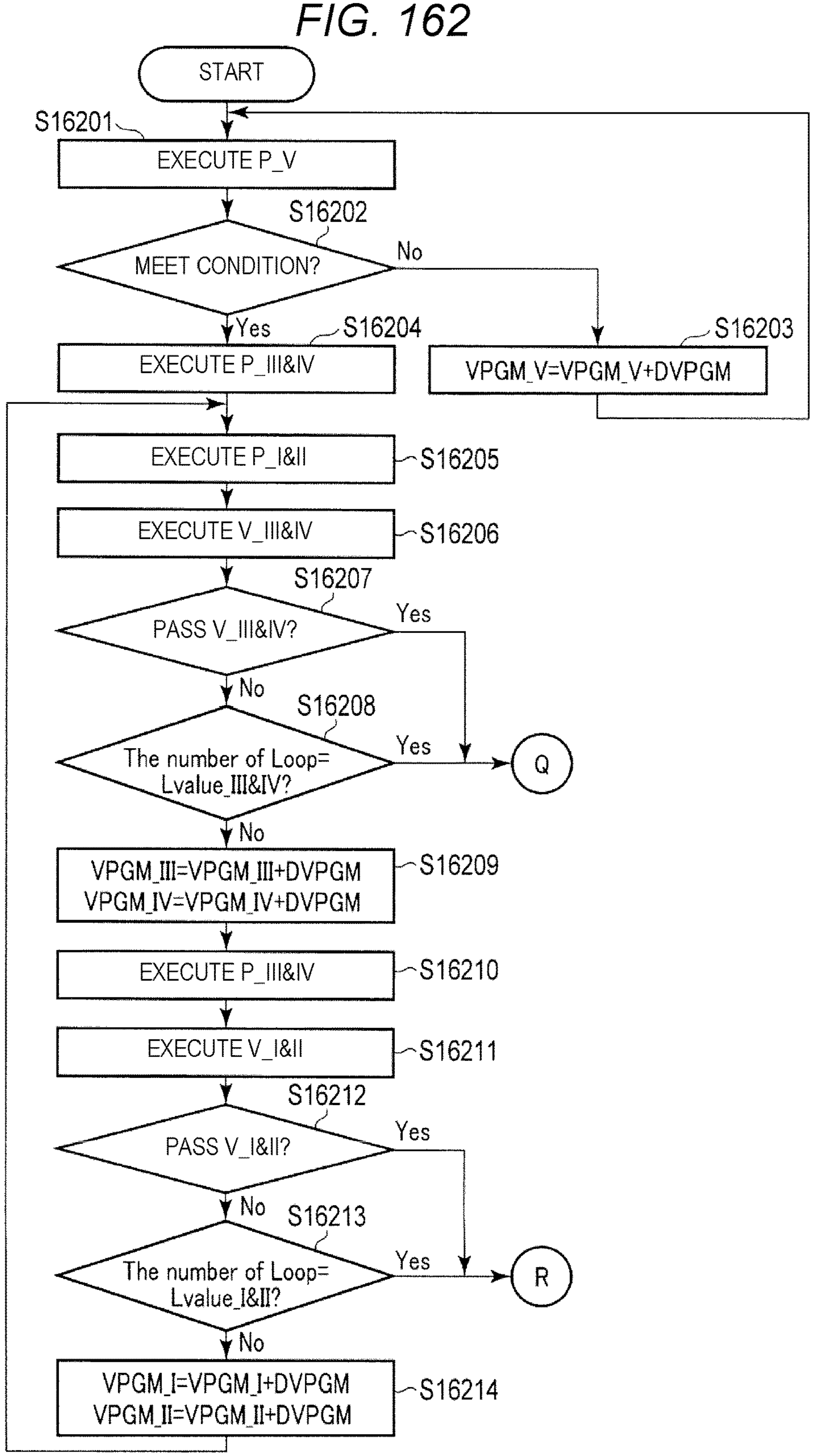
Figure 163:
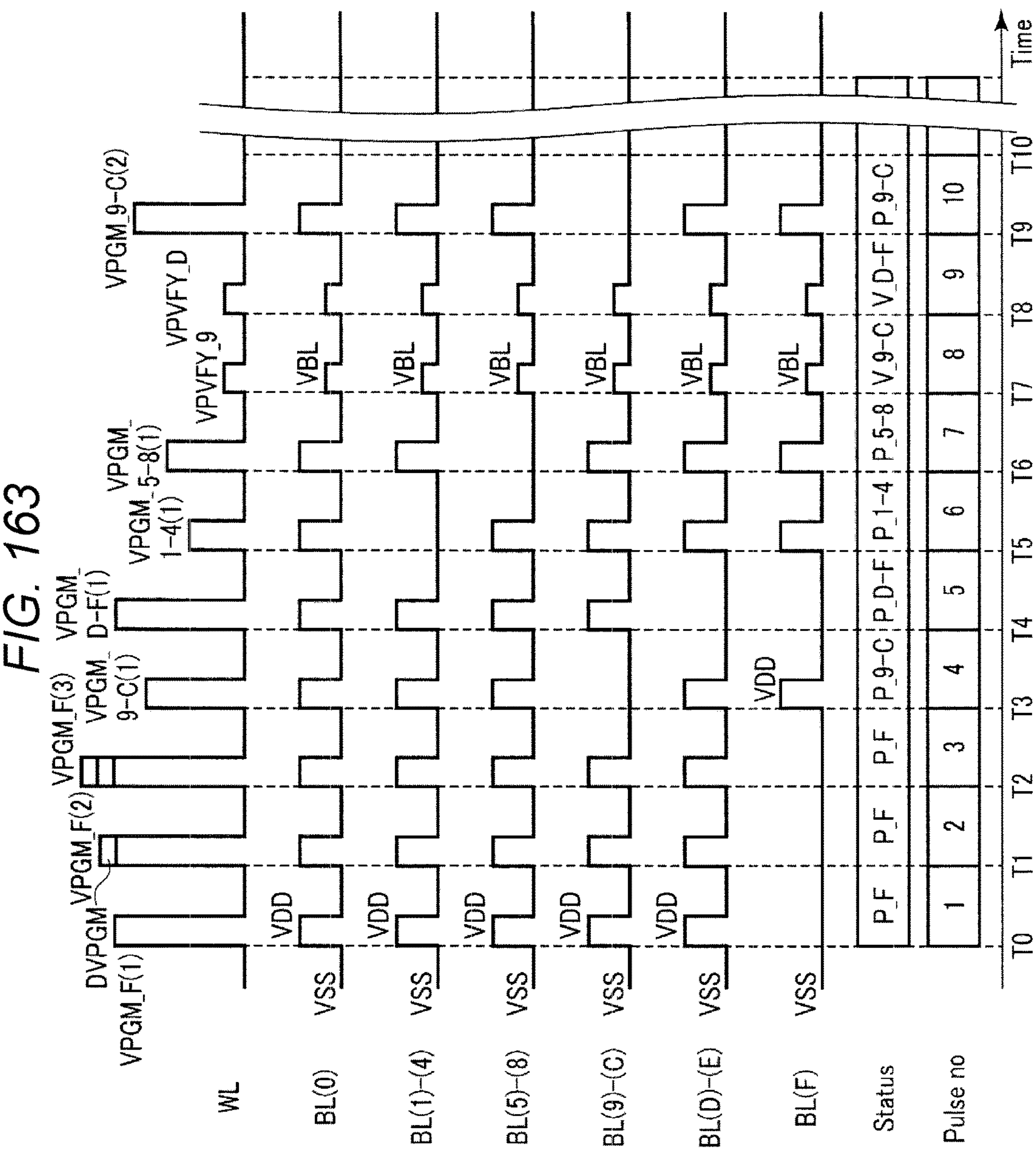

<3-12-2> Example of Order of Performance of Program Operation and Program Verification Operation A method of generating the order of performance of the program operation and the program verification operation (pulse order) according to the third embodiment will be described with reference to FIG. 162.

Step S16201

The sequencer 111 performs the same operation as that in Step S13101.

Step S16202

The sequencer 111 determines whether or not the condition is satisfied.

Step S16203

If the sequencer 111 determines that the number of loops is not the set value (LValue_V) (NO in Step S16202), the sequencer 111 increments the voltage VPGM_V to be used in the fifth program operation by the voltage DVPGM.

Step S16204

The sequencer 111 performs the same operation as that in Step S11601.

Step S16205 to Step S16214 correspond to Step S11602 to Step S11611 in FIG. 116.

<3-12-3> Specific Example of Pulse

Subsequently, referring now to FIG. 163 to FIG. 166, a specific example of the pulse for a case where the write operation of the third embodiment is applied to the memory cell transistors MT described above will be described. The basic operations are the same as those described with reference to FIG. 20 and FIG. 21.

FIG. 163 to FIG. 166 illustrate a pulse of (i) and a pulse of (ii), which are roughly classified pulse categories, as described in conjunction with FIG. 20 and FIG. 21.

In the example illustrated in FIG. 163 to FIG. 166, pulses corresponding to the pulse Nos. 1, 4 to 9, 12, 13, 17, 19, 23, 25, 30 33, 38, 41, 46, 53, and 56 correspond to the pulses of (i).

In the example illustrated in FIG. 163 to FIG. 166, pulses corresponding to the pulses other than Nos. 1, 4 to 9, 12, 13, 17, 19, 23, 25, 30, 33, 38, 41, 46, 53, and 56 correspond to the pulses of (ii).

<3-13> Modified Example 9 of Third Embodiment

A modified example 9 of the third embodiment will be described. In the modified example 9 of the third embodiment, a case where a writing method different from the data writing method described above is employed in the third embodiment will be described.

<3-13-1> Operation

<3-13-1-1> Example of Order of Performance of Program Operation and Program Verification Operation In the following, the order of performance of the program operation and the program verification operation will be described with reference to FIG. 167.

For easy understanding, FIG. 167 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 9 of the third embodiment is divided into first to twelfth write operations.

The first write operation is a write operation for the levels "1" to "4". The second write operation is a write operation for the "5" to "8" levels. The third write operation is a write operation for the "9" to "C"-levels. The fourth write operation is a write operation for the "D" to "F"-levels. The fifth write operation is a write operation for the "1" and "2" levels. The sixth write operation is a write operation for the "3" and "4" levels. The seventh write operation is a write operation for the "5" and "6" levels. The eighth write operation is a write operation for the "7" and "8" levels. The ninth write operation is a write operation for the "9" and "A"-levels. The tenth write operation is a write operation for the "B" and "C"-levels. The eleventh write operation is a write operation for the "D" and "E"-levels. The twelfth write operation is a write operation for the "F"-level.

The first write operation includes a first program operation (P_I) relating to writing for the "1" to "4" levels, and the first program verification operation (V_I) that determines whether or not the first program operation has passed.

The second write operation includes a second program operation (P_II) relating to writing for the "5" to "8" levels, and a second program verification operation (V_II) that determines whether or not the second program operation has passed.

The third write operation includes a third program operation (P_III) for the "9" to "C"-levels.

The fourth write operation includes a fourth program operation (P_IV) relating to writing for the "D" to the "F"-levels.

The fifth write operation includes a fifth program operation (P_V) relating to writing for the "1" and "2" levels.

The sixth write operation includes a sixth program operation (P_VI) relating to writing for the "3" and "4" levels.

The seventh write operation includes a seventh program operation (P_VII) relating to writing for the "5" and "6" levels.

The eighth write operation includes an eighth program operation (P_VIII) relating to writing for the "7" and "8" levels.

The ninth write operation includes a ninth program operation (P_IX) relating to writing for the "9" and "A"-levels.

The tenth write operation includes a tenth program operation (P_X) relating to writing for the "B" and "C"-levels.

The eleventh write operation includes an eleventh program operation (P_XI) relating to writing for the "D" and "E"-levels.

The twelfth write operation includes a twelfth program operation (P_XII) relating to writing for the "F"-level.

The sequencer 111 increments the voltage VPGM_I (n) to the VPGM_IV (n) by the voltage DVPGM every time the first to the fourth program operations are performed.

The modified example 9 of the third embodiment is different from the third embodiment in that the fifth to the twelfth program operations are performed at the start of the write operation.

<3-13-1-2> Method of Generating Order of Performance of Program Operation and Program Verification Operation A method of generating the order of performance of the program operation and the program verification operation (pulse order) according to the third embodiment will be described with reference to FIG. 168.

Step S16801

Firstly, the sequencer 111 performs the fifth to the twelfth program operations using the VPGM_V to VPGM_XII, respectively, in sequence.

Step S16802 to Step S16812 correspond to Step S11601 to Step S11611 in FIG. 116.

<3-12-2> Specific Example of Pulse

Subsequently, referring now to FIG. 169 to FIG. 173, a specific example of the pulse for a case where the write operation of the third embodiment is applied to the memory cell transistors MT described above will be described. The basic operations are the same as those described with reference to FIG. 20 and FIG. 21.

FIG. 169 to FIG. 173 illustrate a pulse of (i) and a pulse of (ii), which are roughly classified pulse categories, as described in conjunction with FIG. 20 and FIG. 21.

In the example illustrated in FIG. 169 to FIG. 173, pulses corresponding to the pulse Nos. 1 to 14, 17, 18, 22, 24, 28, 30, 35, 38, 43, 46, 51, 58, and 61 correspond to the pulses of (i).

In the example illustrated in FIG. 169 to FIG. 173, pulses corresponding to the pulses other than Nos. 1 to 14, 17, 18, 22, 24, 28, 30, 35, 38, 43, 46, 51, 58, and 61 correspond to the pulses of (ii).

<3-14> Modified Example 10 of Third Embodiment

A modified example 10 of the third embodiment will be described. In the modified example 10 of the third embodiment, a case where a writing method different from the data writing method described above is employed in the third embodiment will be described.

<3-14-1> Example of Order of Performance of Program Operation and Program Verification Operation In the following, the order of performance of the program operation and the program verification operation will be described with reference to FIG. 174.

For easy understanding, FIG. 174 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 10 of the third embodiment is divided into first to fourth write operations in the same manner as the third embodiment.

The modified example 10 of the third embodiment is different from the third embodiment in that the third and the fourth write operations are performed first by a plurality of times.

<3-14-2> Method of Generating Order of Performance of Program Operation and Program Verification Operation A method of generating the order of performance of the program operation and the program verification operation (pulse order) according to the third embodiment will be described with reference to FIG. 175.

Step S17501

The sequencer 111 performs the same operation as that in Step S11601.

Step S17502

The sequencer 111 determines whether or not the condition is satisfied.

Step S17503

If the sequencer 111 determines that the numbers of loops are not the set values (LValue_III&IV) (NO in Step S17502), the sequencer 111 increments the voltages VPGM_III and VPGM_IV to be used in the third and the fourth program operations by the voltage DVPGM, respectively.

Step S17504

The sequencer 111 performs the same operation as that in Step S11602.

Step S17505

The sequencer 111 increments the voltages VPGM_III and VPGM_IV to be used in the third and the fourth program operations by the voltage DVPGM, respectively.

Figure 125:
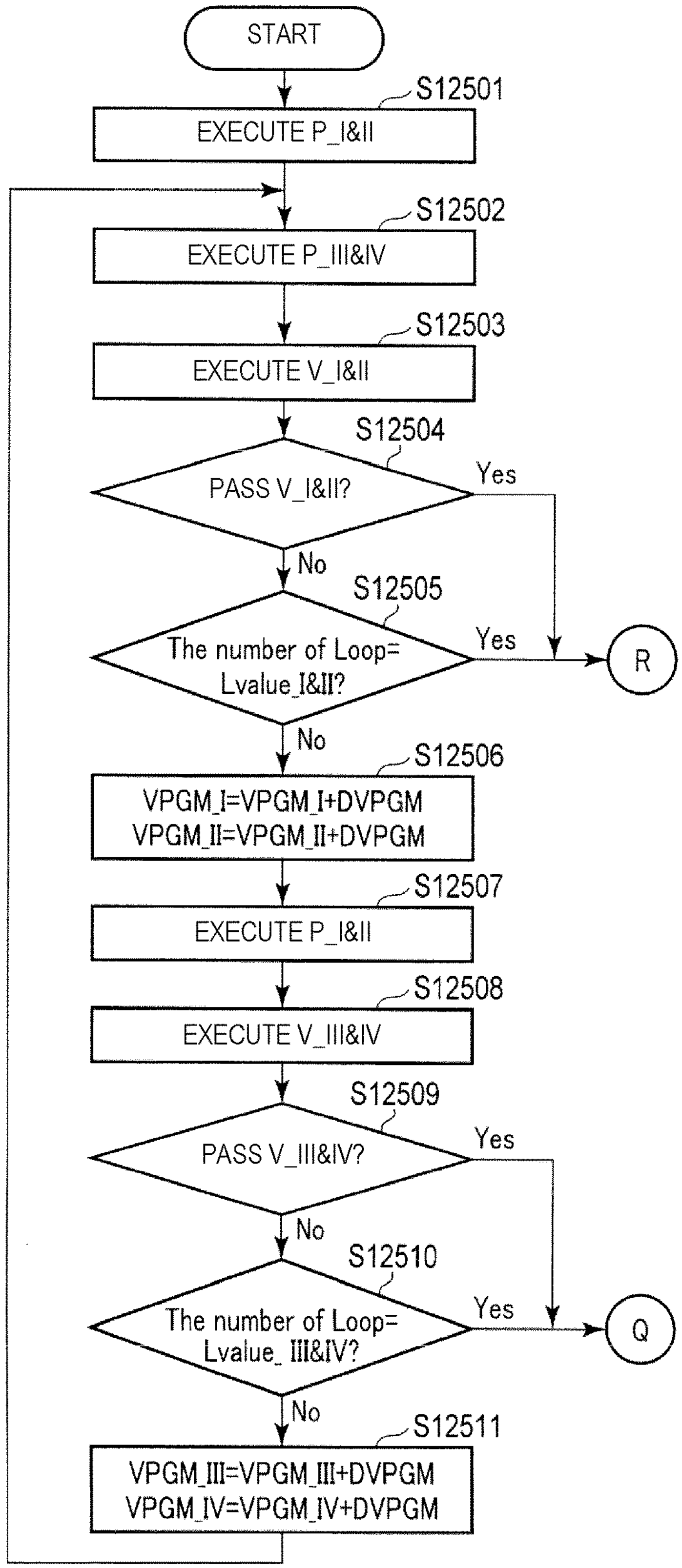
FIG. 125 is a flowchart showing the method of generating the performance order (pulse order) of the program operation and the program verification operation.

Step S17506 to Step S17514 correspond to Step S12502 to Step S12510 in FIG. 125.

<3-15> Modified Example 11 of Third Embodiment

A modified example 11 of the third embodiment will be described. In the modified example 11 of the third embodiment, a case where a writing method different from the data writing method described above is employed in the third embodiment will be described.

<3-15-1> Operation

<3-15-1-1> Example of Order of Performance of Program Operation and Program Verification Operation In the following, the order of performance of the program operation and the program verification operation will be described with reference to FIG. 176.

For easy understanding, FIG. 176 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 11 of the third embodiment is divided into first to fifth write operations in the same manner as the modified example 3 of the third embodiment.

The modified example 11 of the third embodiment is different from the modified example 8 of the third embodiment in that the order of performances of the first and the second write operations and the third and the fourth write operations are inverted.

<3-15-1-2> Example of Order of Performance of Program Operation and Program Verification Operation A method of generating the order of performance of the program operation and the program verification operation (pulse order) according to the third embodiment will be described with reference to FIG. 177.

Step S17701

The sequencer 111 performs the same operation as that in Step S13101.

Step S17702

The sequencer 111 determines whether or not the condition is satisfied.

Step S17703

If the sequencer 111 determines that the number of loops is not the set value (LValue_V) (NO in Step S17702), the sequencer 111 increments a voltage VPGM_V to be used in the fifth program operation by the voltage DVPGM.

Step S17704 to Step S17714 correspond to Step S12501 to Step S12511 in FIG. 125.

<3-15-2> Specific Example of Pulse

Subsequently, referring now to FIG. 178 to FIG. 181, a specific example of the pulse for a case where the write operation of the third embodiment is applied to the memory cell transistors MT described above will be described. The basic operations are the same as those described with reference to FIG. 20 and FIG. 21.

FIG. 178 to FIG. 181 illustrate a pulse of (i) and a pulse of (ii), which are roughly classified pulse categories, as described in conjunction with FIG. 20 and FIG. 21.

In the example illustrated in FIG. 178 to FIG. 181, pulses corresponding to the pulse Nos. 1, 4 to 9, 12, 13, 17, 19, 23, 25, 30, 33, 38, 41, 46, 49, and 54 correspond to the pulses of (i).

In the example illustrated in FIG. 178 to FIG. 181, pulses corresponding to the pulses other than Nos. 1, 4 to 9, 12, 13, 17, 19, 23, 25, 30, 33, 38, 41, 46, 49, and 54 correspond to the pulses of (ii).

<3-16> Modified Example 12 of Third Embodiment

A modified example 12 of the third embodiment will be described. In the modified example 12 of the third embodiment, a case where a writing method different from the data writing method described above is employed in the third embodiment will be described.

<3-16-1> Operation

<3-16-1-1> Example of Order of Performance of Program Operation and Program Verification Operation In the following, the order of performance of the program operation and the program verification operation will be described with reference to FIG. 182.

For easy understanding, FIG. 182 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 12 of the third embodiment is divided into first to twelfth write operations in the same manner as the modified example 9 of the third embodiment.

The modified example 12 of the third embodiment is different from the modified example 9 of the third embodiment in that the order of performances of the first and the second write operations and the third and the fourth write operations are inverted.

<3-16-1-2> Method of Generating Order of Performance of Program Operation and Program Verification Operation A method of generating the order of performance of the program operation and the program verification operation (pulse order) according to the third embodiment will be described with reference to FIG. 183.

Step S18301

The sequencer 111 performs the same operation as that in Step S16801.

Step S18302 to Step S18312 correspond to Step S12501 to Step S12511 in FIG. 125.

<3-16-2> Specific Example of Pulse

Subsequently, referring now to FIG. 184 to FIG. 188, a specific example of the pulse for a case where the write operation of the third embodiment is applied to the memory cell transistors MT described above will be described. The basic operations are the same as those described with reference to FIG. 20 and FIG. 21.

FIG. 184 to FIG. 188 illustrate a pulse of (i) and a pulse of (ii), which are roughly classified pulse categories, as described in conjunction with FIG. 20 and FIG. 21.

In the example illustrated in FIG. 184 to FIG. 188, pulses corresponding to the pulse Nos. 1 to 14, 17, 18, 22, 24, 28, 30, 35, 38, 43, 46, 51, 54, and 59 correspond to the pulses of (i).

In the example illustrated in FIG. 184 to FIG. 188, pulses corresponding to the pulses other than Nos. 1 to 14, 17, 18, 22, 24, 28, 30, 35, 38, 43, 46, 51, 54, and 59 correspond to the pulses of (ii).

<3-17> Modified Example 13 of Third Embodiment

A modified example 13 of the third embodiment will be described. In the modified example 13 of the third embodiment, a case where a writing method different from the data writing method described above is employed in the third embodiment will be described.

<3-17-1> Operation

<3-17-1-1> Example of Order of Performance of Program Operation and Program Verification Operation In the following, the order of performance of the program operation and the program verification operation will be described with reference to FIG. 189.

For easy understanding, FIG. 189 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 13 of the third embodiment is divided into first to fifth write operations in the same manner as the modified example 3 of the third embodiment. It is noted that the voltage VPGM_V used in the fifth program is larger than the initial voltage VPGM_IV.

The modified example 13 of the third embodiment is different from the third embodiment in that the fifth program operation is performed once first.

<3-17-1-2> Method of Generating Order of Performance of Program Operation and Program Verification Operation A method of generating the order of performance of the program operation and the program verification operation (pulse order) according to the third embodiment will be described with reference to FIG. 190.

Step S19001

The sequencer 111 performs the same operation as that in Step S13101.

Step S19002 to Step S19012 correspond to Step S11601 to Step S11611 in FIG. 116.

<3-17-2> Specific Example of Pulse

Subsequently, referring now to FIG. 191 to FIG. 194, a specific example of the pulse for a case where the write operation of the third embodiment is applied to the memory cell transistors MT described above will be described. The basic operations are the same as those described with reference to FIG. 20 and FIG. 21.

FIG. 191 to FIG. 194 illustrate a pulse of (i) and a pulse of (ii), which are roughly classified pulse categories, as described in conjunction with FIG. 20 and FIG. 21.

In the example illustrated in FIG. 191 to FIG. 194, pulses corresponding to the pulse Nos. 1 to 7, 10, 11, 15, 17, 21, 28, 31, 36, 38, 39, 44, 51, and 54 correspond to the pulses of (i).

In the example illustrated in FIG. 191 to FIG. 194, pulses corresponding to the pulses other than Nos. 1 to 7, 10, 11, 15, 17, 21, 28, 31, 36, 38, 39, 44, 51, and 54 correspond to the pulses of (ii).

<3-18> Modified Example 14 of Third Embodiment

A modified example 14 of the third embodiment will be described. In the modified example 14 of the third embodiment, a case where a writing method different from the data writing method described above is employed in the third embodiment will be described.

<3-18-1> Operation

<3-18-1-1> Example of Order of Performance of Program Operation and Program Verification Operation In the following, the order of performance of the program operation and the program verification operation will be described with reference to FIG. 195.

For easy understanding, FIG. 195 illustrates only the voltage VPGM to be applied to the selected word line WL as a pulse for the program operation in the same manner as FIG. 17. In the same manner, for the program verification operation, only the voltage VPVFY to be applied to the selected word line WL is illustrated as a pulse.

The write operation of the modified example 14 of the third embodiment is divided into first to fifth write operations in the same manner as the modified example 3 of the third embodiment. It is noted that the voltage VPGM_V used in the fifth program is larger than the initial voltage VPGM_IV.

The modified example 14 of the third embodiment is different from the modified example 2 of the third embodiment in that the fifth program operation is performed once at first.

<3-18-1-2> Method of Generating Order of Performance of Program Operation and Program Verification Operation A method of generating the order of performance of the program operation and the program verification operation (pulse order) according to the third embodiment will be described with reference to FIG. 196.

Step S19601

The sequencer 111 performs the same operation as that in Step S13101.

Step S19602 to Step S19612 correspond to Step S12501 to Step S12511 in FIG. 125.

<3-18-2> Specific Example of Pulse

Subsequently, referring now to FIG. 197 to FIG. 200, a specific example of the pulse for a case where the write operation of the third embodiment is applied to the memory cell transistors MT described above will be described. The basic operations are the same as those described with reference to FIG. 20 and FIG. 21.

FIG. 197 to FIG. 200 illustrate a pulse of (i) and a pulse of (ii), which are roughly classified pulse categories, as described in conjunction with FIG. 20 and FIG. 21.

In the example illustrated in FIG. 197 to FIG. 200, pulses corresponding to the pulse Nos. 1 to 7, 10, 11, 15, 17, 21, 23, 28, 31, 36, 39, 44, 47, and 52 correspond to the pulses of (i).

In the example illustrated in FIG. 197 to FIG. 200, pulses corresponding to the pulses other than Nos. 1 to 7, 10, 11, 15, 17, 21, 28, 31, 36, 38, 39, 44, 51, and 54 correspond to the pulses of (ii).

In the respective embodiments described above, (1) In the read operation, a voltage to be applied to a word line selected for the read operation of the "A"-level falls within a range, for example, from 0 V to 0.55 V. The range of the voltage is not limited thereto, and may be any one of ranges from 0.1 V to 0.24 V, from 0.21 V to 0.31 V, from 0.31 V to 0.4 V, from 0.4 V to 0.5 V, and from 0.5 V to 0.55 V.

A voltage to be applied to a word line selected for the read operation of the "B"-level falls within a range, for example, from 1.5 V to 2.3 V. The range of the voltage is not limited thereto, and may be any one of ranges from 1.65 V to 1.8 V, from 1.8 V to 1.95 V, from 1.95 V to 2.1 V, and from 2.1 V to 2.3 V.

A voltage to be applied to a word line selected for the read operation of the "C"-level falls within a range, for example, from 3.0 V to 4.0 V. The range of the voltage is not limited thereto, and may be any one of ranges from 3.0 V to 3.2 V, from 3.2 V to 3.4 V, from 3.4 V to 3.5 V, from 3.5 V to 3.6 V, and from 3.6 V to 4.0 V.

A time (tR) for the read operation may be set to ranges, for example, from 25 μs to 38 μs, from 38 μs to 70 μs, and from 70 μs to 80 μs.

(2) The write operation includes the program operation and verification operation as described above. In the write operation, a voltage to be applied to a word line WL selected for the program operation falls within a range, for example, from 13.7 V to 14.3 V. The range of the voltage is not limited thereto, and may be any one of ranges, for example, from 13.7 V to 14.0 V, and from 14.0 V to 14.6 V.

A voltage to be applied first to a selected word line when writing on odd-numbered word lines may be differentiated from a voltage to be applied first to a selected word line when writing on even-numbered word lines.

When the program operation is ISPP system (Incremental Step Pulse Program), examples of step up voltage include a voltage on the order of 0.5 V.

Examples of a voltage to be applied to non-selected word lines include voltages between 6.0 V and 7.3 V. The range of the voltage to be applied to the non-selected word lines is not limited thereto, and may be any one of ranges, for example, from 7.3 V to 8.4 V, or a voltage not higher than 6.0 V. A pass voltage to be applied may be changed depending on whether or not the non-selected word lines are the odd-numbered word line or the even-numbered word line. A time (tProg) for write operation may be set to ranges, for example, from 1700 μs to 1800 μs, from 1800 μs to 1900 μs, and from 1900 μs to 2000 μs.

(3) In the erasing operation, a voltage to be applied to a well formed on an upper portion of the semiconductor substrate and having the above-described memory cells disposed thereon is in a range, for example, between 12 V to 13.6 V. The voltage to be applied to the well may be in ranges of the voltage is not limited thereto, and may be any one of ranges, for example, from 13.6 V to 14.8 V, from 14.8 V to 19.0 V, from 19.0 V to 19.8 V, and from 19.8 V to 21 V. A time (tErase) for the erasing operation may be set to ranges, for example, from 3000 μs to 4000 μs, from 4000 μs to 5000 μs, and from 4000 μs to 9000 μs.

(4) A structure of the memory cell includes, a charge storage layer disposed on a semiconductor substrate (silicon substrate) via a tunnel insulating film having a film thickness of 4 to 10 nm therebetween. The charge storage layer may have a layered structure including an insulating film of SiN or SiON having a film thickness of 2 to 3 nm and polysilicon having a film thickness of 3 to 8 nm. The polysilicon may include a metal such as Ru added thereto. The charge storage layer includes an insulating film formed thereon. The insulating film includes, for example, a silicon oxide film having the thickness of 4 to 10 nm interposed between a lower layer Low-k film having a film thickness of 3 to 10 nm and an upper layer High-k film having a film thickness of 3 to 10 nm. Examples of the High-k film include HfO. The film thickness of the silicon oxide film may be larger than the film thickness of the High-k film. A control electrode having a film thickness of 30 nm to 70 nm via a material having a film thickness of 3 to 10 nm is formed on the insulating film. Examples of such material include a metal oxide film such as TaO, and a metal nitride film such as TaN. The control electrode may be W.

An air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
- a plurality of memory cells;
- a word line electrically connected to gates of the memory cells; and
- a control circuit configured to execute a write operation on the memory cells, the write operation including
- a first program operation during which the control circuit applies a first program voltage to the word line,
- a first verify operation during which the control circuit applies a first verification voltage to the word line to determine whether or not the first program operation passed,
- a second program operation during which the control circuit applies a second program voltage, which is different from the first program voltage, to the word line, and
- a second verify operation during which the control circuit applies a second verification voltage, which is different from the first verification voltage, to the word line to determine whether or not the second program operation passed, wherein
- the control circuit is configured to execute at least one intervening program or verify operation between the first program operation and the first verify operation, and
- the first and second verify operations each include a read operation during which read data is sensed based on a timing of a strobe signal, and the control circuit adjusts the timing of the strobe signal based on a position of the word line.

2. The device according to claim 1, wherein the first program voltage is higher than the second program voltage and the first verification voltage is higher than the second verification voltage.

3. The device according to claim 1, wherein the first program voltage is lower than the second program voltage and the first verification voltage is lower than the second verification voltage.

4. The device according to claim 1, wherein the at least one intervening program or verify operation includes the second program operation.

5. The device according to claim 4, wherein the write operation further includes a repeat operation of the first program operation which is carried out with the first program voltage stepped up to a higher level, the repeat operation being executed between the first verify operation and the second verify operation.

6. The device according to claim 1, wherein the control circuit is configured to execute at least one intervening program or verify operation between the second program operation and the second verify operation.

7. The device according to claim 5, wherein the at least one intervening program or verify operation includes the first verify operation.

8. The device according to claim 7, wherein the write operation further includes a repeat operation of the first program operation which is carried out with the first program voltage stepped up to a higher level, and the at least one intervening program or verify operation further includes the repeat operation that is executed after the first verify operation.

9. The device according to claim 1, wherein the write operation further includes a third program operation
- a third program operation during which the control circuit applies a third program voltage, which is less than both the first program voltage and the second program voltage, to the word line, and
- a third verify operation during which the control circuit applies a second verification voltage, which is less than both the first verification voltage and the second verification voltage, to the word line to determine whether or not the third program operation passed, wherein
- the control circuit is configured to execute at least one intervening program or verify operation between the third program operation and the third verify operation.

10. The device according to claim 9, wherein the control circuit executes the third program operation after the first program operation has passed.

11. The device according to claim 9, wherein the control circuit executes the third program operation, and immediately thereafter, the second verify operation followed by a repeat operation of the second program operation.

12. The device according to claim 9, wherein the control circuit executes the third program operation, and immediately thereafter, a repeat operation of the second program operation.

13. The device according to claim 1, wherein the first program operation and the first verify operation are executed in a loop repeatedly up to a maximum number of loops until the first program operation passes the first verify operation, and each loop of the first program operation and the first verify operation has at least one intervening program or verify operation executed between the first program operation and the first verify operation.

14. The device according to claim 1, wherein the first and second verification voltages are two of three, seven, or fifteen different verification voltages.

15. In a semiconductor memory device comprising a plurality of memory cells having gates thereof electrically connected to a word line and a control circuit, a method of executing a write operation on the memory cells, said method comprising:
- executing a first program operation during which the control circuit applies a first program voltage to the word line;
- after executing the first program operation, executing a second program operation during which the control circuit applies a second program voltage, which is different from the first program voltage, to the word line; and after executing the second program operation, executing a first verify operation during which the control circuit applies a first verification voltage to the word line to determine whether or not the first program operation passed; and after executing the first verify operation, executing a second verify operation during which the control circuit applies a second verification voltage, which is different from the first verification voltage, to the word line to determine whether or not the second program operation passed, wherein the first and second verify operations each include a read operation during which read data is sensed based on a timing of a strobe signal, and the timing of the strobe signal based on a position of the word line.

16. The method according to claim 15, further comprising:

after executing the first verify operation and before executing the second verify operation, repeating the first program operation with the first program voltage stepped up to a higher level.

17. The method according to claim 15, wherein the first program voltage is higher than the second program voltage and the first verification voltage is higher than the second verification voltage.

18. The method according to claim 15, wherein the first program voltage is lower than the second program voltage and the first verification voltage is lower than the second verification voltage.

19. The method according to claim 15, further comprising:

executing a third program operation during which the control circuit applies a third program voltage, which is less than both the first program voltage and the second program voltage, to the word line; and executing a third verify operation during which the control circuit applies a second verification voltage, which is less than both the first verification voltage and the second verification voltage, to the word line to determine whether or not the third program operation passed, wherein at least one intervening program or verify operation is executed between the third program operation and the third verify operation.

* * * * *